US011352384B2

(12) United States Patent
Lee et al.

(10) Patent No.: US 11,352,384 B2
(45) **Date of Patent: *Jun. 7, 2022**

(54) ORGANOMETALLIC COMPOUND, ORGANIC LIGHT-EMITTING DEVICE INCLUDING THE SAME, AND DIAGNOSTIC COMPOSITION INCLUDING THE SAME

(71) Applicant: Samsung Electronics Co., Ltd., Suwon-si (KR)

(72) Inventors: Sunyoung Lee, Seoul (KR); Jungin Lee, Seoul (KR); Aram Jeon, Suwon-si (KR); Kyuyoung Hwang, Anyang-si (KR); Seungyeon Kwak, Suwon-si (KR); Ohyun Kwon, Seoul (KR); Yuri Cho, Suwon-si (KR); Byoungki Choi, Hwaseong-si (KR); Seokhwan Hong, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 383 days.

This patent is subject to a terminal disclaimer.

(21) Appl. No.: 16/240,203

(22) Filed: Jan. 4, 2019

(65) Prior Publication Data

US 2019/0211042 A1 Jul. 11, 2019

(30) Foreign Application Priority Data

Jan. 5, 2018 (KR) ........................ 10-2018-0001851
Jan. 2, 2019 (KR) ........................ 10-2019-0000390

(51) Int. Cl.

| | |
|---|---|
| ***C07F 15/00*** | (2006.01) |
| ***H01L 51/00*** | (2006.01) |
| ***H05B 33/14*** | (2006.01) |
| ***C09K 11/06*** | (2006.01) |
| ***C07B 59/00*** | (2006.01) |
| ***H01L 51/50*** | (2006.01) |
| ***H01L 51/52*** | (2006.01) |

(52) U.S. Cl.

CPC ........ *C07F 15/0086* (2013.01); *C07B 59/004* (2013.01); *C09K 11/06* (2013.01); *H01L 51/0087* (2013.01); *H01L 51/5012* (2013.01); *H01L 51/5092* (2013.01); *H01L 51/5096* (2013.01); *H01L 51/5206* (2013.01); *H01L 51/5221* (2013.01); *H05B 33/14* (2013.01); *C07B 2200/05* (2013.01); *H01L 51/5056* (2013.01); *H01L 51/5072* (2013.01)

(58) Field of Classification Search

CPC .................................................. H01L 51/0087
See application file for complete search history.

(56) References Cited

U.S. PATENT DOCUMENTS

| | | | | |
|---|---|---|---|---|
| 10,930,863 | B2 * | 2/2021 | Kim | H01L 51/0087 |
| 10,937,973 | B2 * | 3/2021 | Lee | C09K 11/06 |
| 2006/0060842 | A1 | 3/2006 | Sano et al. | |
| 2013/0158268 | A1 * | 6/2013 | Molt | C07F 15/002 546/10 |
| 2016/0093814 | A1 | 3/2016 | Hwang et al. | |
| 2016/0240800 | A1 | 8/2016 | Ma et al. | |
| 2017/0179410 | A1 | 6/2017 | Xia et al. | |
| 2018/0013078 | A1 | 1/2018 | Lee et al. | |

FOREIGN PATENT DOCUMENTS

| | | | |
|---|---|---|---|
| EP | 3450441 | A1 | 3/2019 |
| JP | 2015227374 | A | 12/2015 |
| JP | 2016069379 | A | 5/2016 |
| JP | 2020037550 | A | 3/2020 |

OTHER PUBLICATIONS

Bin Wang et al, “Strongly phosphorescent platinum(2) complexes supported by tetradentate benzole-containing ligands”, Journal f Materials Chemistry, vol. 3, No. 31, Jul. 17, 2015, pp. 8212-8218, XP055540969.

Extended European search report issued by the European Patent Office dated Apr. 17, 2019 in the examination of the European Patent Application No. 19150173.3, which corresponds to above U.S. Application.

(Continued)

*Primary Examiner* — Peter F Godenschwager
(74) *Attorney, Agent, or Firm* — Cantor Colburn LLP

(57) ABSTRACT

An organometallic compound represented by Formula 1:

Formula 1

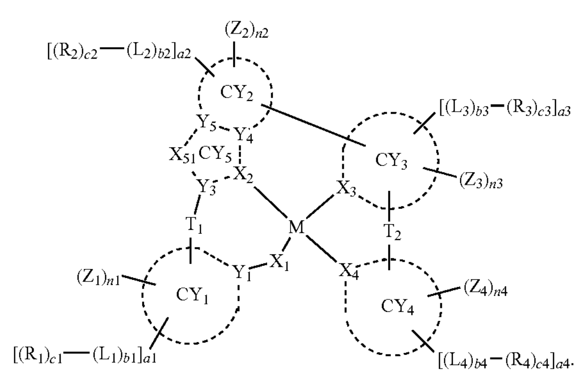

wherein, in Formula 1, groups and variables are the same as described in the specification.

20 Claims, 1 Drawing Sheet

(56) References Cited

OTHER PUBLICATIONS

Bin Wang et al. "Strongly phosphorescent platinum(II) complexes supported by tetradentate benzazole-containing ligands", Journal of Materials Chemistry C, 2015, 3, 8212-8218 (7 pp.).
Abe Thick et al., "A Deuterium Compound for Electronic Devices, Organic Square," 2011, Jun. (36), 2, 3, 20 pp.
English Translation of Office Action dated Feb. 8, 2022, issued in corresponding JP Patent Application No. 2019-000573, 6 pp.
Office Action dated Feb. 8, 2022, issued in corresponding JP Patent Application No. 2019-000573, 6 pp.
Partial English Translation of Abe Thick et al., "A Deuterium Compound for Electronic Devices, Organic Square," 2011, Jun. (36), 2, 3, 1 pg.
Sugiyama, Yoko et al., "Synthesis and evaluation of deuterated OLED materials," Taiyo Nissan Giho, 2013, No. 32, pp. 5-8.

* cited by examiner

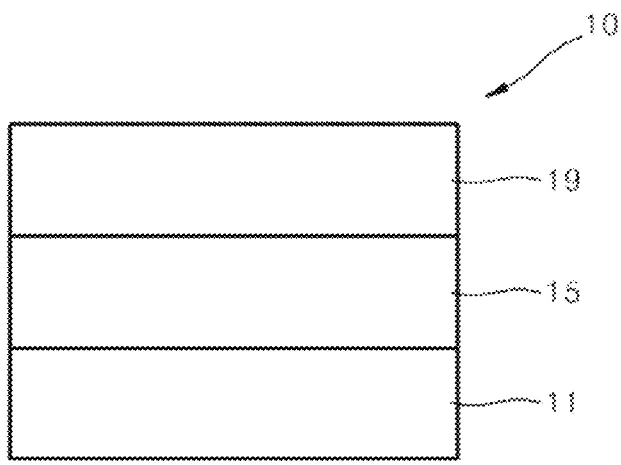
10
19
15
11

ORGANOMETALLIC COMPOUND, ORGANIC LIGHT-EMITTING DEVICE INCLUDING THE SAME, AND DIAGNOSTIC COMPOSITION INCLUDING THE SAME

CROSS-REFERENCE TO RELATED APPLICATION

This application claims priority to Korean Patent Applications No. 10-2018-0001851, filed on Jan. 5, 2018, and No. 10-2019-0000390, filed on Jan. 2, 2019, in the Korean Intellectual Property Office, and all the benefits accruing therefrom under 35 U.S.C. § 119, the content of which is incorporated herein in its entirety by reference.

BACKGROUND

1. Field

The present disclosure relates to an organometallic compound, an organic light-emitting device including the same, and a diagnostic composition including the organometallic compound.

2. Description of the Related Art

Organic light-emitting devices (OLEDs) are self-emission devices, which have improved characteristics in terms of a viewing angle, a response time, brightness, a driving voltage, and a response speed, and which produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

Meanwhile, luminescent compounds, for example, phosphorescent compounds, may be used for monitoring, sensing, and detecting biological materials such as various cells and proteins.

Various types of organic light emitting devices are known. However, there still remains a need in OLEDs having low driving voltage, high efficiency, high brightness, and long lifespan.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to an aspect of an embodiment, an organometallic compound is represented by Formula 1:

Formula 1

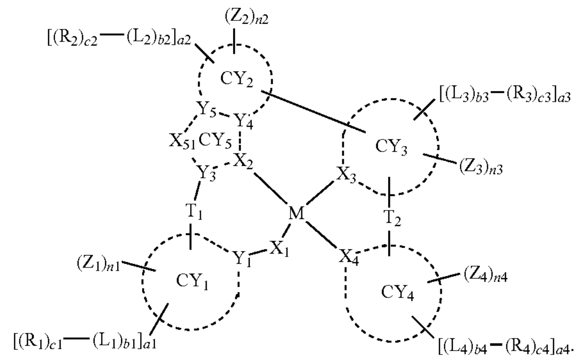

In Formula 1,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ may be a chemical bond, O, S, N(R'), P(R'), B(R'), C(R')(R") or Si(R')(R"), and when $X_1$ is a chemical bond, $Y_1$ may be directly bonded to M, $X_2$ to $X_4$ may each independently be N or C, two selected from $X_2$ to $X_4$ may each be N, and the other may be C, a bond between $X_1$ or $Y_1$ and M may be a covalent bond, one bond selected from a bond between $X_2$ and M, a bond between $X_3$ and M, and a bond between $X_4$ and M may be a covalent bond, and the remaining two bonds may be coordinate bonds, $Y_1$ and $Y_3$ to $Y_5$ may each independently be C or N, among pairs of $X_2$ and $Y_3$, $X_2$ and $Y_4$, $Y_4$ and $Y_5$, $X_{51}$ and $Y_3$, and $X_{51}$ and $Y_5$, the components in each pair may be linked via a chemical bond, ring $CY_1$ to ring $CY_5$ may each independently be selected from a $C_5$-$C_{30}$ carbocyclic group and a $C_1$-$C_{30}$ heterocyclic group, and each of ring $CY_1$, ring $CY_3$, and ring $CY_4$ may not be a benzimidazole group, a cyclometalated ring formed by ring $CY_5$, ring $CY_2$, ring $CY_3$, and M may be a 6-membered ring, $X_{51}$ may be selected from O, S, N-[$(L_7)_{b7}$-$(R_7)_{c7}$], C($R_7$)($R_8$), Si($R_7$)($R_8$), Ge($R_7$)($R_8$), C(=O), N, C($R_7$), Si($R_7$), and Ge($R_7$), $R_7$ and $R_8$ may optionally be linked via a single bond, a double bond, or a first linking group to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $T_1$ and $T_2$ may each independently be a single bond, a double bond, *—N($R_9$)—*', *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*', *—O—*', *—C(=O)—*', *—S(=O)—*', *—S(=O)$_2$—*', *—C($R_9$)=*', *=C($R_9$)—*', *—C($R_9$)=C($R_{10}$)—*', *—C(=S)—*', or * C≡C—*', $L_1$ to $L_4$ and $L_7$ may each independently be selected from a single bond, a substituted or unsubstituted $C_5$-$C_{30}$ carbocyclic group, and a substituted or unsubstituted $C_1$-$C_{30}$ heterocyclic group, b1 to b4 and b7 may each independently be an integer from 1 to 5, $R_1$ to $R_4$, $R_7$ to $R_{10}$, R', and R" may each independently be selected from hydrogen, deuterium, a deuterium-containing group, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, c1 to c4 and c7 may each independently be an integer from 1 to 5, $Z_1$ to $Z_4$ may each independently be deuterium or a deuterium-containing group, a1 to a4 and n1 to n4 may each independently be an integer from 0 to 20, i) when $X_{51}$ is O, S, C(=O), or N, the sum of n1 to n4 may be 1 or more, ii) when $X_{51}$ is $N[(L_7)_{b7}$-$(R_7)_{c7}]$, $C(R_7)$, $Si(R_7)$, or $Ge(R_7)$, a) $R_7$ may be deuterium or a deuterium-containing group; b) the sum of n1 to n4 may be 1 or more; or c) $R_7$ may be deuterium or a deuterium-containing group and the sum of n1 to n4 may be 1 or more, and iii) when $X_{51}$ is $C(R_7)(R_8)$, $Si(R_7)(R_8)$, or $Ge(R_7)(R_8)$, a) at least one selected from $R_7$ and $R_8$ may be deuterium or a deuterium-containing group; b) the sum of n1 to n4 may be 1 or more; or c) at least one selected from $R_7$ and $R_8$ may be deuterium or a deuterium-containing group and the sum of n1 to n4 may be 1 or more, two of a plurality of neighboring groups $R_1$ may be optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of a plurality of neighboring groups $R_2$ may be optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two of a plurality of neighboring groups $R_3$ may be optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of a plurality of neighboring groups $R_4$ may be optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more neighboring groups selected from $R_1$ to $R_4$, $R_7$ to $R_{10}$, R', and R" may be optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ has the same definition as $R_1$, at least one substituent of the substituted $C_5$-$C_{30}$ carbocyclic group, substituted $C_1$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_7$-$C_{60}$ alkylaryl group, substituted $C_6$-$C_{60}$ aryloxy group, substituted $C_6$-$C_{60}$ arylthio group, substituted $C_7$-$C_{60}$ arylalkyl group, substituted $C_1$-$C_{60}$ heteroaryl group, substituted $C_1$-$C_{60}$ heteroaryloxy group, substituted $C_1$-$C_{60}$ heteroarylthio group, substituted $C_2$-$C_{60}$ heteroarylalkyl group, substituted $C_2$-$C_{60}$ alkylheteroaryl group, substituted monovalent non-aromatic condensed polycyclic group and substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{60}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$ and $—P(=O)(Q_{28})(Q_{29})$; and $—N(Q_{31})(Q_{32})$, $—Si(Q_{33})(Q_{34})(Q_{35})$, $—B(Q_{36})(Q_{37})$, and $—P(=O)(Q_{38})(Q_{39})$; wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group.

According to an aspect of another embodiment, an organic light-emitting device includes:

a first electrode;

a second electrode; and an organic layer disposed between the first electrode and the second electrode, wherein the organic layer includes an emission layer and at least one organometallic compound represented by Formula 1.

The organometallic compound in the organic layer may function as a dopant.

According to an aspect of another embodiment, a diagnostic composition includes at least one organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound represented by Formula 1 below is provided:

Formula 1

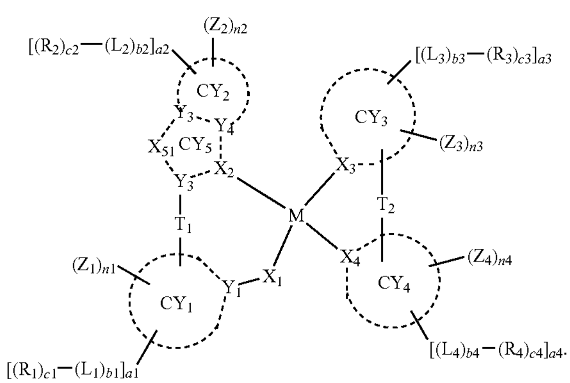

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

In an embodiment, M may be Pt, Pd, or Au, but embodiments of the present disclosure are not limited thereto.

$X_1$ in Formula 1 may be a chemical bond (for example, a single bond or a covalent bond), O, S, N(R'), P(R'), B(R'), C(R')(R"), or Si(R')(R"). R' and R" are the same as described above. When $X_1$ is a chemical bond, $Y_1$ and M may directly be linked to each other.

For example, $X_1$ may be O or S, but embodiments of the present disclosure are not limited thereto.

$X_2$ to $X_4$ in Formula 1 may each independently be N or C, two selected from $X_2$ to $X_4$ may each be N, and the remainder may be C.

A bond between $X_1$ or $Y_1$ and M in Formula 1 may be a covalent bond, one bond selected from a bond between $X_2$ and M, a bond between $X_3$ and M, and a bond between $X_4$ and M may be a covalent bond, and the remaining two bonds may be coordinate bonds. Thus, the organometallic compound represented by Formula 1 may be electrically neutral.

In one or more embodiments, in Formula 1, i) $X_2$ and $X_4$ may each be N, $X_3$ may be C, a bond between $X_2$ and M and a bond between $X_4$ and M may each be a coordinate bond, and a bond between $X_3$, and M may be a covalent bond, or i) $X_2$ and $X_3$ may each be N, $X_4$ may be C, a bond between $X_2$ and M and a bond between $X_3$ and M may each be a coordinate bond, and a bond between $X_4$ and M may be a covalent bond, or iii) $X_3$ and $X_4$ may be N, $X_2$ may be C, a bond between $X_3$ and M and a bond between $X_4$ and M may each be a coordinate bond, and a bond between $X_2$ and M may be a covalent bond, but embodiments of the present disclosure are not limited thereto.

In Formula 1, $Y_1$ and $Y_3$ to $Y_5$ may each independently be C or N, and among pairs of $X_2$ and $Y_3$, $X_2$ and $Y_4$, $Y_4$ and $Y_5$, $X_{51}$ and $Y_3$, and $X_{51}$ and $Y_5$, the components in each pair may be linked via a chemical bond. Accordingly, ring $CY_5$ in the Formula 1 may be a 5-membered ring condensed with ring $CY_2$.

Ring $CY_1$ to ring $CY_5$ in Formula 1 may each independently be selected from a $C_5$-$C_{30}$ carbocyclic group, and a $C_1$-$C_{30}$ heterocyclic group, and each of ring $CY_1$, ring $CY_3$, and ring $CY_4$ may not be a benzimidazole group.

For example, ring $CY_1$ to ring $CY_4$ may each independently selected from: i) a first ring, ii) a second ring, iii) a condensed ring in which two or more first rings are condensed with each other, iv) a condensed ring in which two or more second rings are condensed with each other, and v) a condensed ring in which one or more first rings and one or more second rings are condensed with each other, wherein the first ring may be selected from a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, the second ring may be selected from an adamantane group, a norbornane group, a norbornene group, a cyclohexane group, a cyclohexene group, a benzene group, a pyridine group, a pyrimidine group, a pyrazine group, a pyridazine group, and a triazine group, and each of ring $CY_1$ to ring $CY_4$ may not be a benzimidazole group.

In an embodiment, ring $CY_1$ to ring $CY_4$ may each independently be selected from a benzene group, a naphthalene group, an anthracene group, a phenanthrene group, a triphenylene group, a pyrene group, a chrysene group, cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a 5,6,7,8-tetrahydroisoquinoline group, and a 5,6,7,8-tetrahydroquinoline group, but embodiments of the present disclosure are not limited thereto.

A cyclometalated ring formed by ring $CY_5$, ring $CY_2$, ring $CY_3$, and M in Formula 1 may be a 6-membered ring.

In an embodiment, $X_2$ of ring $CY_5$, $X_3$ of ring $CY_3$, and $X_4$ of ring $CY_4$ in Formula 1 may not constitute a carbine moiety. That is, regarding Formula 1, 1) when $X_2$ is C, a bond between $X_2$ and M may be a covalent bond, 2) when $X_3$ is C, a bond between $X_3$ and M may be a covalent bond, and 3) when $X_4$ is C, a bond between $X_4$ and M may be a covalent bond.

Regarding Formula 1, $X_{51}$ may be O, S, N-[$(L_7)_{b7}$-$(R_7)_{c7}$], $C(R_7)(R_8)$, $Si(R_7)(R_8)$, $Ge(R_7)(R_8)$, C(═O), N, $C(R_7)$, $Si(R_7)$, and $Ge(R_7)$, and $R_7$ and $R_8$ may optionally be linked via a single bond, a double bond, or a first linking group to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$. Herein, the $C_5$-$C_{30}$ carbocyclic group and the $C_1$-$C_{30}$ heterocyclic group may be understood by referring to the descriptions about i) the first ring, ii) the second ring, iii) the condensed ring in which two or more first rings are condensed with each other, iv) the condensed ring in which two or more second rings are condensed with each other, and v) the condensed ring in which one or more first rings and one or more second rings are condensed with each other, and $R_{10a}$ may be understood by referring to the description about $R_1$, and $L_7$, b7, $R_7$, $R_8$, and c7 will be described in detail later.

The first linking group may be selected from *—O—*', *—S—*', *—$C(R_5)(R_6)$—*', *—$C(R_5)$═*', *═$C(R_6)$—*', *—$C(R_5)$═$C(R_6)$—*', *—C(═O)—*', *—C(═S)—*', *—C≡C—*', *—$N(R_5)$—*', *—$Si(R_5)(R_6)$—*', and *—P$(R_5)(R_6)$—*', and $R_5$ and $R_6$ are the same as described in connection with $R_1$, and each of * and *' indicates a binding site to a neighboring atom.

In one or more embodiments, in Formula 1, i) $Y_3$ to $Y_5$ may each be C, a bond between $X_{51}$ and $Y_3$ and a bond between $X_{51}$ and $Y_5$ may each be a single bond, and $X_{51}$ may be O, S, N-[$(L_7)_{b7}$-$(R_7)_{c7}$], $C(R_7)(R_8)$, $Si(R_7)(R_8)$, $Ge(R_7)(R_8)$, or C(═O), ii) $Y_3$ and $Y_4$ may each be C, $Y_5$ may be N, a bond between $X_{51}$ and $Y_3$ may be a double bond, a bond between $X_{51}$ and $Y_5$ may be a single bond, and $X_{51}$ may be N, $C(R_7)$, $Si(R_7)$, or $Ge(R_7)$, iii) $Y_3$ and $Y_5$ may each be C, $Y_4$ may be N, a bond between $X_{51}$ and $Y_3$ may be a single bond, a bond between $X_{51}$ and $Y_5$ may be a double bond, and $X_{51}$ may be N, $C(R_7)$, $Si(R_7)$, or $Ge(R_7)$, iv) $Y_3$ may be N, $Y_4$ and $Y_5$ may each be C, a bond between $X_{51}$ and $Y_3$ may be a single bond, a bond between $X_{51}$ and $Y_5$ may be a double bond, and $X_{51}$ may be N, $C(R_7)$, $Si(R_7)$, or $Ge(R_7)$, or v) $Y_3$ to $Y_5$ may each be C, a bond between $X_{51}$ and $Y_3$ may be a double bond, a bond between $X_{51}$ and $Y_5$ may be a single bond, and $X_{51}$ may be N, $C(R_7)$, $Si(R_7)$, or $Ge(R_7)$, but embodiments are not limited thereto.

$T_1$ and $T_2$ in Formula 1 may each independently be a single bond, a double bond, *—$N(R_9)$—*', *—$B(R_9)$—*', *—$P(R_9)$—*', *—$C(R_9)(R_{10})$—*', *—$Si(R_9)(R_{10})$—*', *—$Ge(R_9)(R_{10})$—*', *—S—*', *—Se—*', *—O—*', *—C(═O)—*', *—S(═O)—*', *—$S(═O)_2$—*', *—$C(R_9)$═*', *═$C(R_9)$—*', *—$C(R_9)$═$C(R_{10})$—*', *—C(═S)—*', or *—C≡C—*', $R_9$ and $R_{10}$ may optionally be linked via a single bond, a double bond, or a second linking group to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$. Herein, the $C_5$-$C_{30}$ carbocyclic group and the $C_1$-$C_{30}$ heterocyclic group may be understood by referring to the descriptions about i) the first ring, ii) the second ring, iii) the condensed ring in which two or more first rings are condensed with each other, iv) the condensed ring in which two or more second rings are condensed with each other, and v) the condensed ring in which one or more first rings and one or more second rings are condensed with each other, and $R_{10a}$ may be understood by referring to the description about $R_1$, and the second linking group may be understood by referring to the description about the first linking group.

In an embodiment, $T_1$ and $T_2$ in Formula 1 may be a single bond, but embodiments are not limited thereto.

$L_1$ to $L_4$ and $L_7$ in Formula 1 may each independently be selected from a single bond, a substituted or unsubstituted $C_5$-$C_{30}$ carbocyclic group, and a substituted or unsubstituted $C_1$-$C_{30}$ heterocyclic group.

For example, $L_1$ to $L_4$ and $L_7$ in Formula 1 may each independently be selected from:

a single bond, a benzene group, a naphthalene group, an anthracene group, a phenanthrene group, a triphenylene group, a pyrene group, a chrysene group, cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group and a benzothiadiazole group; and a benzene group, a naphthalene group, an anthracene group, a phenanthrene group, a triphenylene group, a pyrene group, a chrysene group, cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkyl group substituted with at least one deuterium, a $C_1$-$C_{20}$ alkoxy group, a phenyl group, a phenyl group substituted with at least one deuterium, a biphenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —$N(Q_{31})(Q_{32})$, —$Si(Q_{33})(Q_{34})(Q_{35})$, —$B(Q_{36})(Q_{37})$, and —$P(=O)(Q_{38})(Q_{39})$;

$Q_{31}$ to $Q_{39}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CH_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$ to $C_{10}$ alkyl group, and a phenyl group;

but embodiments of the present disclosure are not limited thereto.

b1 to b4 and b7 in Formula 1 indicate numbers of $L_1$ to $L_4$ and $L_7$, respectively, and may each independently be an integer from 1 to 5. When b1 is two or more, two or more groups $L_1$ may be identical to or different from each other. b2 to b4 and b7 may each be the same as described in connection with b1.

In an embodiment, $L_1$ to $L_4$ and $L_7$ in Formula 1 may each independently be selected from:

a single bond; and a benzene group unsubstituted or substituted with at least one selected from deuterium, —F, a cyano group, a $C_1$-$C_{20}$ alkyl group, a $C_1$-$C_{20}$ alkyl group substituted with at least one deuterium, a phenyl group, a phenyl group substituted with at least one deuterium, a biphenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group and a diphenyldibenzosilolyl group; and b1 to b4 and b7 in Formula 1 may be 1 or 2, but embodiments of the present disclosure are not limited thereto.

In an embodiment, b1 to b4 and b7 in Formula 1 may be 1 or 2, but embodiments of the present disclosure are not limited thereto.

$R_1$ to $R_4$, $R_7$ to $R_{10}$, R', and R'' may each independently be selected from hydrogen, deuterium, deuterium-containing group, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$. The deuterium-containing group and $Q_1$ to $Q_9$ are the same as described above.

For example, $R_1$ to $R_4$, $R_7$ to $R_{10}$, R', and R'' may each independently be selected from:

hydrogen, deuterium, a deuterium-containing group, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a pyridinyl group, and a pyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo

[2.2.2]octyl group, a phenyl group, a ($C_1$-$C_{20}$ alkyl) phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl) phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —$Si(Q_{33})(Q_{34})(Q_{35})$; and —$N(Q_1)(Q_2)$, —$Si(Q_3)(Q_4)(Q_5)$, —$B(Q_6)(Q_7)$, and —$P(=O)(Q_8)(Q_9)$;

Herein, $Q_1$ to $Q_9$ and $Q_{33}$ to $Q_{35}$ may be understood by referring to the description presented above.

In some embodiments, $R_1$ to $R_4$, $R_7$ to $R_{10}$, R', and R" may each independently be selected from:

hydrogen, deuterium, deuterium-containing group, —F, a cyano group, a nitro group, —$SF_5$, a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, a fluorenyl group, a carbazolyl group, a dibenzofuranyl group, a dibenzothiophenyl group, a dibenzosilolyl group, and —$Si(Q_{33})(Q_{34})(Q_{35})$; and —$N(Q_1)(Q_2)$, —$Si(Q_3)(Q_4)(Q_5)$, —$B(Q_6)(Q_7)$, and —$P(=O)(Q_8)(Q_9)$;

wherein $Q_1$ to $Q_9$ and $Q_{33}$ to $Q_{35}$ are the same as described above, but embodiments are not limited thereto.

c1 to c4 and c7 in Formula 1 indicate numbers of $R_1$ to $R_4$ and $R_7$, respectively, and may each independently be an integer from 1 to 5 (for example, 1, 2, and 3). When c1 is two or more, two or more groups $R_1$ may be identical to or different from each other. c2 to c4 and c7 may be understood by referring to the description about c1.

$Z_1$ to $Z_4$ in Formula 1 may each independently be deuterium or a deuterium-containing group.

For example, the deuterium-containing group is a first group substituted with at least one deuterium, and the first group may be selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, and a substituted or unsubstituted monovalent non-aromatic condensed heteropolycyclic group.

The term "a deuterium-containing group" as used herein refers to any group including at least one deuterium, which may be further substituted with substituents other than deuterium. For example, the term "a deuterium-containing group" as used herein may include a phenyl group substituted with one deuterium, a phenyl group substituted with five deuterium and not containing hydrogen (see Formula 11-1), a phenyl group substituted with four deuterium and one tert-butyl group (see Formulae 11-10 to 11-12), a phenyl group substituted with four deuterium and one —$C(CD_3)_3$ and not containing hydrogen (see Formulae 11-7 to 11-9), —$CDH_2$, —$CD_3$, or the like. Herein, for example, the "phenyl group substituted with one deuterium" refers to a deuterium-containing group in which the first group is a "phenyl group," and the "phenyl group substituted with four deuterium and one tert-butyl group" refers to a deuterium-containing group in which the first group is "a phenyl group substituted with a tert-butyl group."

In an embodiment, the deuterium-containing group may be a first group substituted with at least one deuterium, the first group may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a pyridinyl group, and a pyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —$Si(Q_{33})(Q_{34})(Q_{35})$; and —$N(Q_1)(Q_2)$, —$Si(Q_3)(Q_4)(Q_5)$, —$B(Q_6)(Q_7)$, and —$P(=O)(Q_8)(Q_9)$;

Herein, $Q_1$ to $Q_9$ and $Q_{33}$ to $Q_{35}$ may be understood by referring to the description presented above.

In an embodiment, the deuterium-containing group may be a first group substituted with at least one deuterium, and the first group may be selected from a $C_1$-$C_{20}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group and a terphenyl group, each unsubstituted or substituted with at least one selected from —F, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group and a terphenyl group.

In an embodiment, the deuterium-containing group i) may not include hydrogen or ii) may include at least one $C_1$-$C_{10}$ alkyl group.

For example, in the deuterium-containing group, "all hydrogen" of the "first group" is replaced with "deuterium" and thus, hydrogen is not present (for example, such the deuterium-containing group may be selected from —$CD_3$, —$CD_2(CD_3)$, —$CD(CD_3)_2$, —$C(CD_3)_3$, —$CD_2$-$C(CD_3)_3$, —$CD_2$-$CD(CD_3)_2$, —$CD_2$-$CD_2(CD_3)$, —$CD(CD_3)$-$C(CD_3)_3$, —$CD(CD_3)$-$CD(CD_3)_2$, —$CD(CD_3)$-$CD_2(CD_3)$, —$C(CD_3)_2$-$C(CD_3)_3$, —$C(CD_3)_2$-$CD(CD_3)_2$, —$C(CD_3)_2$-$CD_2(CD_3)$, and Formulae 11-1 to 11-9).

In some embodiments, the deuterium-containing group may include at least one $C_1$-$C_{10}$ alkyl group (for example, a methyl group, an ethyl group, an n-propyl group, an iso-propyl group, an n-butyl group, an iso-butyl group, a tert-butyl group, a sec-butyl group, an n-pentyl group, an iso-pentyl group, a tert-pentyl group, a sec-pentyl group, etc.), and such a deuterium-containing group may be, for example, one of Formulae 11-10 to 11-12, but embodiments are not limited thereto.

In some embodiments, $R_1$ to $R_4$, $R_7$ to $R_{10}$, R' and R" may each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$CD_2(CD_3)$, —$CD(CD_3)_2$, —$C(CD_3)_3$, —$CD_2$-$C(CD_3)_3$, —$CD_2$-$CD(CD_3)_2$, —$CD_2$-$CD_2(CD_3)$, —$CD(CD_3)$-$C(CD_3)_3$, —$CD(CD_3)$-$CD(CD_3)_2$, —$CD(CD_3)$-$CD_2(CD_3)$, —$C(CD_3)_2$-$C(CD_3)_3$, —$C(CD_3)_2$-$CD(CD_3)_2$, —$C(CD_3)_2$-$CD_2(CD_3)$, a group represented by Formula 9-1 to 9-19, a group represented by Formulae 10-1 to 10-232, a group represented by Formulae 11-1 to 11-41, and —$Si(Q_1)(Q_2)(Q_3)$ ($Q_1$ to $Q_3$ are the same as described above), $Z_1$ to $Z_4$ may each independently be deuterium, —$CD_3$, —$CD_2H$, —$CDH_2$, —$CD_2(CD_3)$, —$CD(CD_3)_2$, —$C(CD_3)_3$, —$CD_2$-$C(CD_3)_3$, —$CD_2$-$CD(CD_3)_2$, —$CD_2$-$CD_2(CD_3)$, —$CD(CD_3)$-$C(CD_3)_3$, —$CD(CD_3)$-$CD(CD_3)_2$, —$CD(CD_3)$-$CD_2(CD_3)$, —$C(CD_3)_2$-$C(CD_3)_3$, —$C(CD_3)_2$-$CD(CD_3)_2$, —$C(CD_3)_2$-$CD_2(CD_3)$, and a group represented by one of Formulae 9-14 to 9-19, 10-11, 10-12, and 11-1 to 11-41, but embodiments are not limited thereto:

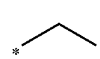

9-1

-continued
9-2
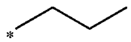
9-3
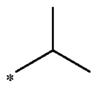
9-4
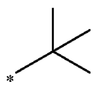
9-5
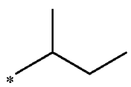
9-6
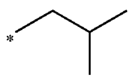
9-7
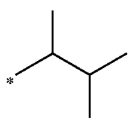
9-8
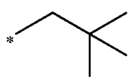
9-9
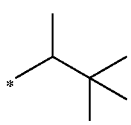
9-10
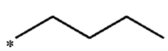
9-11
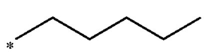
9-12
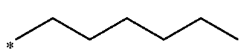
9-13
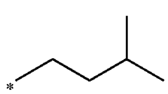
9-14
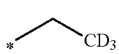
9-15
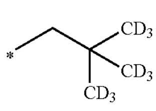
9-16
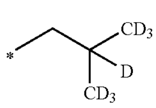
9-17
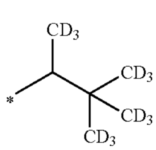
-continued
9-18
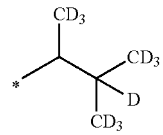
9-19
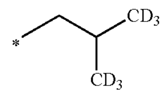
10-1
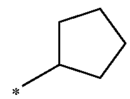
10-2
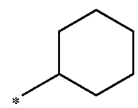
10-3
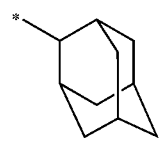
10-4
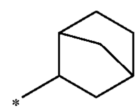
10-5
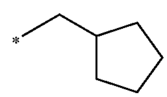
10-6
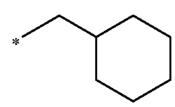
10-7
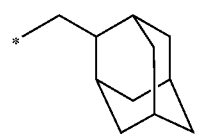
10-8
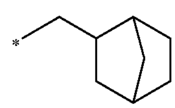
10-9
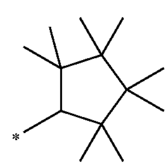
10-10
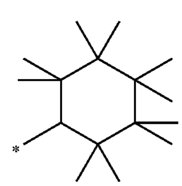

-continued
10-11
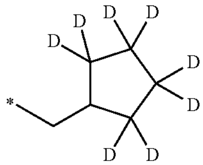
10-12
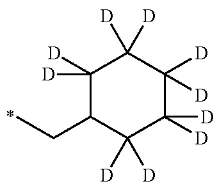
10-13
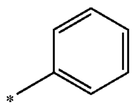
10-14
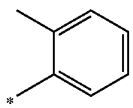
10-15
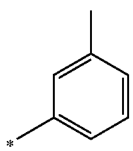
10-16
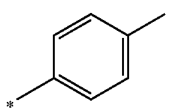
10-17
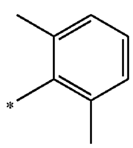
10-18
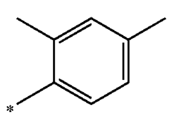
10-19
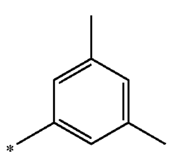
10-20
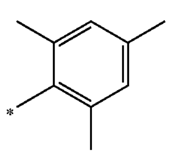
-continued
10-21
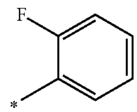
10-22
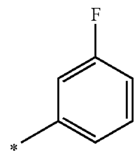
10-23
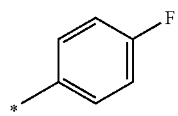
10-24
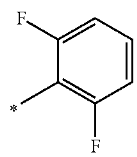
10-25
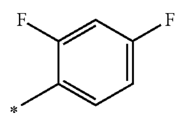
10-26
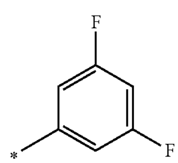
10-27
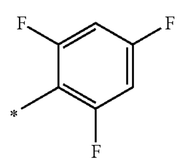
10-28
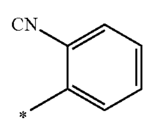
10-29
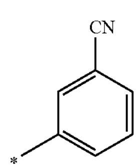
10-30
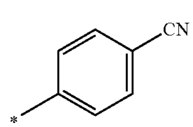

-continued
10-31
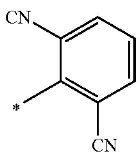
10-32
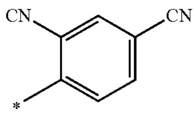
10-33
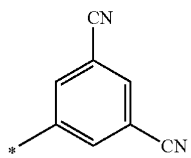
10-34
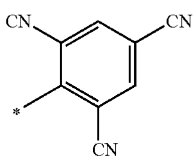
10-35
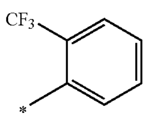
10-36
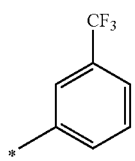
10-37
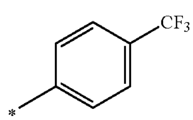
10-38
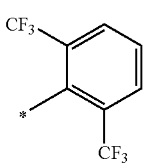
10-39
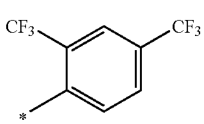
10-40
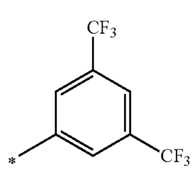
-continued
10-41
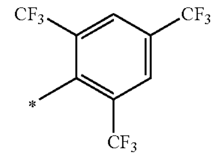
10-42
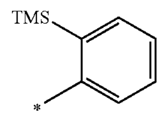
10-43
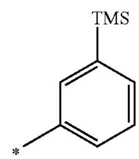
10-44
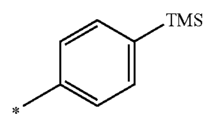
10-45
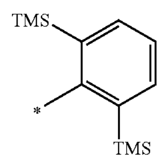
10-46
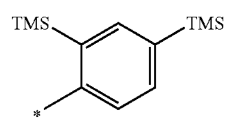
10-47
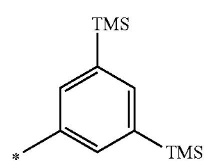
10-48
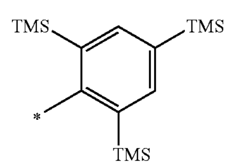
10-49
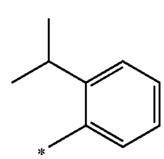
10-50
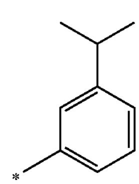

-continued
10-51
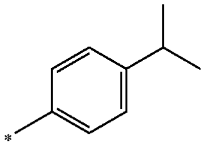
10-52
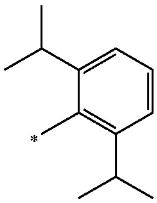
10-53
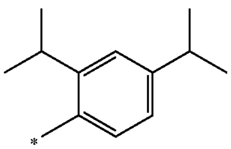
10-54
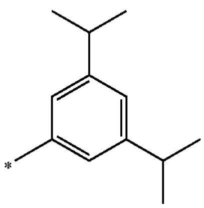
10-55
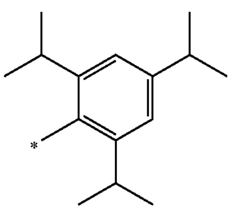
10-56
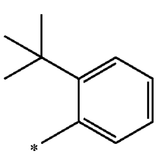
10-57
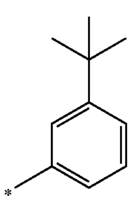
10-58
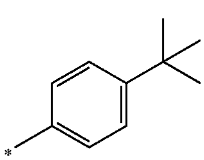
-continued
10-59
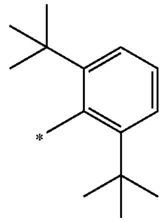
10-60
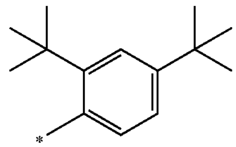
10-61
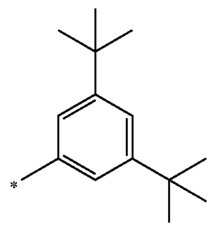
10-62
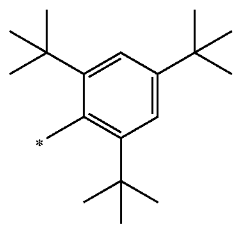
10-63
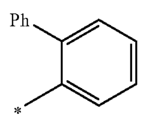
10-64
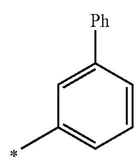
10-65
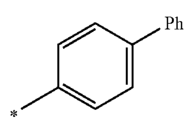
10-66
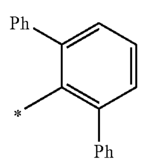
10-67
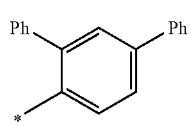

10-68
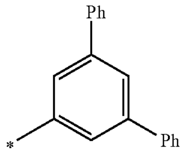
10-69
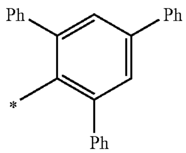
10-70
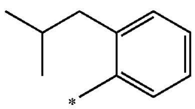
10-71
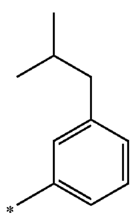
10-72
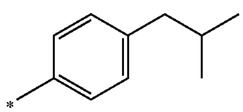
10-73
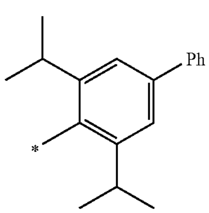
10-74
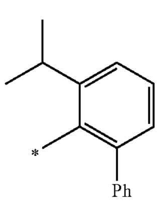
10-75
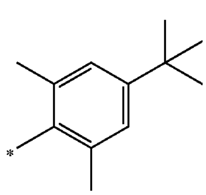
10-76
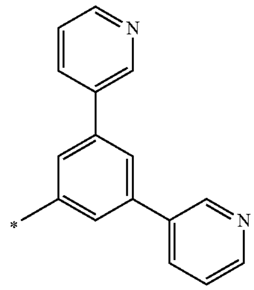
10-77
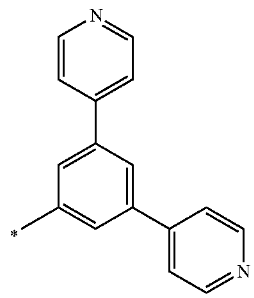
10-78
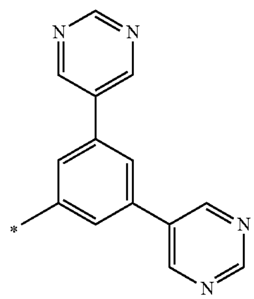
10-79
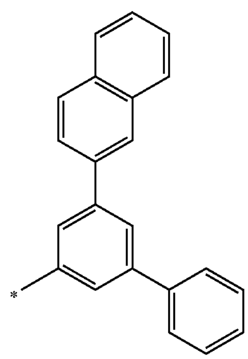
10-80
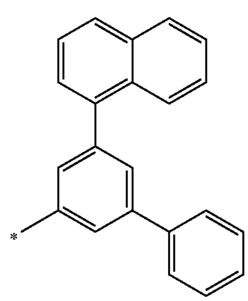

-continued
10-81
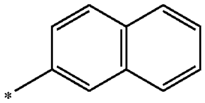
10-82
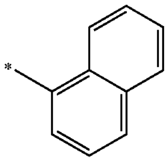
10-83
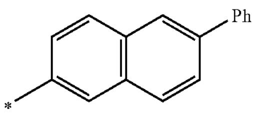
10-84
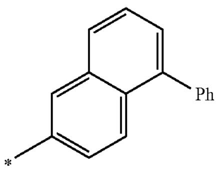
10-85
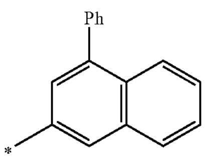
10-86
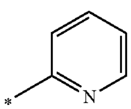
10-87
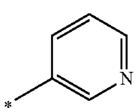
10-88
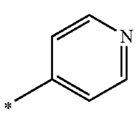
10-89
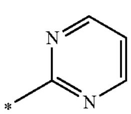
10-90
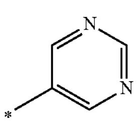
10-91
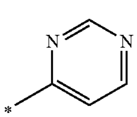
-continued
10-92
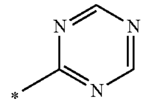
10-93
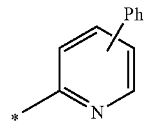
10-94
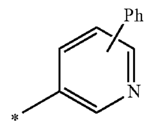
10-95
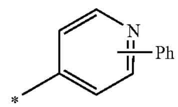
10-96
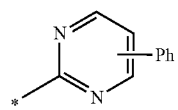
10-97
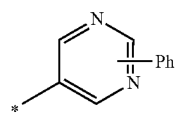
10-98
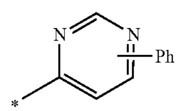
10-99
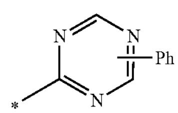
10-100
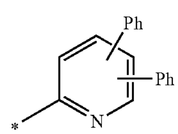
10-101
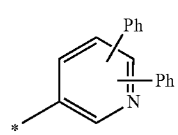
10-102
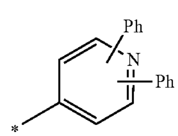

-continued
10-103
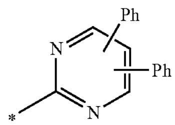
10-104
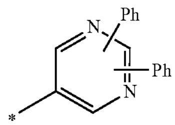
10-105
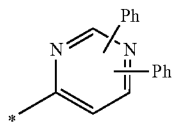
10-106
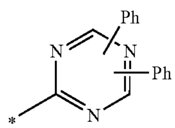
10-107
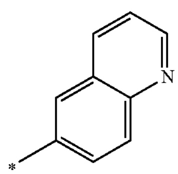
10-108
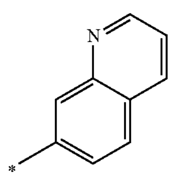
10-109
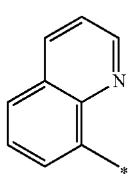
10-110
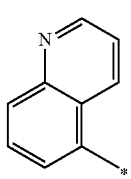
10-111
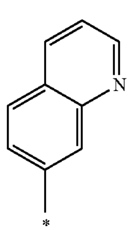
-continued
10-112
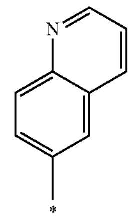
10-113
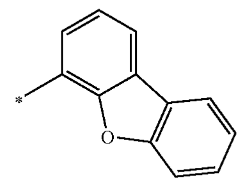
10-114
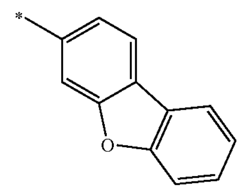
10-115
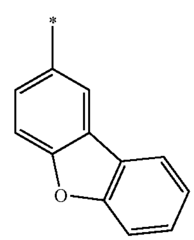
10-116
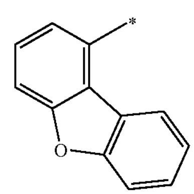
10-117
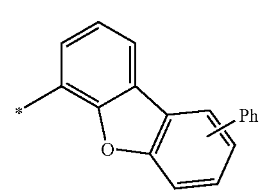
10-118
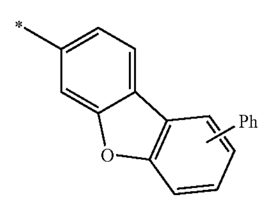

-continued
10-119
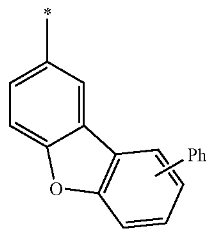
10-120
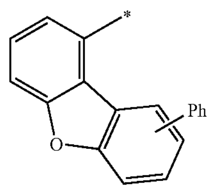
10-121
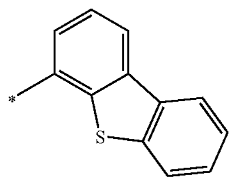
10-122
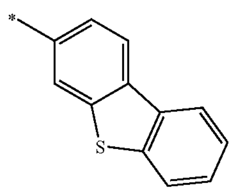
10-123
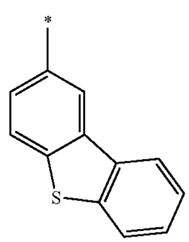
10-124
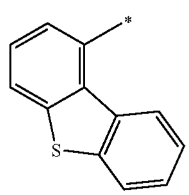
10-125
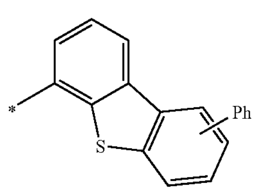
-continued
10-126
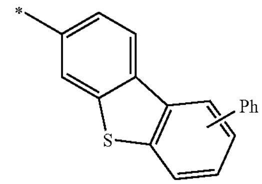
10-127
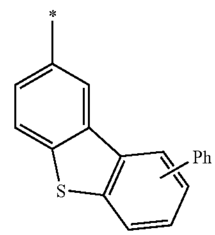
10-128
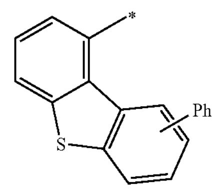
10-129
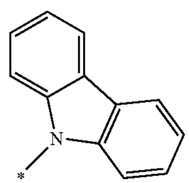
10-130
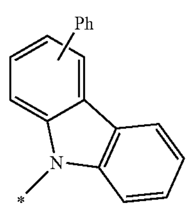
10-131
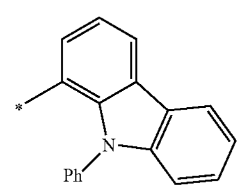
10-132
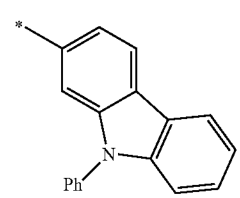

-continued
10-133
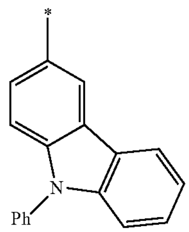
10-134
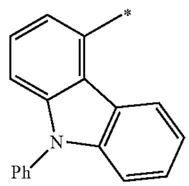
10-135
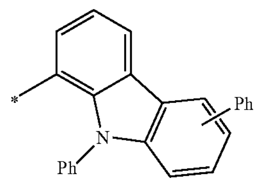
10-136
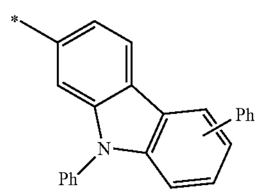
10-137
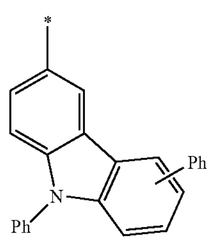
10-138
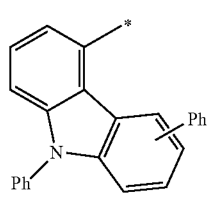
10-139
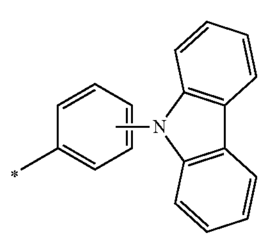
-continued
10-140
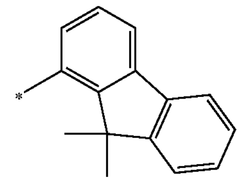
10-141
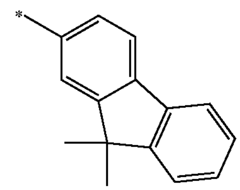
10-142
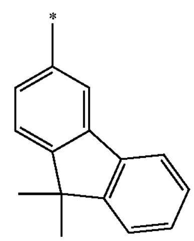
10-143
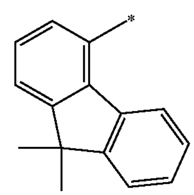
10-144
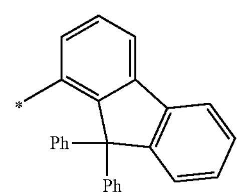
10-145
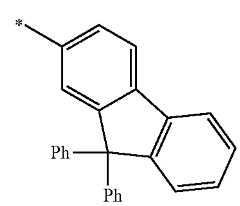
10-146
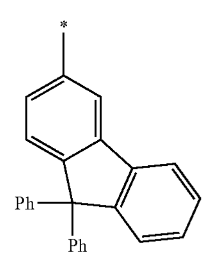

-continued
10-147
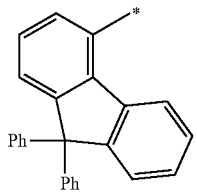
10-148
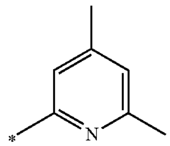
10-149
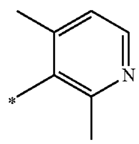
10-150
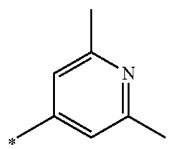
10-151
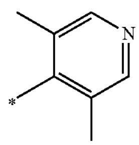
10-152
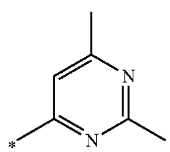
10-153
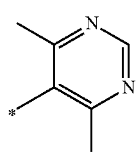
10-154
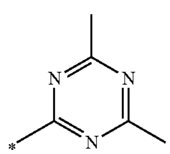
10-155
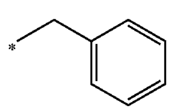
10-156
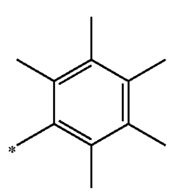
-continued
10-157
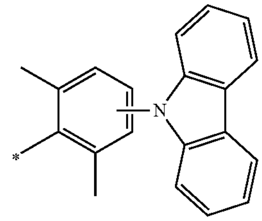
10-158
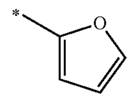
10-159
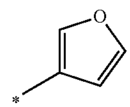
10-160
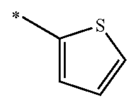
10-161
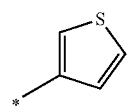
10-162
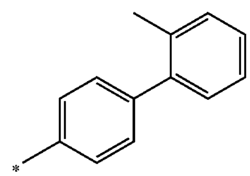
10-163
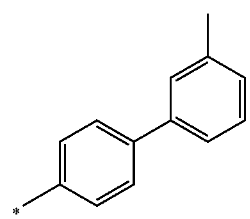
10-164
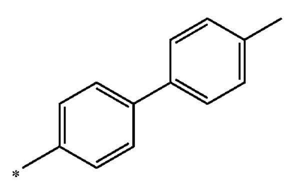
10-165
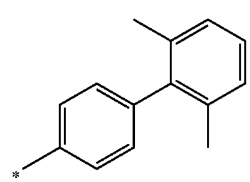

-continued
10-166
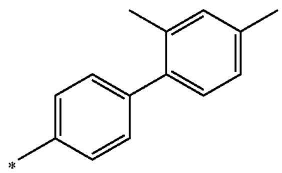
10-167
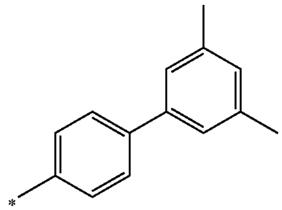
10-168
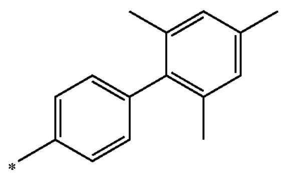
10-169
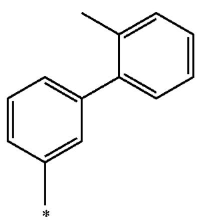
10-170
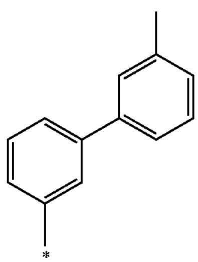
10-171
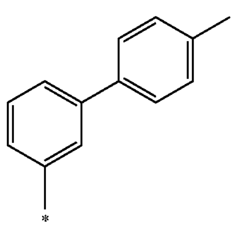
10-172
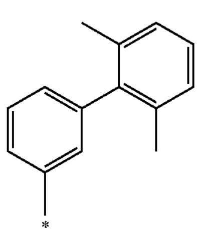
-continued
10-173
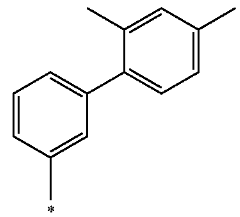
10-174
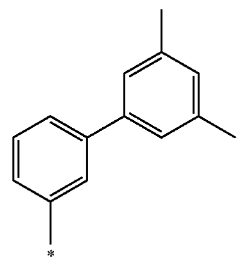
10-175
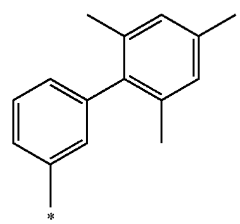
10-176
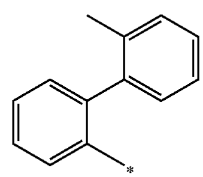
10-177
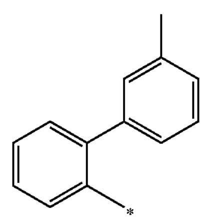
10-178
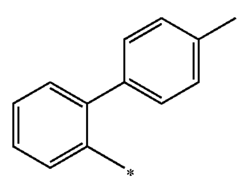
10-179
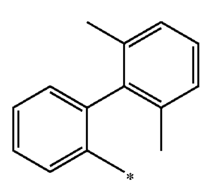

-continued
10-180
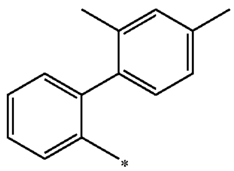
10-181
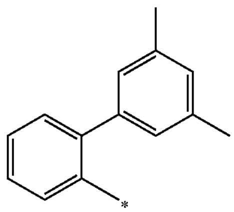
10-182
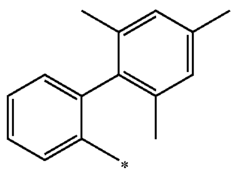
10-183
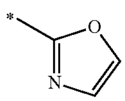
10-184
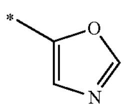
10-185
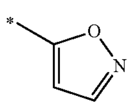
10-186
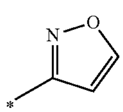
10-187
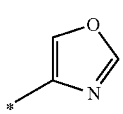
10-188
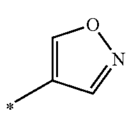
10-189
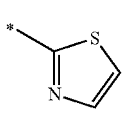
10-190
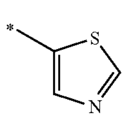
-continued
10-191
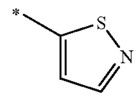
10-192
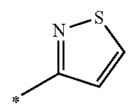
10-193
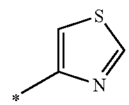
10-194
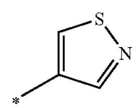
10-195
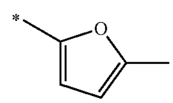
10-196
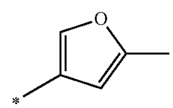
10-197
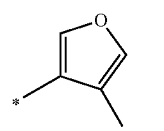
10-198
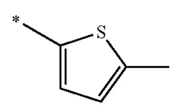
10-199
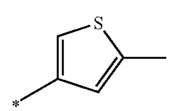
10-200
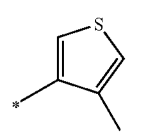
10-201
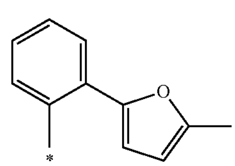
10-202
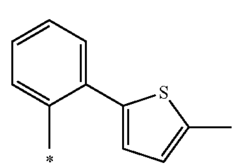

-continued
10-203
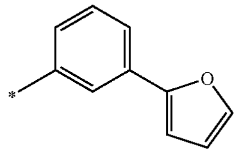
10-204
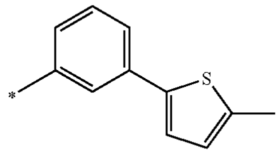
10-205
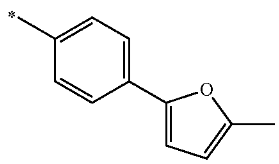
10-206
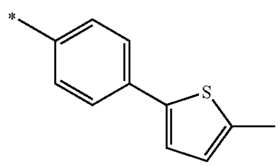
10-207
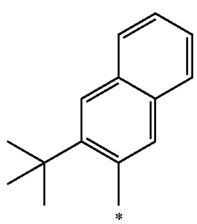
10-208
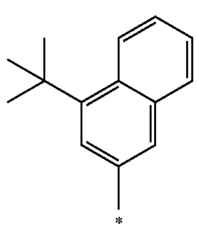
10-209
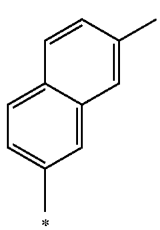
-continued
10-210
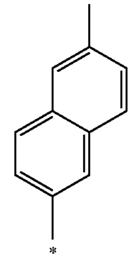
10-211
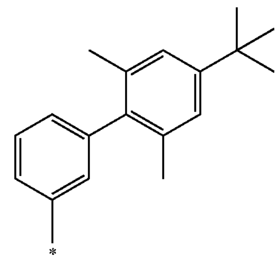
10-212
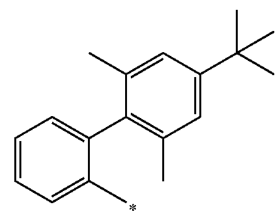
10-213
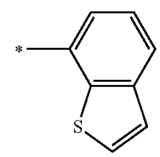
10-214
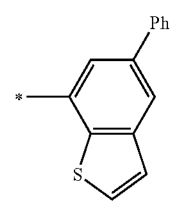
10-215
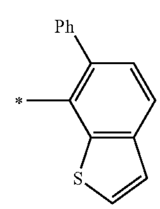
10-216
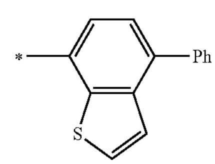

-continued
10-217
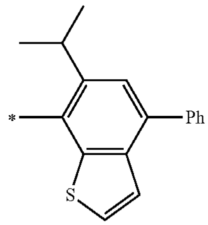
10-218
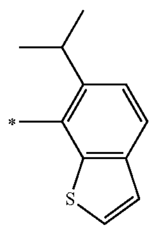
10-219
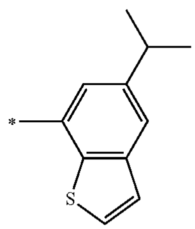
10-220
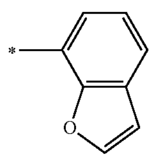
10-221
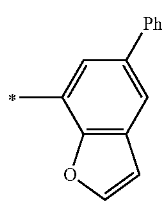
10-222
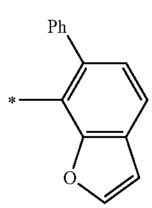
10-223
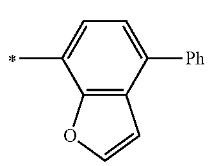
-continued
10-224
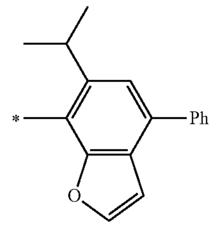
10-225
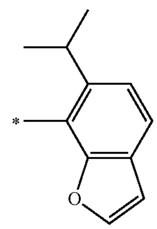
10-226
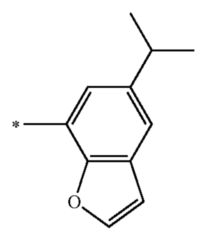
10-227
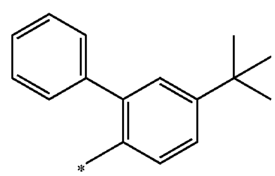
10-228
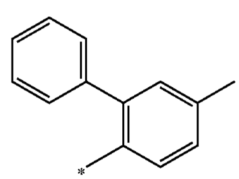
10-229
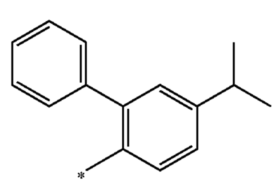
10-230
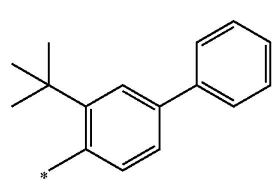

-continued
10-231
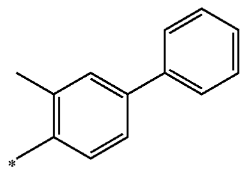
10-232
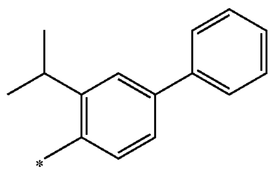
11-1
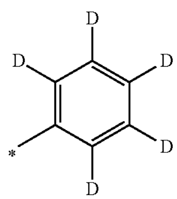
11-2
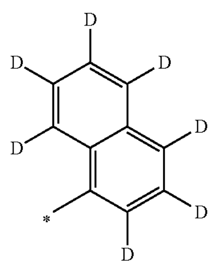
11-3
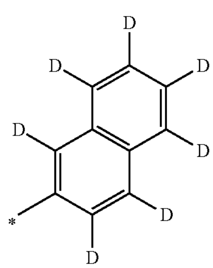
11-4
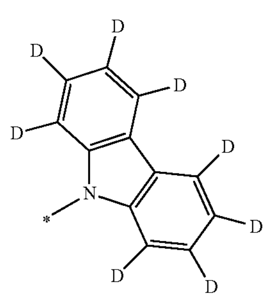
11-5
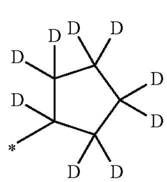
-continued
11-6
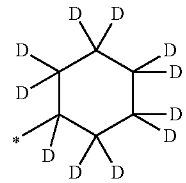
11-7
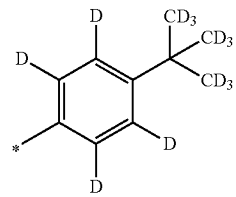
11-8
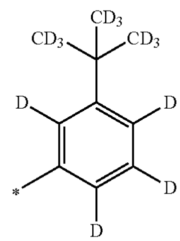
11-9
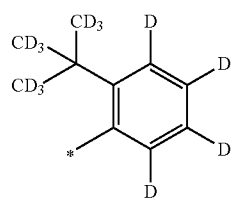
11-10
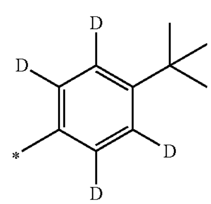
11-11
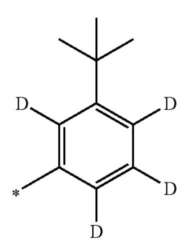
11-12
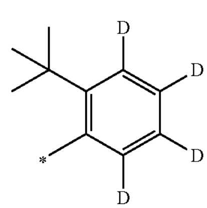

-continued
11-13
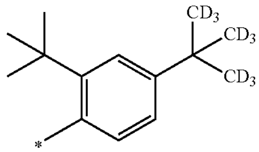
11-14
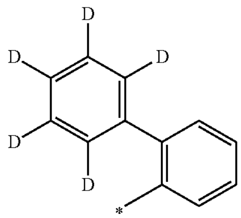
11-15
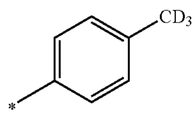
11-16
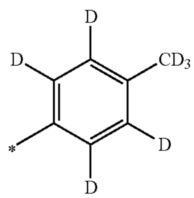
11-17
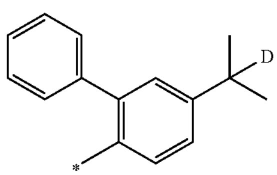
11-18
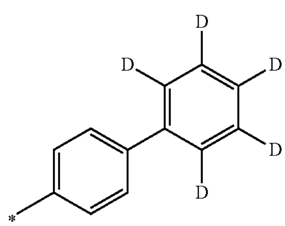
11-19
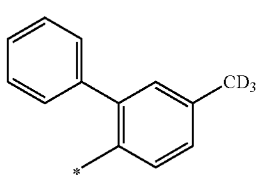
11-20
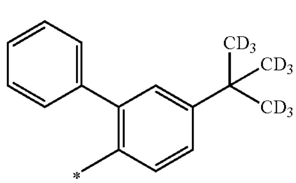
11-21
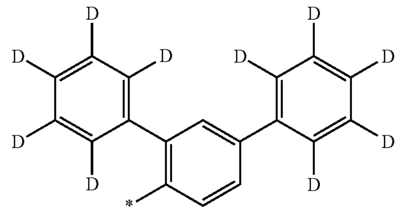
11-22
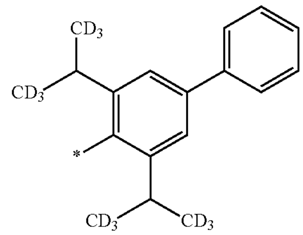
11-23
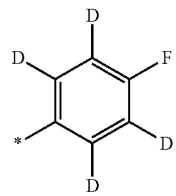
11-24
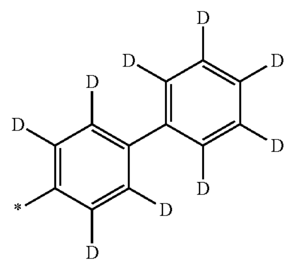
11-25
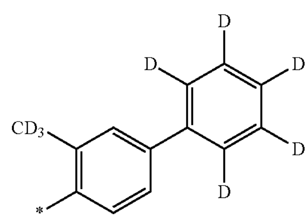
11-26
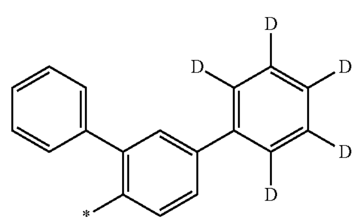
11-27
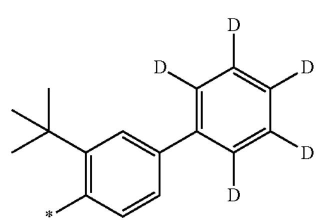

-continued 11-28

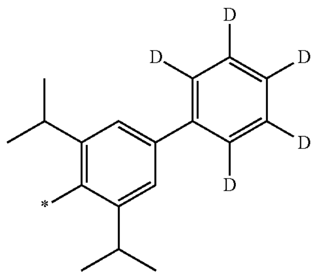

11-29

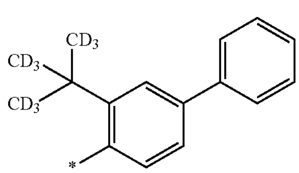

11-30

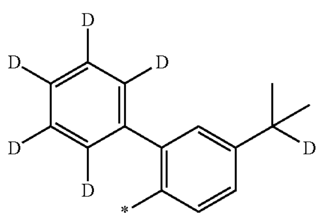

11-31

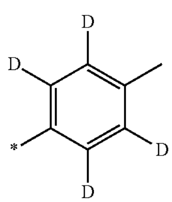

11-32

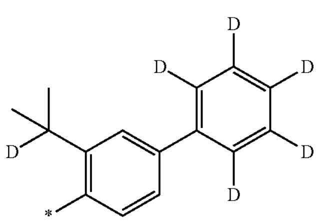

11-33

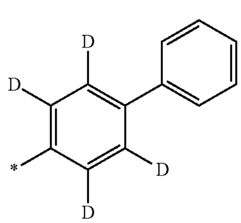

11-34

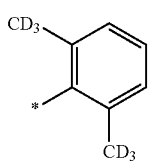

-continued 11-35

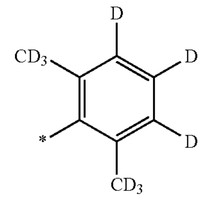

11-36

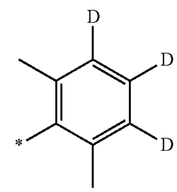

11-37

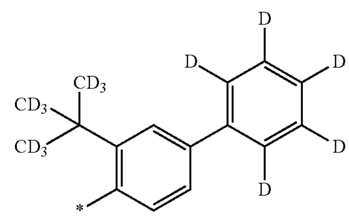

11-38

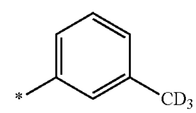

11-39

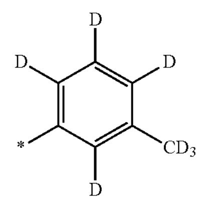

11-40

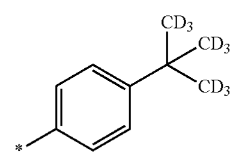

11-41

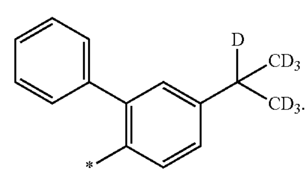

Regarding Formulae 9-1 to 9-19, 10-1 to 10-232 and 11-1 to 11-41, * indicates a binding site to neighboring atoms, Ph is a phenyl group, and TMS is a trimethylsilyl group.

In one or more embodiments, the deuterium-containing group may be selected from —$CD_3$, —$CD_2(CD_3)$, —$CD(CD_3)_2$, —$C(CD_3)_3$, —$CD_2$-$C(CD_3)_3$, —$CD_2$-$CD(CD_3)_2$, —$CD_2$-$CD_2(CD_3)$, —$CD(CD_3)$-$C(CD_3)_3$, —$CD(CD_3)$-$CD(CD_3)_2$, —$CD(CD_3)$-$CD_2(CD_3)$, —$C(CD_3)_2$-$C(CD_3)_3$, —$C(CD_3)_2$-$CD(CD_3)_2$, —$C(CD_3)_2$-$CD_2(CD_3)$, and a group represented by one of Formula 11-1 to 11-41, but embodiments are not limited thereto.

Regarding Formula 1, a1 to a4 respectively indicate numbers of *—$[(L_1)_{b1}$-$(R_1)_{c1}]$, * $[(L_2)_{b2}$-$(R_2)_{c2}]$, *—$[(L_3)_{b3}$-$(R_3)_{c3}]$, and *—$[(L_4)_{b4}$-$(R_4)_{c4}]$, and n1 to n4 respectively indicate numbers of $Z_1$ to $Z_4$, and a1 to a4 and n1 to n4 may each independently be an integer from 0 to 20. When a1 is two or more, two or more groups $*\text{—}[(L_1)_{b1}\text{-}(R_1)_{c1}]$ may be identical to or different from each other, when a2 is two or more, two or more groups $*\text{—}[(L_2)_{b2}\text{-}(R_2)_{c2}]$ may be identical to or different from each other, when a3 is two or more, two or more groups $*\text{—}[(L_3)_{b3}\text{-}(R_3)_{c3}]$ may be identical to or different from each other, when a4 is two or more, two or more groups $*\text{—}[(L_4)_{b4}\text{-}(R_4)_{c4}]$ may be identical to or different from each other, when n1 is two or more, two or more groups $Z_1$ may be identical to or different from each other, when n2 is two or more, two or more groups $Z_2$ may be identical to or different from each other, when n3 is two or more, two or more groups $Z_3$ may be identical to or different from each other, and when n4 is two or more, two or more groups $Z_4$ may be identical to or different from each other.

In Formula 1, i) when $X_{51}$ is O, S, C(═O), or N, the sum of n1 to n4 may be 1 or more, ii) when $X_{51}$ is $N[(L_7)_{b7}\text{-}(R_7)_{c7}]$, $C(R_7)$, $Si(R_7)$, or $Ge(R_7)$, a) $R_7$ is deuterium or a deuterium-containing group; b) the sum of n1 to n4 may be 1 or more; or c) $R_7$ is deuterium or a deuterium-containing group and the sum of n1 to n4 may be 1 or more, iii) when $X_{51}$ is $C(R_7)(R_8)$, $Si(R_7)(R_8)$, or $Ge(R_7)(R_8)$, a) at least one selected from $R_7$ and $R_8$ may be a deuterium or a deuterium-containing group; b) the sum of n1 to n4 may be 1 or more; or c) at least one selected from $R_7$ and $R_8$ may be deuterium or a deuterium-containing group and the sum of n1 to n4 may be 1 or more.

That is, Formula 1 may essentially include at least one deuterium and/or at least one deuterium-containing group.

In one or more embodiments, in Formula 1, $Y_3$ to $Y_5$ may each be C, a bond between $X_{51}$ and $Y_3$ and a bond between $X_{51}$ and $Y_5$ may each be a single bond, and a) $X_{51}$ may be O or S, and the sum of n1 to n4 may be 1, 2, 3, or 4; b) $X_{51}$ may be $N[(L_7)_{b7}\text{-}(R_7)_{c7}]$ and $R_7$ may be deuterium or a deuterium-containing group; c) $X_{51}$ may be $N[(L_7)_{b7}\text{-}(R_7)_{c7}]$, and the sum of n1 to n4 may be 1, 2, 3, or 4; d) $X_{51}$ may be $N[(L_7)_{b7}\text{-}(R_7)_{c7}]$, $R_7$ may be deuterium or deuterium-containing group, and the sum of n1 to n4 may be 1, 2, 3, or 4; e) $X_{51}$ may be $C(R_7)(R_8)$, and at least one selected from $R_7$ and $R_8$ may be deuterium or a deuterium-containing group; or f) $X_{51}$ may be $C(R_7)(R_8)$, and the sum of n1 to n4 may be 1, 2, 3, or 4, but embodiments are not limited thereto.

In one or more embodiments, Formula 1 may satisfy at least one of Condition A to Condition D:

Condition A n1 may be 1, 2, 3 or 4.

Condition B $X_{51}$ may be $N[(L_7)_{b7}\text{-}(R_7)_{c7}]$ and $R_7$ may be deuterium or a deuterium-containing group.

Condition C n3 may be 1, 2 or 3.

Condition D n4 may be 1, 2, 3 or 4.

In one or more embodiments, in Formula 1, i) n1=n2=n3=0, and n4 may be 1, 2, 3, or 4, ii) n1=n2=n4=0, and n3 may be 1, 2, 3, or 4, iii) n1=n3=n4=0, and n2 may be 1, 2, 3, or 4, iv) n2=n3=n4=0, and n1 may be 1, 2, 3, or 4, or v) n1=n2=n3=n4=0, $X_{51}$ may be $N\text{-}[(L_7)_{b7}\text{-}(R_7)_{c7}]$, $C(R_7)$, $Si(R_7)$, or $Ge(R_7)$, and $R_7$ may be deuterium or a deuterium-containing group; or vi) n1=n2=0, and n3 and n4 may each independently be 1, 2, 3, or 4, vii) n1=n2=n3=0, n4 may be 1, 2, 3, or 4, $X_{51}$ may be $N\text{-}[(L_7)_{b7}\text{-}(R_7)_{c7}]$, $C(R_7)$, $Si(R_7)$, or $Ge(R_7)$, and $R_7$ may be deuterium or a deuterium-containing group, viii) n1=n2=n4=0, n3 may be 1, 2, 3, or 4, $X_{51}$ may be $N\text{-}[(L_7)_{b7}\text{-}(R_7)_{c7}]$, $C(R_7)$, $Si(R_7)$, or $Ge(R_7)$, and $R_7$ may be deuterium or a deuterium-containing group, or ix) n2=n4=0, and n1 and n3 may each independently be 1, 2, 3, or 4, but embodiments are not limited thereto.

In one or more embodiments, regarding Formula 1, i) $X_1$ may be a chemical bond, and $T_1$ may be a single bond, a moiety represented by

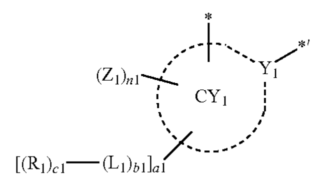

may be a group represented by Formula CY1-B, ii) $X_1$ may be O, S, N(R'), P(R'), B(R'), C(R')(R''), Si(R')(R''), or N(R')(R''), and $T_1$ may be a single bond, a moiety represented by

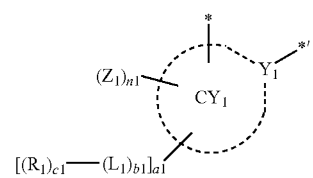

may be a group represented by Formula CY1-A, or iii) $X_1$ may be a chemical bond, and $T_1$ may be $*\text{—}N(R_9)\text{—}*'$, $*\text{—}B(R_9)\text{—}*'$, $*\text{—}P(R_9)\text{—}*'$, $*\text{—}C(R_9)(R_{10})\text{—}*'$, $*\text{—}Si(R_9)(R_{10})\text{—}*'$, $*\text{—}Ge(R_9)(R_{10})\text{—}*'$, $*\text{—}S\text{—}*'$, $*\text{—}Se\text{—}*'$, $*\text{—}O\text{—}*'$, $*\text{—}C({=}O)\text{—}*'$, $*\text{—}S({=}O)\text{—}*'$, $*\text{—}S({=}O)_2\text{—}*'$, $*\text{—}C(R_9){=}*'$, $*{=}C(R_9)\text{—}*'$, $*\text{—}C(R_9){=}C(R_{10})\text{—}*'$, $*\text{—}C({=}S)\text{—}*'$, or $*\text{—}C{\equiv}C\text{—}*'$, and a moiety represented by

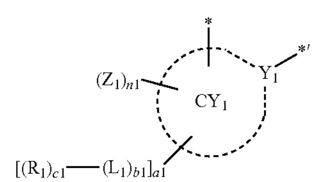

may be a group represented by Formula CY1-A:

CY1-A

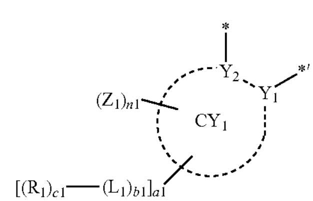

-continued

CY1-B

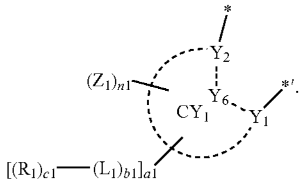

Regarding Formulae CY1-A and CY1-B, $Y_1$, $CY_1$, $L_1$, b1, $R_1$, c1, a1, $Z_1$, and n1 are the same as described above, $Y_2$ and $Y_6$ may each independently be N or C, and a bond between $Y_1$ and $Y_2$, a bond between $Y_1$ and $Y_6$, and a bond between $Y_6$ and $Y_2$ may each be a chemical bond.

In one or more embodiments, regarding Formula 1, a moiety represented by

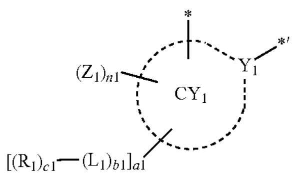

may be a group represented by one of Formulae CY1-1 to CY1-40:

CY1-1

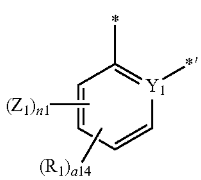

CY1-2

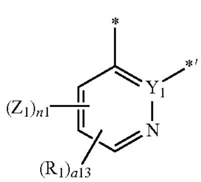

CY1-3

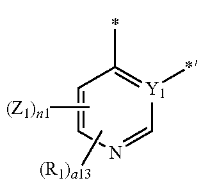

CY1-4

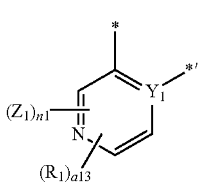

-continued

CY1-5

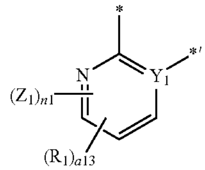

CY1-6

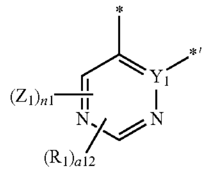

CY1-7

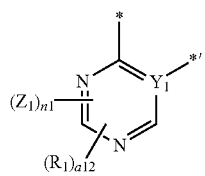

CY1-8

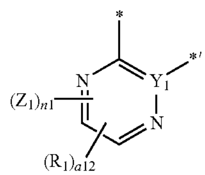

CY1-9

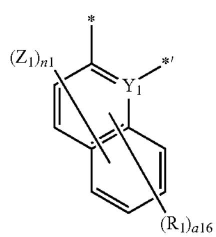

CY1-10

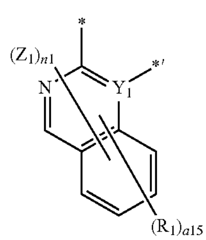

CY1-11

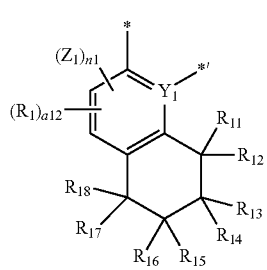

-continued
CY1-12
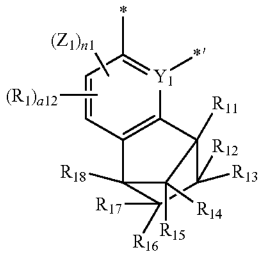
CY1-13
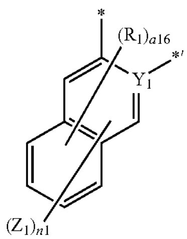
CY1-14
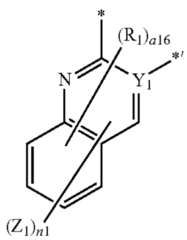
CY1-15
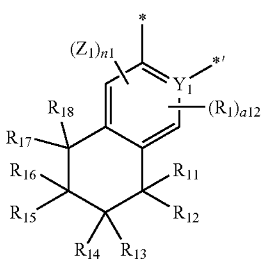
CY1-16
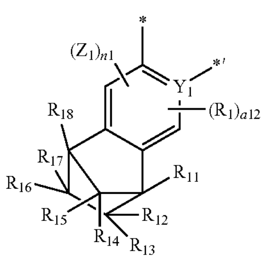
CY1-17
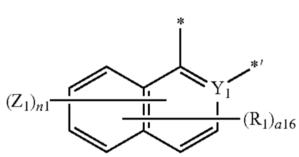
CY1-18
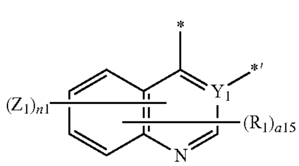
-continued
CY1-19
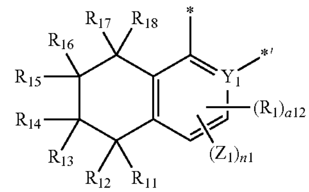
CY1-20
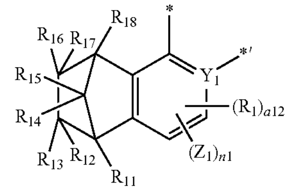
CY1-21
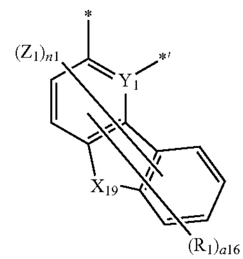
CY1-22
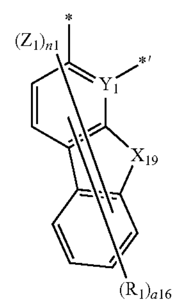
CY1-23
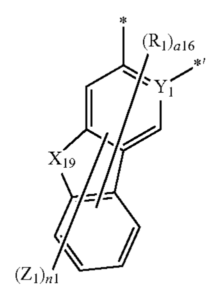
CY1-24
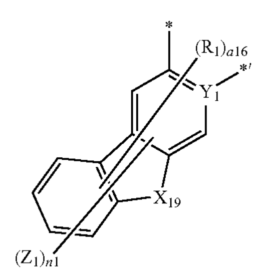

-continued
CY1-25
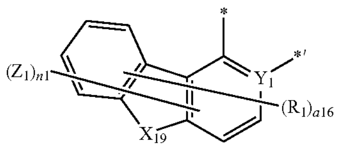
CY1-26
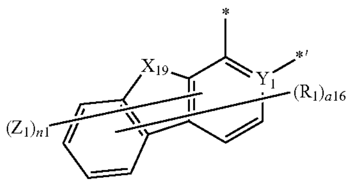
CY1-27
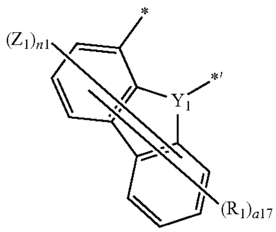
CY1-28
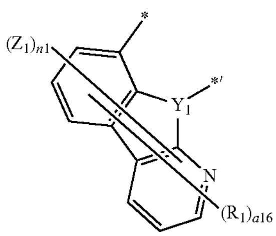
CY1-29
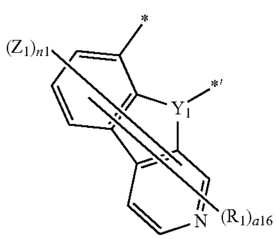
CY1-30
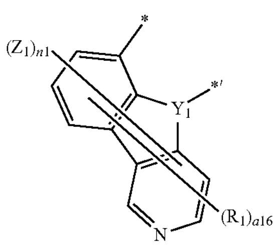
CY1-31
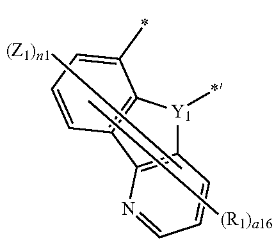
-continued
CY1-32
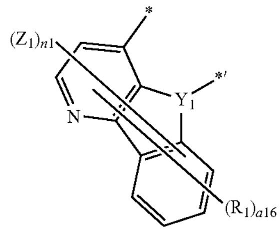
CY1-33
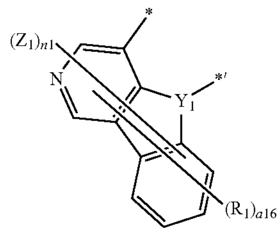
CY1-34
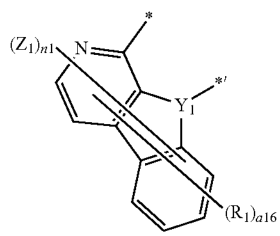
CY1-35
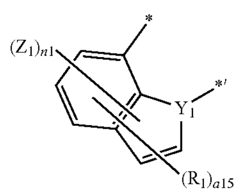
CY1-36
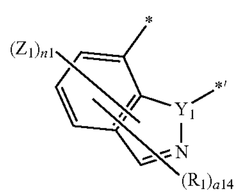
CY1-37
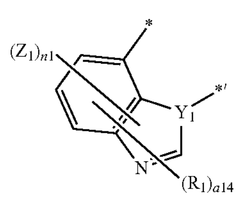
CY1-38
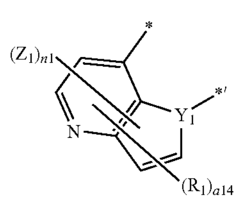

-continued

CY1-39

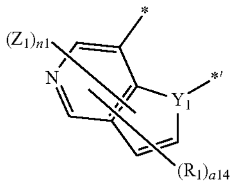

CY1-40

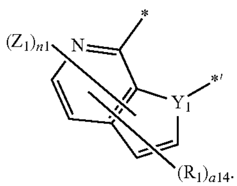

In Formula CY1-1 to CY1-40, $Y_1$, $R_1$, $Z_1$, and n1 are the same as described above, and n1 may be an integer from 0 to 7, $X_{19}$ may be $C(R_{19a})(R_{19b})$, $N[(L_{19})_{b19}-(R_{19})_{c19}]$, O, S, or $Si(R_{19a})(R_{19b})$, $L_{19}$ may be the same as explained in connection with $L_1$;

b19 and c19 are the same as described in connection with b1 and c1, $R_{11}$ to $R_{19}$, $R_{19a}$, and $R_{19b}$ are the same as described in connection with $R_1$, a12 may be an integer from 0 to 2, a13 may be an integer from 0 to 3, a14 may be an integer from 0 to 4, a15 may be an integer from 0 to 5, a16 may be an integer from 0 to 6, a17 may be an integer from 0 to 7,

*' indicates a binding site to $X_1$ or M in Formula 1, and

* indicates a binding site to $T_1$ in Formula 1.

n1 in Formula CY1-1 to CY1-40 has been described based on when n1 has its maximum value, and n1 may be an integer from 0 to 7, varying depending on a corresponding chemical formula. For example, n1 in Formula CY1-1 may be 0, 1, 2, 3, or 4, n1 in Formula CY1-2 may be 0, 1, 2, or 3, and n1 in Formula CY1-27 may be 0, 1, 2, 3, 4, 5, 6, or 7.

In one or more embodiments, regarding Formula 1, a moiety represented by

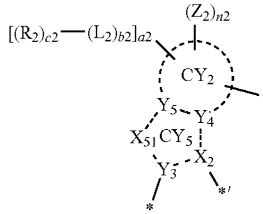

may be a group represented by one of Formulae CY2-1 to CY2-20:

CY2-1

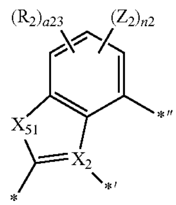

CY2-2

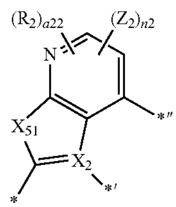

CY2-3

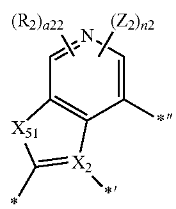

CY2-4

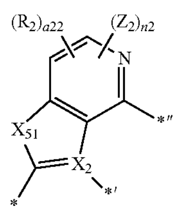

CY2-5

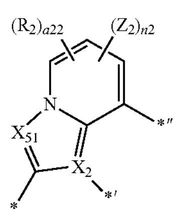

CY2-6

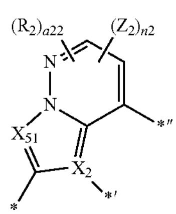

CY2-7

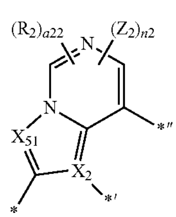

-continued

CY2-8

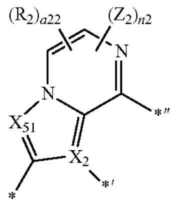

CY2-9

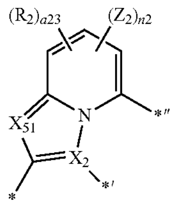

CY2-10

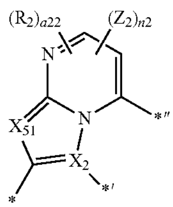

CY2-11

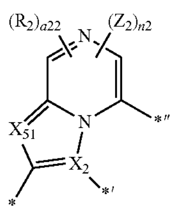

CY2-12

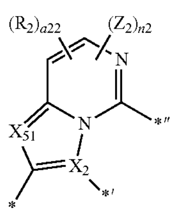

CY2-13

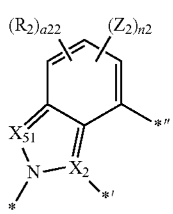

CY2-14

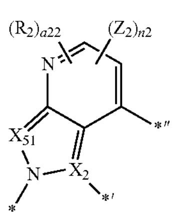

-continued

CY2-15

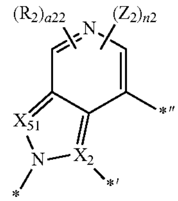

CY2-16

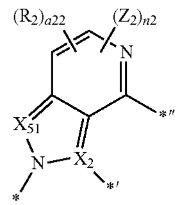

CY2-17

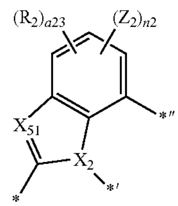

CY2-18

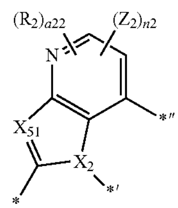

CY2-19

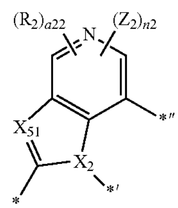

CY2-20

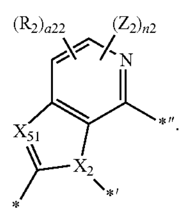

In Formulae CY2-1 to CY2-20, $X_2$, $R_2$, $Z_2$, and n2 are the same as described above, and n2 may be an integer from 0 to 3, $X_{51}$ in Formulae CY2-1 to CY2-4 may be O, S, N-[$(L_7)_{b7}$-$(R_7)_{c7}$], $C(R_7)(R_8)$, $Si(R_7)(R_8)$, $Ge(R_7)(R_8)$, or C(═O), $X_{51}$ in Formulae CY2-5 to CY2-20 may be N, $C(R_7)$, $Si(R_7)$, or $Ge(R_7)$, $L_7$, b7, $R_7$, and c7 may be the same as described above, a22 is an integer from 0 to 2, a23 is an integer from 0 to 3,

* indicates a binding site to $T_1$ in Formula 1,

*' indicates a binding site to M in Formula 1, and

*" indicates a binding site to ring $CY_3$ in Formula 1.

n2 in Formula CY2-1 to CY2-20 has been described based on when n2 has its maximum value, and n2 may be an integer from 0 to 3, varying depending on a corresponding chemical formula. For example, n2 in Formula CY2-1 may be 0, 1, 2, or 3, and n2 in Formula CY2-2 may be 0, 1, or 2.

In one or more embodiments, regarding Formula 1, a moiety represented by

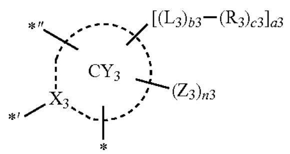

may be a group represented by one of Formulae CY3-1 to CY3-12:

CY3-1

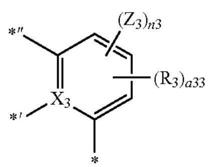

CY3-2

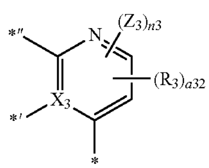

CY3-3

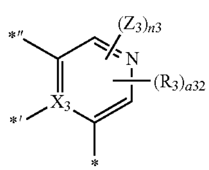

CY3-4

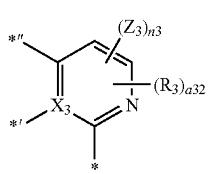

CY3-5

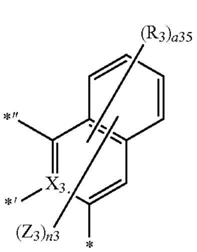

-continued

CY3-6

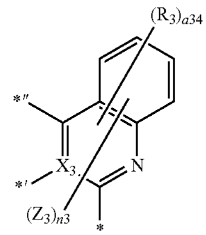

CY3-7

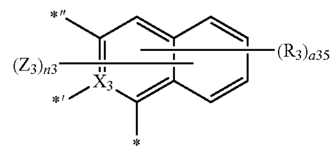

CY3-8

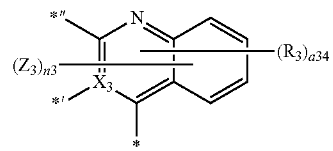

CY3-9

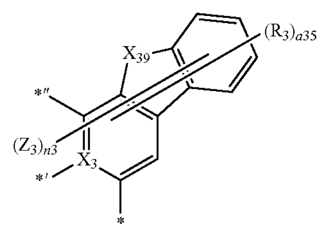

CY3-10

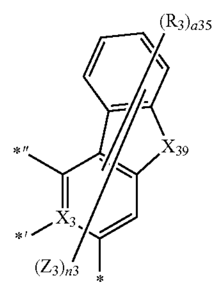

CY3-11

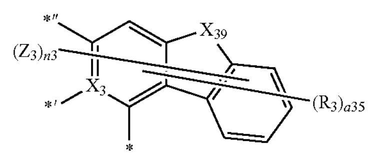

CY3-12

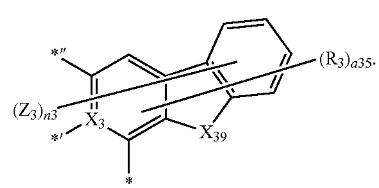

In Formulae CY3-1 to CY3-12, $X_3$, $R_3$, $Z_3$, and n3 are the same as described above, and n3 may be an integer from 0 to 5, $X_{39}$ may be $C(R_{39a})(R_{39b})$, $N[(L_{39})_{b39}-(R_{39})_{c39}]$, O, S, or $Si(R_{39a})(R_{39b})$, $L_{39}$ may be the same as explained in connection with $L_3$, b39 and c39 may be the same as described in connection with b3 and c3, $R_{39a}$ and $R_{39b}$ may be the same as described in connection with $R_3$, a32 may be an integer from 0 to 2, a33 may be an integer from 0 to 3, a34 may be an integer from 0 to 4, a35 may be an integer from 0 to 5,

* indicates a binding site to $T_2$ in Formula 1,

*' indicates a binding site to M in Formula 1, and

*" indicates a binding site to ring $CY_2$ in Formula 1.

n3 in Formulae CY3-1 to CY3-12 has been described based on when n3 has its maximum value, and n3 may be an integer from 0 to 5, varying depending on a corresponding chemical formula. For example, n3 in Formula CY3-1 may be 0, 1, 2, or 3, and n3 in Formula CY3-9 may be 0, 1, 2, 3, 4, or 5.

In one or more embodiments, regarding Formula 1, a moiety represented by

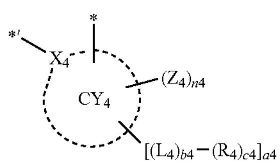

may be a group represented by one of Formulae CY4-1 to CY4-26:

CY4-1

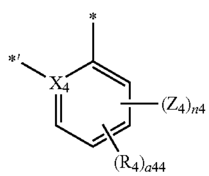

CY4-2

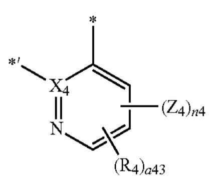

CY4-3

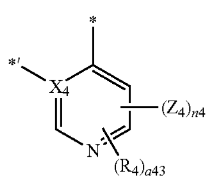

CY4-4

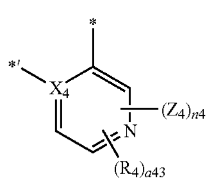

CY4-5

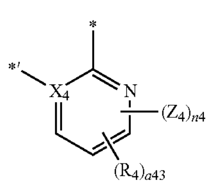

-continued

CY4-6

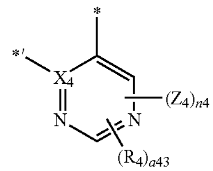

CY4-7

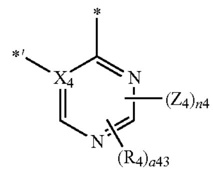

CY4-8

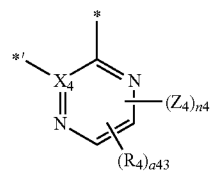

CY4-9

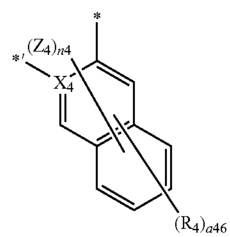

CY4-10

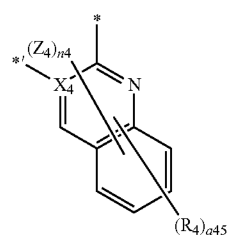

CY4-11

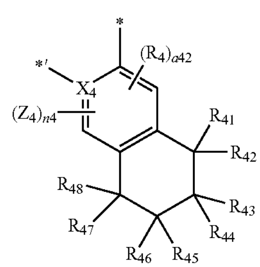

CY4-12

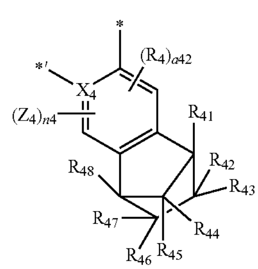

-continued
CY4-13
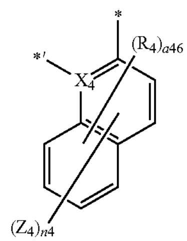
CY4-14
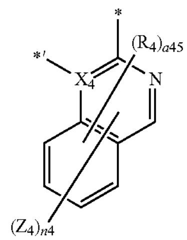
CY4-15
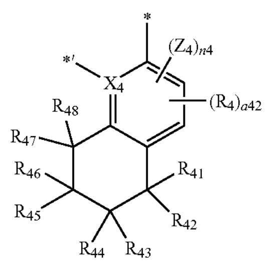
CY4-16
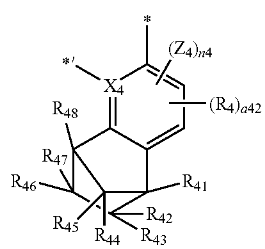
CY4-17
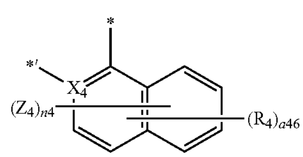
CY4-18
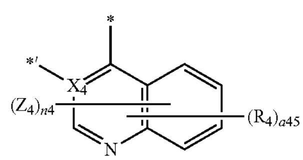
CY4-19
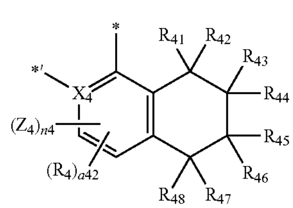
-continued
CY4-20
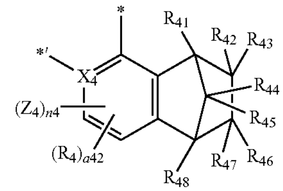
CY4-21
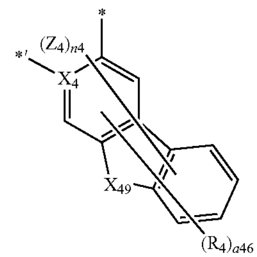
CY4-22
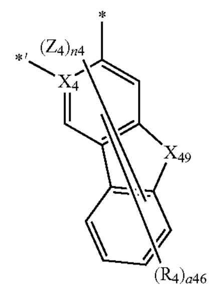
CY4-23
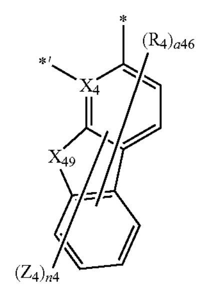
CY4-24
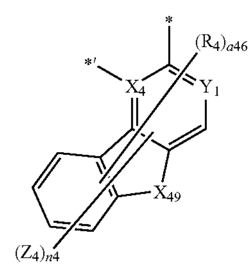
CY4-25
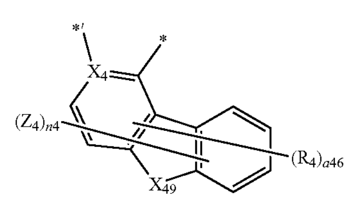

-continued

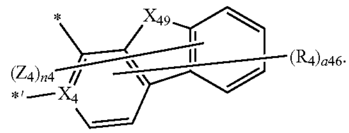

CY4-26

In Formulae CY4-1 to CY4-26, $X_4$, $R_4$, $Z_4$, and n4 may be the same as described above, and n4 may be 0, 1, 2, 3, 4, 5, or 6, $X_{49}$ may be $C(R_{49a})(R_{49b})$, $N[(L_{49})_{b49}\text{-}(R_{49})_{c49}]$, O, S, or $Si(R_{49a})(R_{49b})$, $L_{49}$ may be the same as explained in connection with $L_4$, b49 and c49 are the same as described in connection with b4 and c4, $R_{41}$ to $R_{49}$, $R_{49a}$, and $R_{49b}$ are the same as described in connection with $R_4$, a42 may be an integer from 0 to 2, a43 may be an integer from 0 to 3, a44 may be an integer from 0 to 4, a45 may be an integer from 0 to 5, a46 may be an integer from 0 to 6,

* indicates a binding site to $T_2$ in Formula 1, and

*' indicates a binding site to M in Formula 1.

n4 in Formulae CY4-1 to CY4-26 has been described based on when n4 has its maximum value, and n4 may be an integer from 0 to 6, varying depending on a corresponding chemical formula. For example, n4 in Formula CY4-1 may be 0, 1, 2, 3, or 4, n4 in Formula CY4-2 may be 0, 1, 2, or 3, and n4 in Formula CY4-17 may be 0, 1, 2, 3, 4, 5, or 6.

In one or more embodiments, regarding Formula 1, a moiety represented by

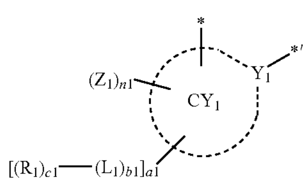

may be a group represented by one of Formulae CY1(1) to CY1(16) and CY1-d(1) to CY1-d(18), and (or), a moiety represented by

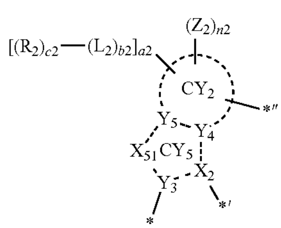

may be a group represented by one of Formulae CY2(1) to CY2(20) and CY2-d(1) to CY2-d(15), and (or), a moiety represented by

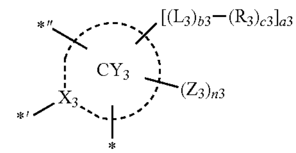

may be a group represented by one of Formulae CY3(1) to CY3(12) and CY3-d(1) to CY3-d(13), and (or), a moiety represented by

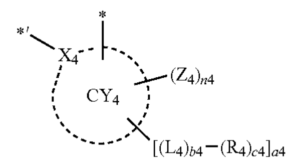

may be a group represented by one of Formulae CY4(1) to CY4(10) and CY4-d(1) to CY4-d(18), but embodiments are not limited thereto.

CY1(1)

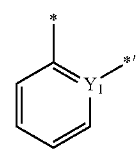

CY1(2)

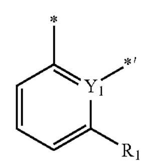

CY1(3)

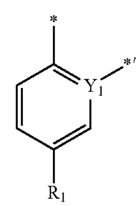

CY1(4)

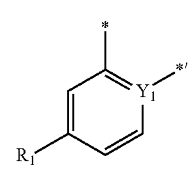

CY1(5)

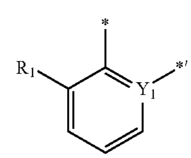

CY1(6)

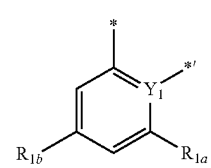

-continued
CY1(7)
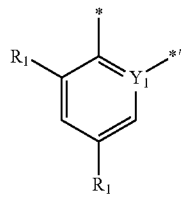
CY1(8)
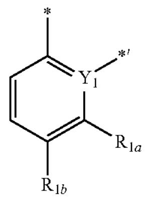
CY1(9)
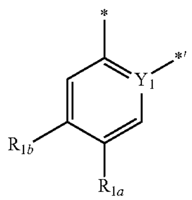
CY1(10)
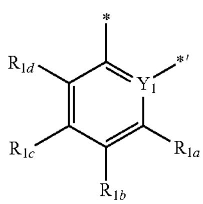
CY1(11)
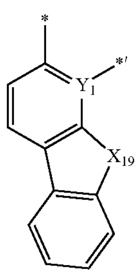
CY1(12)
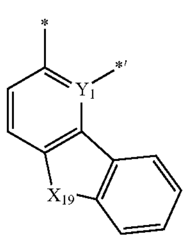
CY1(13)
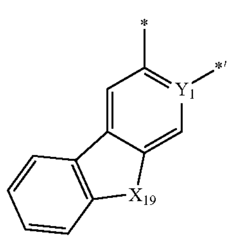
-continued
CY1(14)
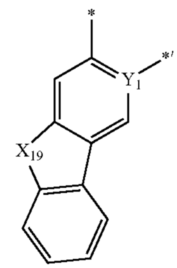
CY1(15)
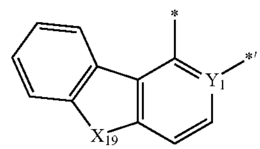
CY1(16)
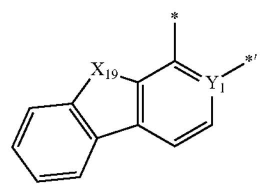
CY1-d(1)
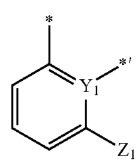
CY1-d(2)
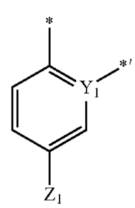
CY1-d(3)
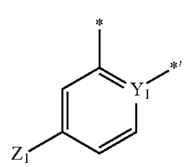
CY1-d(4)
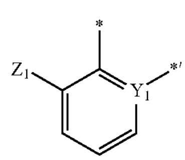
CY1-d(5)
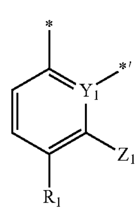

-continued
CY1-d(6)
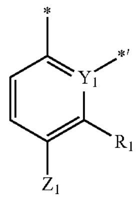
CY1-d(7)
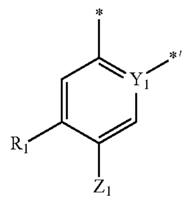
CY1-d(8)
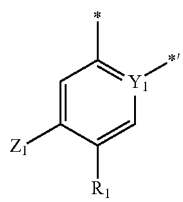
CY1-d(9)
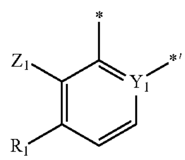
CY1-d(10)
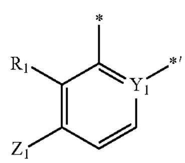
CY1-d(11)
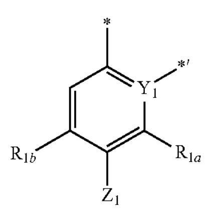
CY1-d(12)
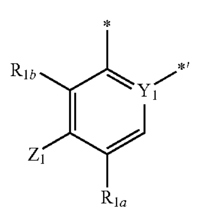
CY1-d(13)
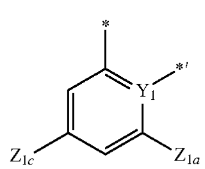
-continued
CY1-d(14)
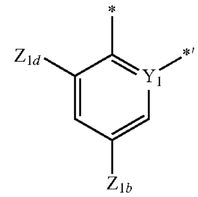
CY1-d(15)
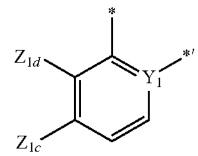
CY1-d(16)
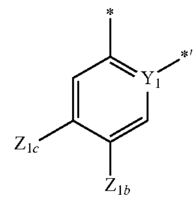
CY1-d(17)
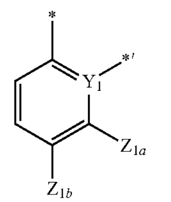
CY1-d(18)
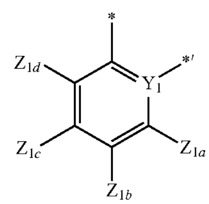
CY2(1)
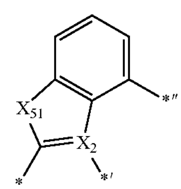
CY2(2)
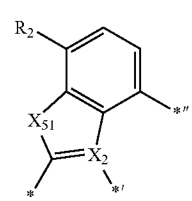
CY2(3)
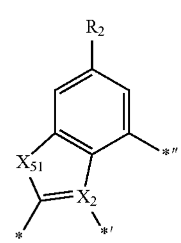

-continued
CY2(4)
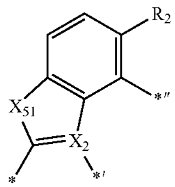
CY2(5)
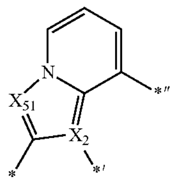
CY2(6)
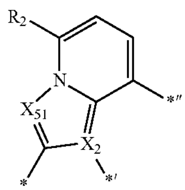
CY2(7)
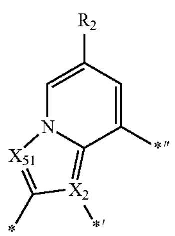
CY2(8)
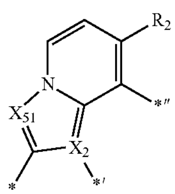
CY2(9)
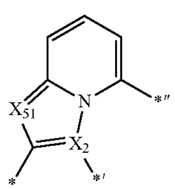
CY2(10)
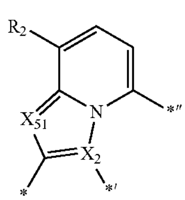
CY2(11)
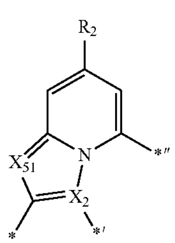
-continued
CY2(12)
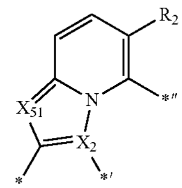
CY2(13)
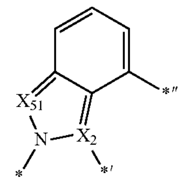
CY2(14)
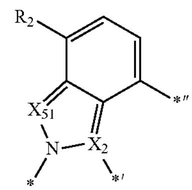
CY2(15)
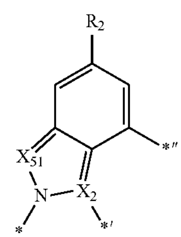
CY2(16)
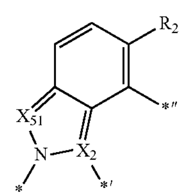
CY2(17)
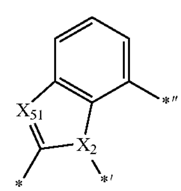
CY2(18)
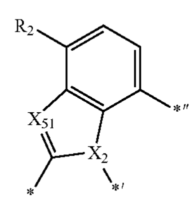
CY2(19)
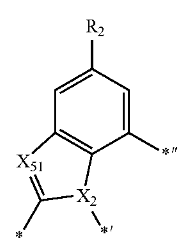

-continued
CY2(20)
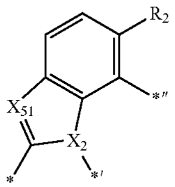
CY2-d(1)
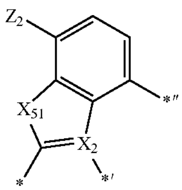
CY2-d(2)
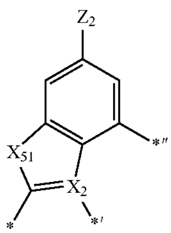
CY2-d(3)
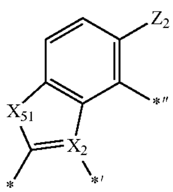
CY2-d(4)
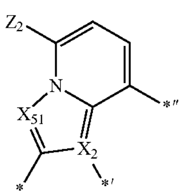
CY2-d(5)
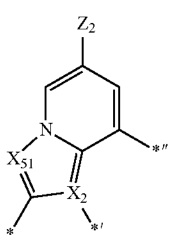
CY2-d(6)
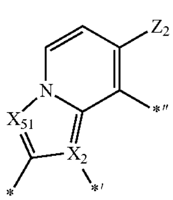
CY2-d(7)
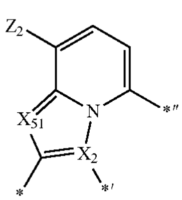
-continued
CY2-d(8)
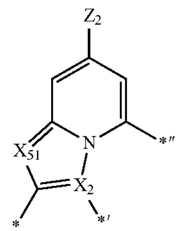
CY2-d(9)
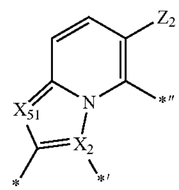
CY2-d(10)
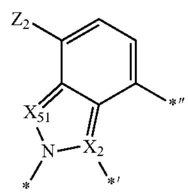
CY2-d(11)
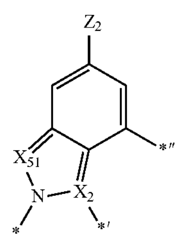
CY2-d(12)
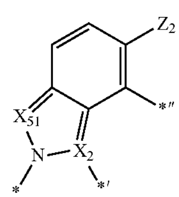
CY2-d(13)
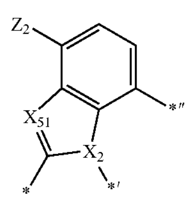
CY2-d(14)
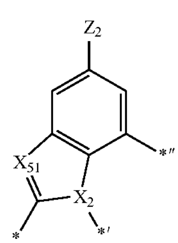

CY2-d(15)
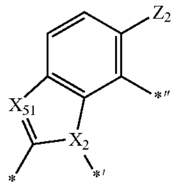
CY3(1)
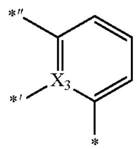
CY3(2)
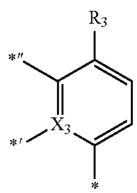
CY3(3)
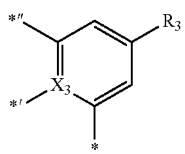
CY3(4)
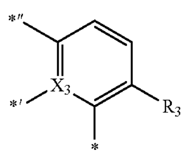
CY3(5)
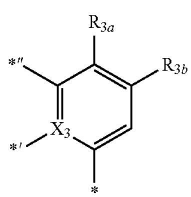
CY3(6)
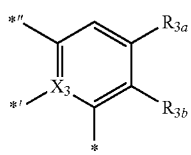
CY3(7)
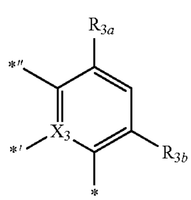
CY3(8)
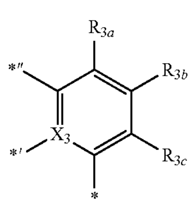
CY3(9)
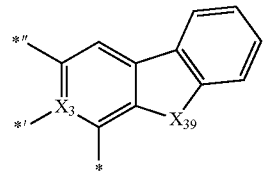
CY3(10)
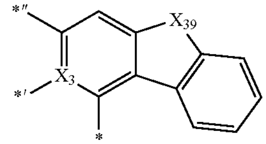
CY3(11)
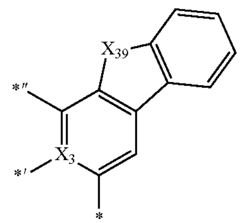
CY3(12)
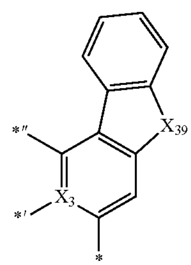
CY3-d(1)
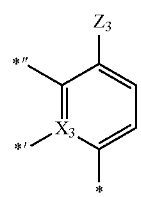
CY3-d(2)
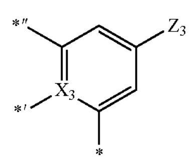
CY3-d(3)
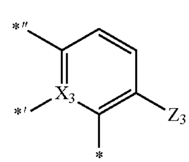
CY3-d(4)
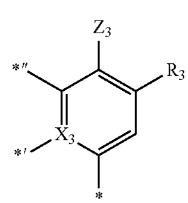

-continued
CY3-d(5)
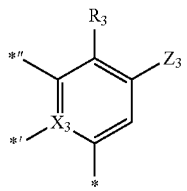
CY3-d(6)
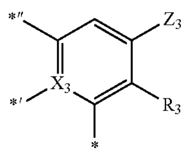
CY3-d(7)
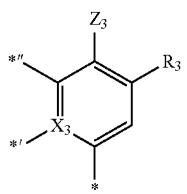
CY3-d(8)
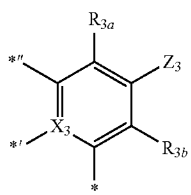
CY3-d(9)
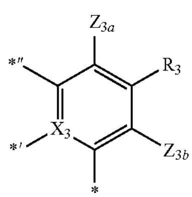
CY3-d(10)
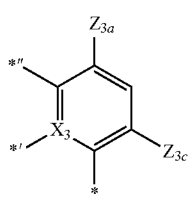
CY3-d(11)
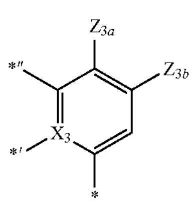
CY3-d(12)
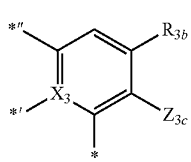
-continued
CY3-d(13)
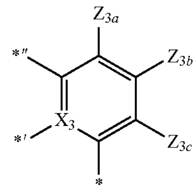
CY4(1)
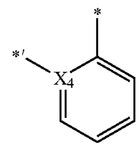
CY4(2)
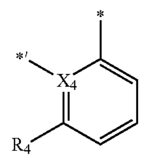
CY4(3)
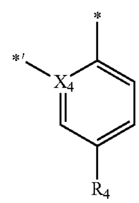
CY4(4)
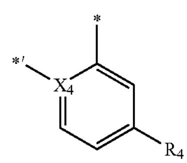
CY4(5)
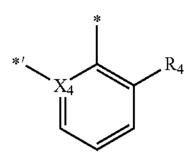
CY4(6)
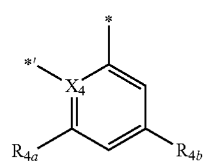
CY4(7)
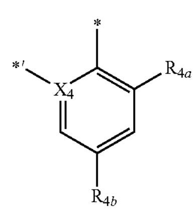
CY4(8)
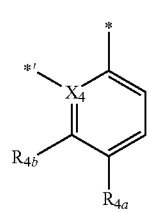

-continued
CY4(9)
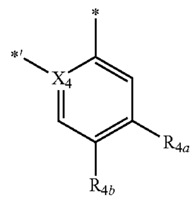
CY4(10)
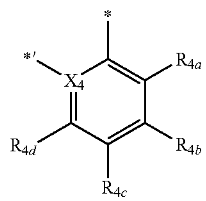
CY4-d(1)
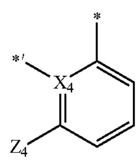
CY4-d(2)
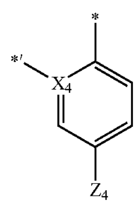
CY4-d(3)
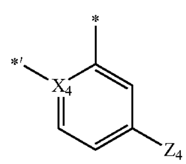
CY4-d(4)
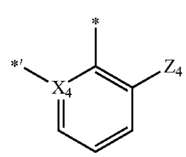
CY4-d(5)
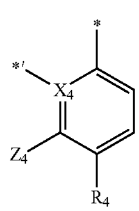
CY4-d(6)
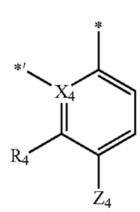
-continued
CY4-d(7)
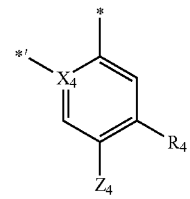
CY4-d(8)
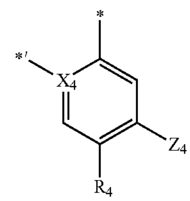
CY4-d(9)
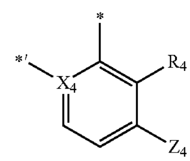
CY4-d(10)
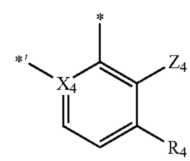
CY4-d(11)
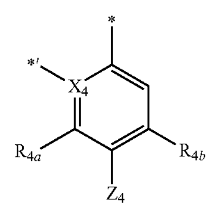
CY4-d(12)
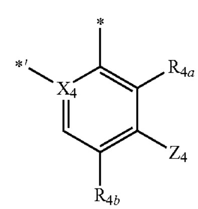
CY4-d(13)
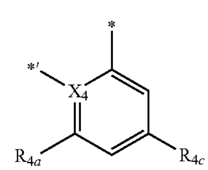
CY4-d(14)
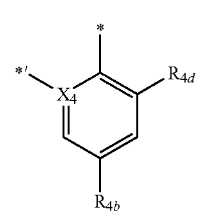

-continued

CY4-d(15)

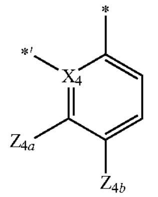

CY4-d(16)

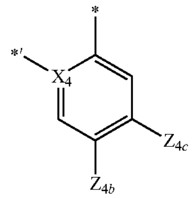

CY4-d(17)

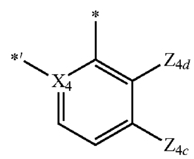

CY4-d(18)

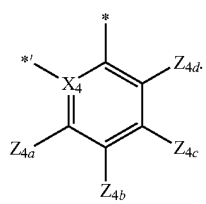

In Formulae CY1(1) to CY1 (16), CY1-d(1) to CY1-d (18), CY2(1) to CY2(20), CY2-d(1) to CY2-d(15), CY3(1) to CY3(12), CY3-d(1) to CY3-d(13), CY4(1) to CY4(10), and CY4-d(1) to CY4-d(18), $X_2$ to $X_4$, $Y_1$, $X_{51}$, $R_1$ to $R_4$ and $Z_1$ to $Z_4$ may be the same as described above, $X_{19}$ may be $C(R_{19a})(R_{19b})$, $N[(L_{19})_{b19}\text{-}(R_{19})_{c19}]$, O, S, or $Si(R_{19a})(R_{19b})$, $X_{39}$ may be $C(R_{39a})(R_{39b})$, $N[(L_{39})_{b39}\text{-}(R_{39})_{c39}]$, O, S, or $Si(R_{39a})(R_{39b})$, $L_{19}$, b19, $R_{19}$, and c19 are the same as described in connection with $L_1$, b1, $R_1$, and c1, respectively, $L_{39}$, b39, $R_{39}$, and c39 are the same as described in connection with $L_3$, b3, $R_3$, and c3, respectively.

$R_{1a}$ to $R_{1d}$, $R_{19a}$, and $R_{19b}$ are the same as described in connection with $R_1$, $R_{3a}$ to $R_{3c}$, $R_{39a}$, and $R_{39b}$ are the same as described in connection with $R_3$, $R_{4a}$ to $R_{4d}$ may be the same as described in connection with $R_4$, each of $R_1$ to $R_4$, $R_{1a}$ to $R_{1d}$, $R_{3a}$ to $R_{3c}$ and $R_{4a}$ to $R_{4d}$ is not hydrogen, $Z_{1a}$ to $Z_{1d}$ are the same as described in connection with $Z_1$, $Z_{3a}$ to $Z_{3c}$ are the same as described in connection with $Z_3$, $Z_{4a}$ to $Z_{4d}$ are the same as described in connection with $Z_4$, regarding Formula CY1(1) to CY1(16) and CY1-d(1) to CY1-d(18), *' indicates a binding site to $X_1$ or M in Formula 1, and * indicates a binding site to $T_1$ in Formula 1, regarding Formulae CY2(1) to CY2(20) and CY2-d(1) to CY2-d(15), *' indicates a binding site to M in Formula 1, * indicates a binding site to $T_1$ in Formula 1, and *" indicates a binding site to ring $CY_3$ in Formula 1, regarding Formulae CY3(1) to CY3(12) and CY3-d(1) to CY3-d(13), *' indicates a binding site to M in Formula 1, *" indicates a binding site to ring $CY_2$ in Formula 1, and * indicates a binding site to $T_2$ in Formula 1, and regarding Formulae CY4(1) to CY4(10) and CY4-d(1) to CY4-d(18), *' indicates a binding site to M in Formula 1, and * indicates a binding site to $T_2$ in Formula 1.

In an embodiment, each of $R_1$ to $R_4$, $R_{1a}$ to $R_{1d}$, $R_{3a}$ to $R_{3c}$ and $R_{4a}$ to $R_{4d}$ in Formulae $CY_1(1)$ to $CY_1(16)$, CY2(1) to CY2(20), CY3(1) to CY3(13) and CY4(1) to CY4(10) may not be deuterium and a deuterium-containing group.

In one or more embodiments, Formula 1 may satisfy at least one of Condition 1 to Condition 5:

Condition 1

In Formula 1, a moiety represented by

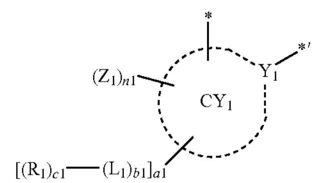

may be a group represented by one of Formulae CY1-d(1) to CY1-d(18).

Condition 2

In Formula 1, a moiety represented by

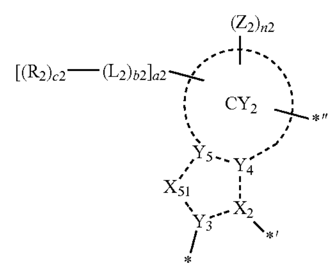

may be a group represented by one of Formulae CY2-d(1) to CY2-d(15).

Condition 3

In Formula 1, a moiety represented by

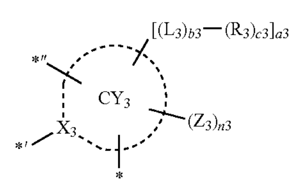

is a group represented by one of Formulae CY3-d(1) to CY3-d(13).

Condition 4

In Formula 1, a moiety represented by

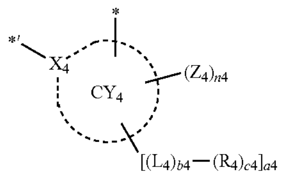

may be a group represented by one of Formulae CY4-d(1) to CY4-d(18).

Condition 5 a) in Formula 1, a moiety represented by

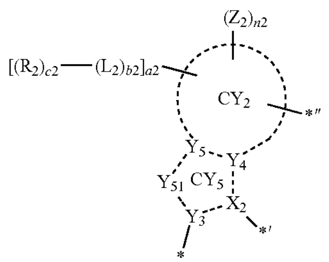

may be a group represented by one of Formulae CY2(1) to CY2(20), and b) regarding Formulae CY2(1) to CY2(20), i) $X_{51}$ is N-[$(L_7)_{b7}$-$(R_7)_{c7}$], C($R_7$), Si($R_7$), or Ge($R_7$), and $R_7$ is deuterium or a deuterium-containing group, or ii) $X_{51}$ is C($R_7$)($R_8$), Si($R_7$)($R_8$), or Ge($R_7$)($R_8$), and at least one of $R_7$ and $R_8$ is deuterium or a deuterium-containing group.

Regarding Formula 1, i) two of a plurality of neighboring groups $R_1$ may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, ii) two of a plurality of neighboring groups $R_2$ may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iii) two of a plurality of neighboring groups $R_3$ may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iv) two of a plurality of neighboring groups $R_4$ may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and v) two or more neighboring substituents selected from $R_1$ to $R_4$, $R_7$ to $R_{10}$, R' and R" may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$. Herein, the $C_5$-$C_{30}$ carbocyclic group and the $C_1$-$C_{30}$ heterocyclic group may be understood by referring to the descriptions about i) the first ring, ii) the second ring, iii) the condensed ring in which two or more first rings are condensed with each other, iv) the condensed ring in which two or more second rings are condensed with each other, and v) the condensed ring in which one or more first rings and one or more second rings are condensed with each other, and $R_{10a}$ may be understood by referring to the description about $R_1$.

"An azabenzothiophene, an azabenzofuran, an azaindene, an azaindole, an azabenzosilole, an azadibenzothiophene, an azadibenzofuran, an azafluorene, an azacarbazole, and an azadibenzosilole" may have the same backbone as those of "a benzothiophene, a benzofuran, an indene, an indole, a benzosilole, a dibenzothiophene, a dibenzofuran, a fluorene, a carbazole, and a dibenzosilole," respectively, and may each be a heteroring in which at least one of ring-forming carbon atoms is substituted with nitrogen.

In one embodiment, the organometallic compound represented by Formula 1 may be represented by Formula 1A as follows:

Formula 1A

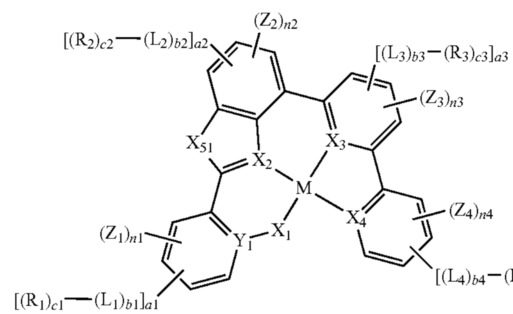

In Formula 1A, the descriptions for M, $X_1$ to $X_4$, $Y_1$, $X_{51}$, $L_1$ to $L_4$, b1 to b4, $R_1$ to $R_4$, c1 to c4, $Z_1$ to $Z_4$, a1 to a4 and n1 to n4 may be the same as described in this disclosure.

For example, the organometallic compound represented by Formula 1 may be one of Compounds 1 to 666 below, but embodiments of the present disclosure are not limited thereto.

1

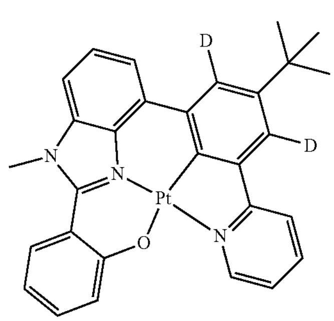

2

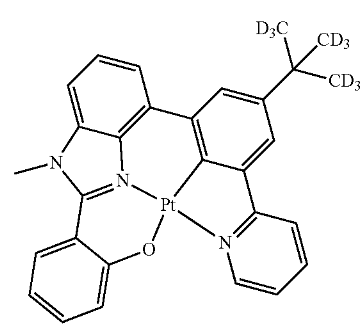

-continued
3
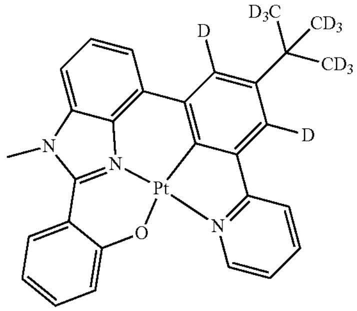
4
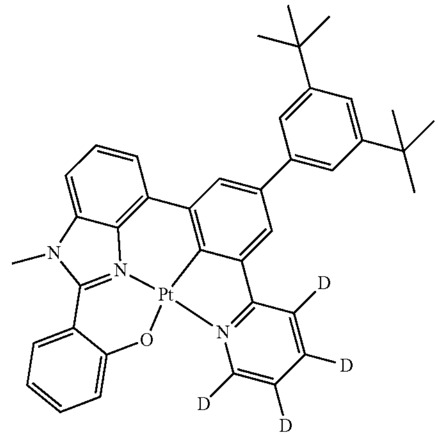
5
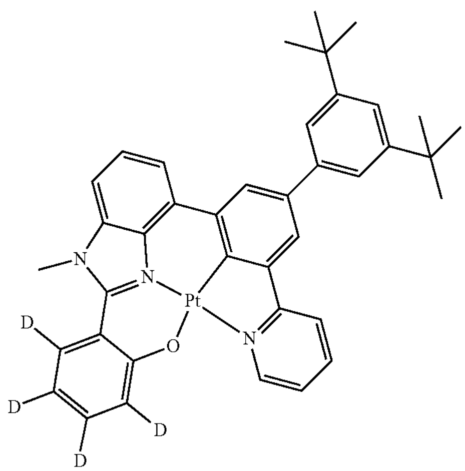
6
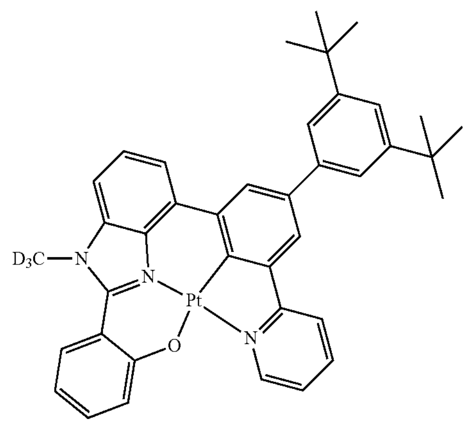
7
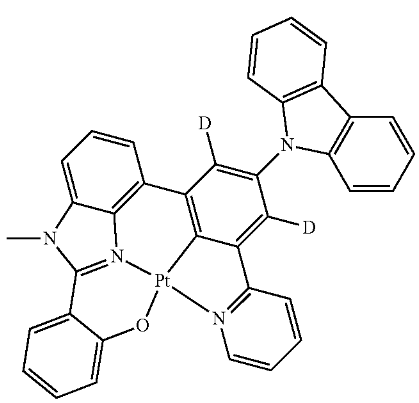
8
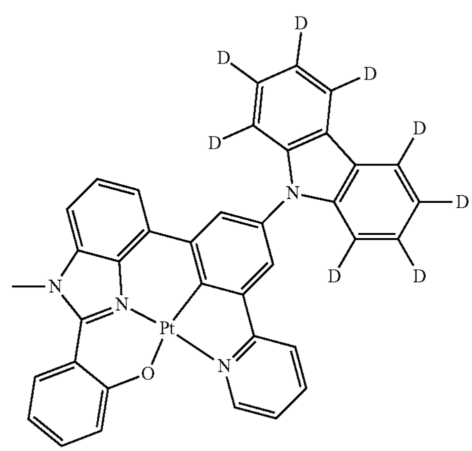

-continued
9
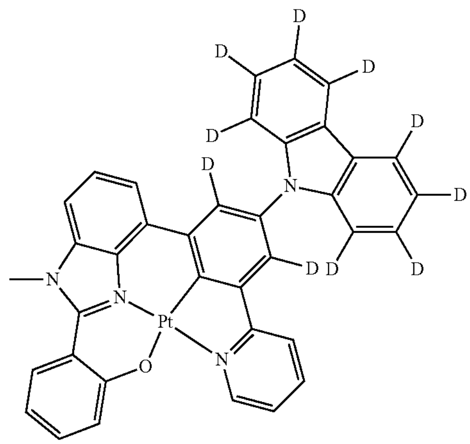
10
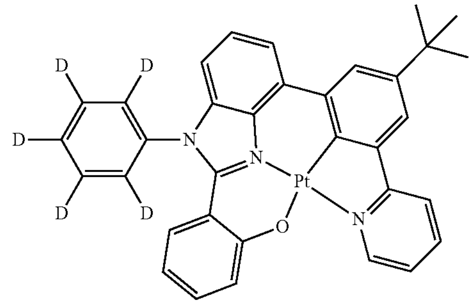
11
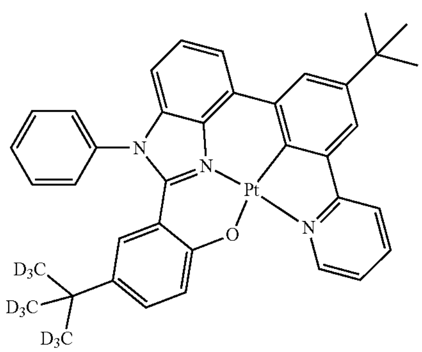
12
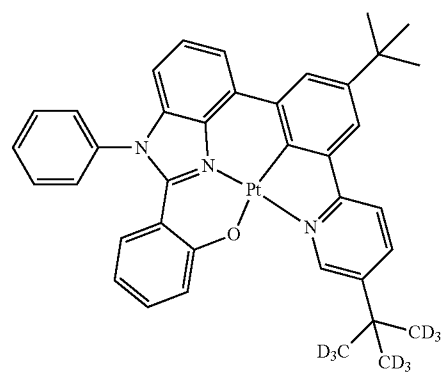
13
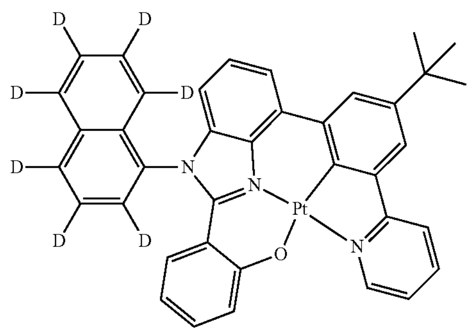
14
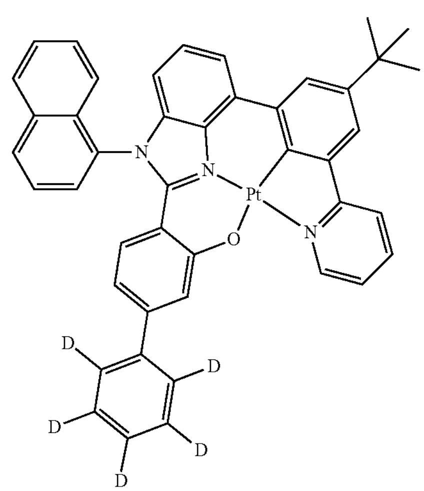

-continued
15
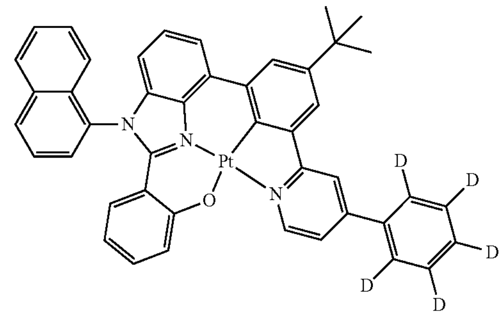
16
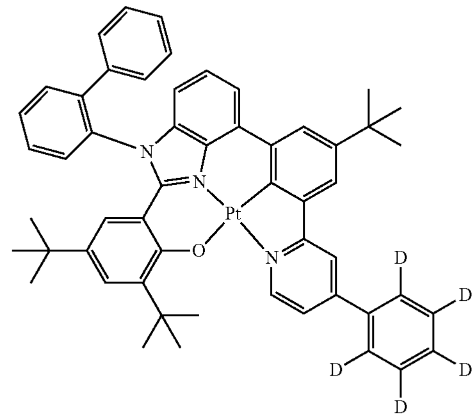
17
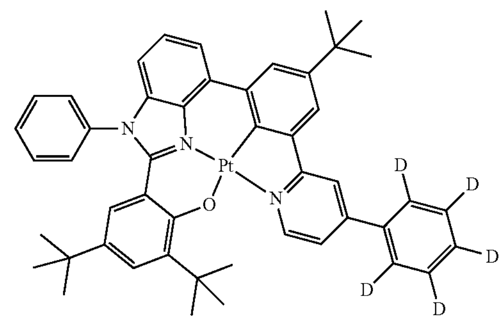
18
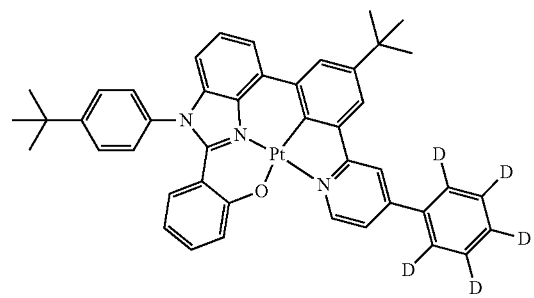
19
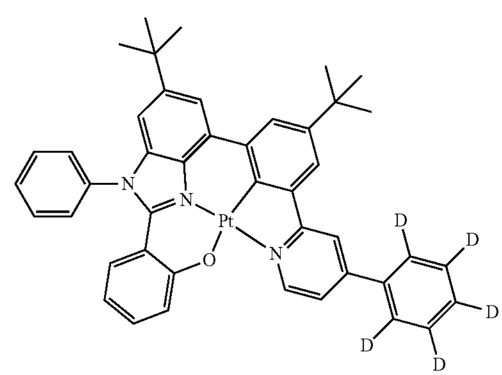
20
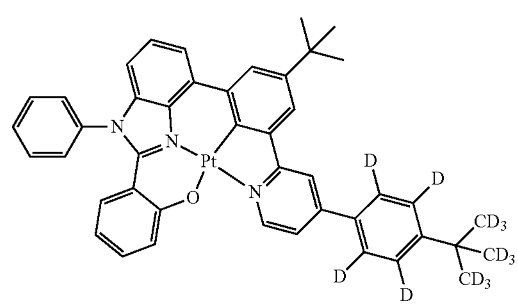
21
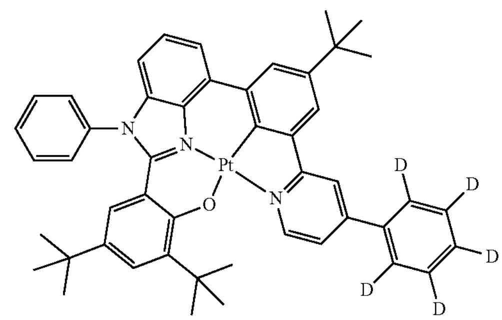
22
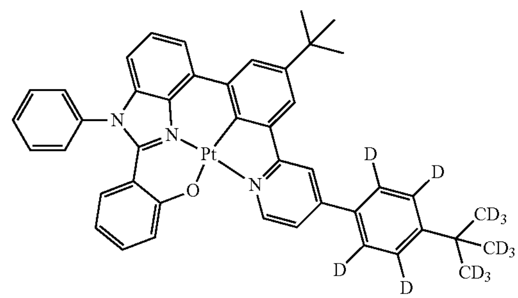

-continued
23
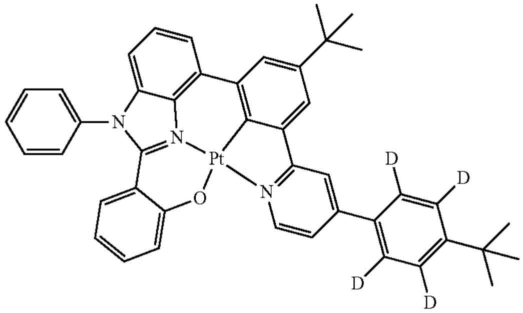
24
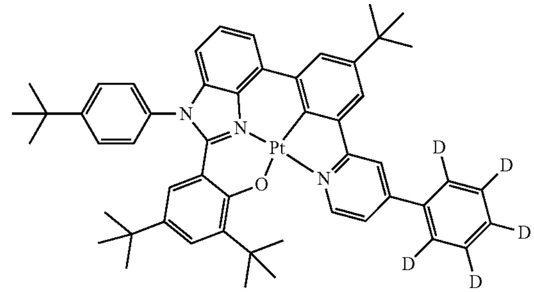
25
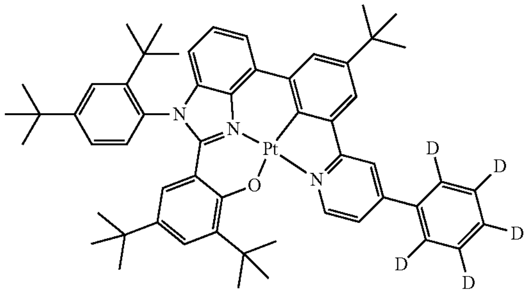
26
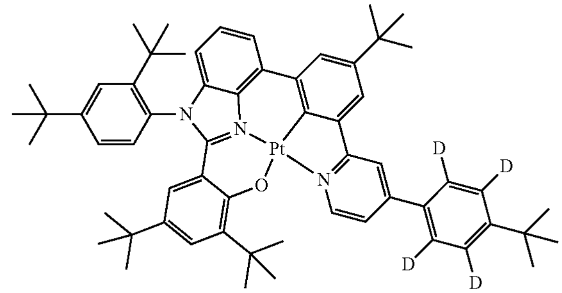
27
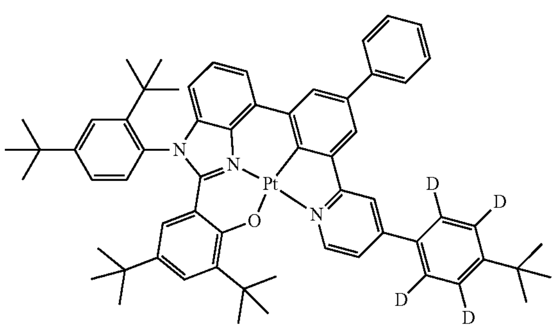
28
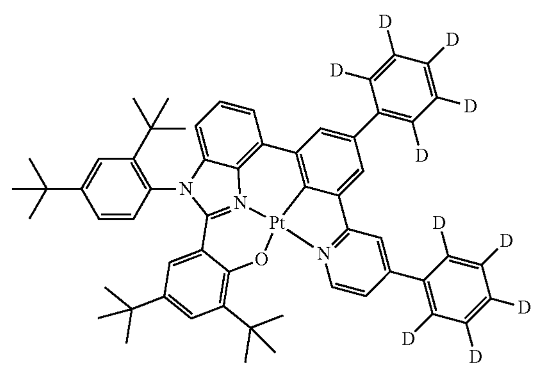
29
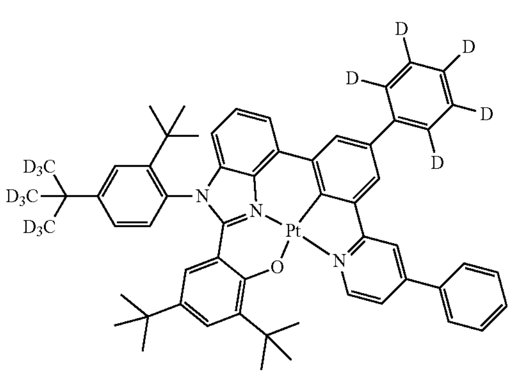
30
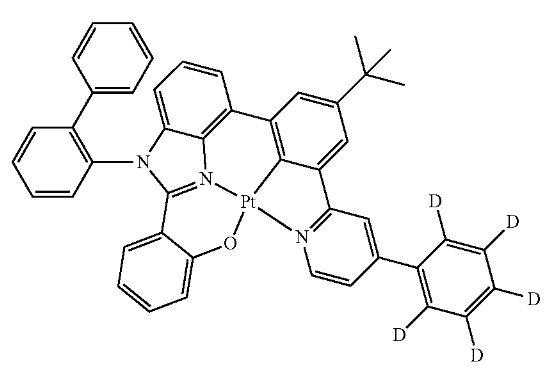

-continued
31
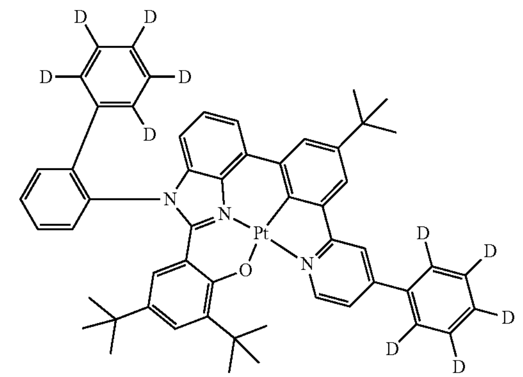
32
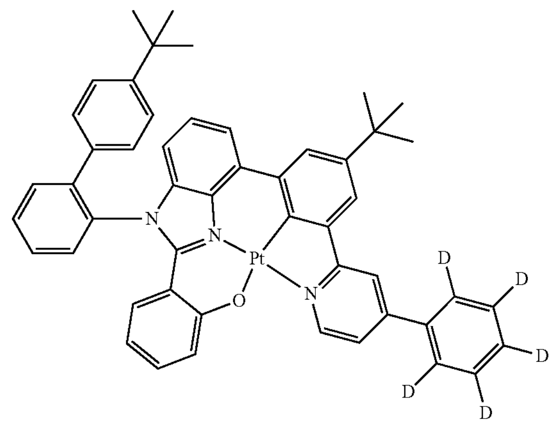
33
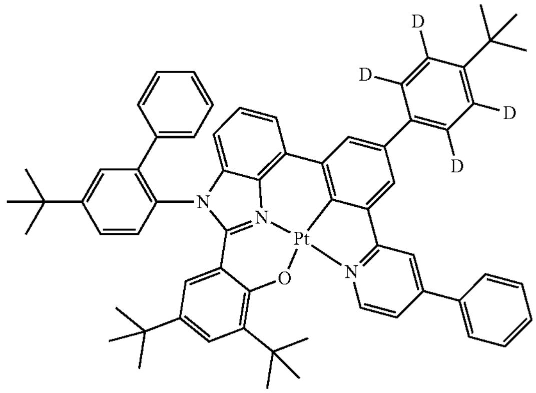
34
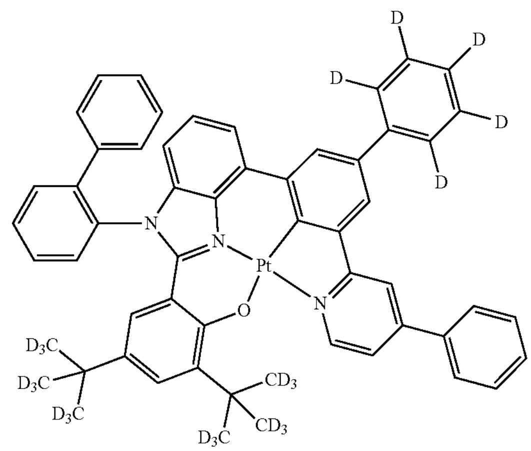
35
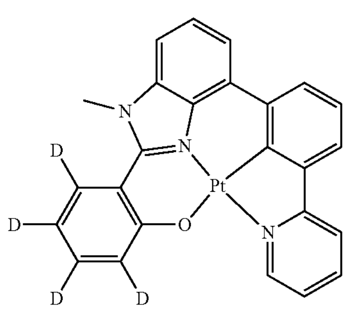
36
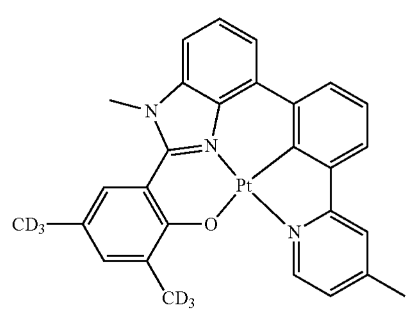
37
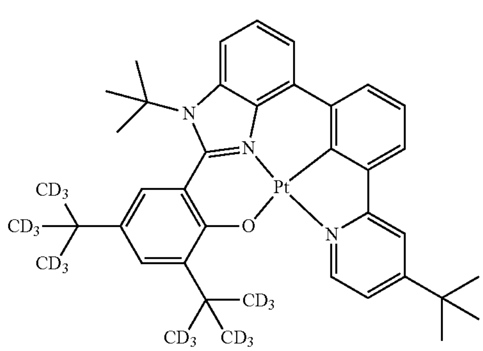
38
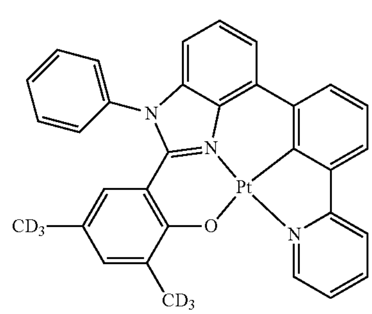

-continued
39
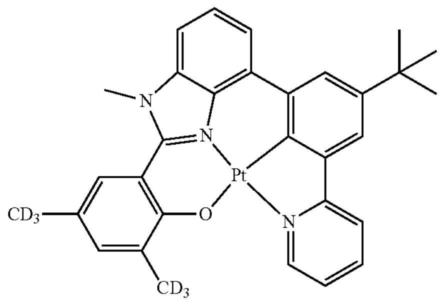
40
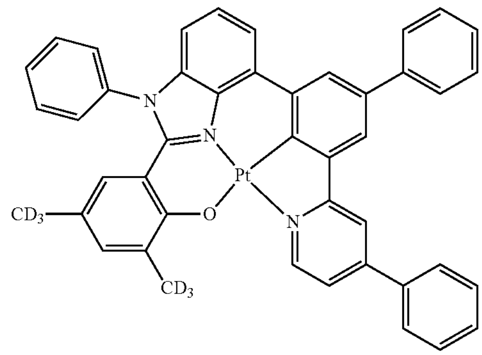
41
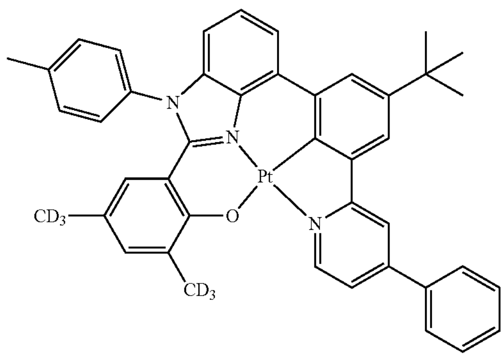
42
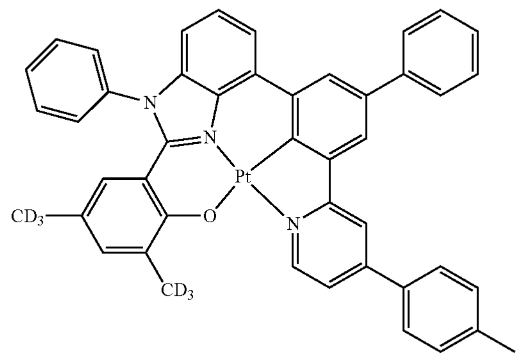
43
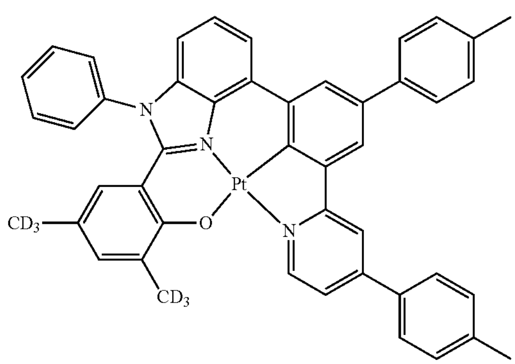
44
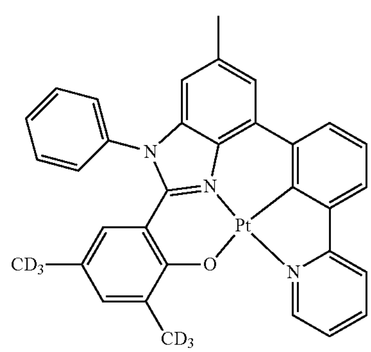
45
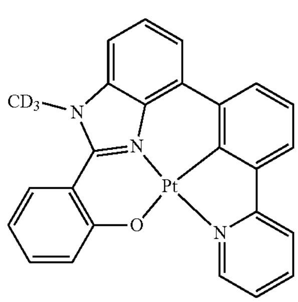
46
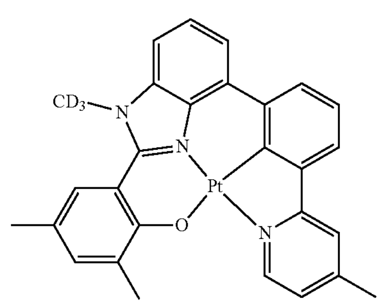

-continued
47
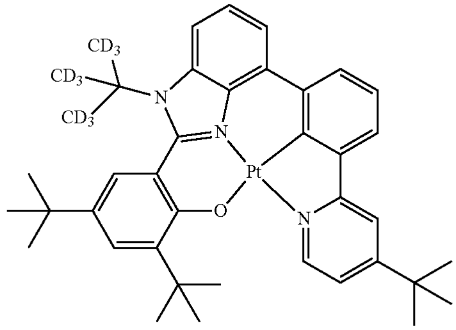
48
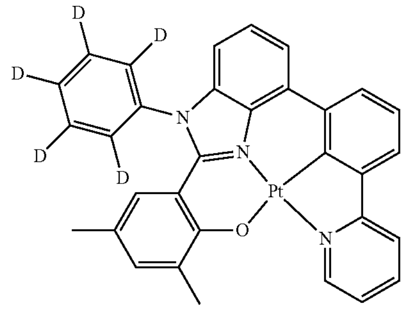
49
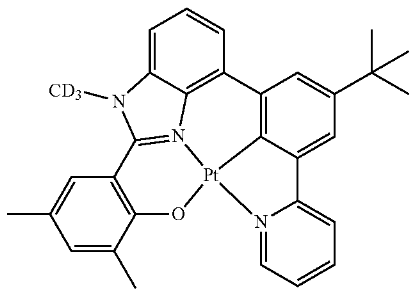
50
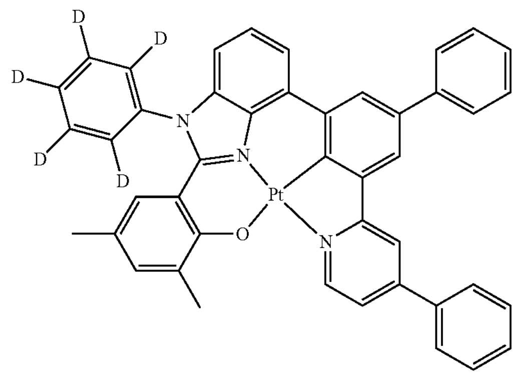
51
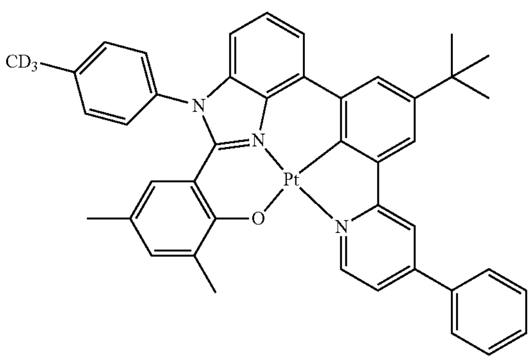
52
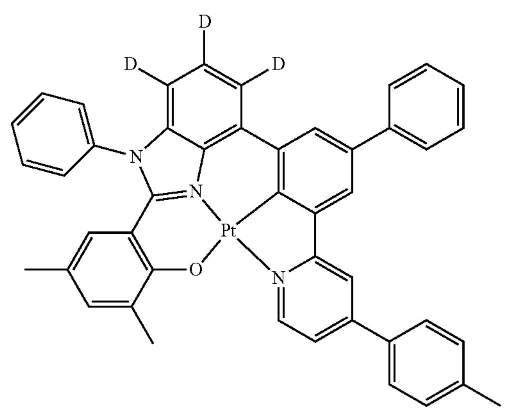
53
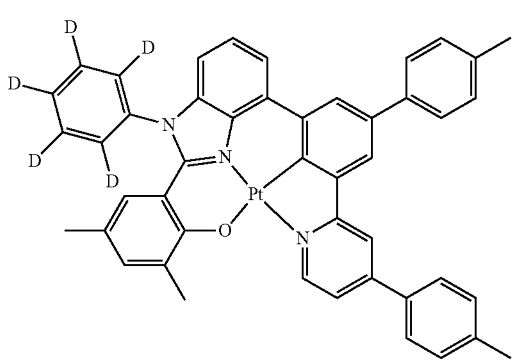
54
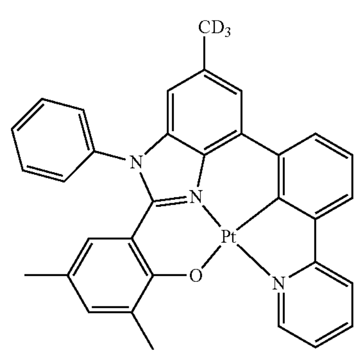

-continued
55
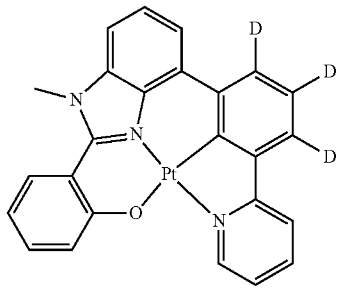
56
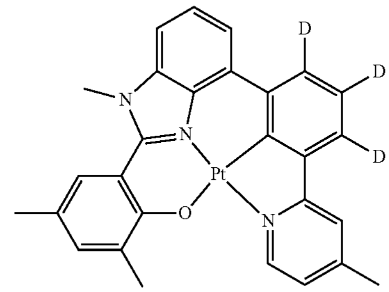
57
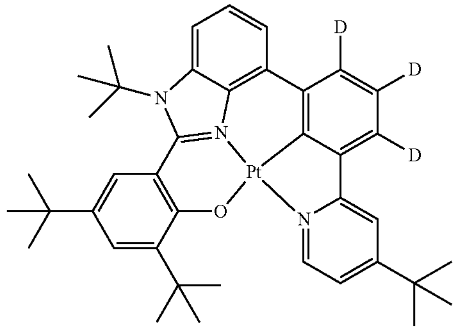
58
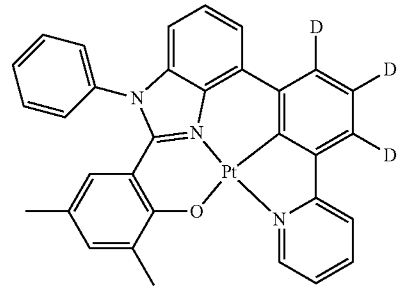
59
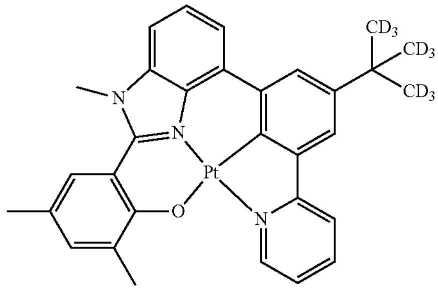
60
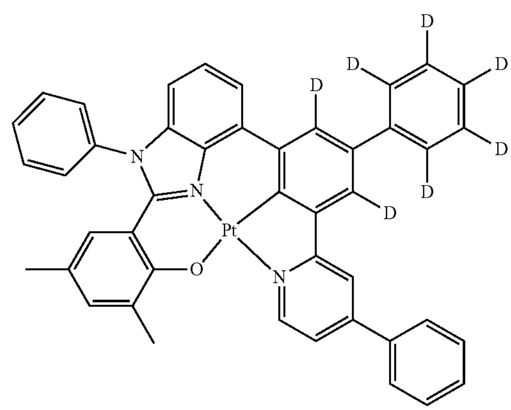
61
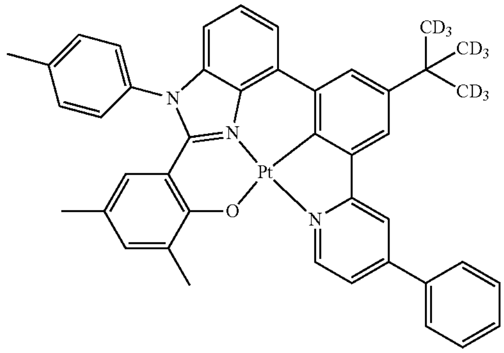
62
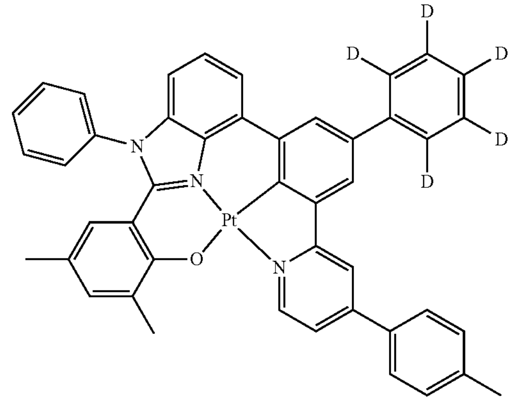

-continued
63
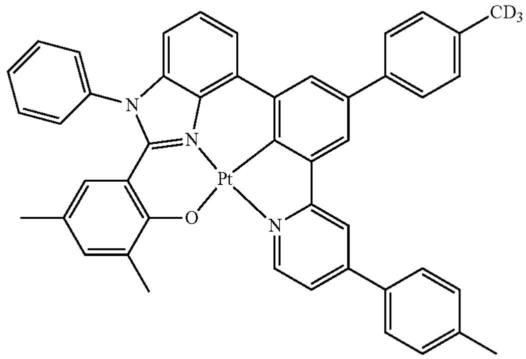
64
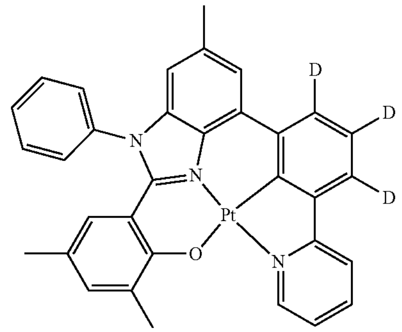
65
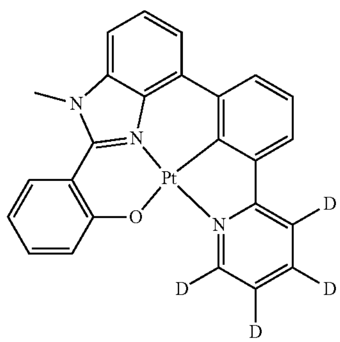
66
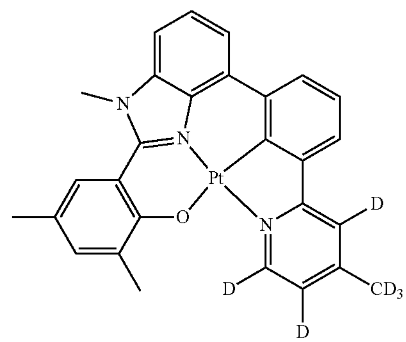
67
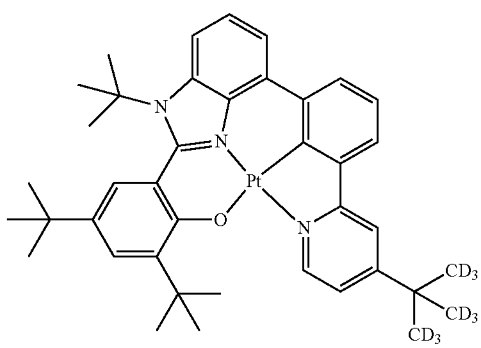
68
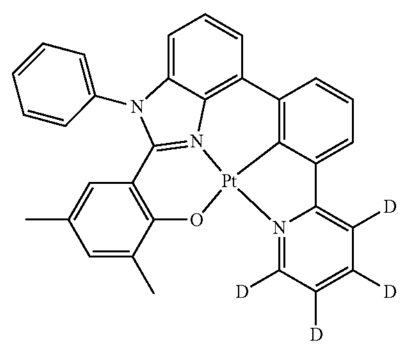
69
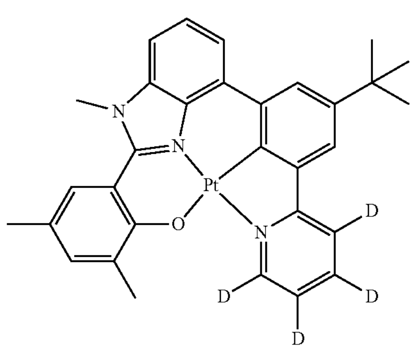
70
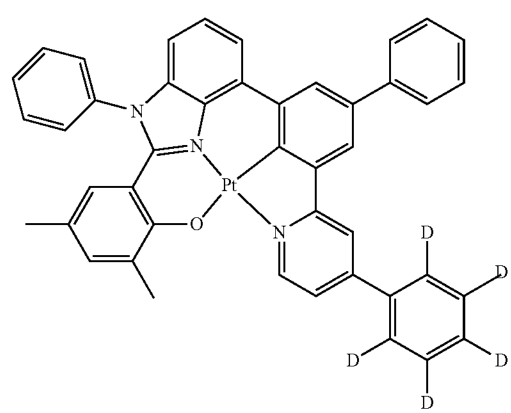

-continued
71
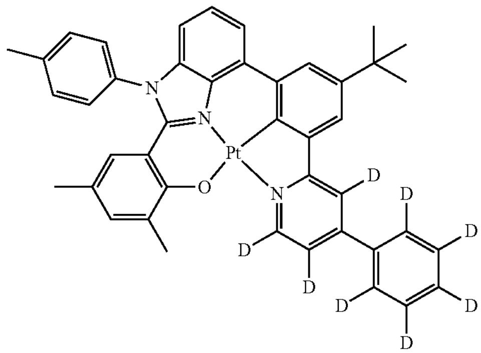
72
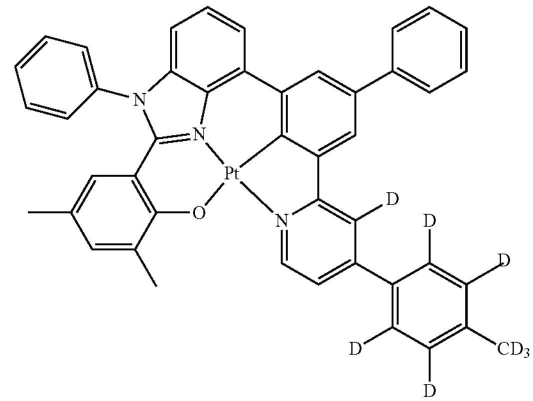
73
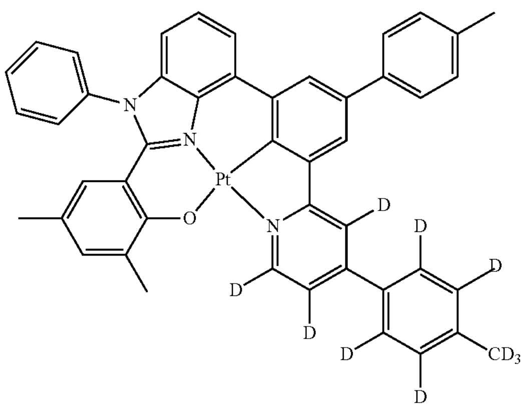
74
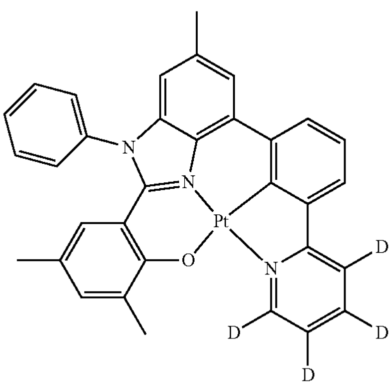
75
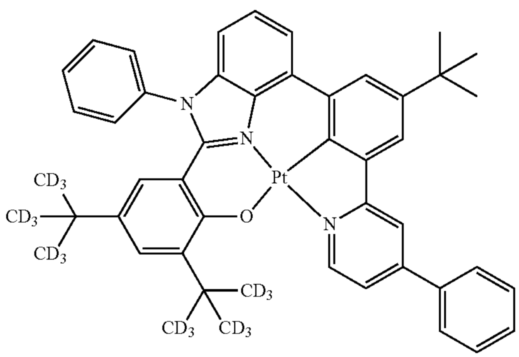
76
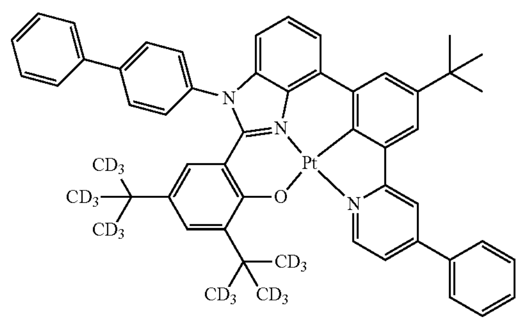
77
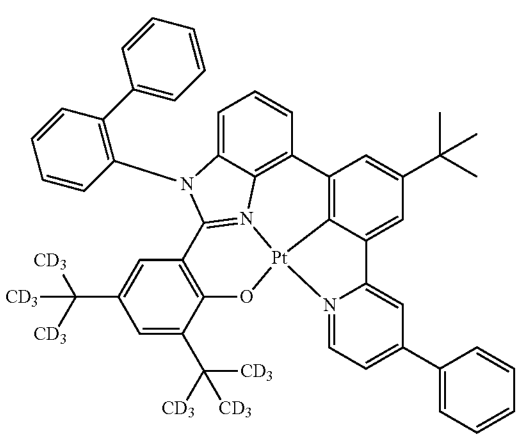
78
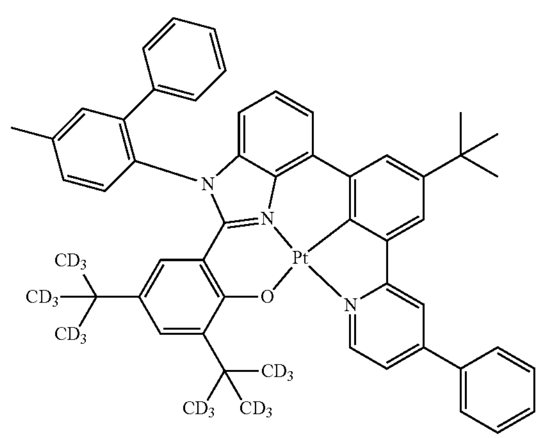

-continued
79
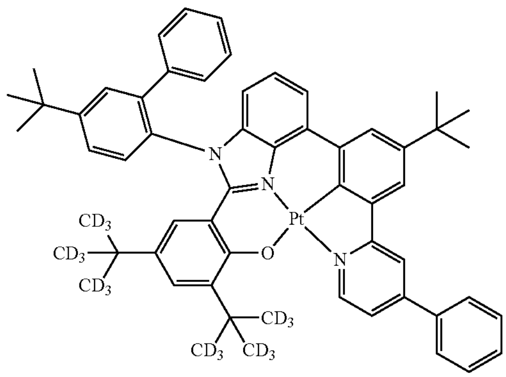
80
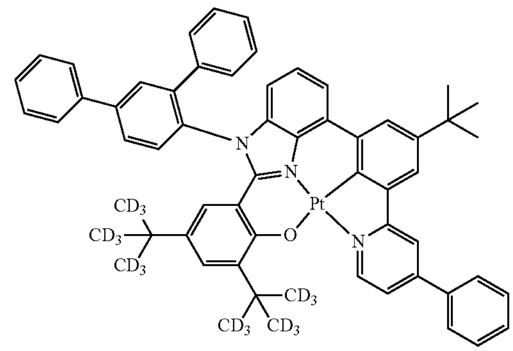
81
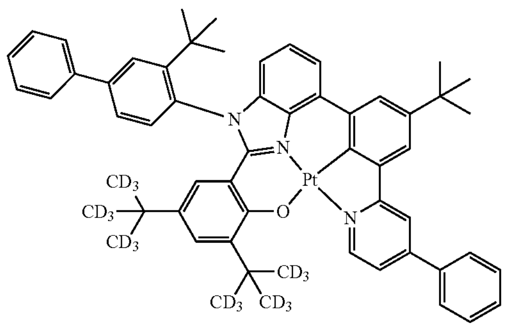
82
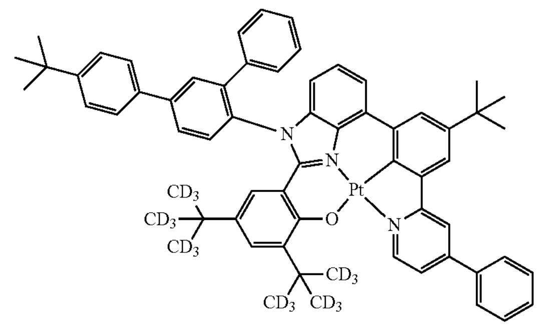
83
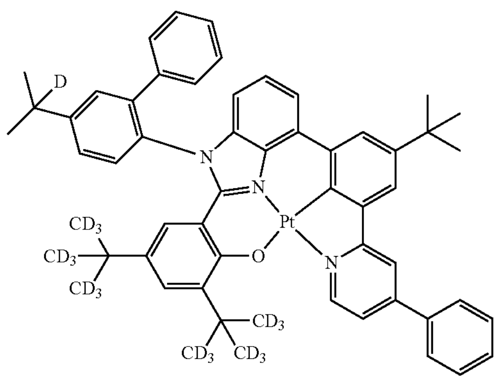
84
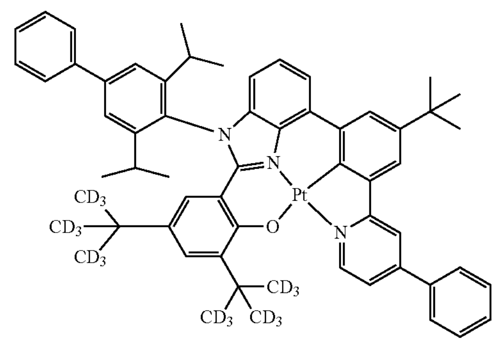
85
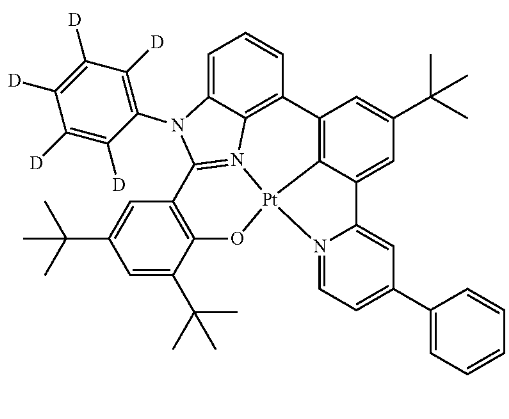
86
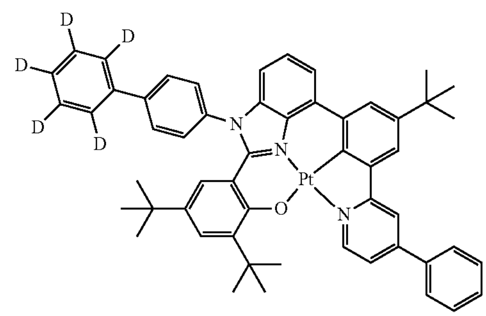

-continued
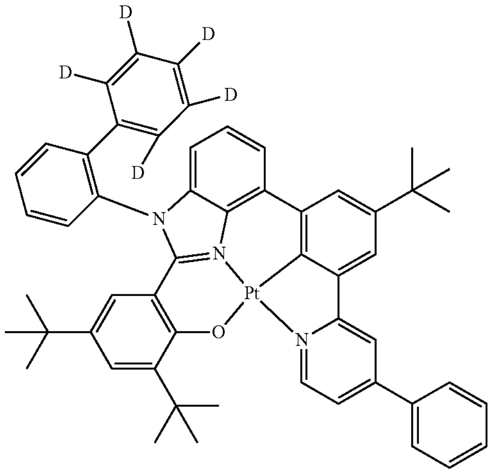
87
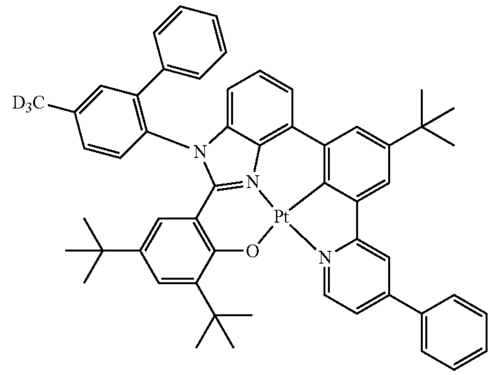
88
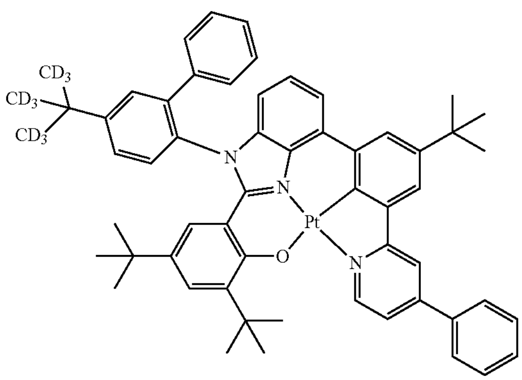
90
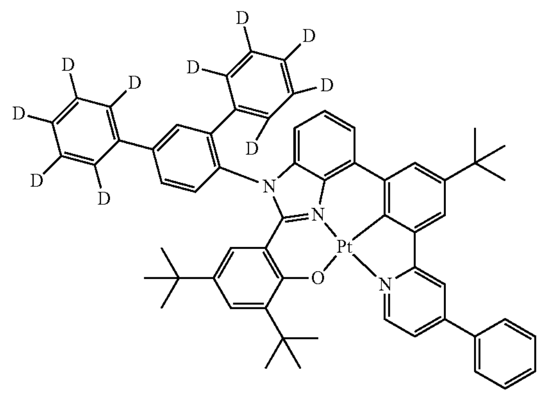
89
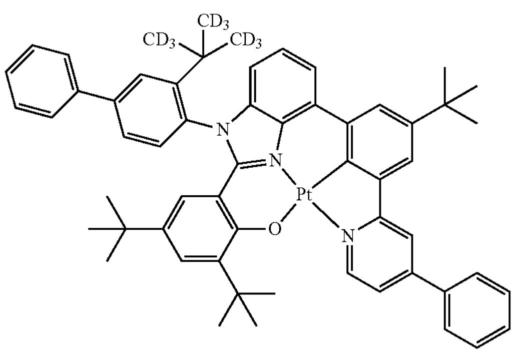
91
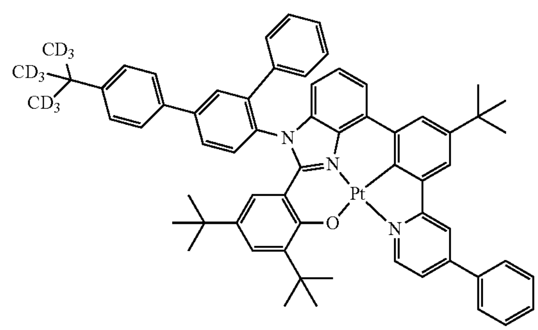
92
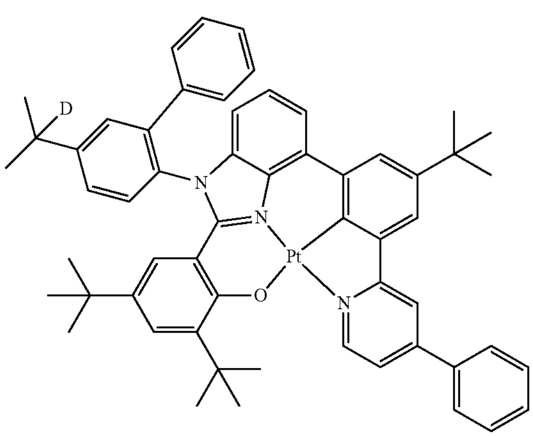
93
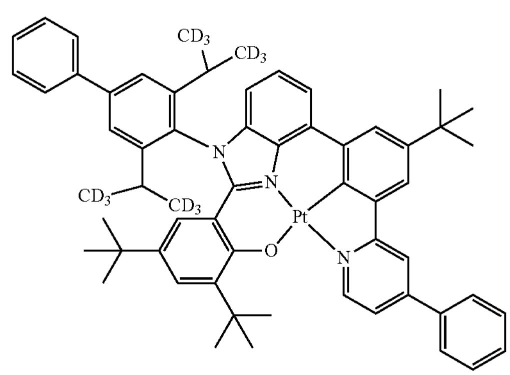
94

-continued
95
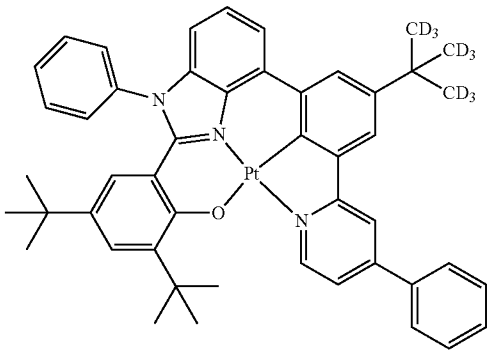
96
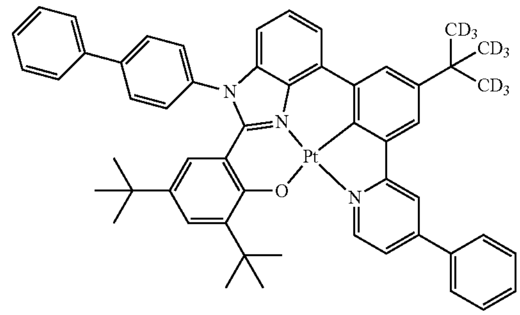
97
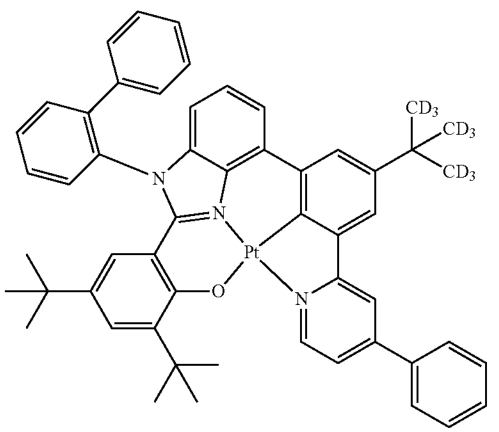
98
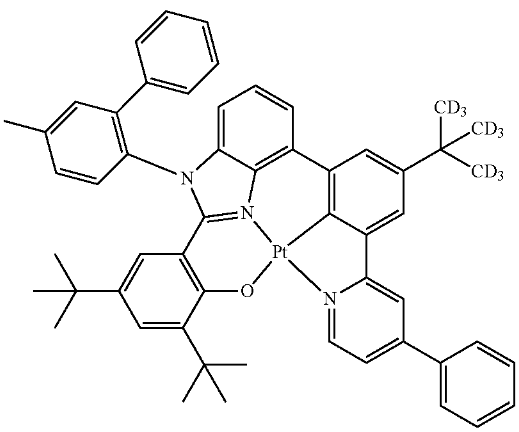
99
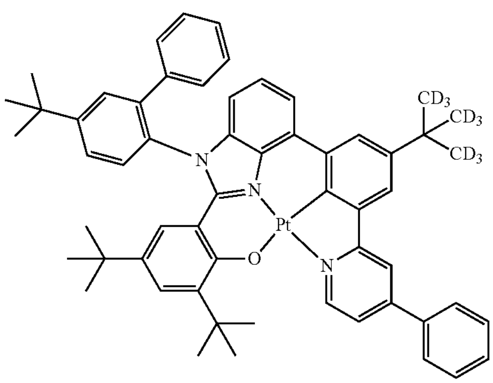
100
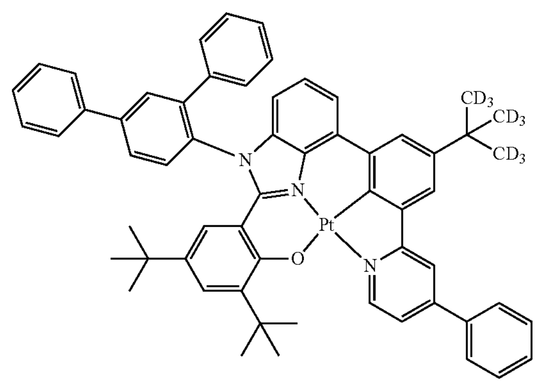
101
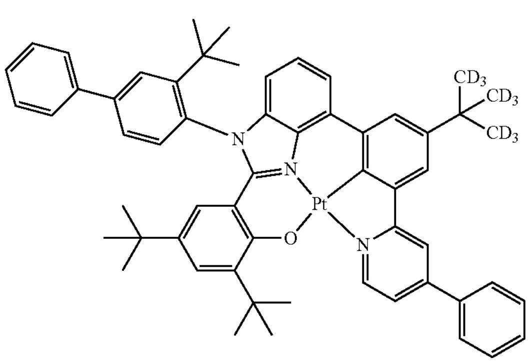
102
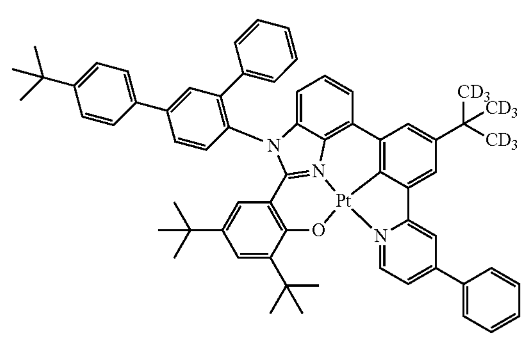

-continued
103
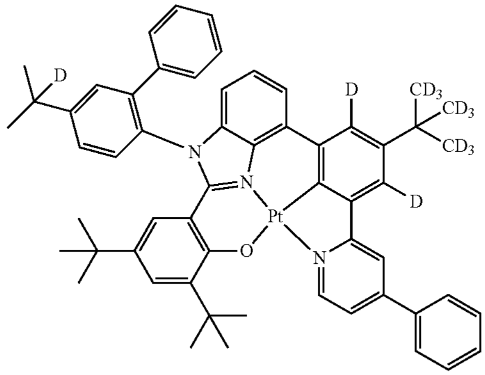
104
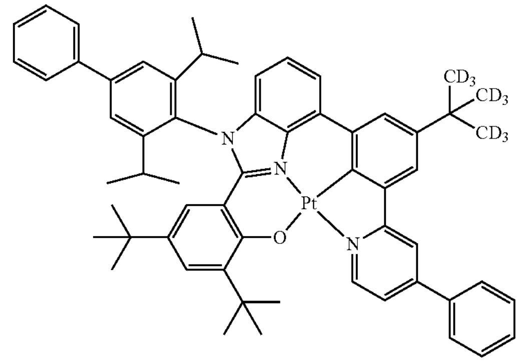
105
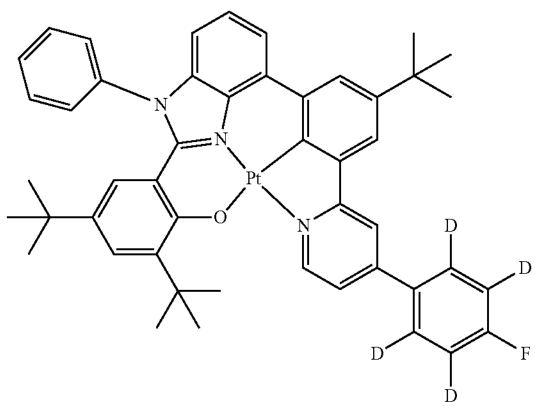
106
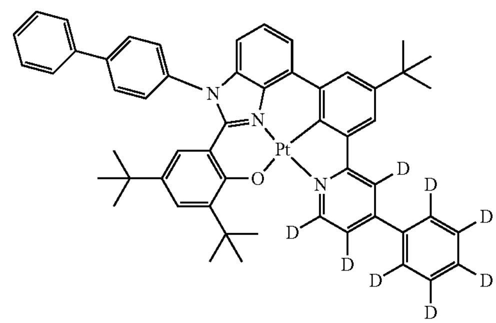
107
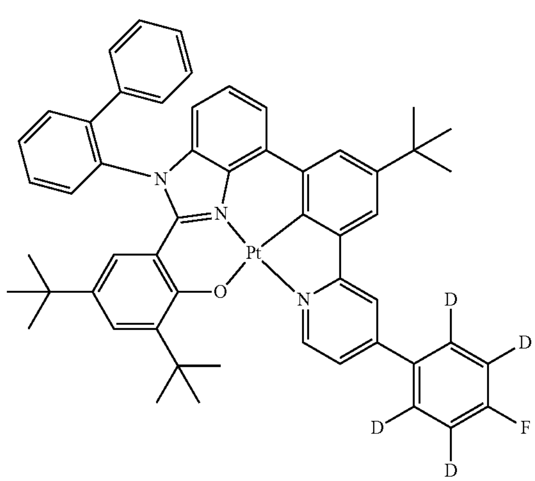
108
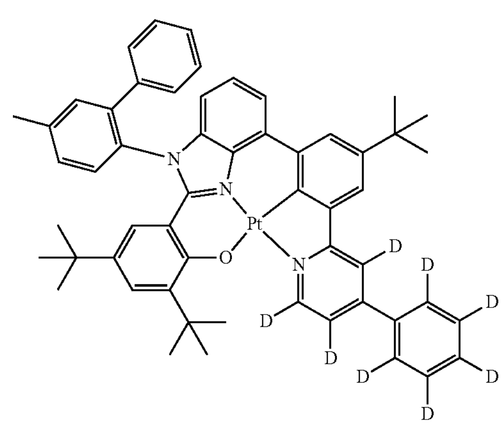

-continued
109
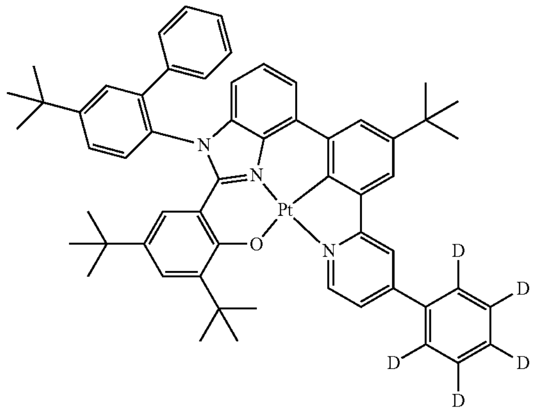
110
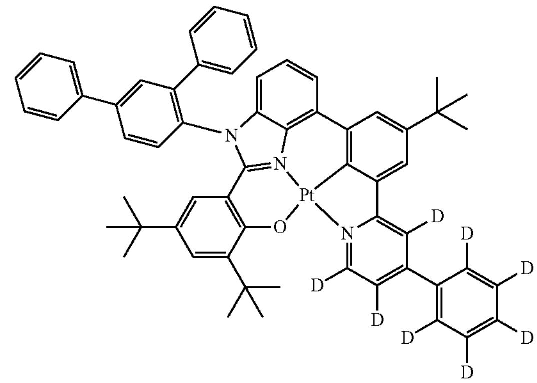
111
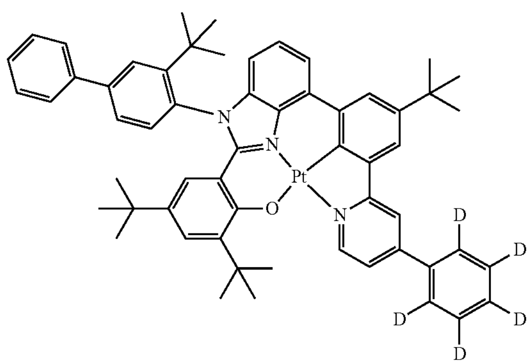
112
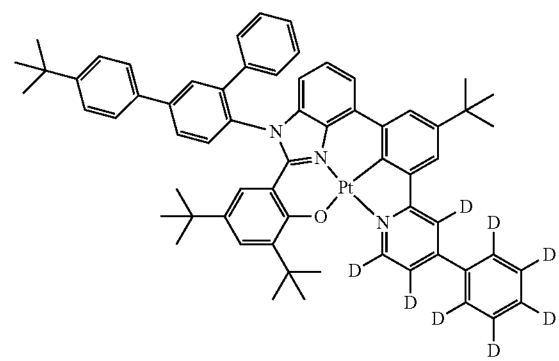
113
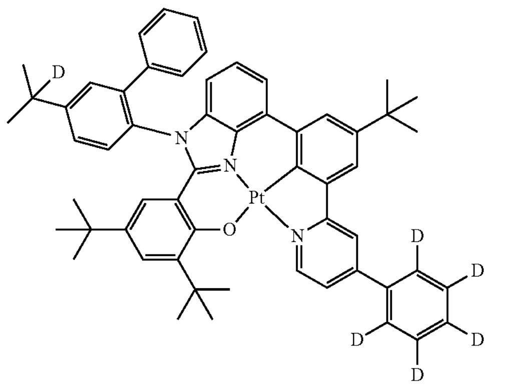
114
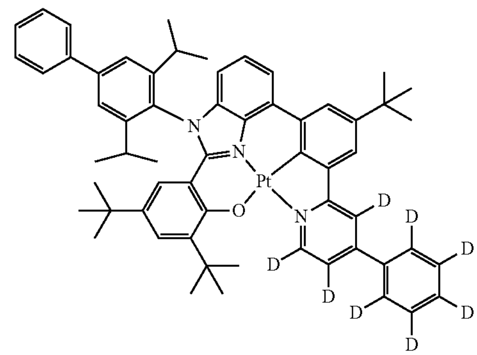
115
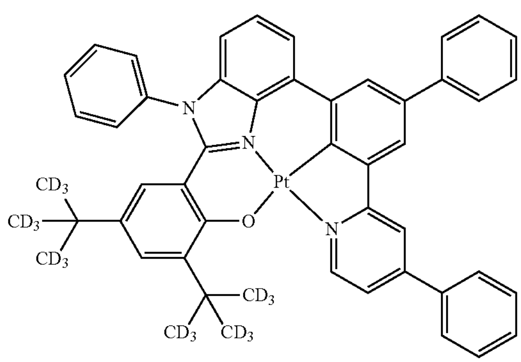
116
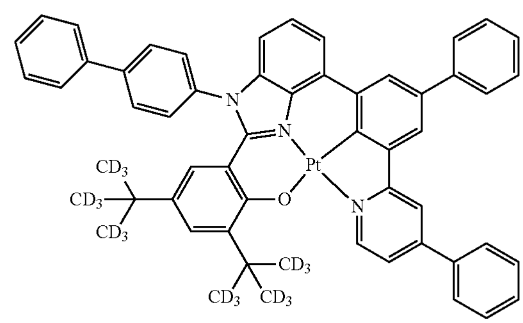

-continued
117
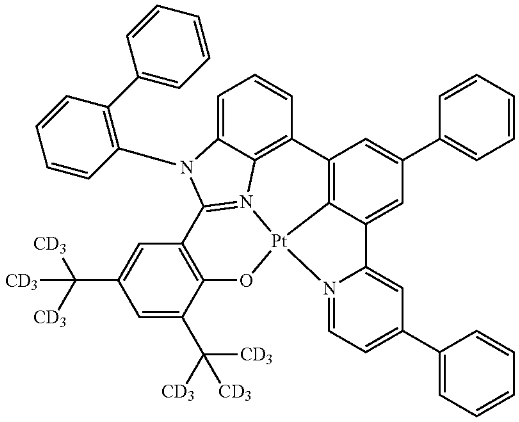
118
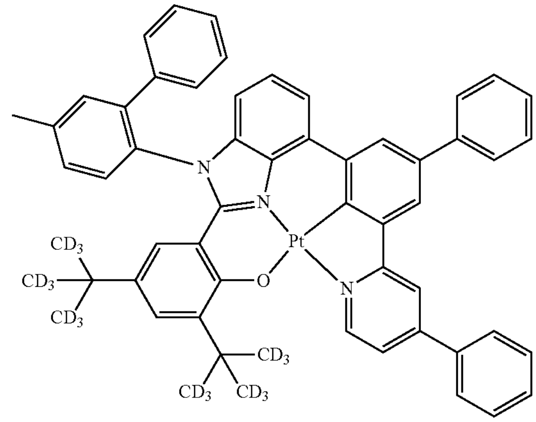
119
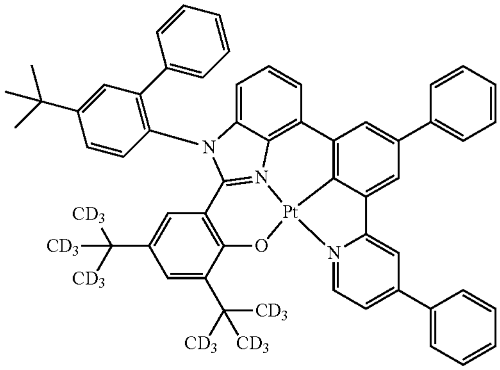
120
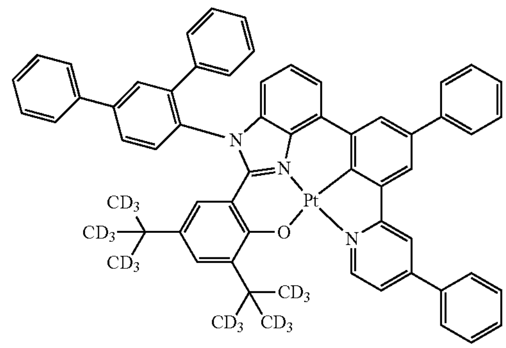
121
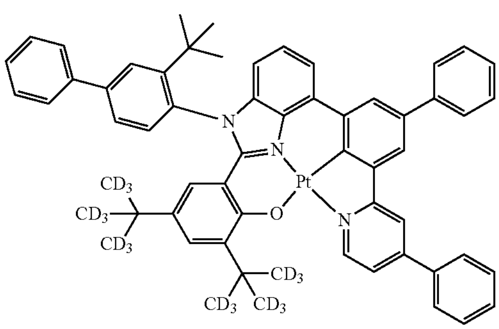
122
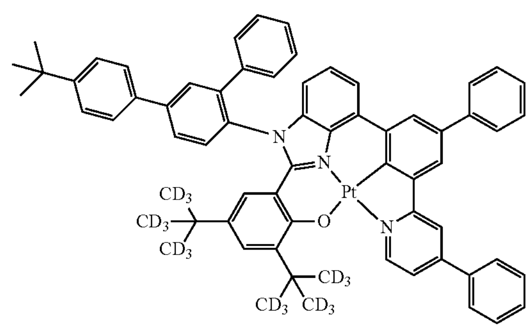
123
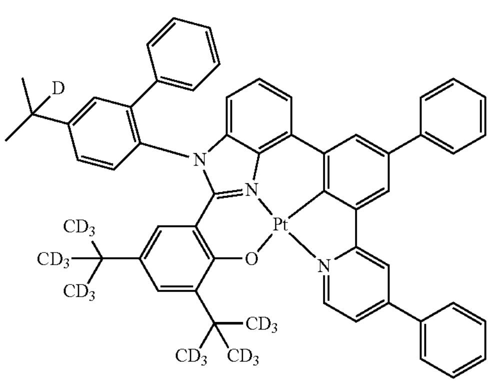
124
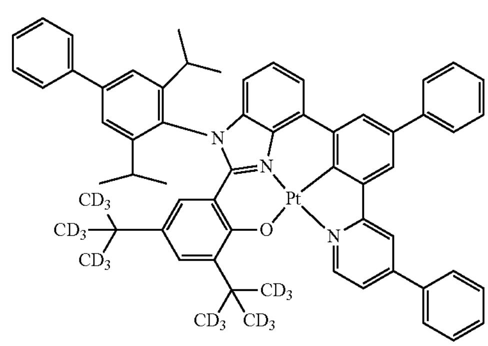

-continued
125
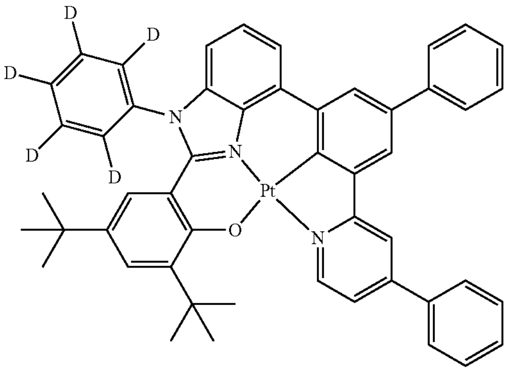
126
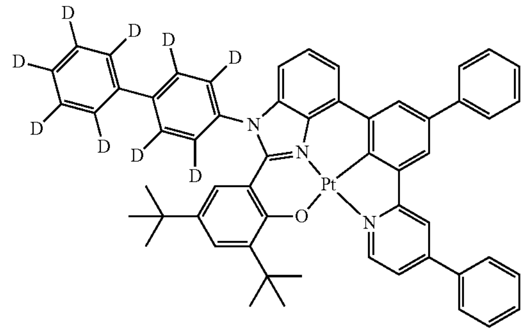
127
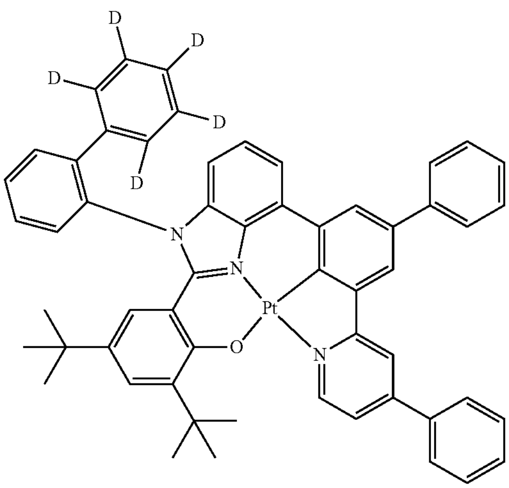
128
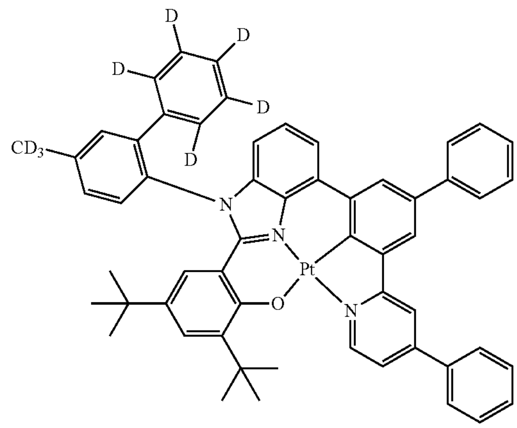
129
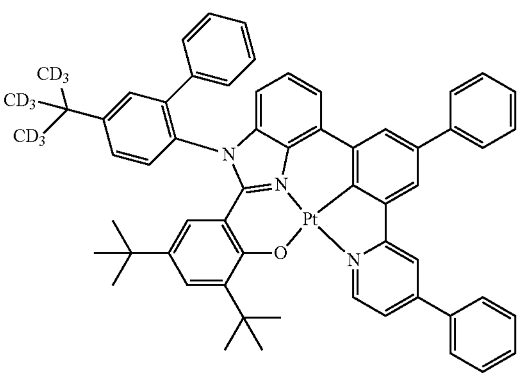
130
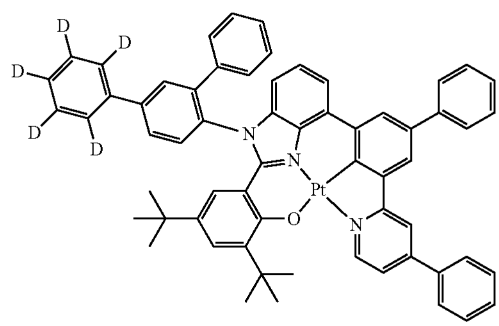
131
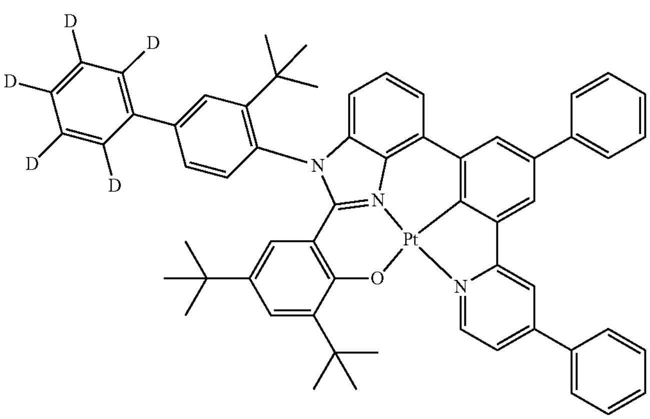

-continued
132
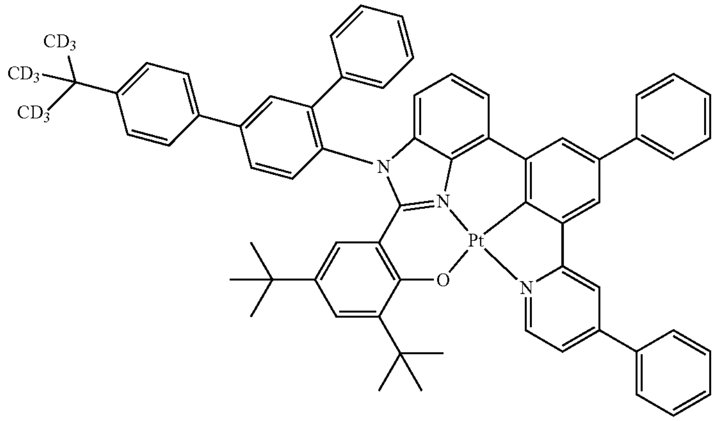
133
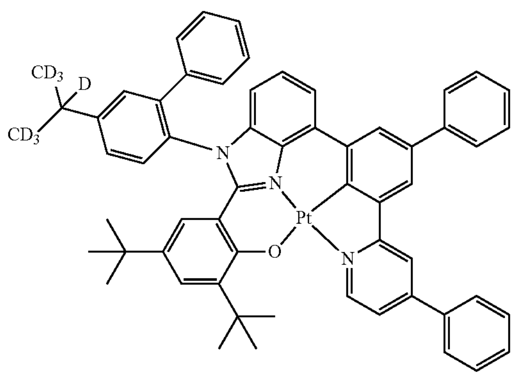
134
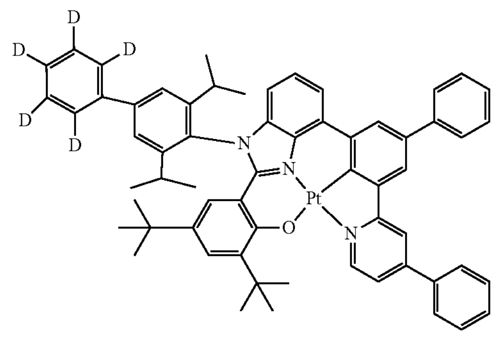
135
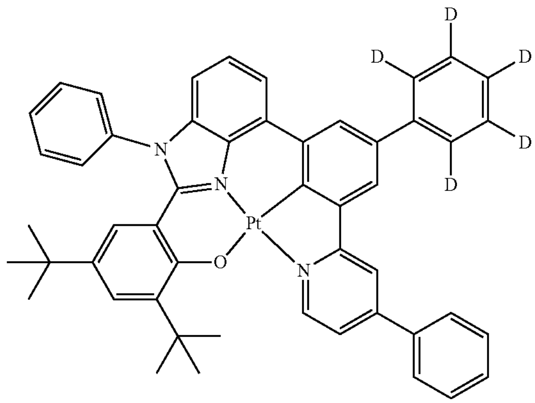
136
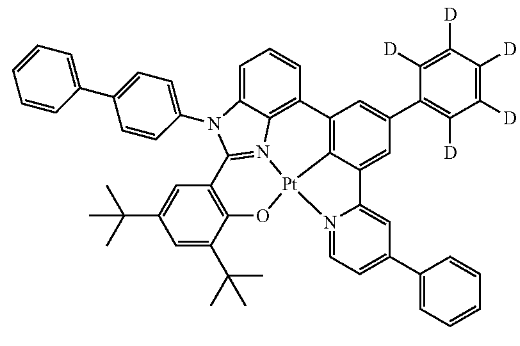

-continued
137
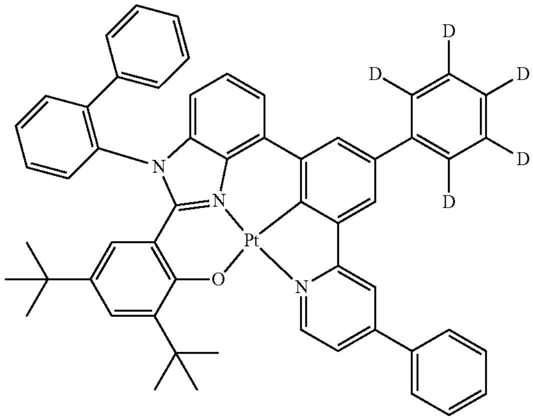
138
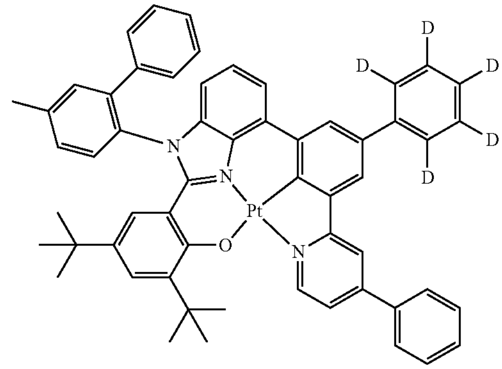
139
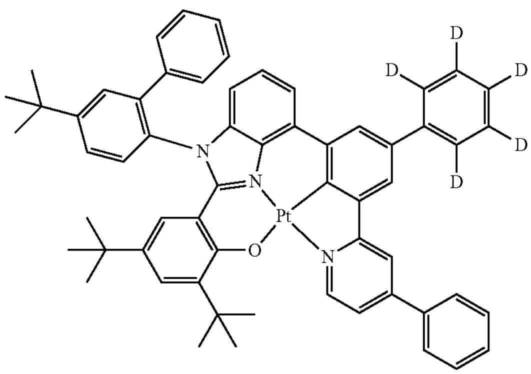
140
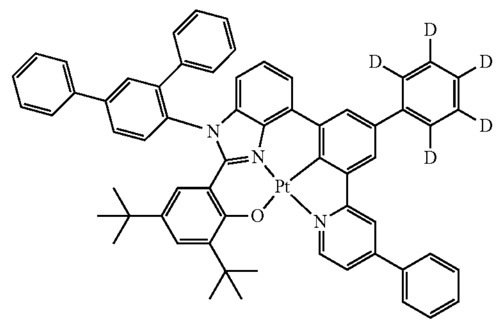
141
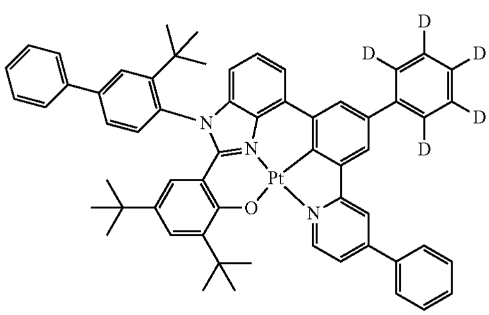
142
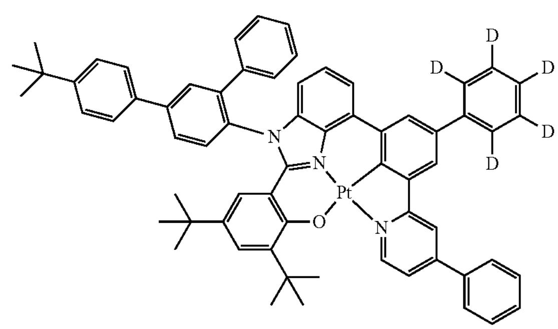
143
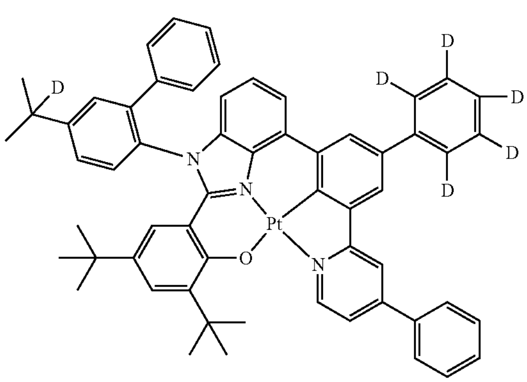
144
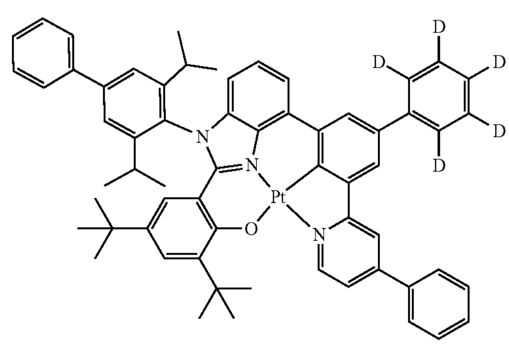

-continued
145
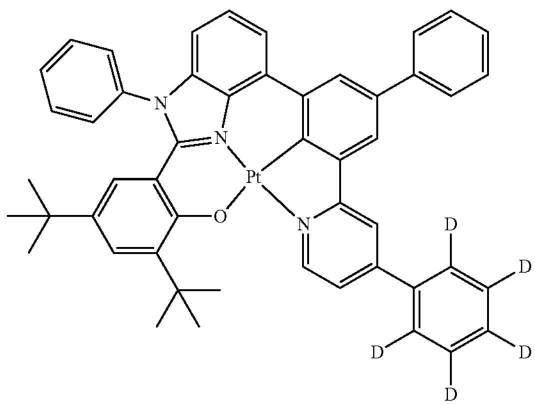
146
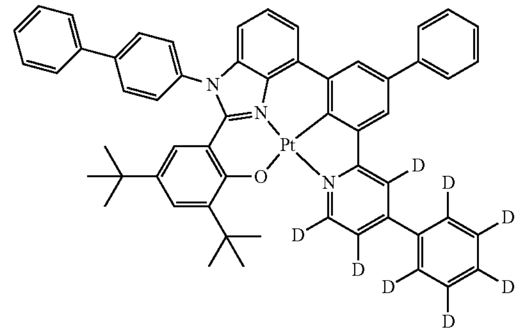
147
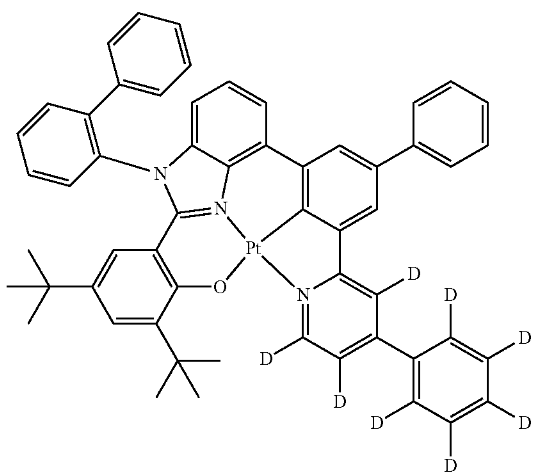
148
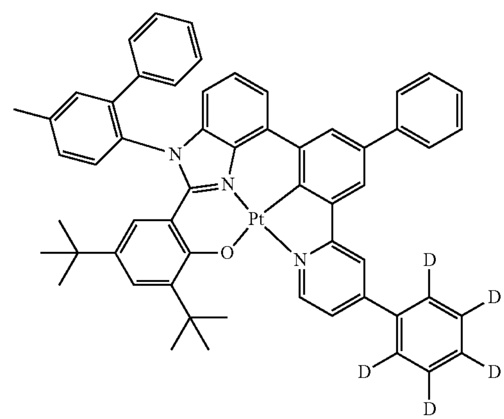
149
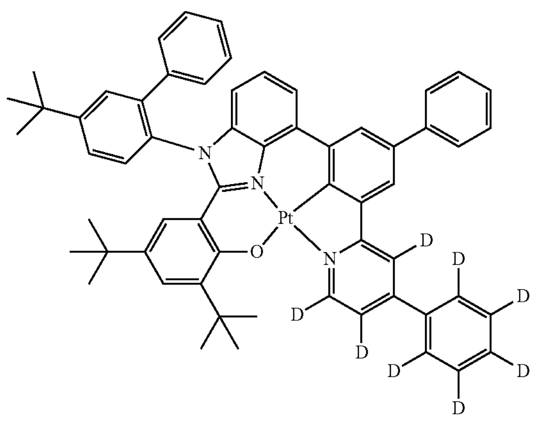
150
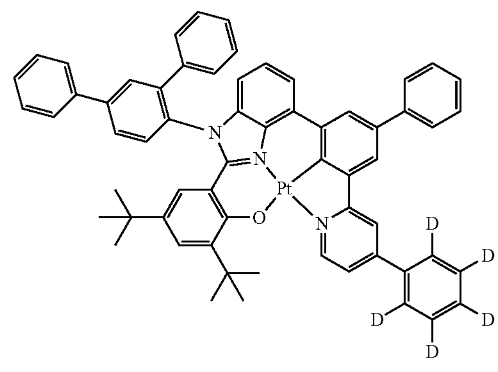

-continued
151
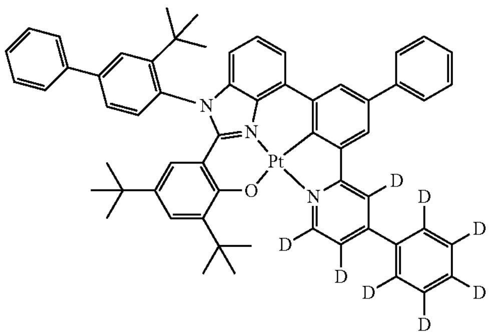
152
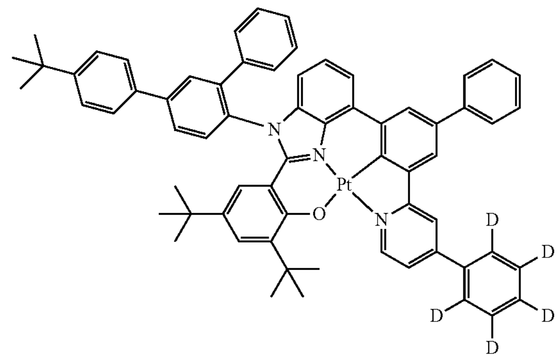
153
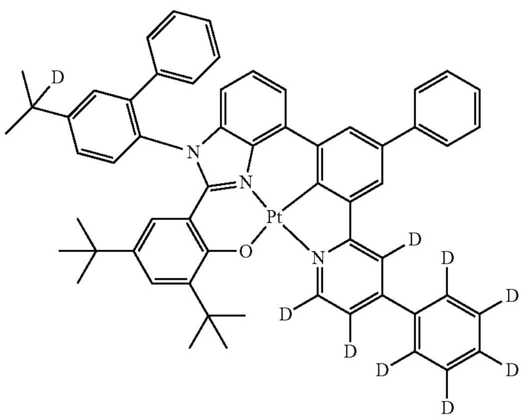
154
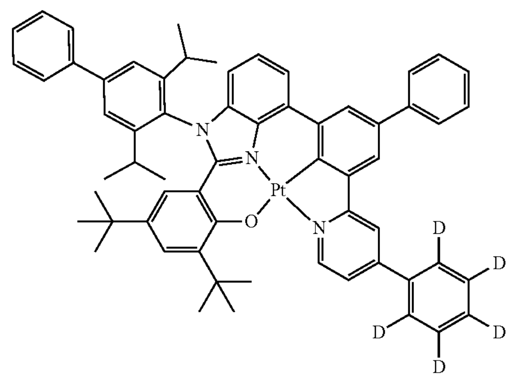
155
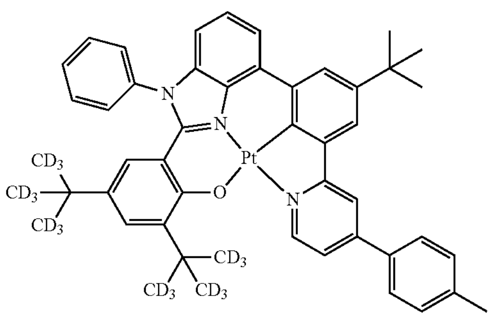
156
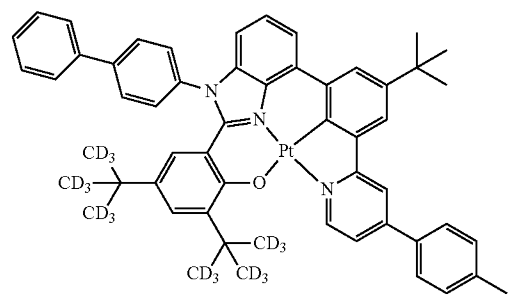
157
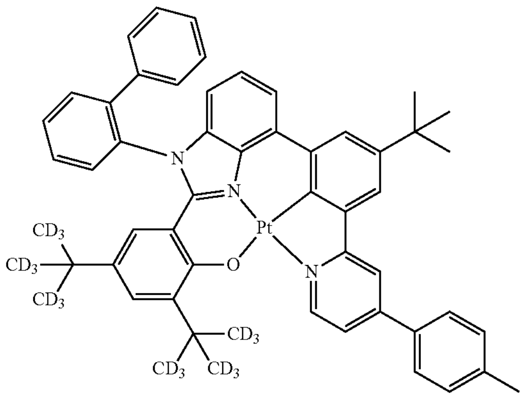
158
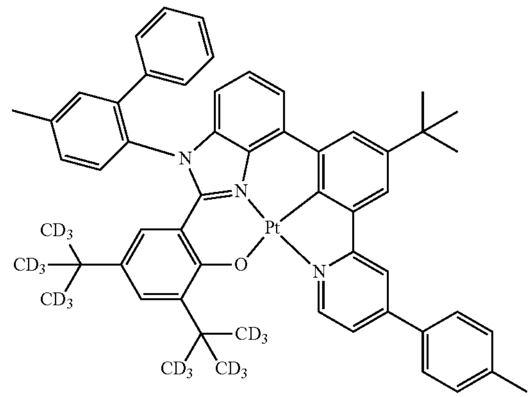

-continued
159
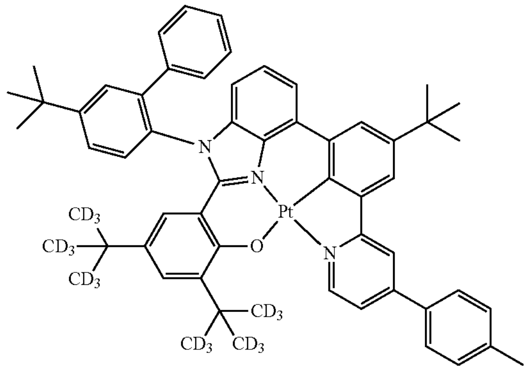
160
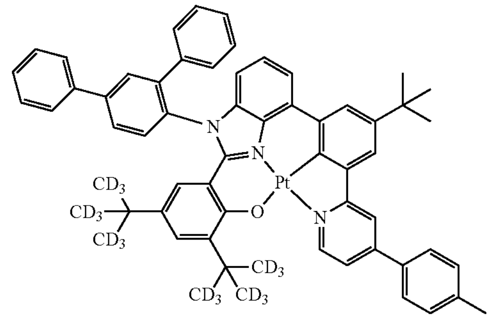
161
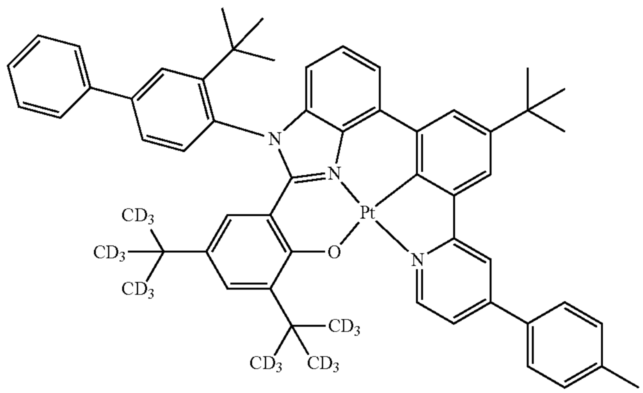
162
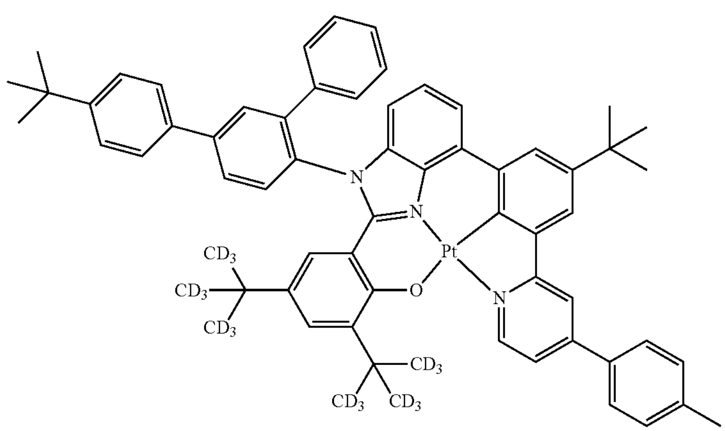
163
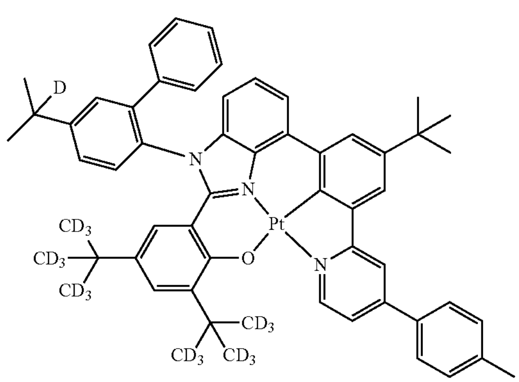
164
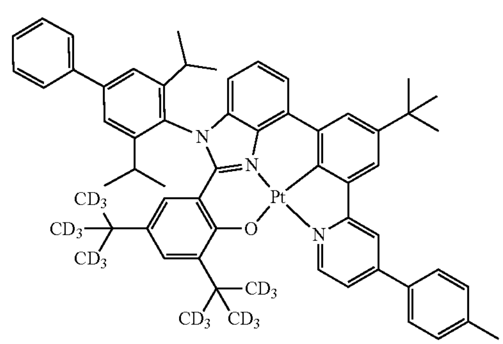

-continued
165
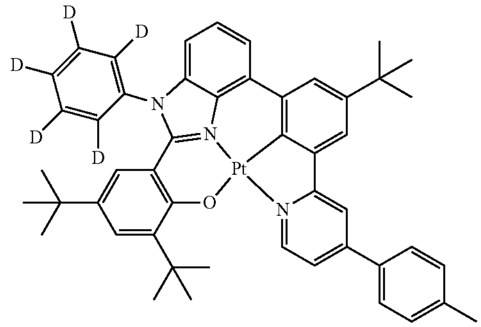
166
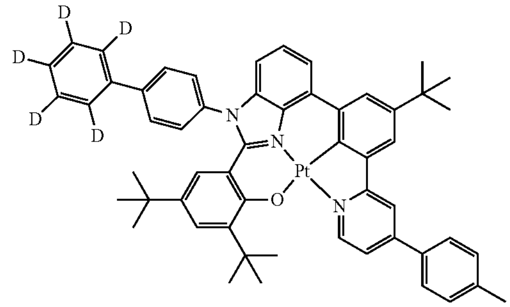
167
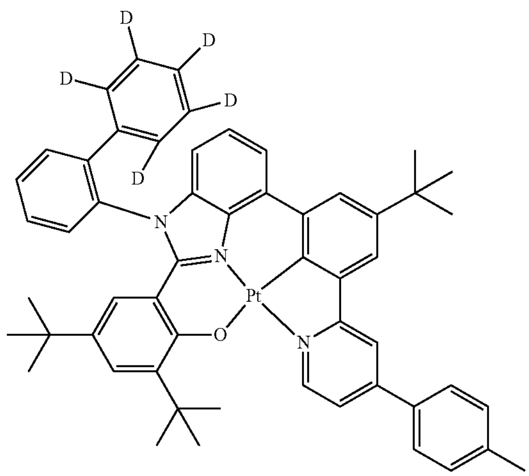
168
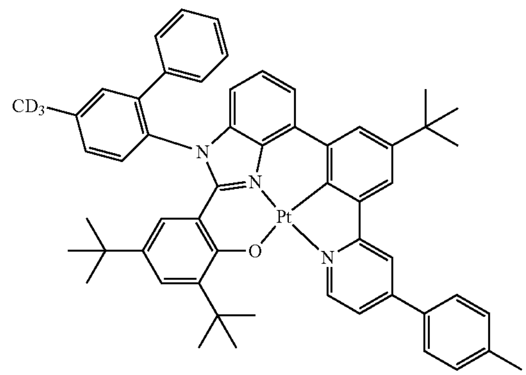
169
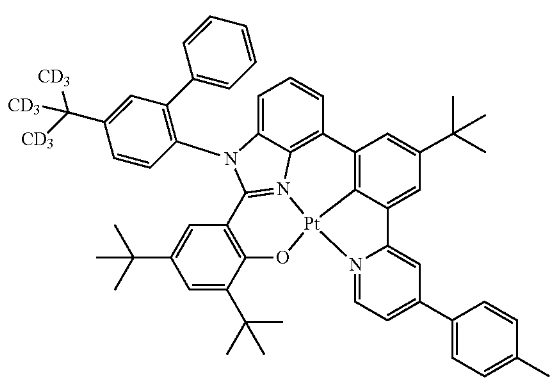
170
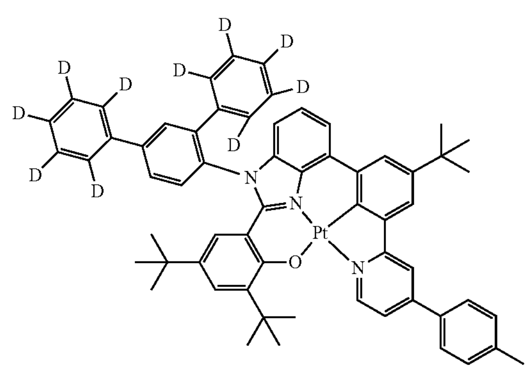
171
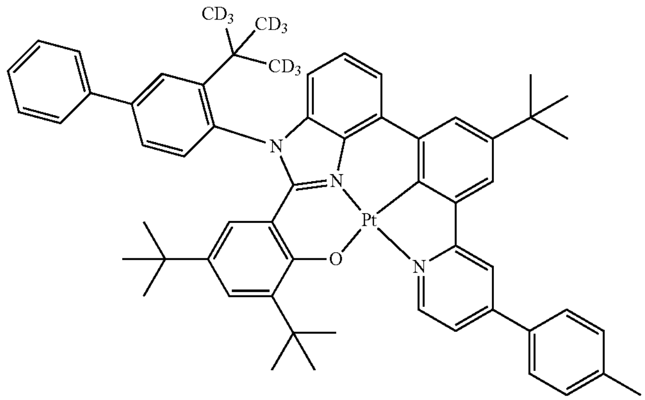

-continued
172
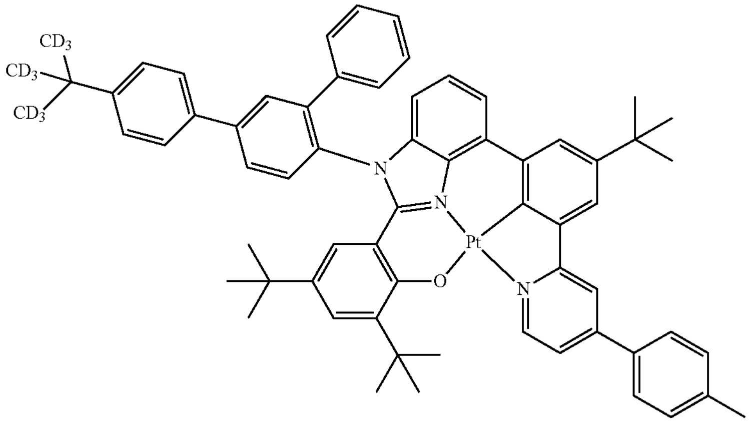
173
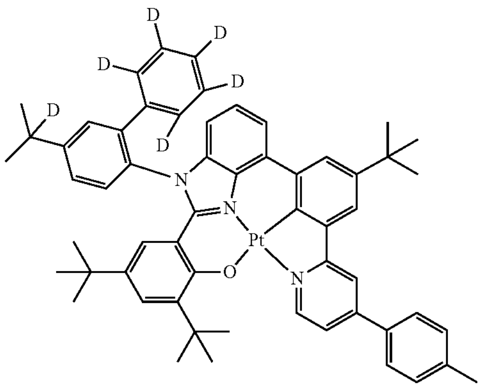
174
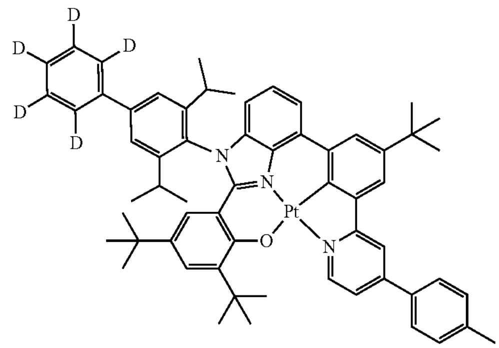
175
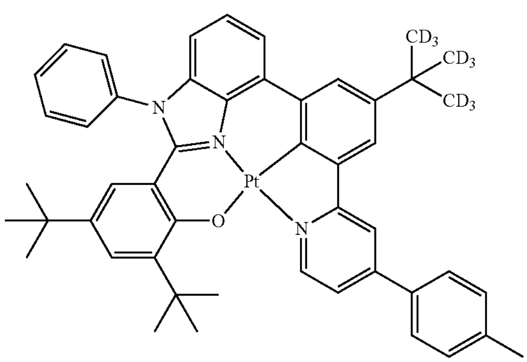
176
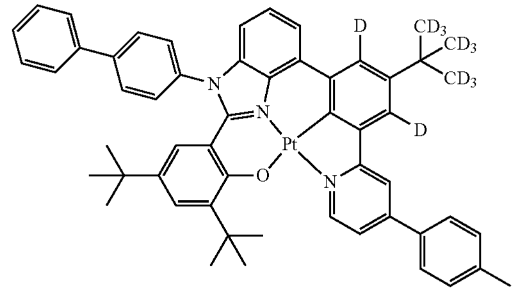
177
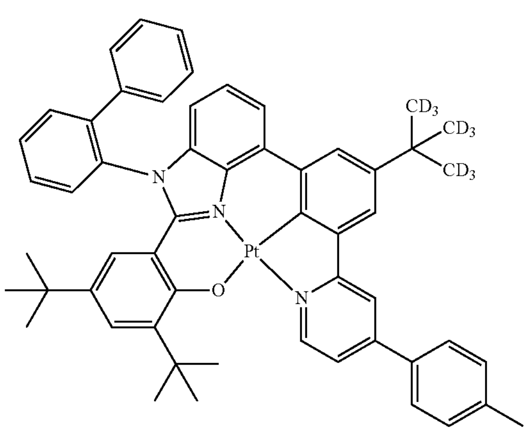
178
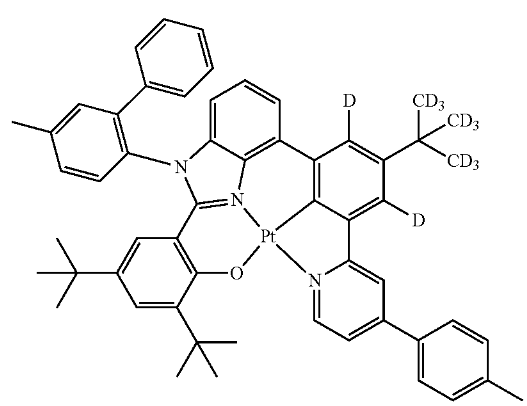

-continued
179
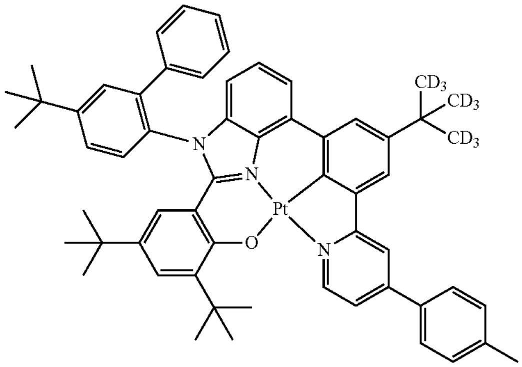
180
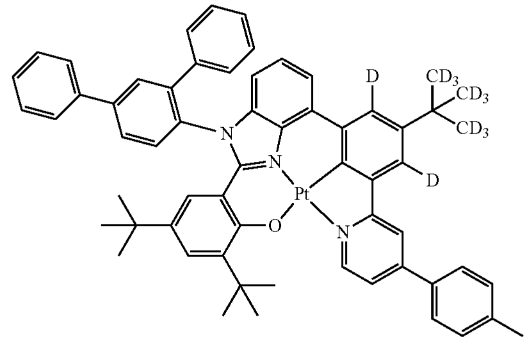
181
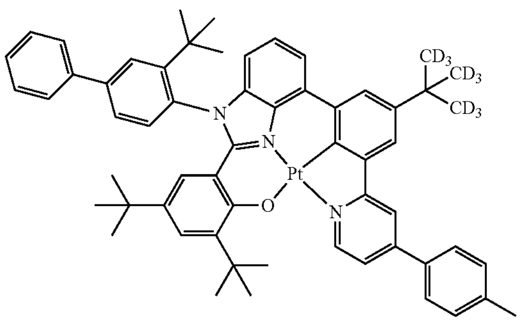
182
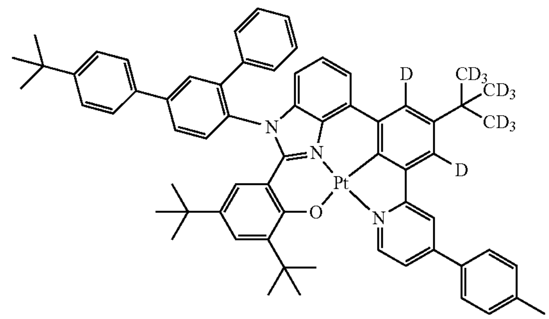
183
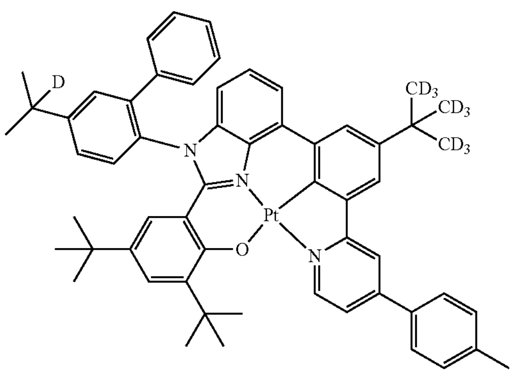
184
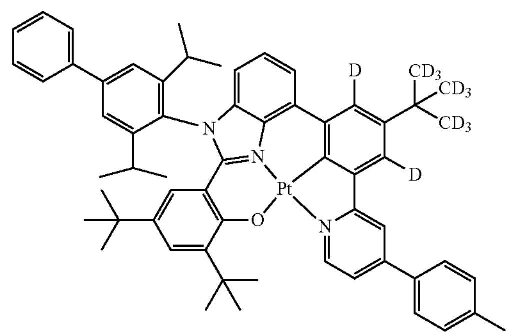
185
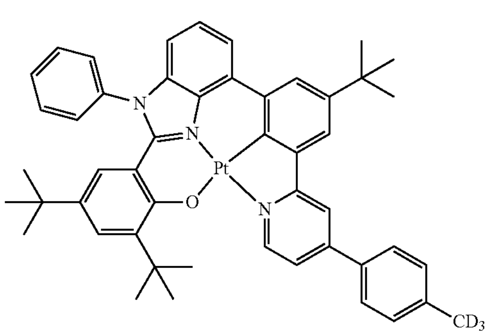
186
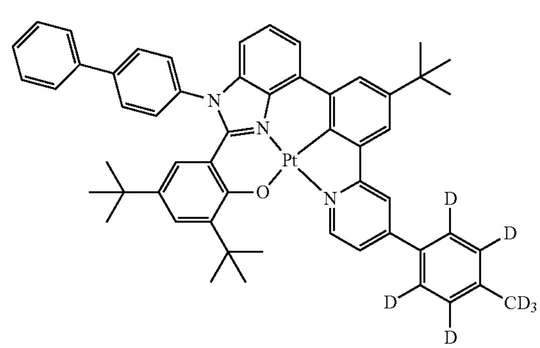

-continued
187
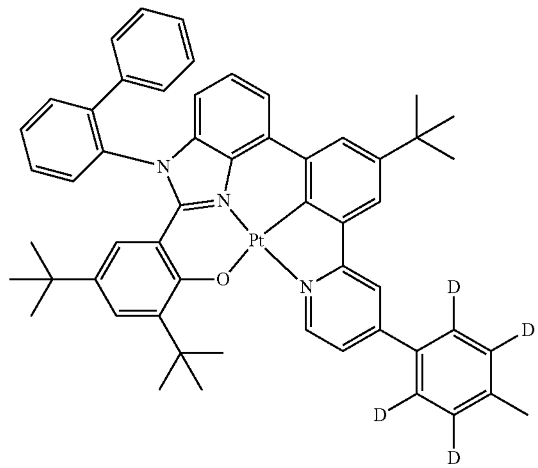
188
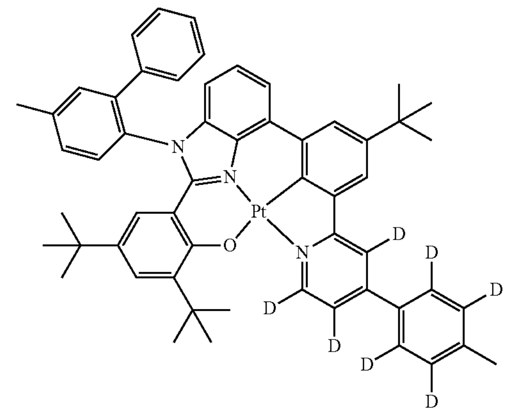
189
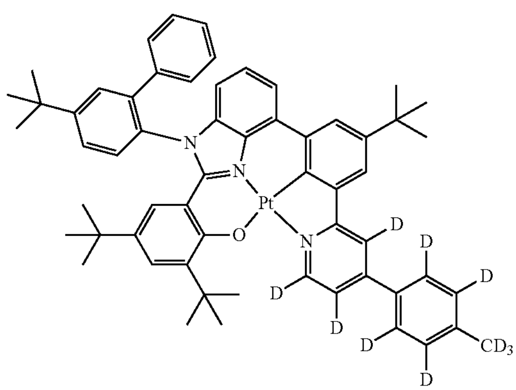
190
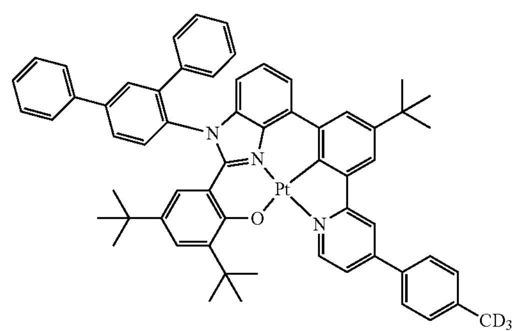
191
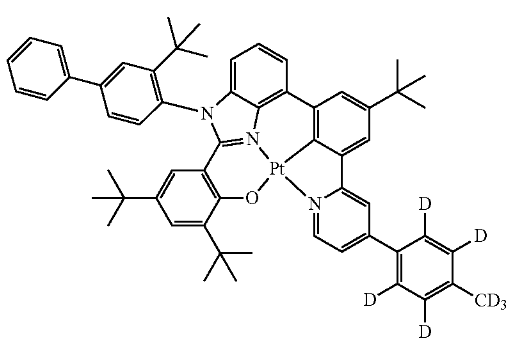
192
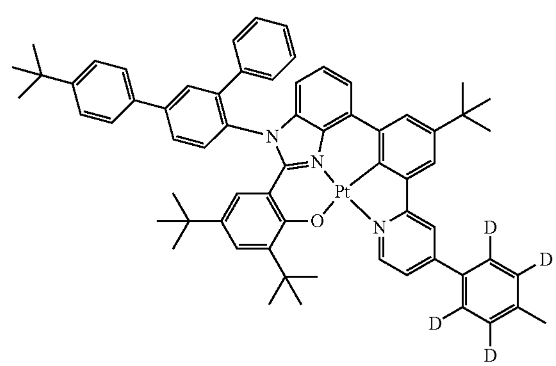

-continued
193
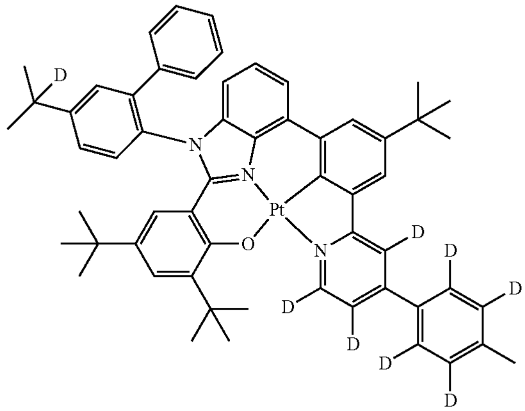
194
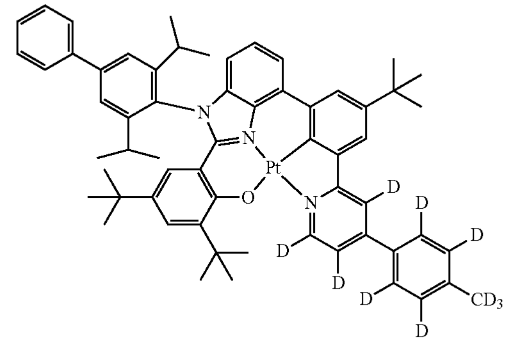
195
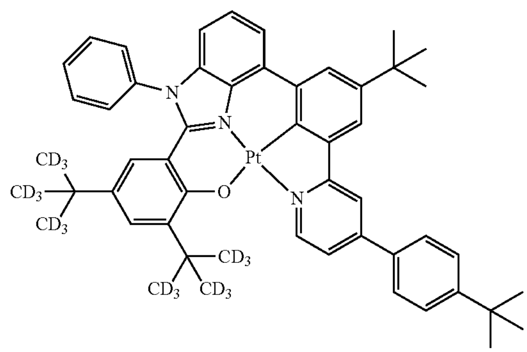
196
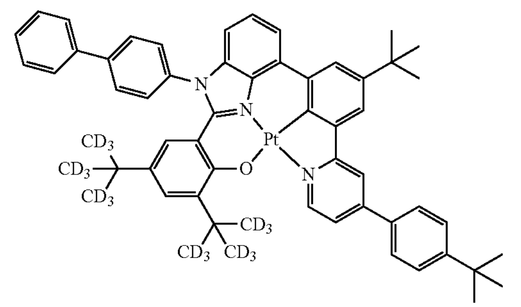
197
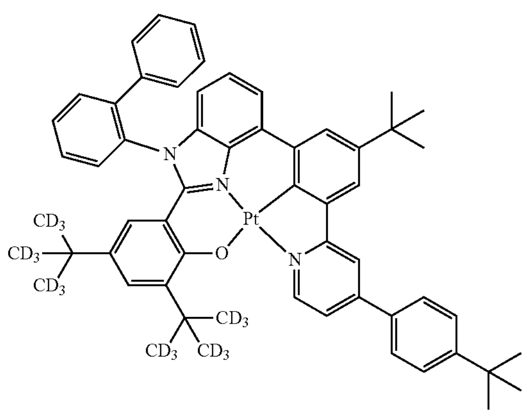
198
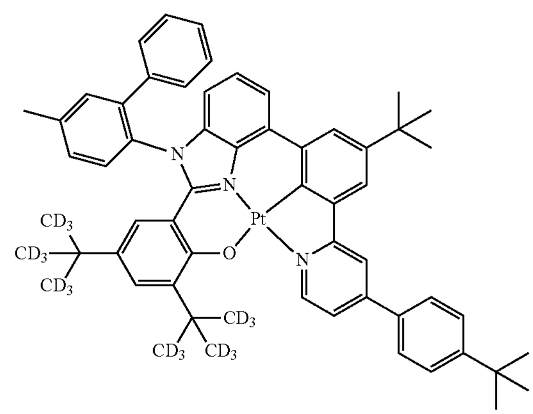
199
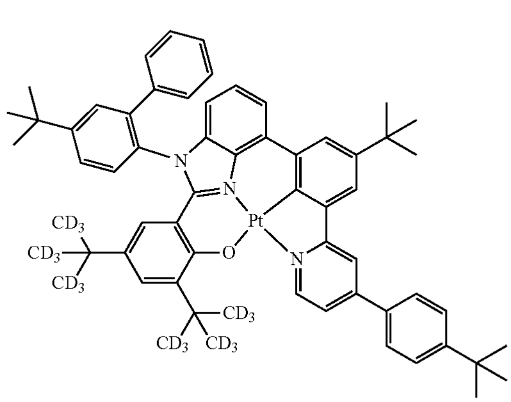
200
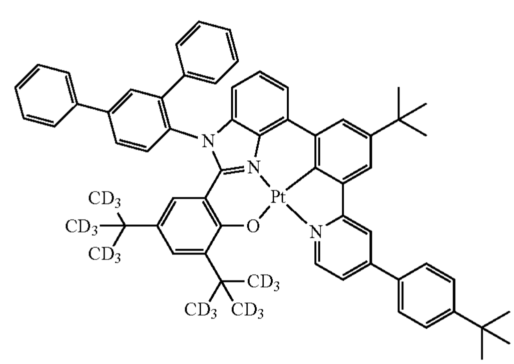

-continued
201
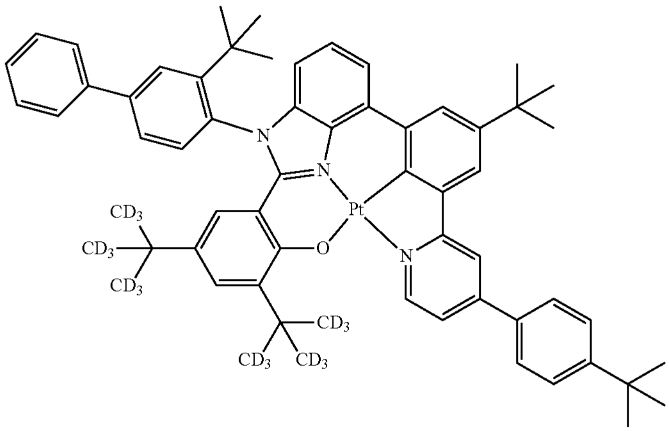
202
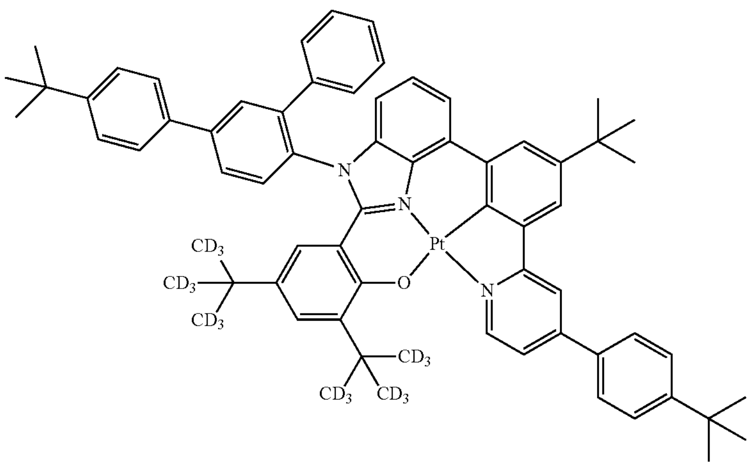
203
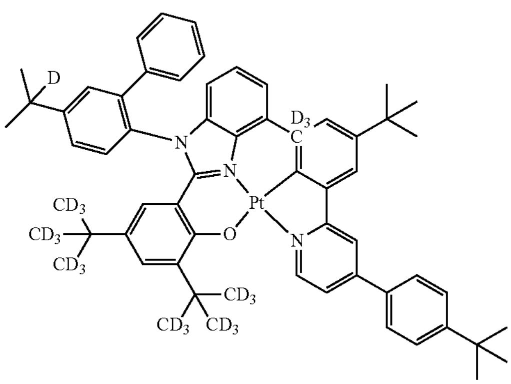
204
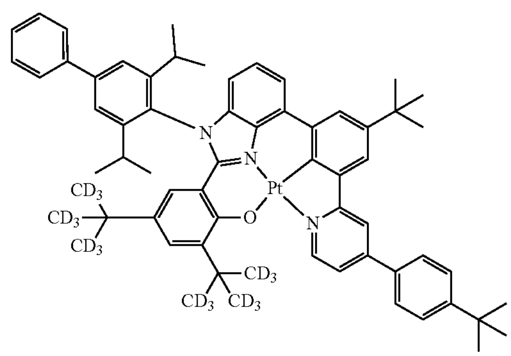
205
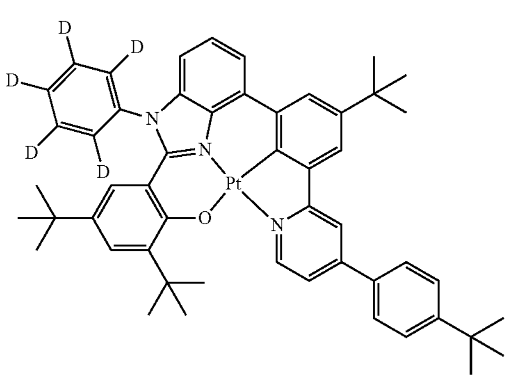
206
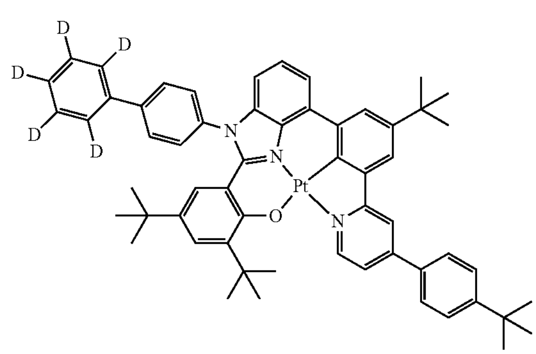

-continued
207
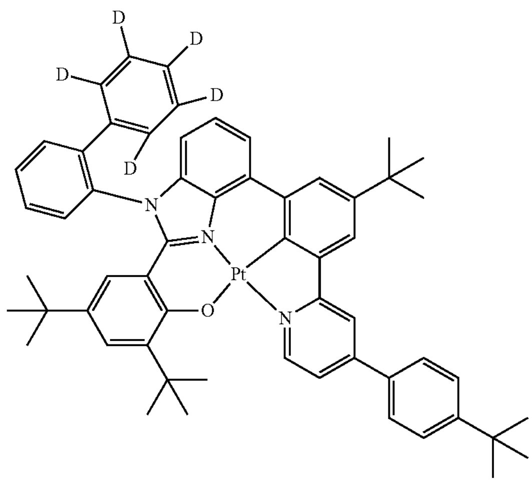
208
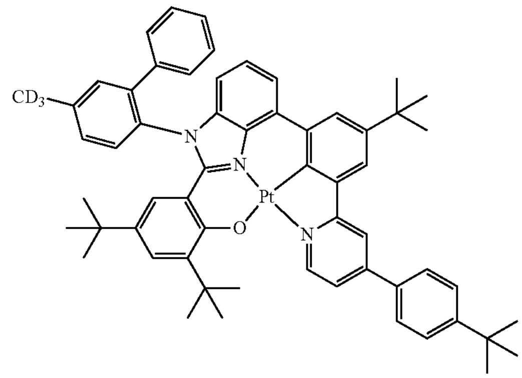
209
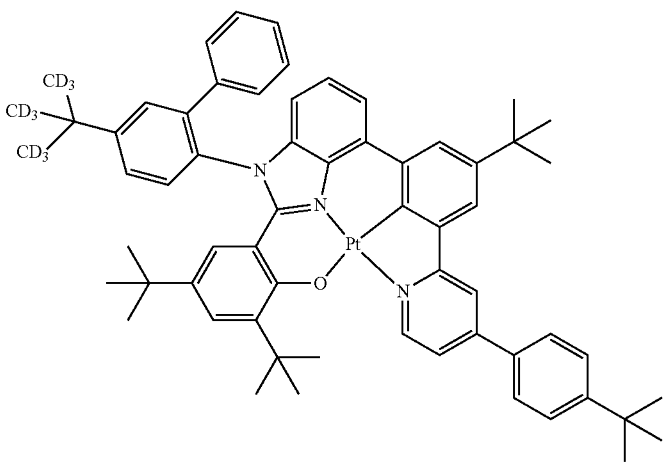
210
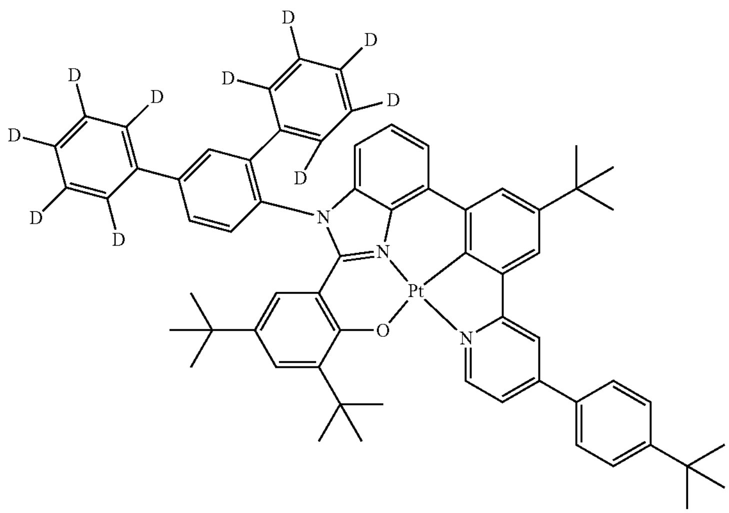

-continued
211
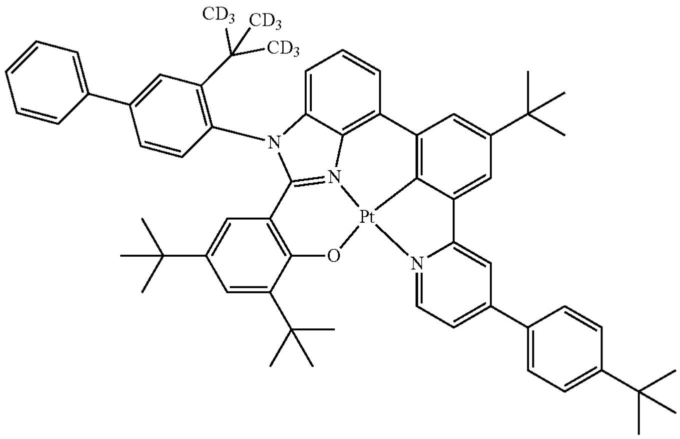
212
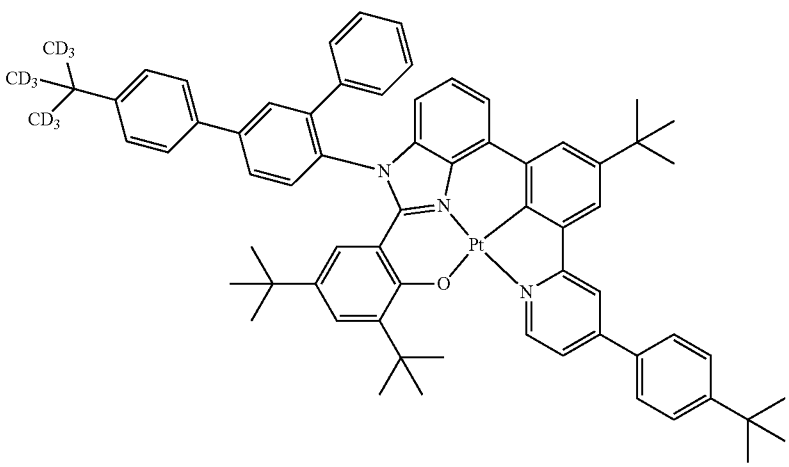
213
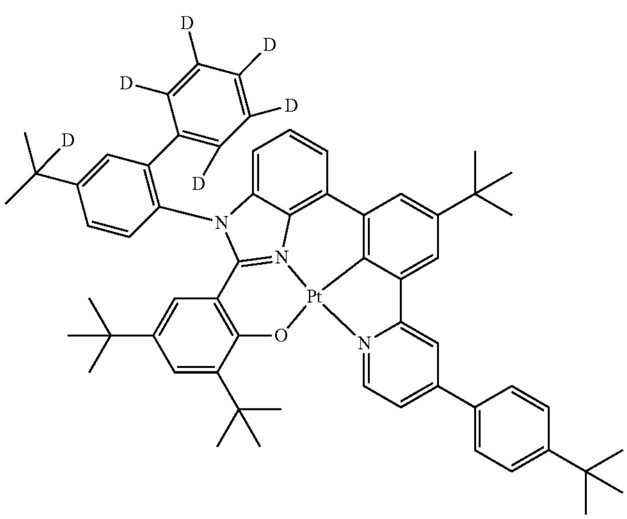

-continued
214
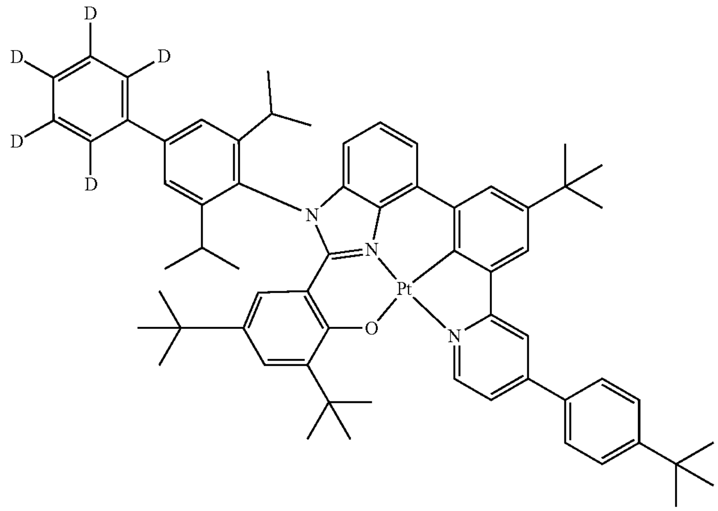
215
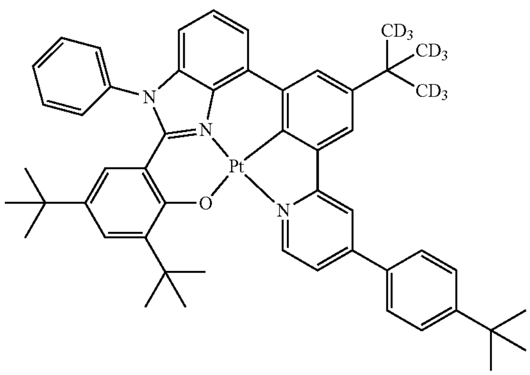
216
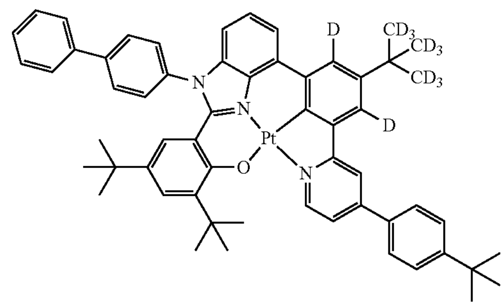
217
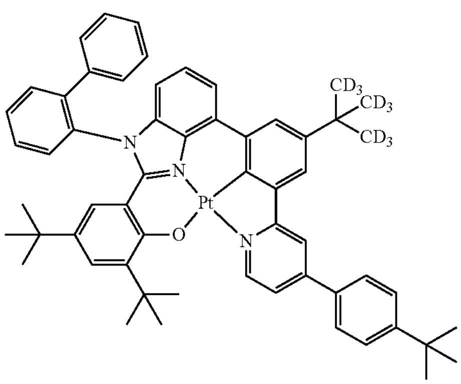
218
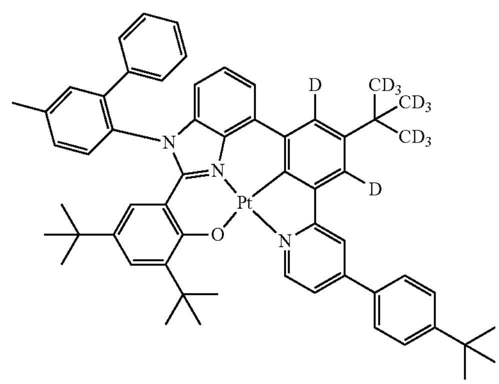
219
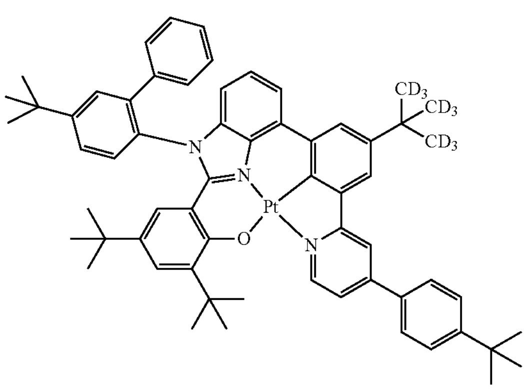
220
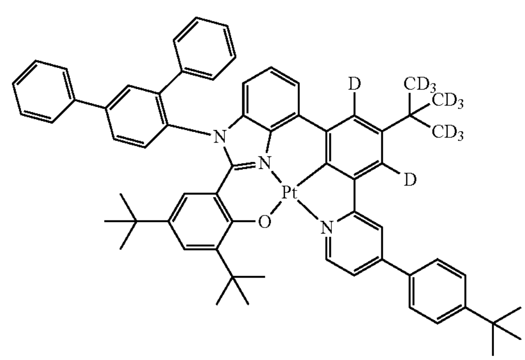

-continued
221
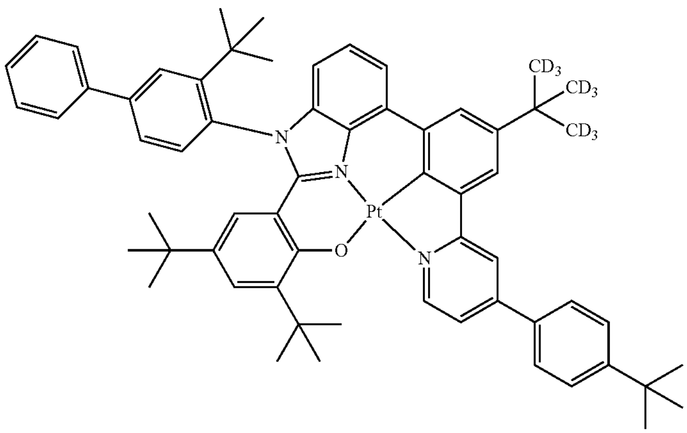
222
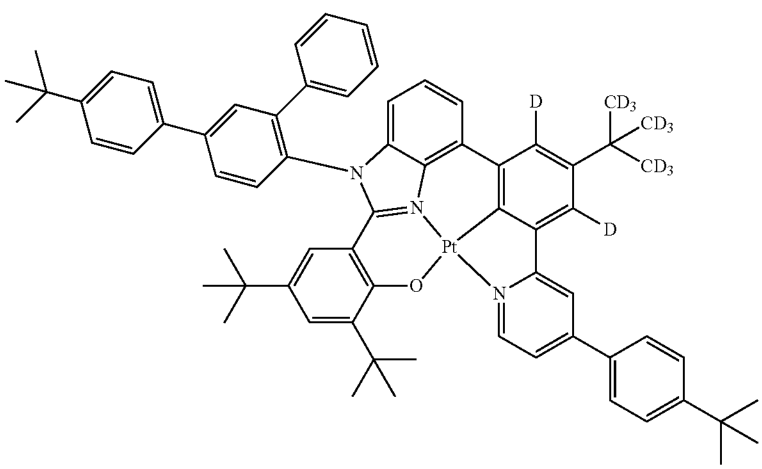
223
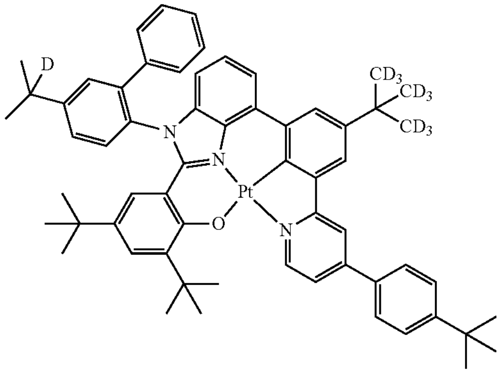
224
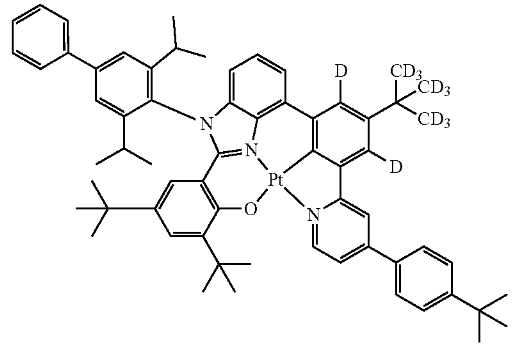

-continued
225
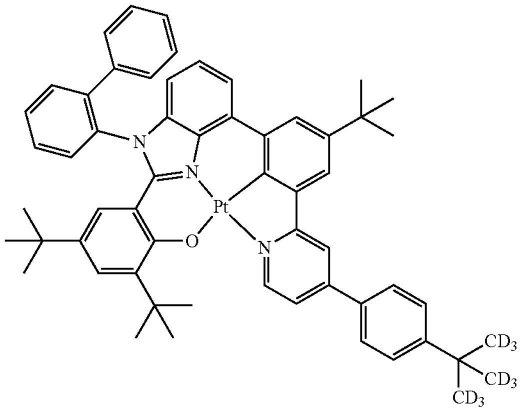
226
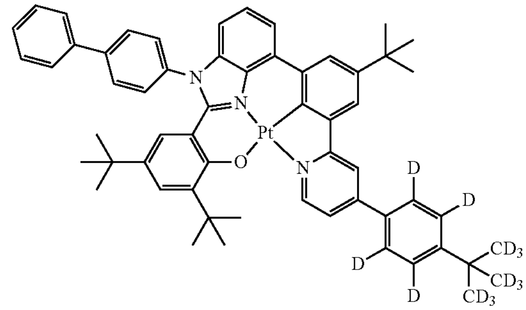
227
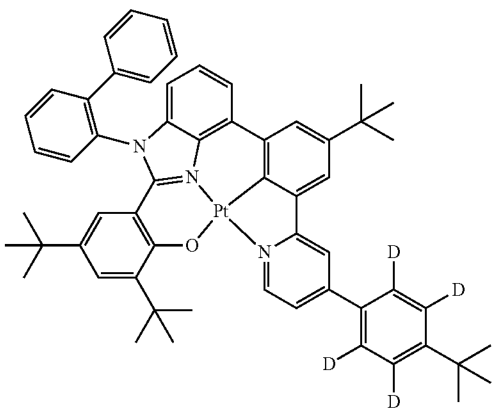
228
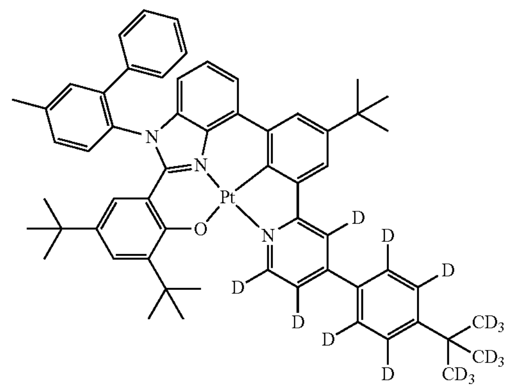
229
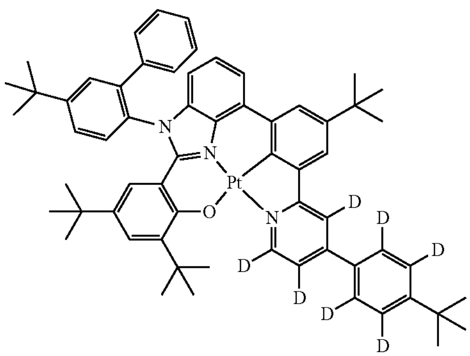
230
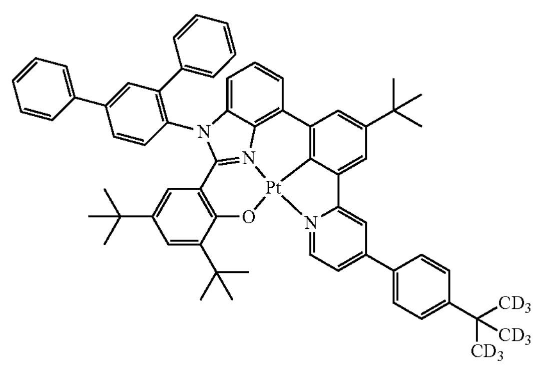
231
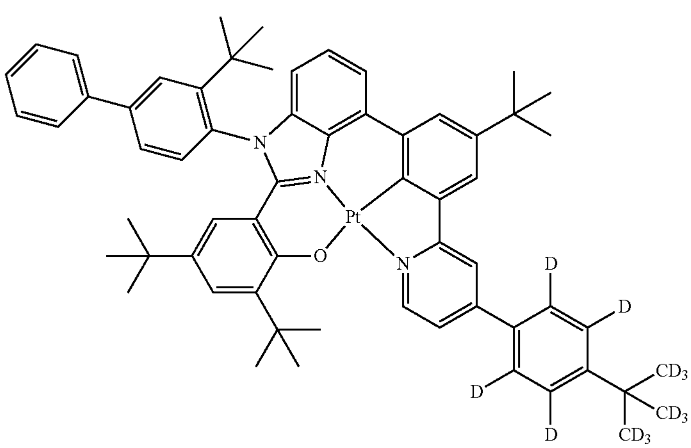

-continued
232
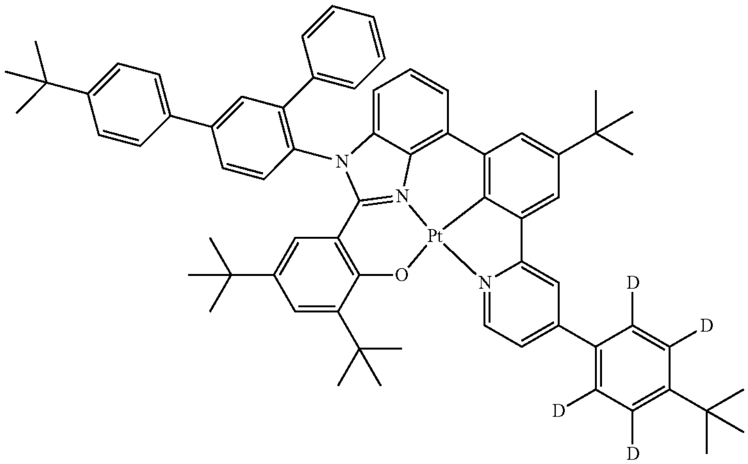
233
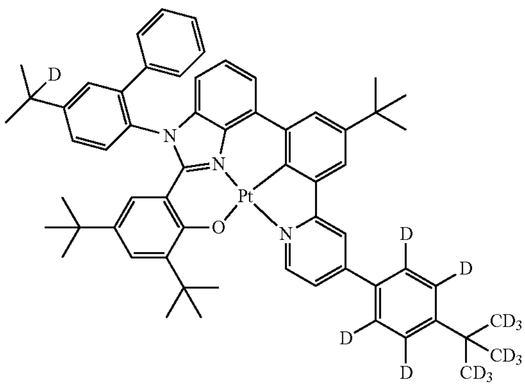
234
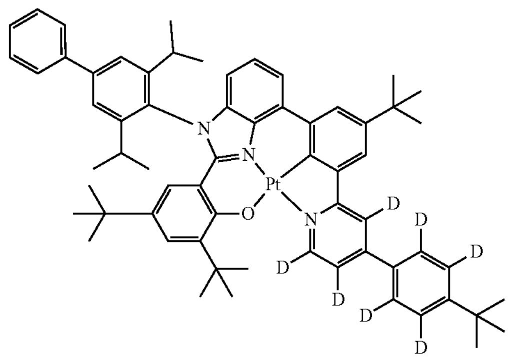
235
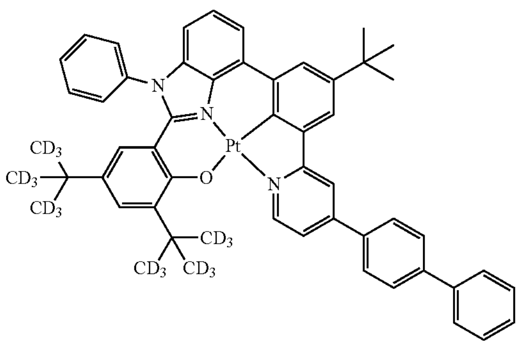
236
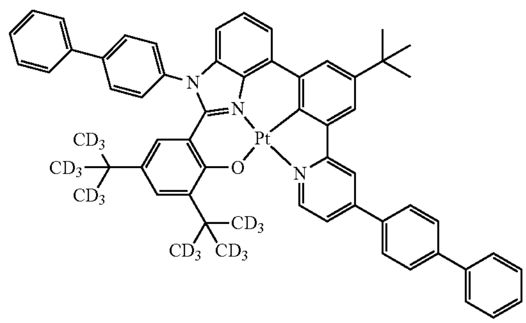
237
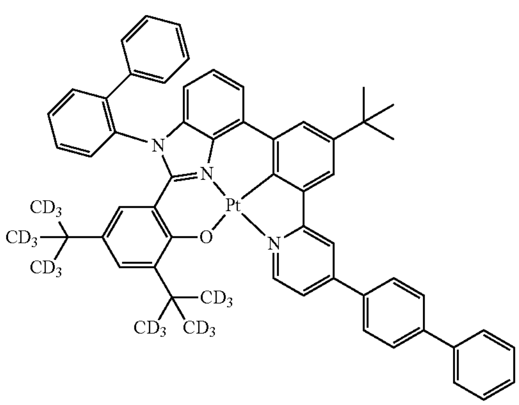
238
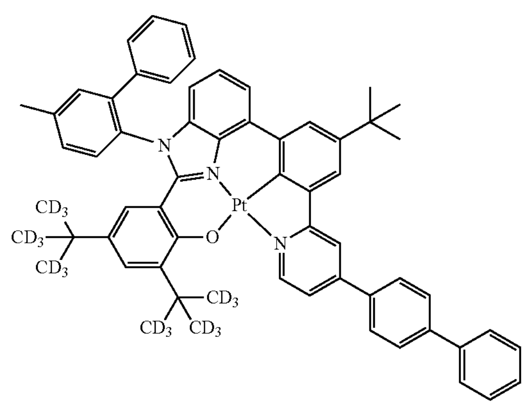

-continued
239
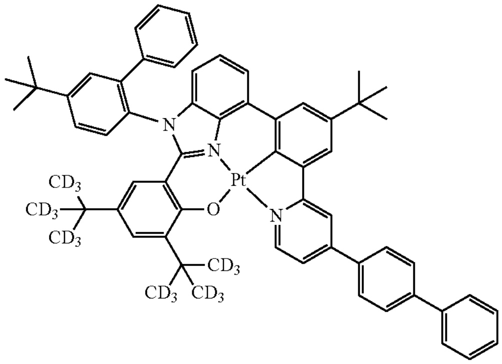
240
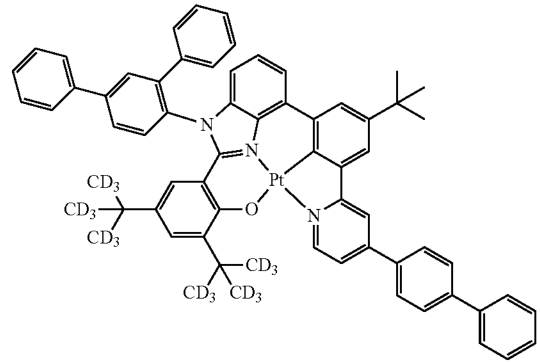
241
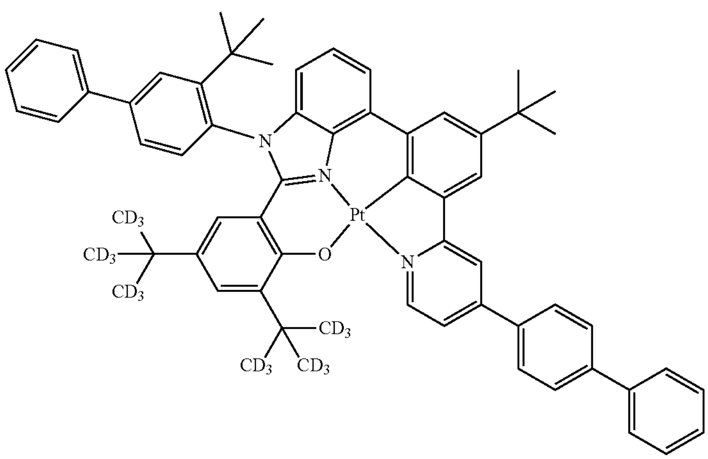
242
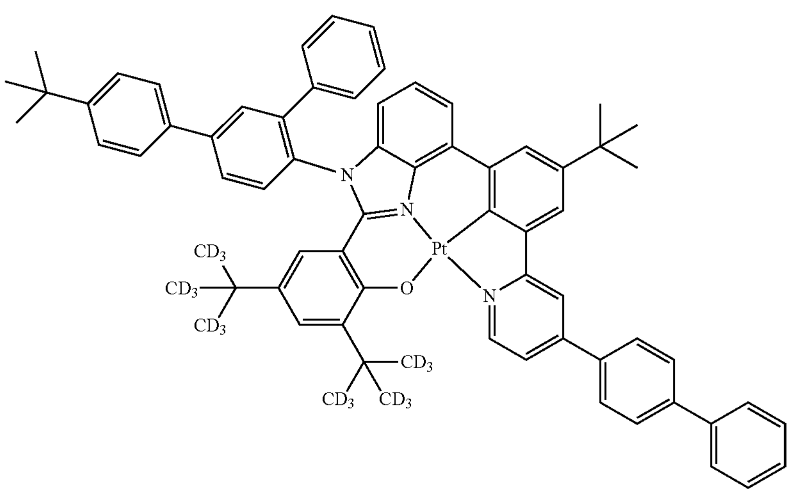

-continued
243
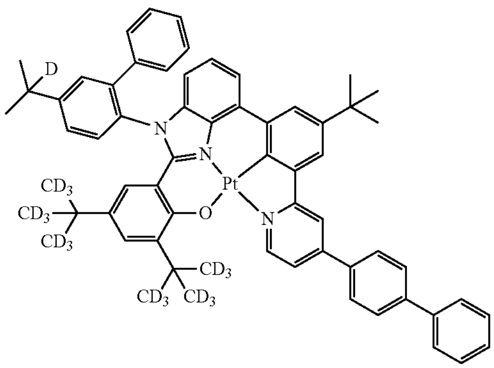
244
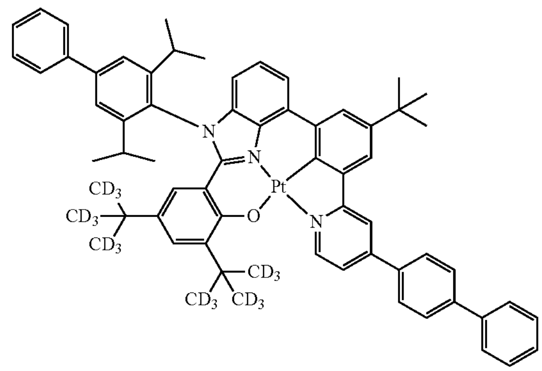
245
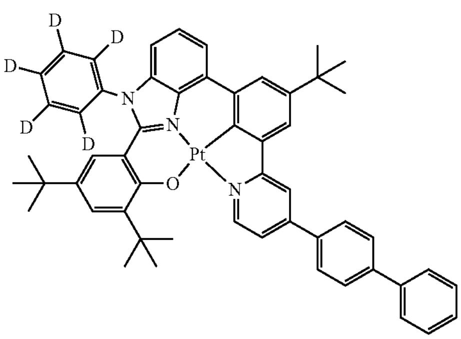
246
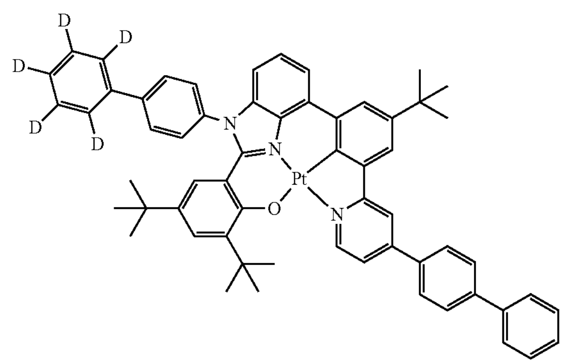
247
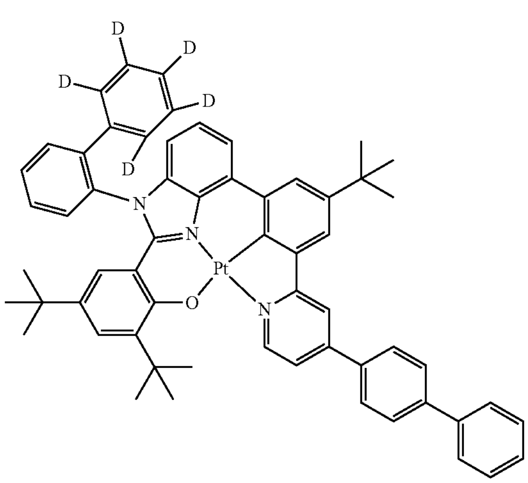
248
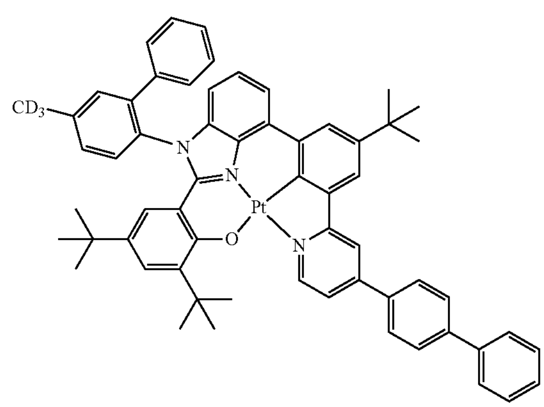

-continued
249
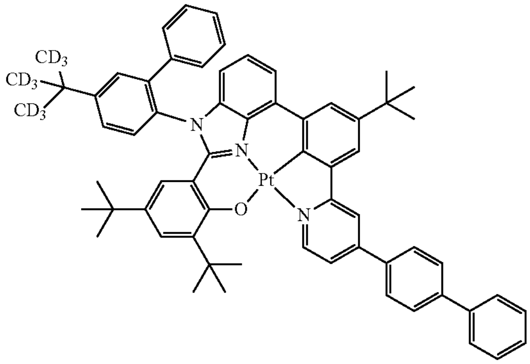
250
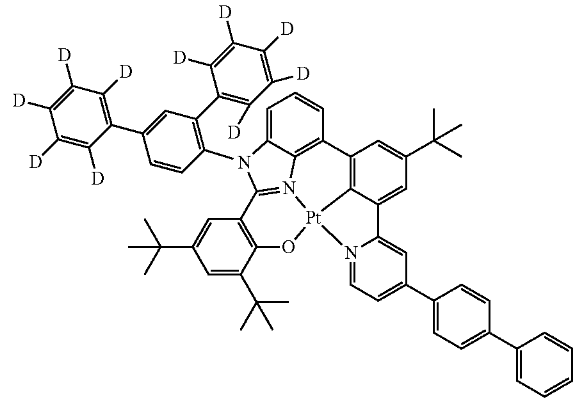
251
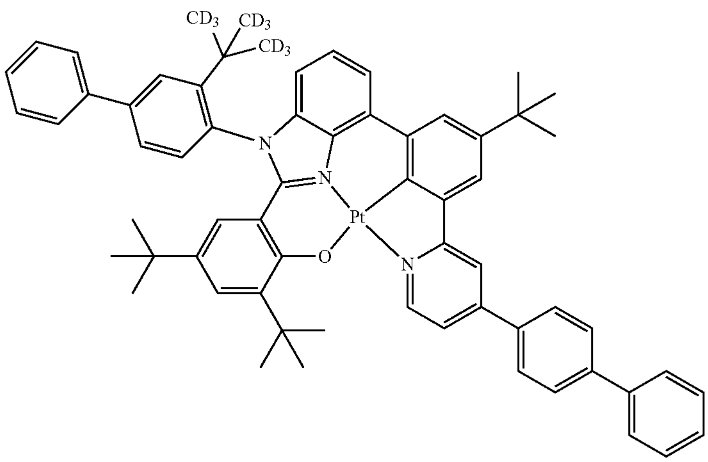
252
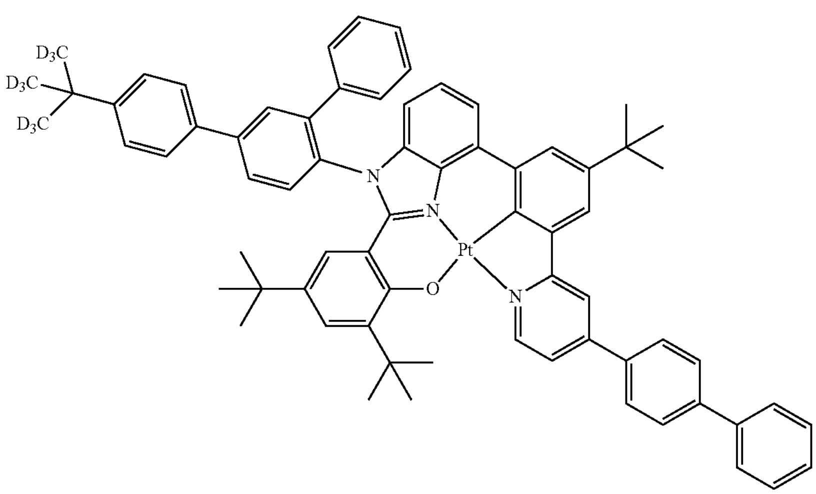

-continued
253
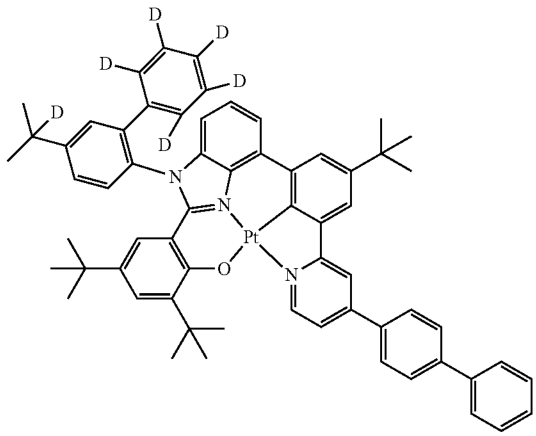
254
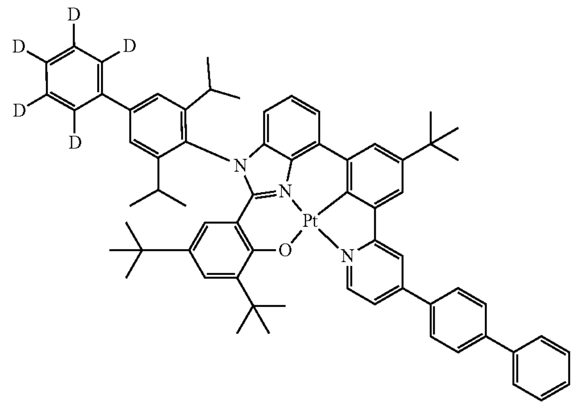
255
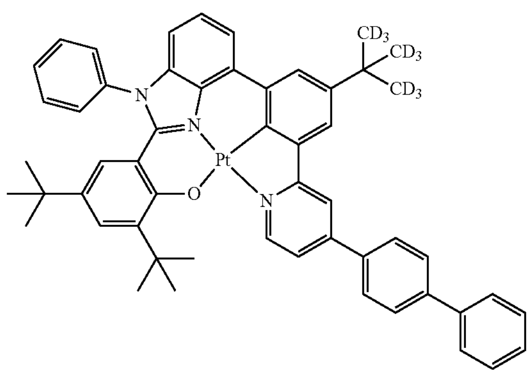
256
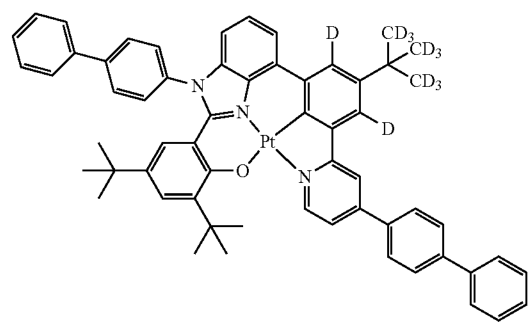
257
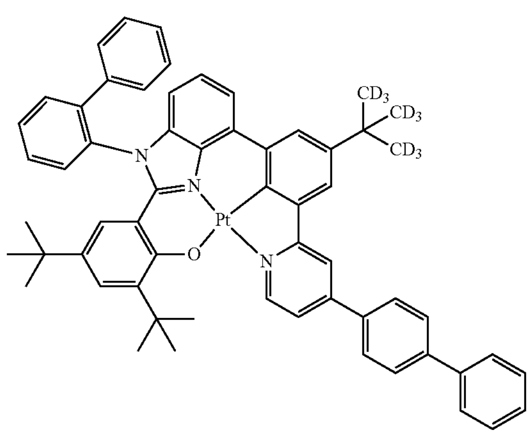
258
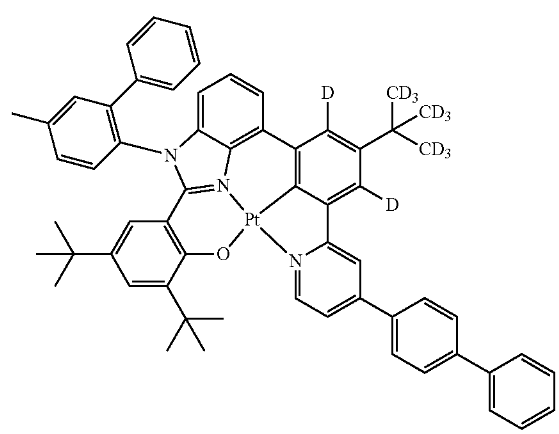

-continued
259
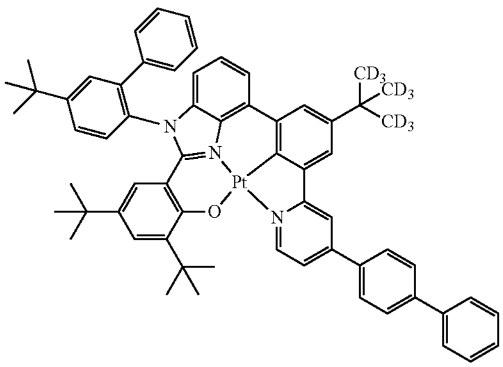
260
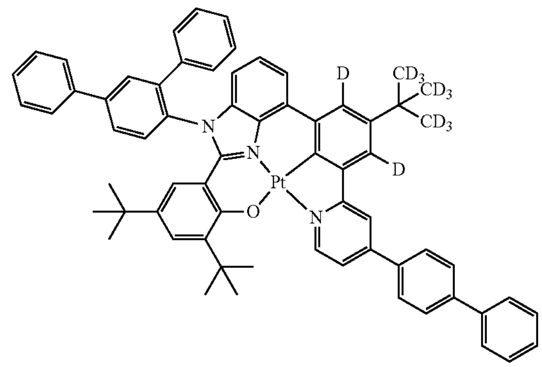
261
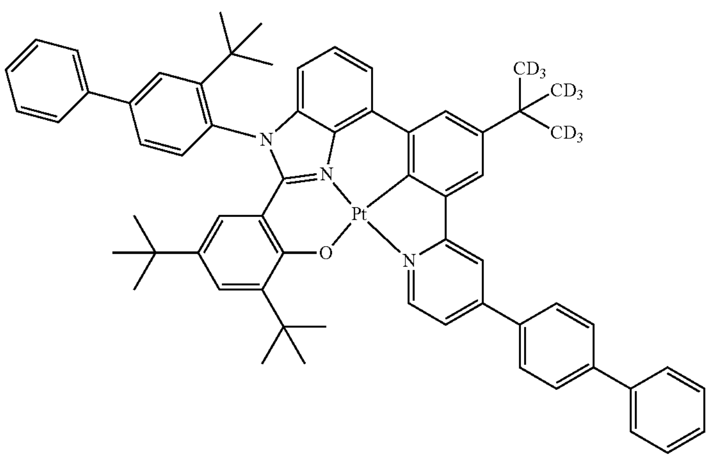
262
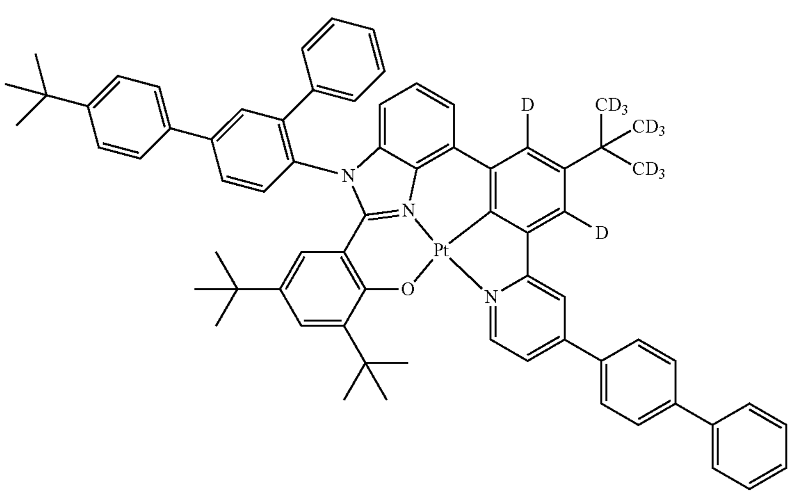

-continued
263
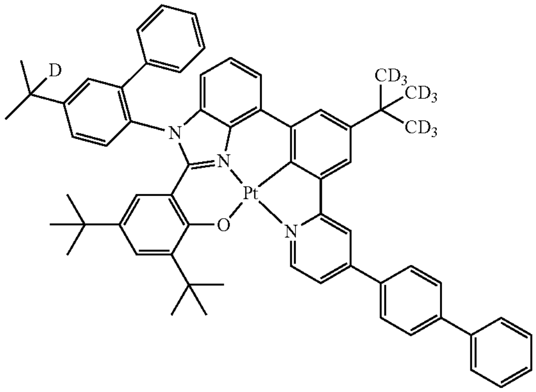
264
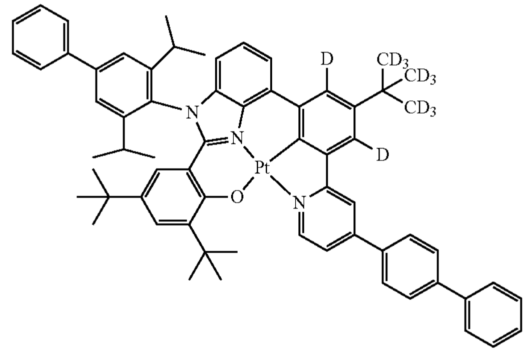
265
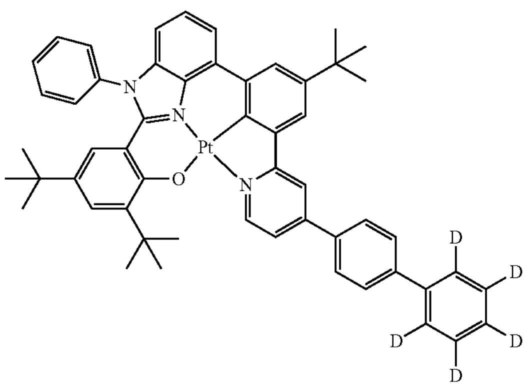
266
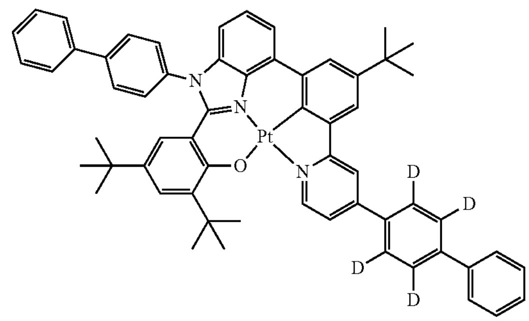
267
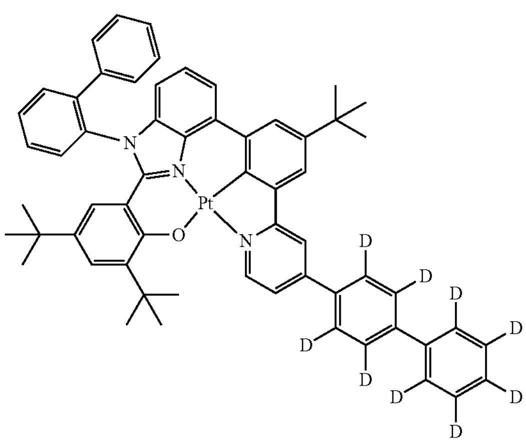
268
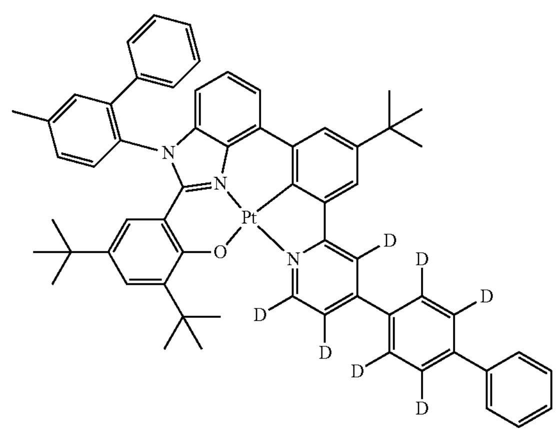

-continued
269
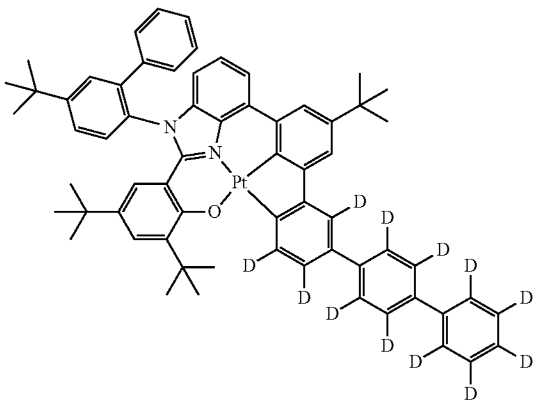
270
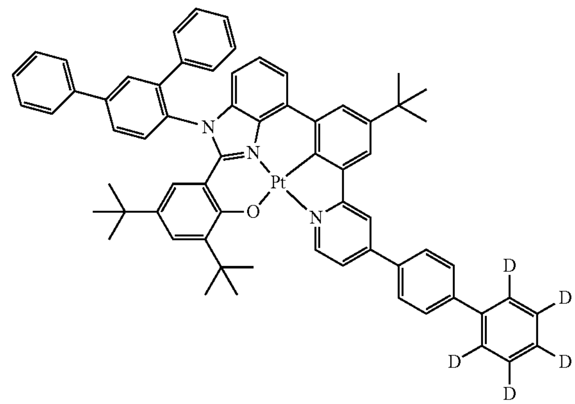
271
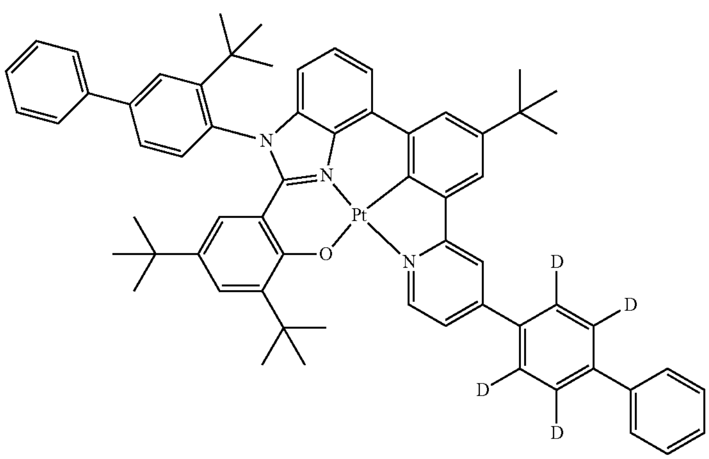
272
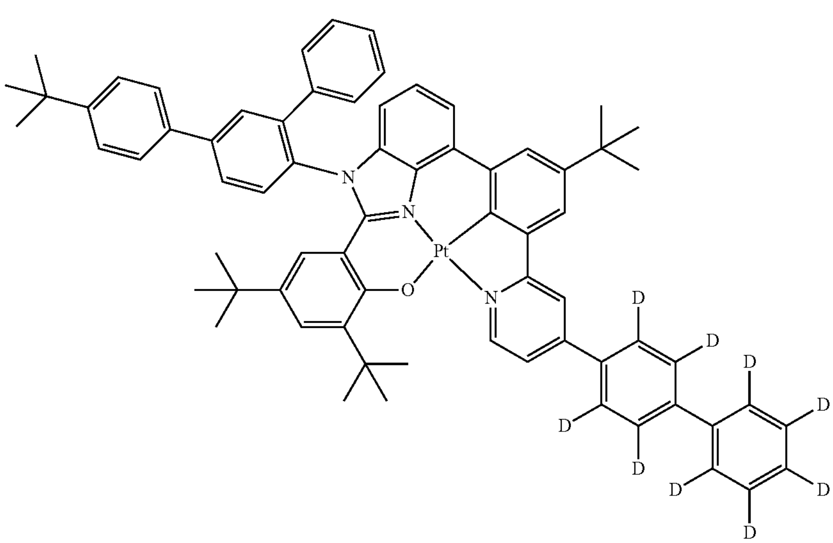

-continued
273
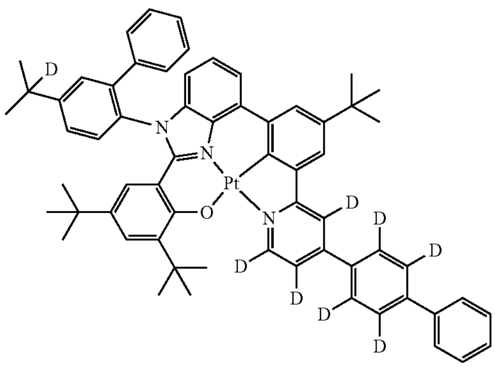
274
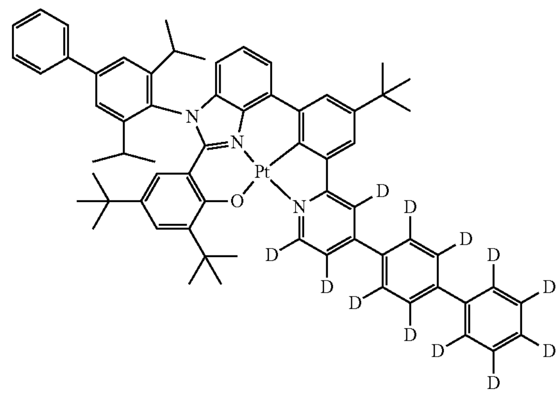
275
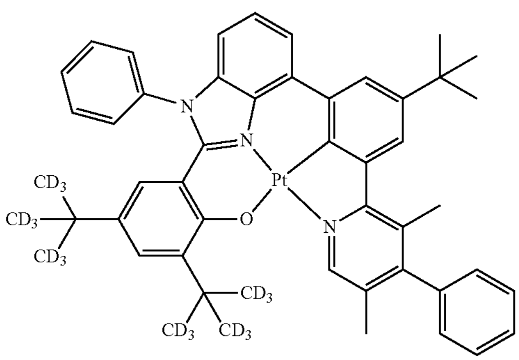
276
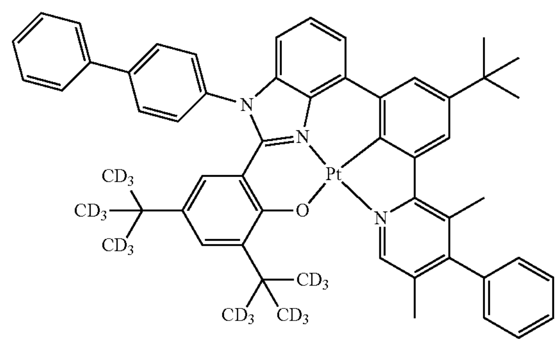
277
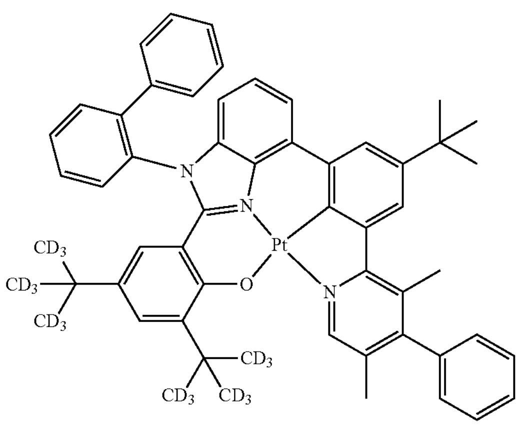
278
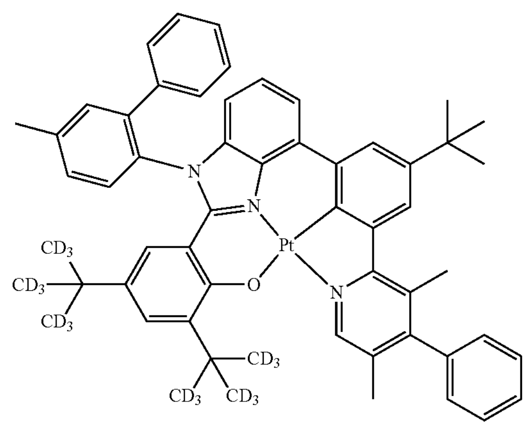
279
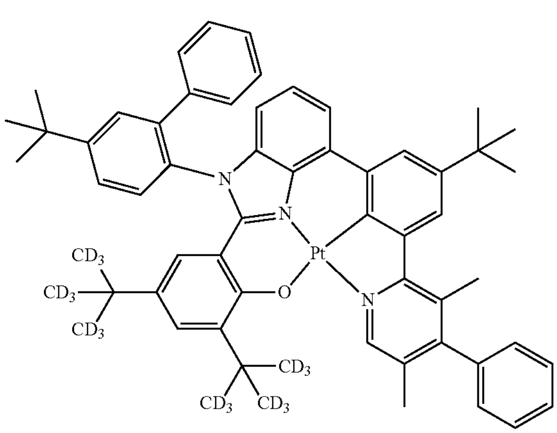
280
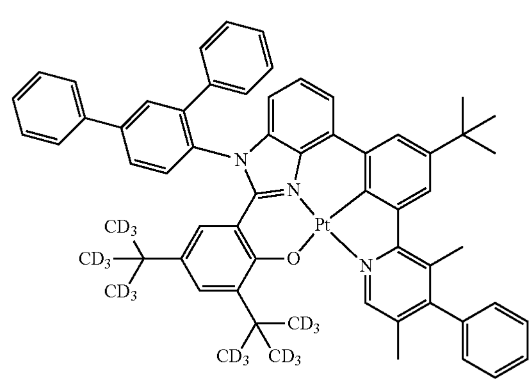

-continued
281
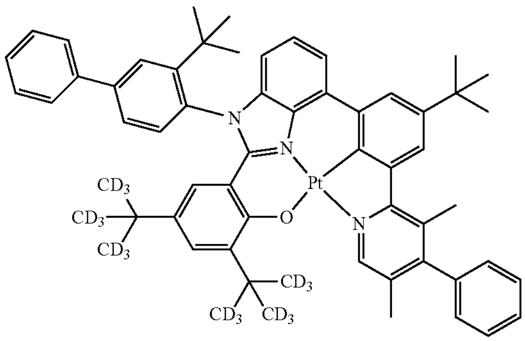
282
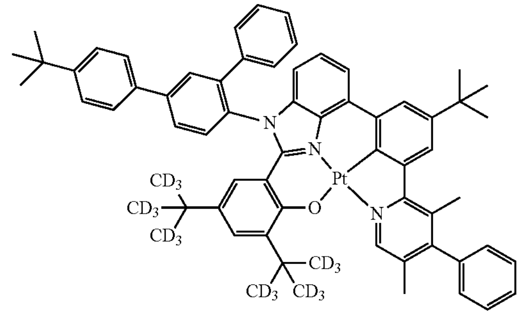
283
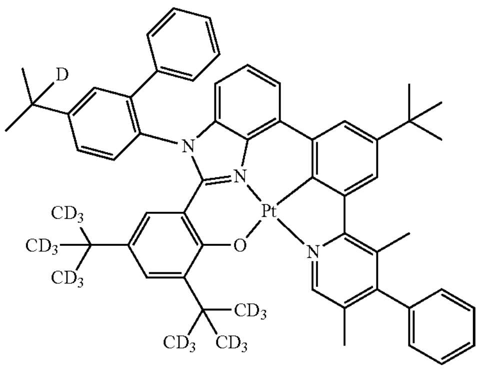
284
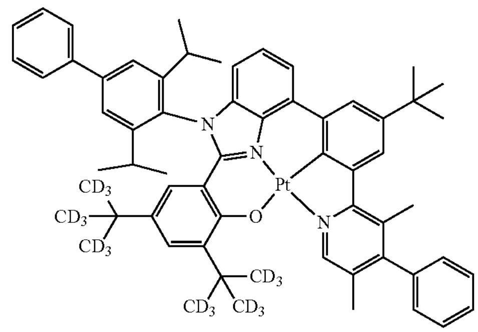
285
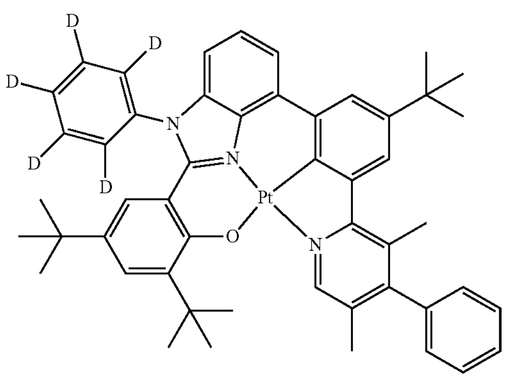
286
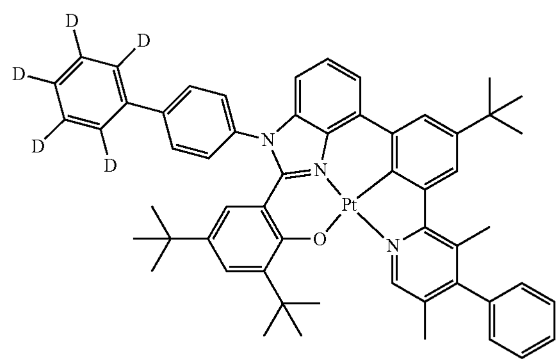
287
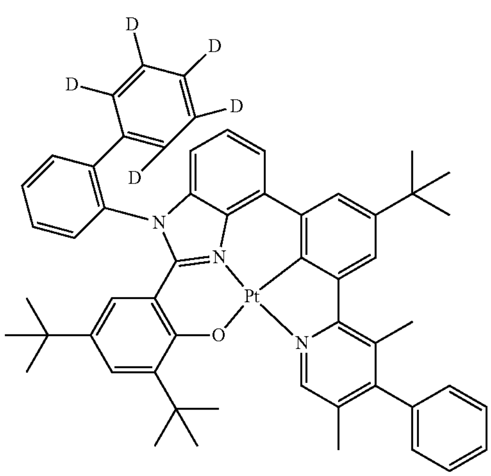
288
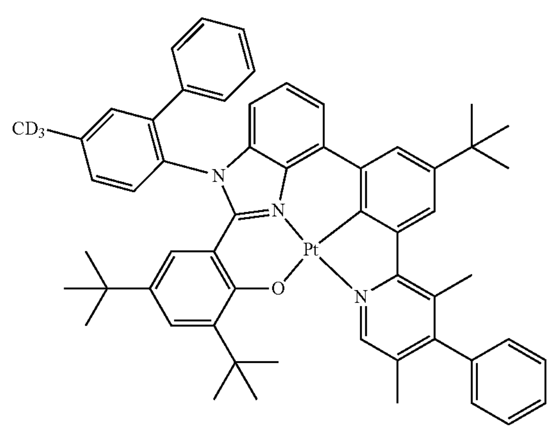

-continued
289
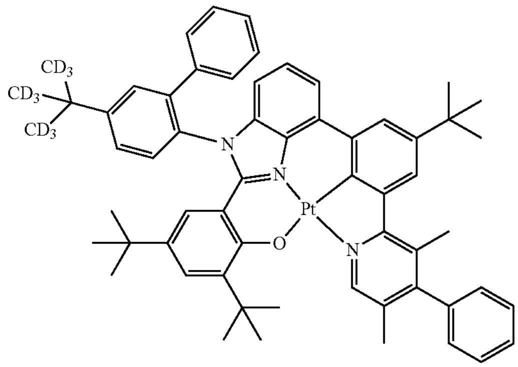
290
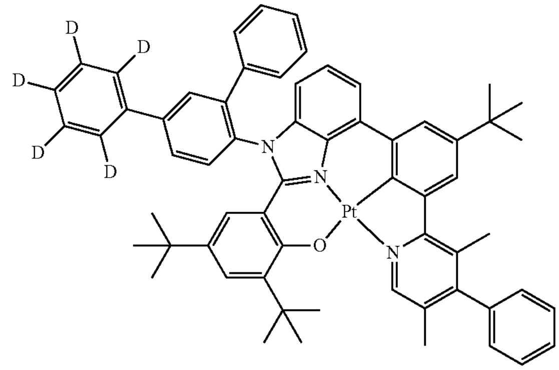
291
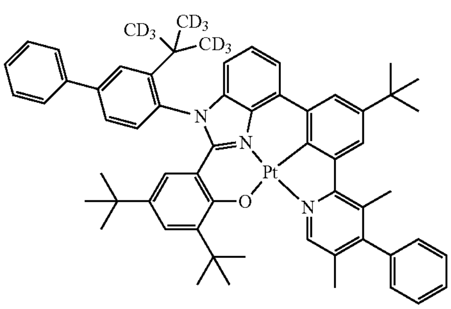
292
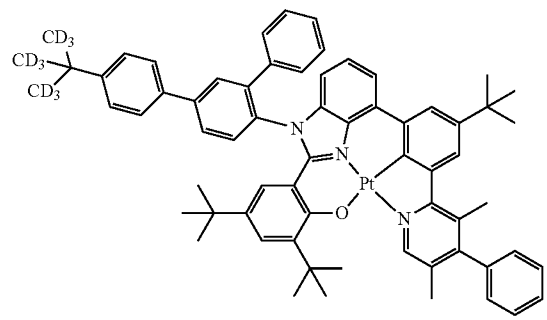
293
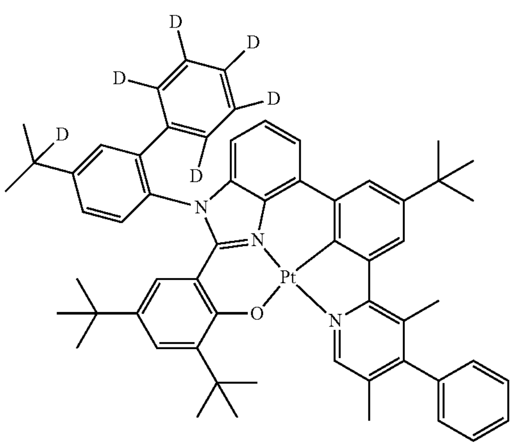
294
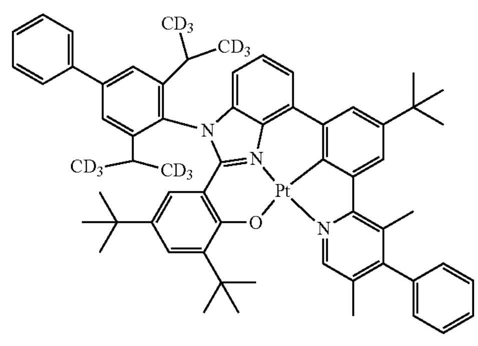
295
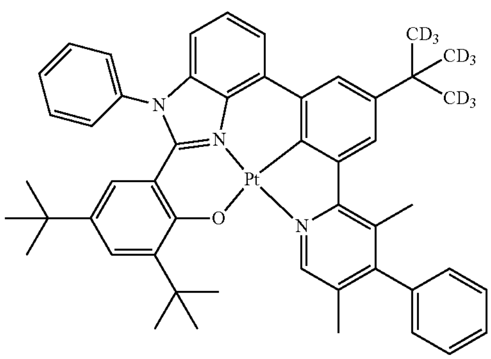
296
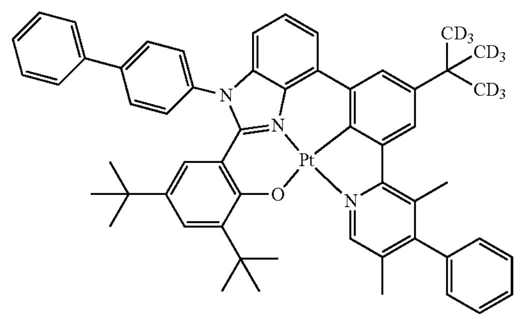

-continued
297
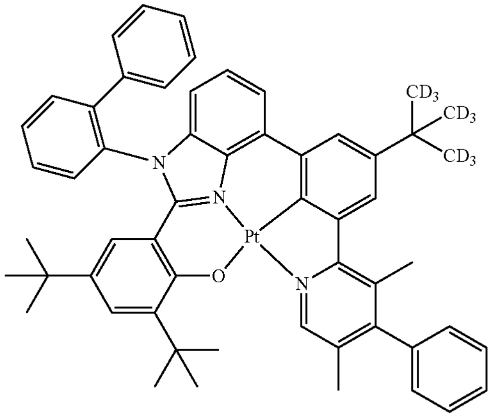
298
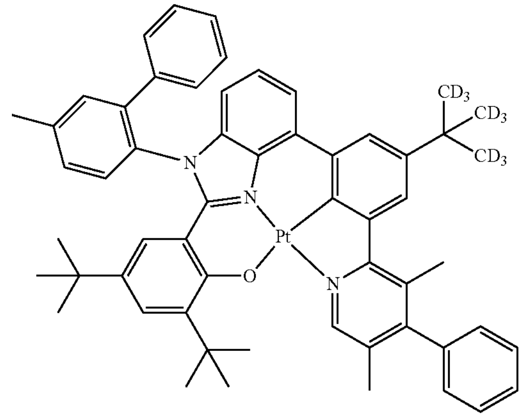
299
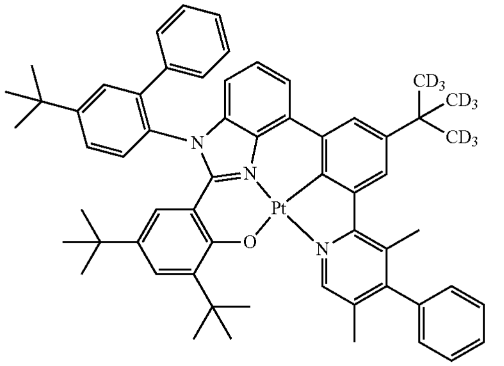
300
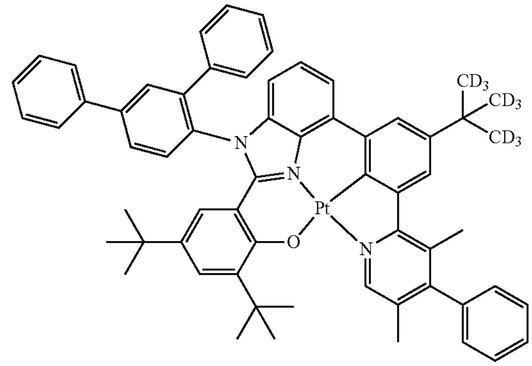
301
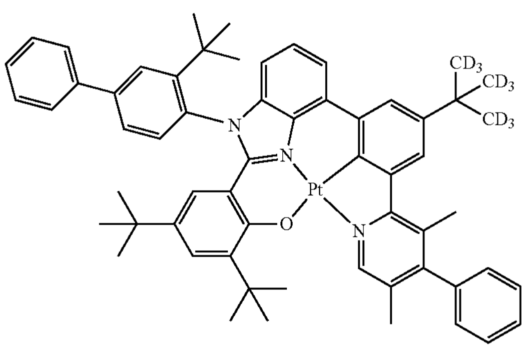
302
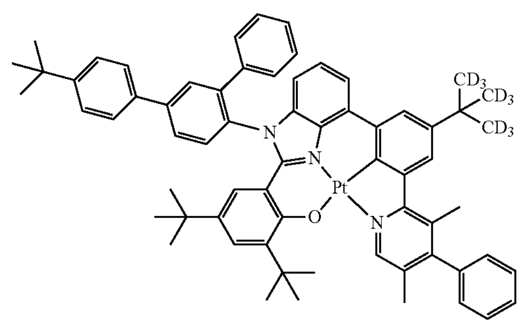
303
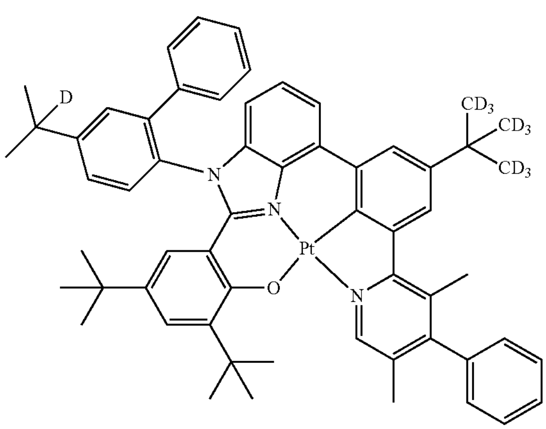
304
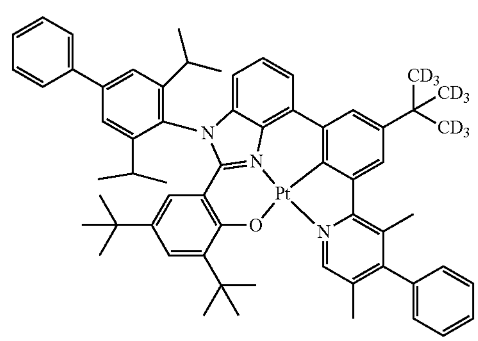

-continued
305
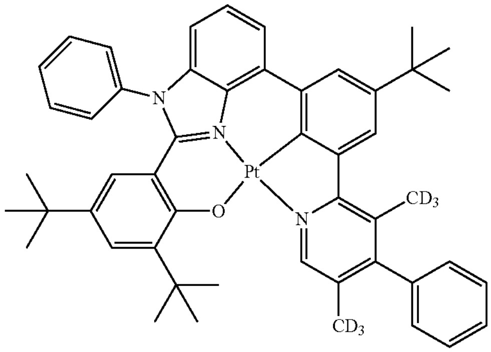
306
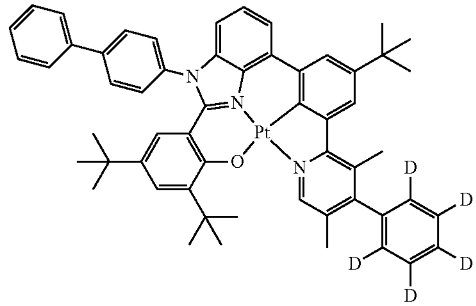
307
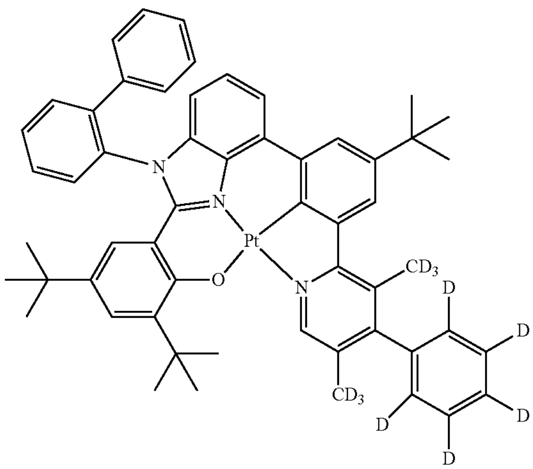
308
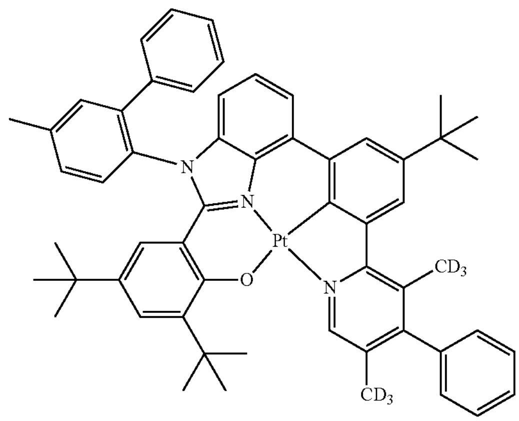
309
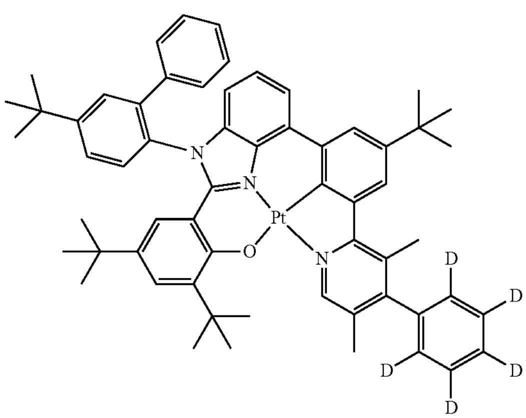
310
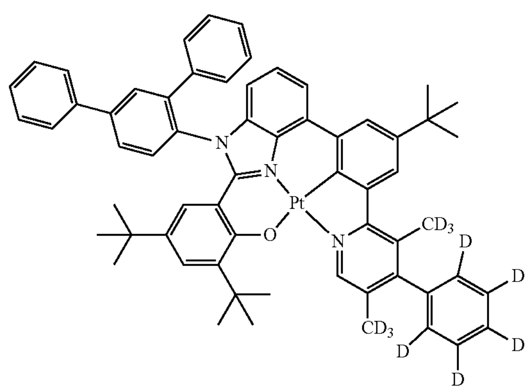
311
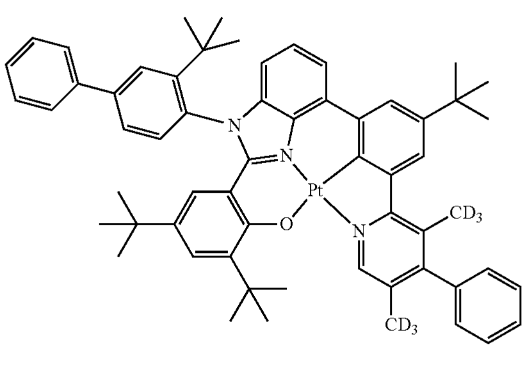
312
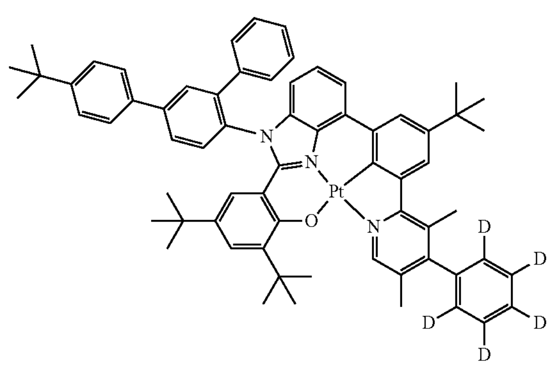

-continued
313
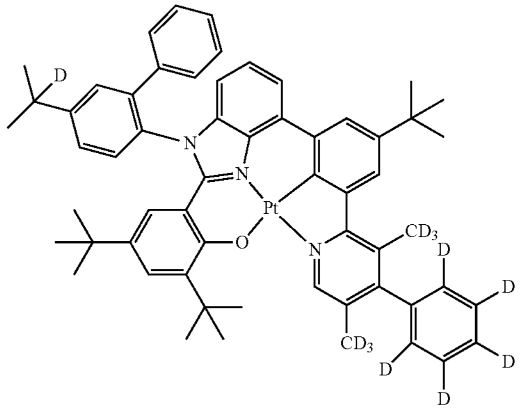
314
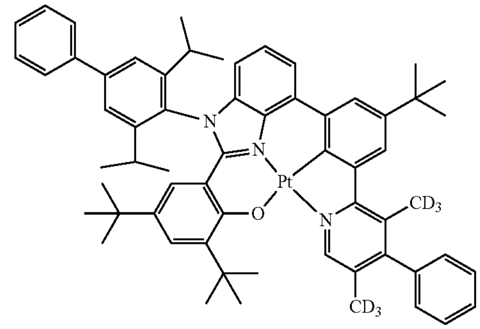
315
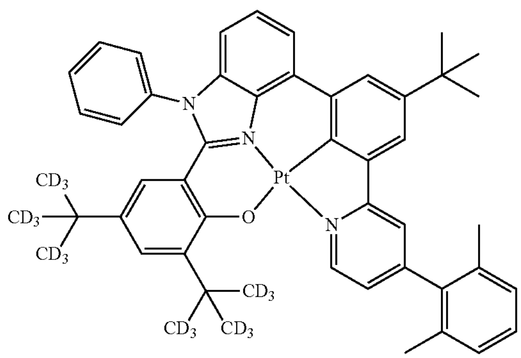
316
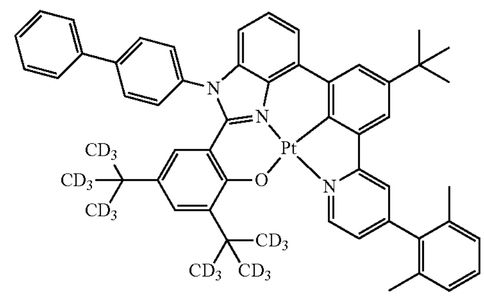
317
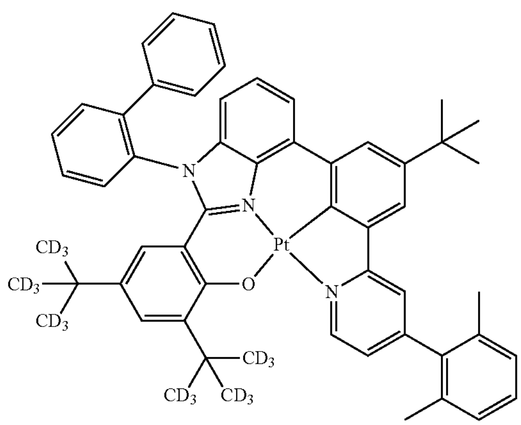
318
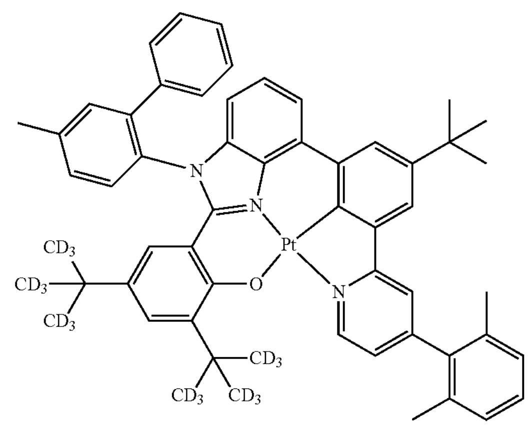
319
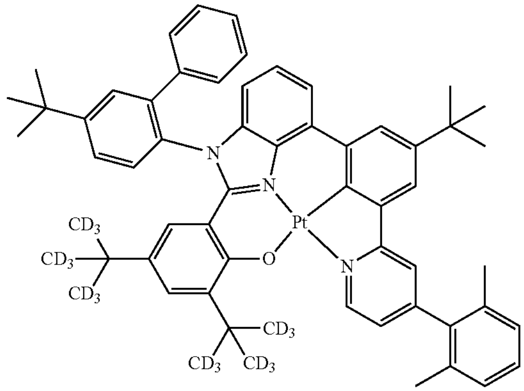
320
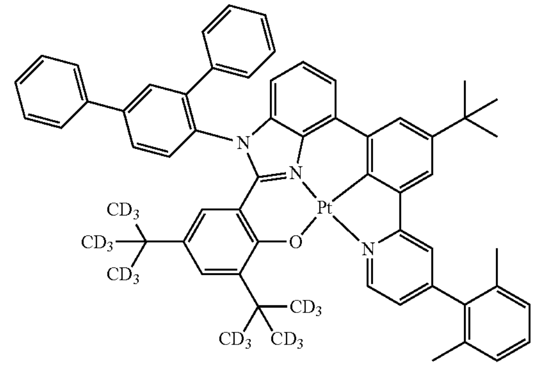

-continued
321
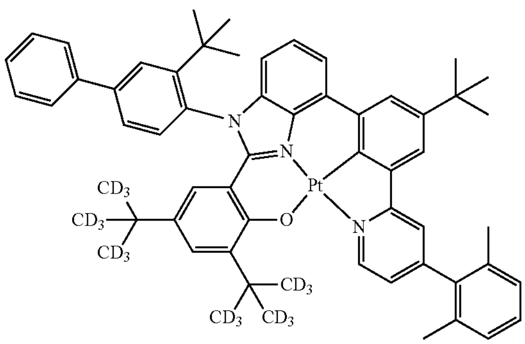
322
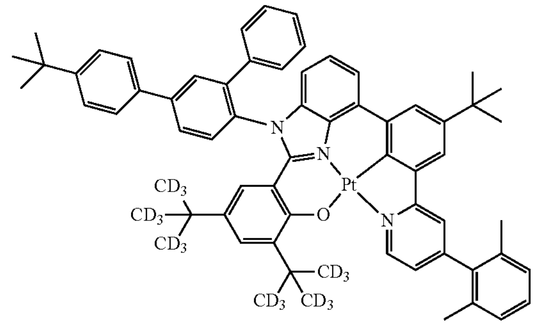
323
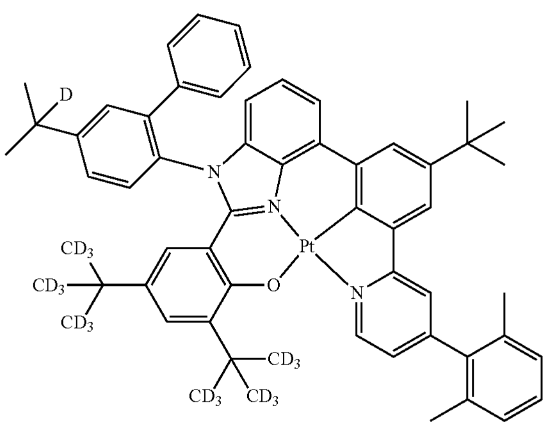
324
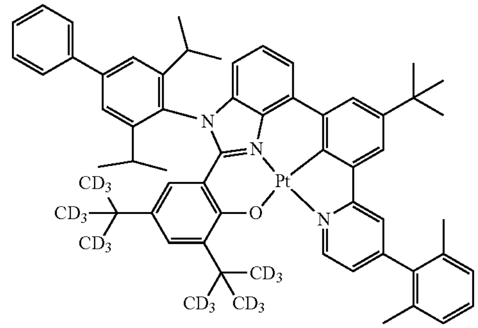
325
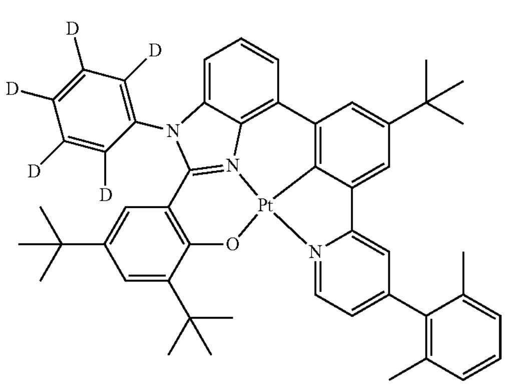
326
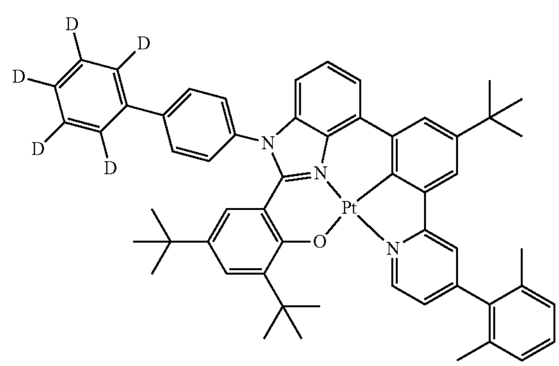

-continued
327
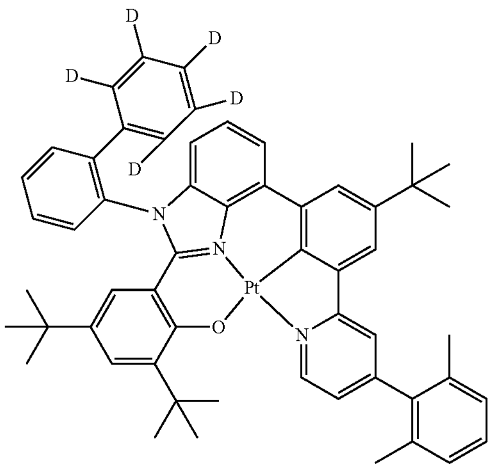
328
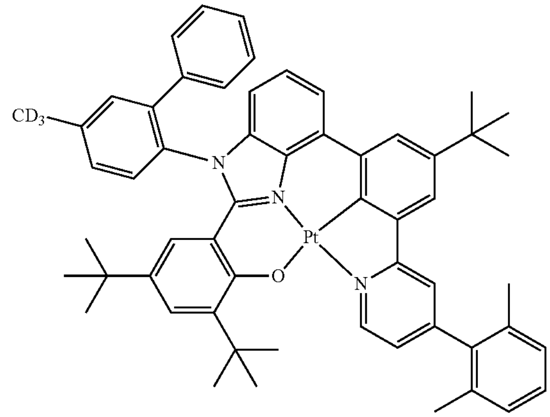
329
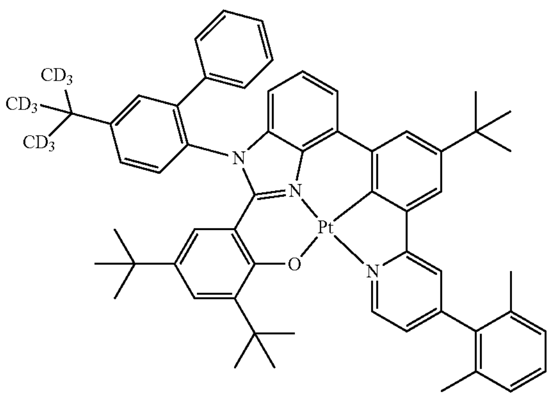
330
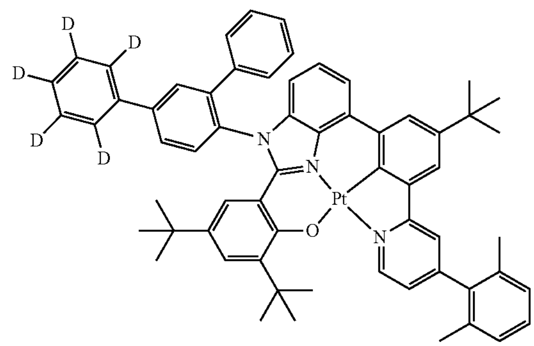
331
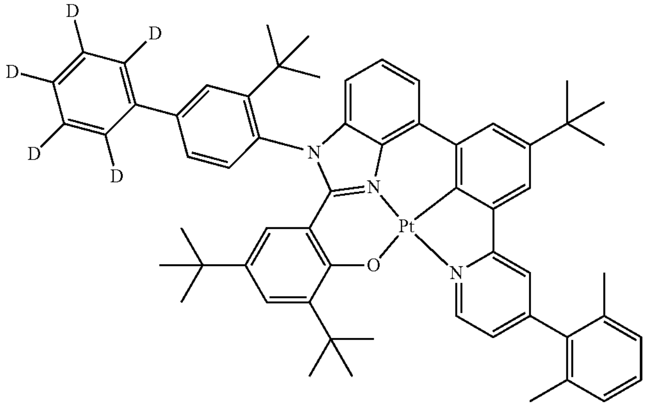

-continued
332
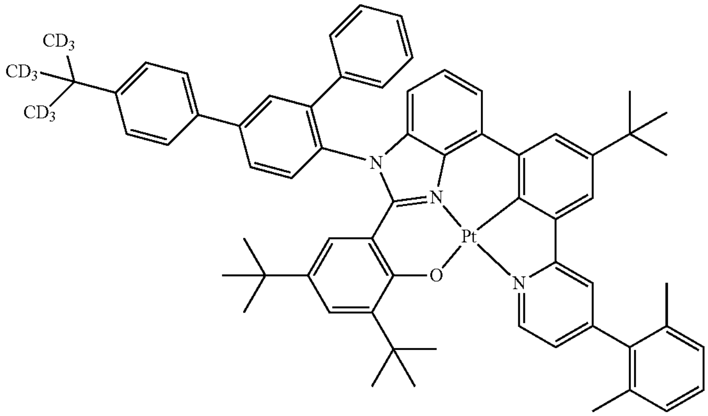
333
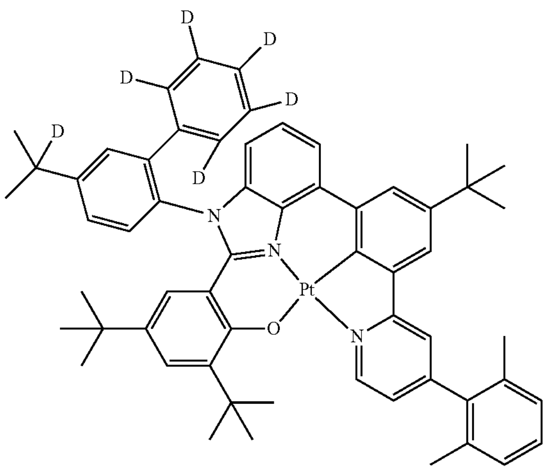
334
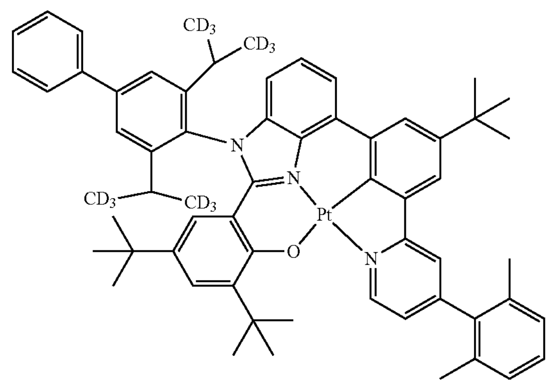
335
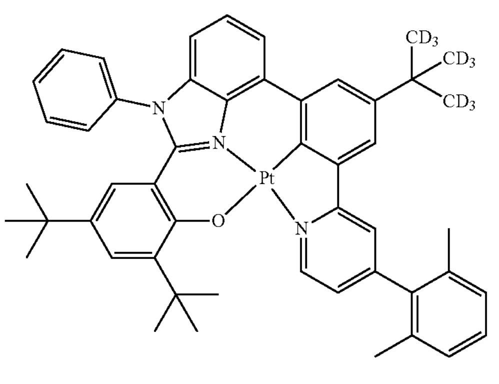
336
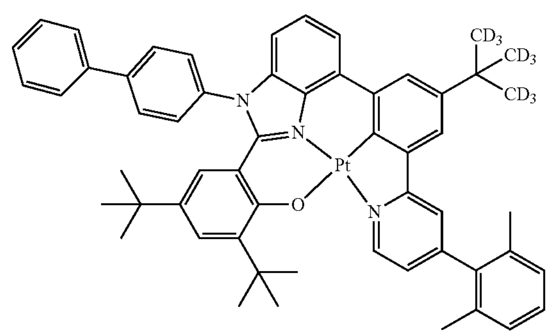

-continued
337
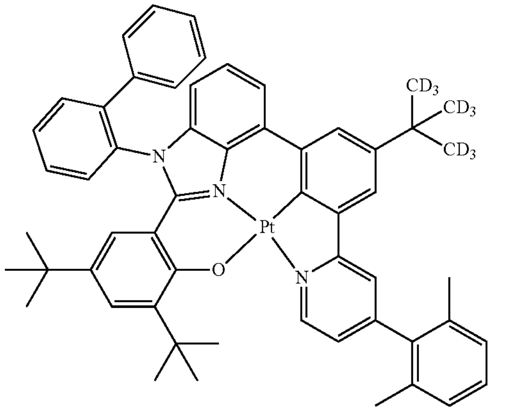
338
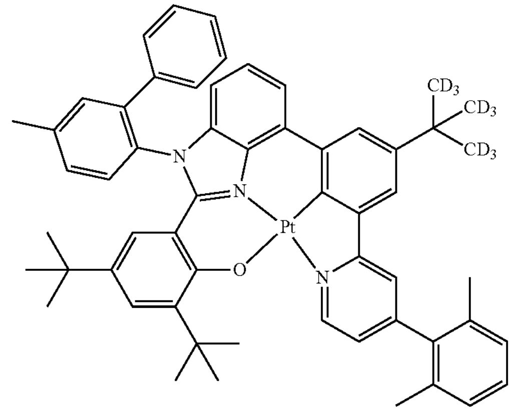
339
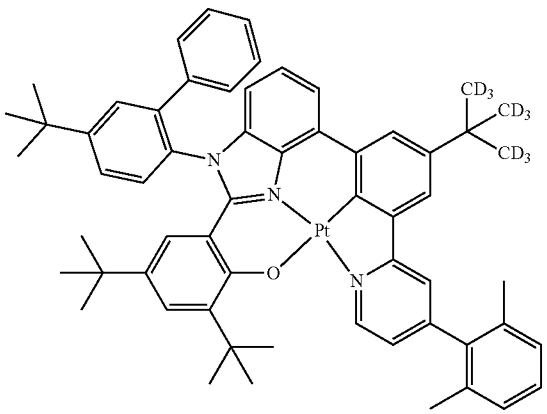
340
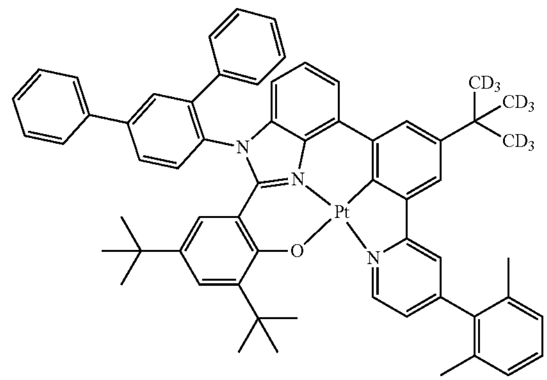
341
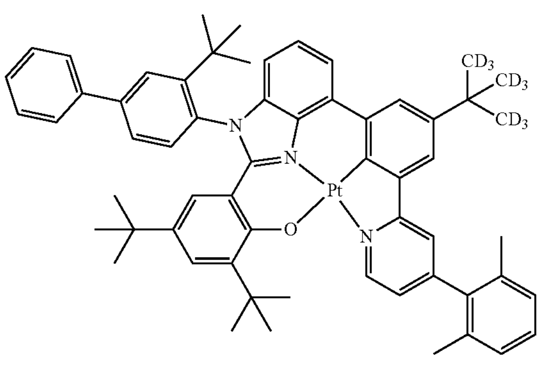
342
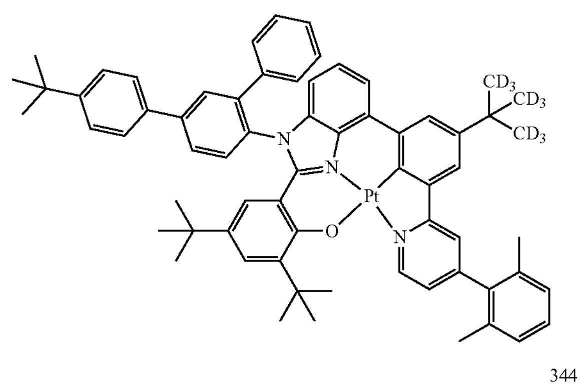
343
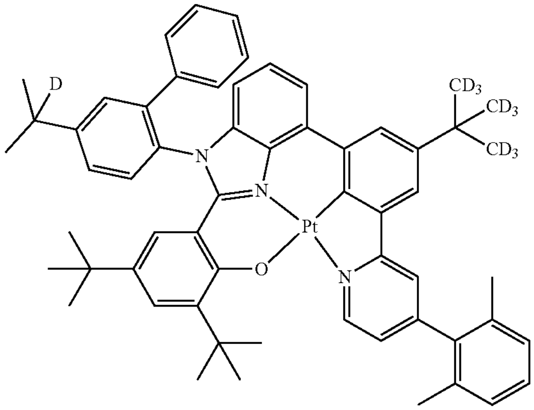
344
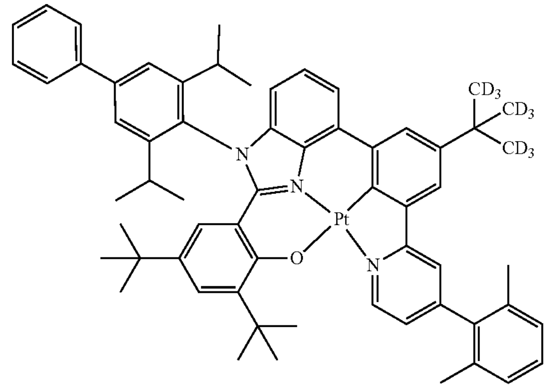

-continued
345
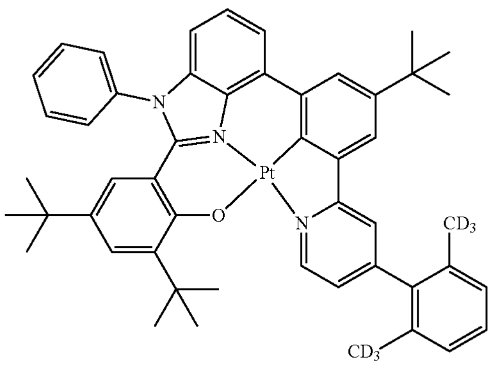
346
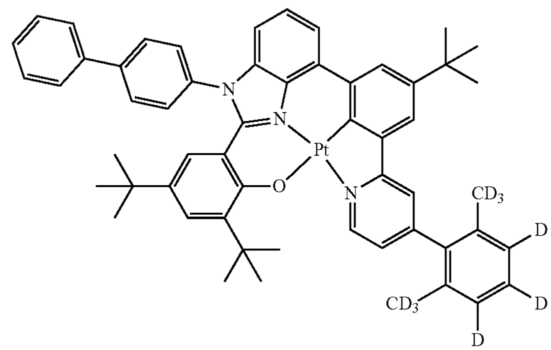
347
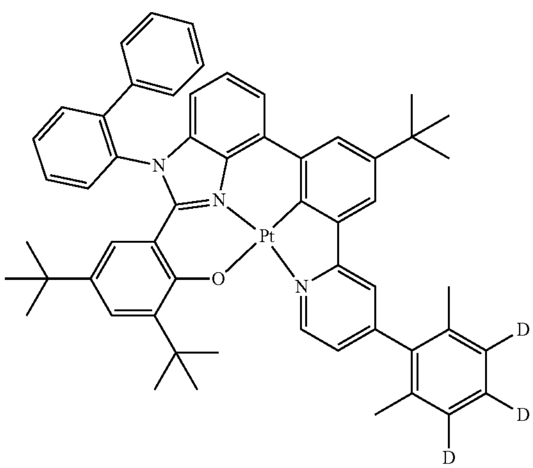
348
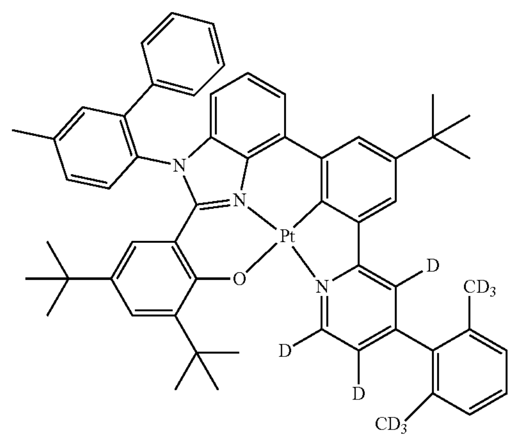
349
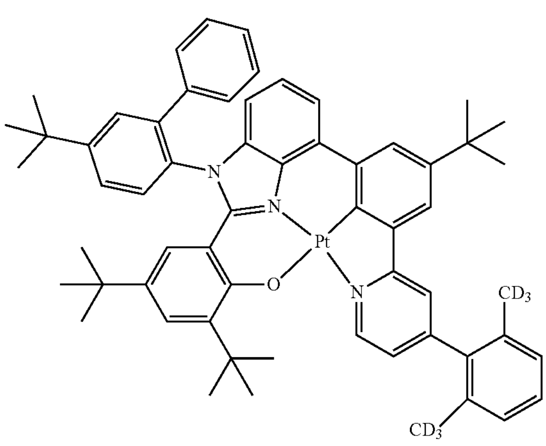
350
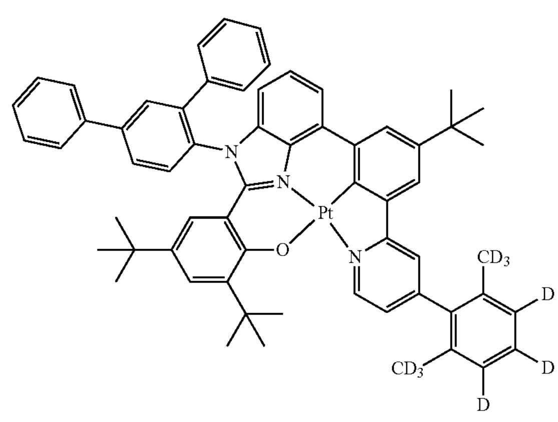

-continued
351
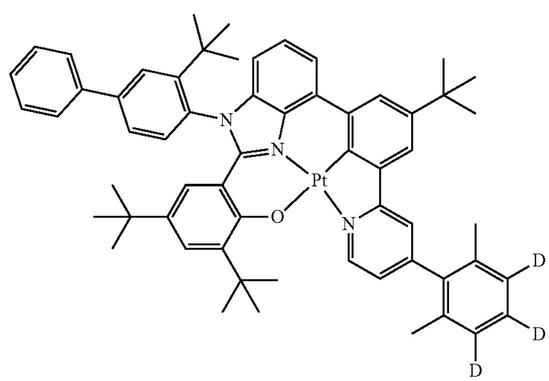
352
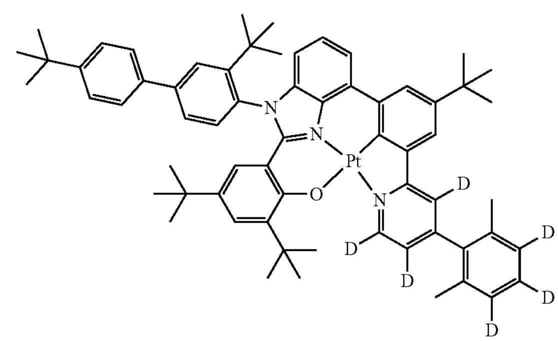
353
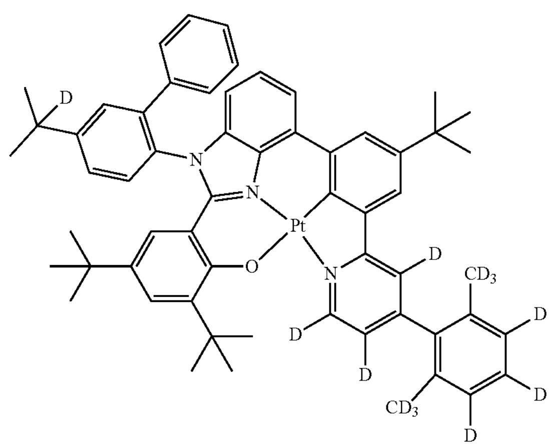
354
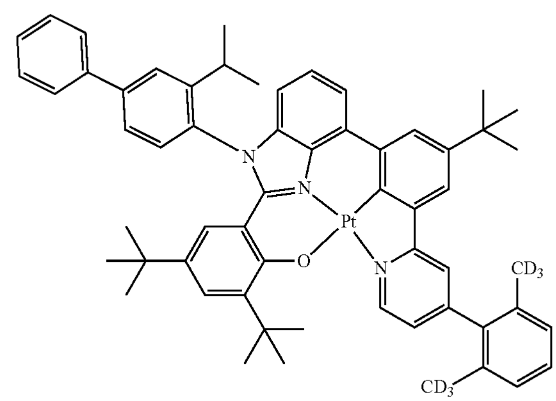
355
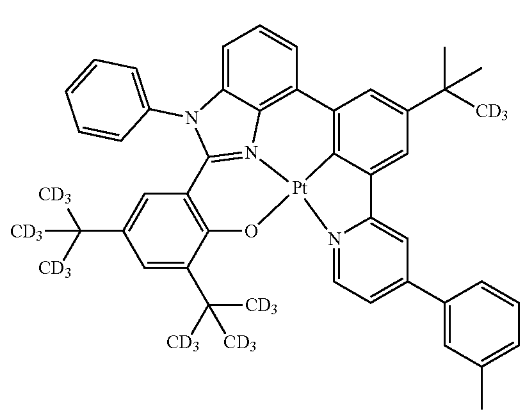
356
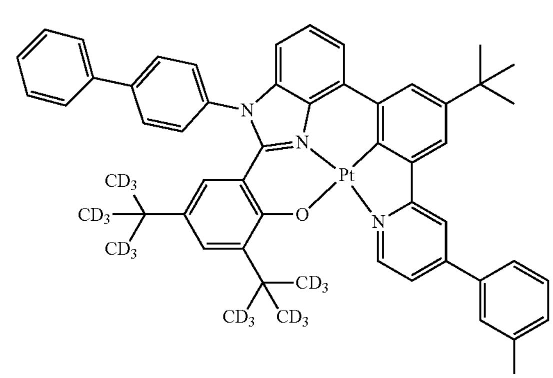

-continued
357
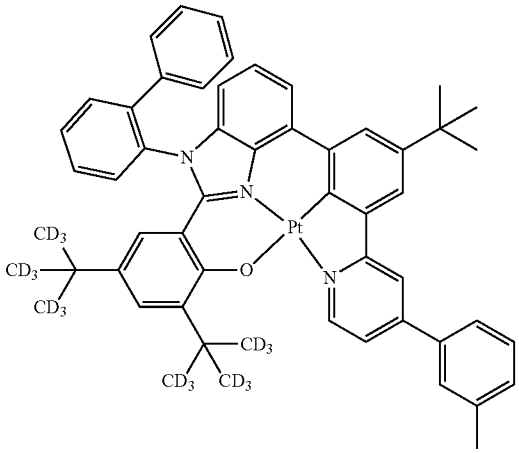
358
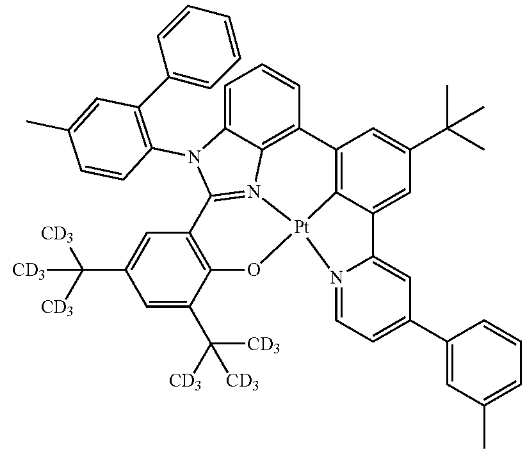
359
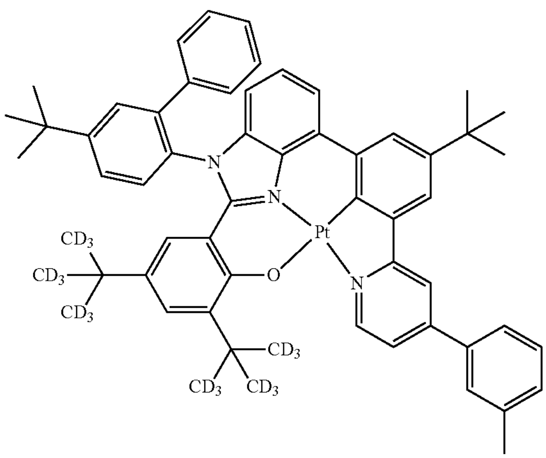
360
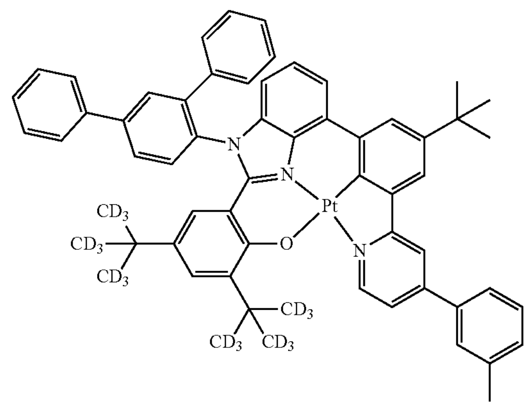
361
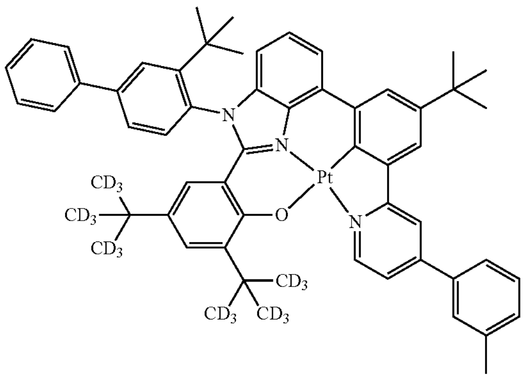
362
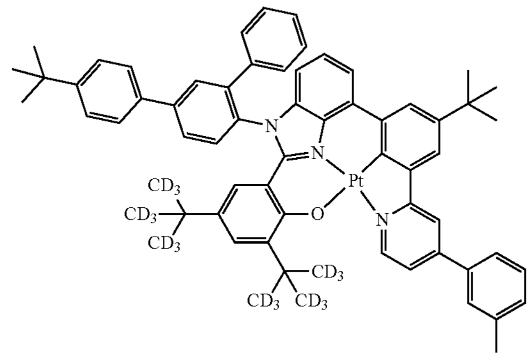

-continued
363
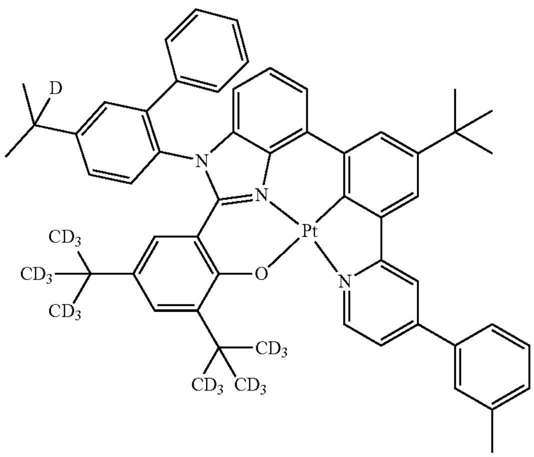
364
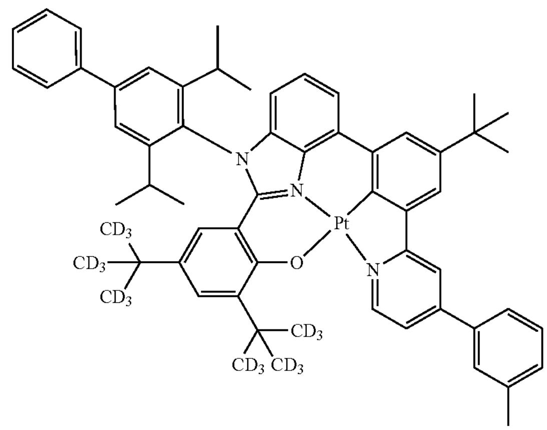
365
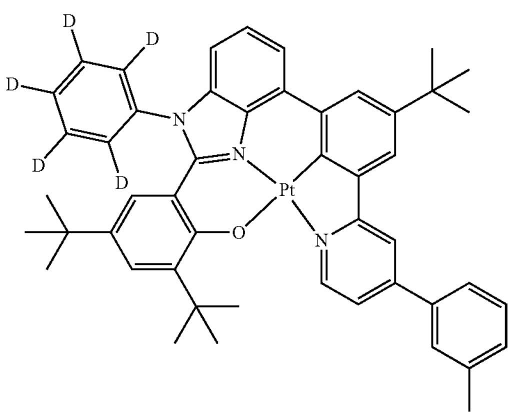
366
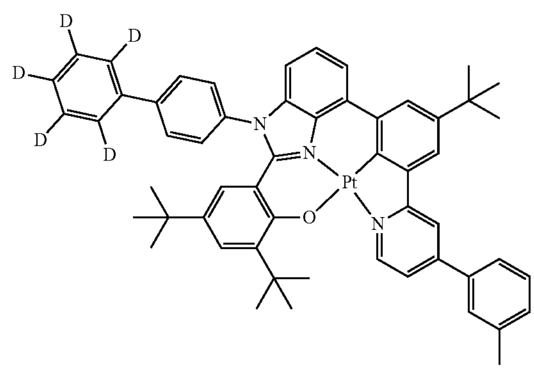
367
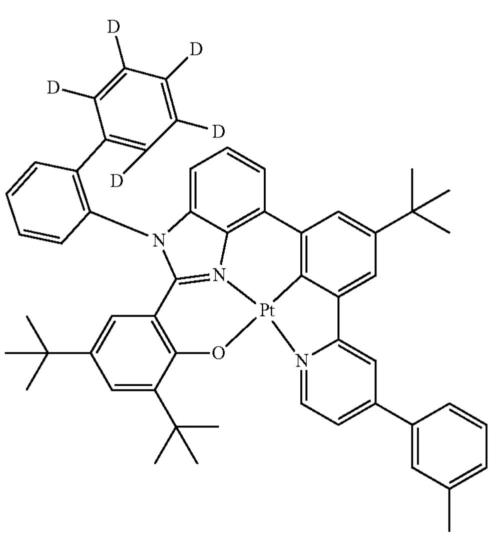
368
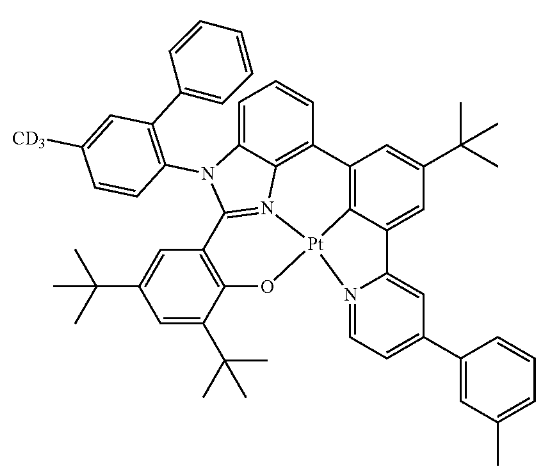

-continued
369
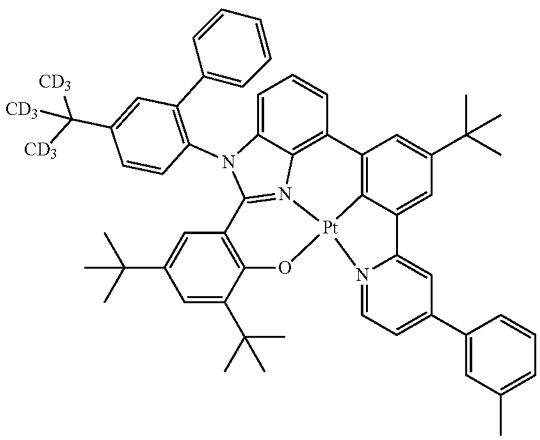
370
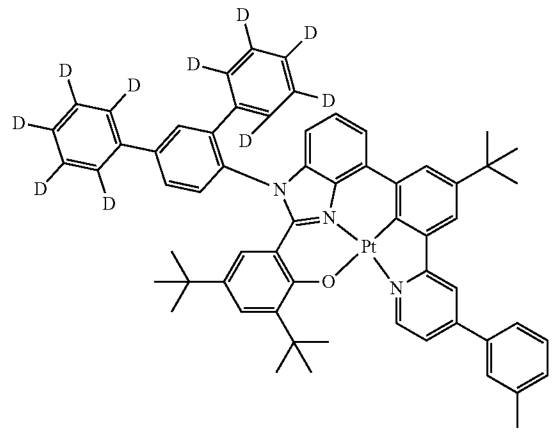
371
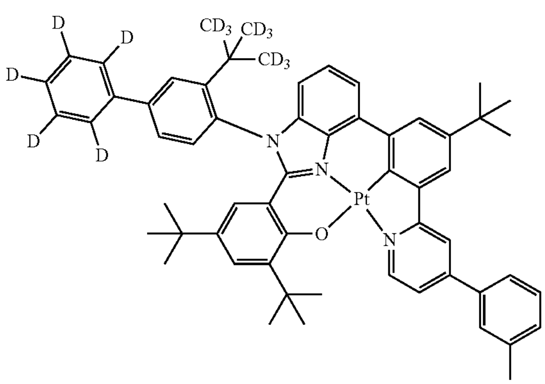
372
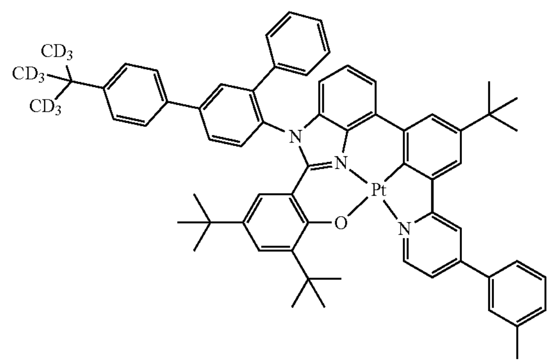
373
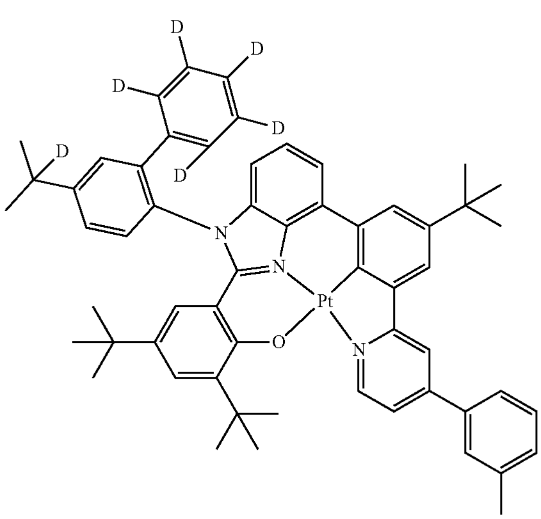
374
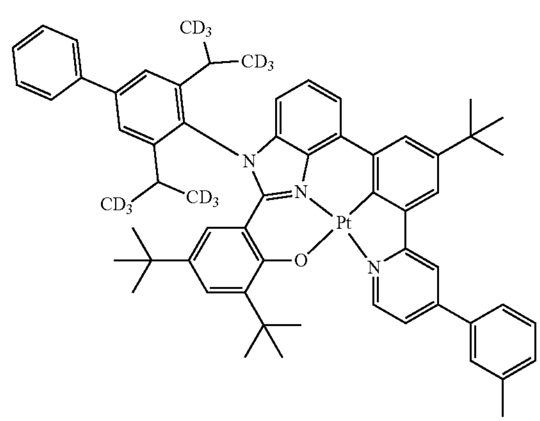

-continued
375
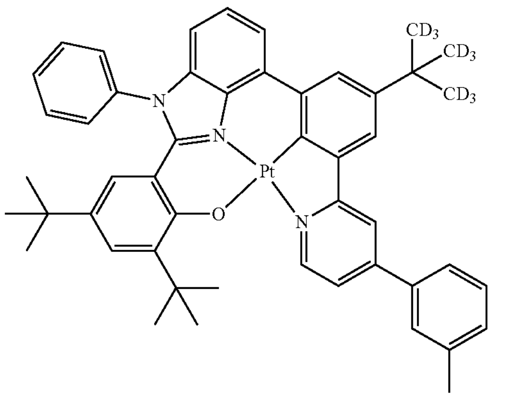
376
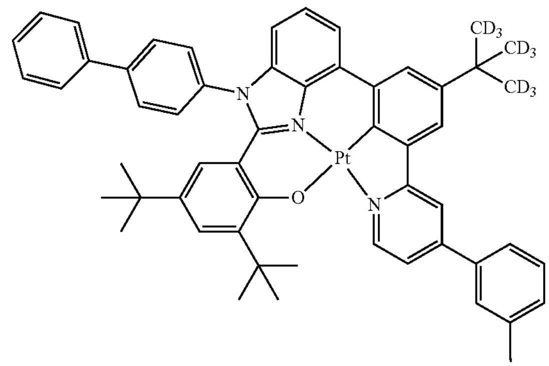
377
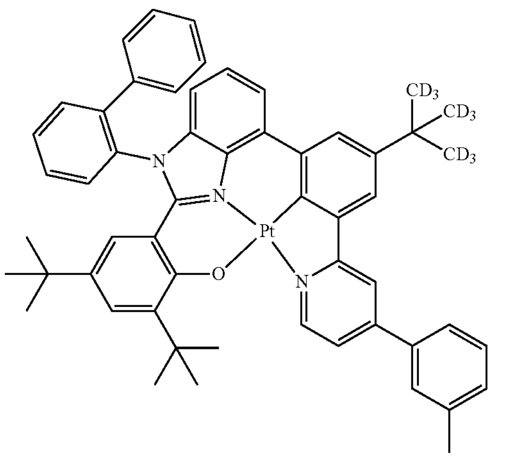
378
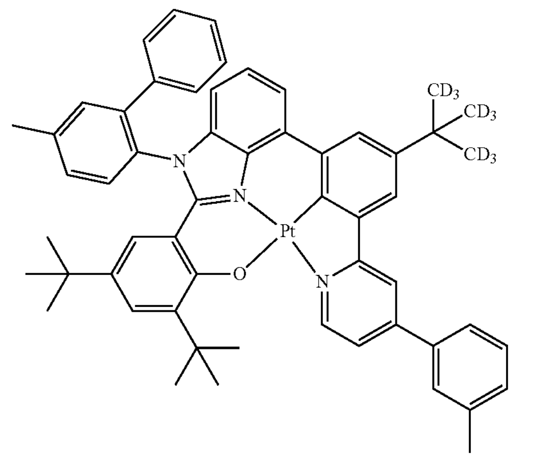
379
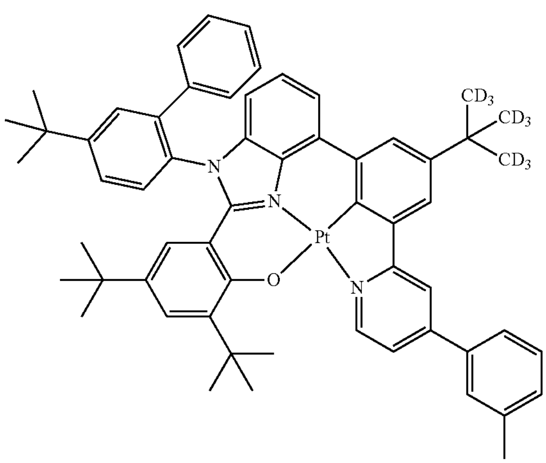
380
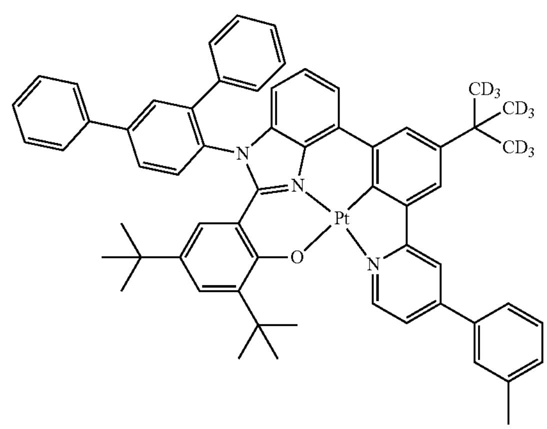

-continued
381
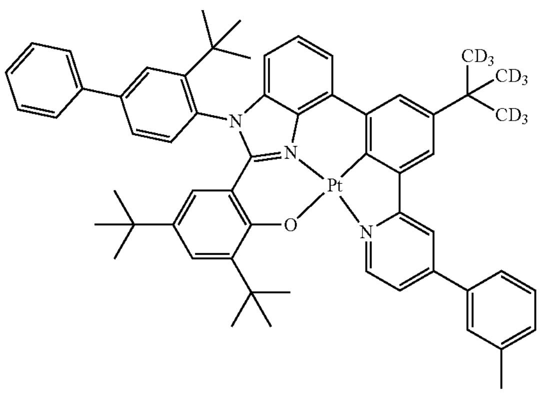
382
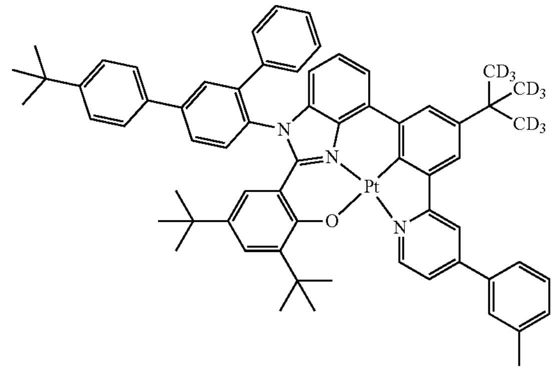
383
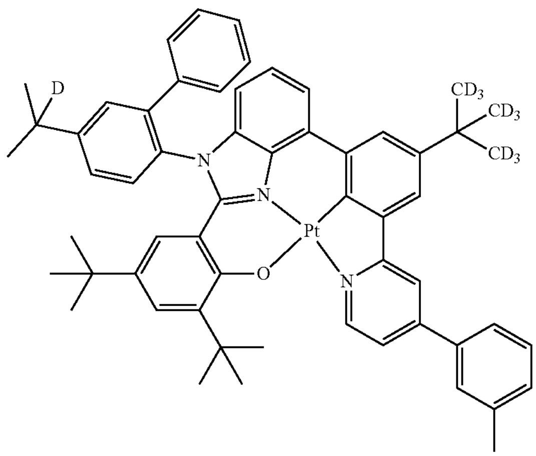
384
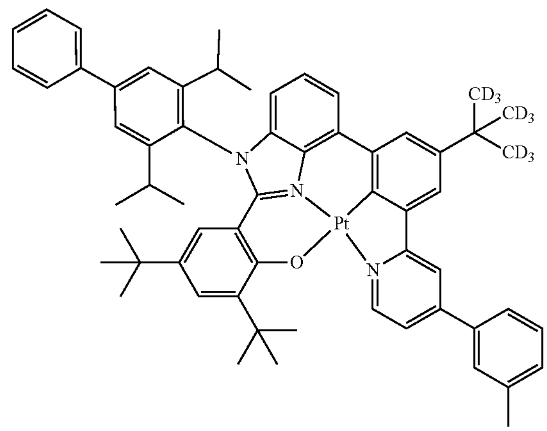
385
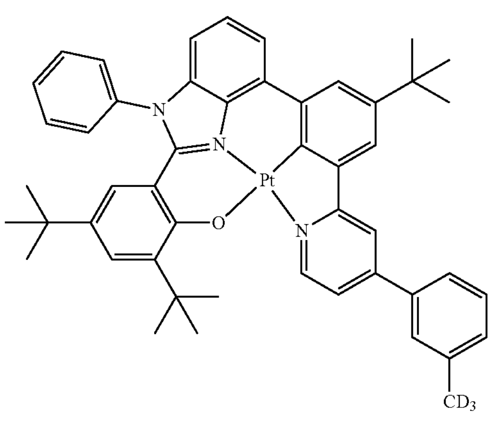
386
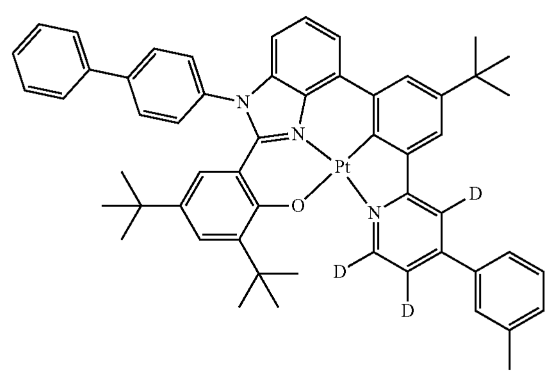

-continued
387
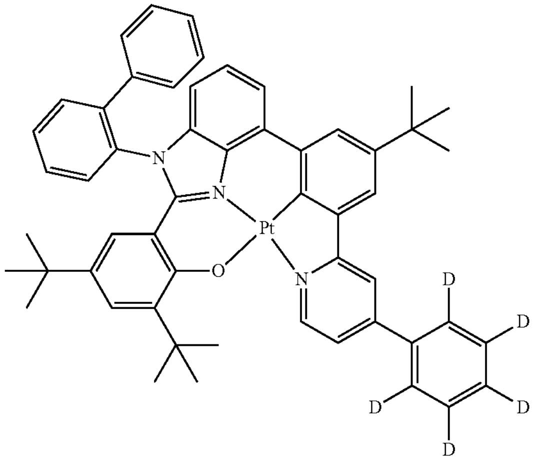
388
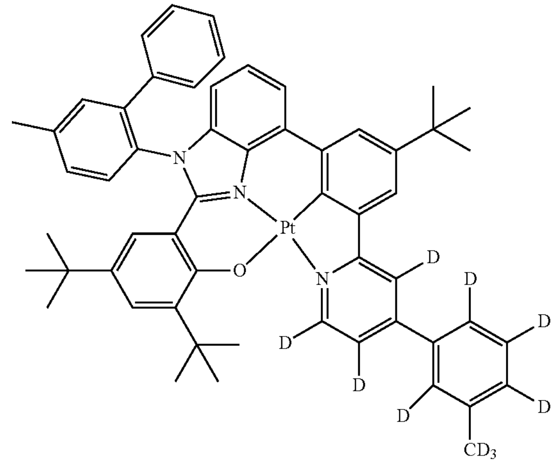
389
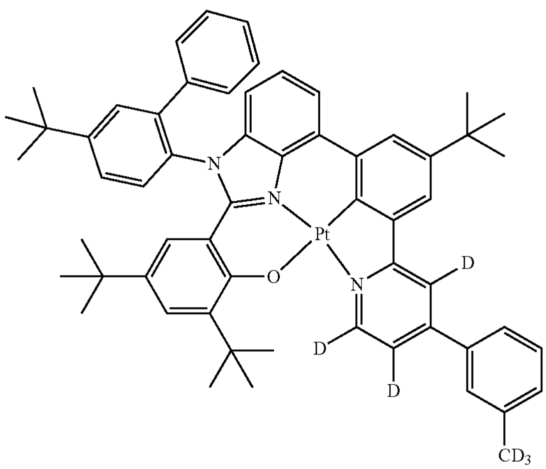
390
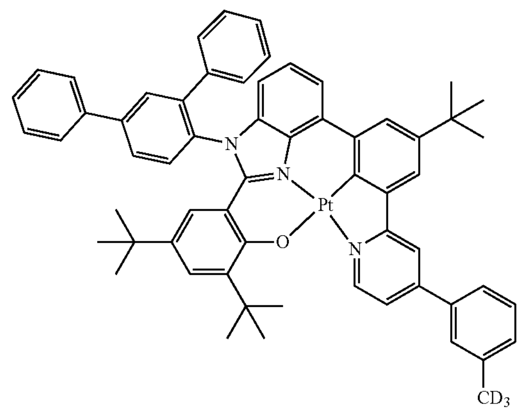
391
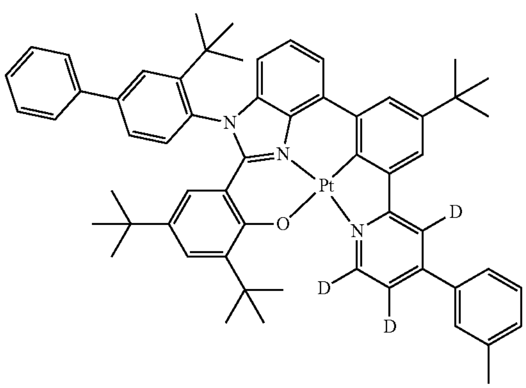
392
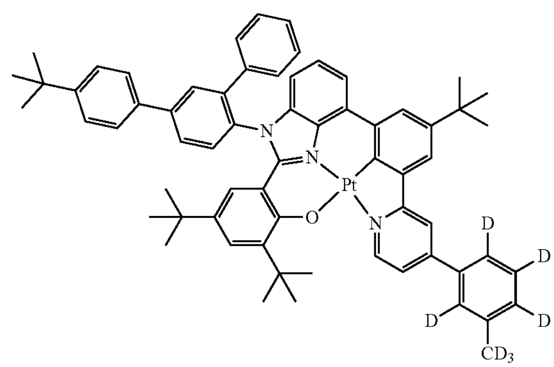

-continued
393
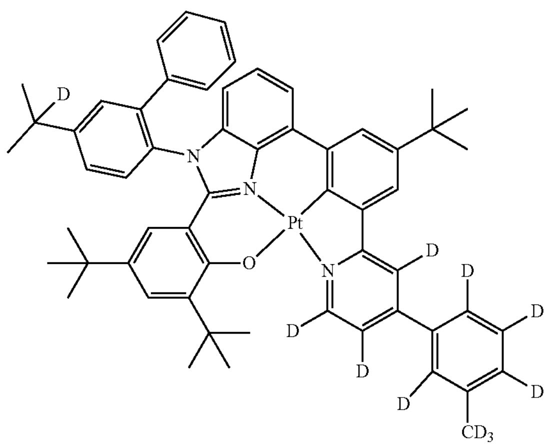
394
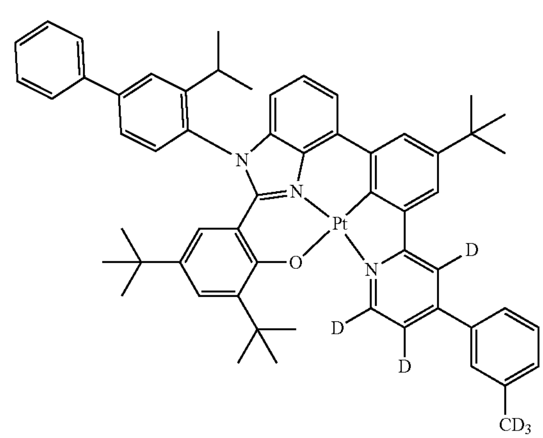
395
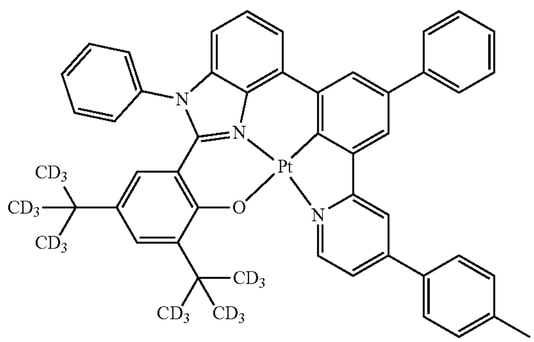
396
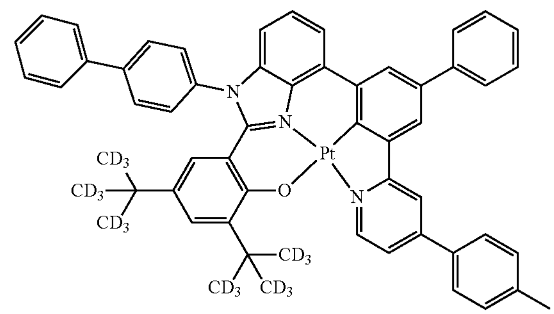
397
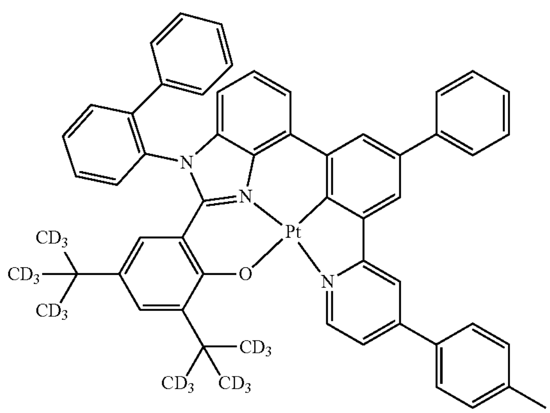
398
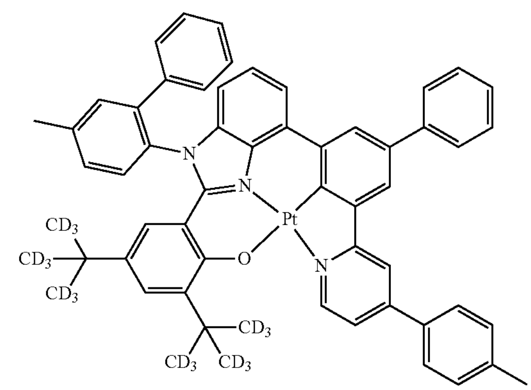
399
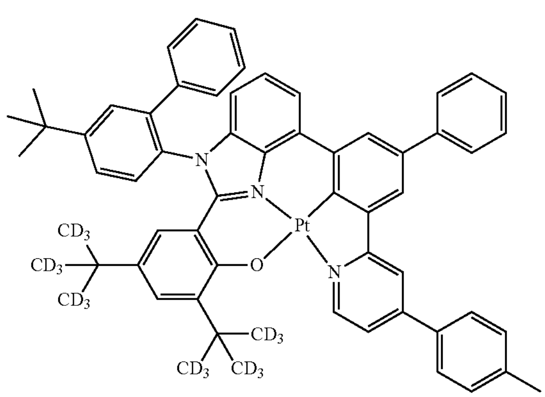
400
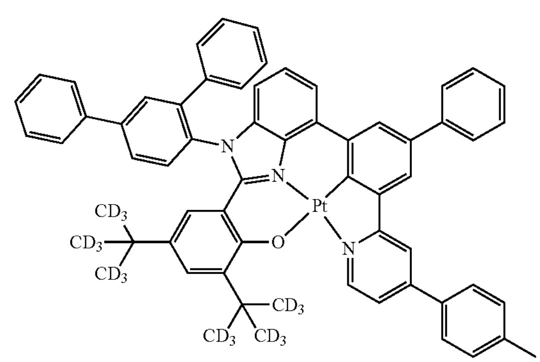

-continued
401
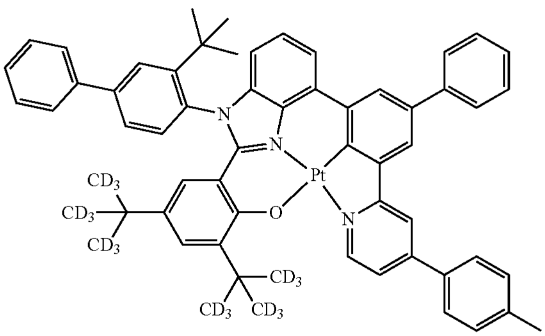
402
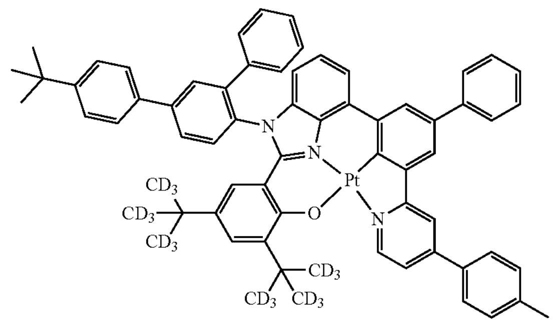
403
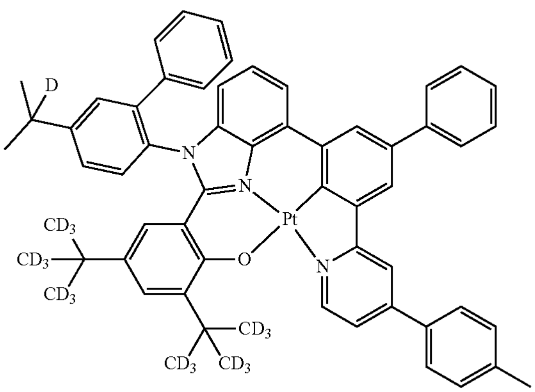
404
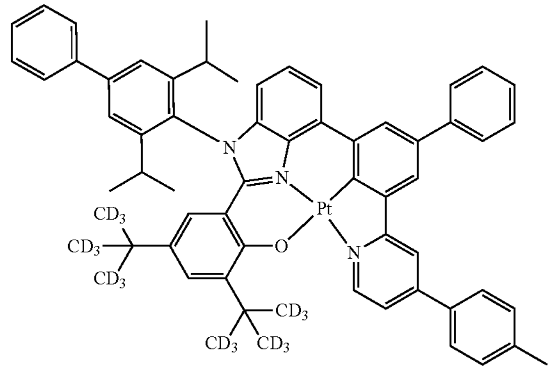
405
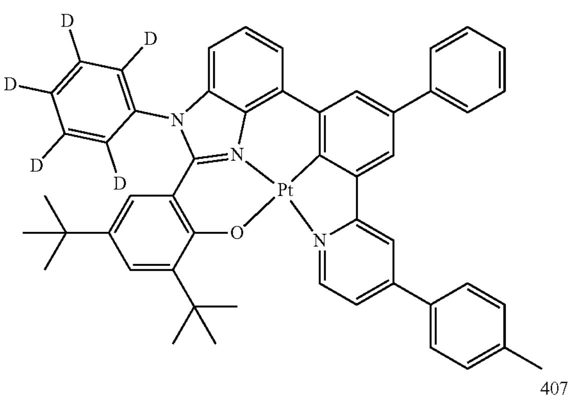
406
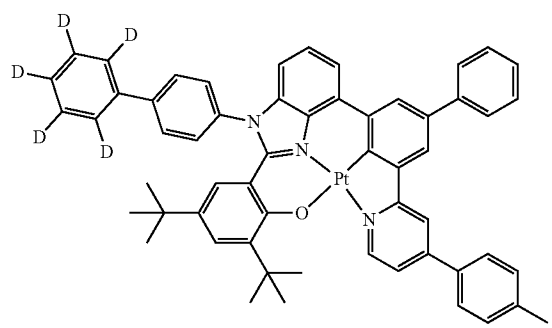
407
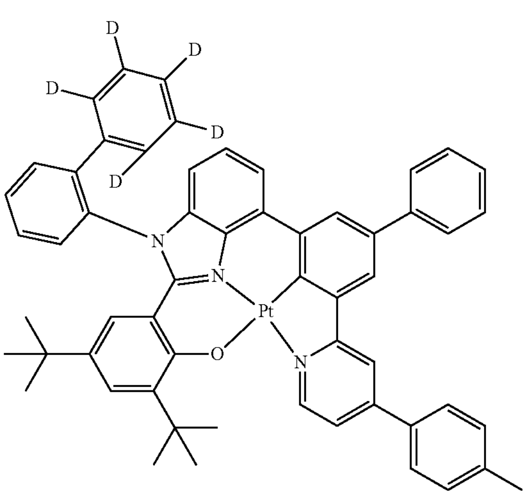
408
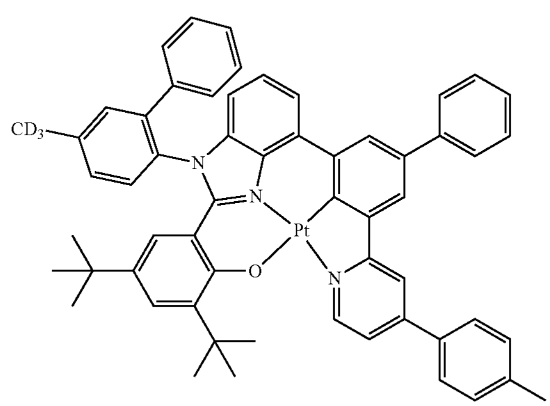

-continued
409
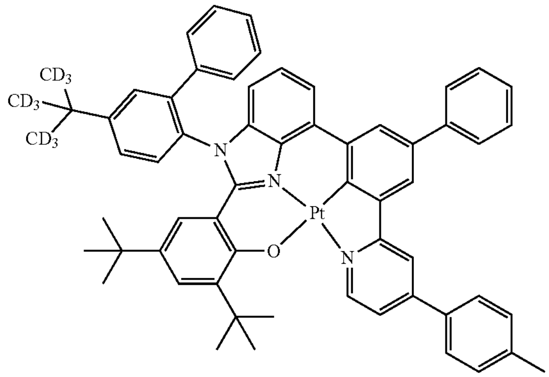
410
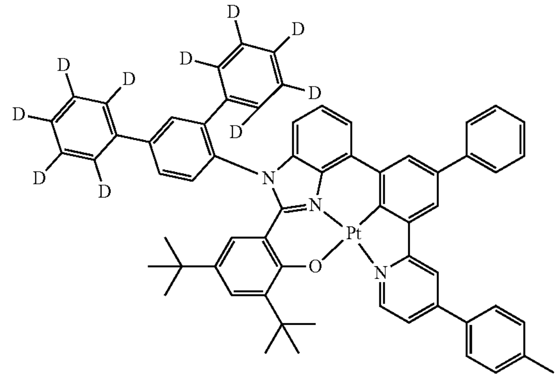
411
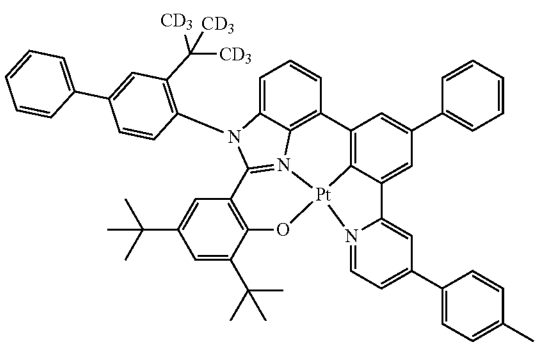
412
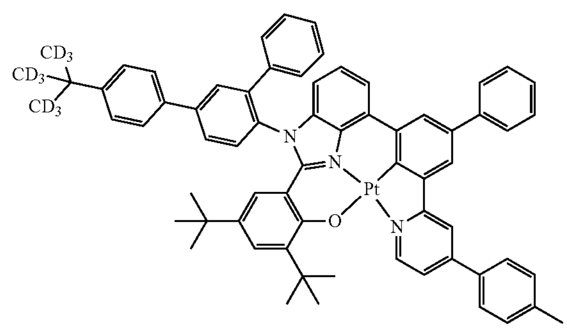
413
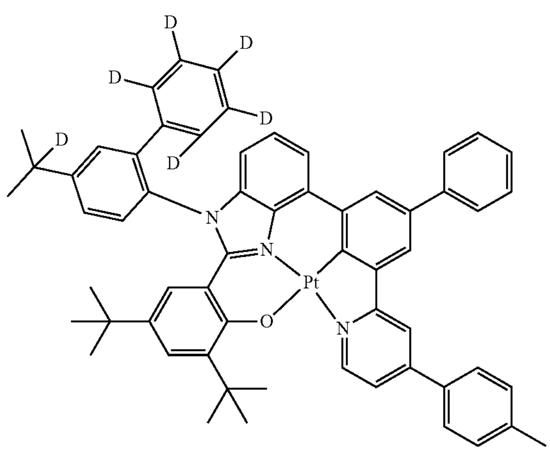
414
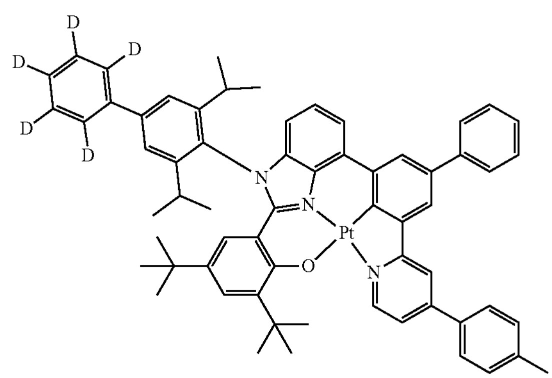
415
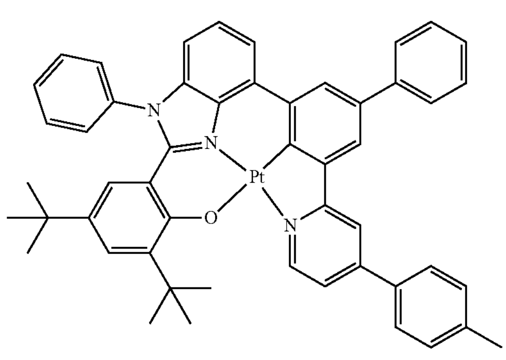
416
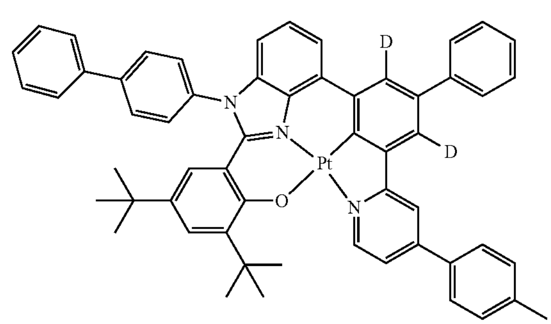

-continued
417
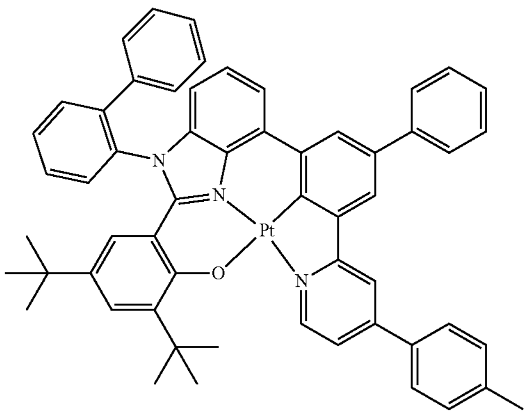
418
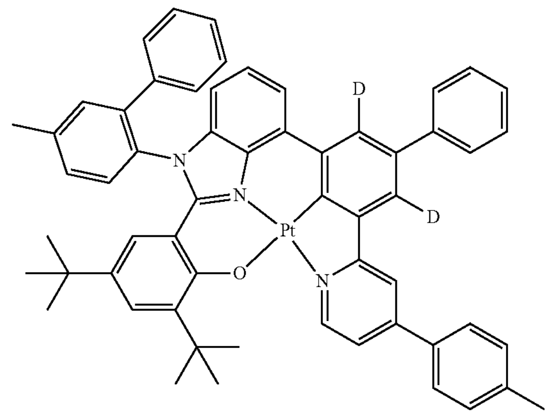
419
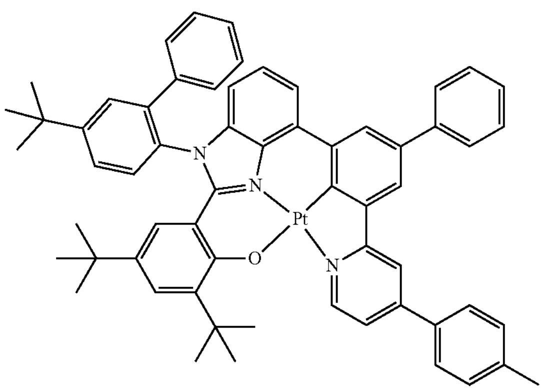
420
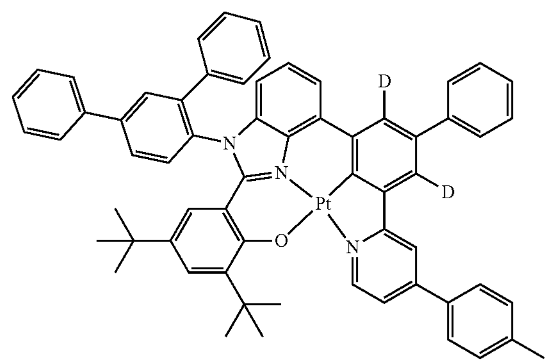
421
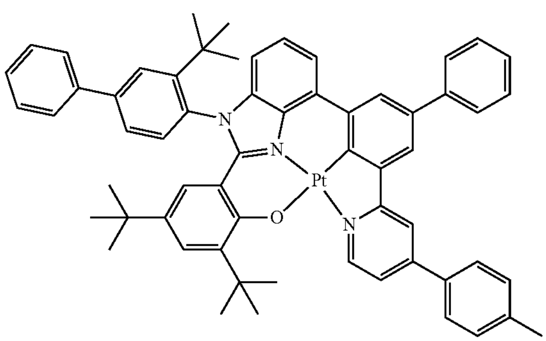
422
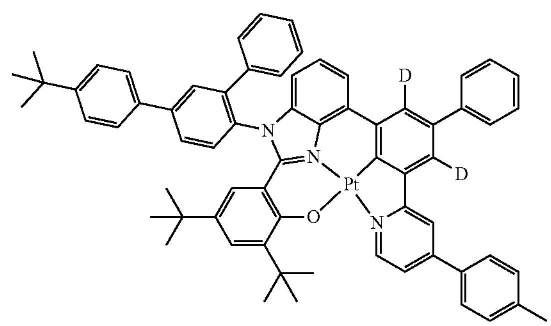
423
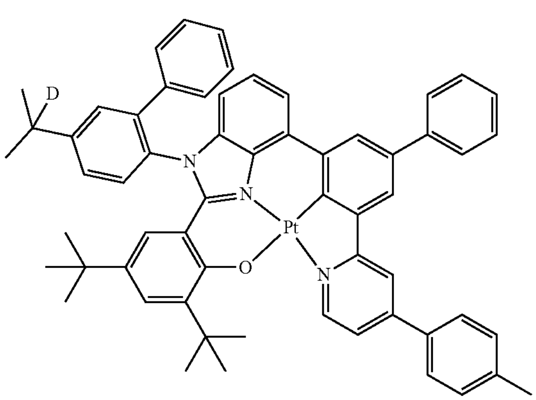
424
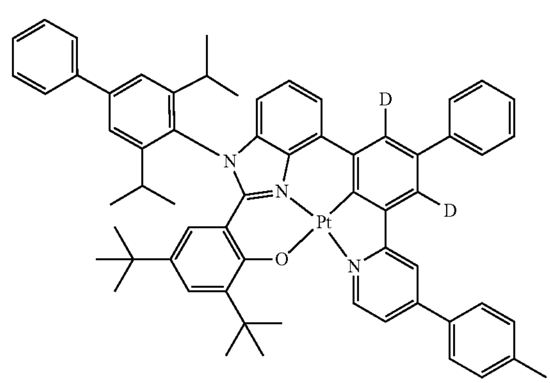

-continued
425
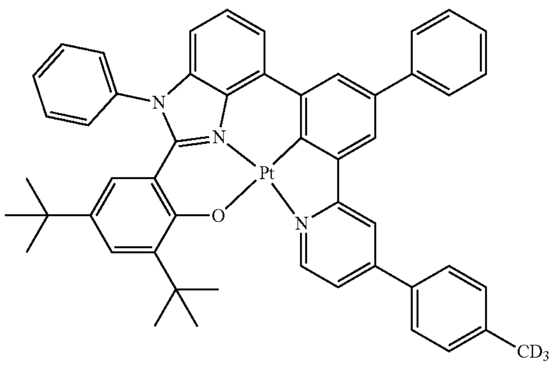
426
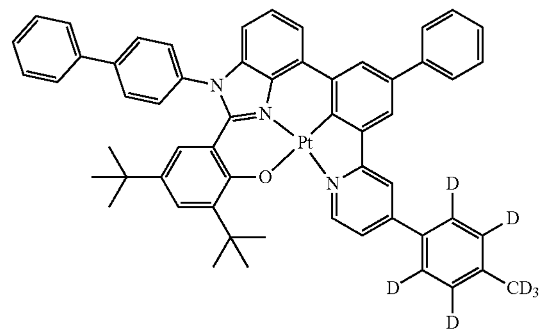
427
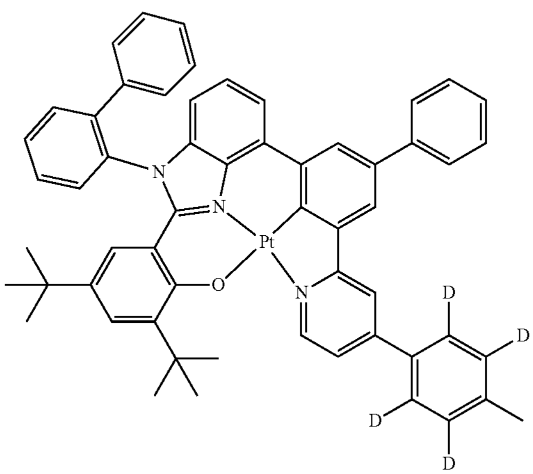
428
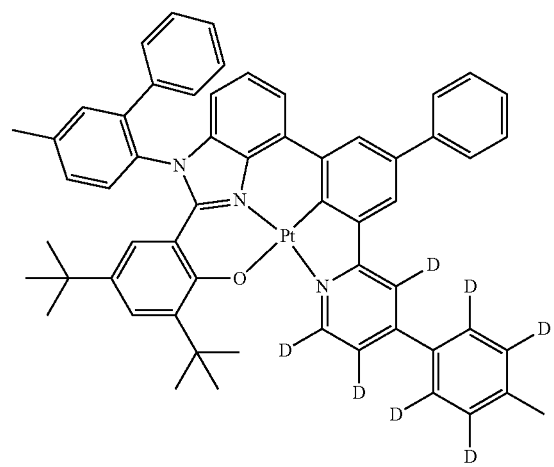
429
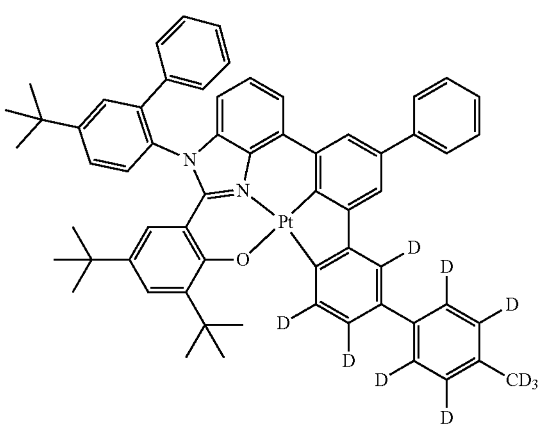
430
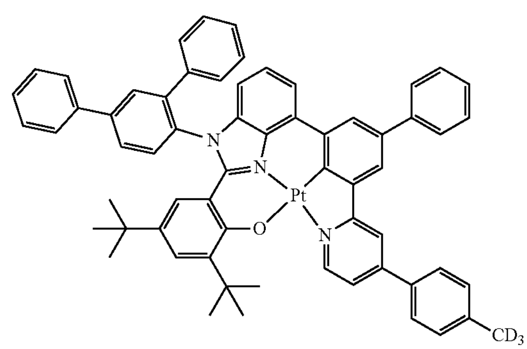

-continued
431
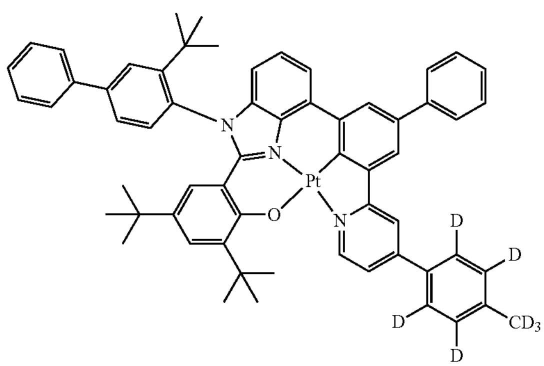
432
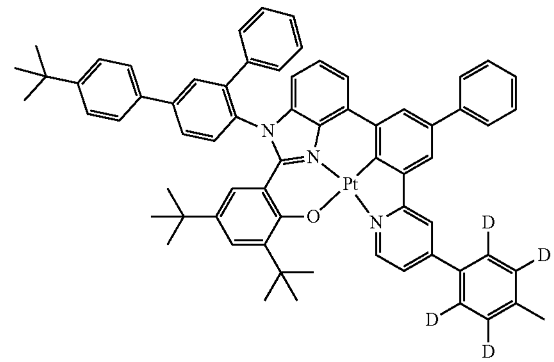
433
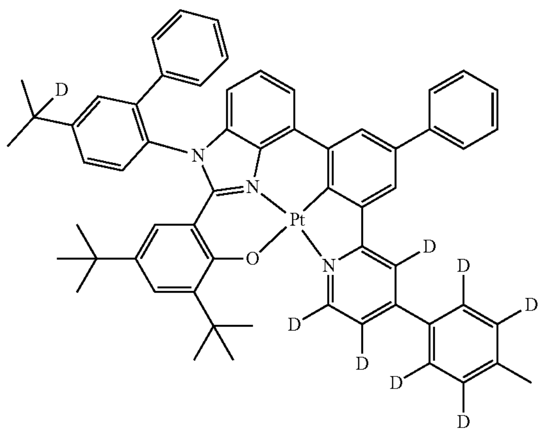
434
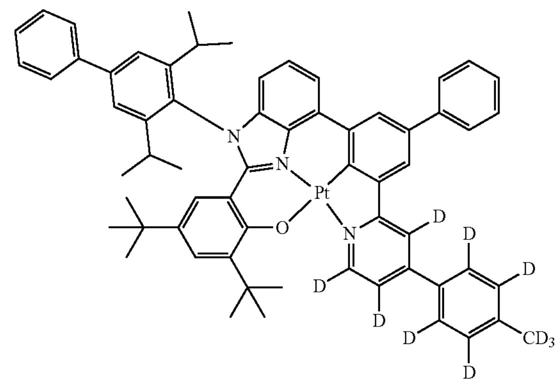
435
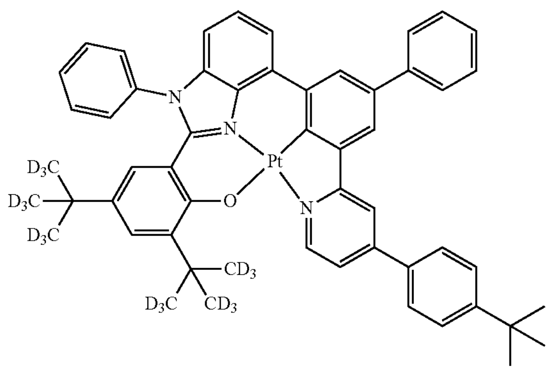
436
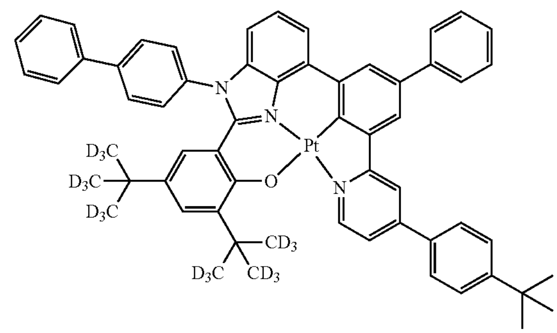
437
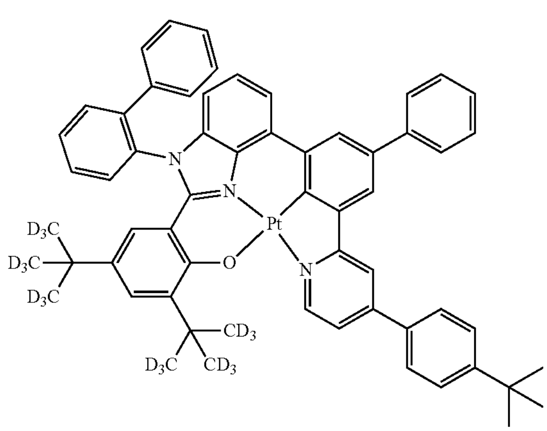
438
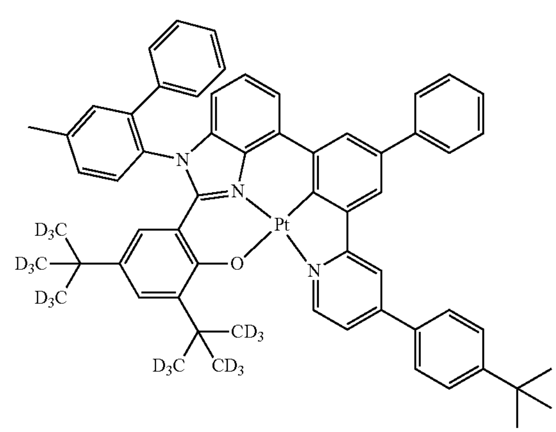

-continued
439
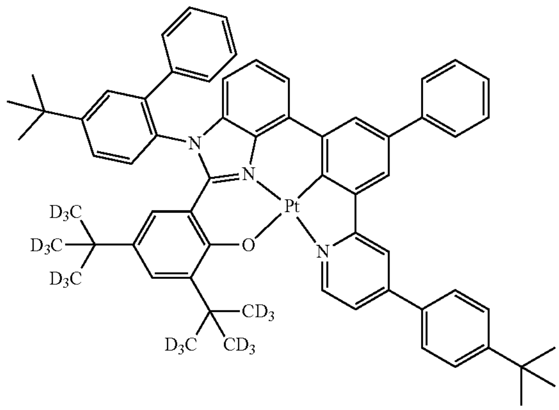
440
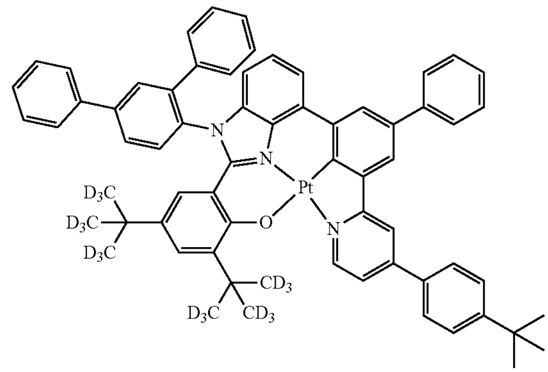
441
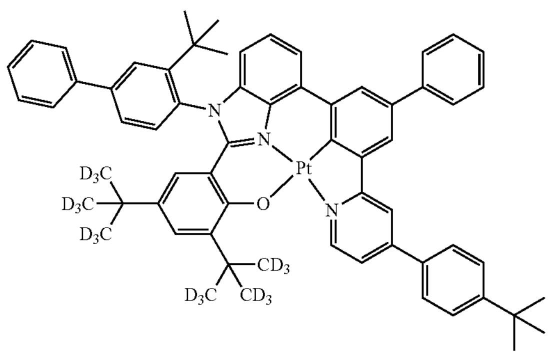
442
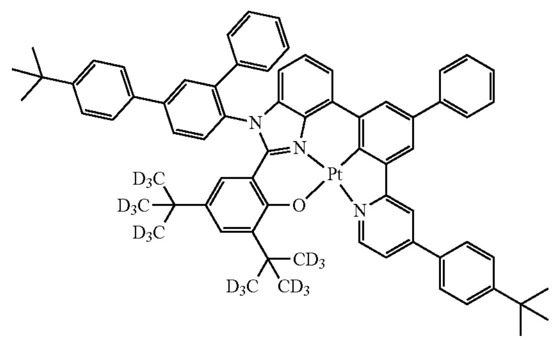
443
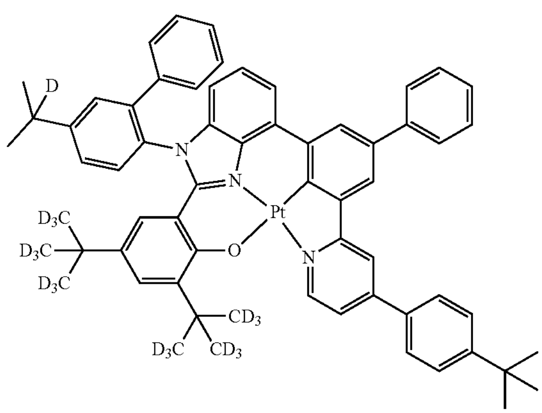
444
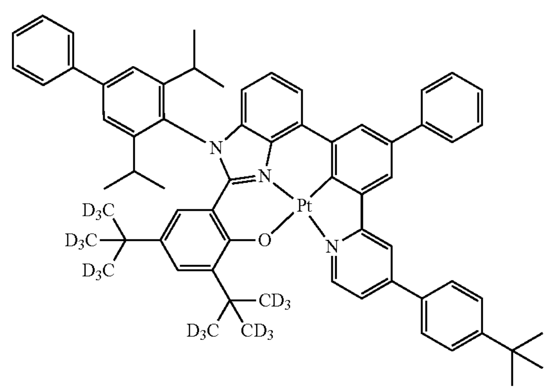
445
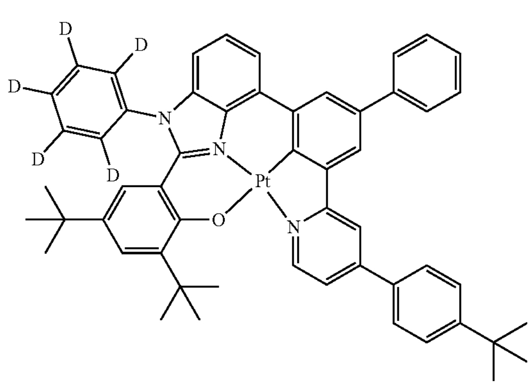
446
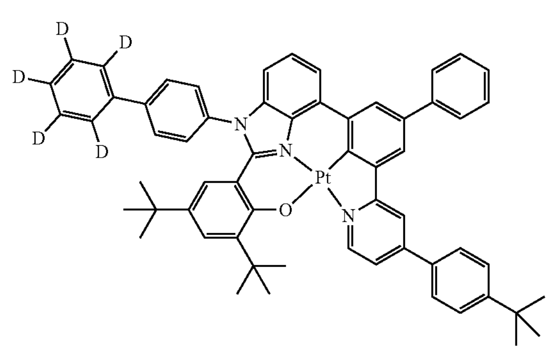

-continued
447
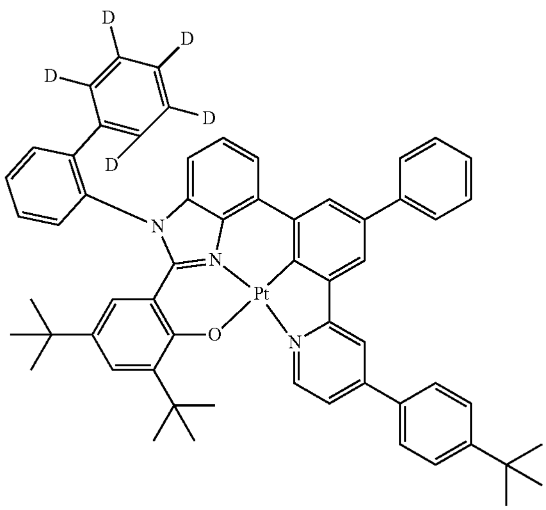
448
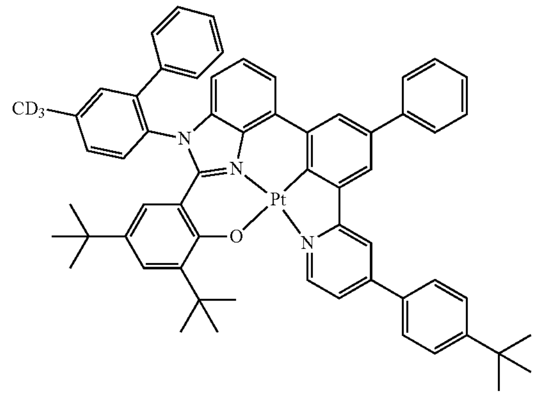
449
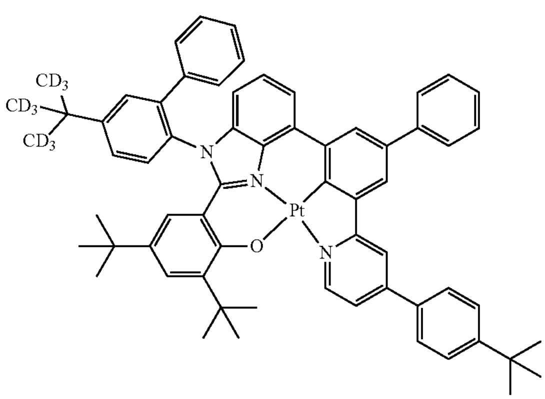
450
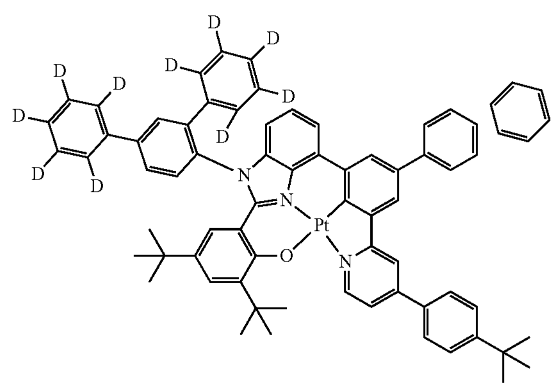
451
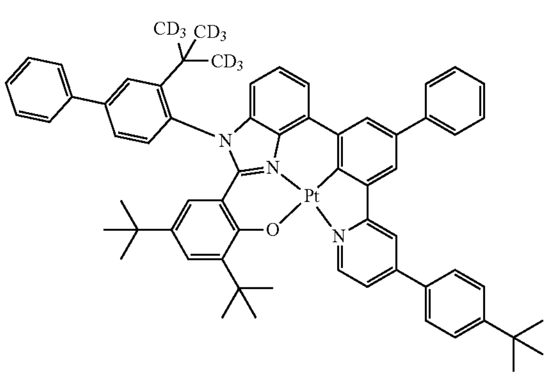
452
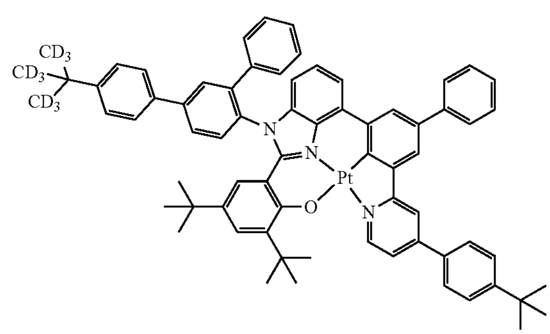

-continued
453
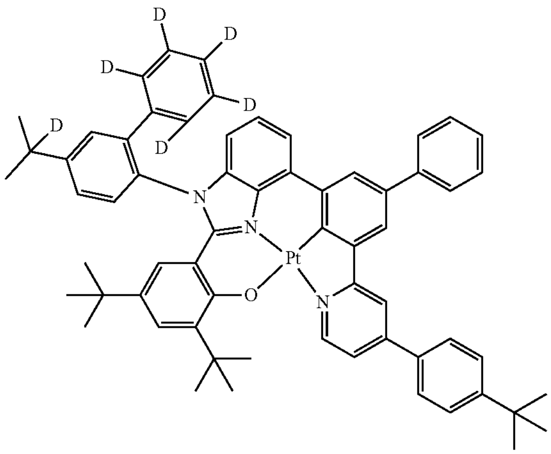
454
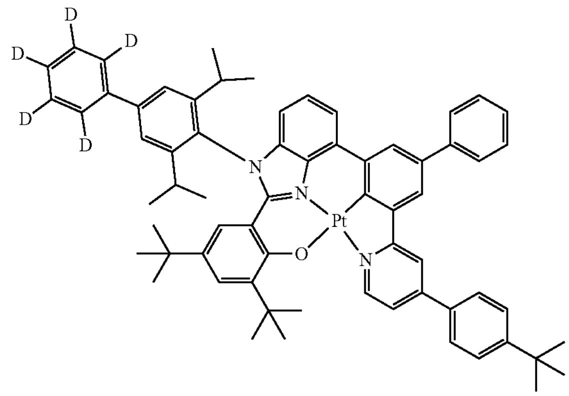
455
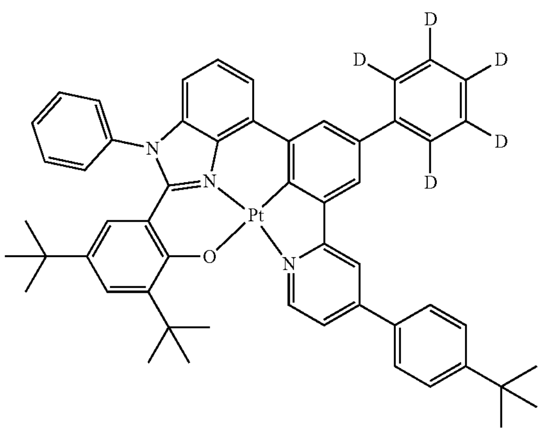
456
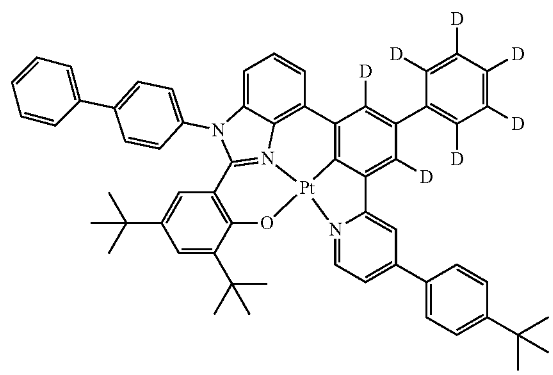
457
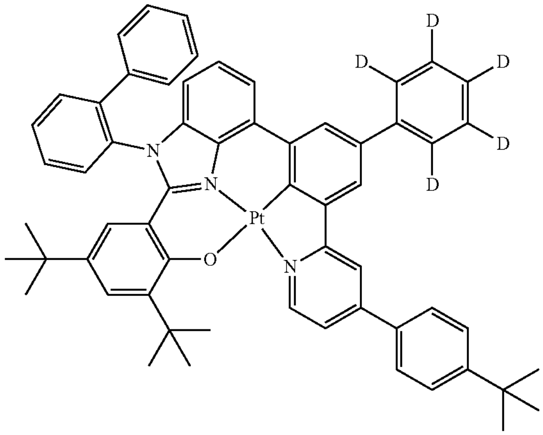
458
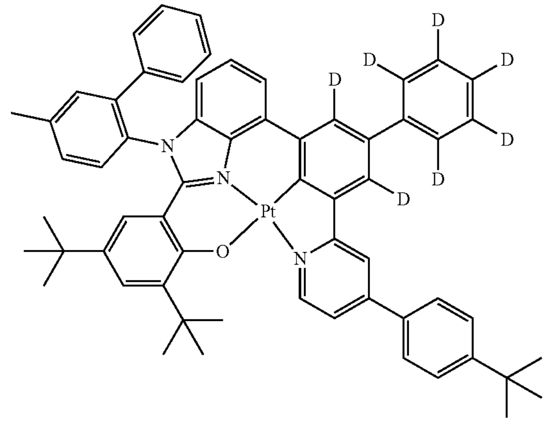

-continued
459
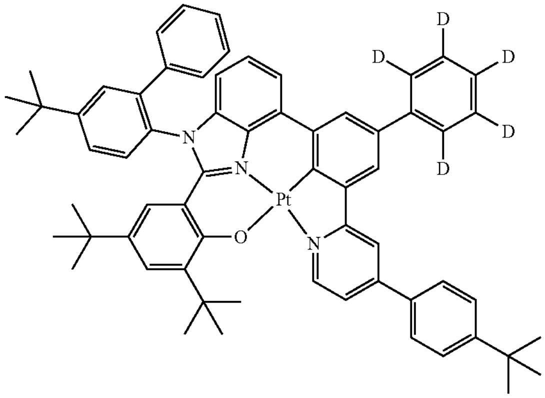
460
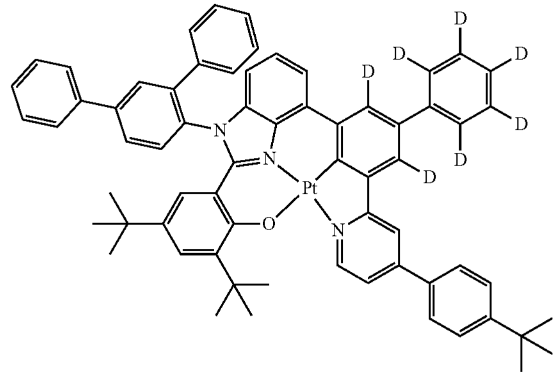
461
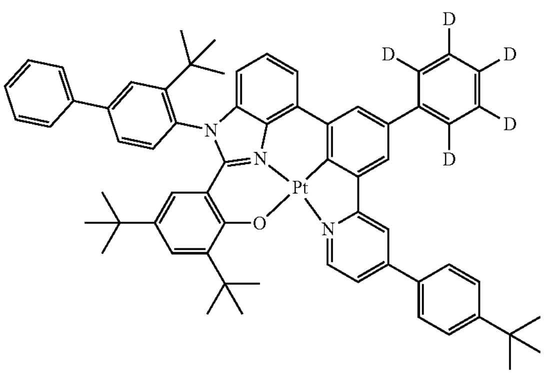
462
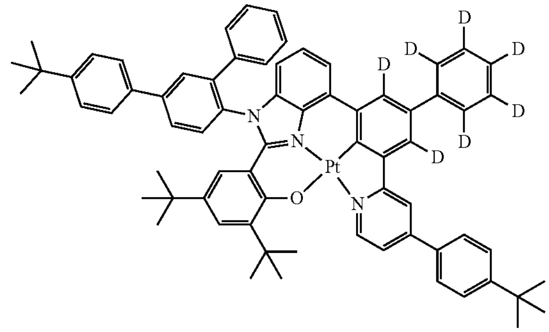
463
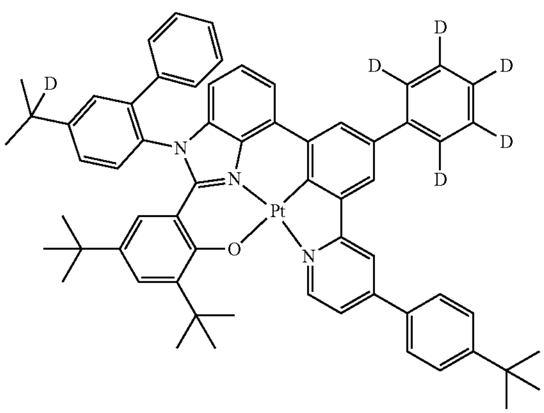
464
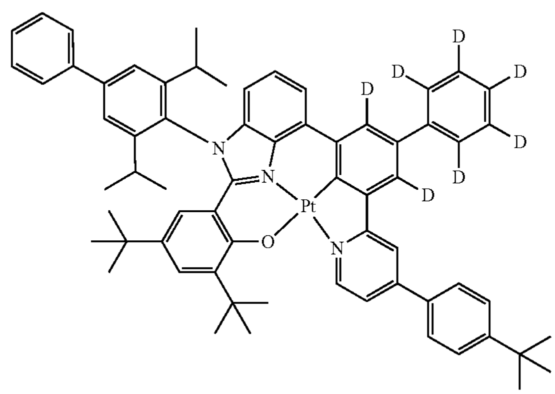
465
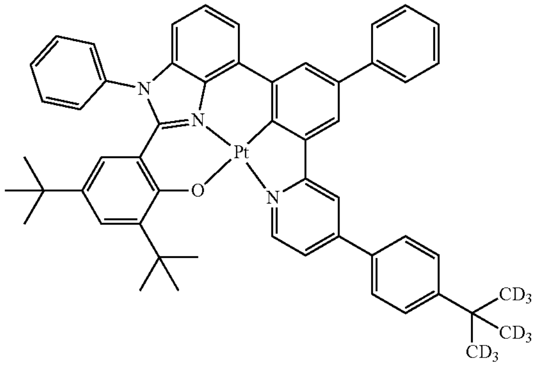
466
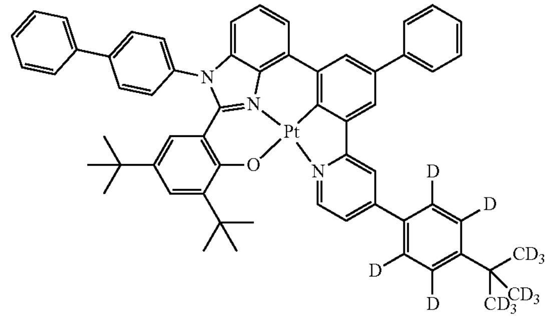

-continued
467
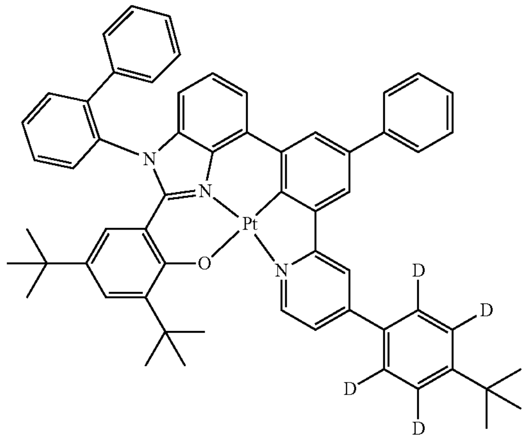
468
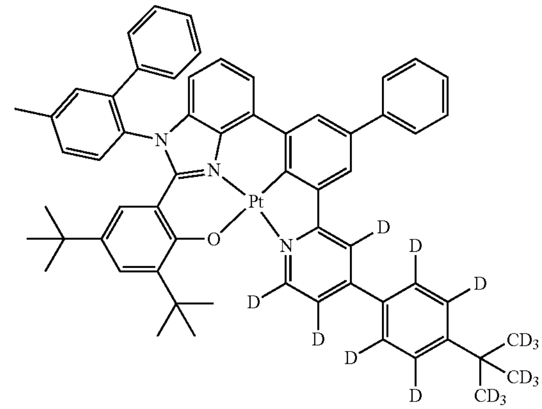
469
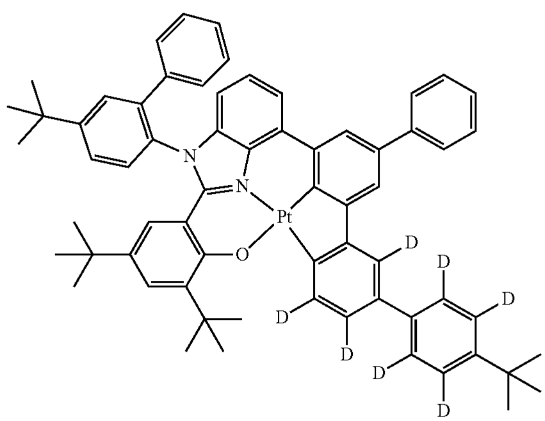
470
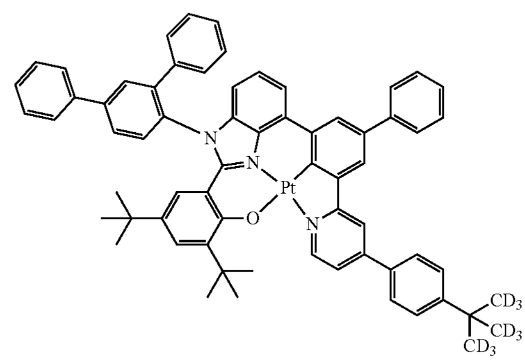
471
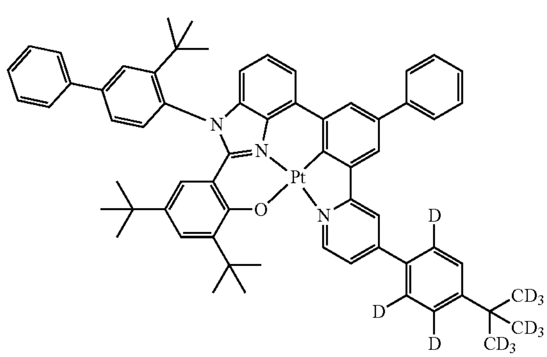
472
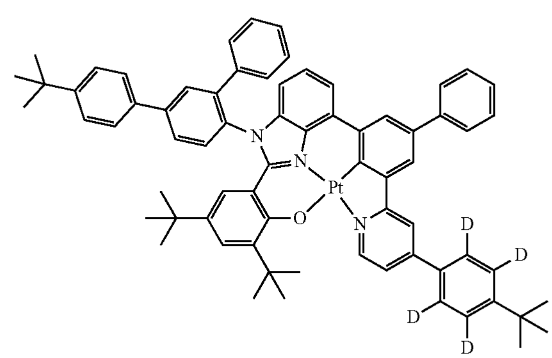

-continued
473
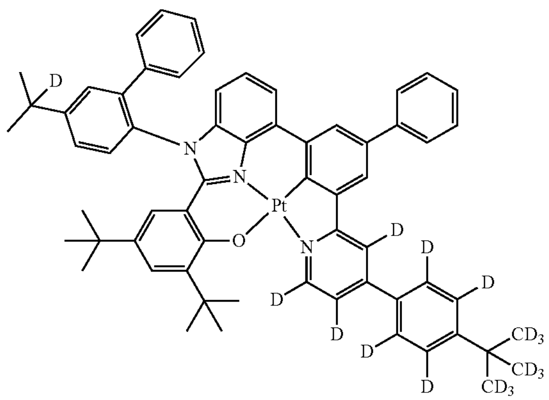
474
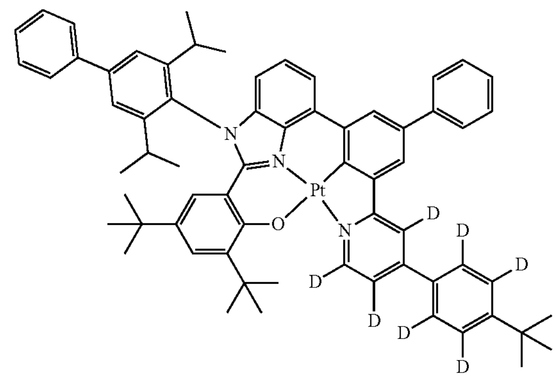
475
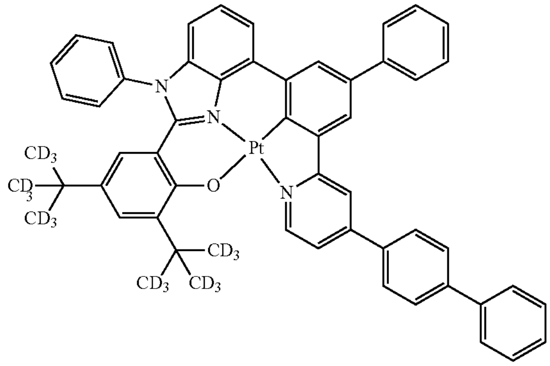
476
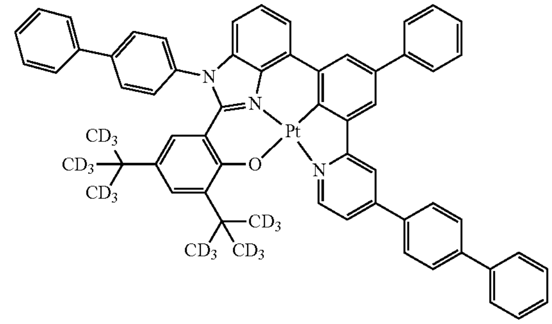
477
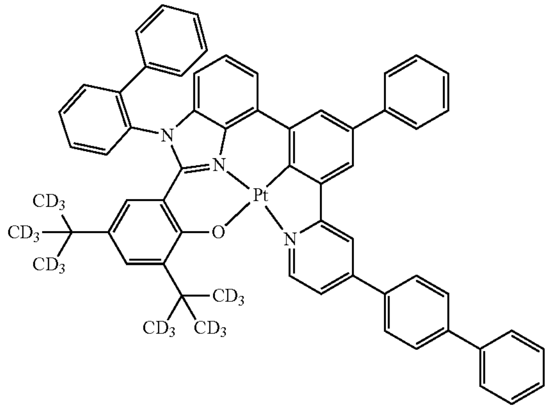
478
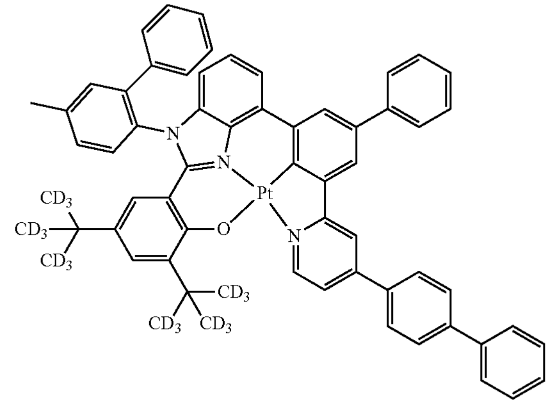
479
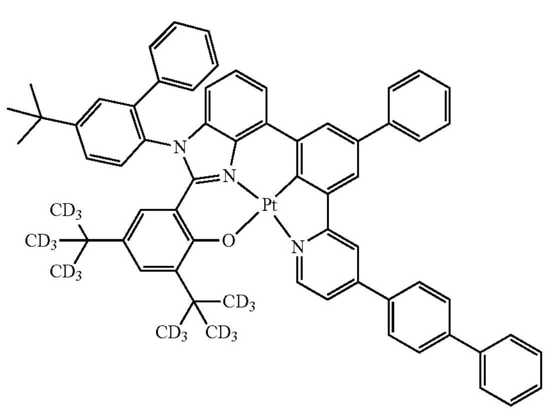
480
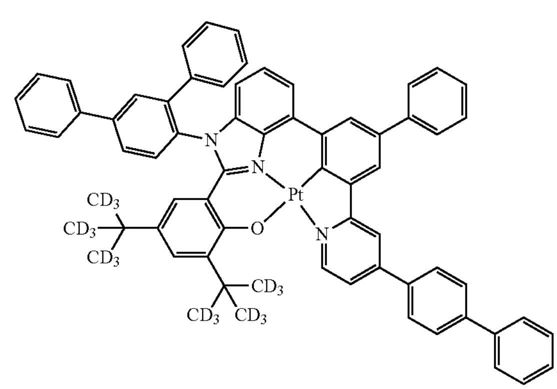

-continued
481
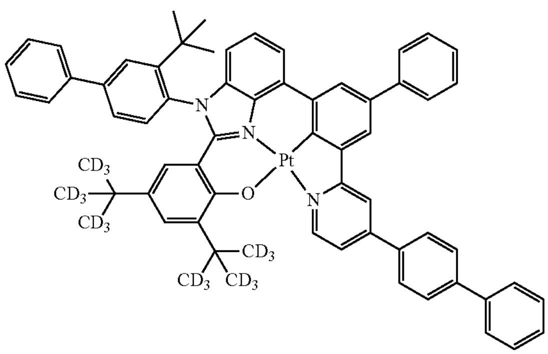
482
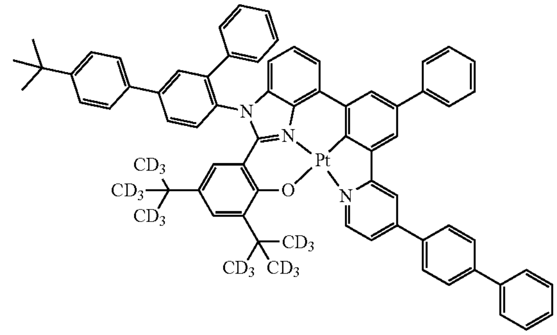
483
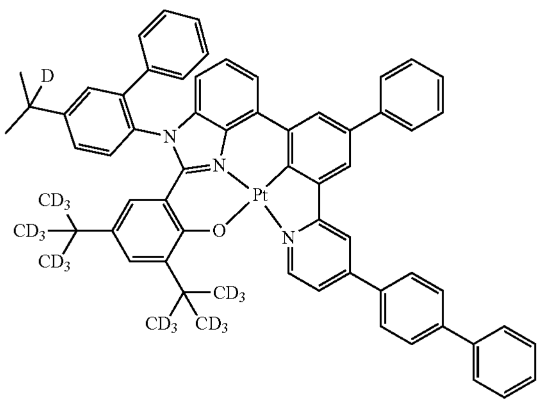
484
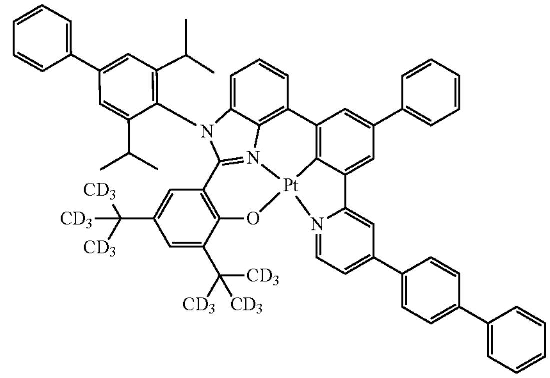
485
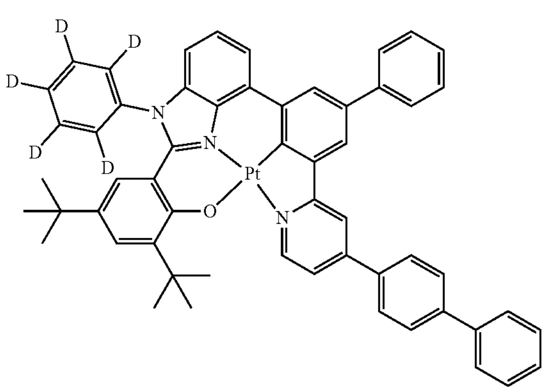
486
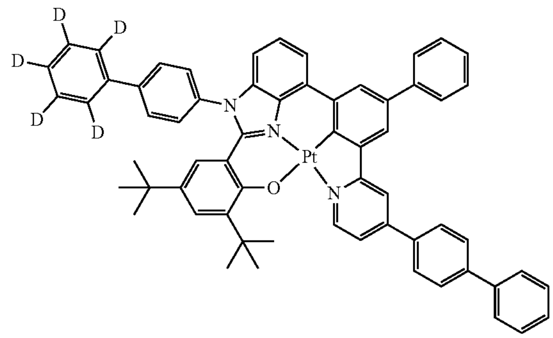

-continued
487
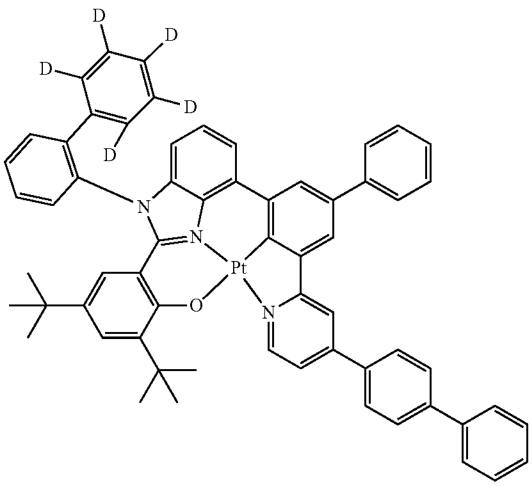
488
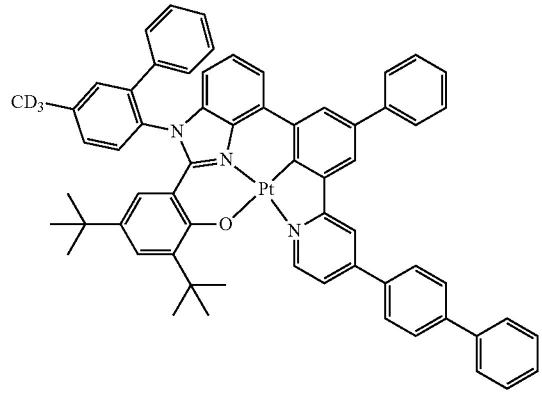
489
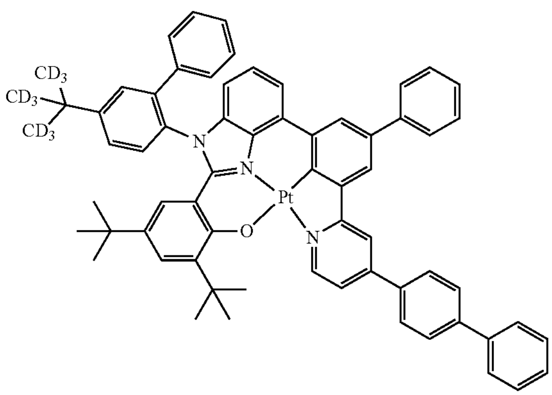
490
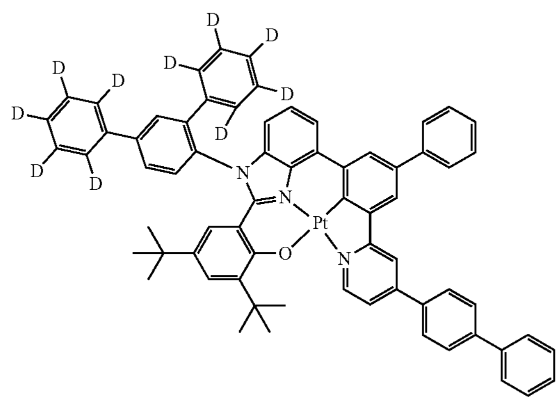
491
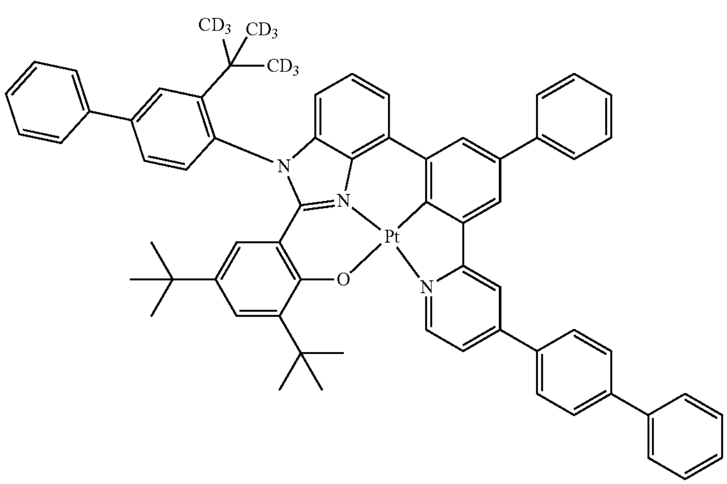

-continued
492
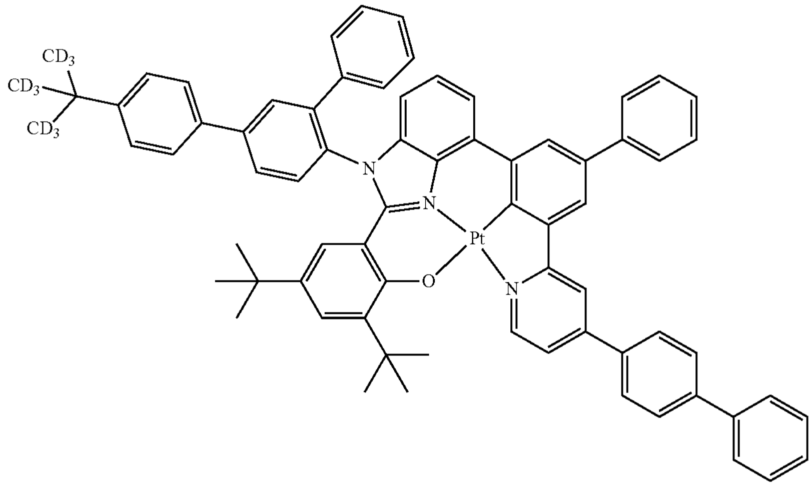
493
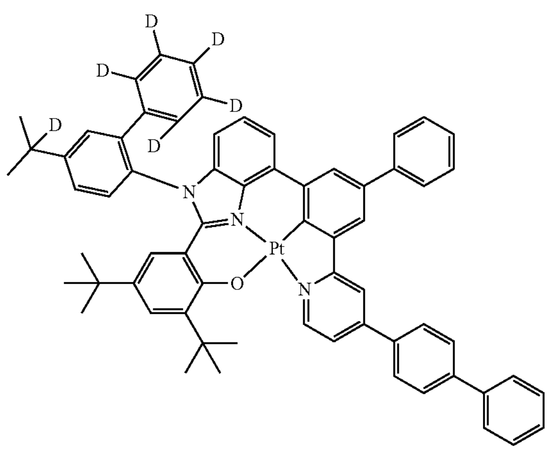
494
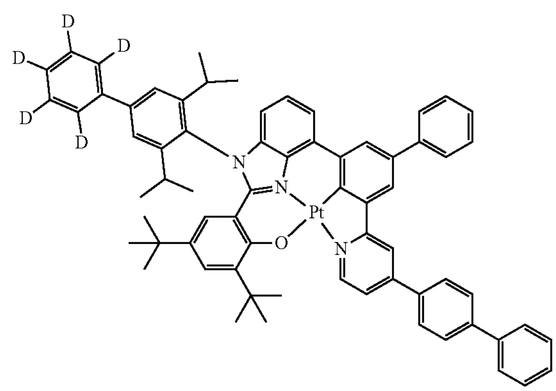
495
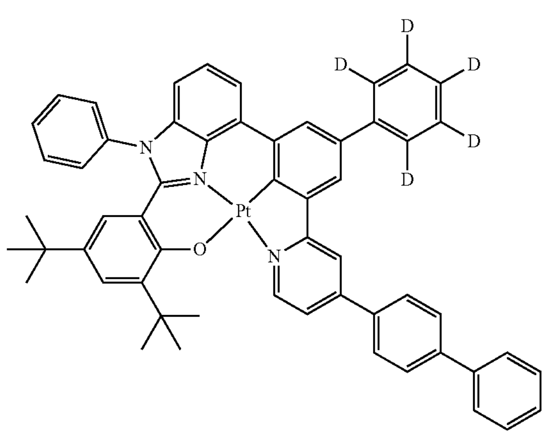
496
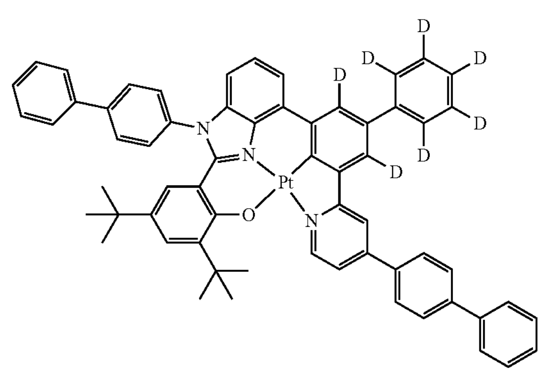

-continued
497
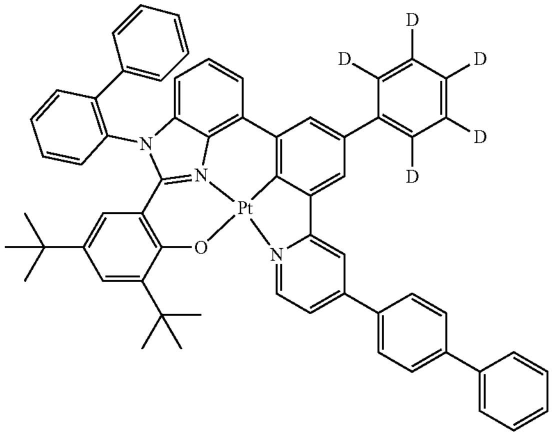
498
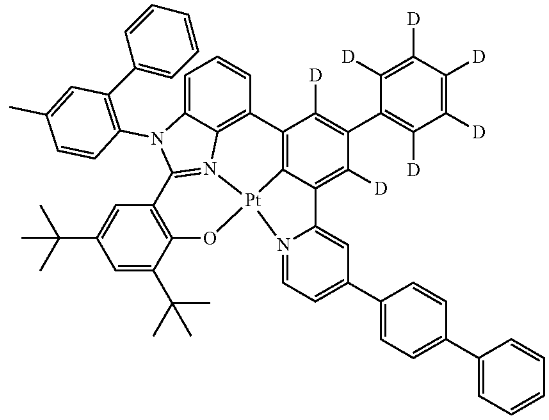
499
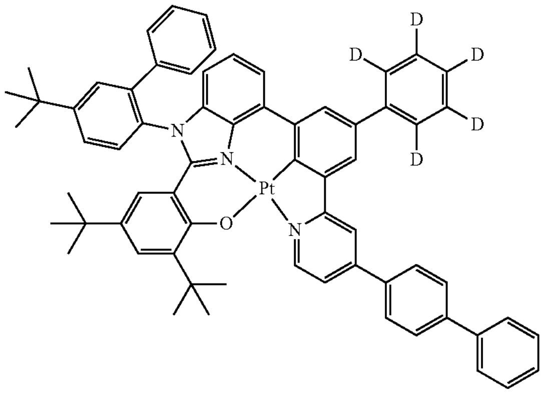
500
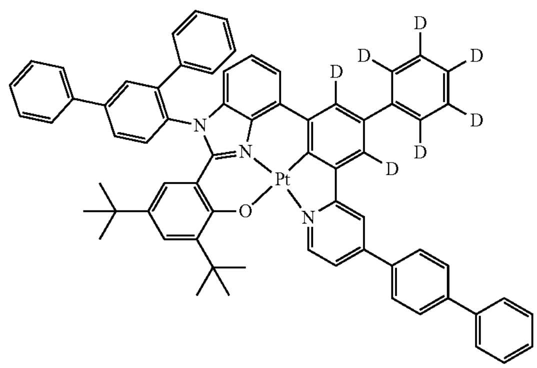
501
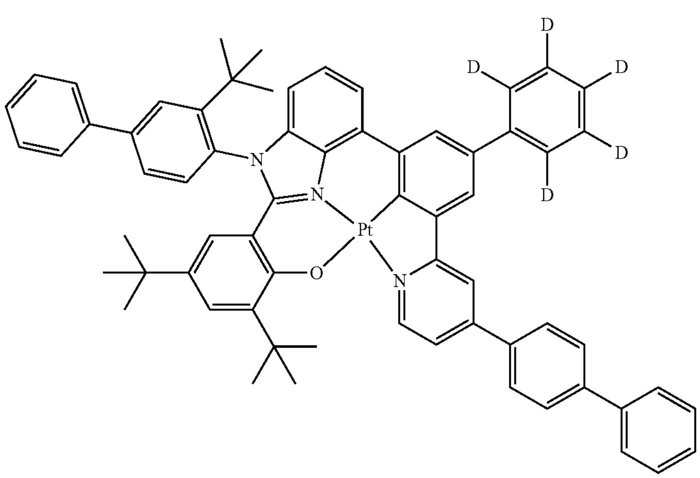

-continued
502
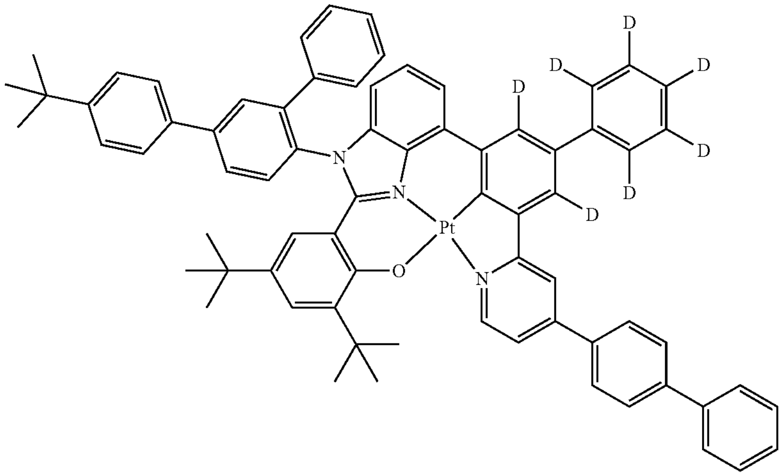
503
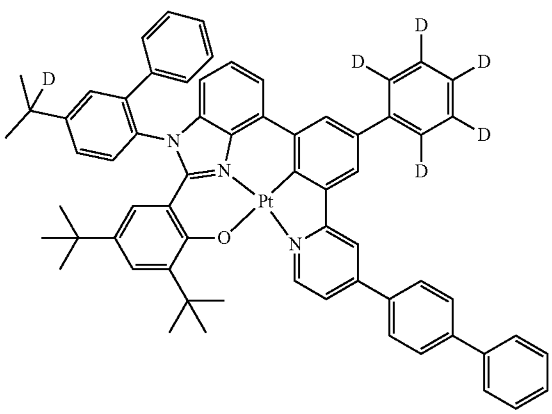
504
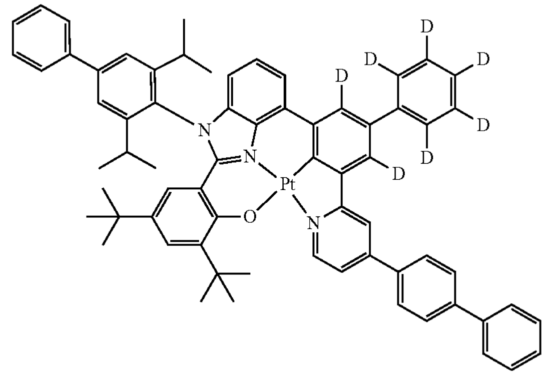
505
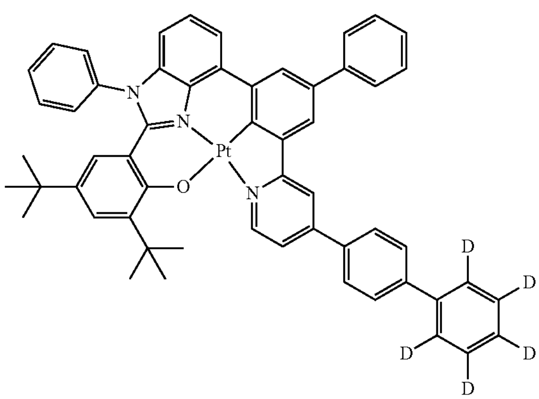
506
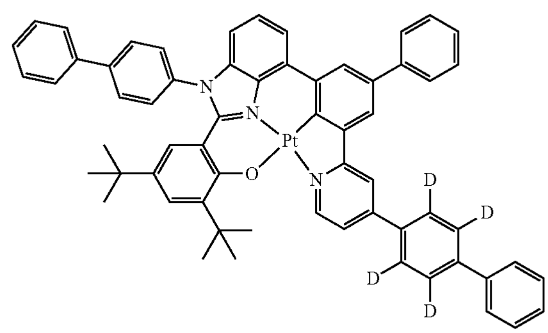

-continued
507
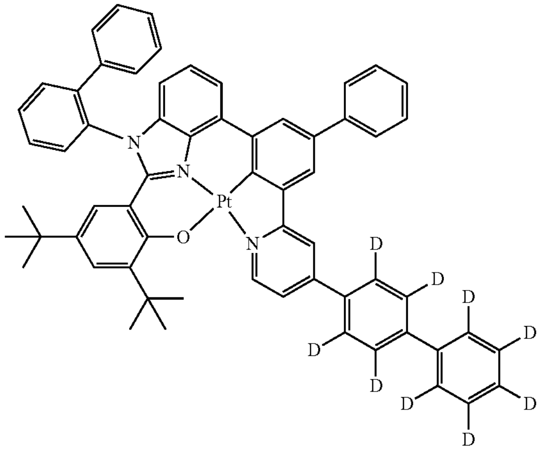
508
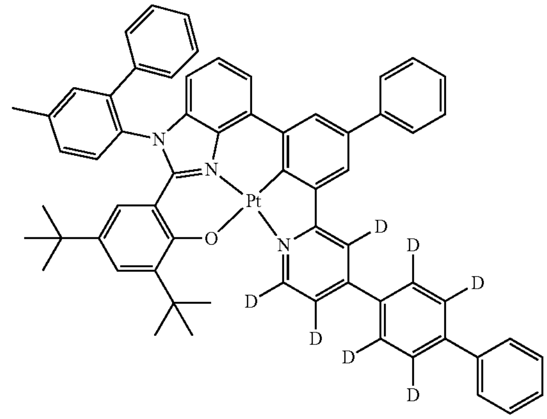
509
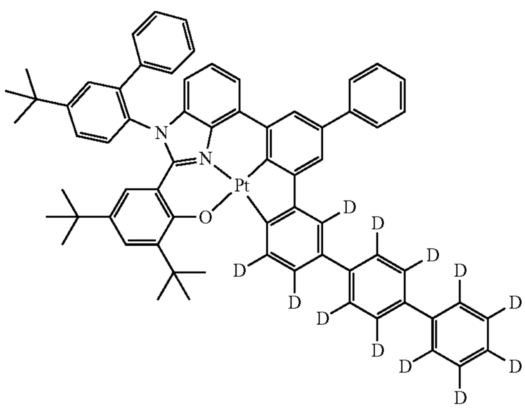
510
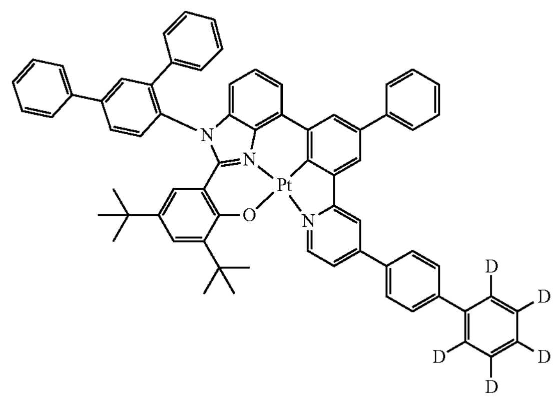
511
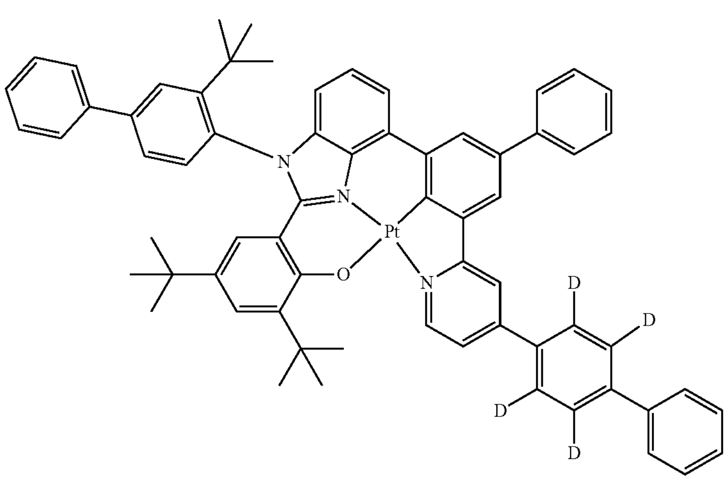

-continued
512
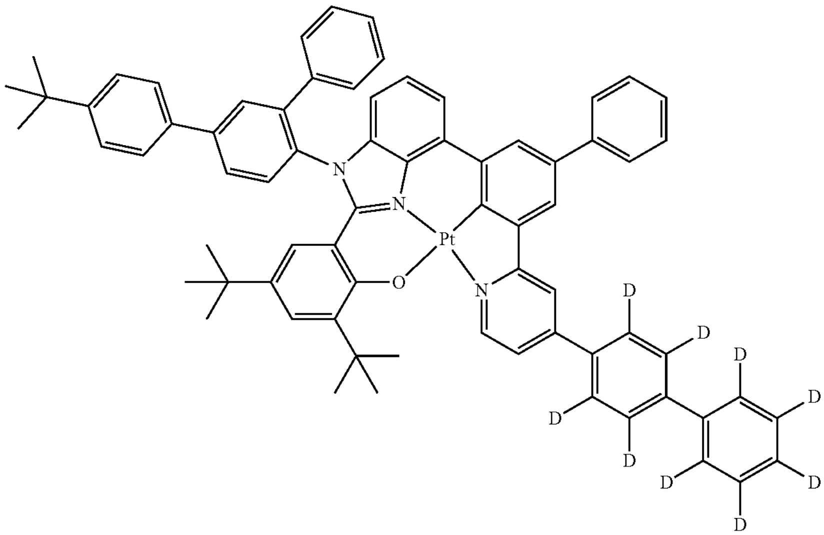
513
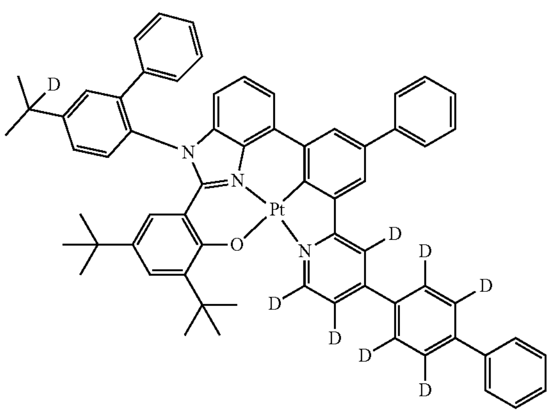
514
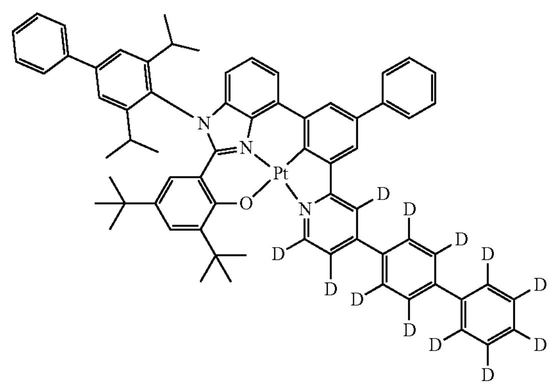
515
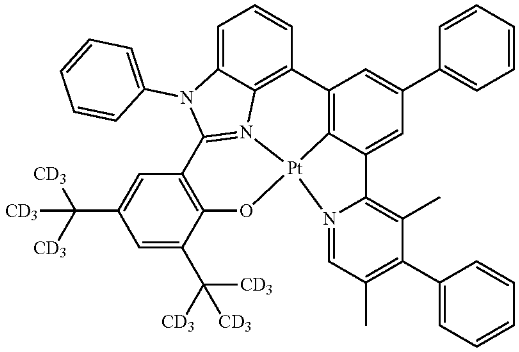
516
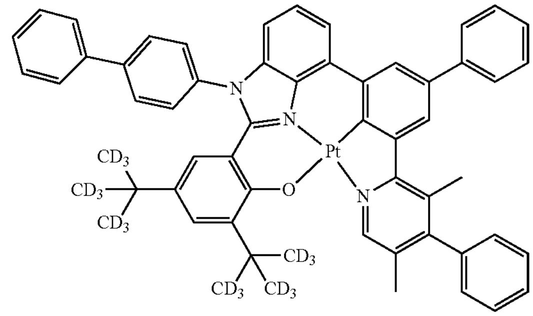

-continued
517
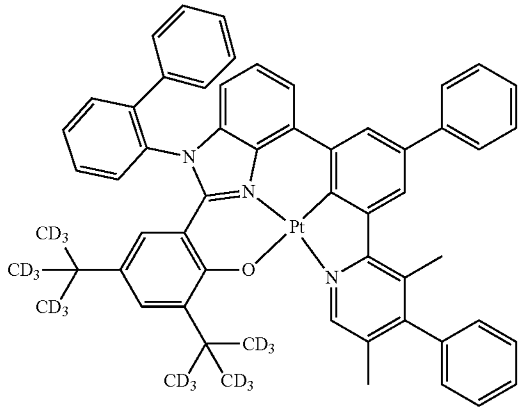
518
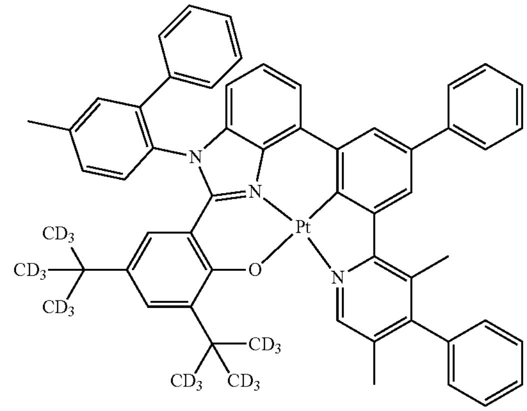
519
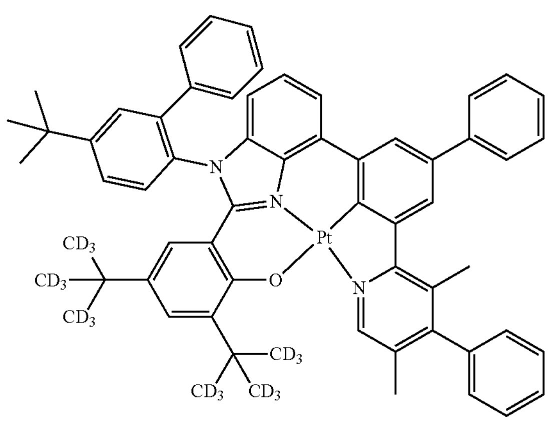
520
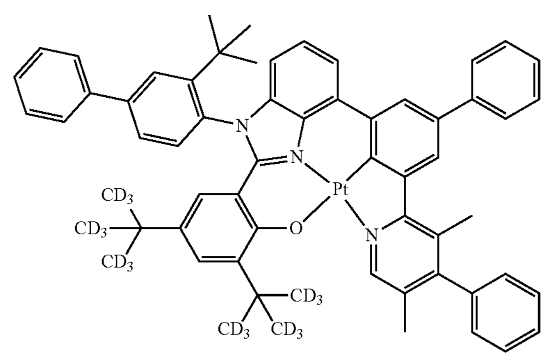
521
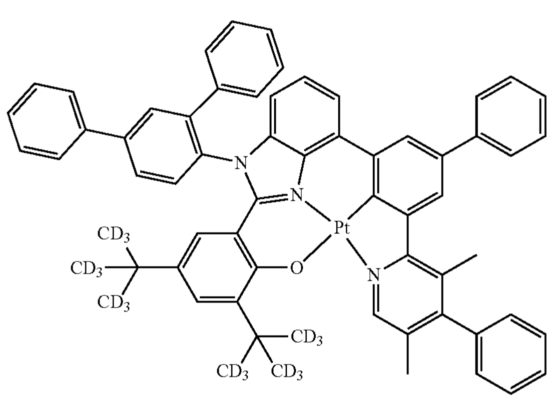
522
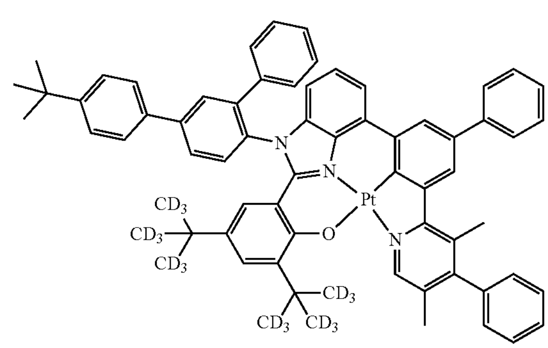

-continued
523
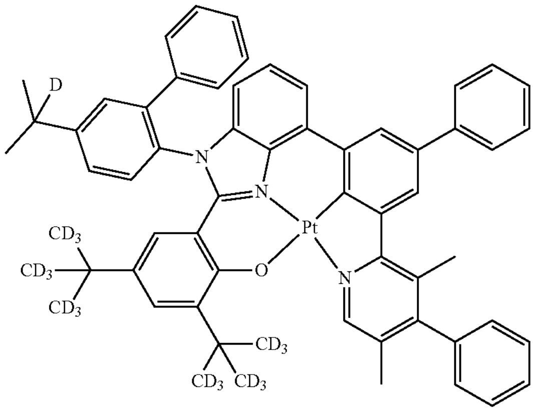
524
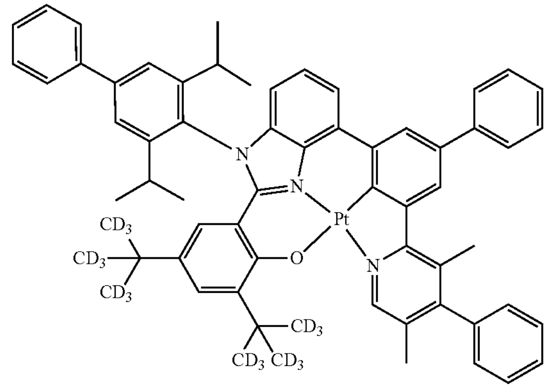
525
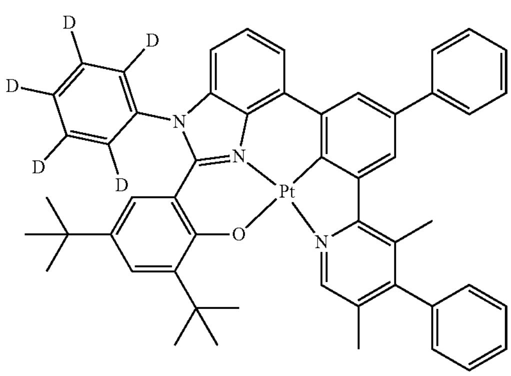
526
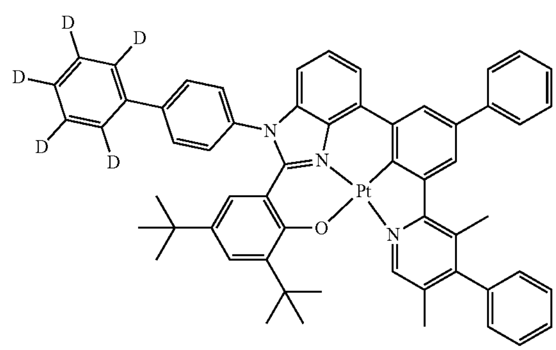
527
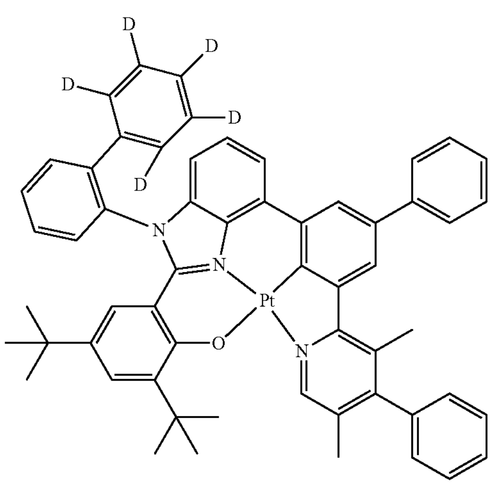
528
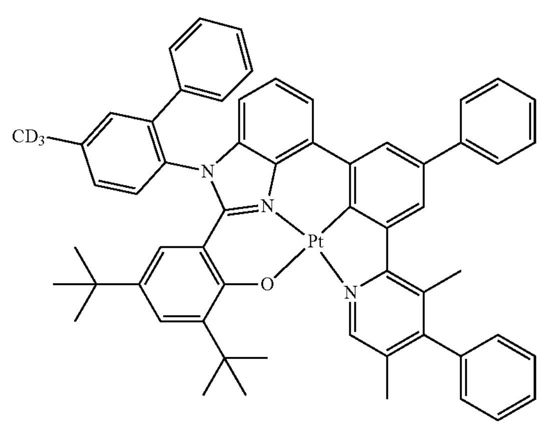

-continued
529
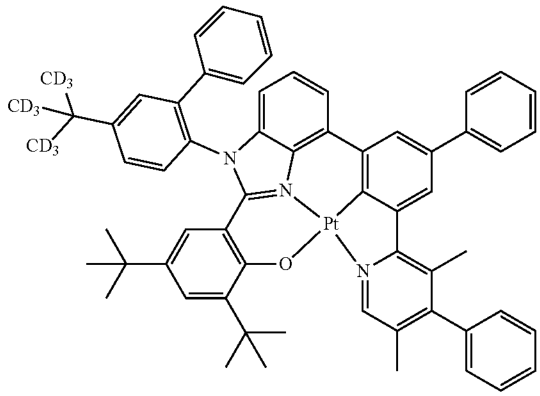
530
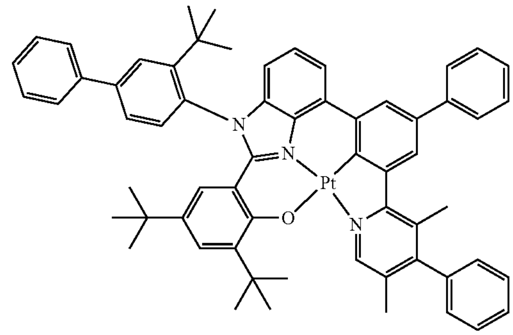
531
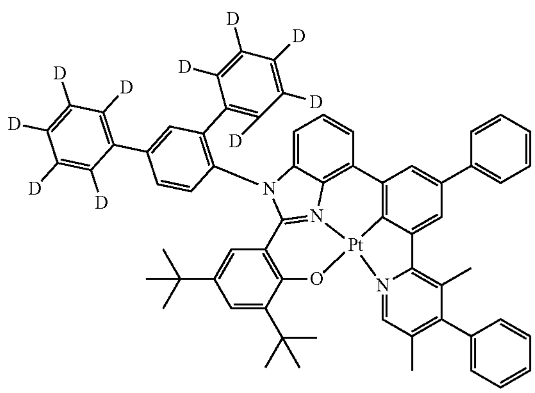
532
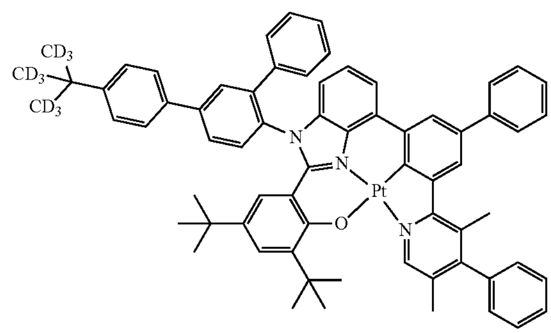
533
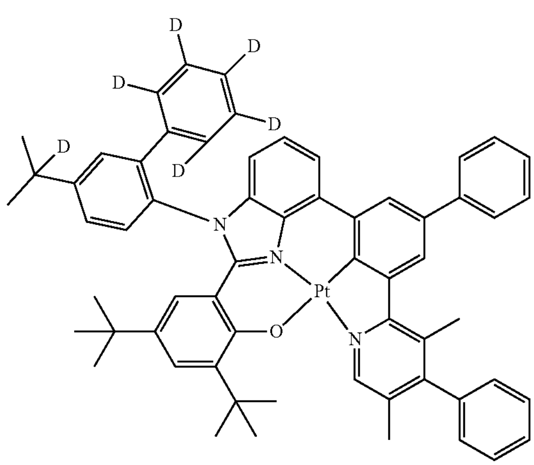
534
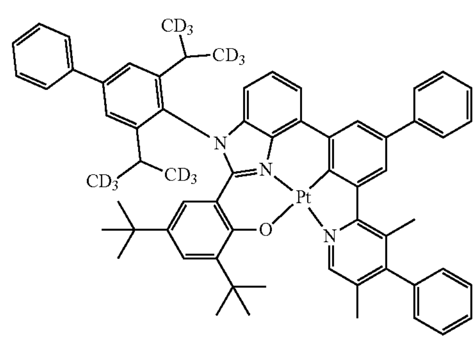

-continued
535
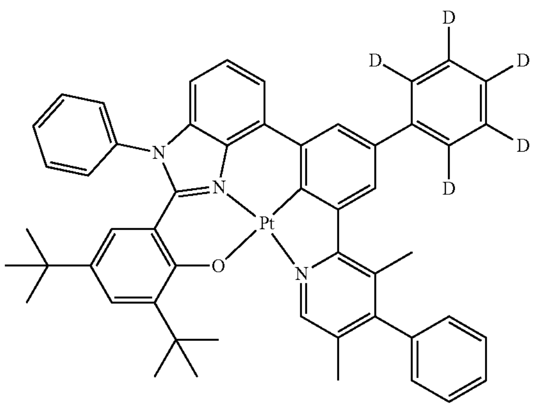
536
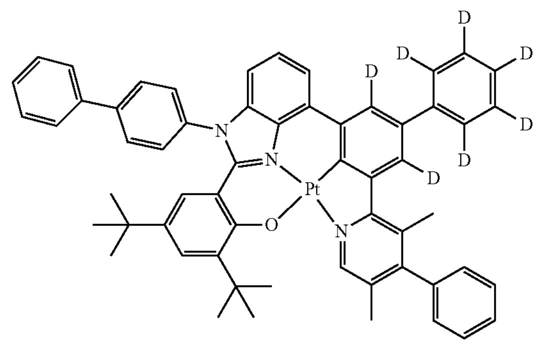
537
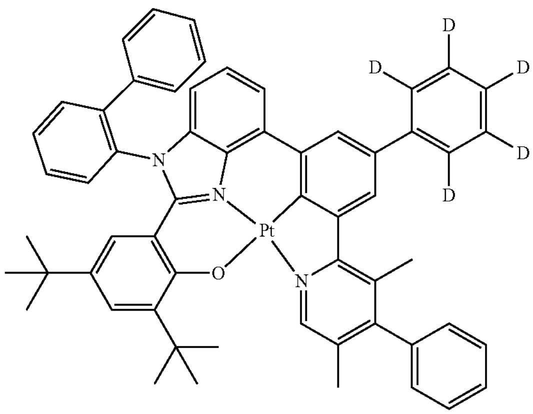
538
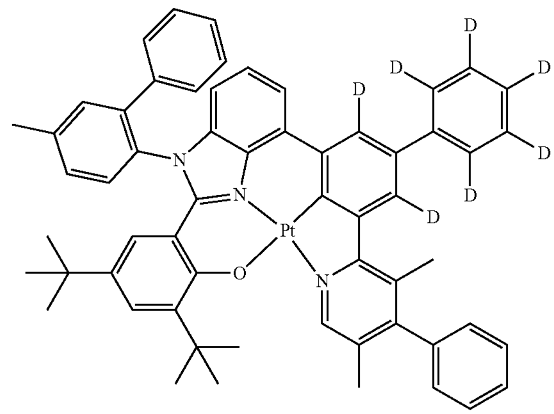
539
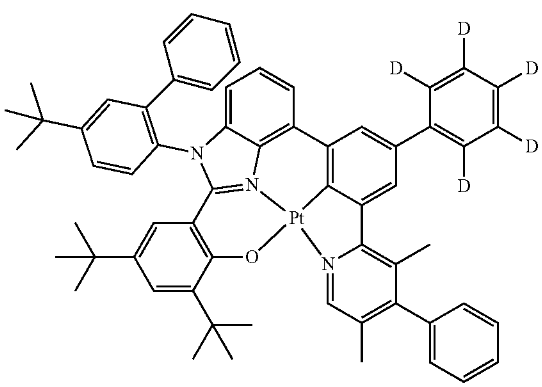
540
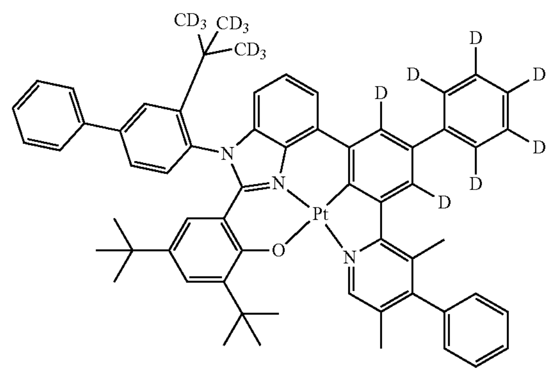
541
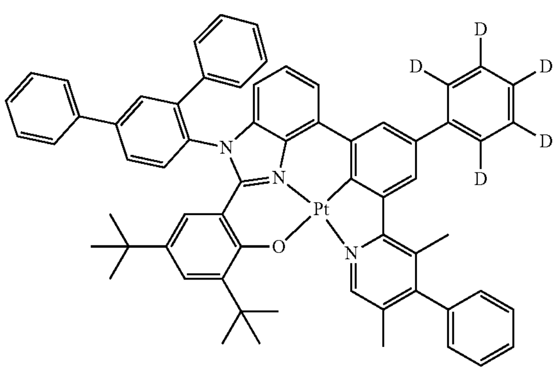
542
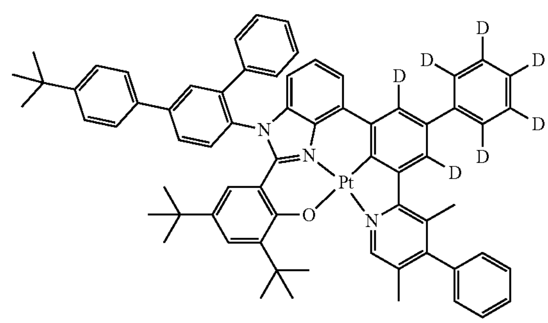

-continued
543
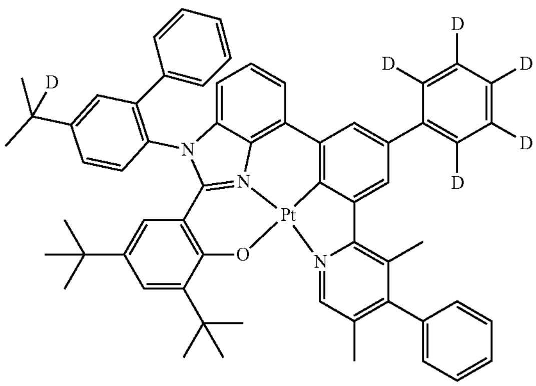
544
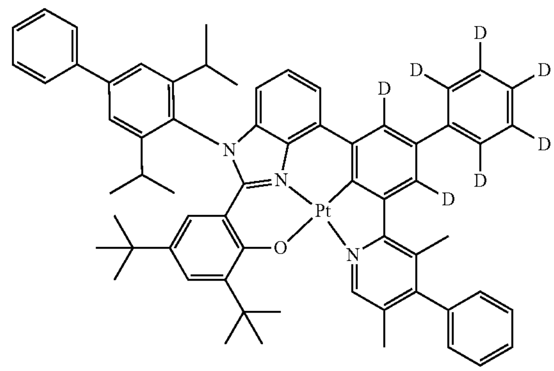
545
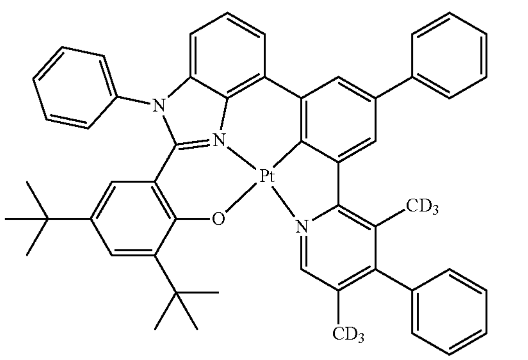
546
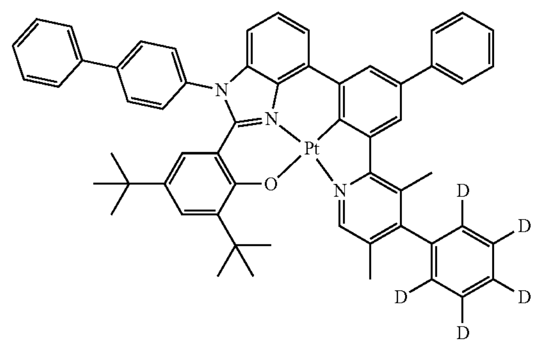
547
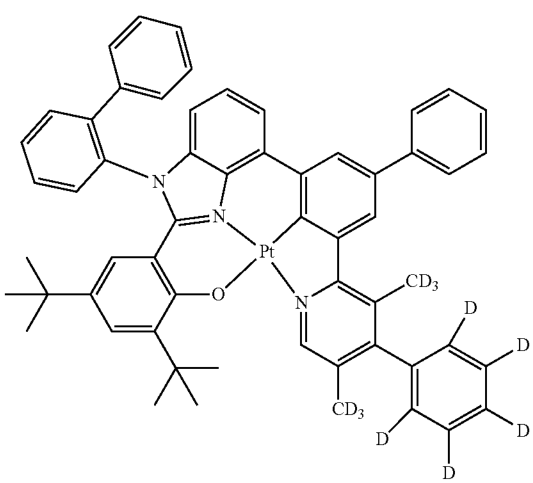
548
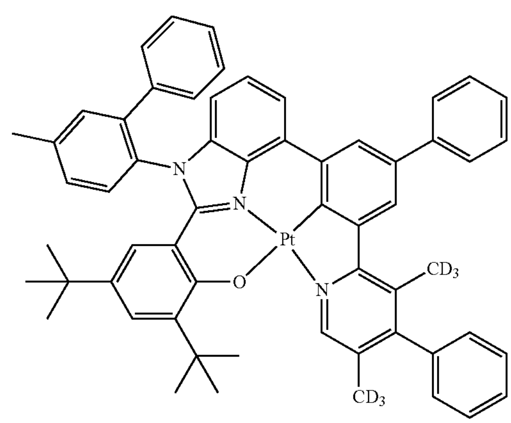

-continued
549
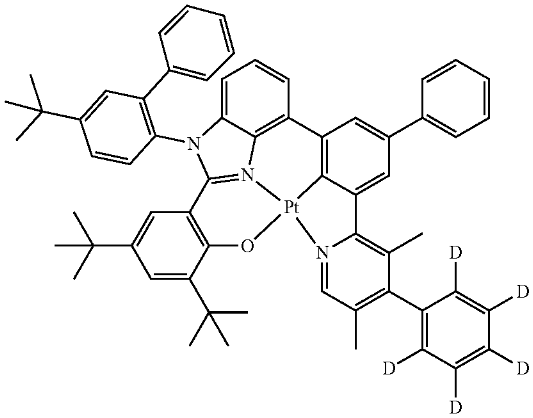
550
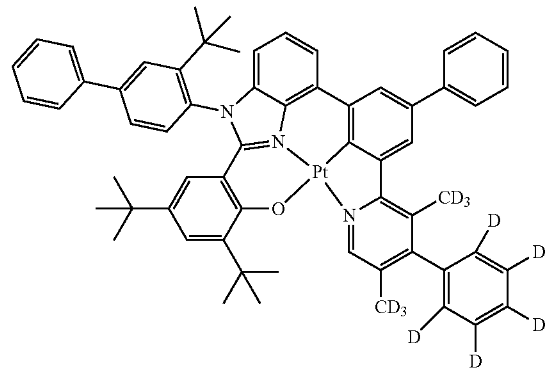
551
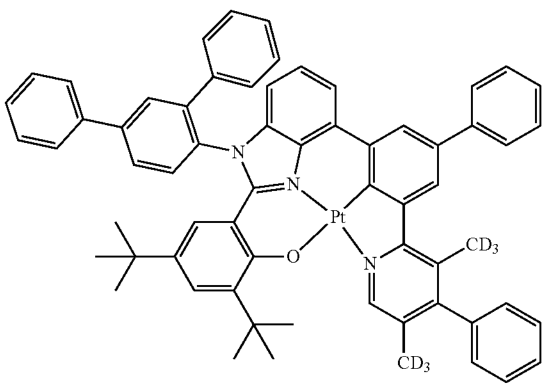
552
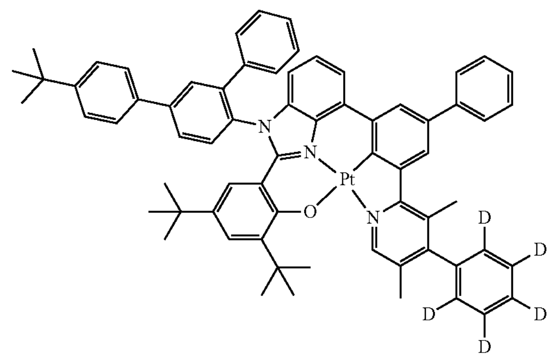
553
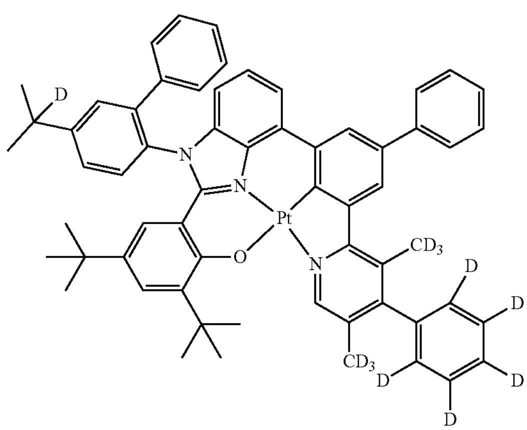
554
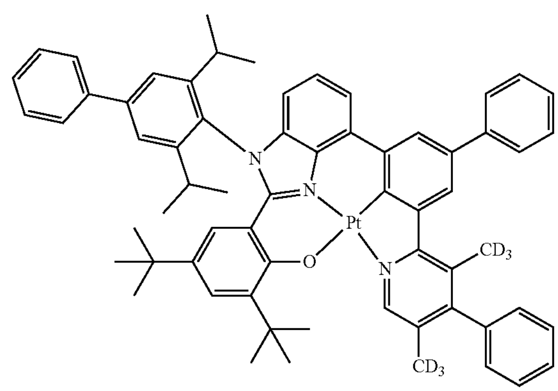
555
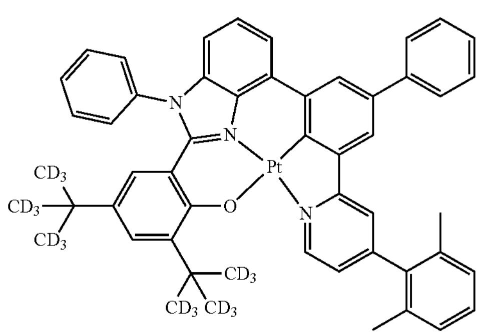
556
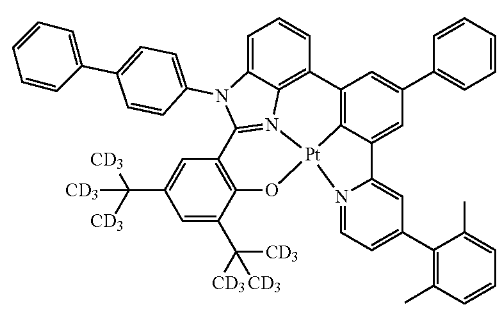

-continued
557
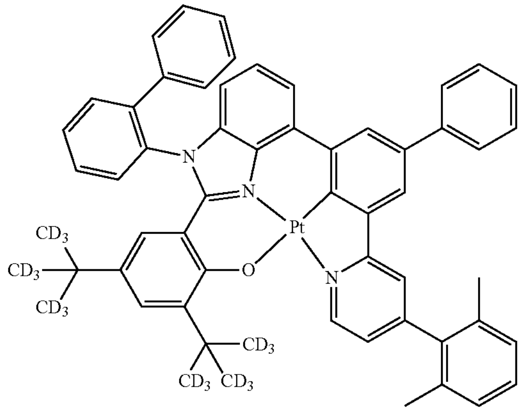
558
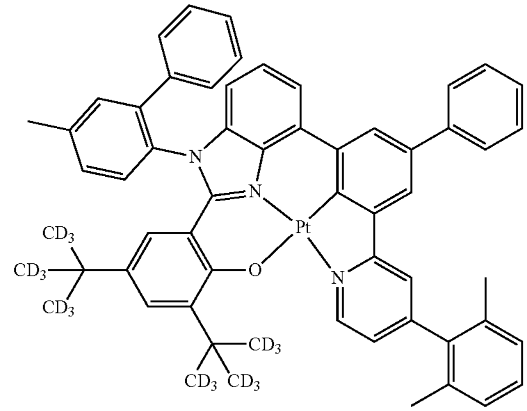
559
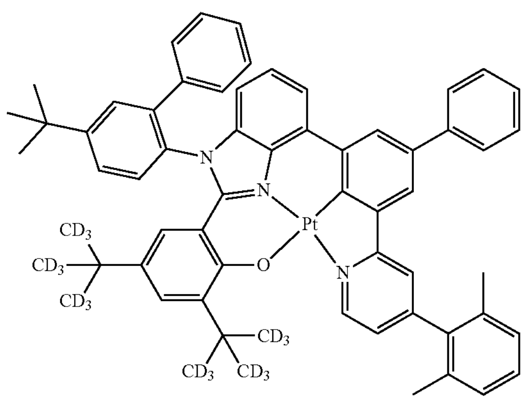
560
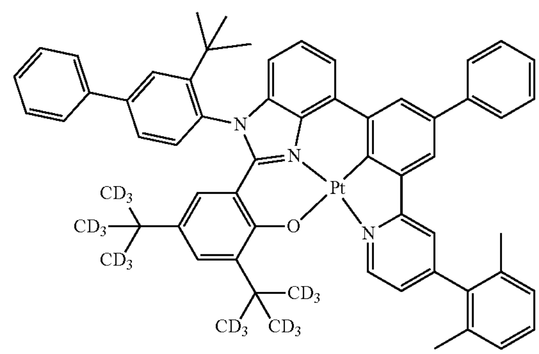
561
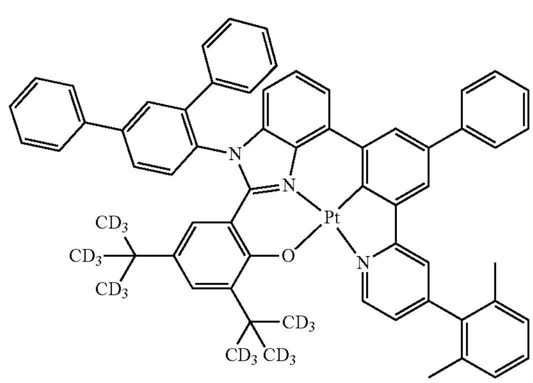
562
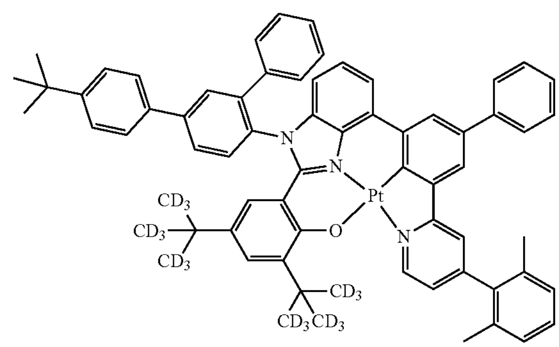
563
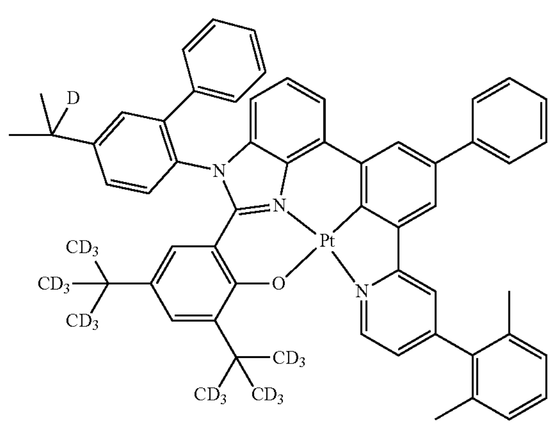
564
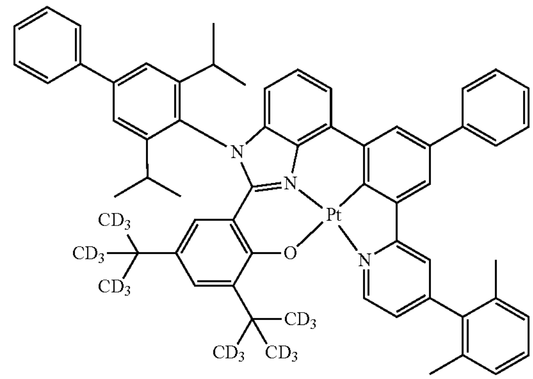

-continued
565
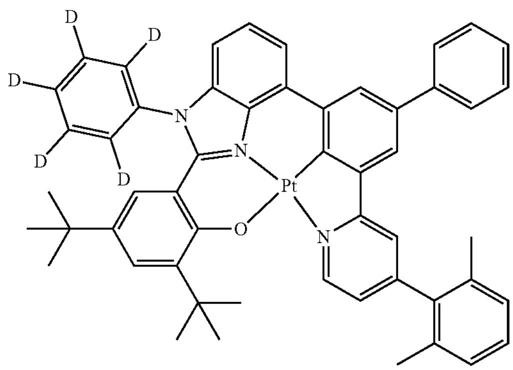
566
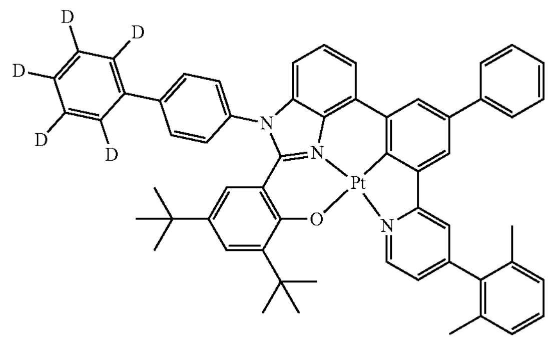
567
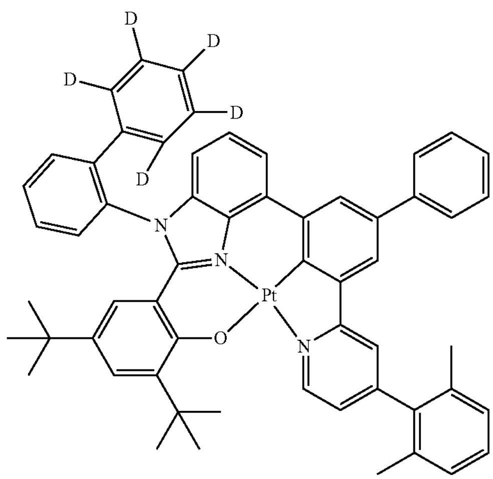
568
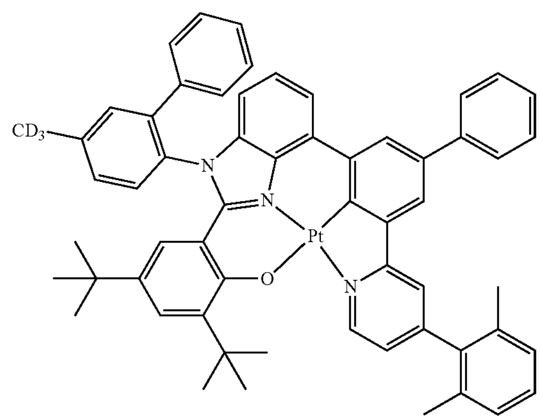
569
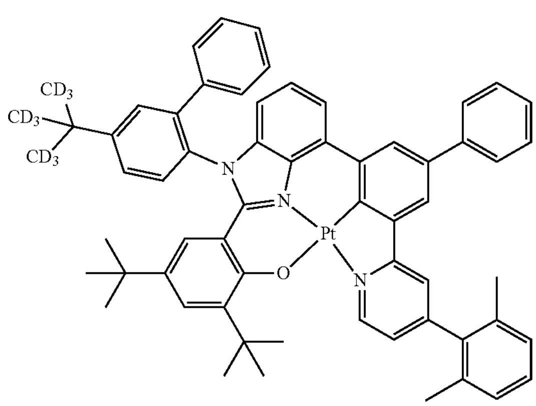
570
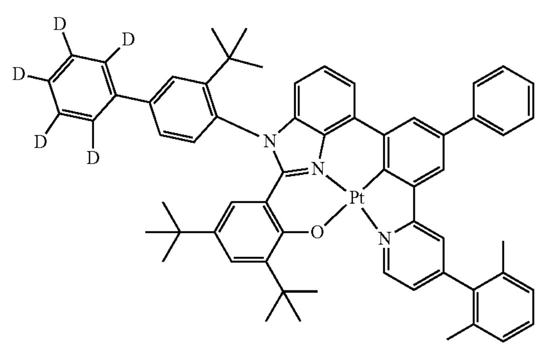

-continued
571
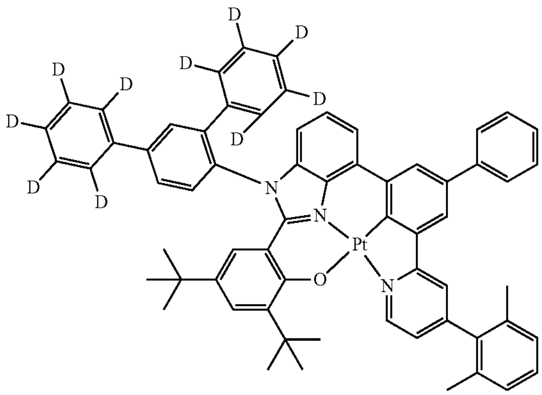
572
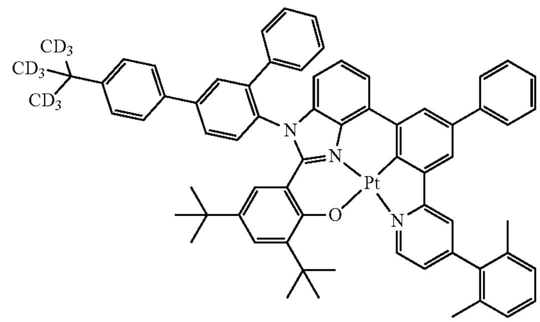
573
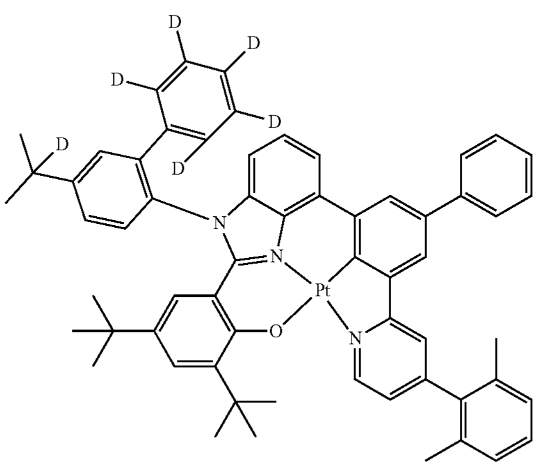
574
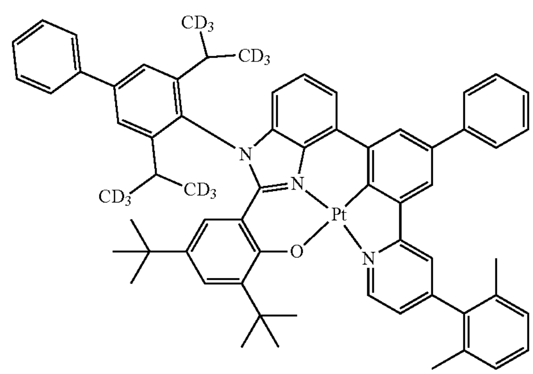
575
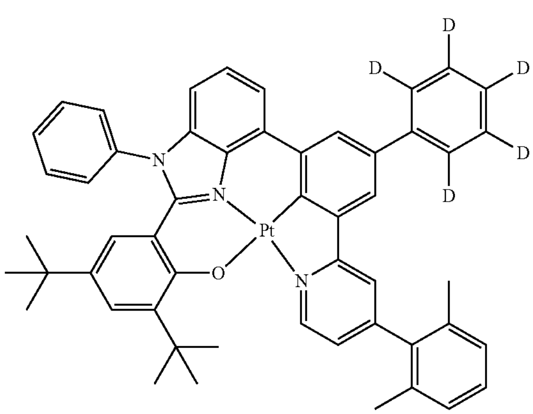
576
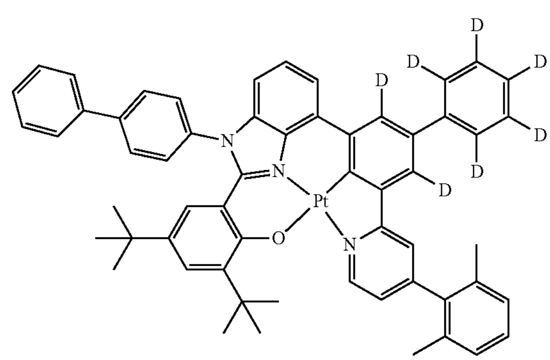

-continued
577
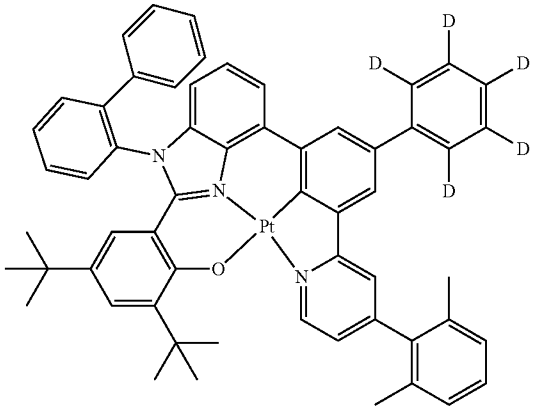
578
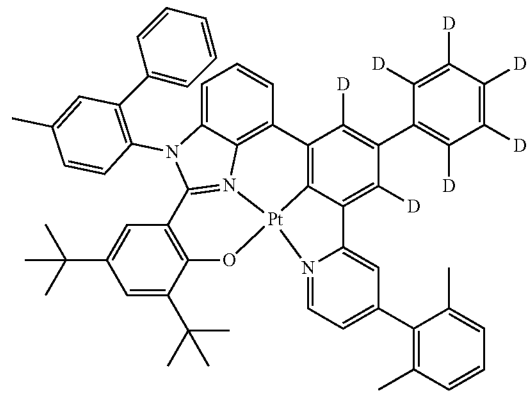
579
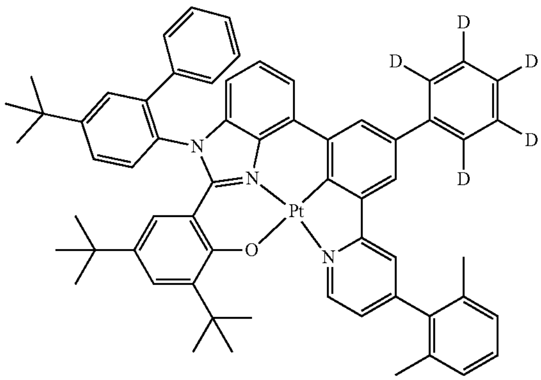
580
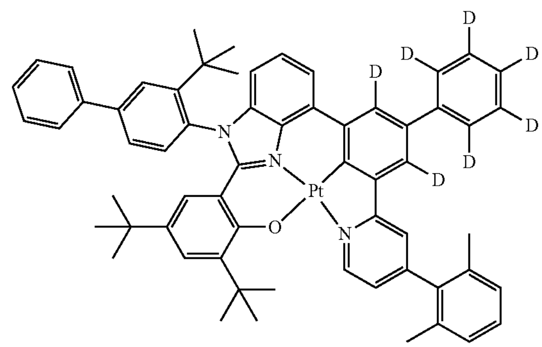
581
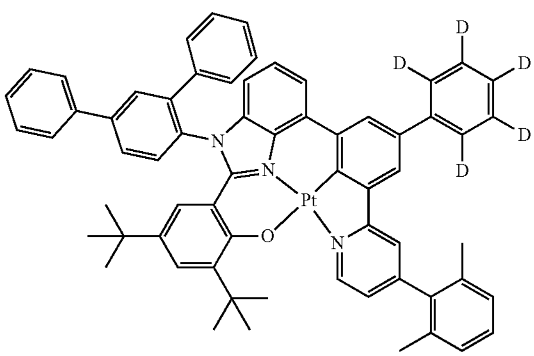
582
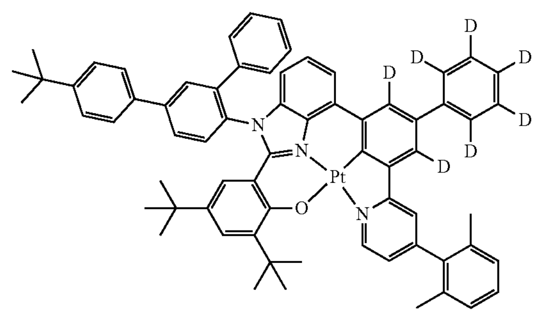
583
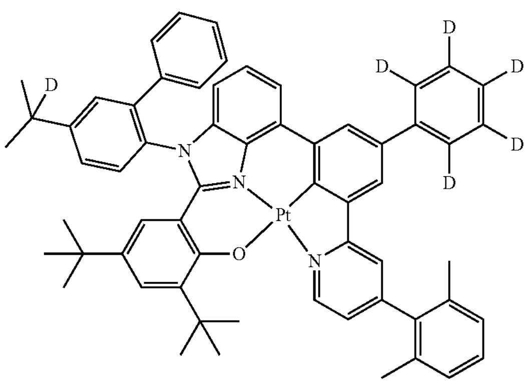
584
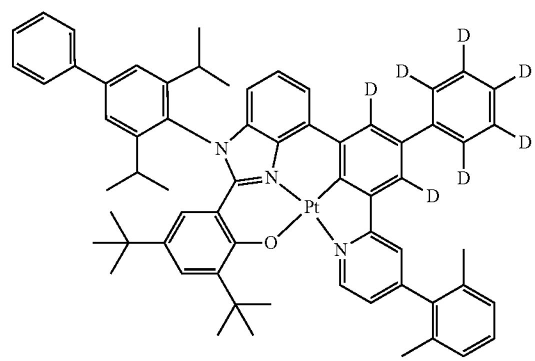

-continued
585
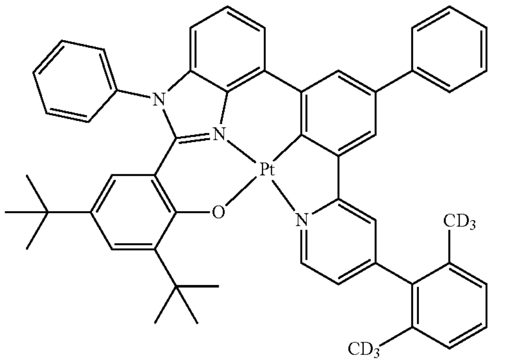
586
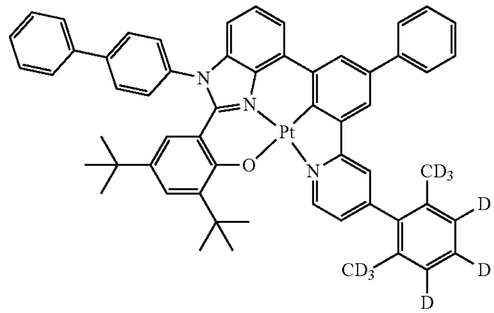
587
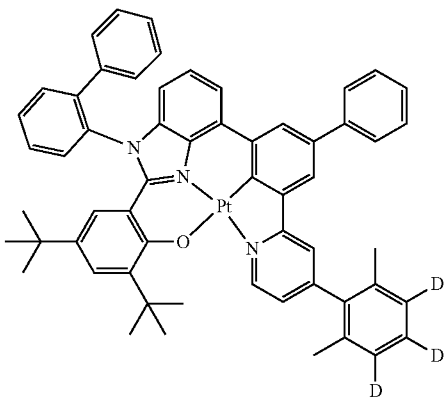
588
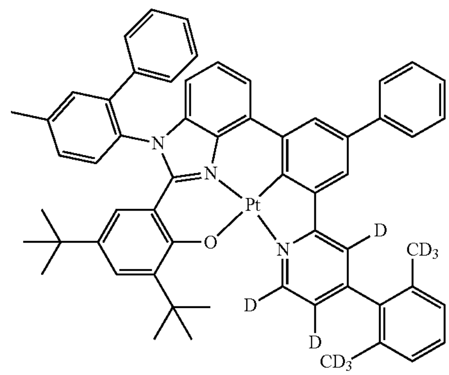
589
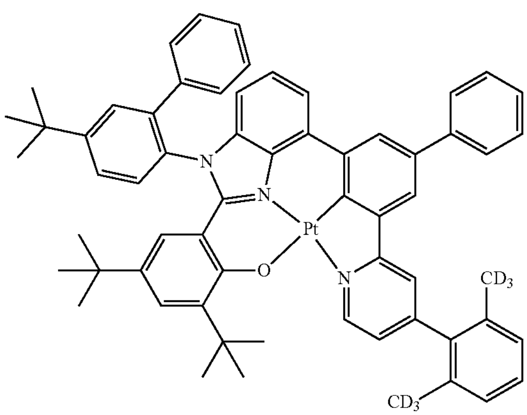
590
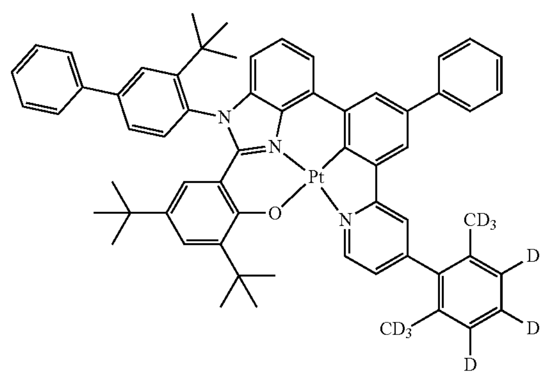
591
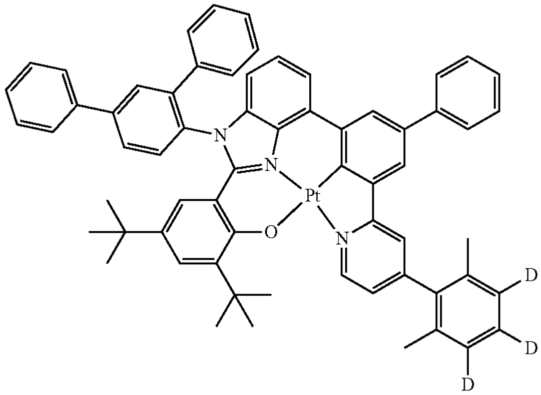
592
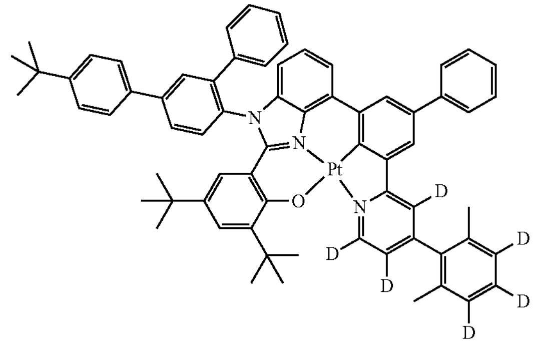

-continued
593
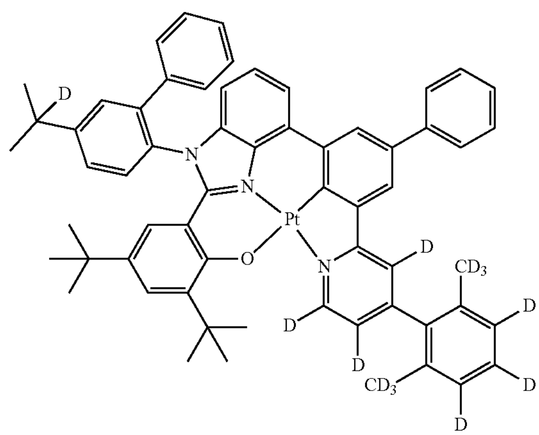
594
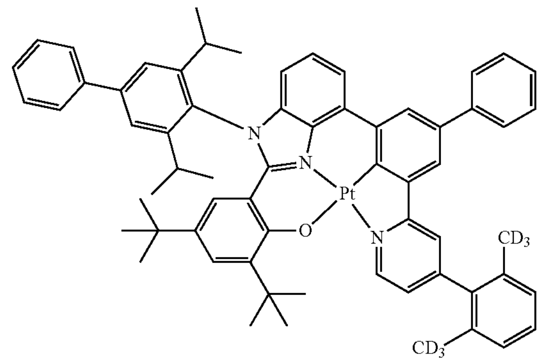
595
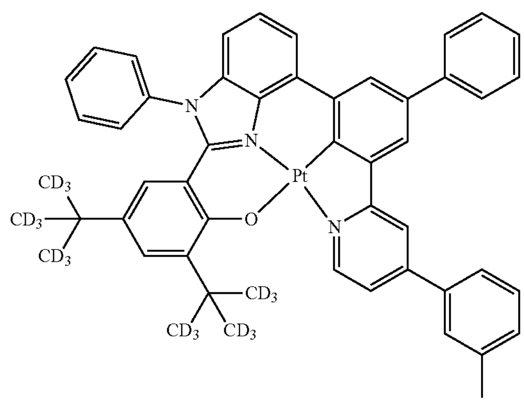
596
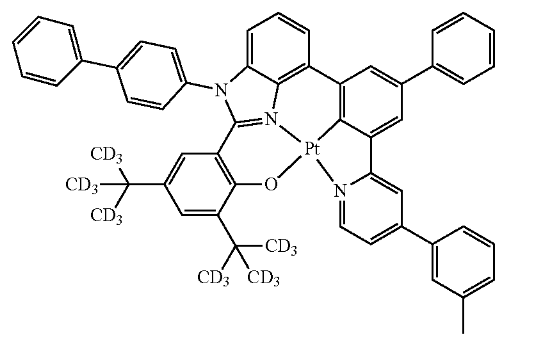
597
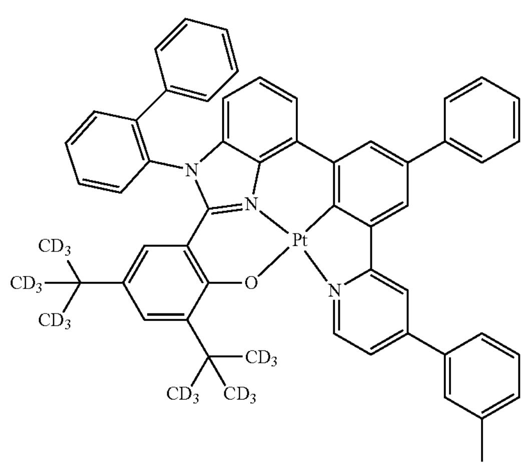
598
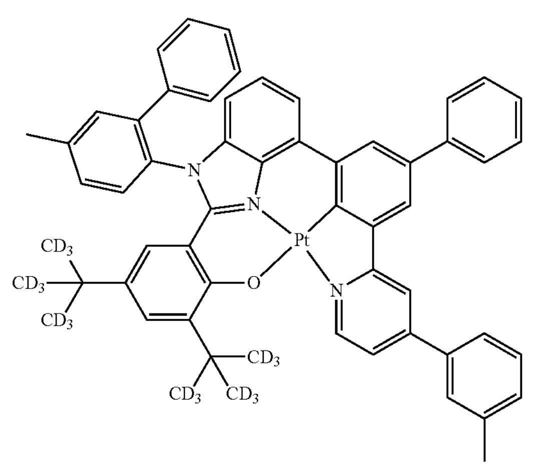

-continued
599
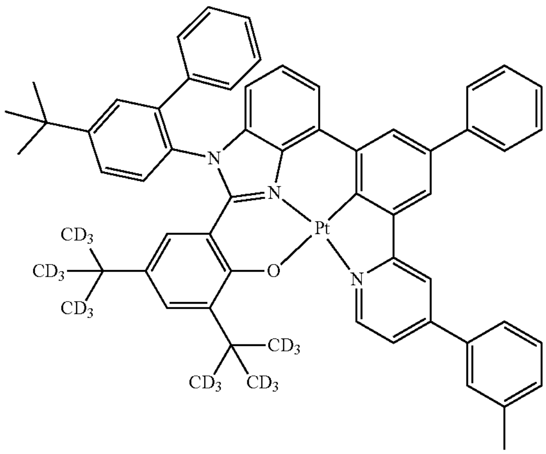
600
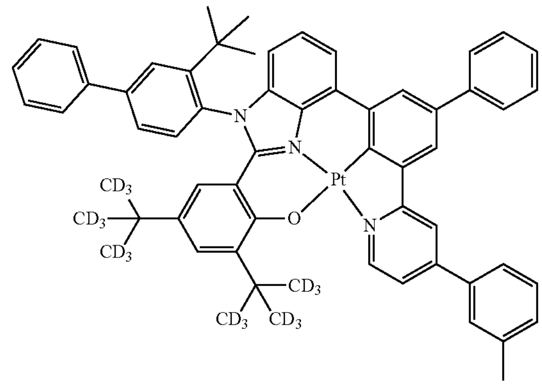
601
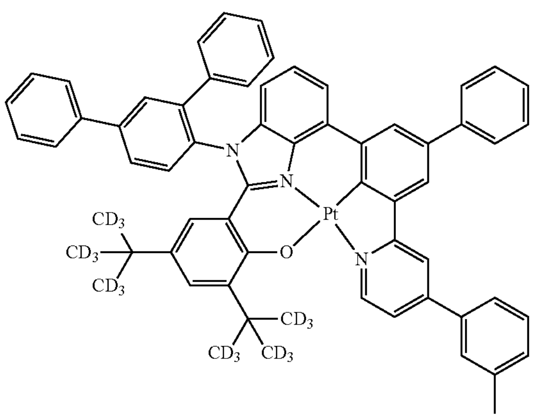
602
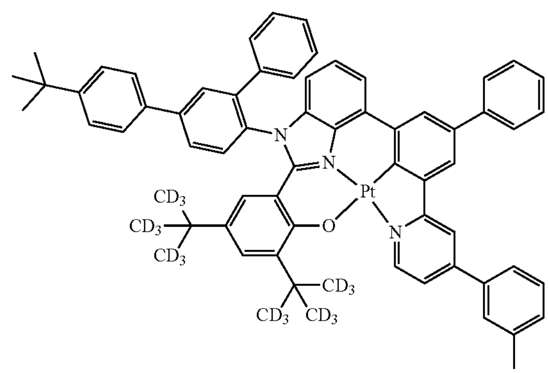
603
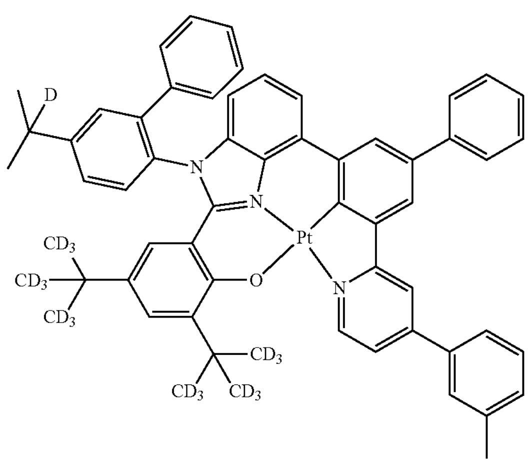
604
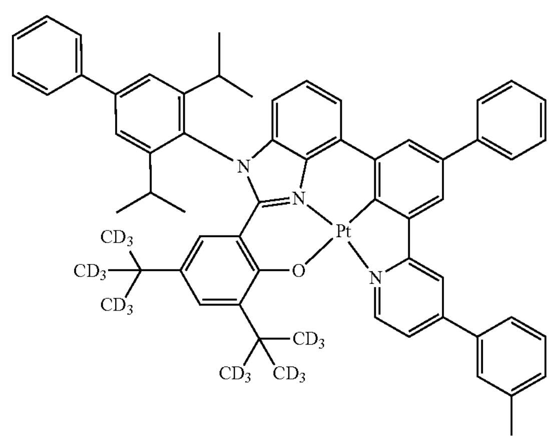

-continued
605
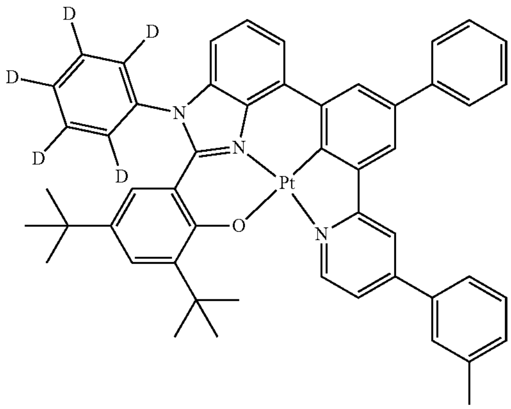
606
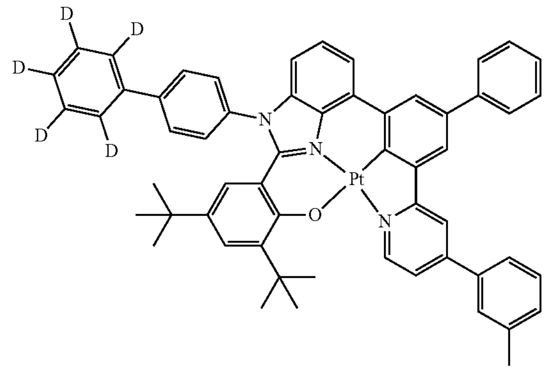
607
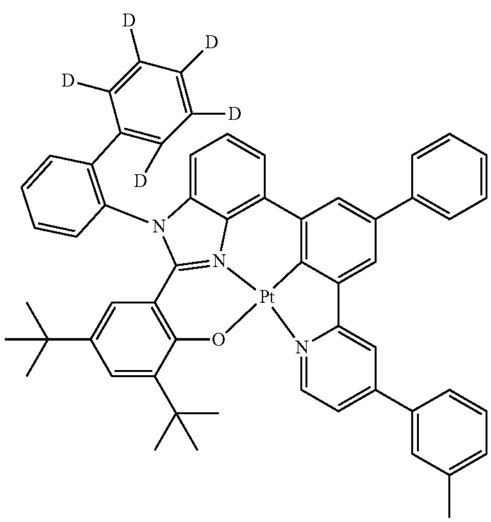
608
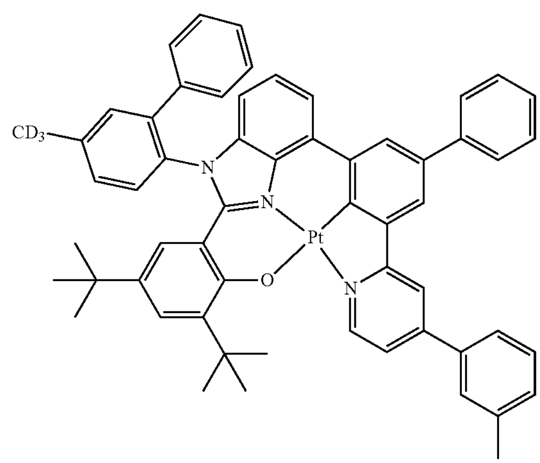
609
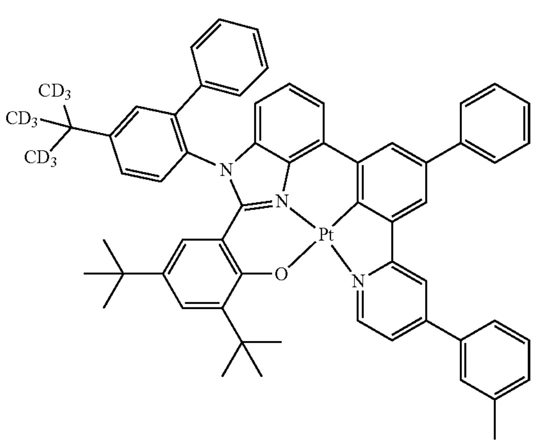
610
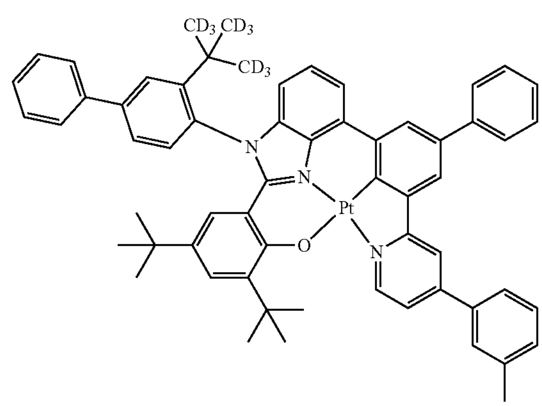

-continued
611
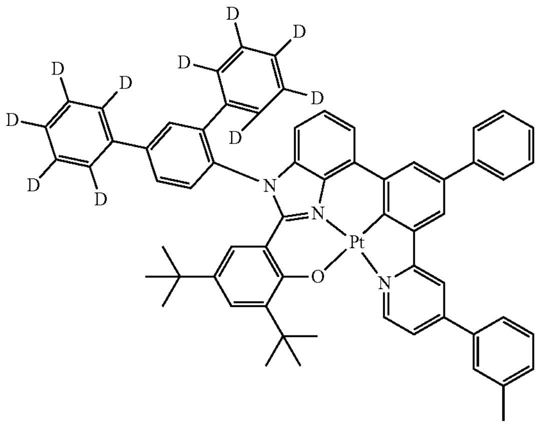
612
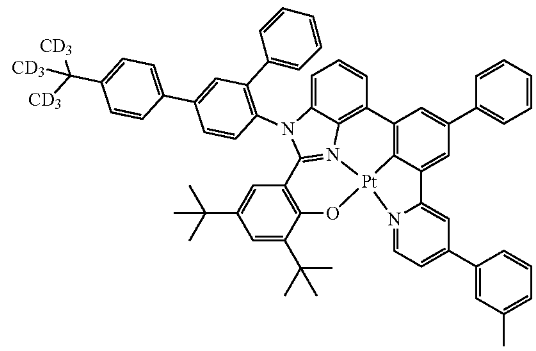
613
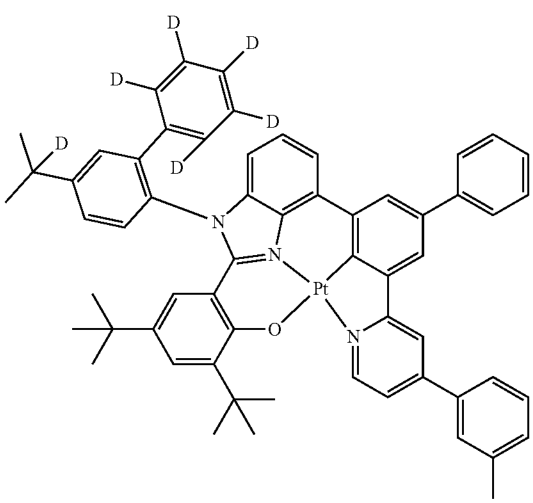
614
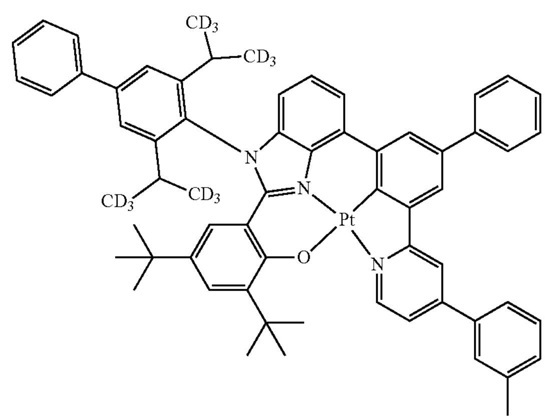
615
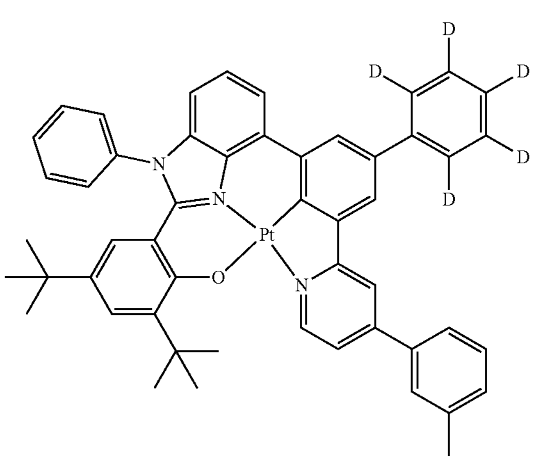
616
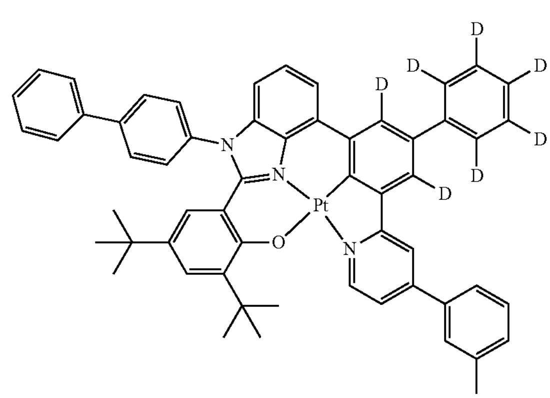

-continued
617
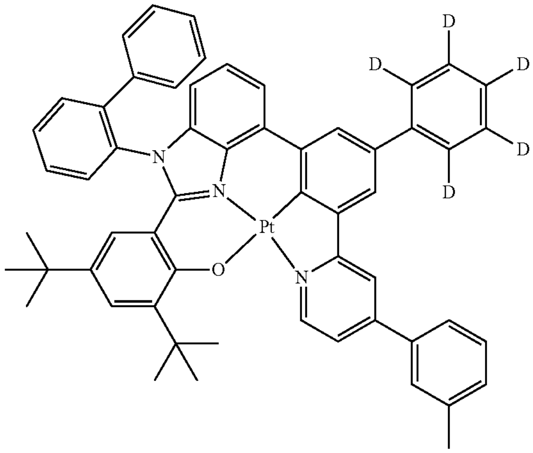
618
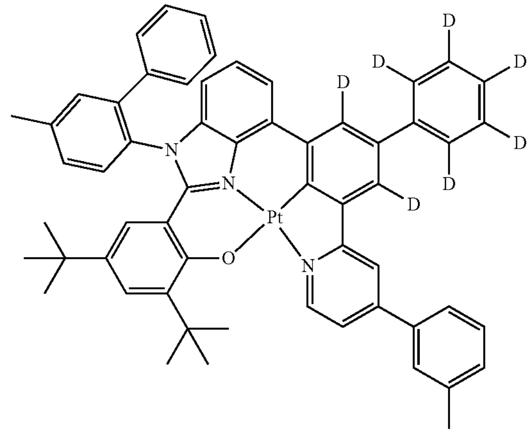
619
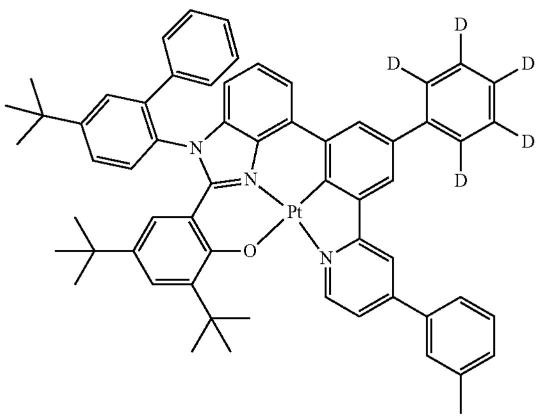
620
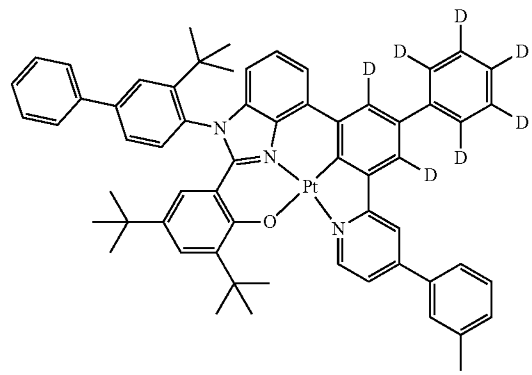
621
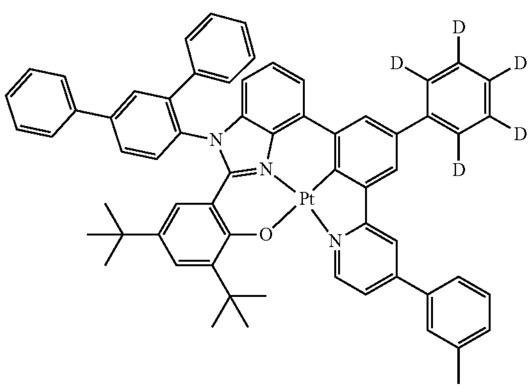
622
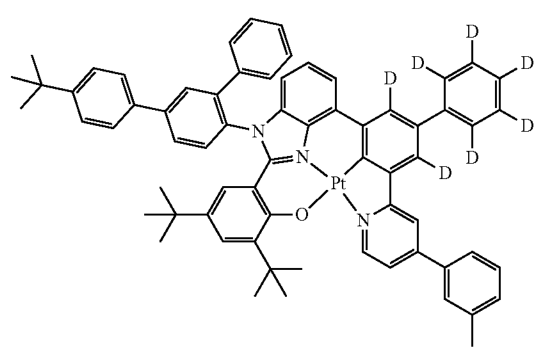

-continued
623
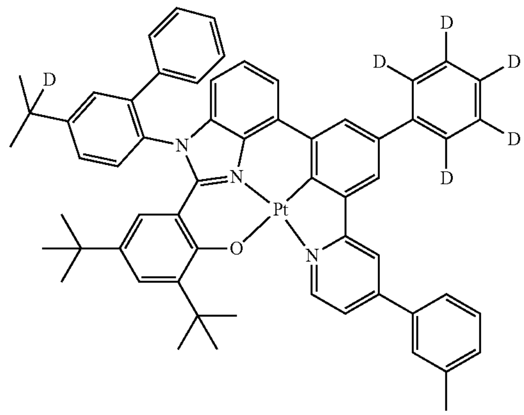
624
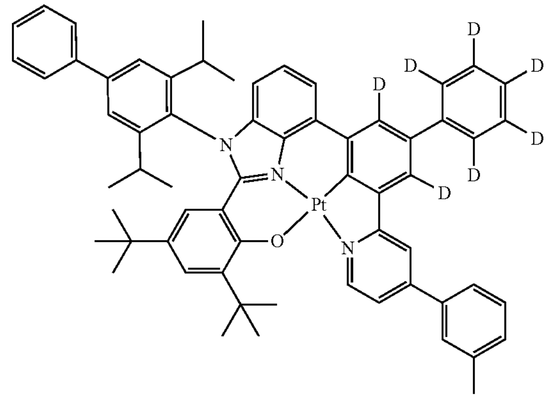
625
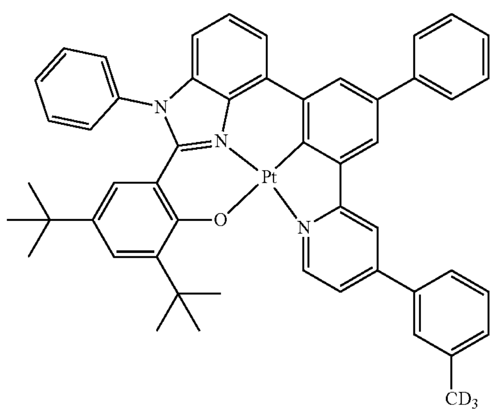
626
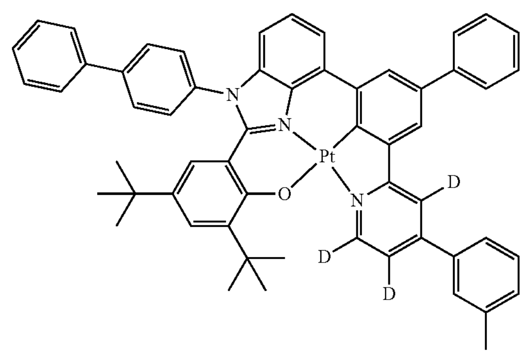
627
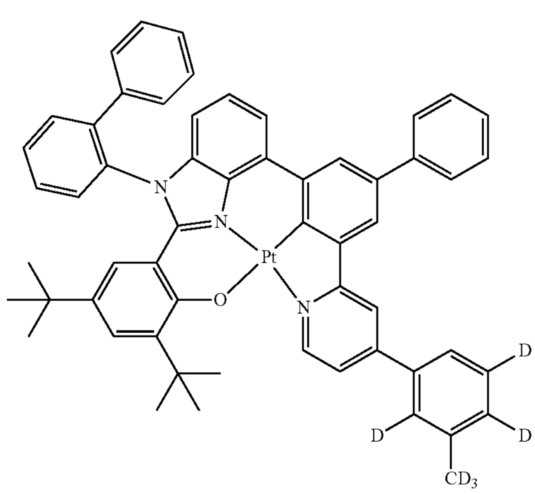
628
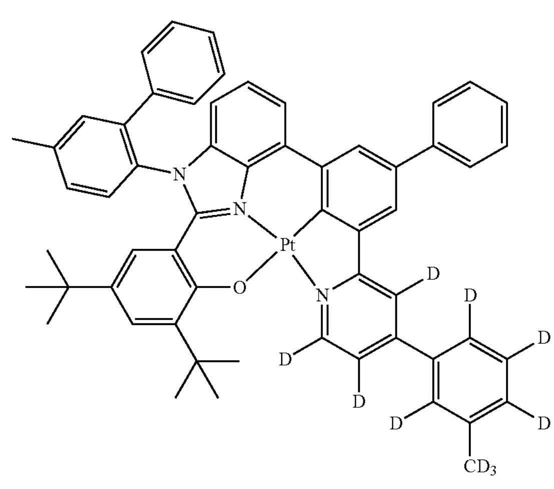

-continued
629
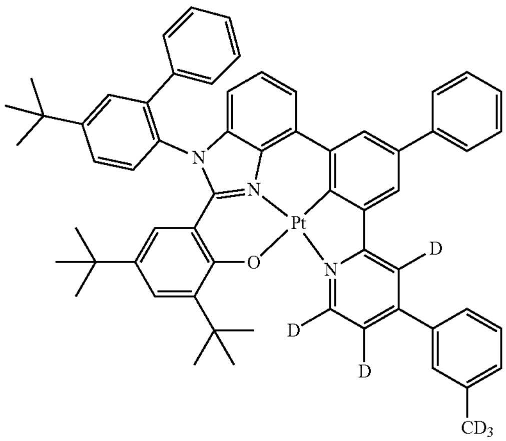
630
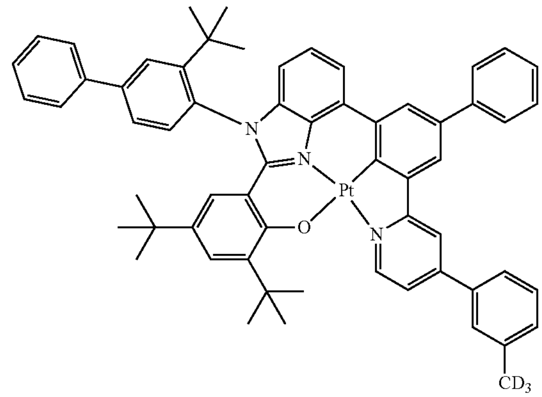
631
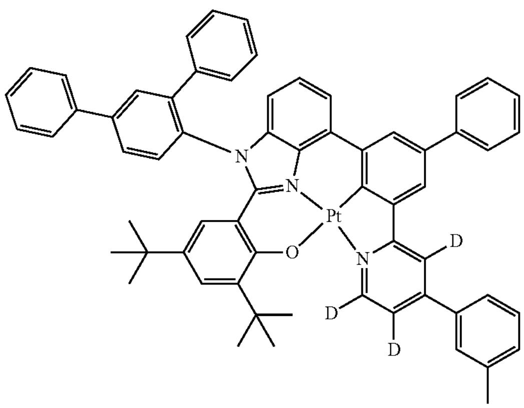
632
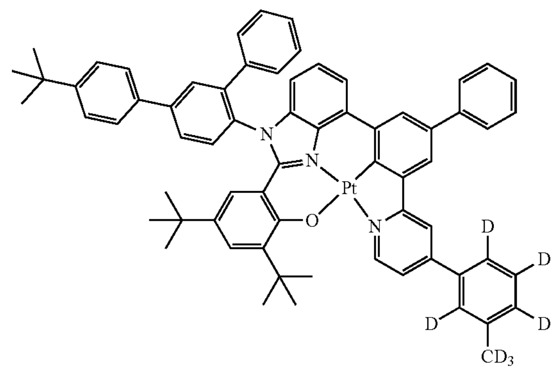
633
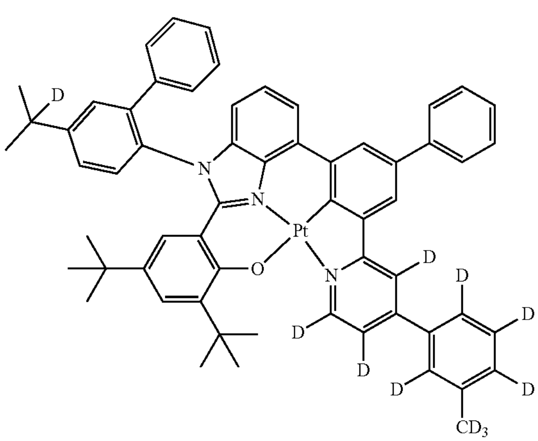
634
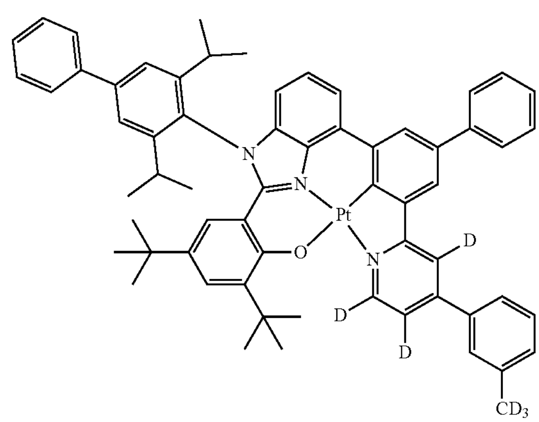

-continued
635
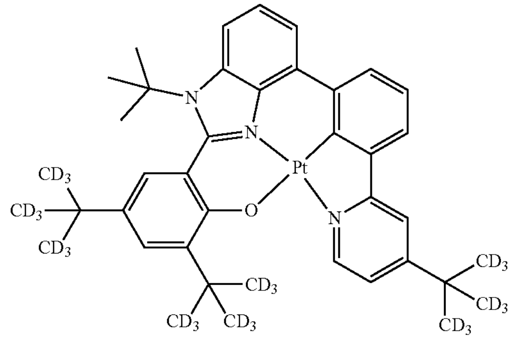
636
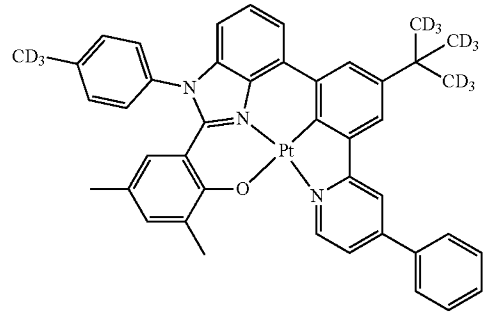
637
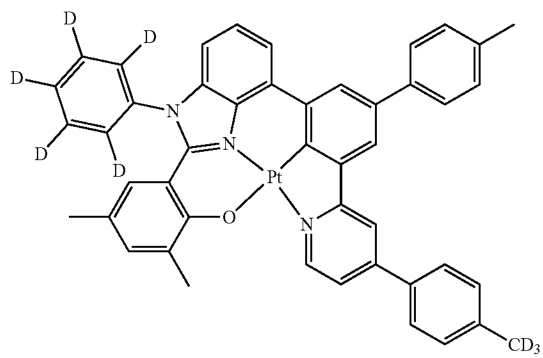
638
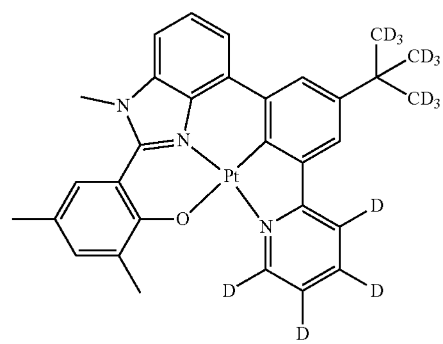
639
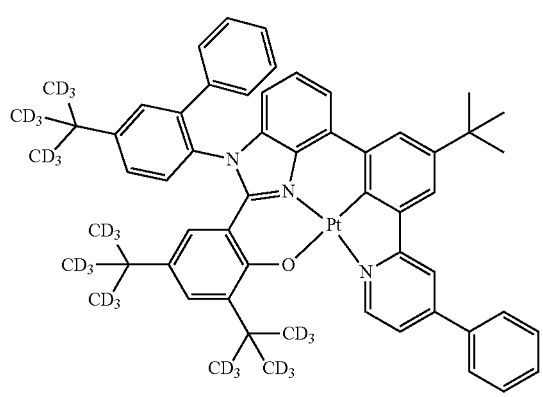
640
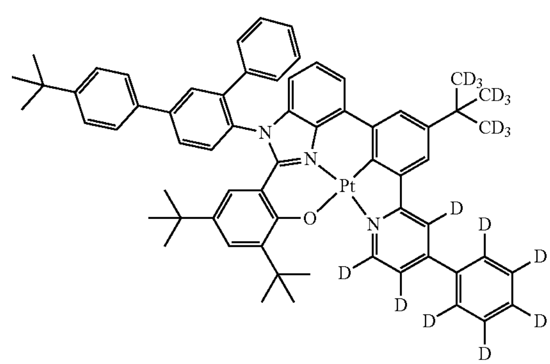
641
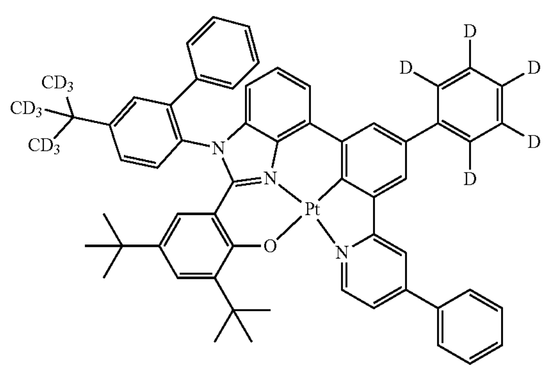
642
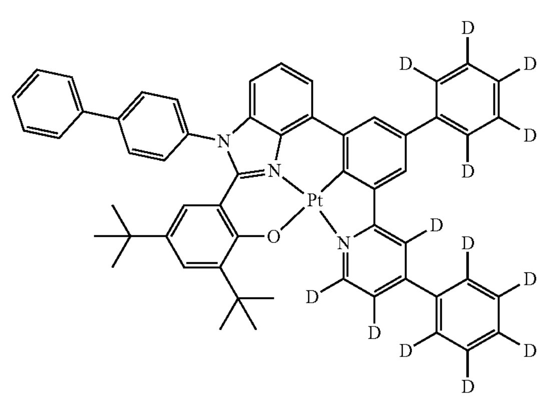

-continued
643
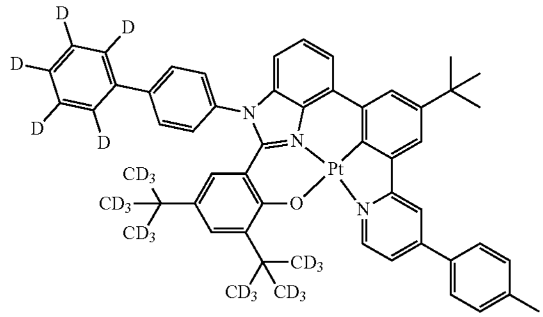
644
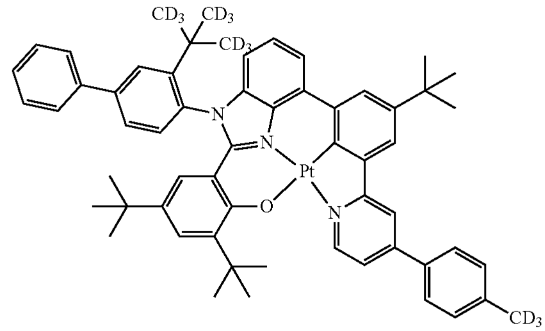
645
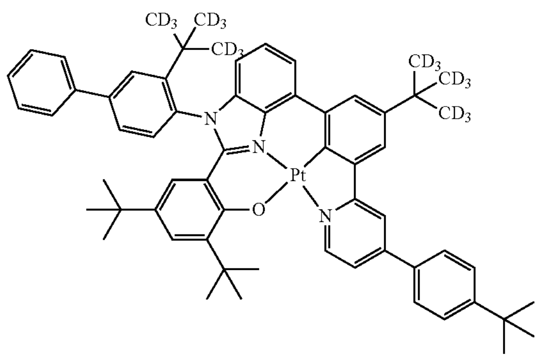
646
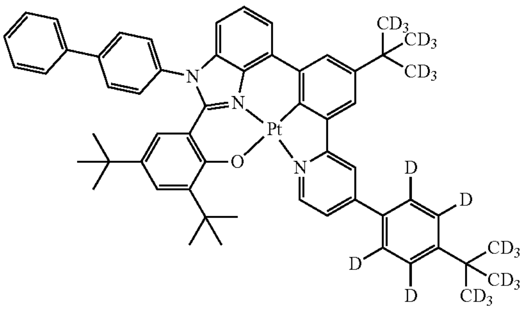
647
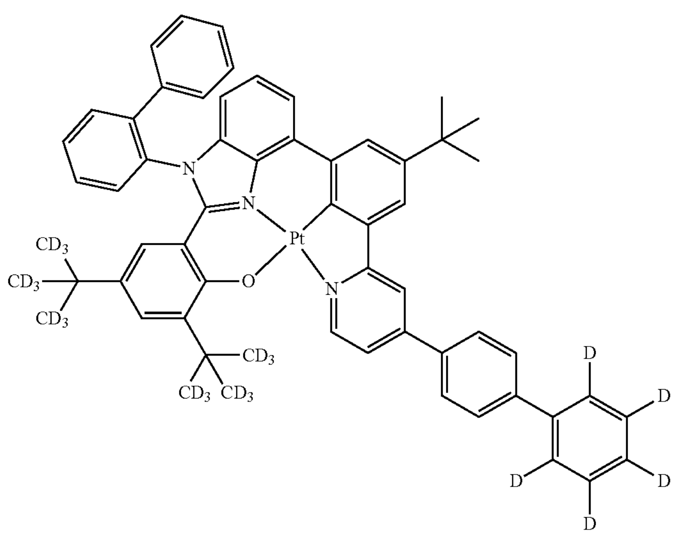

-continued
648
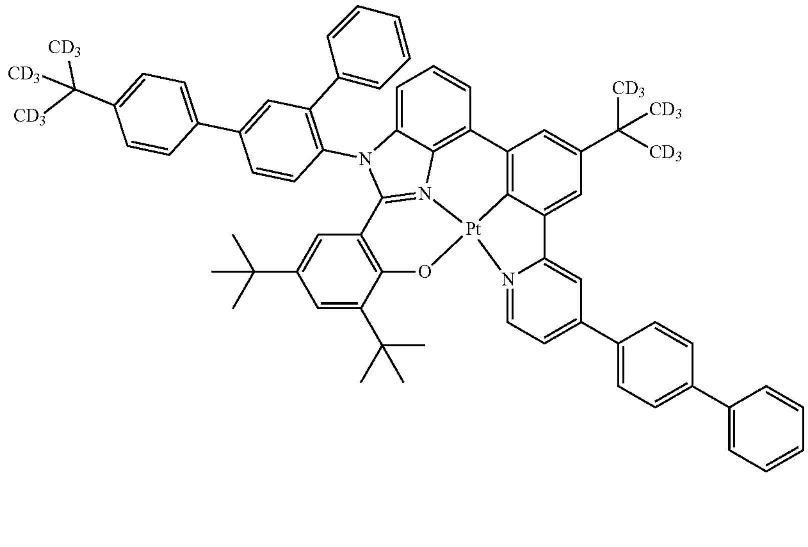
649
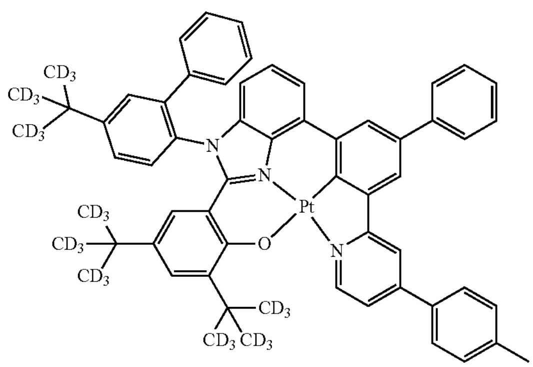
650
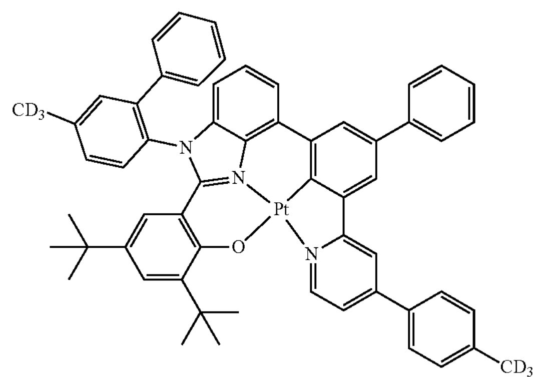
651
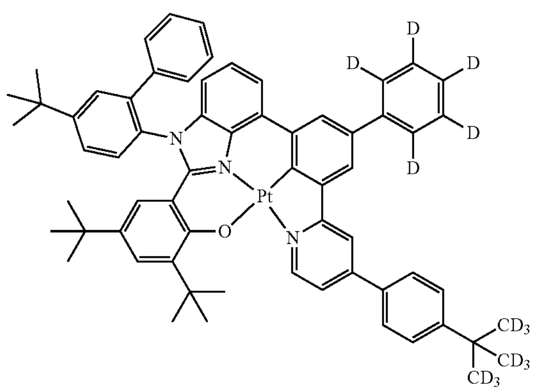
652
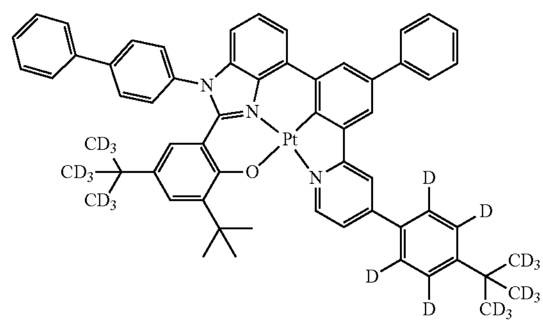

-continued
653
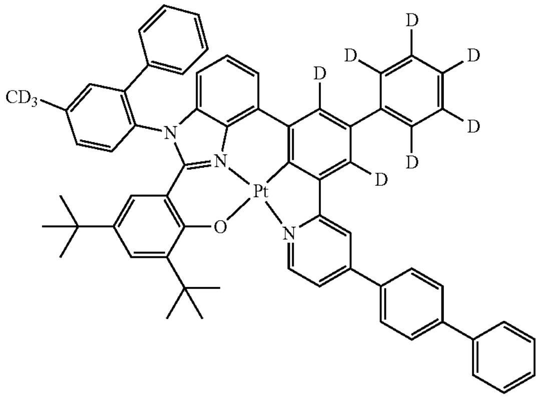
654
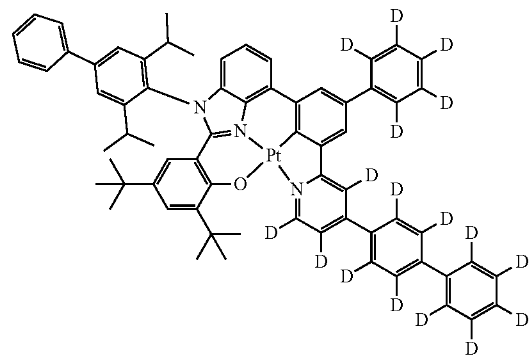
655
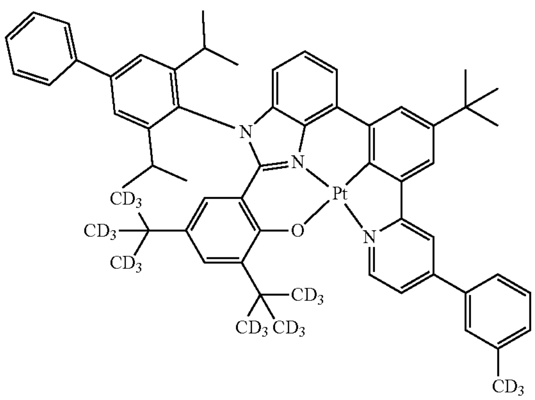
656
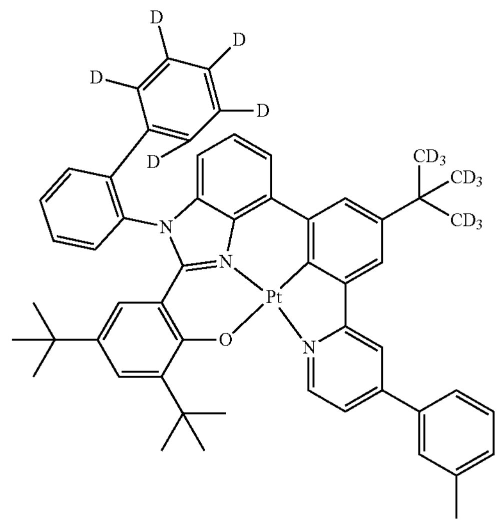
657
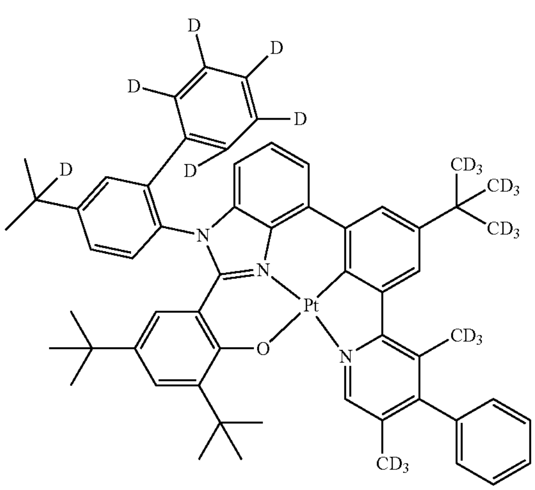
658
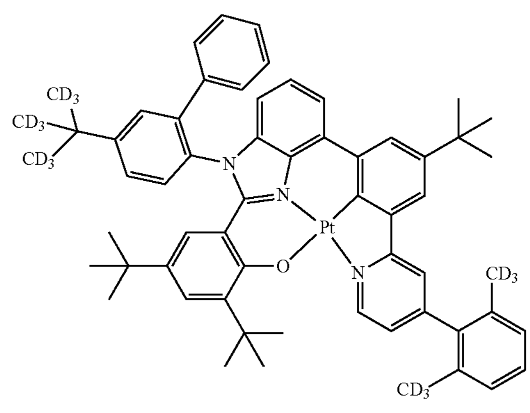

-continued
659
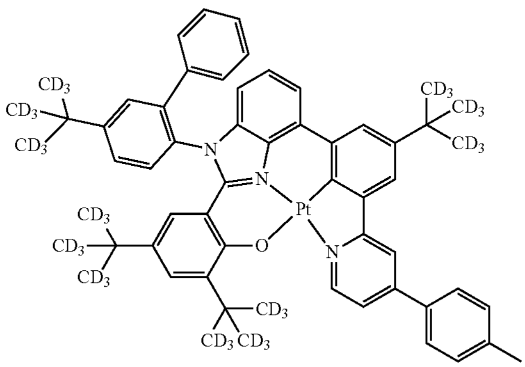
660
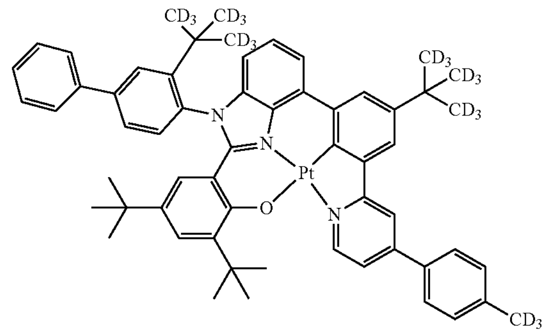
661
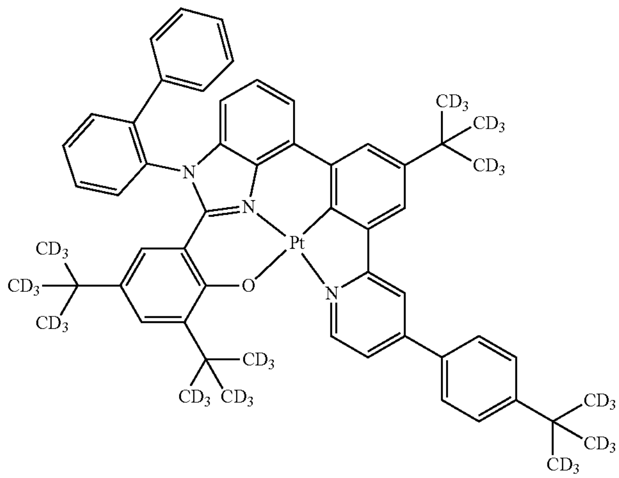
662
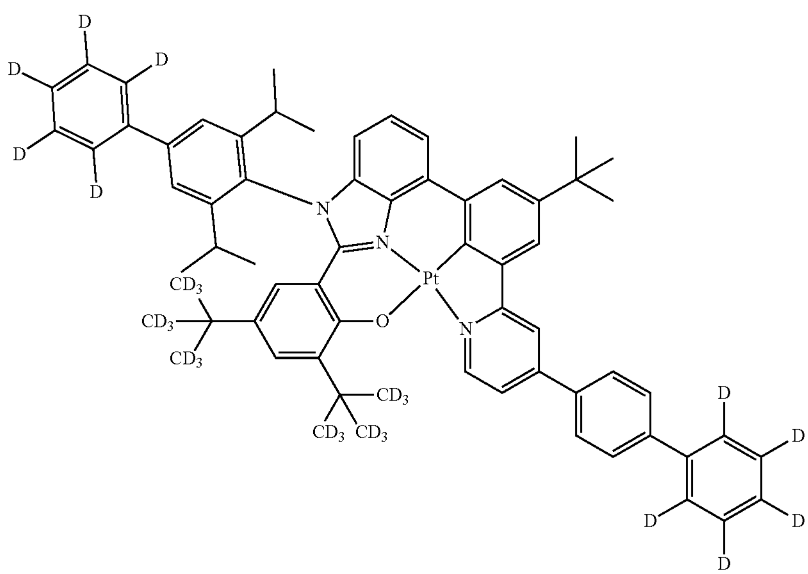

-continued

663

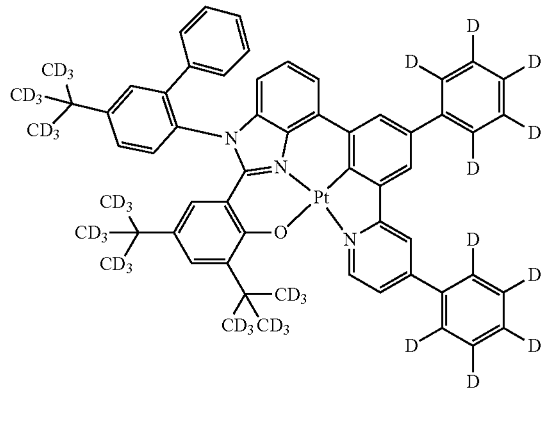

664

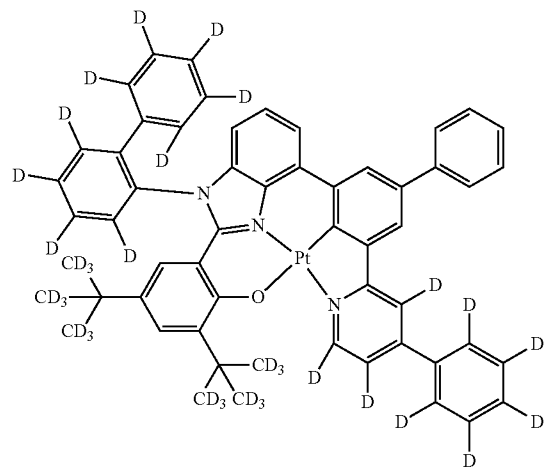

665

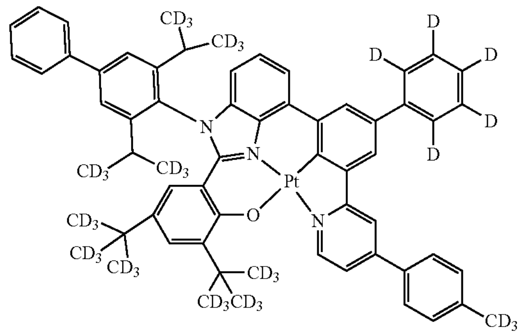

666

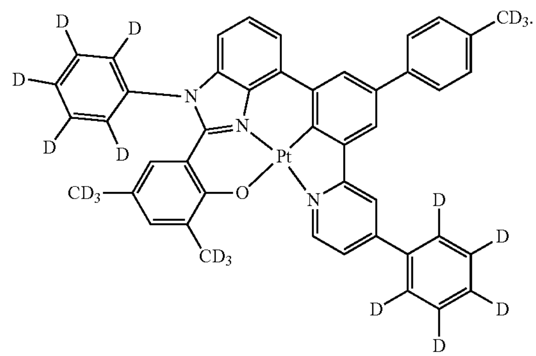

$Z_1$ to $Z_4$ in Formula 1 may each independently be deuterium or a deuterium-containing group, and i) when $X_{51}$ is O, S, C(=O), or N, the sum of n1 to n4 may be 1 or more, ii) when $X_{51}$ is $N[(L_7)_{b7}\text{-}(R_7)_{c7}]$, $C(R_7)$, $Si(R_7)$, or $Ge(R_7)$, a) $R_7$ is deuterium or a deuterium-containing group; b) the sum of n1 to n4 may be 1 or more; or c) $R_7$ is deuterium or a deuterium-containing group and the sum of n1 to n4 is 1 or more, and iii) when $X_{51}$ is $C(R_7)(R_8)$, $Si(R_7)(R_8)$, or $Ge(R_7)(R_8)$, a) at least one of $R_7$ and $R_8$ may be deuterium or a deuterium-containing group; b) the sum of n1 to n4 is 1 or more; or c) at least one of $R_7$ and $R_8$ is deuterium or a deuterium-containing group and the sum of n1 to n4 is 1 or more. That is, the organometallic compound represented by Formula 1 may essentially include at least one deuterium. Accordingly, the reduced mass of the organometallic compound represented by Formula 1 is changed, and thus, a molecular structure change caused by energy quenching caused due to vibration of the organometallic compound being in an excited state is decreased. Due to the decrease in the molecular structure change, an electronic device including the organometallic compound represented by Formula 1, for example, an organic light-emitting device including the organometallic compound represented by Formula 1 may have improved lifespan characteristics.

In one or more embodiments, $X_2$ to $X_4$ in Formula 1 may each independently be N or C, two selected from $X_2$ to $X_4$ may each be N, and the remaining one may be C, and a bond between $X_1$ or $Y_1$ and M may be a covalent bond, and one bond selected from a bond between $X_2$ and M, a bond between $X_3$ and M, and a bond between $X_4$ and M may be a covalent bond, and the remaining two bonds may each be a coordinate bond. In an embodiment, $X_2$ of ring $CY_5$, $X_3$ of ring $CY_3$, and $X_4$ of ring $CY_4$ in Formula 1 may not constitute a carbine moiety. That is, regarding Formula 1, 1) when $X_2$ is C, a bond between $X_2$ and M may be a covalent bond, 2) when $X_3$ is C, a bond between $X_3$ and M may be a covalent bond, and 3) when $X_4$ is C, a bond between $X_4$ and M may be a covalent bond. Therefore, the structural change of the main emission moiety of the organometallic compound represented by Formula 1 in an exited state is decreased, and thus, color purity of an electronic device including the organometallic compound, for example, an organic light-emitting device including the organometallic compound may be improved.

Furthermore, each of ring $CY_1$, ring $CY_3$, and ring $CY_4$ in Formula 1 may not be a benzimidazole group. Accordingly, since the steric hindrance of a ligand surrounding the center metal M is improved, an electronic device including the organometallic compound, for example, an organic light-emitting device including the organometallic compound may have an improved lifespan characteristic and a sharp electroluminescence peak.

For example, HOMO, LUMO, singlet ($S_1$) and triplet ($T_1$) energy levels of Compounds 1 to 10 and 13 were evaluated by using a DFT method of Gaussian program (structurally optimized at a level of B3LYP, 6-31G(d,p)). Evaluation results are shown in Table 1 below.

TABLE 1

| Compound No. | HOMO (eV) | LUMO (eV) | Energy gap (eV) | $S_1$ energy level (eV) | $T_1$ energy level (eV) |
|---|---|---|---|---|---|
| 1 | −4.85 | −1.546 | 3.304 | 2.751 | 2.517 |
| 2 | −4.85 | −1.546 | 3.304 | 2.751 | 2.517 |
| 3 | −4.85 | −1.546 | 3.304 | 2.751 | 2.517 |
| 4 | −4.869 | −1.589 | 3.280 | 2.728 | 2.472 |
| 5 | −4.869 | −1.589 | 3.280 | 2.728 | 2.472 |
| 6 | −4.869 | −1.589 | 3.280 | 2.728 | 2.472 |
| 7 | −4.994 | −1.793 | 3.201 | 2.661 | 2.439 |
| 8 | −4.994 | −1.793 | 3.201 | 2.661 | 2.439 |
| 9 | −4.994 | −1.793 | 3.201 | 2.661 | 2.439 |
| 10 | −4.794 | −1.528 | 3.266 | 2.721 | 2.47 |
| 13 | −4.782 | −1.528 | 3.254 | 2.719 | 2.466 |

From Table 1, it is confirmed that the organometallic compound represented by Formula 1 has such electric characteristics that are suitable for use as a dopant for an electronic device, for example, an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is located between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, a low driving voltage, high efficiency, high power efficiency, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 may all be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIGURE a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0.01 Angstroms per second (A/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, R-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

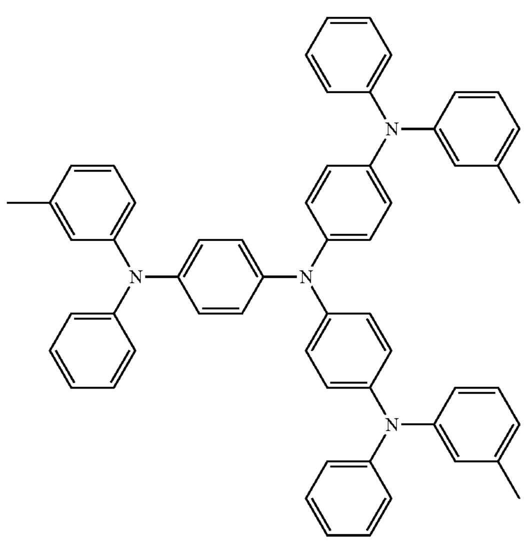

m-MTDATA

-continued

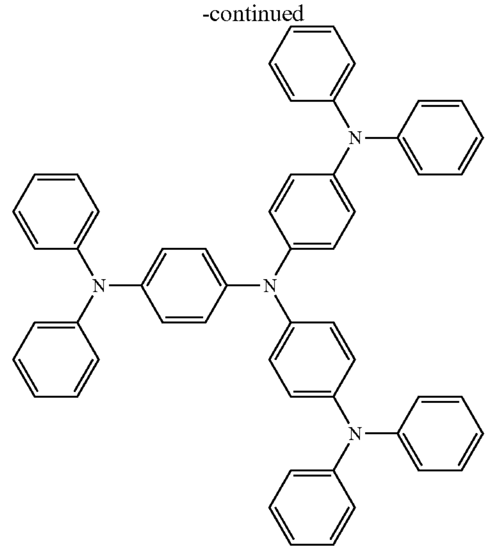

TDATA

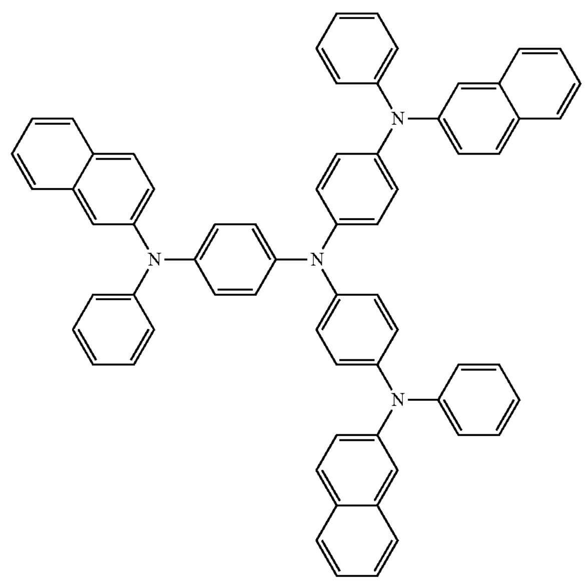

2-TNATA

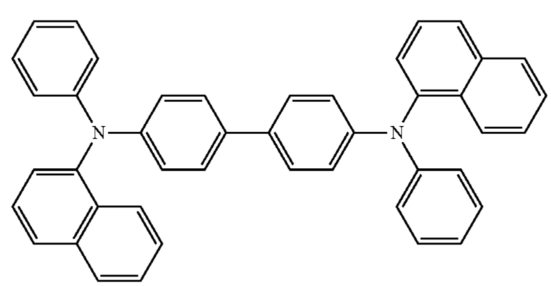

NPB

-continued

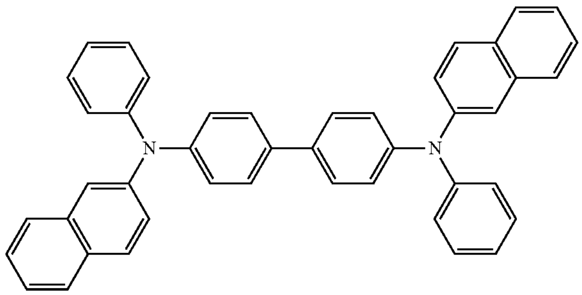

β-NPB

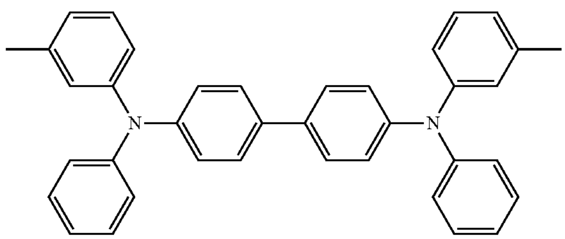

TPD

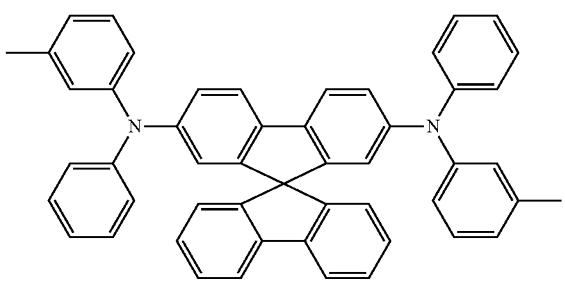

Spiro-TPD

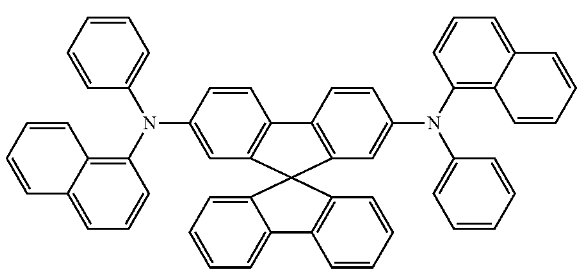

Spiro-NPB

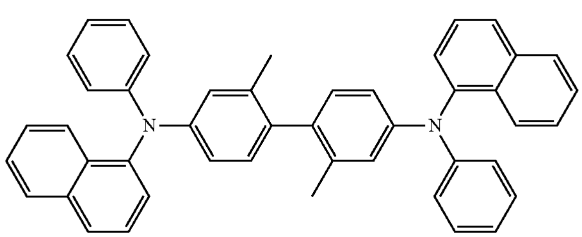

methylated NPB

-continued

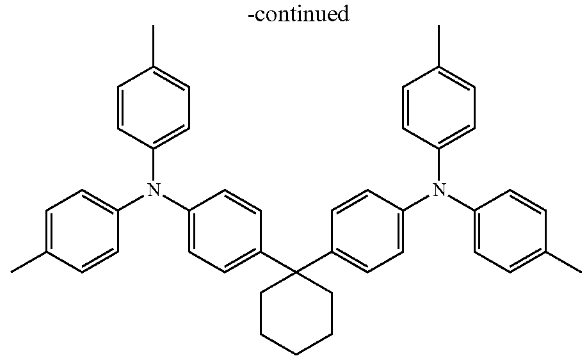

TAPC

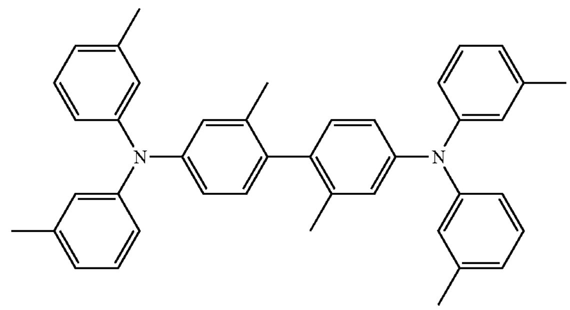

HMTPD

Formula 201

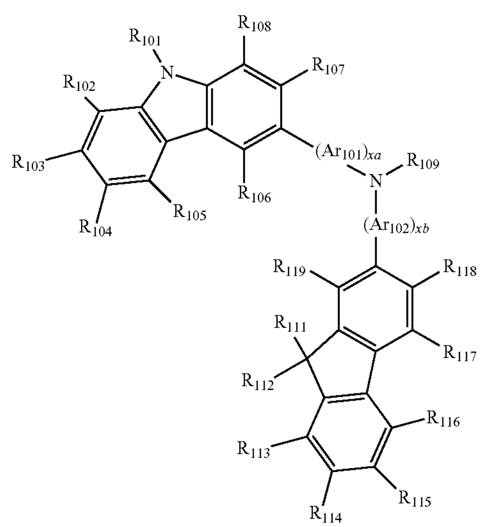

Formula 202

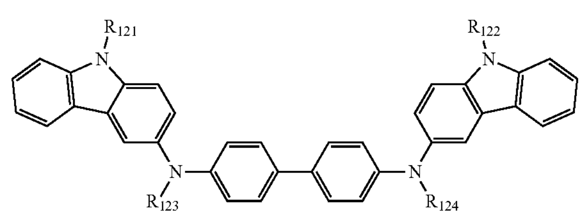

$Ar_{101}$ to $Ar_{102}$ in Formula 201 may each independently be selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

xa and xb in Formula 201 may each independently be an integer from 0 to 5, or 0, 1 or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, or a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A below, but embodiments of the present disclosure are not limited thereto:

Formula 201A

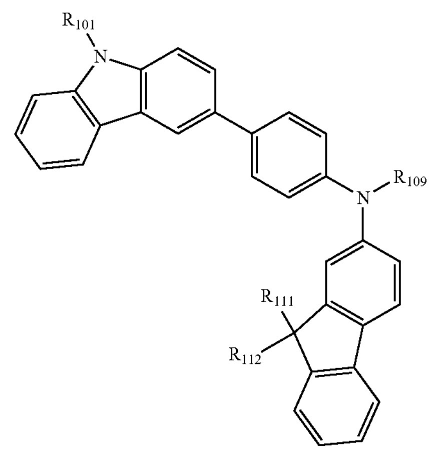

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

HT1

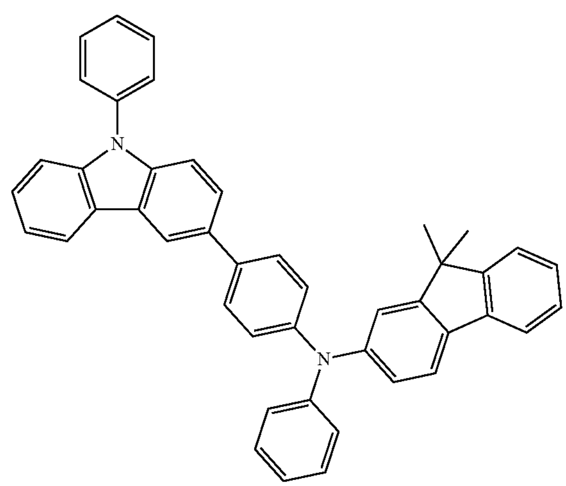

HT2
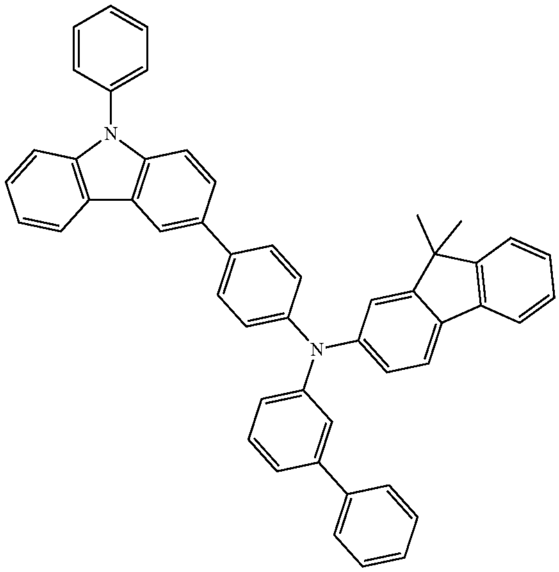
HT3
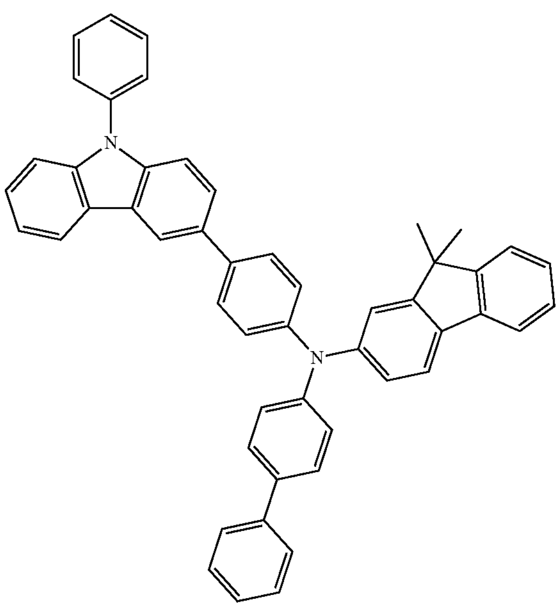
HT4
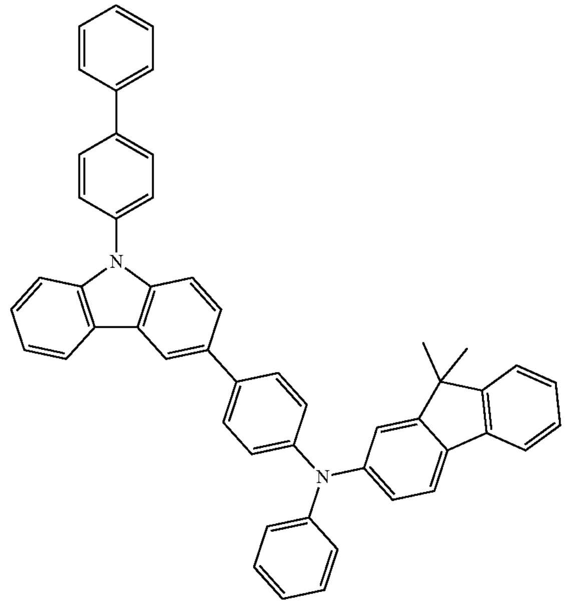
HT5
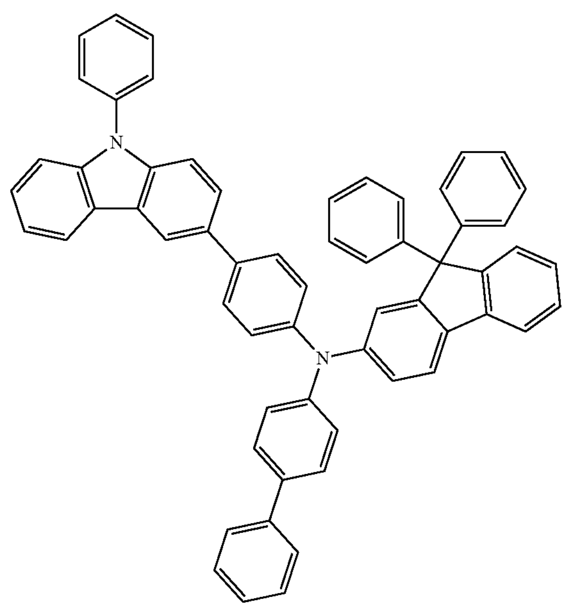

HT6
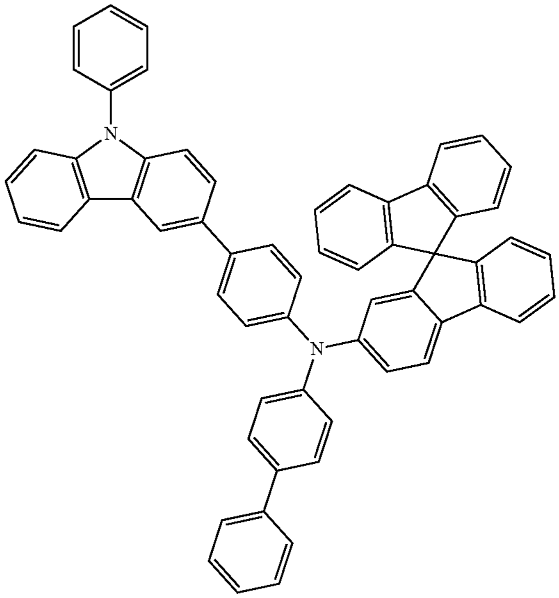
HT7
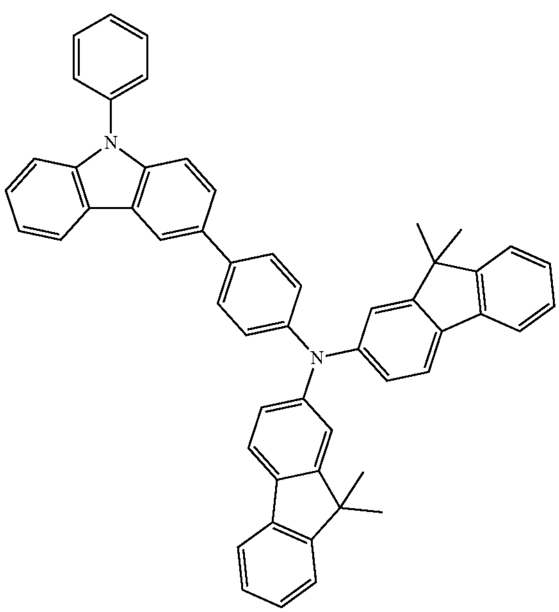
HT8
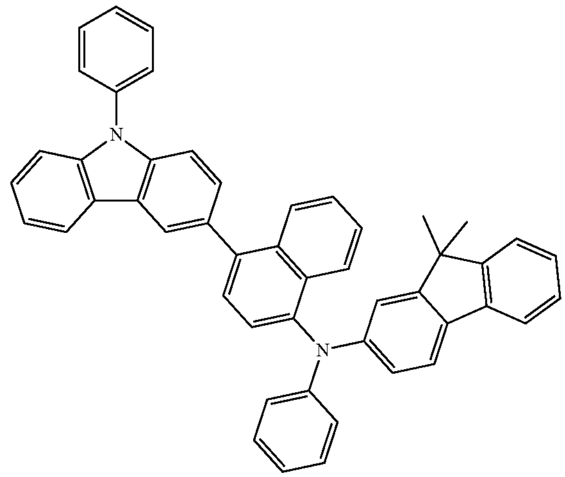
HT9
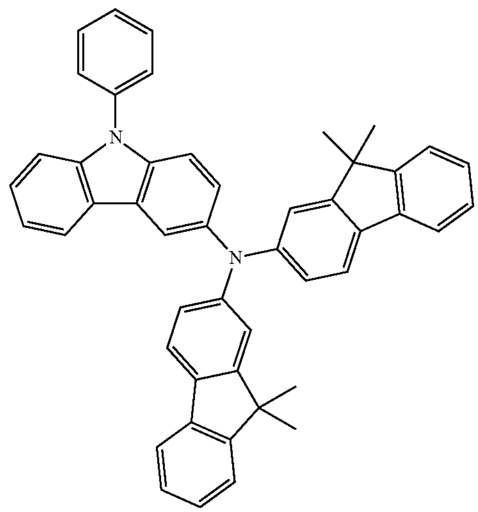
HT10
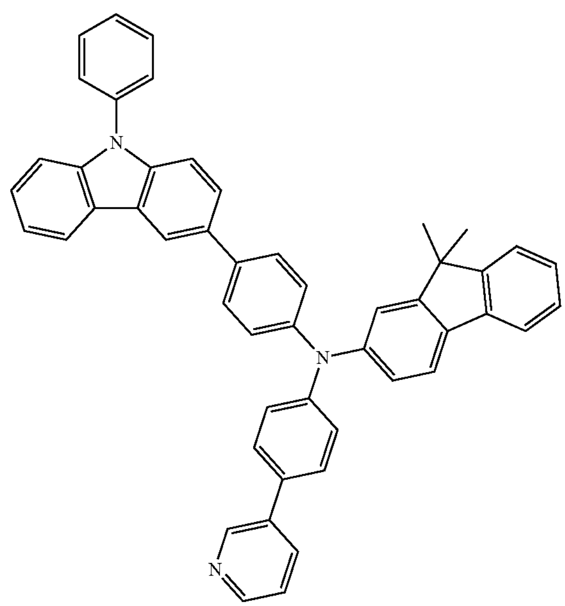

-continued
HT11
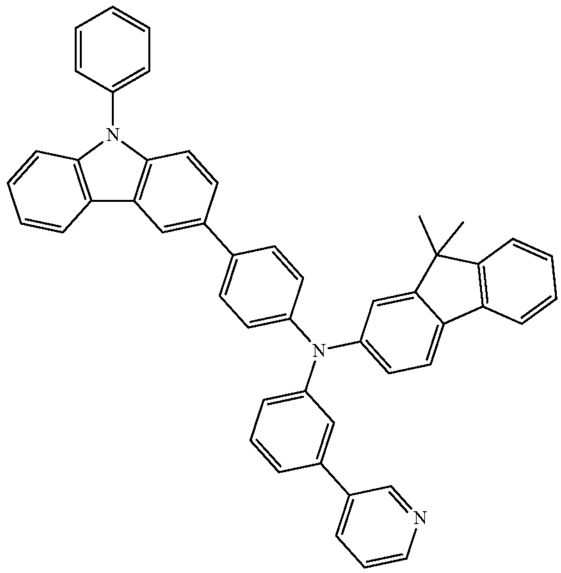
HT12
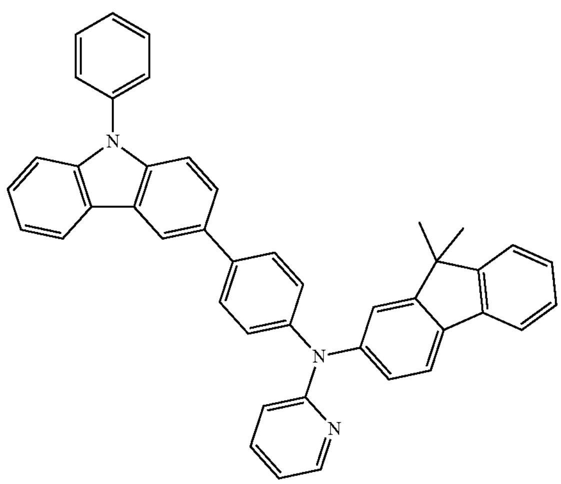
HT13
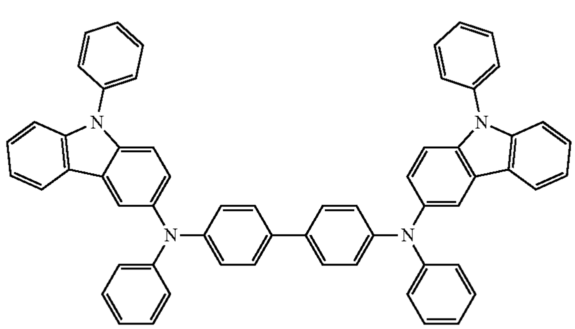
-continued
HT14
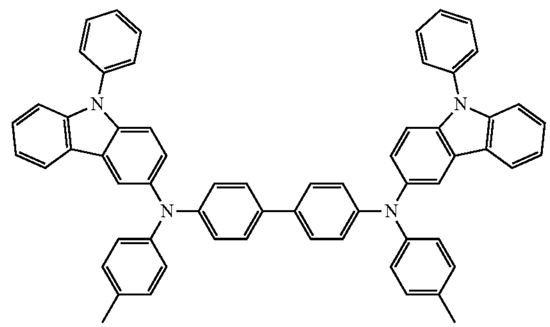
HT15
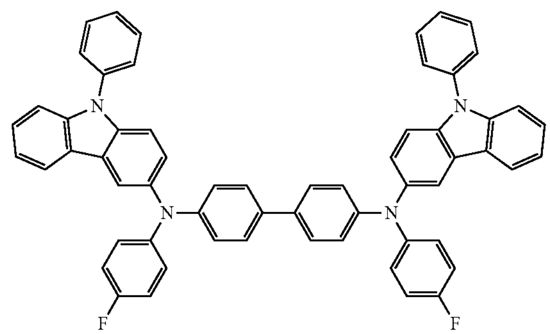
HT16
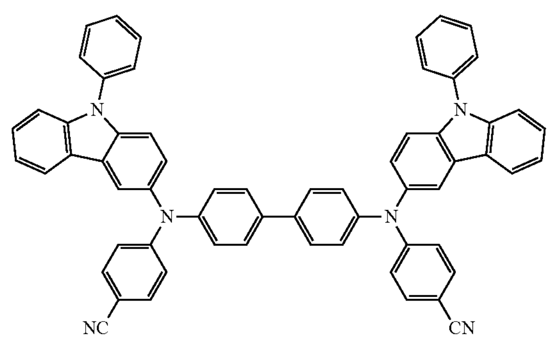
HT17
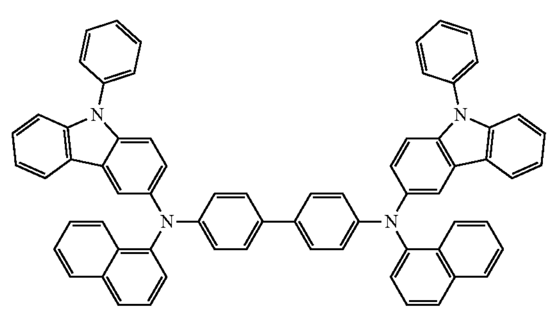

-continued

HT18

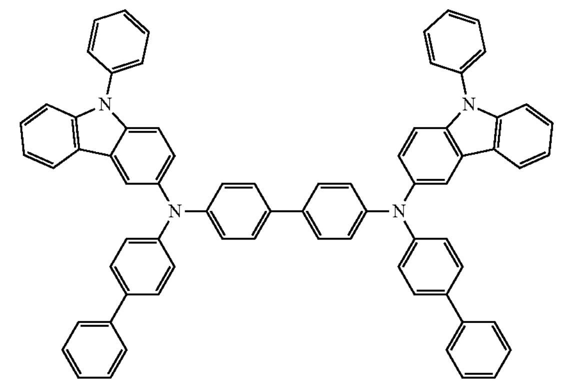

HT19

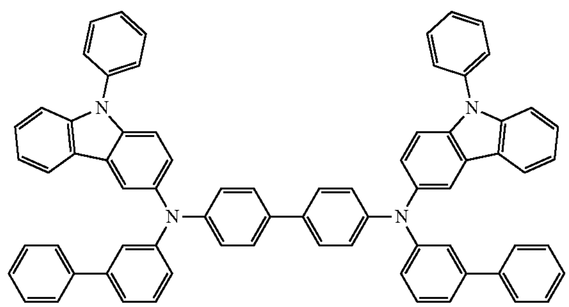

HT20

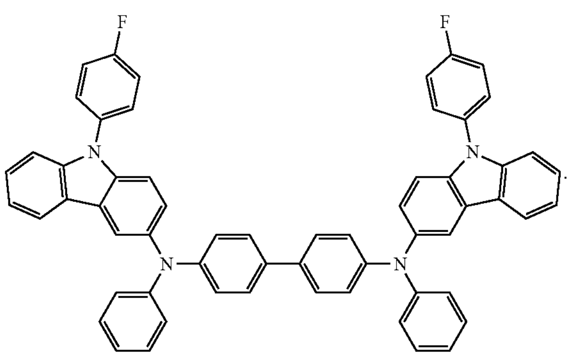

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. While not wishing to be bound by theory, it is understood that when the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto.

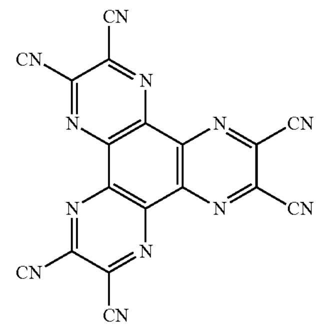

HT-D1

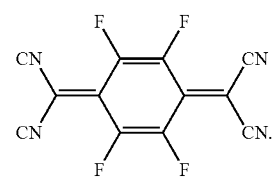

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

-continued
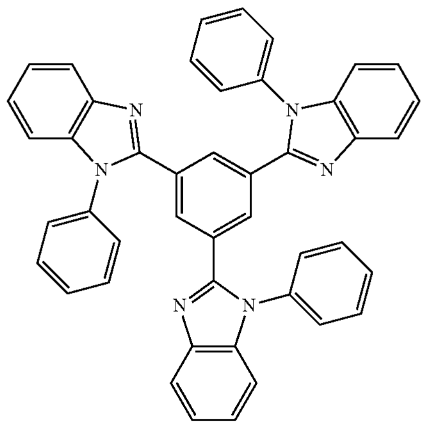
TPBi
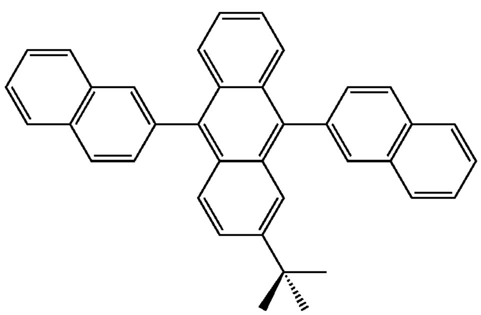
TBADN
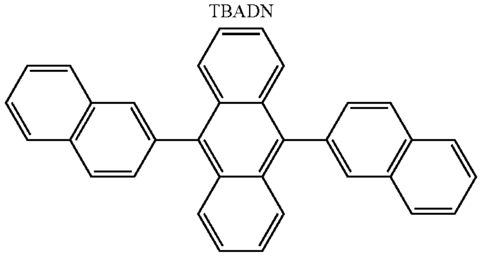
ADN
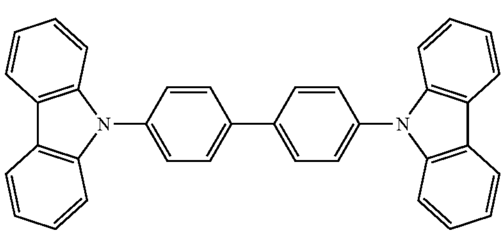
CBP
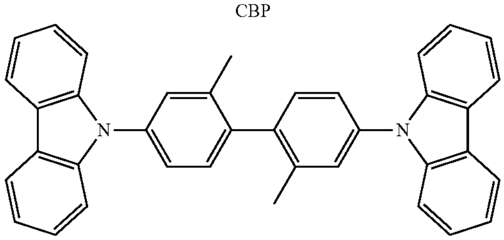
CDBP
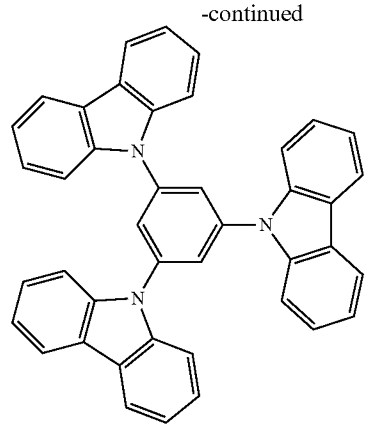
TCP
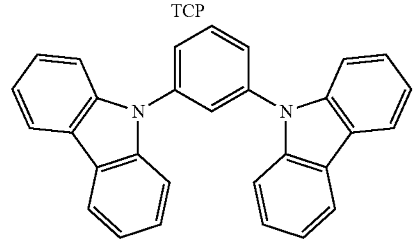
mCP
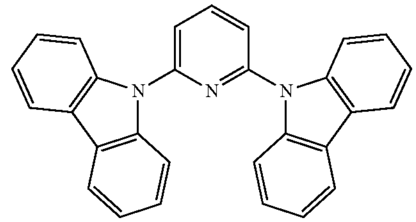
H50
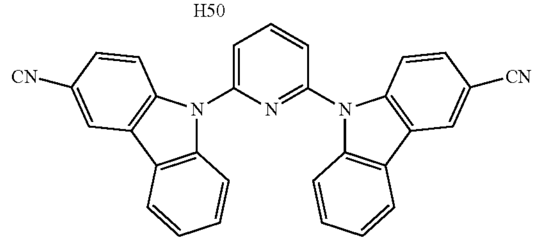
H51
In one or more embodiments, the host may further include a compound represented by Formula 301 below.
Formula 301
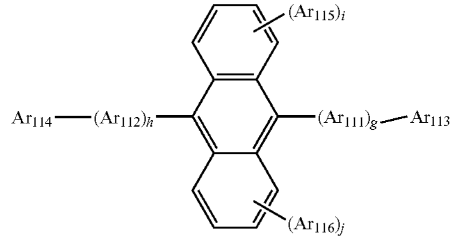
$Ar_{111}$ and $Ar_{112}$ in Formula 301 may each independently be selected from:
a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ and $Ar_{116}$ in Formula 301 may each independently be selected from a $C_1$-$C_{10}$ alkyl group, substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

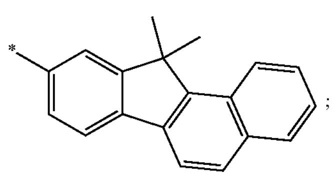 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

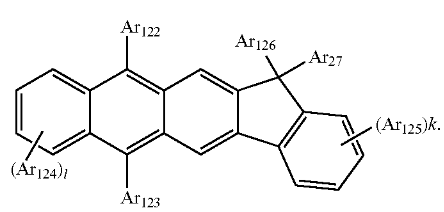

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, BPhen, and BAlq but embodiments of the present disclosure are not limited thereto.

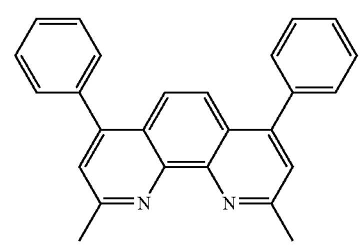

BCP

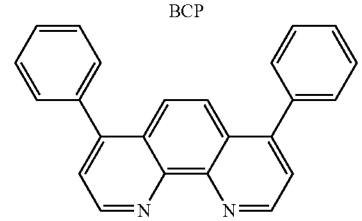

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have excellent hole blocking characteristics without a substantial increase in driving voltage.

The electron transport layer may further include at least one selected from BCP, BPhen, $Alq_3$, BAlq, TAZ, and NTAZ.
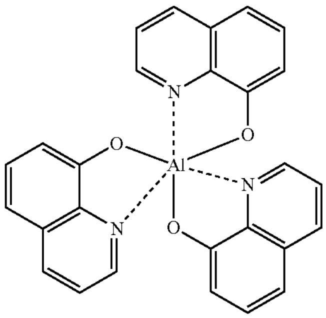
$Alq_3$
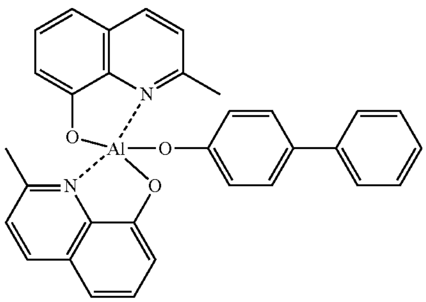
BAlq
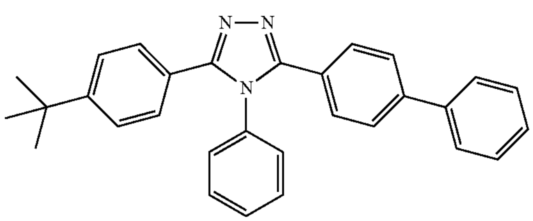
TAZ
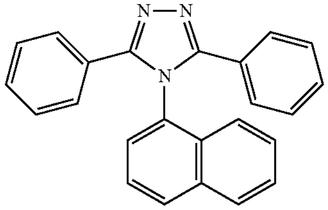
NTAZ
In one or more embodiments, the electron transport layer may include at least one of ET1 to ET25, but are not limited thereto:
ET1
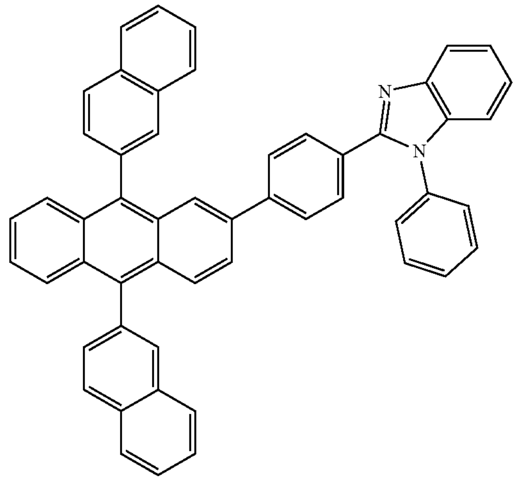
ET2
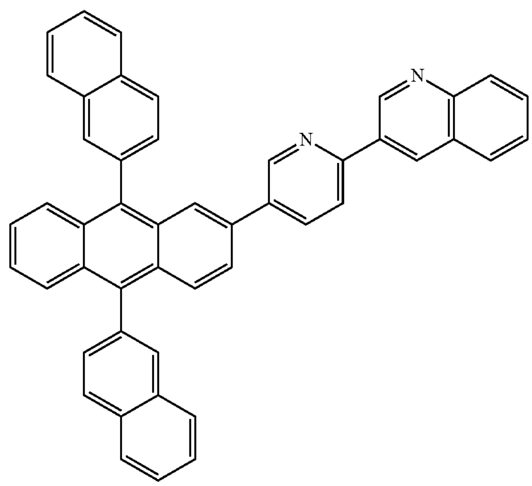
ET3
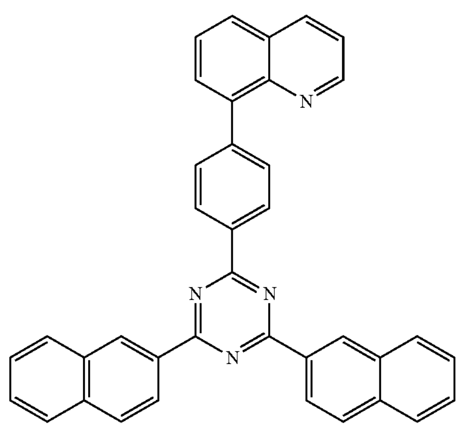

-continued
ET4
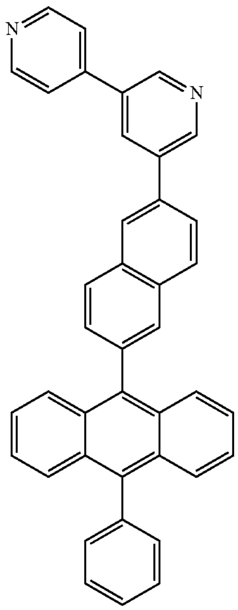
ET5
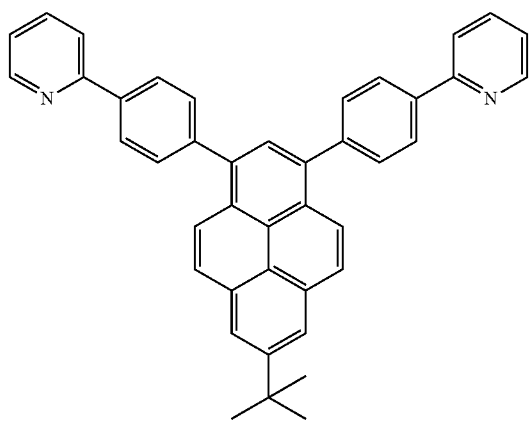
ET6
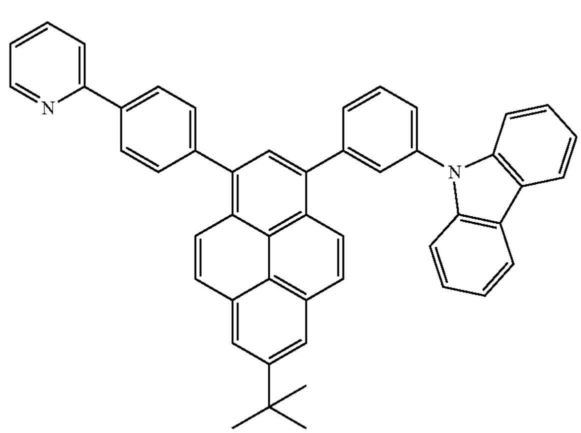
-continued
ET7
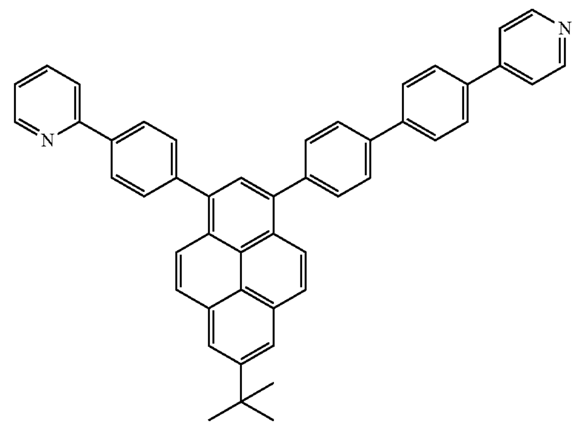
ET8
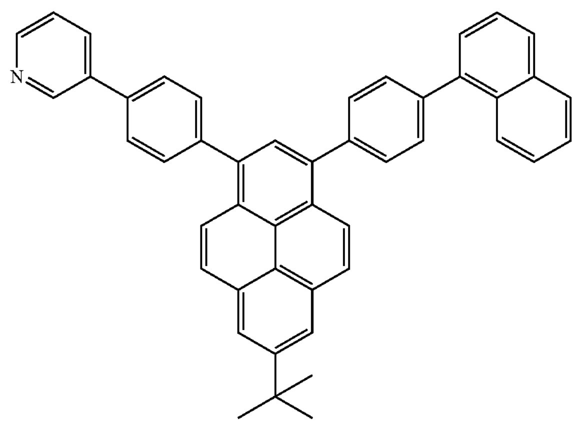
ET9
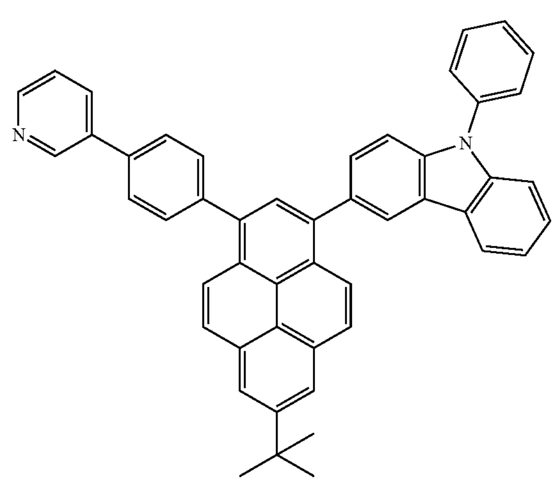

-continued
ET10
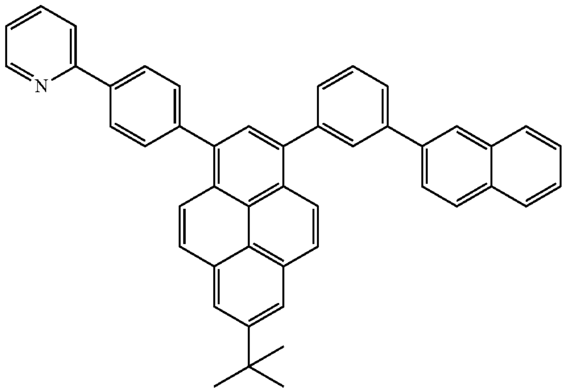
ET11
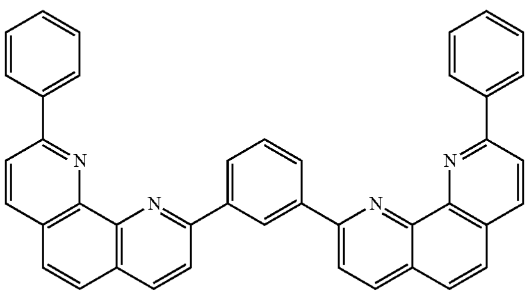
ET12
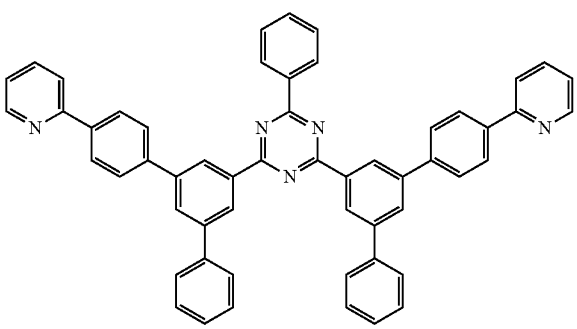
ET13
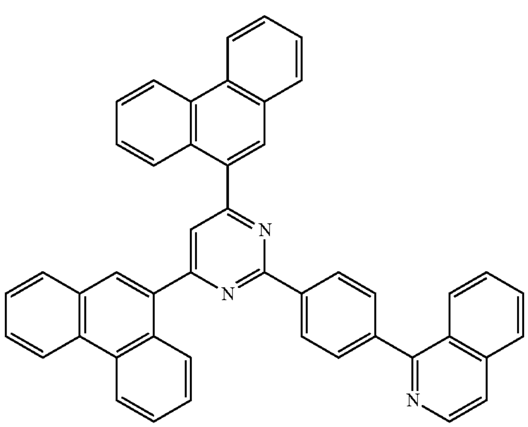
-continued
ET14
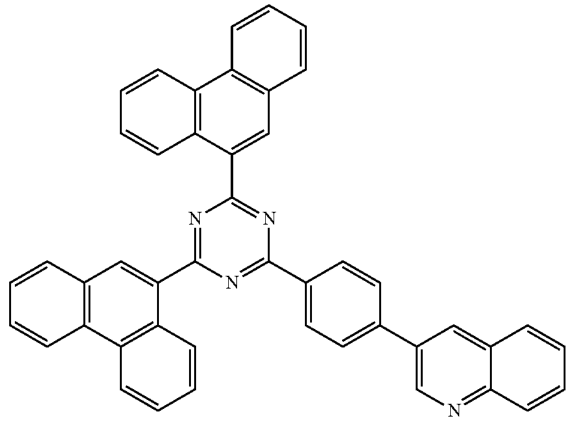
ET15
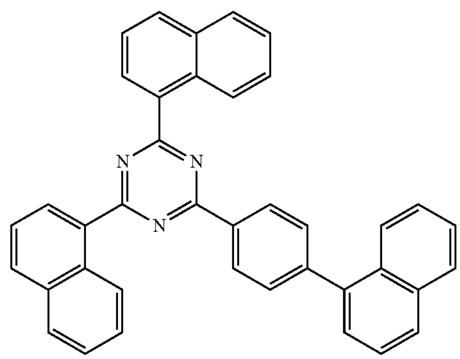
ET16
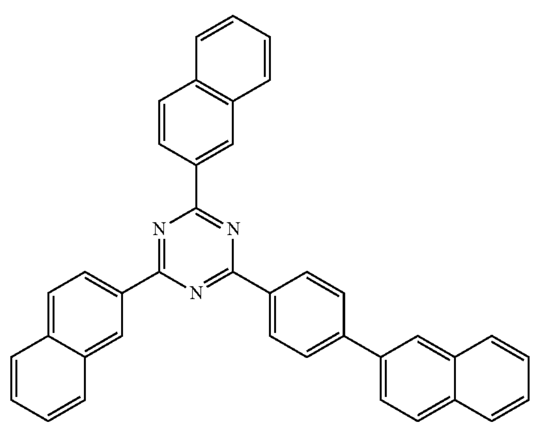

ET17
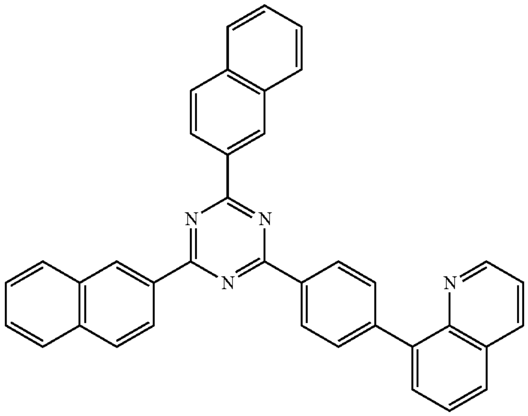
ET18
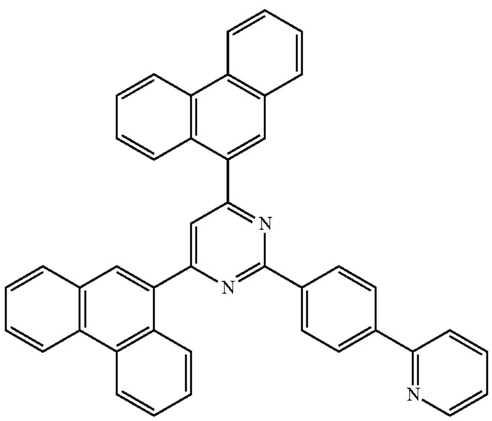
ET19
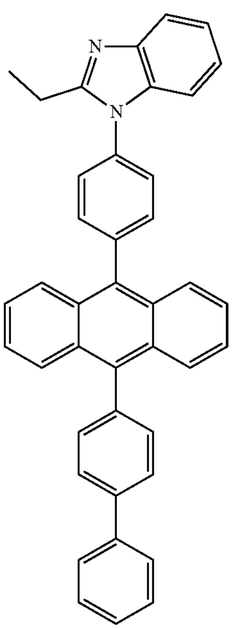
ET20
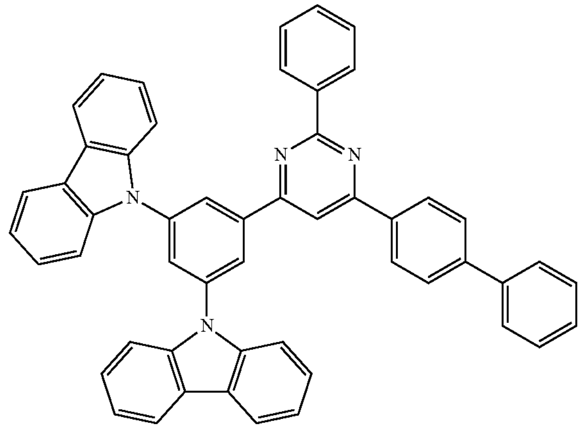
ET21
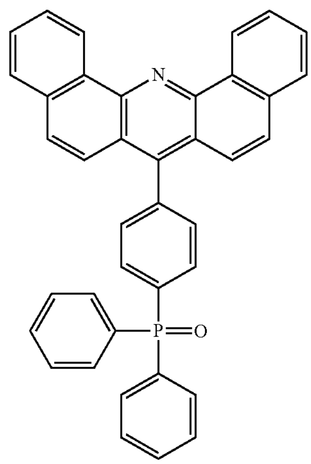
ET22
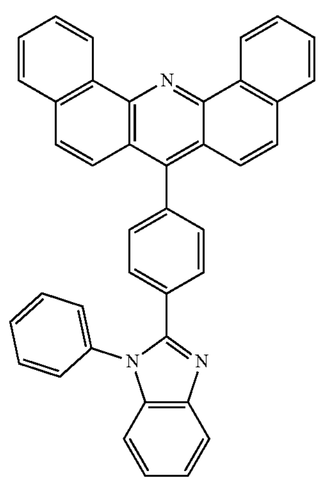

-continued

ET23

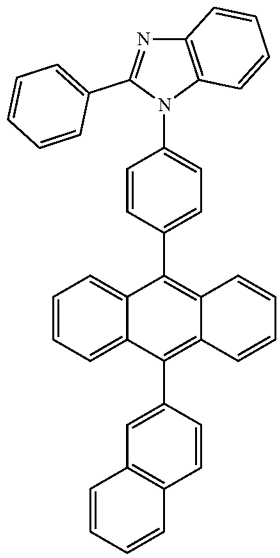

ET24

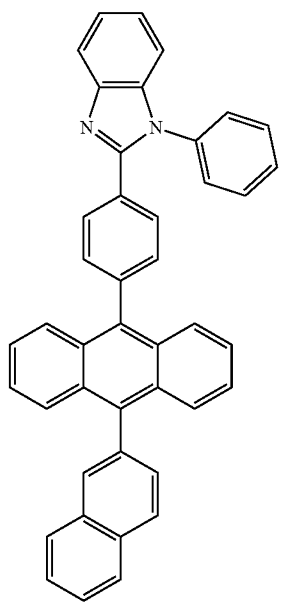

ET25

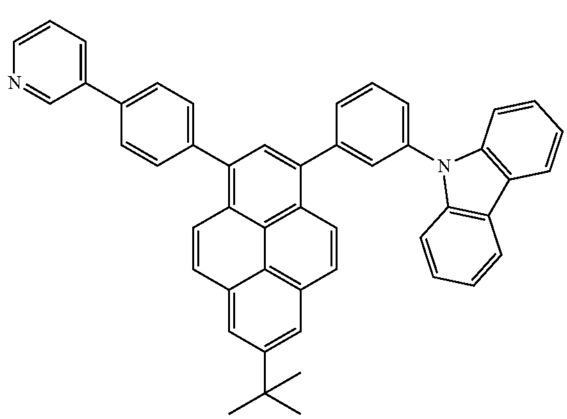

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2.

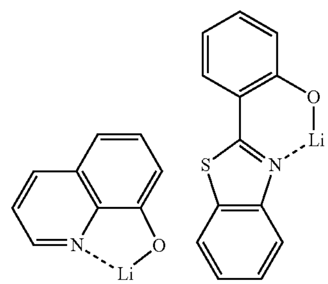

ET-D1 ET-D2

The electron transport region may include an electron injection layer (EIL) that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, and, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as that of the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as that of the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as that of the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as that of the $C_3$-$C_{10}$ cycloalkyl group.

The term "$C_1$-$C_1o$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other. The $C_7$-$C_{60}$ alkylaryl group refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a heterocyclic aromatic system that has at least one heteroatom selected from N, O, P, and S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other. The $C_2$-$C_{60}$ alkylheteroaryl group refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_7$-$C_{60}$ aryl alkyl group" as used herein indicates -$A_{104}A_{105}$ (wherein $A_{105}$ is the $C_6$-$C_{59}$ aryl group and $A_{104}$ is the $C_1$-$C_{53}$ alkylene group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

at least one of substituents of the substituted $C_5$-$C_{30}$ carbocyclic group, substituted $C_1$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_7$-$C_{60}$ alkylaryl group, substituted $C_6$-$C_{60}$ aryloxy group, substituted $C_6$-$C_{60}$ arylthio group, substituted $C_7$-$C_{60}$ arylalkyl group, substituted $C_1$-$C_{60}$ heteroaryl group, substituted $C_1$-$C_{60}$ heteroaryloxy group, substituted $C_1$-$C_{60}$ heteroarylthio group, substituted $C_2$-$C_{60}$ heteroarylalkyl group, substituted $C_2$-$C_{60}$ alkylheteroaryl group, substituted monovalent non-aromatic condensed polycyclic group, and substituted monovalent non-aromatic condensed heteropolycyclic group is selected from:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, and $—P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, and $—P(=O)(Q_{28})(Q_{29})$; and $—N(Q_{31})(Q_{32})$, $—Si(Q_{33})(Q_{34})(Q_{35})$, $—B(Q_{36})(Q_{37})$, and $—P(=O)(Q_{38})(Q_{39})$;

wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 3

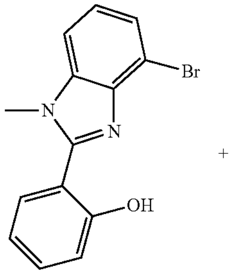

3-A

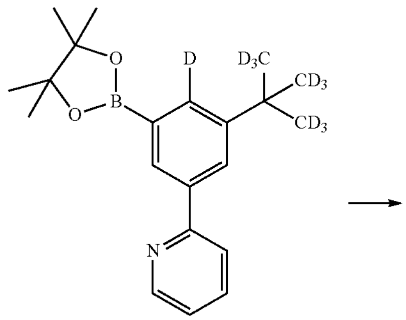

3-B

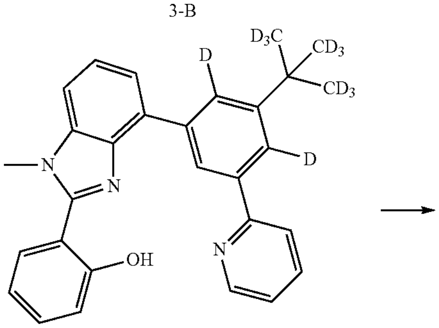

3-C

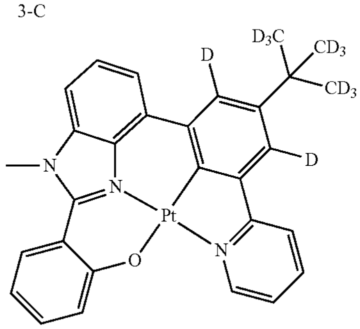

3

Synthesis of Intermediate 3-C 2 grams (g) (6.60 millimoles, mmol) of starting material 3-A, 2.53 g (7.26 mmol, 1.1 equivalents, equiv.) of starting material 3-B, 0.53 g (0.46 mmol, 0.07 equiv.) of tetrakis (triphenylphosphine)palladium (0)), and 2.74 g (19.79 mmol, 3 equiv.) of potassium carbonate were mixed with 48 mL of a mixture including tetrahydrofuran (THF) and $H_2O$ at a ratio of 3:1, and the resulting mixture was refluxed overnight. The obtained resultant was cooled to room temperature, and the precipitate was removed therefrom to obtain a filtrate. The filtrate was washed with ethylene acetate (EA)/$H_2O$, and purified by column chromatography to produce 1.7 g (yield of 78%) of Intermediate 3-C. The obtained compound was identified by LC-MS.

LC-MS m/z=444.28 $(M+H)^+$

Synthesis of Compound 3

1.5 g (3.37 mmol) of Intermediate 3-C and 1.68 g (4.05 mmol, 1.2 equiv.) of $K_2PtCl_4$ were mixed with a mixture including 80 mL of AcOH (acetic acid) and 4 mL of $H_2O$, and then the resulting mixture was refluxed overnight. The obtained resultant was cooled to room temperature and filtered to obtain the precipitate, which was then mixed with methylene chloride (MC) and washed with $H_2O$, and purified by column chromatography to produce 1.1 g (yield 51%) of Compound 3. The obtained compound was identified by LC-MS.

LC-MS m/z=637.23 $(M+H)^+$

Synthesis Example 2: Synthesis of Compound 17

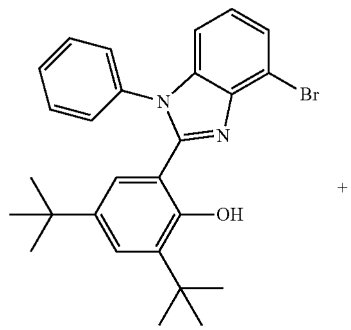

17-A

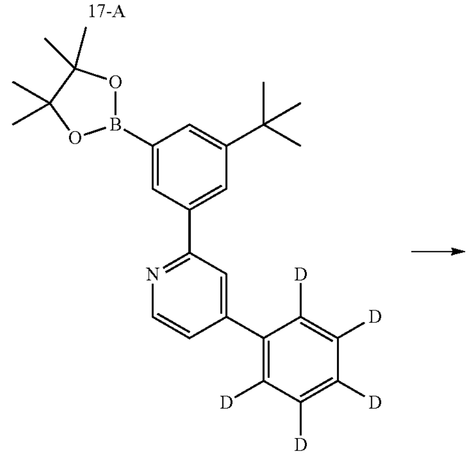

17-B

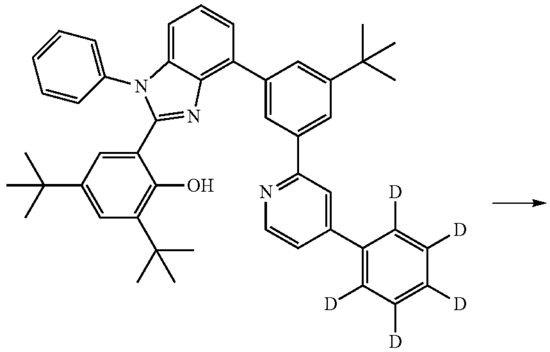

17-C

-continued

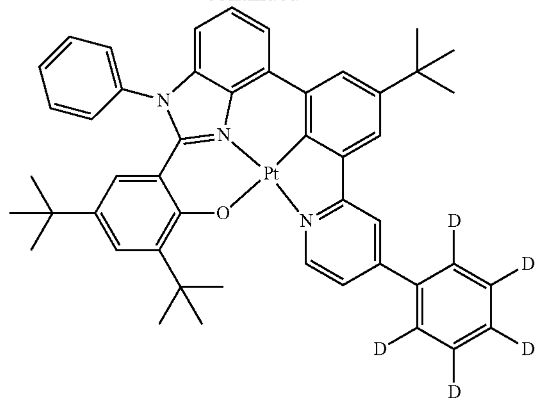

17

Synthesis of Intermediate 17-C 2 g (4.19 mmol) of starting material 17-A, 1.93 g (4.61 mmol, 1.1 equiv.) of starting material 17-B, 0.34 g (0.29 mmol, 0.07 equiv.) of tetrakis(triphenylphosphine)palladium (0), and 1.74 g (12.57 mmol, 3 equiv.) of potassium carbonate were mixed with 30 mL of a mixture including THF and $H_2O$ at a ratio of 3:1, and the resulting mixture was refluxed overnight. The obtained resultant was cooled to room temperature, and the precipitate was removed therefrom to obtain a filtrate. The filtrate was washed with EA/$H_2O$, and purified by column chromatography to produce 1.9 g (yield 66%) of Intermediate 17-C. The obtained compound was identified by LC-MS.

LC-MS m/z=688.42 (M+H)

Synthesis of Compound 17

1.8 g (2.61 mmol) of Intermediate 17-C and 1.3 g (3.14 mmol, 1.2 equiv.) of $K_2PtCl_4$ were mixed with a mixture including 65 mL of AcOH and 3 mL of $H_2O$, and the resulting mixture was refluxed overnight. The obtained resultant was cooled to room temperature and filtered to obtain the precipitate, which was then mixed with MC and washed with $H_2O$, and purified by column chromatography to produce 1.41 g (yield of 61%) of Compound 17. The obtained compound was identified by LC-MS.

LC-MS m/z=881.37 $(M+H)^+$

Synthesis Example 3: Synthesis of Compound 24

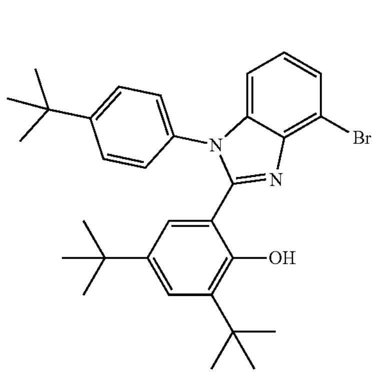

24-A

+

-continued

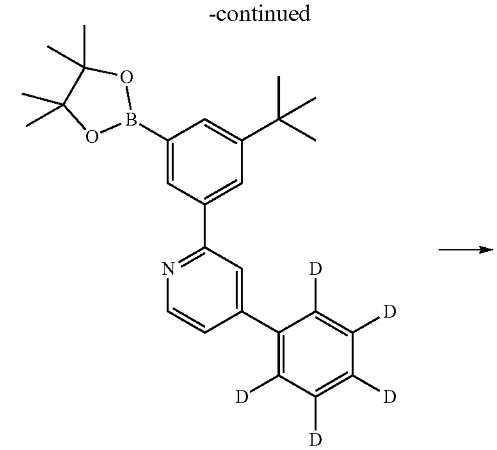

24-B

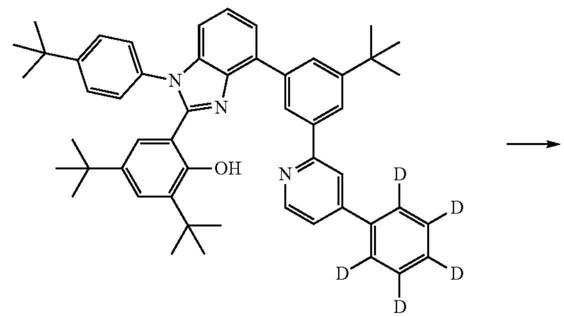

24-C

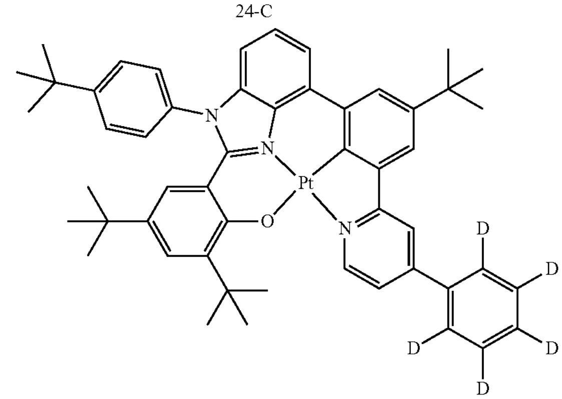

24

Synthesis of Intermediate 24-C 2 g (3.75 mmol) of starting material 24-A, 1.73 g (4.12 mmol, 1.1 equiv.) of starting material 24-B, 0.30 g (0.26 mmol, 0.07 equiv.) of tetrakis(triphenylphosphine)palladium (0), and 1.82 g (11.25 mmol, 3 equiv.) of potassium carbonate were mixed with 27 mL of a mixture including THF and $H_2O$ at a ratio of 3:1, and the resulting mixture was refluxed overnight. The obtained resultant was cooled to room temperature, and the precipitate was removed therefrom to obtain a filtrate. The filtrate was washed with EA/$H_2O$, and purified by column chromatography to produce 1.9 g (yield 68%) of Intermediate 24-C. The obtained compound was identified by LC-MS.

LC-MS m/z=744.48 $(M+H)^+$

Synthesis of Compound 24

1.7 g (2.28 mmol) of Intermediate 24-C and 1.3 g (3.14 mmol, 1.2 equiv.) of $K_2PtCl_4$ were mixed with a mixture including 57 mL of AcOH and 3 mL of $H_2O$, and the resulting mixture was refluxed overnight. The obtained resultant was cooled to room temperature and filtered to obtain the precipitate, which was then mixed with MC and washed with $H_2O$, and purified by column chromatography to produce 1.41 g (yield of 65%) of Compound 24. The obtained compound was identified by LC-MS.

LC-MS m/z=937.43 $(M+H)^+$

Synthesis Example 4: Synthesis of Compound 27

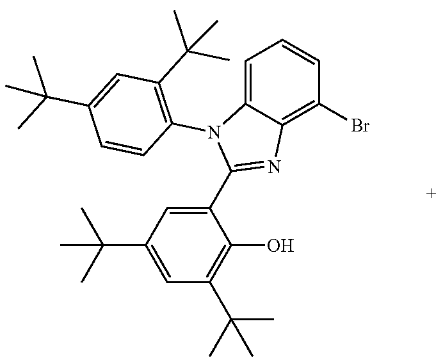

27-A

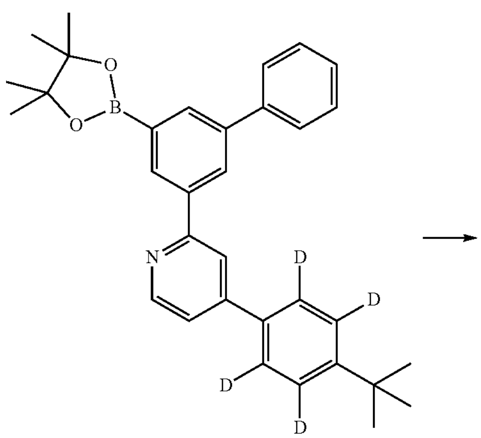

27-B

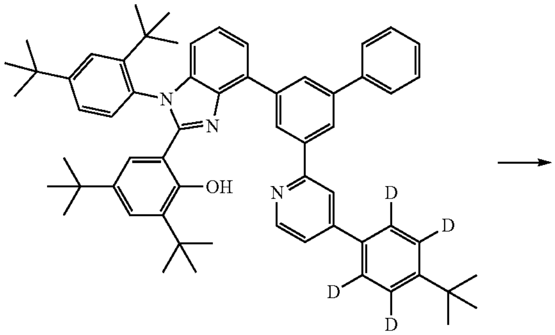

27-C

-continued

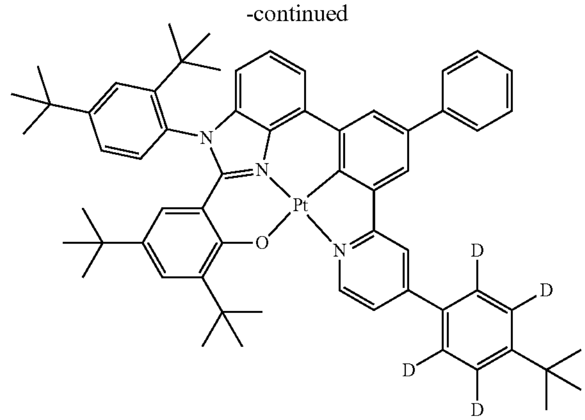

27

Synthesis of Intermediate 27-C 2 g (3.39 mmol) of starting material 27-A, 1.84 g (3.73 mmol, 1.1 equiv.) of starting material 27-B, 0.27 g (0.24 mmol, 0.07 equiv.) of tetrakis(triphenylphosphine)palladium (0), and 1.41 g (10.18 mmol, 3 equiv.) of potassium carbonate were mixed with 27 mL of a mixture including THF and $H_2O$ at a ratio of 3:1, and the resulting mixture was refluxed overnight. The obtained resultant was cooled to room temperature, and the precipitate was removed therefrom to obtain a filtrate. The filtrate was washed with EA/$H_2O$, and purified by column chromatography to produce 2.2 g (yield of 74%) of Intermediate 27-C. The obtained compound was identified by LC-MS.

LC-MS m/z=875.57 $(M+H)^+$

Synthesis of Compound 27

1.5 g (1.71 mmol) of Intermediate 27-C and 0.85 g (3.14 mmol, 1.2 equiv.) of $K_2PtCl_4$ were mixed with a mixture including 43 mL of AcOH and 2 mL of $H_2O$, and the resulting mixture was refluxed overnight. The obtained resultant was cooled to room temperature and filtered to obtain the precipitate, which was then mixed with MC and washed with $H_2O$, and purified by column chromatography to produce 1.1 g (yield of 60%) of Compound 27. The obtained compound was identified by LC-MS.

LC-MS m/z=1068.52 $(M+H)^+$

Synthesis Example 5: Synthesis of Compound 31

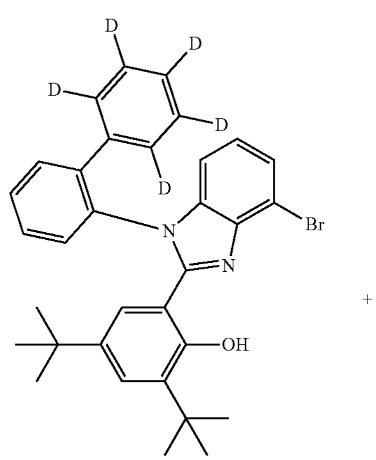

31-A

-continued

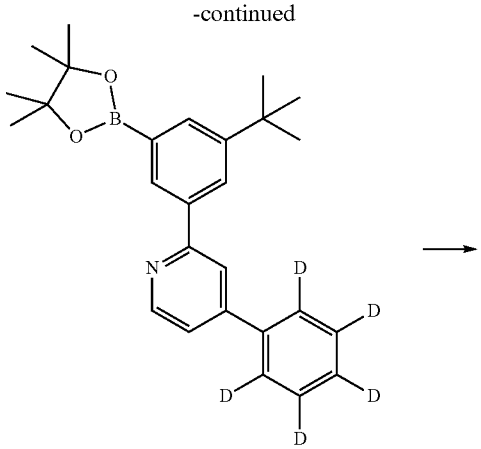

31-B

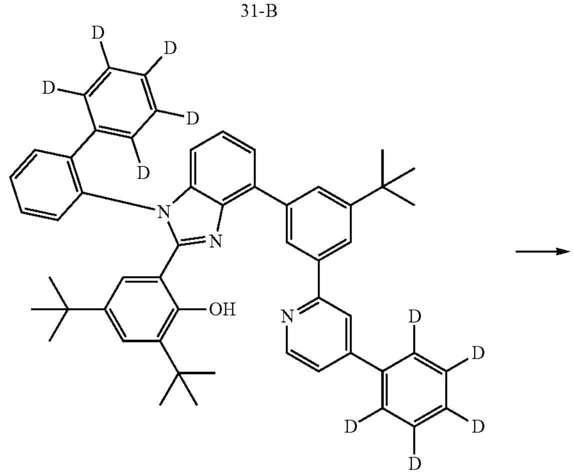

31-C

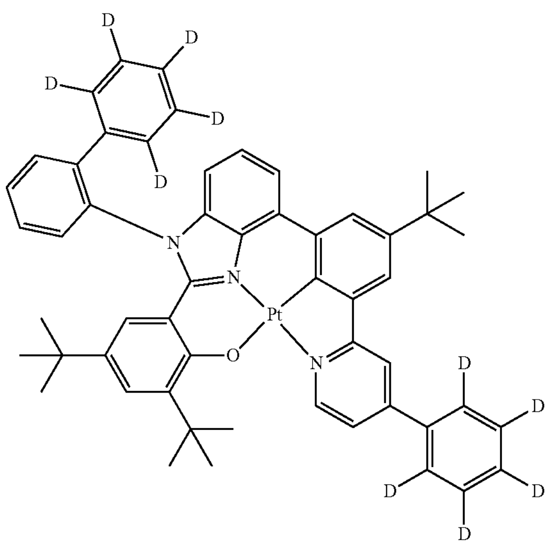

31

Synthesis of Intermediate 31-C 2 g (3.58 mmol) of starting material 31-A, 1.65 g (3.73 mmol, 1.1 equiv.) of starting material 31-B, 0.29 g (0.25 mmol, 0.07 equiv.) of tetrakis(triphenylphosphine)palladium (0), and 1.48 g (10.74 mmol, 3 equiv.) of potassium carbonate were mixed with 26 mL of a mixture including THF and $H_2O$ at a ratio of 3:1, and the resulting mixture was refluxed overnight. The obtained resultant was cooled to room temperature, and the precipitate was removed therefrom to obtain a filtrate. The filtrate was washed with EA/$H_2O$, and purified by column chromatography to produce 1.8 g (yield of 65%) of Intermediate 31-C. The obtained compound was identified by LC-MS.

LC-MS m/z=769.48 $(M+H)^+$

Synthesis of Compound 31

1.7 g (2.21 mmol) of Intermediate 31-C and 1.1 g (2.65 mmol, 1.2 equiv.) of $K_2PtCl_4$ were mixed with a mixture including 55 mL of AcOH and 3 mL of $H_2O$, and the resulting mixture was refluxed overnight. The obtained resultant was cooled to room temperature and filtered to obtain the precipitate, which was then mixed with MC and washed with $H_2O$, and purified by column chromatography to produce 1.2 g (yield of 56%) of Compound 31. The obtained compound was identified by LC-MS.

LC-MS m/z=962.43 $(M+H)^+$

Synthesis Example 6: Synthesis of Compound 99

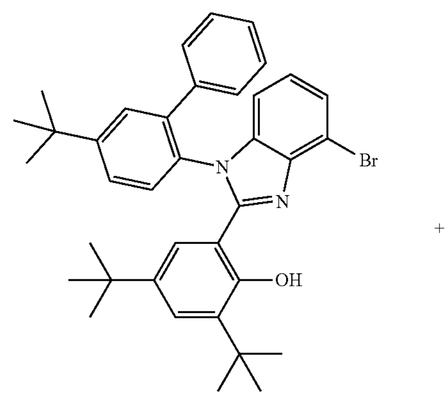

99-A

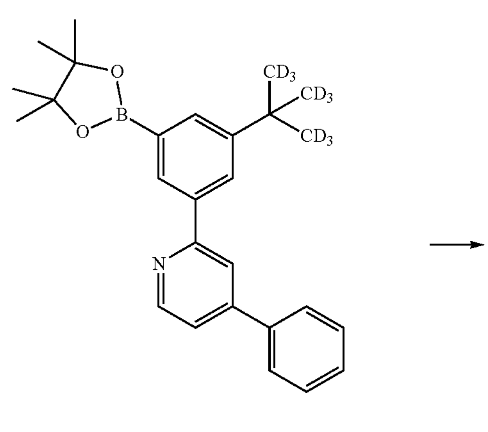

99-B

-continued

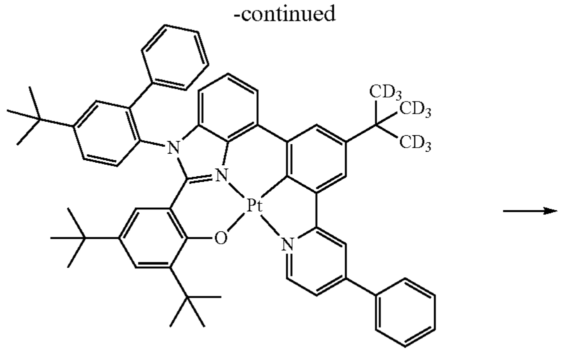

99-C

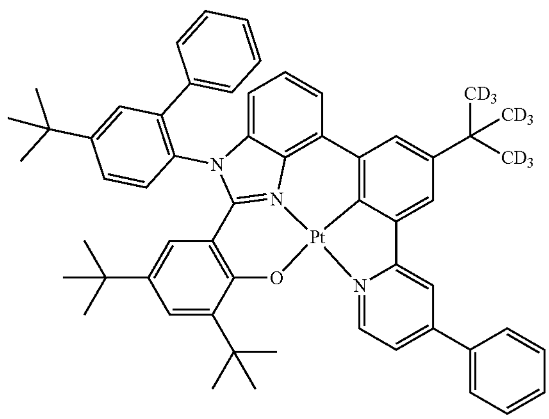

99

Synthesis of Intermediate 99-C 2 g (3.28 mmol) of starting material 99-A, 1.52 g (3.61 mmol, 1.1 equiv.) of starting material 99-B, 0.27 g (0.23 mmol, 0.07 equiv.) of tetrakis(triphenylphosphine)palladium(0), and 1.36 g (9.84 mmol, 3 equiv.) of potassium carbonate were mixed with 36 mL of a mixture including THF and $H_2O$ at a ratio of 3:1, and the resultant mixture was refluxed overnight. The obtained result was cooled to room temperature, and then, the precipitate was removed therefrom to obtain a filtrate. The filtrate was washed with EA/$H_2O$, and column chromatography was performed thereon to complete the production of 2.1 g (yield of 78%) of Intermediate 99-C. The obtained compound was identified by LC-MS.

LC-MS m/z=824.54 $(M+H)^+$

Synthesis of Compound 99

2 g (2.42 mmol) of Intermediate 99-C and 1.21 g (2.91 mmol, 1.2 equiv.) of $K_2PtCl_4$ were mixed with a mixture including 61 mL of AcOH and 3 mL of $H_2O$, and the resultant mixture was refluxed overnight. The obtained result was cooled to room temperature and filtered to obtain the precipitate, which was then mixed with MC and washed with $H_2O$, and column chromatography was performed thereon to complete the production of 1.3 g (yield of 53%) of Compound 99. The obtained compound was identified by LC-MS.

LC-MS m/z=1017.49 $(M+H)^+$

Synthesis Example 7: Synthesis of Compound 157

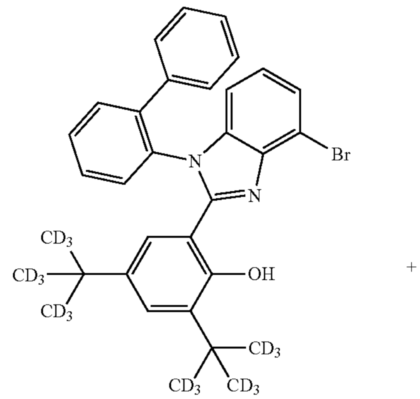

157-A

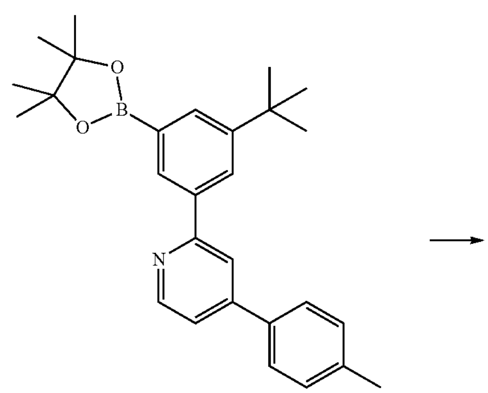

157-B

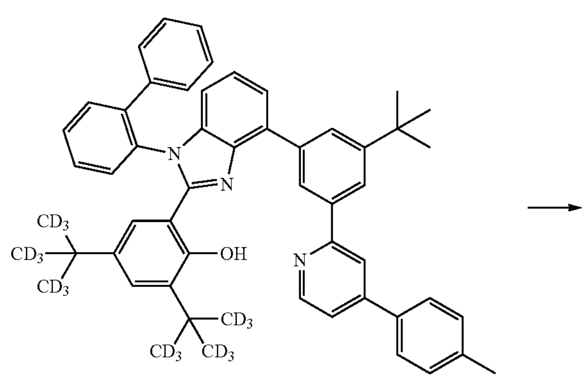

157-C

-continued

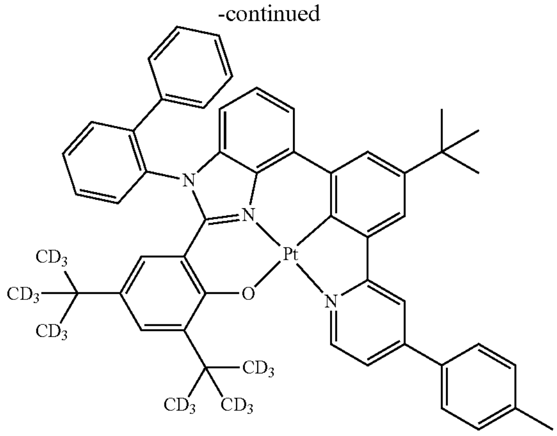

157

Synthesis of Intermediate 157-C 2 g (3.5 mmol) of starting material 157-A, 1.64 g (3.85 mmol, 1.1 equiv.) of starting material 157-B, 0.28 g (0.24 mmol, 0.07 equiv.) of tetrakis(triphenylphosphine)palladium(0), and 1.45 g (10.50 mmol, 3 equiv.) of potassium carbonate were mixed with 38 mL of a mixture including THF and $H_2O$ at a ratio of 3:1, and the resultant mixture was refluxed overnight. The obtained result was cooled to room temperature, and then, the precipitate was removed therefrom to obtain a filtrate. The filtrate was washed with EA/$H_2O$, and column chromatography was performed thereon to complete the production of 2.1 g (yield of 76%) of Intermediate 157-C. The obtained compound was identified by LC-MS.

LC-MS m/z=791.55 $(M+H)^+$

Synthesis of Compound 157

2 g (2.52 mmol) of Intermediate 157-C 1.26 g (3.03 mmol, 1.2 equiv.) of $K_2PtCl_4$ were mixed with a mixture including 63 mL of AcOH and 3 mL of $H_2O$, and the resultant mixture was refluxed overnight. The obtained result was cooled to room temperature and filtered to obtain the precipitate, which was then mixed with MC and washed with $H_2O$, and column chromatography was performed thereon to complete the production of 1.2 g (yield of 48%) of Compound 157. The obtained compound was identified by LC-MS.

LC-MS m/z=984.50 $(M+H)^+$

Synthesis Example 8: Synthesis of Compound 186

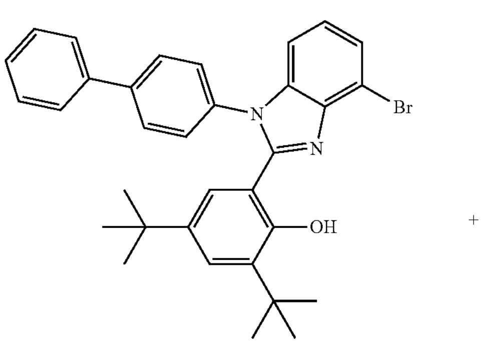

186-A

-continued

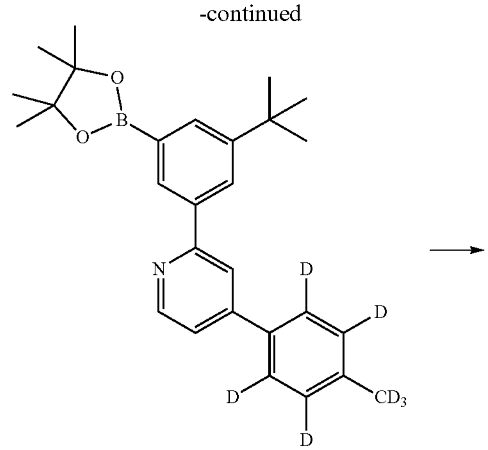

186-B

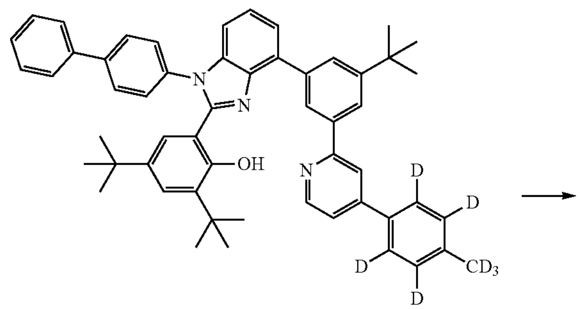

186-C

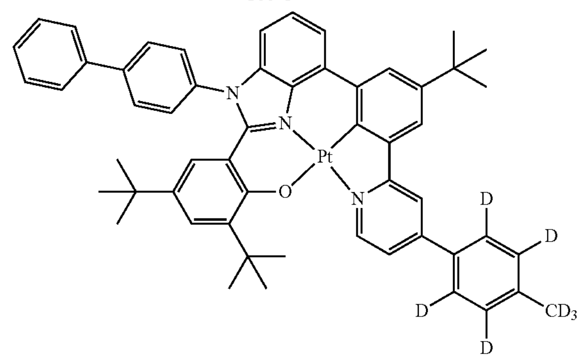

186

Synthesis of Intermediate 186-C 2 g (3.61 mmol) of starting material 186-A, 1.73 g (3.97 mmol, 1.1 equiv.) of starting material 186-B, 0.29 g (0.25 mmol, 0.07 equiv.) of tetrakis(triphenylphosphine)palladium(0), and 1.50 g (10.84 mmol, 3 equiv.) of potassium carbonate were mixed with a mixture including THF and $H_2O$ at a ratio of 3:1, and the resultant mixture was refluxed overnight. The obtained result was cooled to room temperature, and then, the precipitate was removed therefrom to obtain a filtrate. The filtrate was washed with EA/$H_2O$, and column chromatography was performed thereon to complete the production of 1.8 g (yield of 64%) of Intermediate 186-C. The obtained compound was identified by LC-MS.

LC-MS m/z=780.48 $(M+H)^+$

Synthesis of Compound 186

1.5 g (1.92 mmol) of Intermediate 186-C and 0.96 g (2.3 mmol, 1.2 equiv.) of $K_2PtCl_4$ were mixed with a mixture including 48 mL of AcOH and 3 mL of $H_2O$, and the resultant mixture was refluxed overnight. The obtained result was cooled to room temperature and filtered to obtain the precipitate, which was then mixed with MC and washed with $H_2O$, and column chromatography was performed thereon to complete the production of 0.8 g (yield of 43%) of Compound 186. The obtained compound was identified by LC-MS.

LC-MS m/z=973.43 $(M+H)^+$

Synthesis Example 9: Synthesis of Compound 448

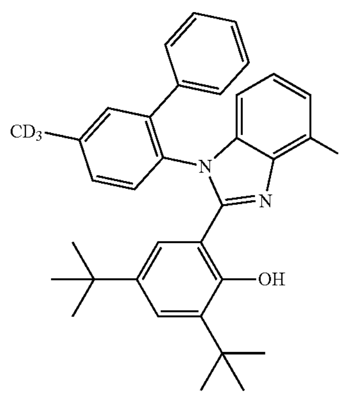

448-A

+

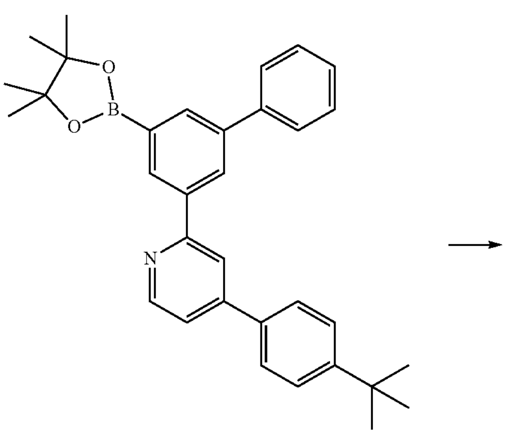

448-B

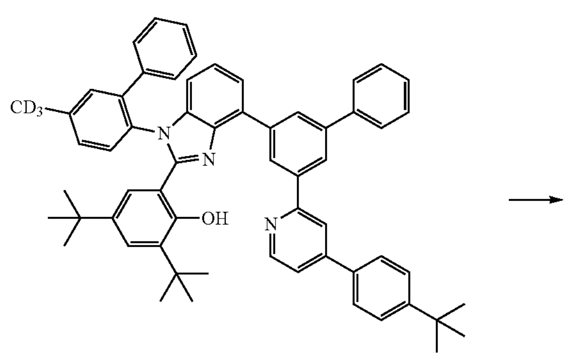

448-C

-continued

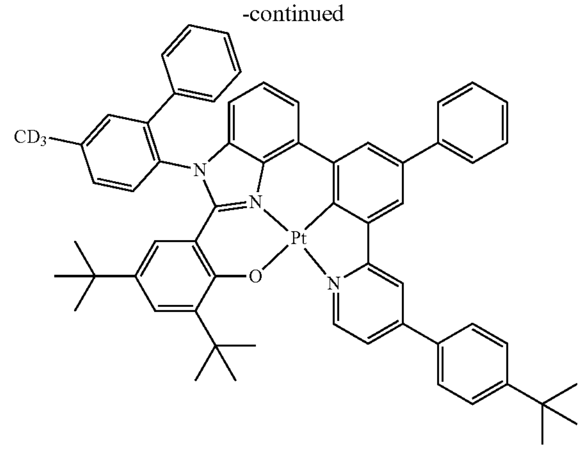

448

Synthesis of Intermediate 448-C 2 g (3.51 mmol) of starting material 448-A, 1.89 g (3.86 mmol, 1.1 equiv.) of starting material 448-B, 0.28 g (0.25 mmol, 0.07 equiv.) of tetrakis(triphenylphosphine)palladium(0), and 1.45 g (10.52 mmol, 3 equiv.) of potassium carbonate were mixed with 38 mL of a mixture including THF and $H_2O$ at a ratio of 3:1, and the resultant was refluxed overnight. The obtained result was cooled to room temperature, and then, the precipitate was removed therefrom to obtain a filtrate. The filtrate was washed with EA/$H_2O$, and column chromatography was performed thereon to complete the production of 2.0 g (yield of 73%) of Intermediate 448-C. The obtained compound was identified by LC-MS.

LC-MS m/z=852.48 $(M+H)^+$

Synthesis of Compound 448

1.8 g (2.11 mmol) of Intermediate 448-C and 1.05 g (2.53 mmol, 1.2 equiv.) of $K_2PtCl_4$ were mixed with a mixture including 53 mL of AcOH and 3 mL of $H_2O$, and the resultant mixture was refluxed overnight. The obtained result was cooled to room temperature and filtered to obtain the precipitate, which was then mixed with MC and washed with $H_2O$, and column chromatography was performed thereon to complete the production of 1.1 g (yield of 50%) of Compound 448. The obtained compound was identified by LC-MS.

LC-MS m/z=1045.43 $(M+H)^+$

Evaluation Example 1: Evaluation of Photoluminescence Quantum Yields (PLQY)

PMMA in $CH_2Cl_2$ solution, 5 percent by weight (wt %) of CBP, and Compound 3 were mixed, and the resultant was coated on a quartz substrate by using a spin coater, and then, heat-treated in an oven at a temperature of 80° C., and cooled to room temperature to obtain a film.

The PLQY of Compound 3 in film was evaluated by using a Hamamatsu Photonics absolute PL quantum yield measurement system equipped with a xenon light source, a monochromator, a photonic multichannel analyzer, and an integrating sphere, and using PLQY measurement software (Hamamatsu Photonics, Ltd., Shizuoka, Japan), and the same experiment was performed on each of Compounds 17, 24, 27 and 31. Results thereof are shown in Table 2.

TABLE 2
| Compound No. | PLQY |
|---|---|
| 3 | 0.978 |
| 17 | 0.999 |
| 24 | 0.998 |
| 27 | 0.999 |
| 31 | 0.999 |
| 99 | 0.993 |
| 157 | 0.986 |
| 186 | 0.999 |
| 448 | 0.985 |
3
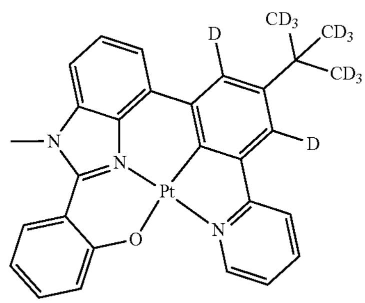
17
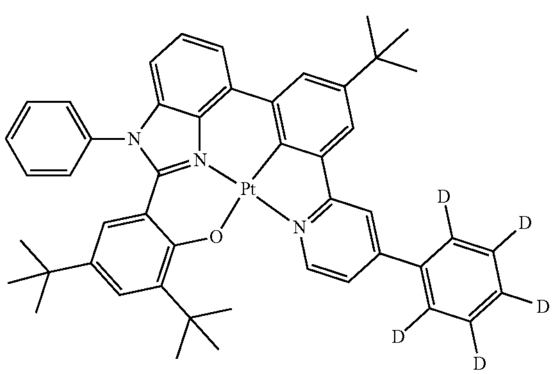
24
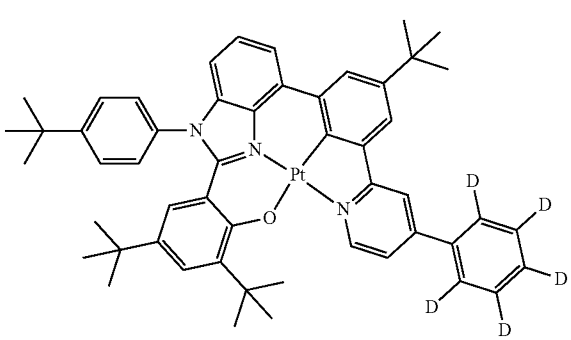
-continued
27
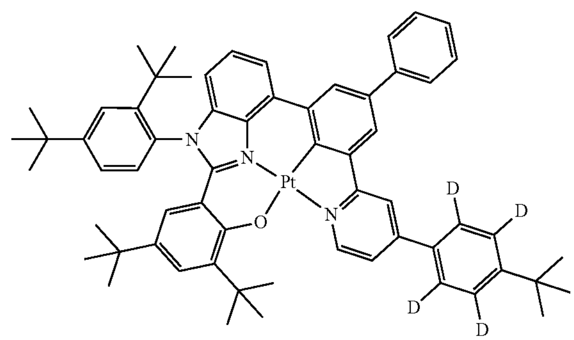
31
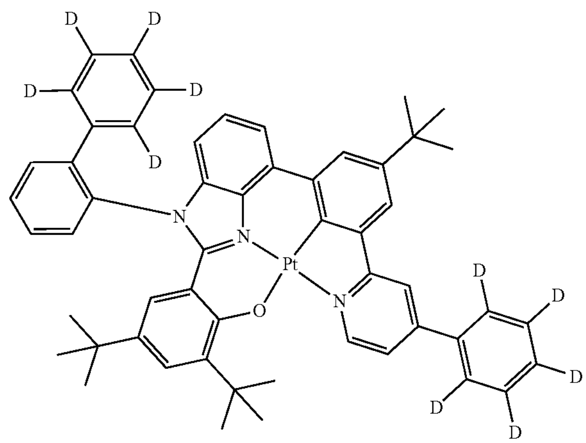
99
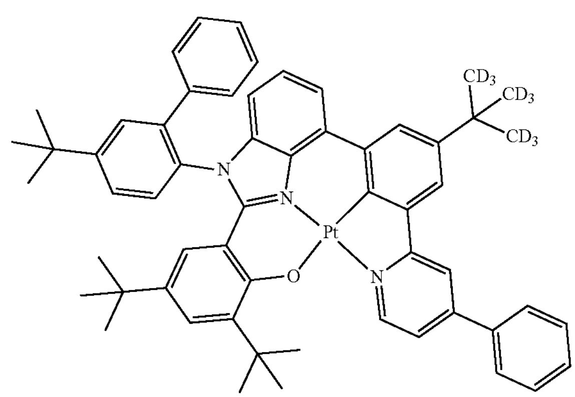
157
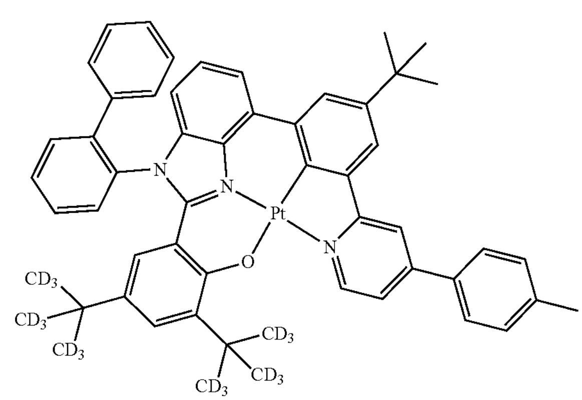

-continued

186

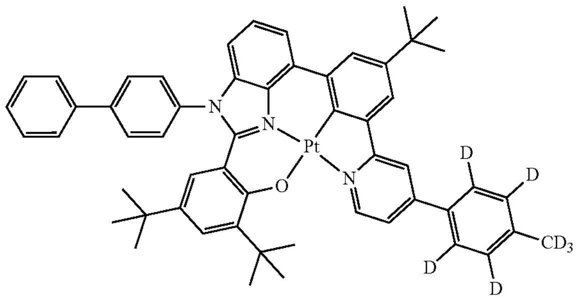

448

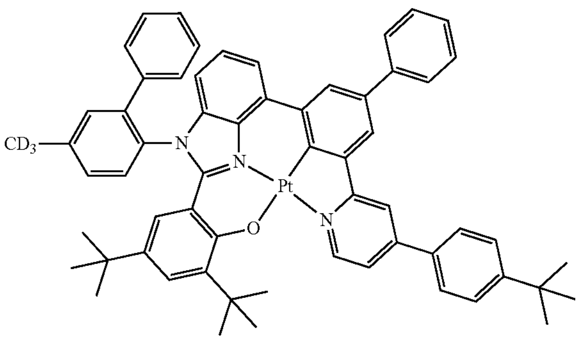

From Table 2, it was confirmed that Compounds 3, 17, 24, 27, 31, 99, 157, 186 and 448 had high PLQY (in film).

Evaluation Example 2: Decay Time Measurement

A quartz substrate washed with chloroform and pure water was prepared, and then, a predetermined material shown in Table 3 was vacuum-(co)deposited at a degree of vacuum of $10^7$ torr to prepare Films 1 to 5 having a thickness of 50 nanometers (nm).

TABLE 3

| Film name | Compound used in film production |
|---|---|
| Film 1 | CBP:Compound 3 (weight ratio of 9:1) |
| Film 2 | CBP:Compound 17 (weight ratio of 9:1) |
| Film 3 | CBP:Compound 24 (weight ratio of 9:1) |
| Film 4 | CBP:Compound 27 (weight ratio of 9:1) |
| Film 5 | CBP:Compound 31 (weight ratio of 9:1) |
| Film 6 | CBP:Compound 99 (weight ratio of 9:1) |
| Film 7 | CBP:Compound 157 (weight ratio of 9:1) |
| Film 8 | CBP:Compound 186 (weight ratio of 9:1) |
| Film 9 | CBP:Compound 448 (weight ratio of 9:1) |

Photoluminescence (PL) spectrum of each of Films 1 to 9 was measured by using FluoTime 300, which is a TRPL measurement system manufactured by PicoQuant Inc. and PLS340 (excitation wavelength=340 nanometers, spectral width=20 nanometers), which is a pumping source of PicoQuant Inc. at room temperature. Then, the main peak of each spectrum was identified, and the number of photons emitted at the wavelength of photon pulse (pulse width=500 picoseconds) applied by PLS340 to each of Films 1 to 9 was repeatedly measured based on time-correlated single photon counting (TCSPC) according to time, thereby obtaining a TRPL curve sufficient for fitting. The obtained result was fitted with two or more exponential decay functions to obtain $T_{decay}$ ($E_x$), that is, decay time of each of Films 1 to 9 (decay time). Results obtained therefrom were shown in Table 4. A function for fitting is as shown in Equation 1, and from among $T_{decay}$ values obtained from each exponential decay function used for fitting, the largest $T_{decay}$ was obtained as $T_{decay}$ ($E_x$). In this regard, the same measurement was performed during the same measurement time as that for obtaining TRPL curve in the dark state (in which pumping signals entering a film are blocked) to obtain a baseline or a background signal curve for use as a baseline for fitting.

TABLE 4

| Film name | Decay time (μs) |
|---|---|
| Film 1 (Compound 3) | 2.340 |
| Film 2 (Compound 17) | 2.081 |
| Film 3 (Compound 24) | 2.010 |
| Film 4 (Compound 27) | 2.174 |
| Film 5 (Compound 31) | 2.002 |
| Film 6 (Compound 99) | 2.228 |
| Film 7 (Compound 157) | 2.470 |
| Film 8 (Compound 186) | 2.323 |
| Film 9 (Compound 448) | 2.371 |

From Table 4, it was confirmed that Compounds 3, 17, 24, 27, 31, 99, 157, 186 and 448 had excellent decay time characteristics.

Example 1

An ITO glass substrate was cut to a size of 50 mm×50 mm×0.5 mm (mm=millimeter) and then, sonicated in acetone iso-propyl alcohol and pure water, each for 15 minutes, and then, washed by exposure to UV ozone for 30 minutes.

Then, m-MTDATA was deposited on an ITO electrode (anode) of the glass substrate at a deposition speed of 1 Angstroms per second (A/sec) to form a hole injection layer having a thickness of 600 Angstroms (Å), and then, α-NPD (NPB) was deposited on the hole injection layer at a deposition speed of 1 Å/sec to form a hole transport layer having a thickness of 250 Å.

Compound 3 (dopant) and CBP (host) were co-deposited on the hole transport layer at a deposition speed of 0.1 Å/sec and a deposition speed of 1 Å/sec, respectively, to form an emission layer having a thickness of 400 Å.

BAlq was deposited on the emission layer at a deposition speed of 1 Å/sec to form a hole blocking layer having a thickness of 50 Å, and $Alq_3$ was deposited on the hole blocking layer to form an electron transport layer having a thickness of 300 Å, and then, LiF was deposited on the electron transport layer to form an electron injection layer having a thickness of 10 Å, and then, Al was vacuum deposited on the electron injection layer to form a second electrode (cathode) having a thickness of 1,200 Å, thereby completing manufacturing of an organic light-emitting device having a structure of ITO/m-MTDATA (600 Å)/α-NPD (250 Å)/CBP+Compound 3 (10%) (400 Å)/BAlq (50 Å)/$Alq_3$ (300 Å)/LiF (10 Å)/Al (1,200 Å).

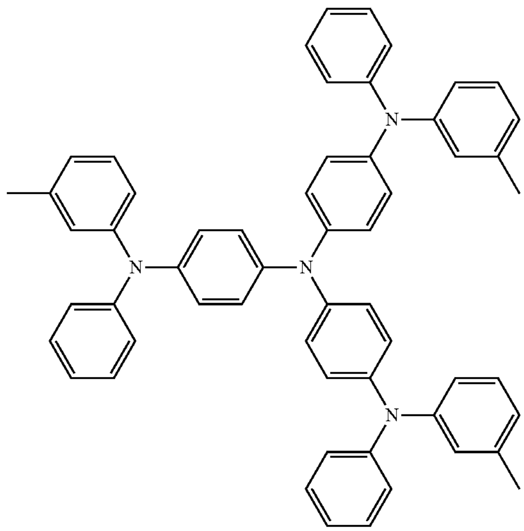

m-MTDATA

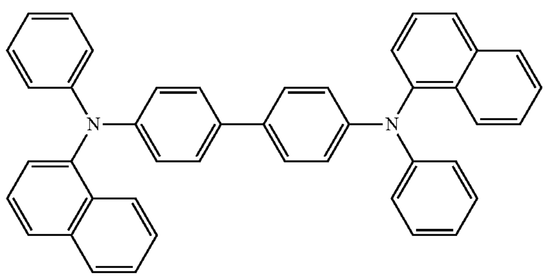

NPB

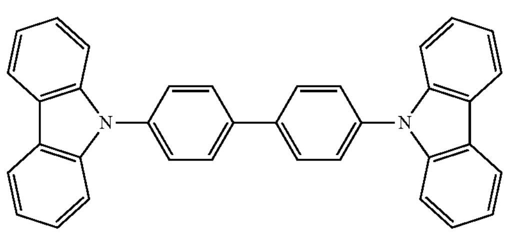

CBP

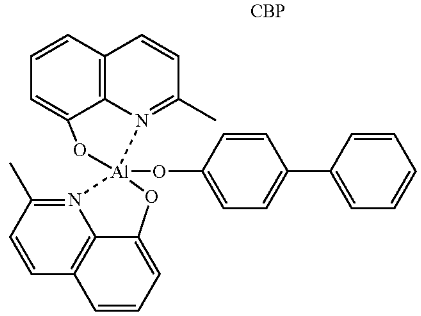

BAlq

-continued

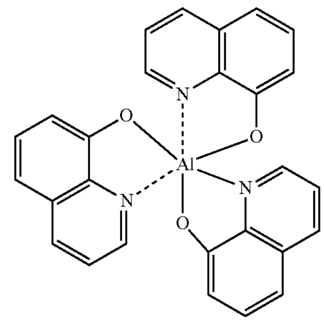

$Alq_3$

Examples 2 to 9 and Comparative Examples a to C

Organic light-emitting devices were manufactured in the same manner as in Example 1, except that in forming an emission layer, for use as a dopant, corresponding compounds shown in Table 5 were used instead of Compound 3.

Evaluation Example 3: Evaluation on Characteristics of Organic Light-Emitting Devices The driving voltage, the luminescence quantum efficiency, the roll-off ratio, and the lifespan ($T_{95}$) of each of the organic light-emitting devices manufactured according to Examples 1 to 9 and Comparative Examples A to C were evaluated. Results thereof are shown in Table 5. This evaluation was performed using a current-voltage meter (Keithley 2400) and a luminescence meter (Minolta Cs-1,000A), and the lifespan ($T_{95}$)(at 6000 nit) was evaluated by measuring the amount of time that elapsed until luminance was reduced to 95% of the initial brightness of 100%. The lifespan ($T_{95}$)(at 6000 nit) was represented as a relative value (%) in Table 5. The roll-off ratio was calculated by the following equation:

$$\text{Roll off ratio}=\{1-(\text{efficiency (at 9,000 nit)}/\text{maximum luminescent efficiency})\}\times 100\% \qquad \text{Equation 20}$$

TABLE 5

| No. | Dopant Compound No. | Driving Voltage (V) | Luminescent quantum Efficiency (%) | Roll-off ratio (%) | Lifespan (Relative value, %) ($T_{95}$) |
|---|---|---|---|---|---|
| Example 1 | 3 | 4.12 | 19.9 | 10 | 15.8% |
| Example 2 | 17 | 4.08 | 23.2 | 9 | 20.1% |
| Example 3 | 24 | 4.11 | 24.7 | 8 | 21.5% |
| Example 4 | 27 | 3.85 | 23.3 | 9 | 32.4% |
| Example 5 | 31 | 3.97 | 22.8 | 8 | 23.0% |
| Example 6 | 99 | 4.19 | 25.0 | 4 | 35.3% |
| Example 7 | 157 | 3.97 | 26.5 | 7 | 38.3% |
| Example 8 | 186 | 4.08 | 26.2 | 8 | 20.7% |
| Example 9 | 448 | 3.86 | 26.5 | 7 | 34.9% |
| Comparative Example A | A | 4.54 | 17.8 | 11 | 4.2% |
| Comparative Example B | B | 5.8 | 14.3 | 14 | 7.7% |
| Comparative Example C | C | 5.7 | 10.2 | 12 | 3.0% |

-continued
3
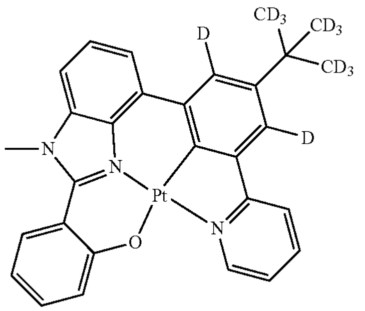
17
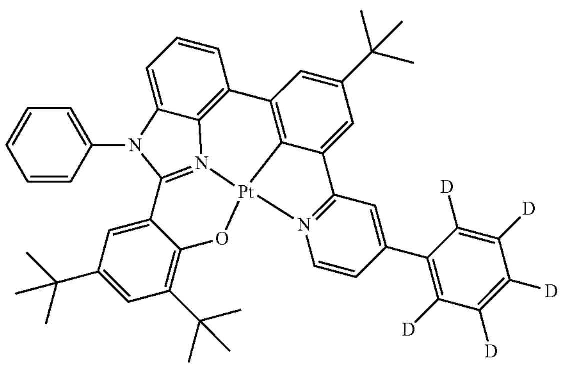
24
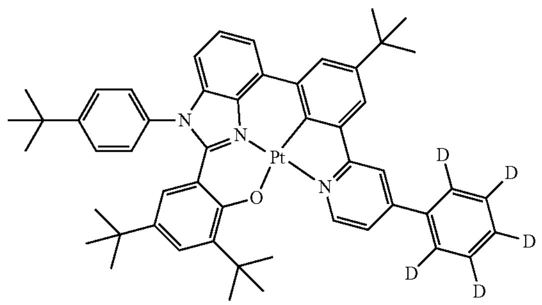
27
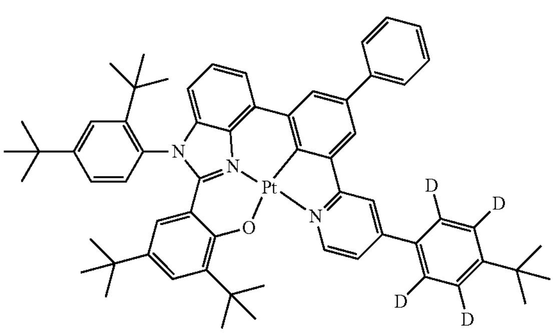
31
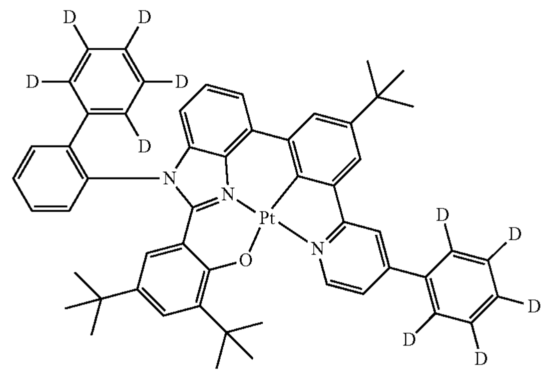
99
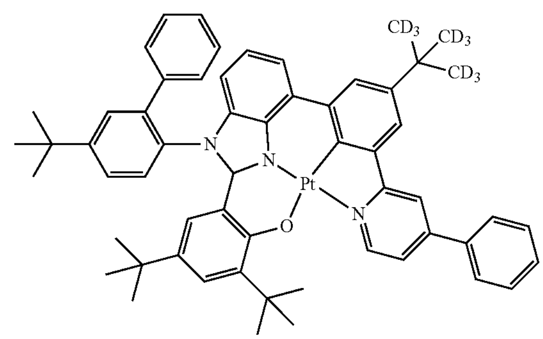
157
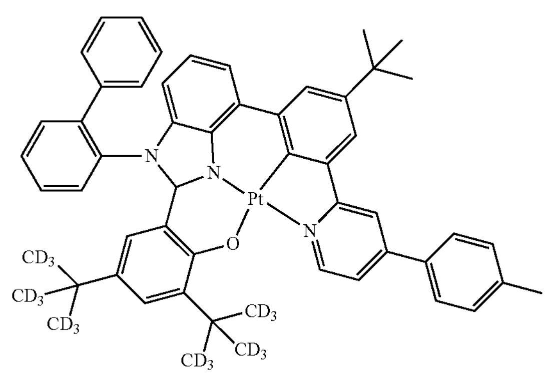
186
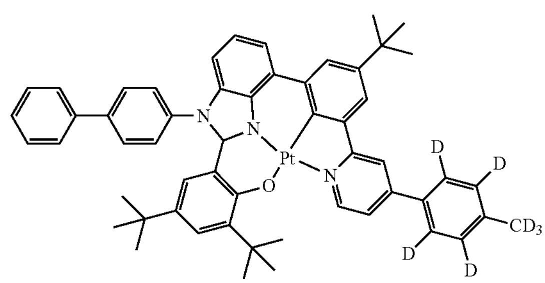

-continued

448

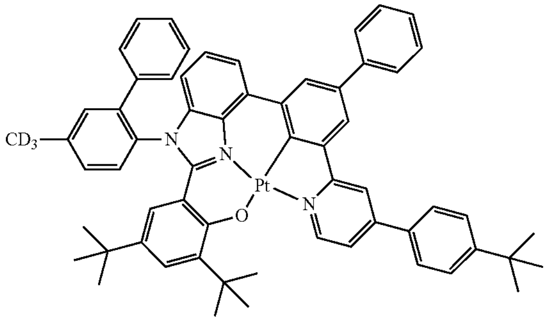

A

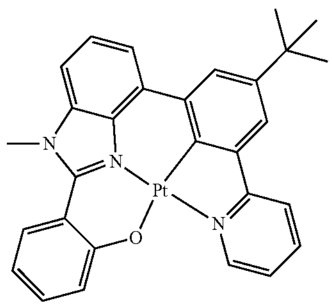

B

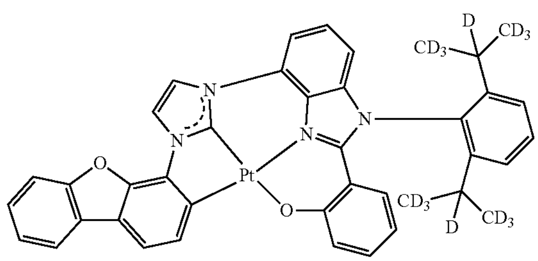

C

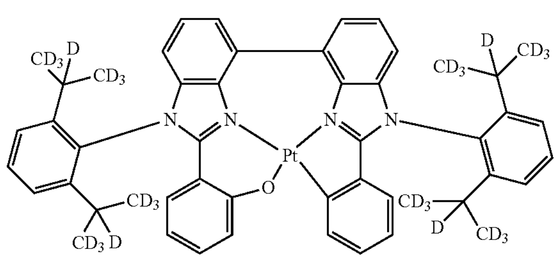

From Table 5, it was confirmed that the organic light-emitting devices of Example 1 to 9 have excellent driving voltage characteristics, high luminescence quantum efficiency, low roll-off ratio, and excellent lifespan characteristics compared to the organic light-emitting devices of Comparative Examples A to CC The organometallic compound according to embodiments has excellent electric characteristics and thermal stability. Accordingly, an organic light-emitting device including the organometallic compound may have excellent driving voltage, quantum efficiency, power efficiency, color purity, and lifespan characteristics. Such organometallic compounds have excellent phosphorescent luminescent characteristics, and thus, when used, a diagnostic composition having a high diagnostic efficiency may be provided.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present description as defined by the following claims.

What is claimed is:

1. An organometallic compound represented by Formula 1:

Formula 1

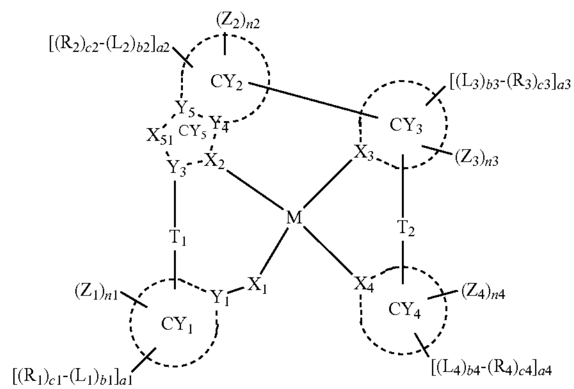

wherein, in Formula 1,

M is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ is a chemical bond, O, S, N(R'), P(R'), B(R'), C(R')(R"), or Si(R')(R"), and when $X_1$ is a chemical bond, $Y_1$ is directly bonded to M, $X_2$ to $X_4$ are each independently N or C, wherein two selected from $X_2$ to $X_4$ are each N and the other is C, a bond between $X_1$ or $Y_1$ and M is a covalent bond, one bond selected from a bond between $X_2$ and M, a bond between $X_3$ and M, and a bond between $X_4$ and M is a covalent bond, and the remaining two bonds are coordinate bonds, $Y_1$ and $Y_3$ to $Y_5$ are each independently C or N, among pairs of $X_2$ and $Y_3$, $X_2$ and $Y_4$, $Y_4$ and $Y_5$, $X_{51}$ and $Y_3$, and $X_{51}$ and $Y_5$, the components in each pair are linked via a chemical bond, ring $CY_1$ to ring $CY_5$ are each independently selected from a $C_5$-$C_{30}$ carbocyclic group and a $C_1$-$C_{30}$ heterocyclic group, and each of ring $CY_1$, ring $CY_3$, and ring $CY_4$ is not a benzimidazole group, a cyclometalated ring formed by ring $CY_5$, ring $CY_2$, ring $CY_3$, and M is a 6-membered ring, $X_{51}$ is selected from O, S, N-[$(L_7)_{b7}$-$(R_7)_{c7}$], C($R_7$)($R_8$), Si($R_7$)($R_8$), Ge($R_7$)($R_8$), C(=O), N, C($R_7$), Si($R_7$), and Ge($R_7$), $R_7$ and $R_8$ are optionally linked via a single bond, a double bond, or a first linking group to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $T_1$ and $T_2$ are each independently selected from a single bond, a double bond, *—N($R_9$)—*, *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*', *—O—*', *—C(═O)—*', *—S(═O)—*', *—S(═O)$_2$—*', *—C($R_9$)═*', *═C($R_9$)—*', *—C($R_9$)═C($R_{10}$)—*', *—C(═S)—*', or *—C≡C—*', $L_1$ to $L_4$ and $L_7$ are each independently selected from a single bond, a substituted or unsubstituted $C_5$-$C_{30}$ carbocyclic group, and a substituted or unsubstituted $C_1$-$C_{30}$ heterocyclic group, b1 to b4 and b7 are each independently an integer from 1 to 5, $R_1$ to $R_4$, $R_7$ to $R_{10}$, R' and R" are each independently selected from hydrogen, deuterium, a deuterium-containing group, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), c1 to c4 and c7 are each independently an integer from 1 to 5, each of $Z_1$ to $Z_4$ is deuterium or a deuterium-containing group, a1 to a4 and n1 to n4 are each independently an integer from 0 to 20, i) when $X_{51}$ is O, S, C(═O), or N, the sum of n1 to n4 is 1 or more, ii) when $X_{51}$ is N[($L_7$)$_{b7}$-($R_7$)$_{c7}$], C($R_7$), Si($R_7$), or Ge($R_7$), a) $R_7$ is a deuterium-containing group; b) the sum of n1 to n4 is 1 or more; or c) $R_7$ is a deuterium-containing group and the sum of n1 to n4 is 1 or more, and iii) when $X_{51}$ is C($R_7$)($R_8$), Si($R_7$)($R_8$), or Ge($R_7$)($R_8$), a) at least one selected from $R_7$ and $R_8$ is a deuterium-containing group; b) the sum of n1 to n4 is 1 or more; or c) at least one selected from $R_7$ and $R_8$ is a deuterium-containing group and the sum of n1 to n4 is 1 or more, the deuterium-containing group is a first group substituted with at least one deuterium, and the first group is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloakenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_7$-$C_{60}$ arylalkyl group, a substituted or unsubstituted $C_1$-$C_{60}$ heteroaryl group, a substituted or unsubstituted $C_7$-$C_{60}$ heteroarylalkyl group, a substituted or unsubstituted $C_2$-$C_{60}$ alkylheteroaryl group, a substituted or unsubstituted monovalent non-aromatic condensed polycyclic group, and a substituted or unsubstituted monovalent non-aromatic condensed heterocyclic group, two of a plurality of neighboring groups $R_1$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of a plurality of neighboring groups $R_2$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10}$, two of a plurality of neighboring groups $R_3$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of a plurality of neighboring groups $R_4$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more neighboring groups selected from $R_1$ to $R_4$, $R_7$ to $R_{10}$, R', and R" are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ has the same definition as $R_1$, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$;

wherein $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group.

2. The organometallic compound of claim 1, wherein i) $X_2$ and $X_4$ are each N, $X_3$ is C, a bond between $X_2$ and M and a bond between $X_4$ and M are each a coordinate bond, and a bond between $X_3$ and M is a covalent bond, i) $X_2$ and $X_3$ are each N, $X_4$ is C, a bond between $X_2$ and M and a bond between $X_3$ and M are each a coordinate bond, and a bond between $X_4$ and M is a covalent bond, or iii) $X_3$ and $X_4$ are each N, $X_2$ is C, a bond between $X_3$ and M and a bond between $X_4$ and M are each a coordinate bond, and a bond between $X_2$ and M is a covalent bond.

3. The organometallic compound of claim 1, wherein ring $CY_1$ to ring $CY_4$ are each independently selected from i) a first ring, ii) a second ring, iii) a condensed ring in which two or more first rings are condensed with each other, iv) a condensed ring in which two or more second rings are condensed with each other, and v) a condensed ring in which one or more first rings and one or more second rings are condensed with each other, the first ring is selected from a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, the second ring is selected from an adamantane group, a norbornane group, a norbornene group, a cyclohexane group, a cyclohexene group, a benzene group, a pyridine group, a pyrimidine group, a pyrazine group, a pyridazine group, and a triazine group, and each of ring $CY_1$ to ring $CY_4$ is not a benzimidazole group.

4. The organometallic compound of claim 1, wherein ring $CY_1$ to ring $CY_4$ are each independently selected from a benzene group, a naphthalene group, an anthracene group, a phenanthrene group, a triphenylene group, a pyrene group, a chrysene group, cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a 5,6,7,8-tetrahydroisoquinoline group, and a 5,6,7,8-tetrahydroquinoline group.

5. The organometallic compound of claim 1, wherein i) $Y_3$ to $Y_5$ are each C, a bond between $X_{51}$ and $Y_3$ and a bond between $X_{51}$ and $Y_5$ are each a single bond, and $X_{51}$ is O, S, N-[$(L_7)_{b7}$-$(R_7)_{c7}$], $C(R_7)(R_8)$, $Si(R_7)(R_8)$, $Ge(R_7)(R_8)$, or C(=O), ii) $Y_3$ and $Y_4$ are each C, $Y_5$ is N, a bond between $X_{51}$ and $Y_3$ is a double bond, a bond between $X_{51}$ and $Y_5$ is a single bond, and $X_{51}$ is N, $C(R_7)$, $Si(R_7)$, or $Ge(R_7)$, iii) $Y_3$ and $Y_5$ are each C, $Y_4$ is N, a bond between $X_{51}$ and $Y_3$ is a single bond, a bond between $X_{51}$ and $Y_5$ is a double bond, and $X_{51}$ is N, $C(R_7)$, $Si(R_7)$, or $Ge(R_7)$, iv) $Y_3$ is N, $Y_4$ and $Y_5$ are each C, a bond between $X_{51}$ and $Y_3$ is a single bond, a bond between $X_{51}$ and $Y_5$ is a double bond, and $X_{51}$ is N, $C(R_7)$, $Si(R_7)$, or $Ge(R_7)$, or v) $Y_3$ to $Y_5$ are each C, a bond between $X_{51}$ and $Y_3$ is a double bond, a bond between $X_{51}$ and $Y_5$ is a single bond, and $X_{51}$ is N, $C(R_7)$, $Si(R_7)$, or $Ge(R_7)$.

6. The organometallic compound of claim 1, wherein the first group is selected from:

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and $—Si(Q_{33})(Q_{34})(Q_{35})$;

wherein $Q_{33}$ to $Q_{35}$ are each independently selected from: $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, —$CHDCD_2H$, —$CHDCDH_2$, —$CHDCD_3$, —$CD_2CH_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from a $C_1$ to $C_{10}$ alkyl group, and a phenyl group.

7. The organometallic compound of claim 1, wherein the first group is selected from a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, and a terphenyl group, each unsubstituted or substituted with at least one selected from —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, and a terphenyl group.

8. The organometallic compound of claim 1, wherein $R_1$ to $R_4$, $R_7$ to $R_{10}$, R', and R" are each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$CD_2(CD_3)$, —$CD(CD_3)_2$, —$C(CD_3)_3$, —$CD_2$-$C(CD_3)_3$, —$CD_2$-$CD(CD_3)_2$, —$CD_2$-$CD_2(CD_3)$, —$CD(CD_3)$—$C(CD_3)_3$, —$CD(CD_3)$-$CD(CD_3)_2$, —$CD(CD_3)$-$CD_2(CD_3)$, —$C(CD_3)_2$-$C(CD_3)_3$, —$C(CD_3)_2$-$CD(CD_3)_2$, —$C(CD_3)_2$-$CD_2(CD_3)$, a group represented by Formula 9-1 to 9-19, a group represented by Formulae 10-1 to 10-232, a group represented by Formulae 11-1 to 11-41, and —$Si(Q_1)(Q_2)(Q_3)$, $Z_1$ to $Z_4$ are each independently selected from deuterium, —$CD_3$, —$CD_2H$, —$CDH_2$, —$CD_2(CD_3)$, —$CD(CD_3)_2$, —$C(CD_3)_3$, —$CD_2$-$C(CD_3)_3$, —$CD_2$-$CD(CD_3)_2$, —$CD_2$-$CD_2(CD_3)$, —$CD(CD_3)$-$C(CD_3)_3$, —$CD(CD_3)$-$CD(CD_3)_2$, —$CD(CD_3)$-$CD_2(CD_3)$, —$C(CD_3)_2$-$C(CD_3)_3$, —$C(CD_3)_2$-$CD(CD_3)_2$, —$C(CD_3)_2$-$CD_2(CD_3)$, and a group represented by one of Formulae 9-14 to 9-19, 10-11, 10-12, and 11-1 to 11-41:

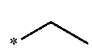
9-1

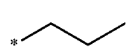
9-2

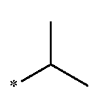
9-3

-continued

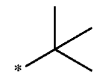
9-4

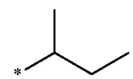
9-5

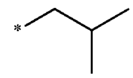
9-6

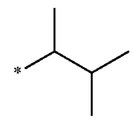
9-7

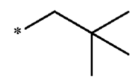
9-8

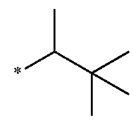
9-9

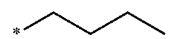
9-10

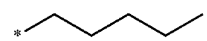
9-11

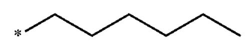
9-12

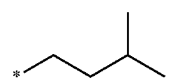
9-13

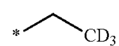

9-14

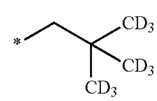

9-15

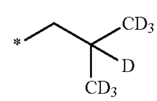

9-16

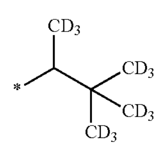

9-17

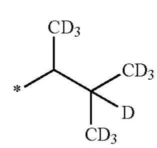

9-18

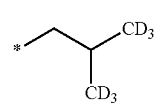

9-19

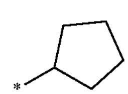
10-1

-continued
10-2
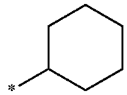
10-3
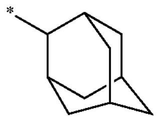
10-4
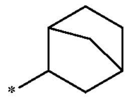
10-5
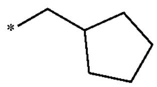
10-6
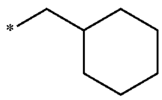
10-7
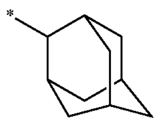
10-8
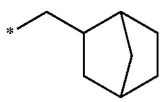
10-9
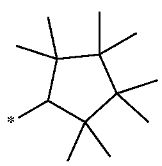
10-10
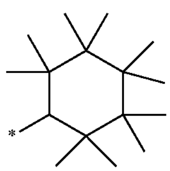
10-11
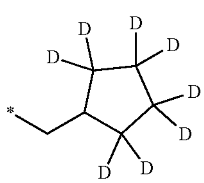
10-12
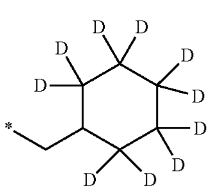
10-13
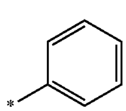
-continued
10-14
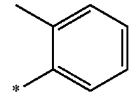
10-15
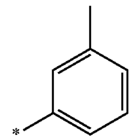
10-16
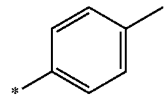
10-17
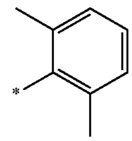
10-18
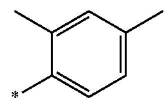
10-19
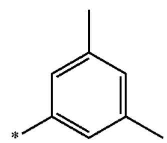
10-20
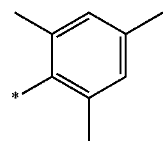
10-21
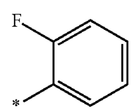
10-22
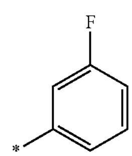
10-23
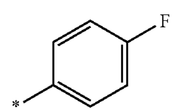
10-24
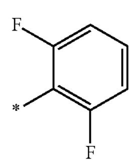
10-25
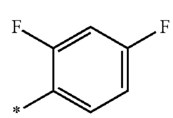

10-26
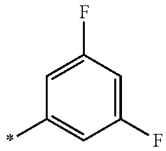
10-27
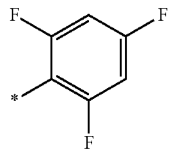
10-28
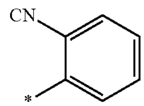
10-29
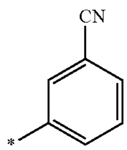
10-30
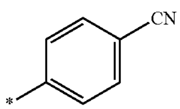
10-31
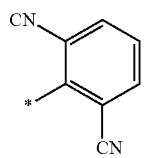
10-32
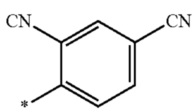
10-33
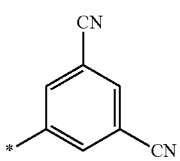
10-34
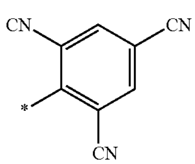
10-35
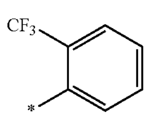
10-36
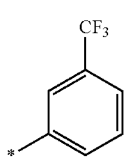
10-37
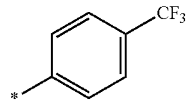
10-38
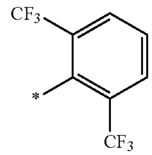
10-39
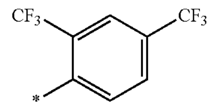
10-40
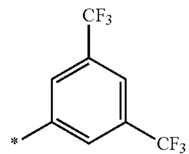
10-41
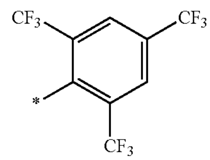
10-42
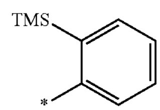
10-43
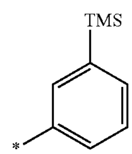
10-44
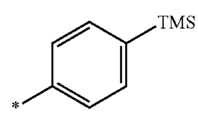
10-45
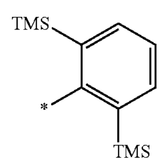
10-46
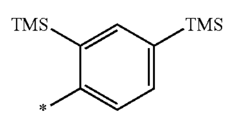
10-47
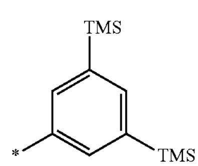

-continued
10-48
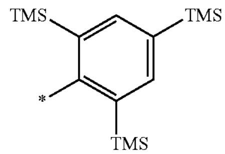
10-49
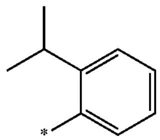
10-50
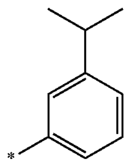
10-51
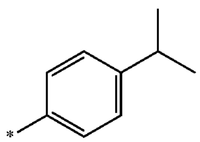
10-52
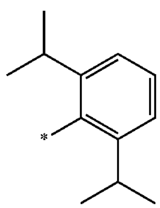
10-53
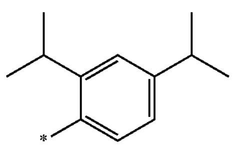
10-54
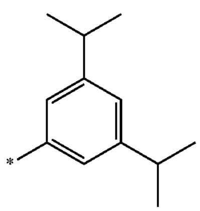
10-55
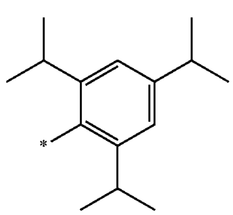
10-56
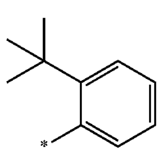
-continued
10-57
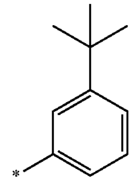
10-58
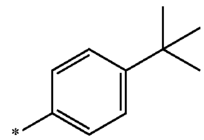
10-59
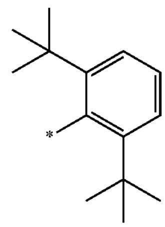
10-60
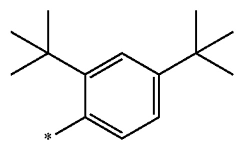
10-61
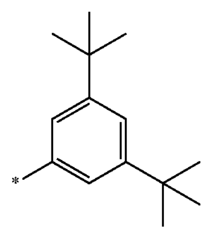
10-62
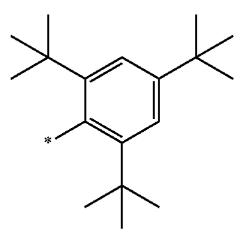
10-63
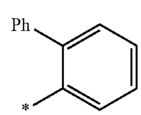
10-64
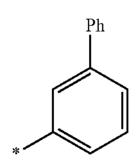
10-65
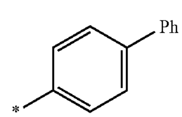

-continued
10-66
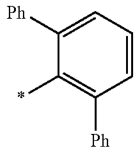
10-67
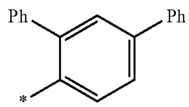
10-68
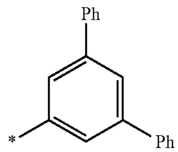
10-69
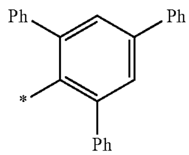
10-70
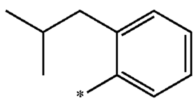
10-71
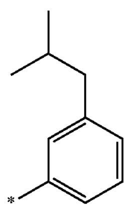
10-72
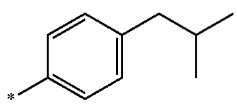
10-73
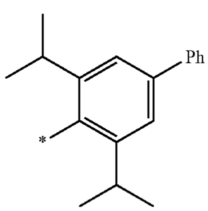
10-74
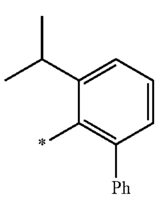
10-75
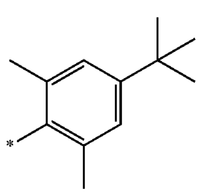
-continued
10-76
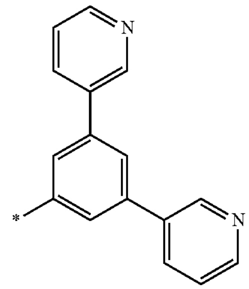
10-77
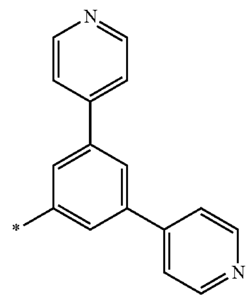
10-78
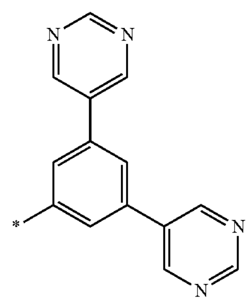
10-79
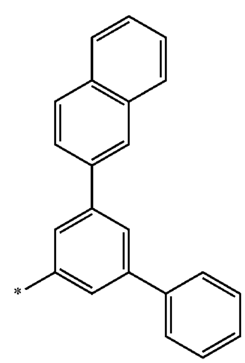
10-80
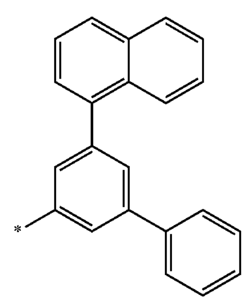

-continued
10-81
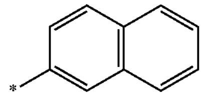
10-82
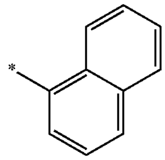
10-83
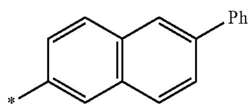
10-84
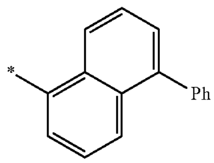
10-85
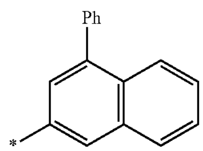
10-86
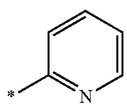
10-87
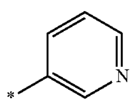
10-88
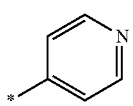
10-89
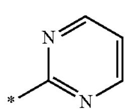
10-90
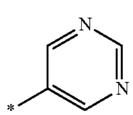
10-91
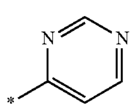
10-92
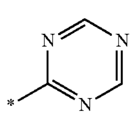
-continued
10-93
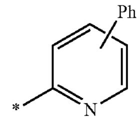
10-94
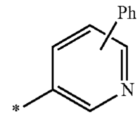
10-95
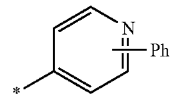
10-96
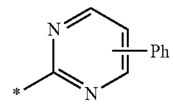
10-97
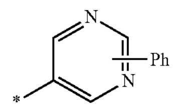
10-98
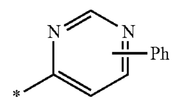
10-99
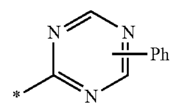
10-100
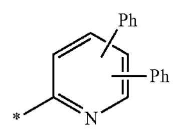
10-101
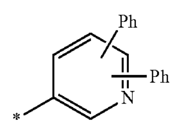
10-102
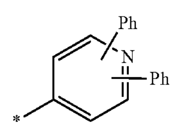
10-103
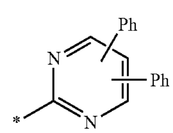
10-104
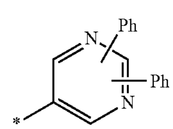
10-105
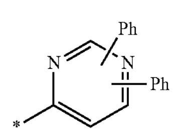

-continued
10-106
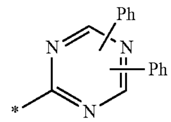
10-107
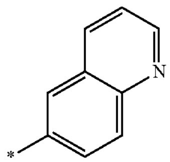
10-108
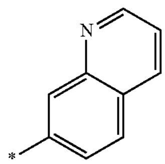
10-109
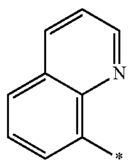
10-110
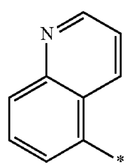
10-111
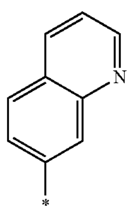
10-112
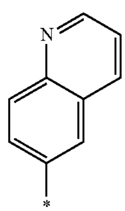
10-113
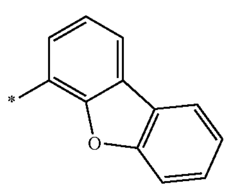
10-114
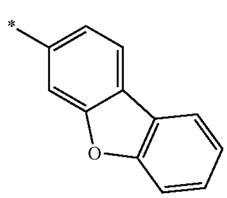
-continued
10-115
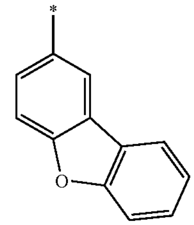
10-116
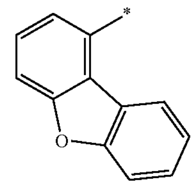
10-117
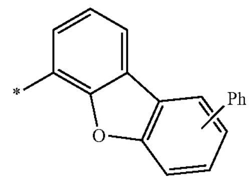
10-118
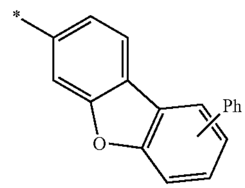
10-119
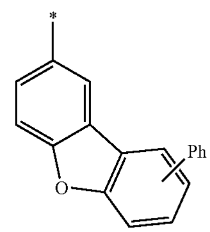
10-120
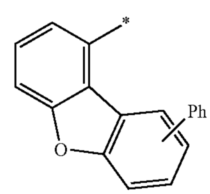
10-121
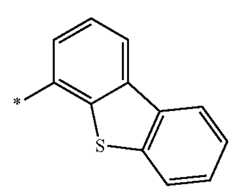
10-122
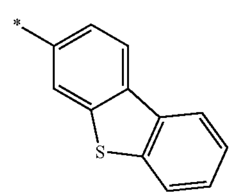

-continued
10-123
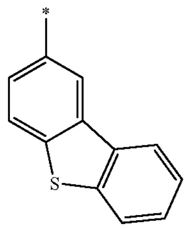
10-124
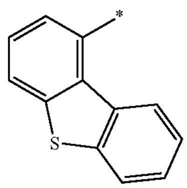
10-125
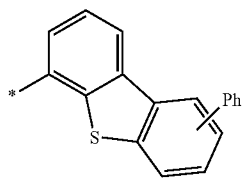
10-126
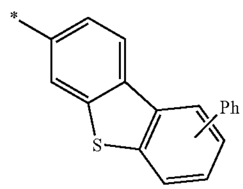
10-127
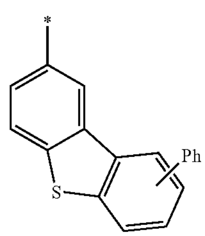
10-128
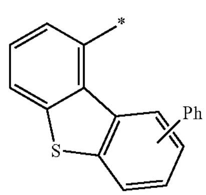
10-129
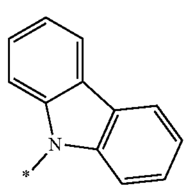
10-130
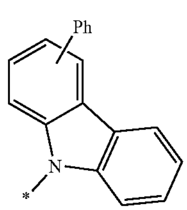
-continued
10-131
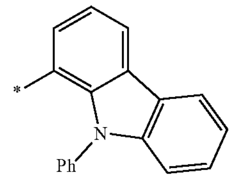
10-132
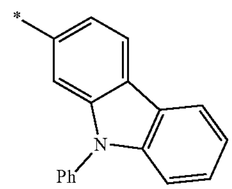
10-133
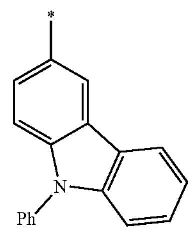
10-134
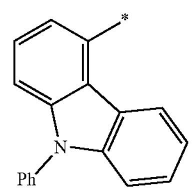
10-135
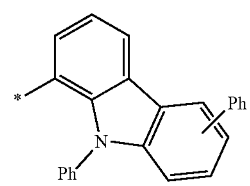
10-136
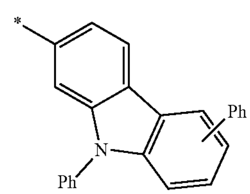
10-137
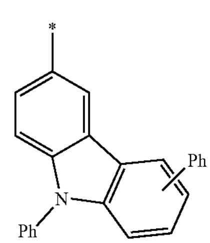
10-138
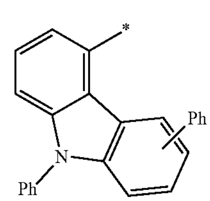

-continued
10-139
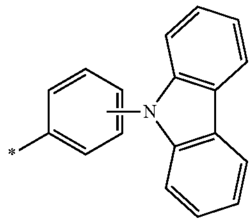
10-140
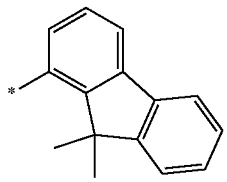
10-141
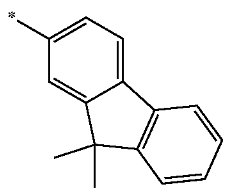
10-142
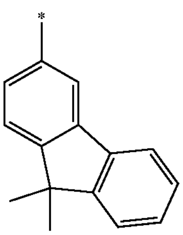
10-143
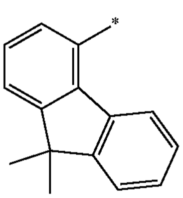
10-144
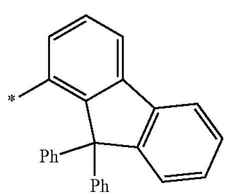
10-145
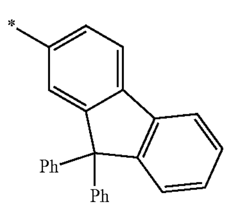
-continued
10-146
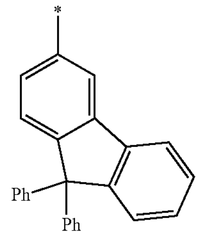
10-147
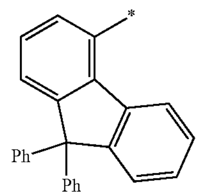
10-148
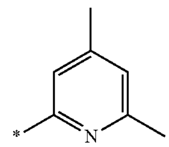
10-149
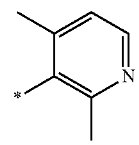
10-150
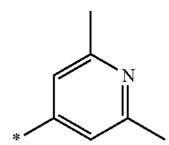
10-151
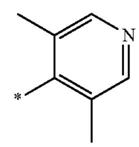
10-152
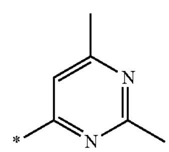
10-153
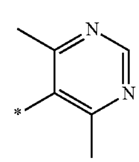
10-154
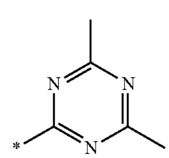
10-155
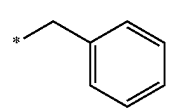

-continued
10-156
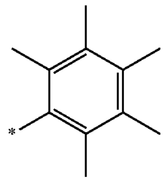
10-157
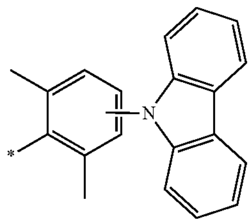
10-158
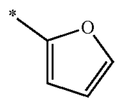
10-159
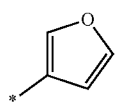
10-160
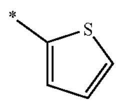
10-161
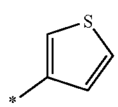
10-162
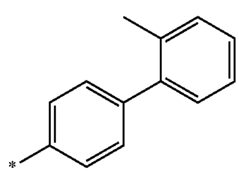
10-163
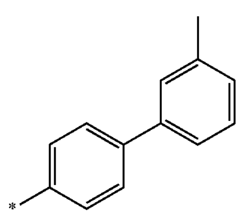
10-164
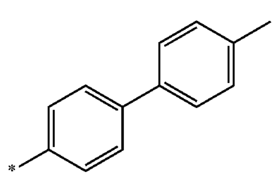
10-165
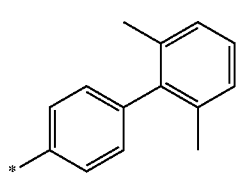
-continued
10-166
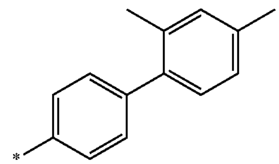
10-167
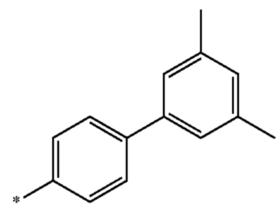
10-168
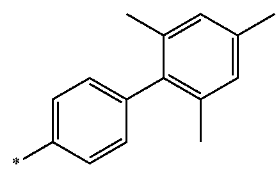
10-169
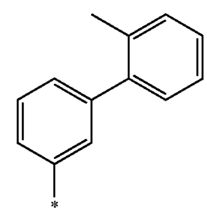
10-170
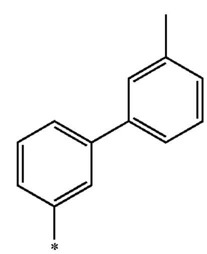
10-171
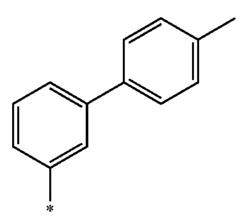
10-172
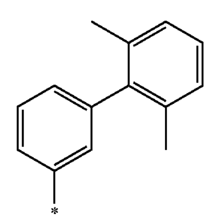

-continued
10-173
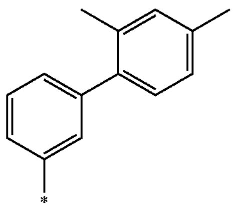
10-174
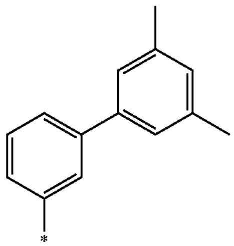
10-175
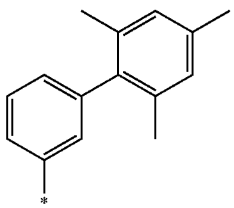
10-176
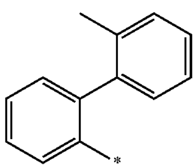
10-177
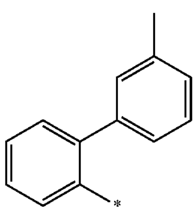
10-178
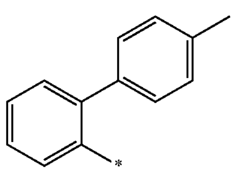
10-179
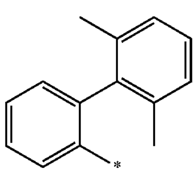
10-180
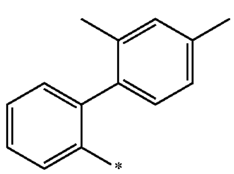
-continued
10-181
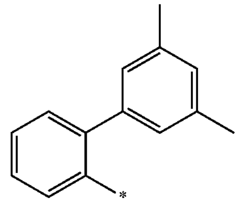
10-182
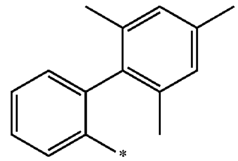
10-183
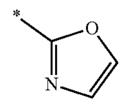
10-184
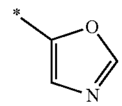
10-185
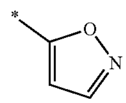
10-186
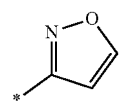
10-187
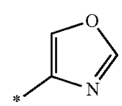
10-188
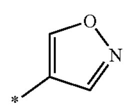
10-189
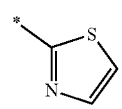
10-190
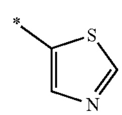
10-191
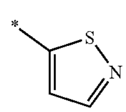
10-192
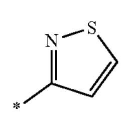
10-193
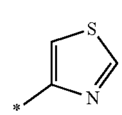

-continued
10-194
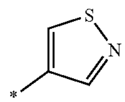
10-195
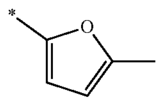
10-196
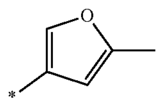
10-197
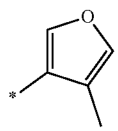
10-198
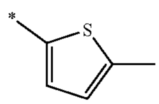
10-199
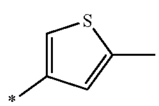
10-200
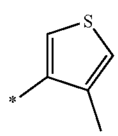
10-201
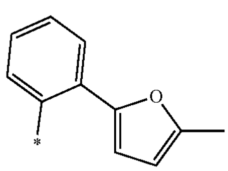
10-202
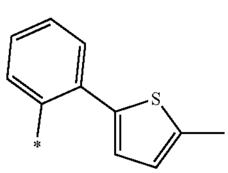
10-203
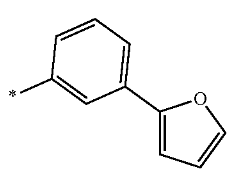
10-204
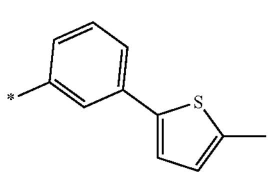
-continued
10-205
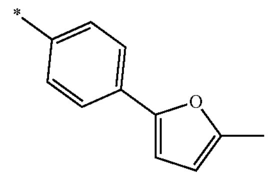
10-206
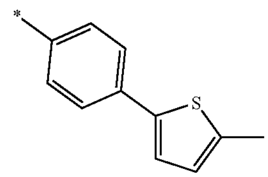
10-207
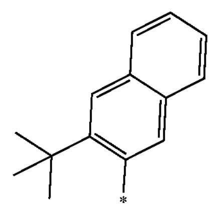
10-208
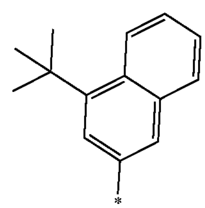
10-209
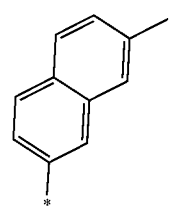
10-210
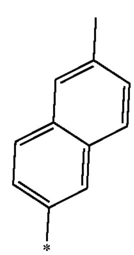
10-211
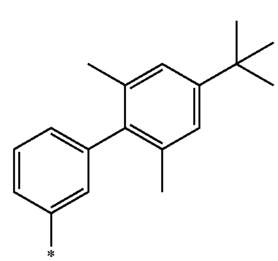

-continued
10-212
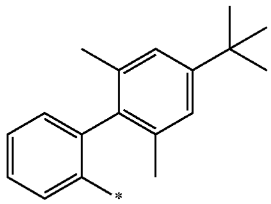
10-213
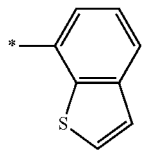
10-214
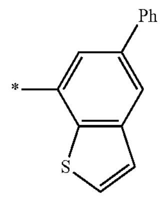
10-215
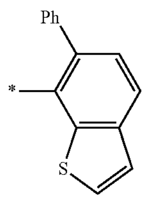
10-216
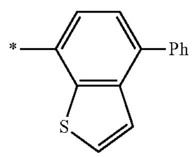
10-217
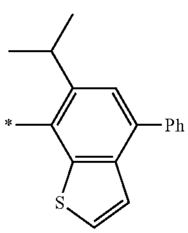
10-218
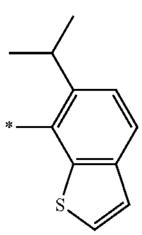
10-219
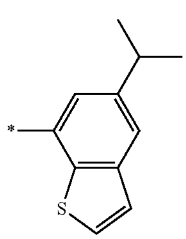
-continued
10-220
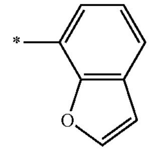
10-221
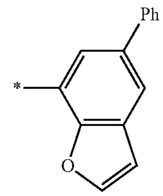
10-222
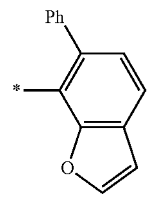
10-223
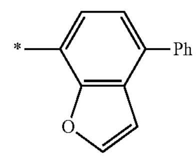
10-224
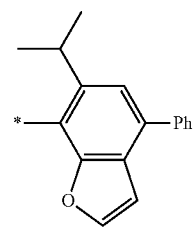
10-225
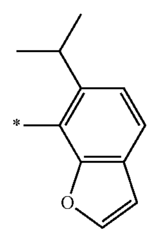
10-226
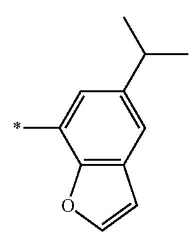
10-227
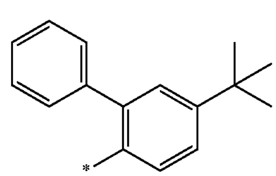

-continued
10-228
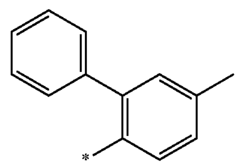
10-229
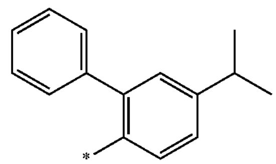
10-230
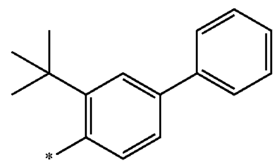
10-231
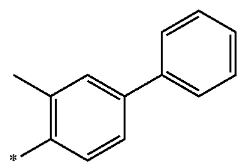
10-232
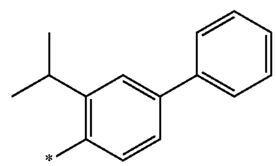
11-1
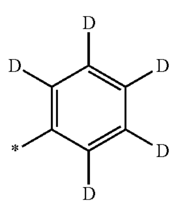
11-2
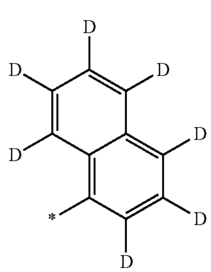
11-3
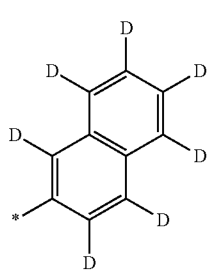
-continued
11-4
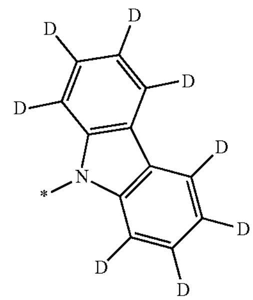
11-5
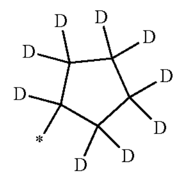
11-6
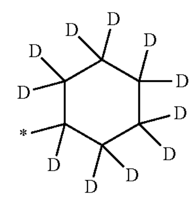
11-7
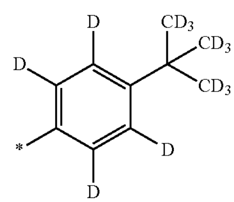
11-8
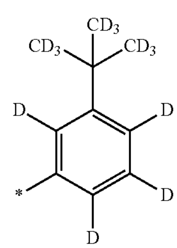
11-9
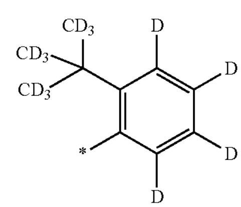
11-10
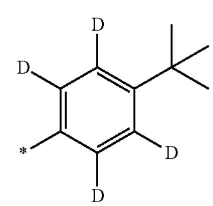

-continued
11-11
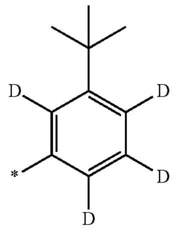
11-12
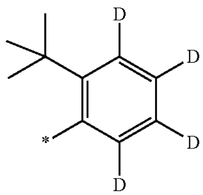
11-13
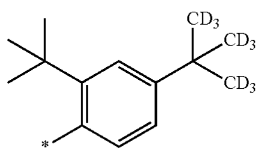
11-14
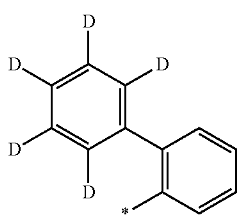
11-15
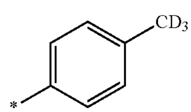
11-16
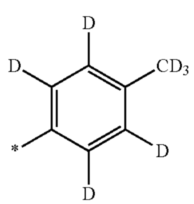
11-17
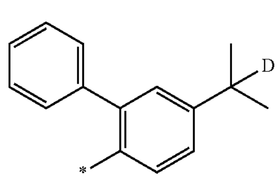
11-18
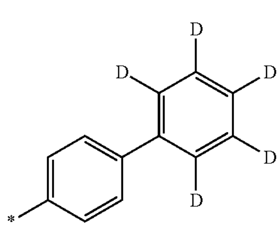
-continued
11-19
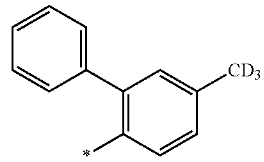
11-20
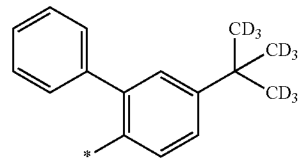
11-21
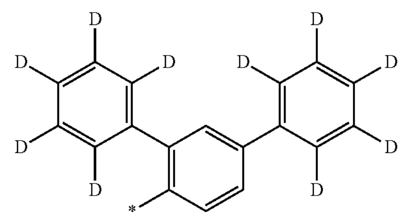
11-22
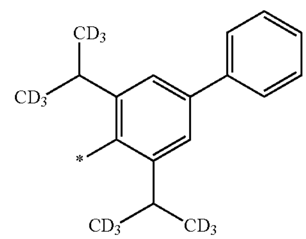
11-23
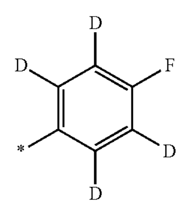
11-24
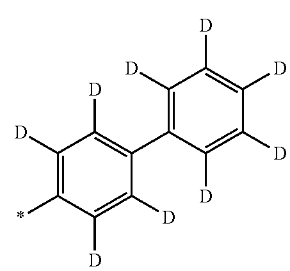
11-25
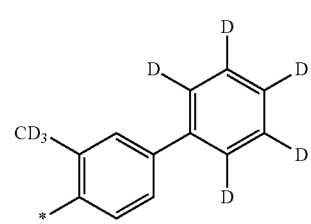

-continued
11-26
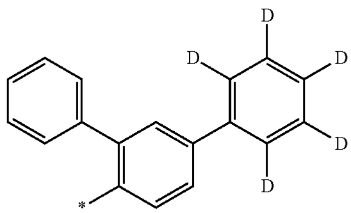
11-27
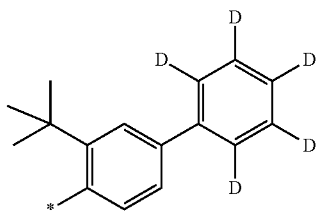
11-28
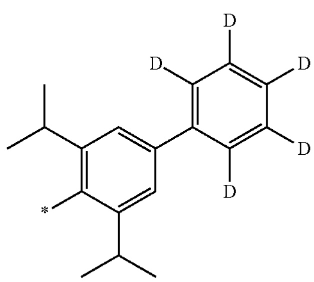
11-29
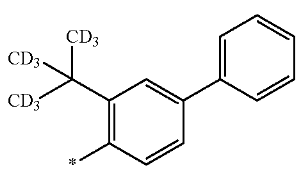
11-30
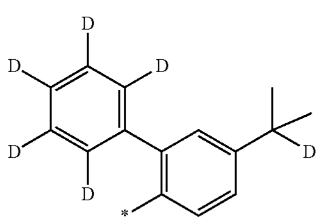
11-31
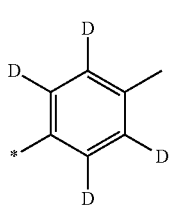
11-32
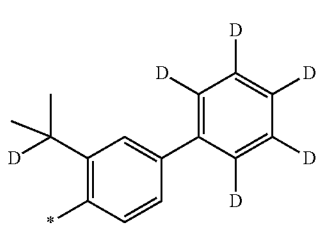
-continued
11-33
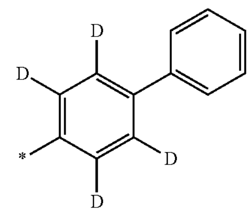
11-34
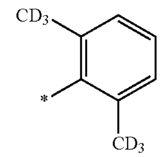
11-35
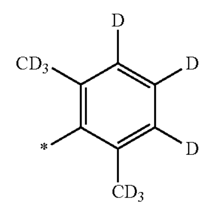
11-36
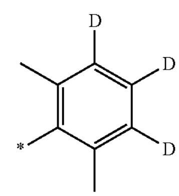
11-37
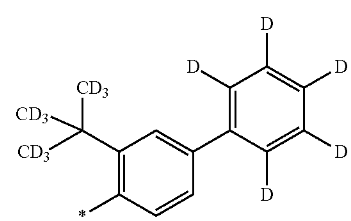
11-38
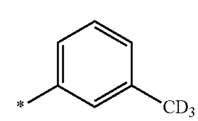
11-39
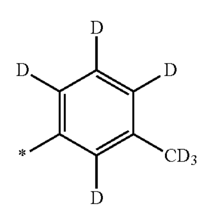
11-40
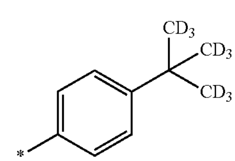

-continued
11-41
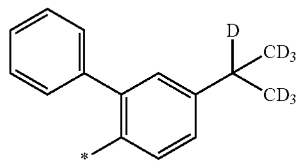
wherein, in Formulae 9-1 to 9-19, 10-1 to 10-232, and 11-1 to 11-41, * indicates a binding site to a neighboring atom, Ph is a phenyl group, and TMS is a trimethylsilyl group.
9. The organometallic compound of claim 1, wherein the deuterium-containing group is selected from a group represented by one of Formulae 11-1 to 11-41:
11-1
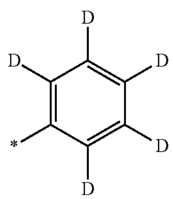
11-2
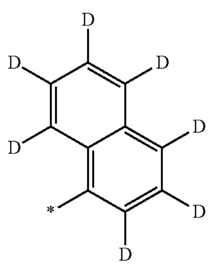
11-3
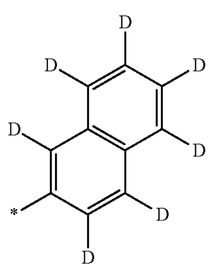
11-4
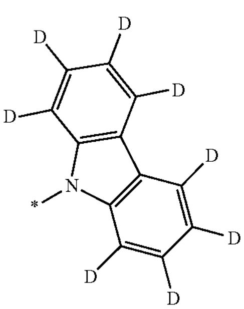
11-5
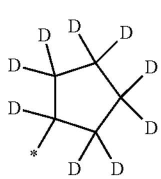
-continued
11-6
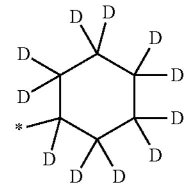
11-7
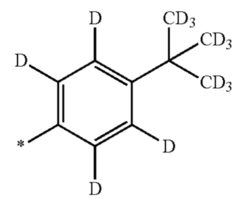
11-8
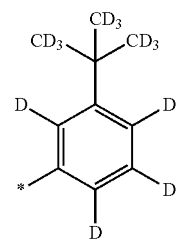
11-9
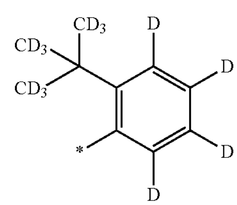
11-10
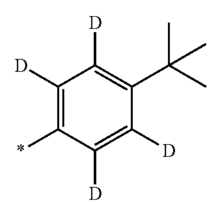
11-11
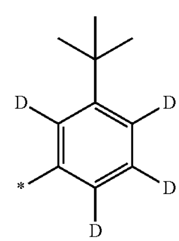
11-12
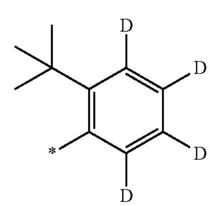
11-13
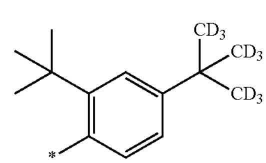

-continued
11-14
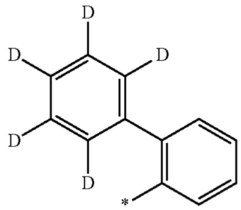
11-15
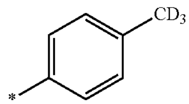
11-16
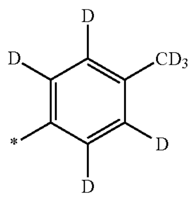
11-17
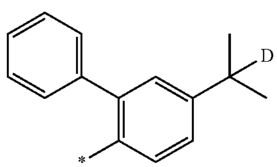
11-18
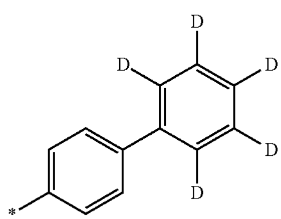
11-19
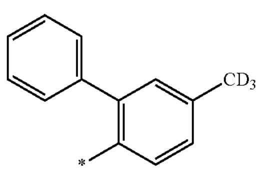
11-20
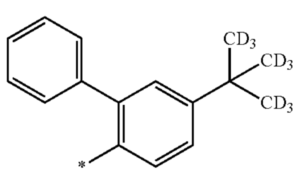
11-21
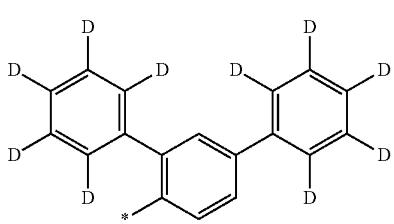
-continued
11-22
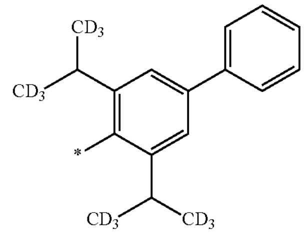
11-23
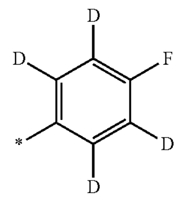
11-24
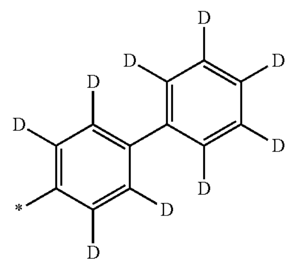
11-25
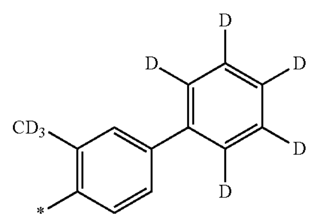
11-26
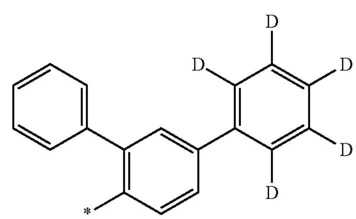
11-27
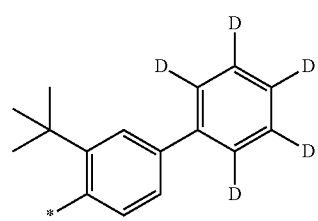
11-28
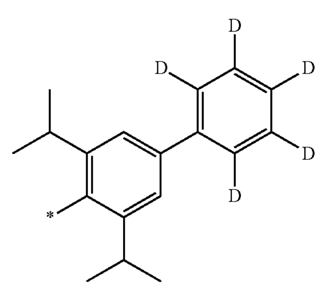

-continued 11-29

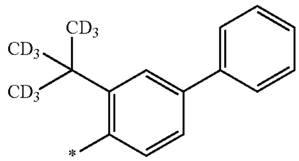

11-30

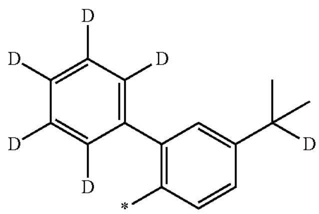

11-31

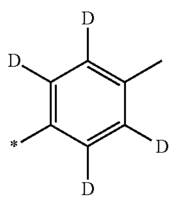

11-32

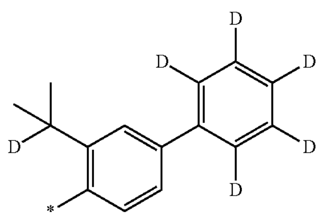

11-33

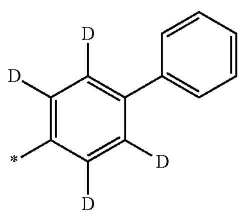

11-34

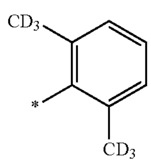

11-35

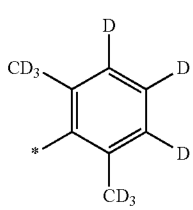

11-36

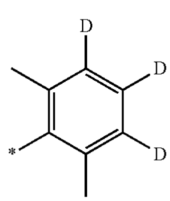

-continued 11-37

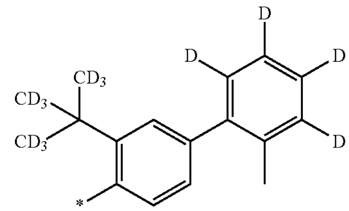

11-38

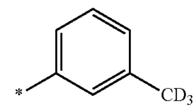

11-39

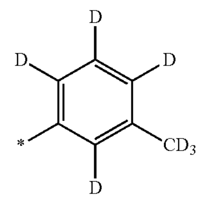

11-40

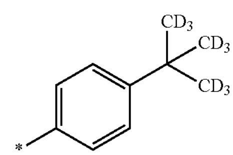

11-41

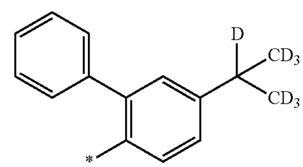

wherein * in Formulae 11-1 to 11-41 indicates a binding site to a neighboring atom.

10. The organometallic compound of claim 1, wherein satisfying at least one of Condition A to Condition D:

Condition A n1 is 1, 2, 3 or 4;

Condition B $X_{51}$ is $N[(L_7)_{b7}-(R_7)_{c7}]$ and $R_7$ is a deuterium-containing group;

Condition C n3 is 1, 2 or 3;

Condition D n4 is 1, 2, 3 or 4.

11. The organometallic compound of claim 1, wherein a moiety represented by

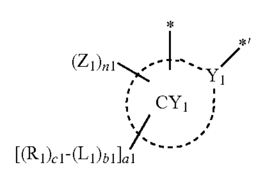

in Formula 1 is a group represented by one of Formulae CY1-1 to CY1-40:
CY1-1
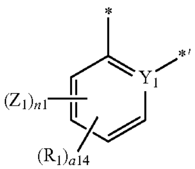
CY1-2
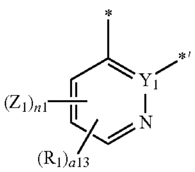
CY1-3
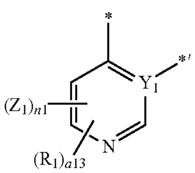
CY1-4
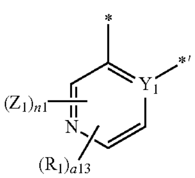
CY1-5
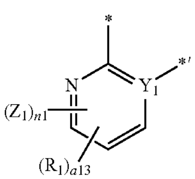
CY1-6
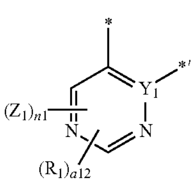
CY1-7
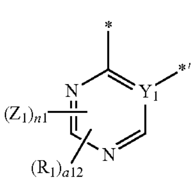
CY1-8
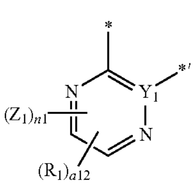
-continued
CY1-9
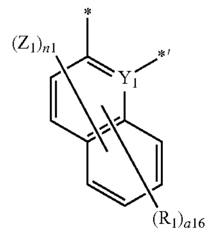
CY1-10
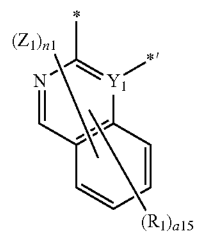
CY1-11
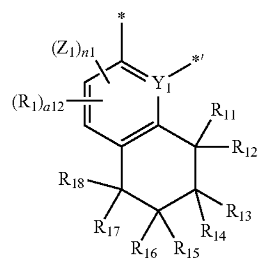
CY1-12
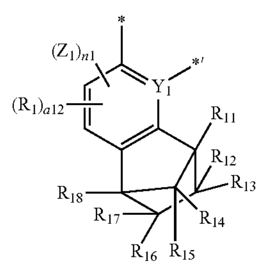
CY1-13
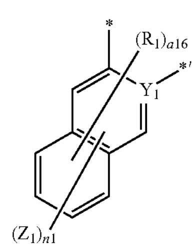
CY1-14
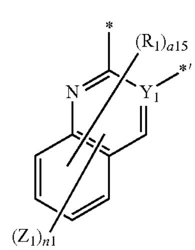

-continued
CY1-15
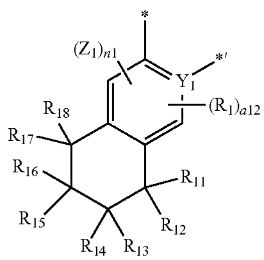
CY1-16
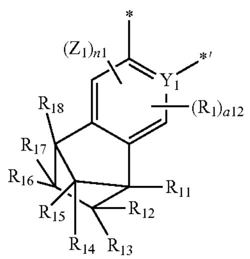
CY1-17
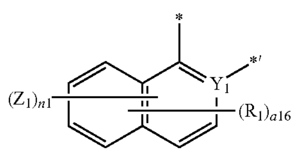
CY1-18
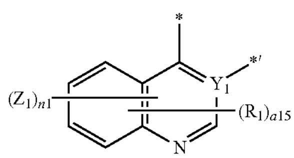
CY1-19
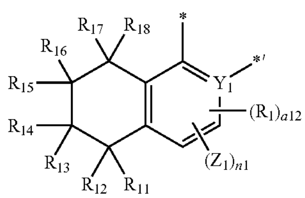
CY1-20
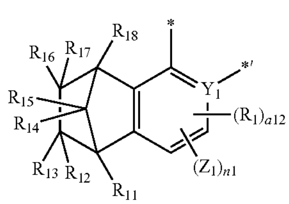
CY1-21
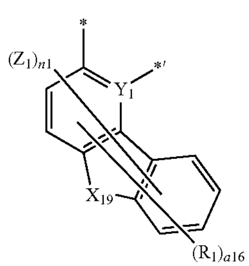
-continued
CY1-22
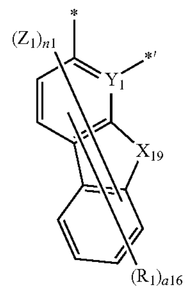
CY1-23
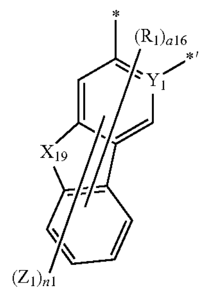
CY1-24
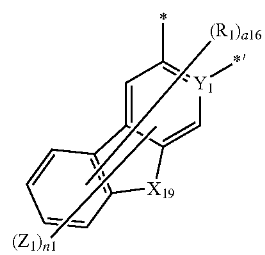
CY1-25
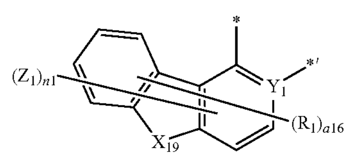
CY1-26
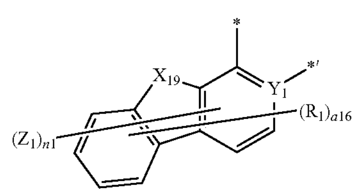
CY1-27
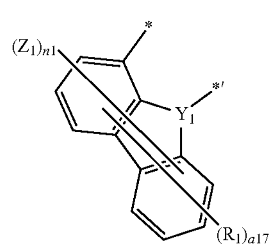

-continued
CY1-28
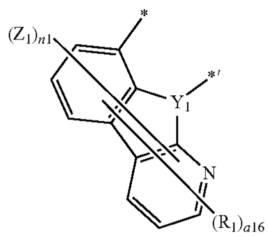
CY1-29
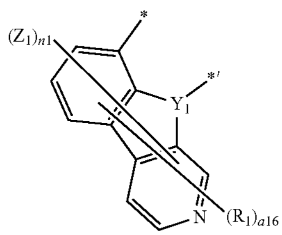
CY1-30
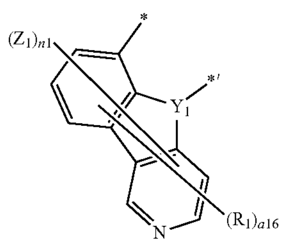
CY1-31
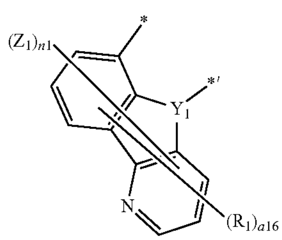
CY1-32
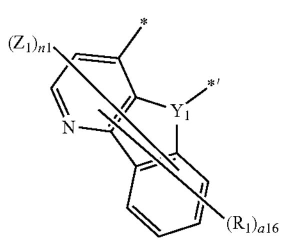
CY1-33
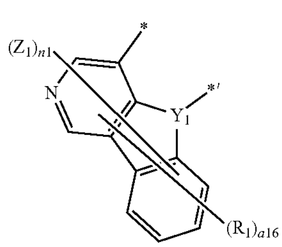
-continued
CY1-34
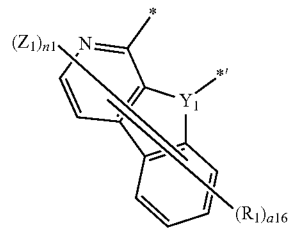
CY1-35
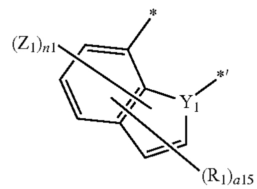
CY1-36
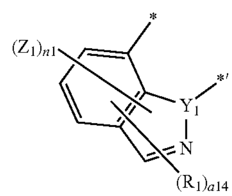
CY1-37
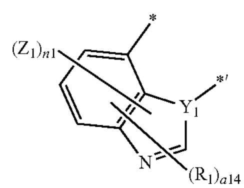
CY1-38
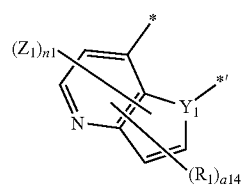
CY1-39
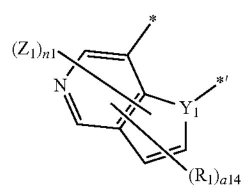
CY1-40
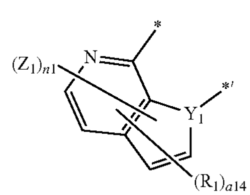
wherein, in Formula CY1-1 to CY1-40,
$Y_1$, $R_1$, $Z_2$, and n1 are the same as described in claim 1, and n1 is an integer from 0 to 7,
$X_{19}$ is $C(R_{19a})(R_{19b})$, $N[(L_{19})_{b19}-(R_{19})_{c19}]$, O, S, or $Si(R_{19a})(R_{19b})$,
$L_{19}$ is the same as described in connection with $L_1$ in claim 1,
b19 and c19 are the same as described in connection with b1 and c1 in claim 1, $R_{11}$ to $R_{19}$, $R_{19a}$, and $R_{19b}$ are the same as described in connection with $R_1$ in claim 1, a12 is an integer from 0 to 2, a13 is an integer from 0 to 3, a14 is an integer from 0 to 4, a15 is an integer from 0 to 5, a16 is an integer from 0 to 6, a17 is an integer from 0 to 7,

*' indicates a binding site to $X_1$ or M in Formula 1, and

* indicates a binding site to $T_1$ in Formula 1.

12. The organometallic compound of claim 1, wherein a moiety represented by

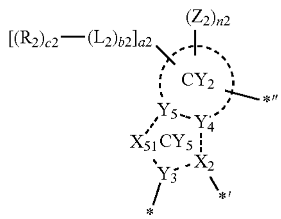

in Formula 1 is a group represented by one of Formulae CY2-1 to CY2-20:

CY2-1

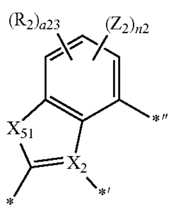

CY2-2

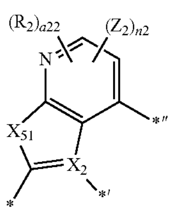

CY2-3

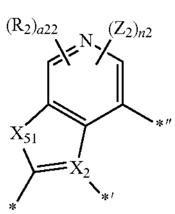

CY2-4

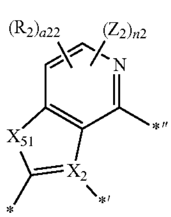

-continued

CY2-5

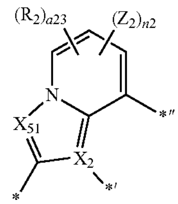

CY2-6

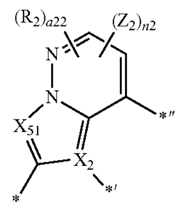

CY2-7

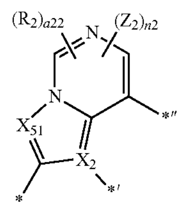

CY2-8

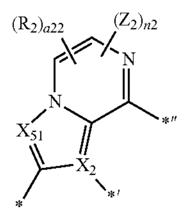

CY2-9

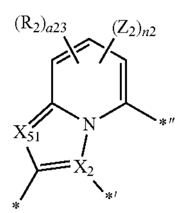

CY2-10

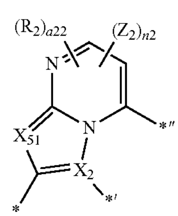

CY2-11

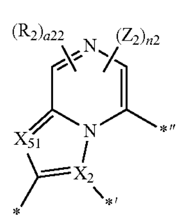

-continued

CY2-12

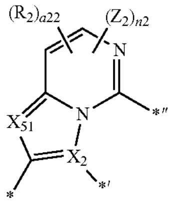

CY2-13

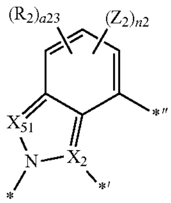

CY2-14

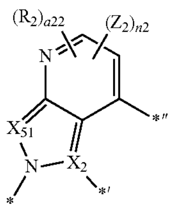

CY2-15

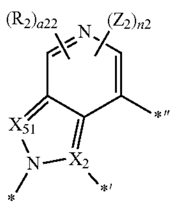

CY2-16

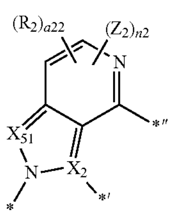

CY2-17

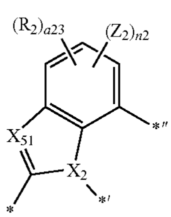

CY2-18

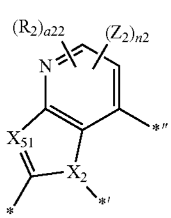

-continued

CY2-19

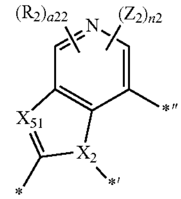

CY2-20

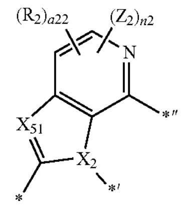

wherein, in Formulae CY2-1 to CY2-20, $X_2$, $R_2$, $Z_2$, and n2 are the same as described in claim 1, and n2 is an integer from 0 to 3, $X_{51}$ in Formulae CY2-1 to CY2-4 is O, S, N-[$(L_7)_{b7}$-$(R_7)_{c7}$], $C(R_7)(R_8)$, $Si(R_7)(R_8)$, $Ge(R_7)(R_8)$, or C(═O), $X_{51}$ in Formulae CY2-5 to CY2-20 is N, $C(R_7)$, $Si(R_7)$, or $Ge(R_7)$, $L_7$, b7, $R_7$, and c7 are the same as described in connection with claim 1, a22 is an integer from 0 to 2, a23 is an integer from 0 to 3,

* indicates a binding site to $T_1$ in Formula 1,

*' indicates a binding site to M in Formula 1, and

*" indicates a binding site to ring $CY_3$ in Formula 1.

13. The organometallic compound of claim 1, wherein a moiety represented by

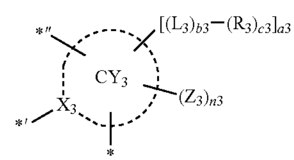

in Formula 1 is a group represented by one of Formulae CY3-1 to CY3-12:

CY3-1

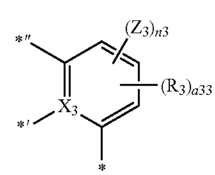

CY3-2

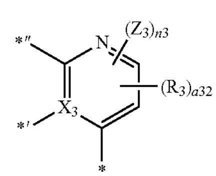

-continued

CY3-3

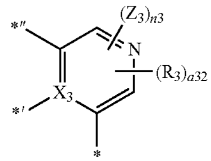

CY3-4

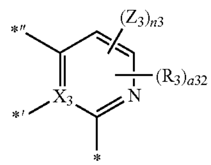

CY3-5

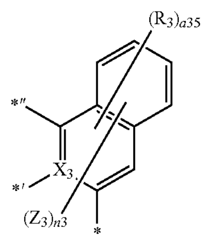

CY3-6

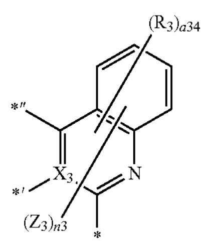

CY3-7

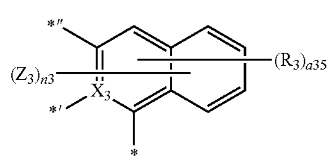

CY3-8

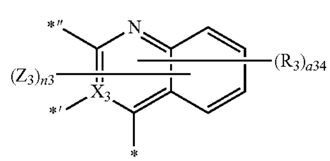

CY3-9

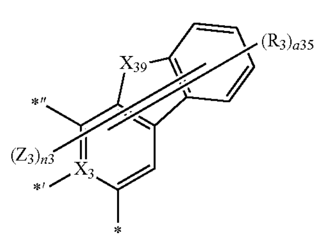

-continued

CY3-10

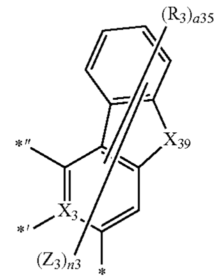

CY3-11

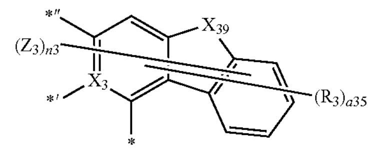

CY3-12

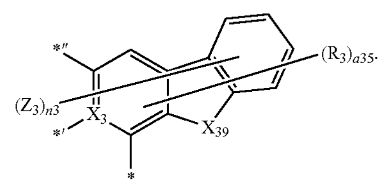

wherein, in Formulae CY3-1 to CY3-12, $X_3$, $R_3$, $Z_3$, and n3 are the same as described in connection with claim 1, and n3 is an integer from 0 to 5, $X_{39}$ is $C(R_{39a})(R_{39b})$, $N[(L_{39})_{b39}-(R_{39})_{c39}]$, O, S, or $Si(R_{39a})(R_{39b})$, $L_{39}$ is the same as explained in connection with $L_3$ in claim 1, b39 and c39 are the same as described in connection with b3 and c3 in claim 1, respectively, $R_{39a}$ and $R_{39b}$ are the same as described in connection with $R_3$ in claim 1, a32 is an integer from 0 to 2, a33 is an integer from 0 to 3, a34 is an integer from 0 to 4, a35 is an integer from 0 to 5,

* indicates a binding site to $T_2$ in Formula 1,

*' indicates a binding site to M in Formula 1, and

*" indicates a binding site to ring $CY_2$ in Formula 1.

14. The organometallic compound of claim 1, wherein a moiety represented by

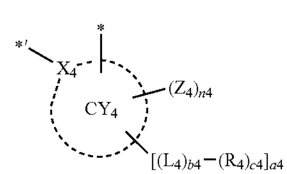

in Formula 1 is a group represented by one of Formulae CY4-1 to CY4-26:
CY4-1
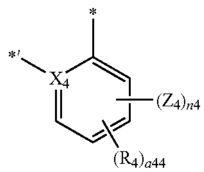
CY4-2
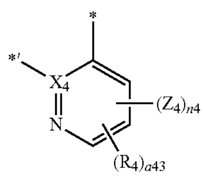
CY4-3
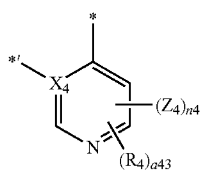
CY4-4
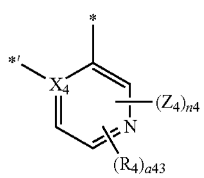
CY4-5
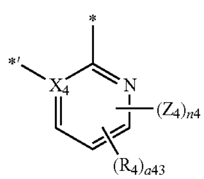
CY4-6
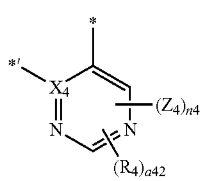
CY4-7
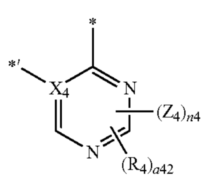
CY4-8
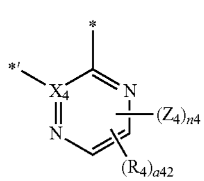
-continued
CY4-9
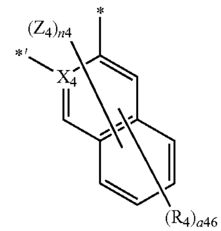
CY4-10
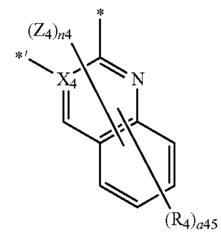
CY4-11
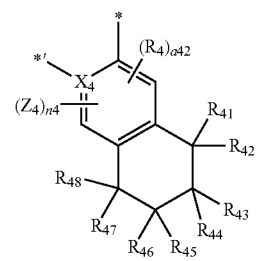
CY4-12
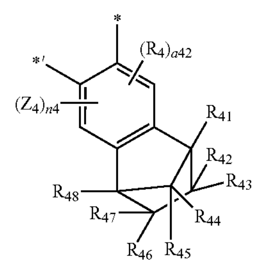
CY4-13
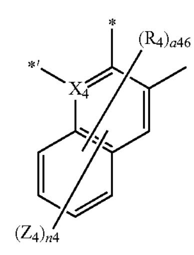
CY4-14
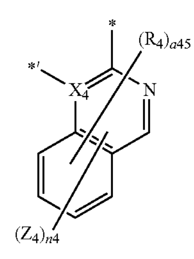

-continued

CY4-15

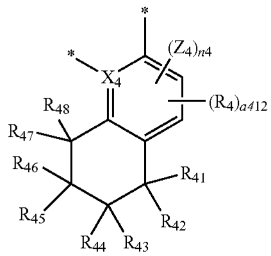

CY4-16

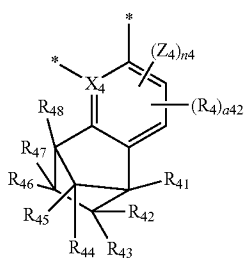

CY4-17

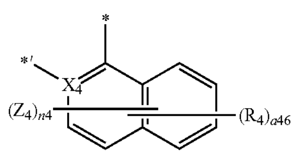

CY4-18

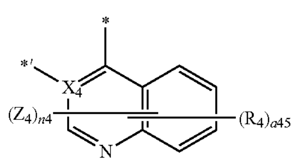

CY4-19

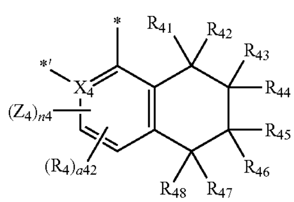

CY4-20

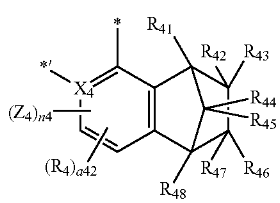

CY4-21

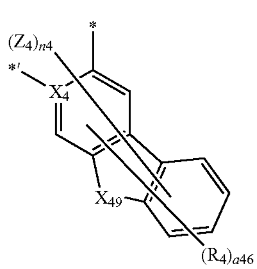

-continued

CY4-22

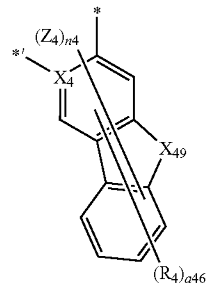

CY4-23

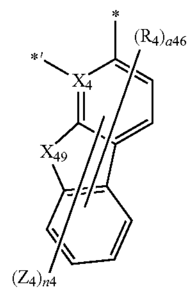

CY4-24

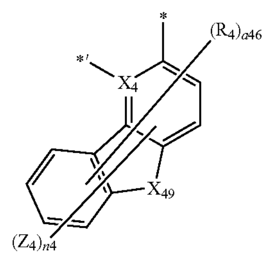

CY4-25

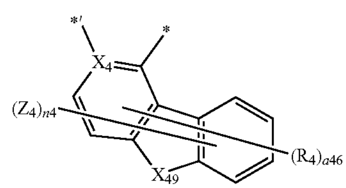

CY4-26

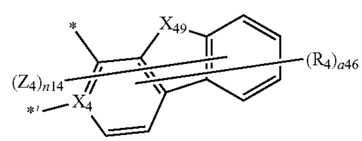

wherein, in Formulae CY4-1 to CY4-26, $X_4$, $R_4$, $Z_4$, and n4 are the same as described in connection with claim 1, and n4 is an integer from 0 to 6, $X_{49}$ is $C(R_{49a})(R_{49b})$, $N[(L_{49})_{b49}-(R_{49})_{c49}]$, O, S, or $Si(R_{49a})(R_{49b})$, $L_{49}$ is the same as described in connection with $L_4$ in claim 1, b49 and c49 are the same as described in connection with b4 and c4 in claim 1, respectively, $R_{41}$ to $R_{49}$, $R_{49a}$, and $R_{49b}$ are the same as described in connection with $R_4$ in claim 1, respectively, a42 is an integer from 0 to 2, a43 is an integer from 0 to 3, a44 is an integer from 0 to 4, a45 is an integer from 0 to 5, a46 is an integer from 0 to 6,

* indicates a binding site to $T_2$ in Formula 1, and

*' indicates a binding site to M in Formula 1.

15. An organic light-emitting device comprising:
a first electrode;
a second electrode; and
an organic layer disposed between the first electrode and the second electrode,
wherein the organic layer comprises an emission layer and at least one organometallic compound of claim 1.

16. The organic light-emitting device of claim 15, wherein
the first electrode is an anode,
the second electrode is a cathode,
the organic layer further includes a hole transport region disposed between the first electrode and the emission layer and an electron transport region disposed between the emission layer and the second electrode,
the hole transport region includes a hole injection layer, a hole transport layer, an electron blocking layer, a buffer layer or any combination thereof, and
the electron transport region includes a hole blocking layer, an electron transport layer, an electron injection layer, or any combination thereof.

17. The organic light-emitting device of claim 15, wherein
the organometallic compound is included in the emission layer.

18. The organic light-emitting device of claim 17, wherein
the emission layer further includes a host and the amount of the host is greater than the amount of the organometallic compound.

19. A diagnostic composition comprising at least one organometallic compound of claim 1.

20. An organometallic compound, wherein
the organometallic compound is one of Compounds 1 to 666 below:

1

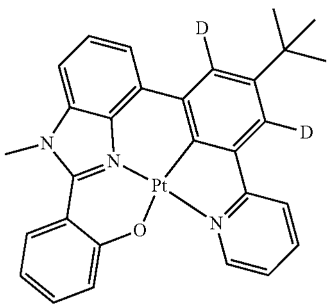

2

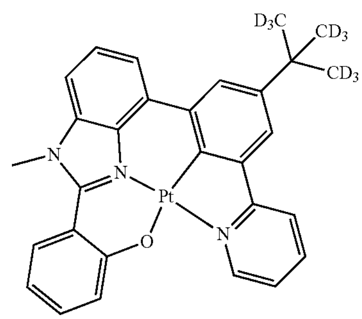

3

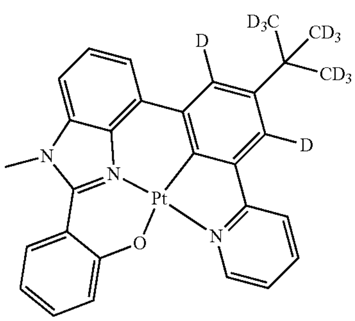

4

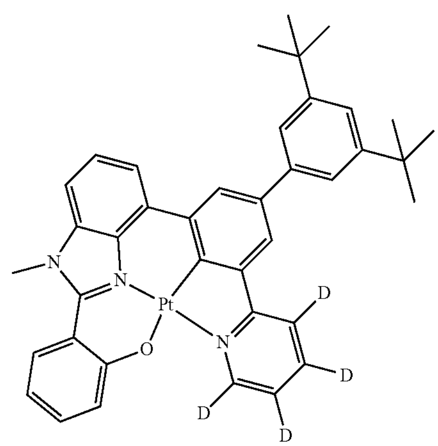

5

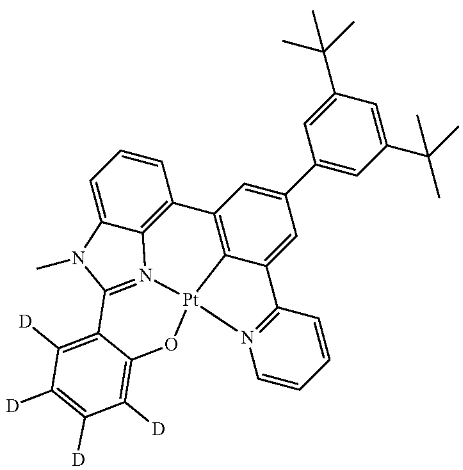

6

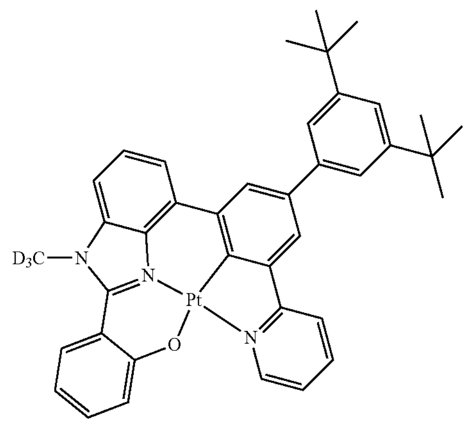

-continued
7
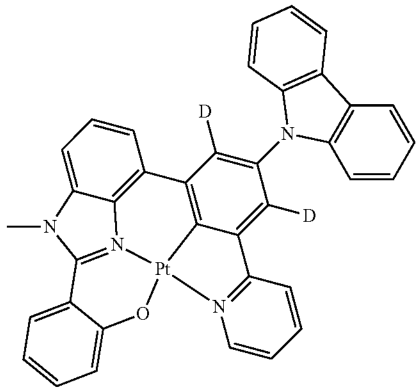
8
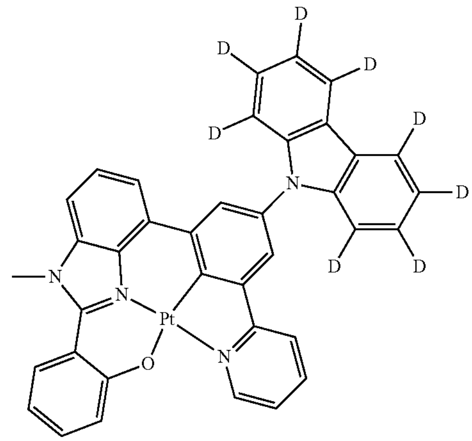
9
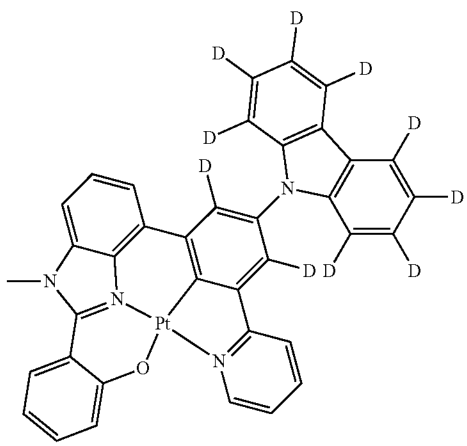
10
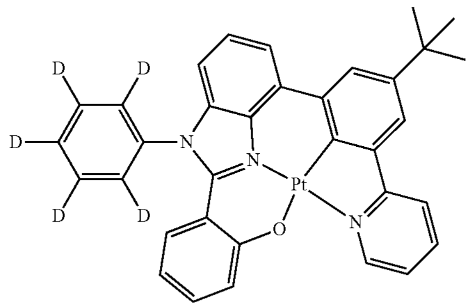
11
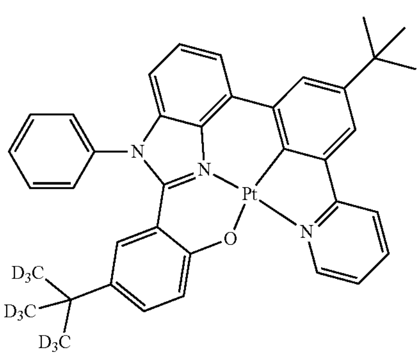
12
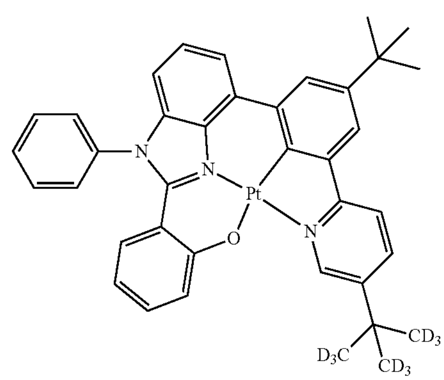

-continued
13
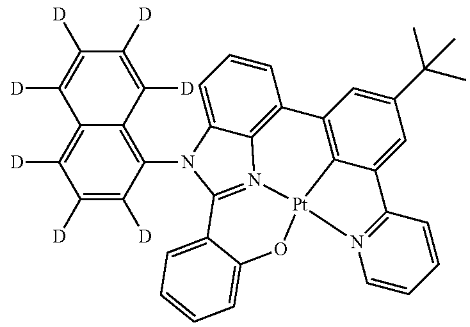
14
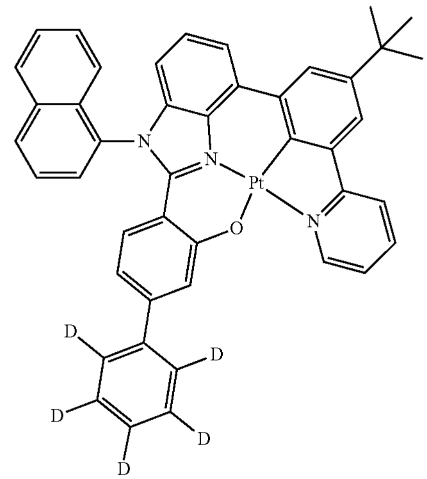
15
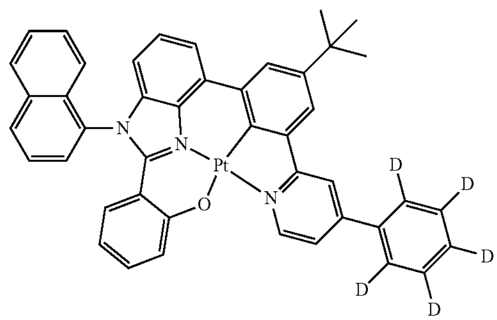
16
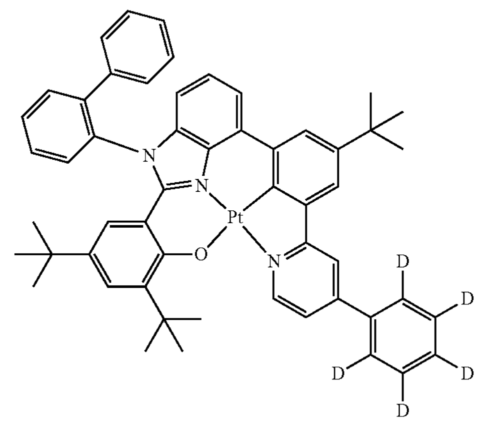
17
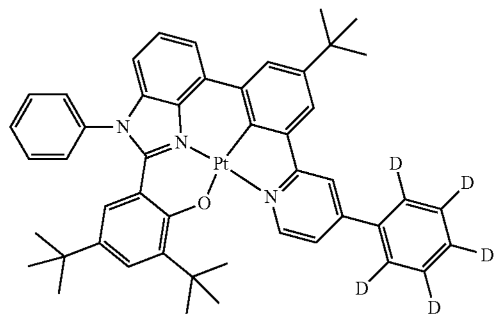
18
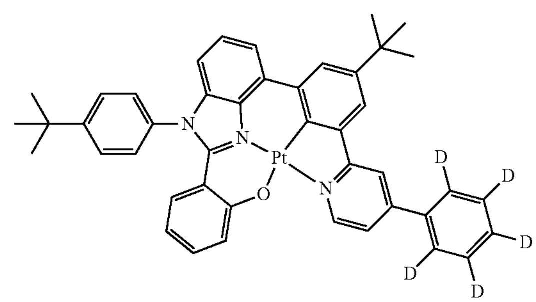
19
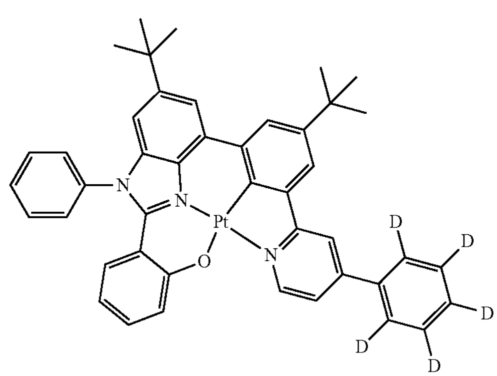
20
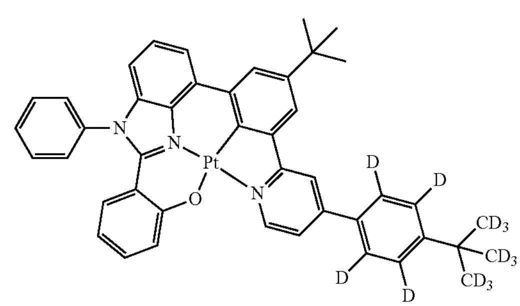

-continued
21
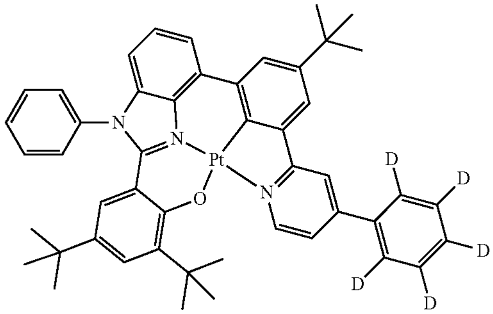
22
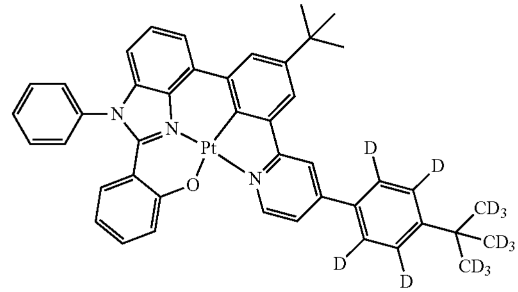
23
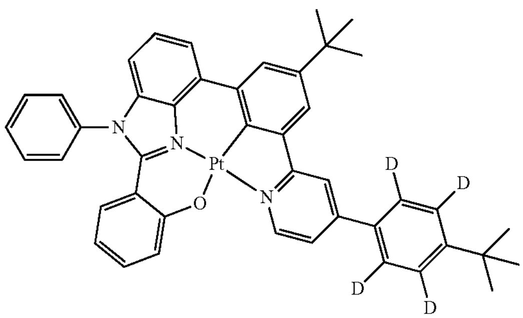
24
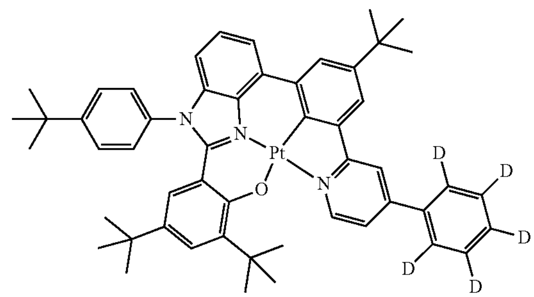
25
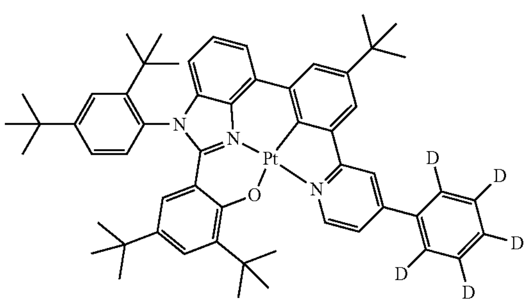
26
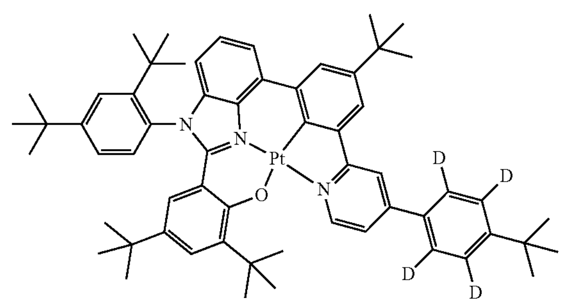
27
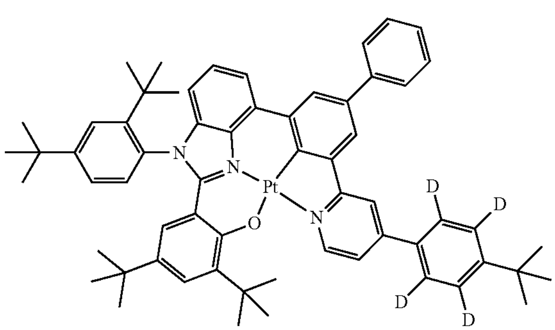
28
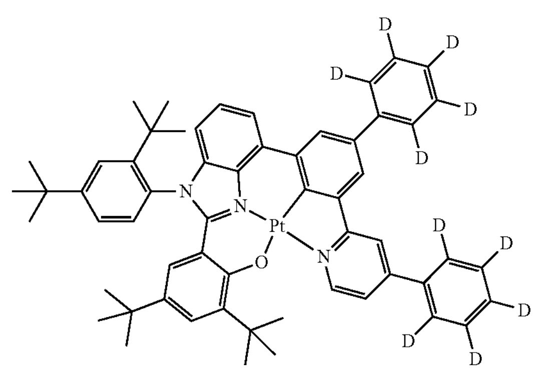

-continued
29
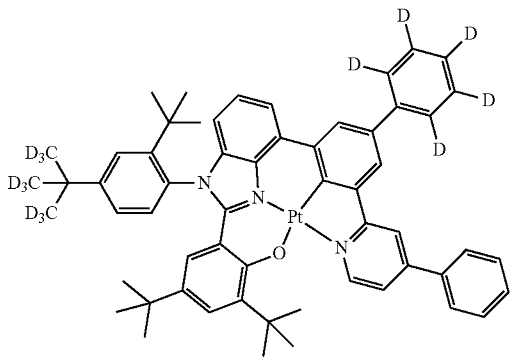
30
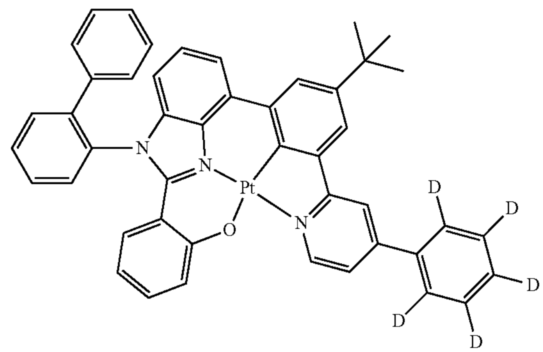
31
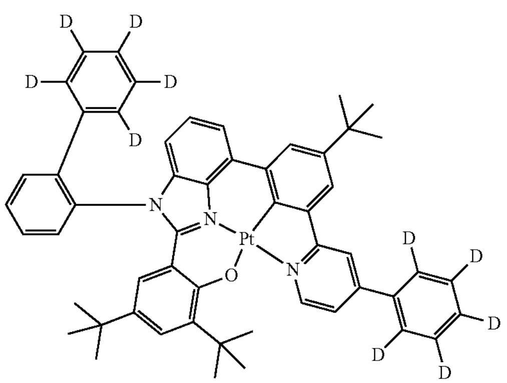
32
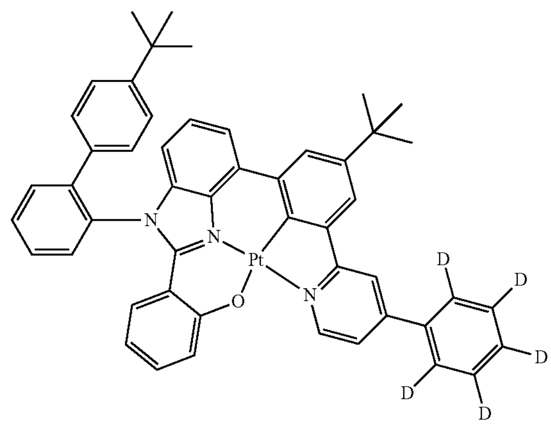
33
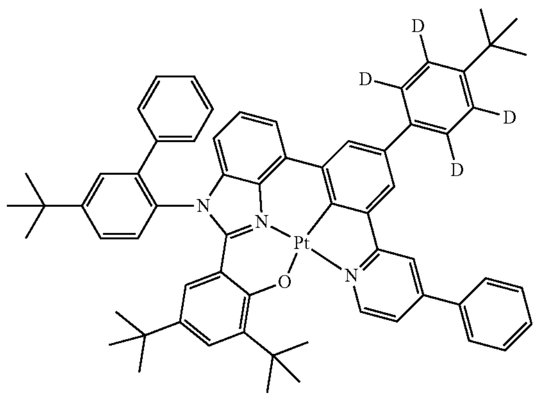
34
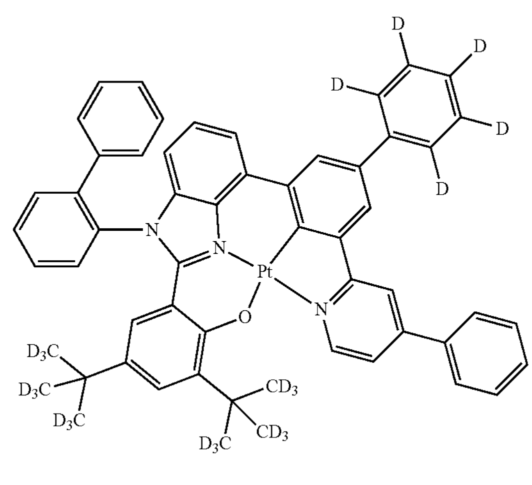
35
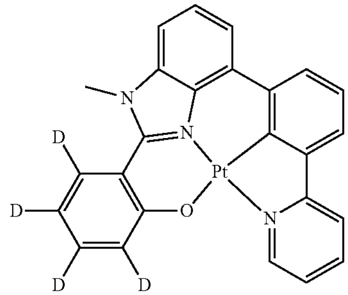
36
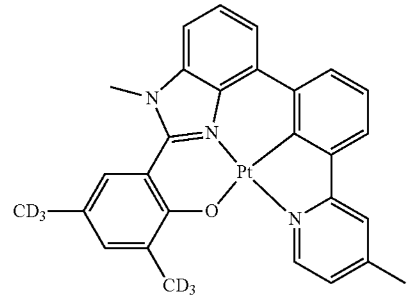

-continued
37
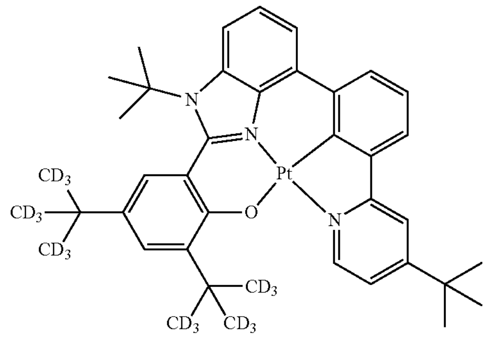
38
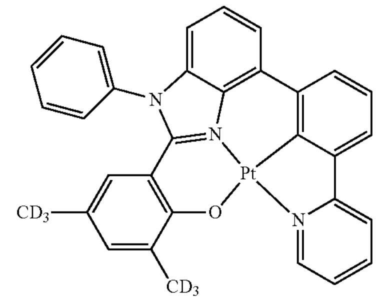
39
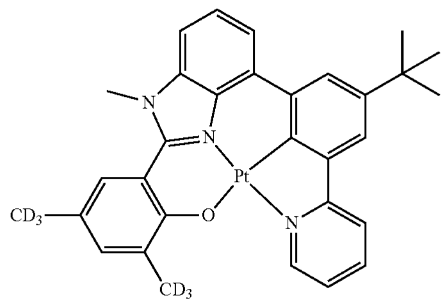
40
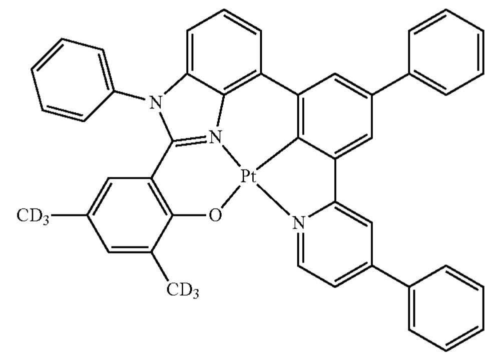
41
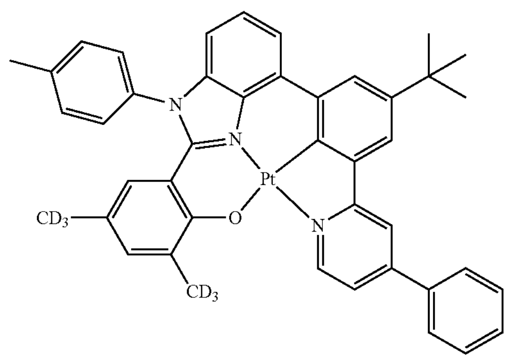
42
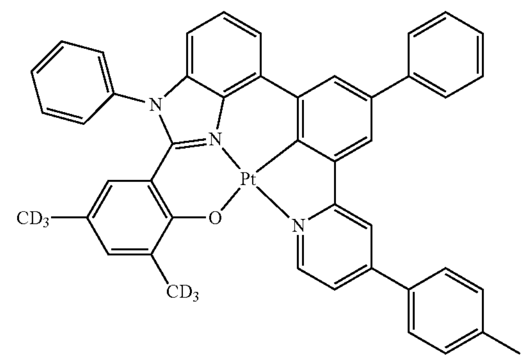
43
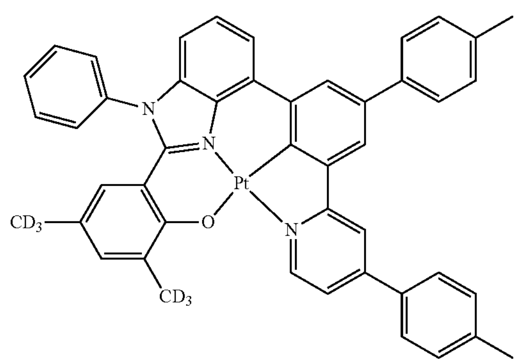
44
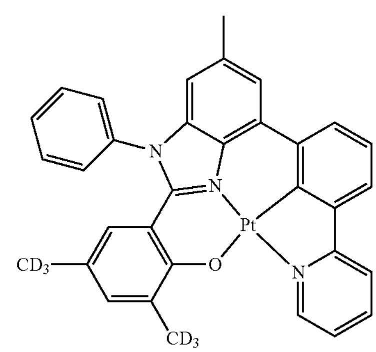

-continued
45
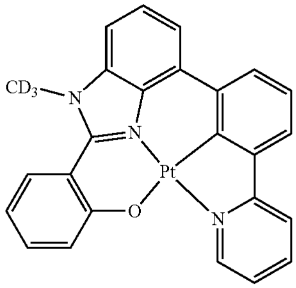
46
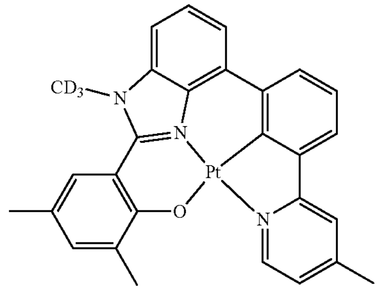
47
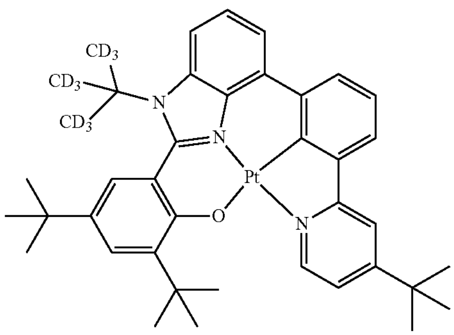
48
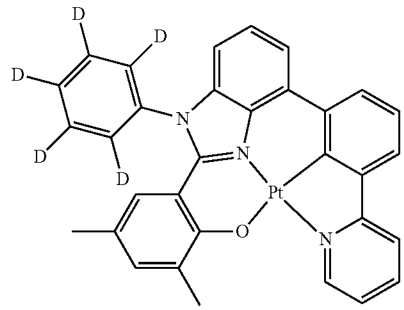
49
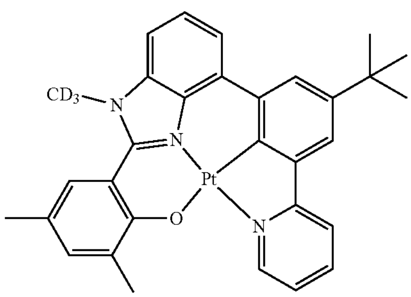
50
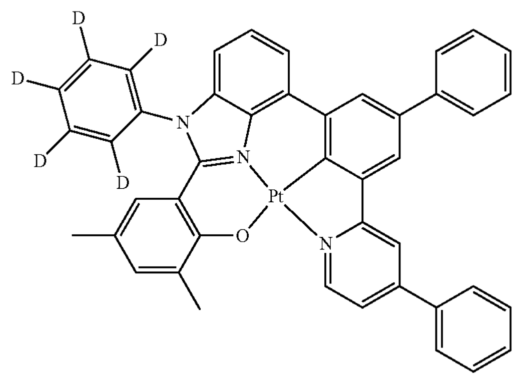
51
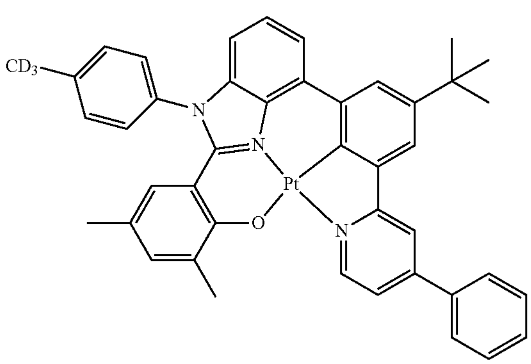
52
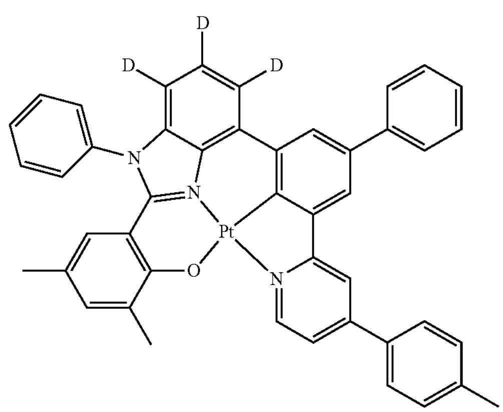

-continued
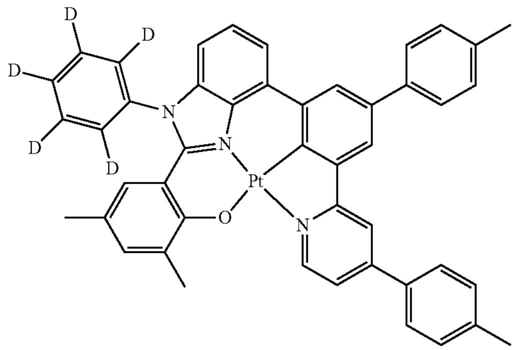
53
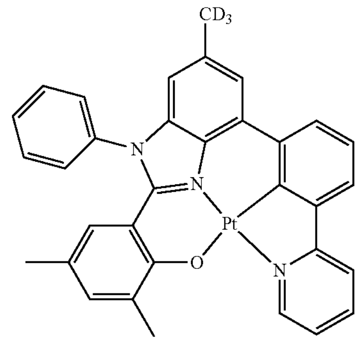
54
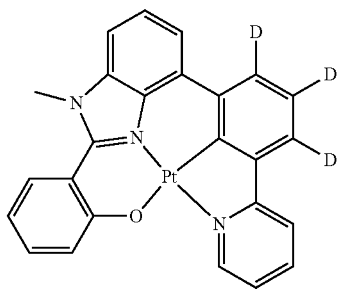
55
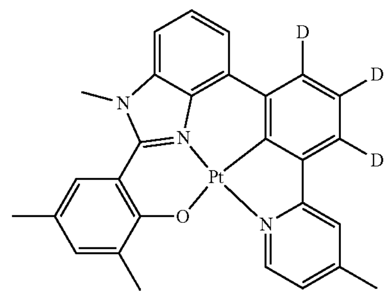
56
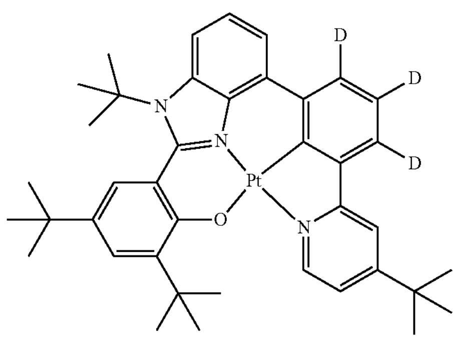
57
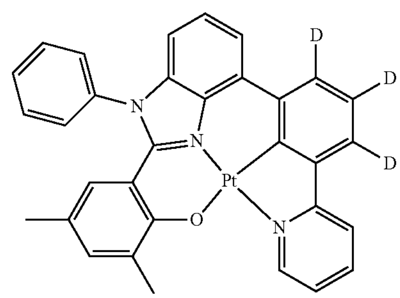
58
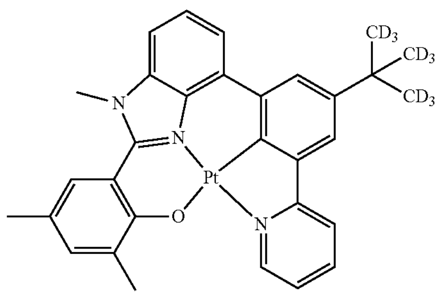
59
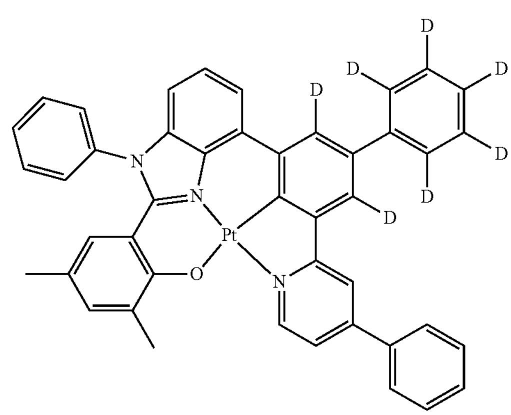
60

-continued
61
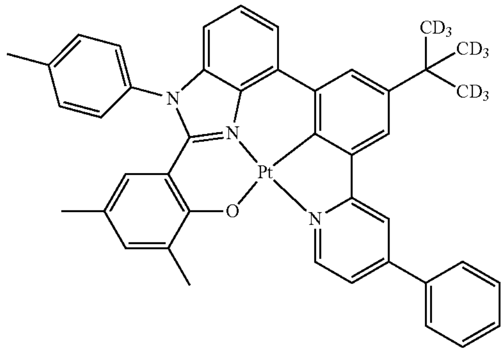
62
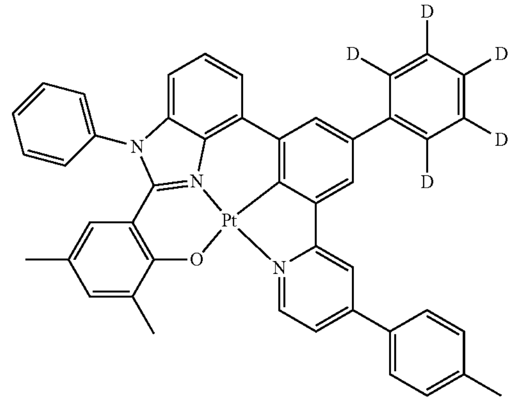
63
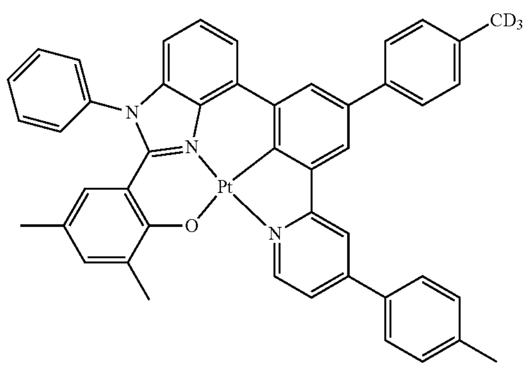
64
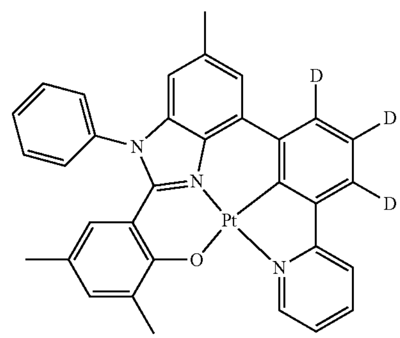
65
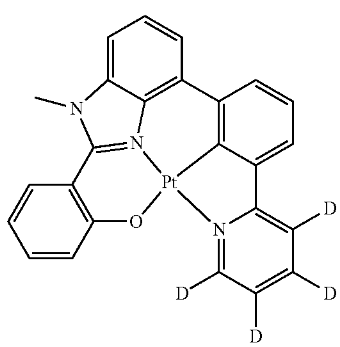
66
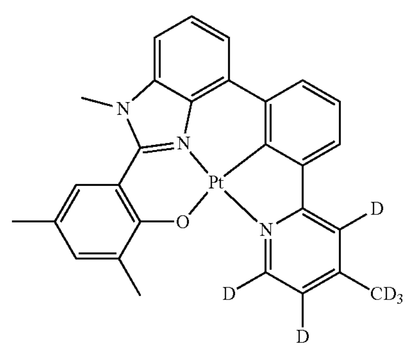
67
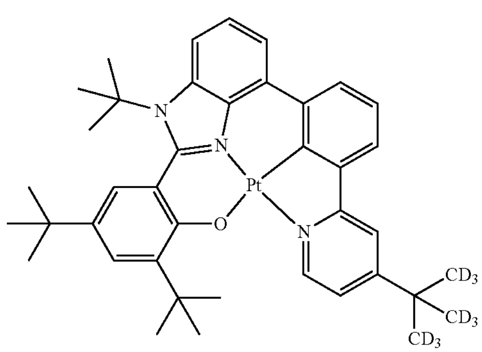
68
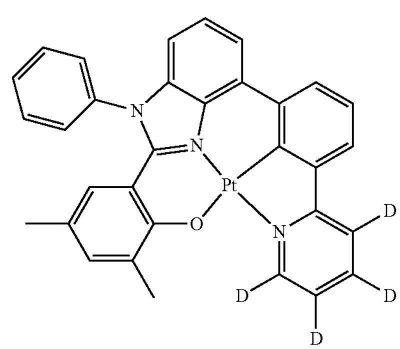

-continued
69
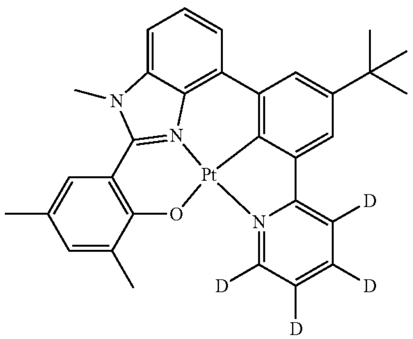
70
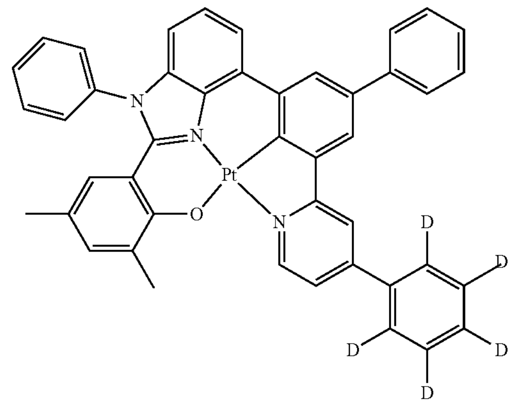
71
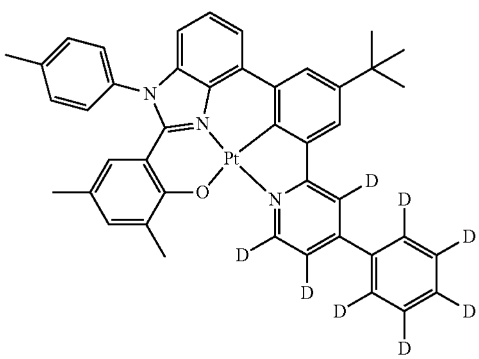
72
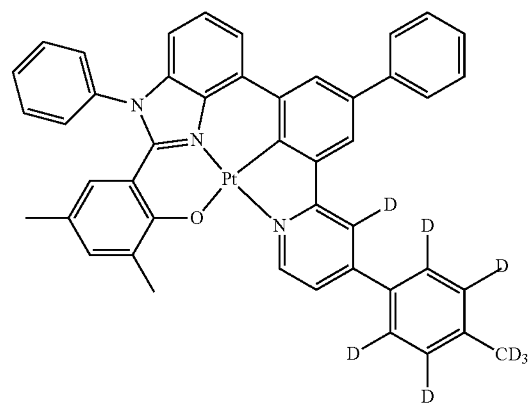
73
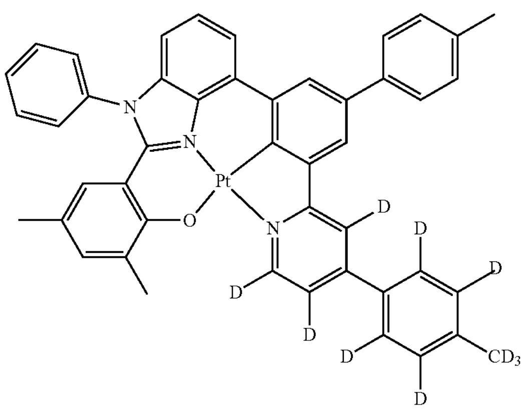
74
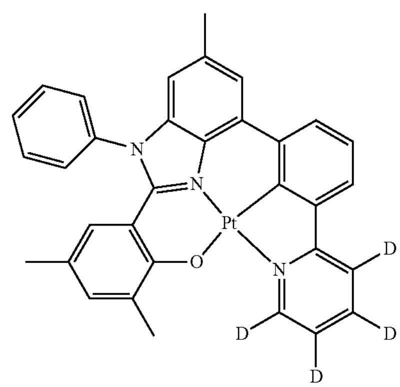
75
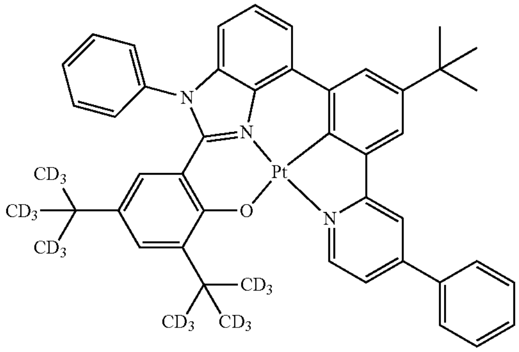
76
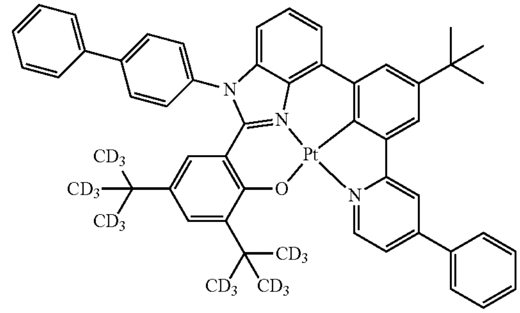

-continued
77
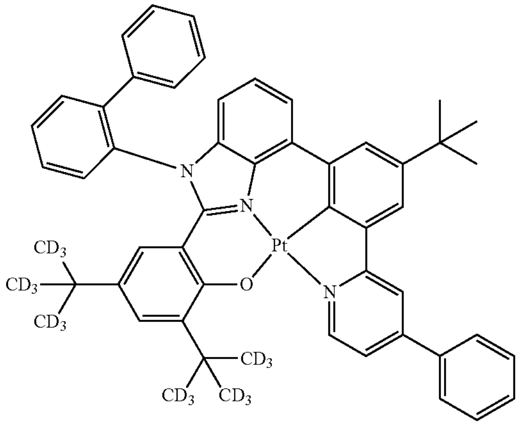
78
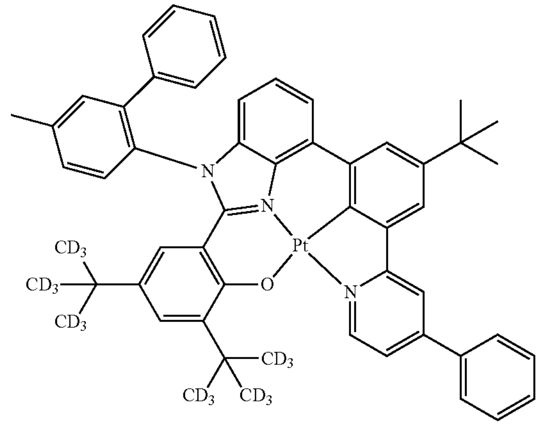
79
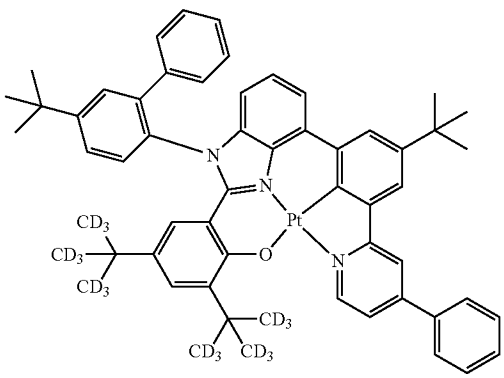
80
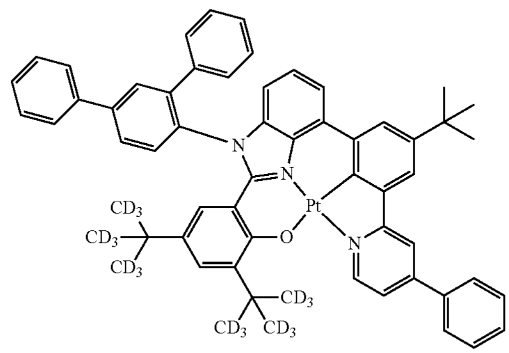
81
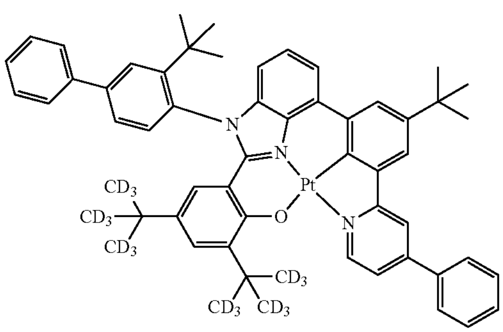
82
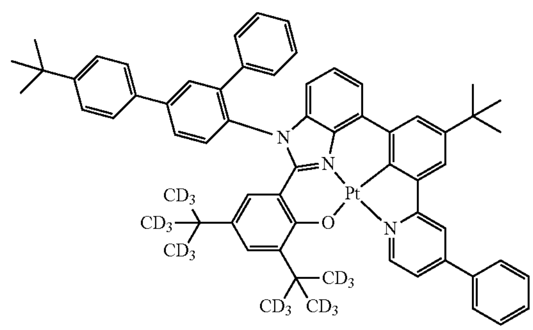
83
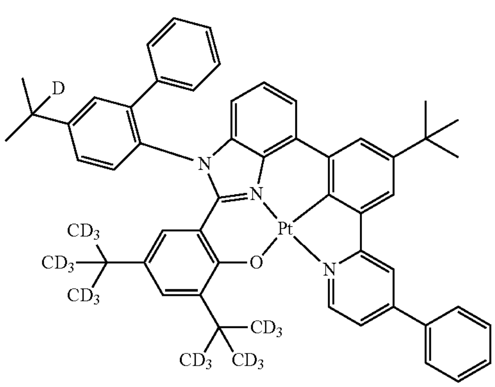
84
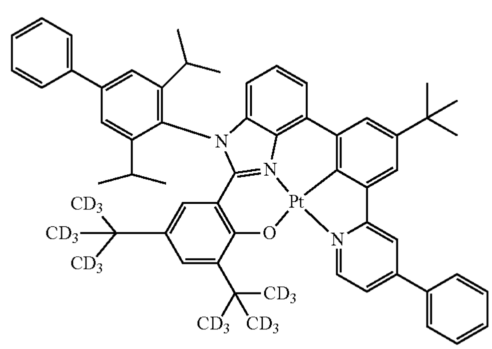

-continued
85
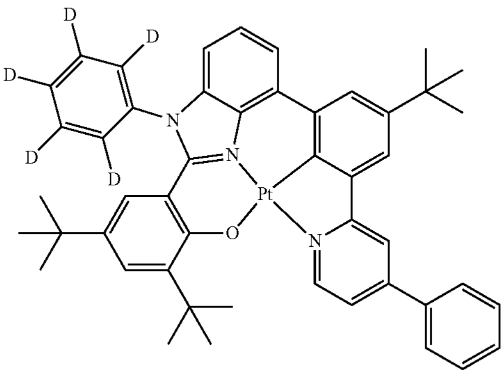
86
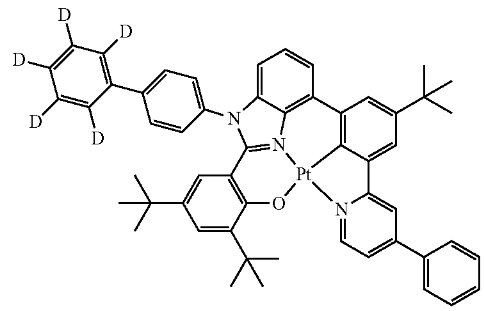
87
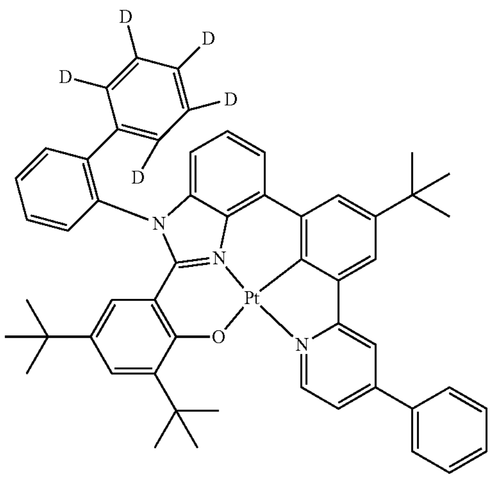
88
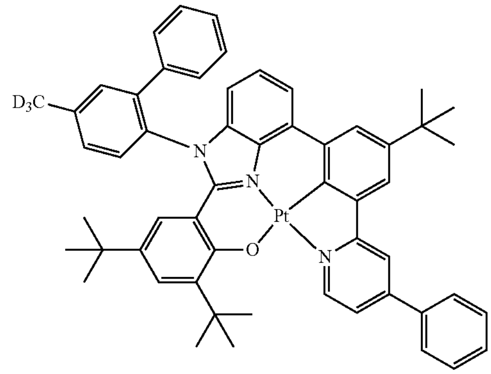
90
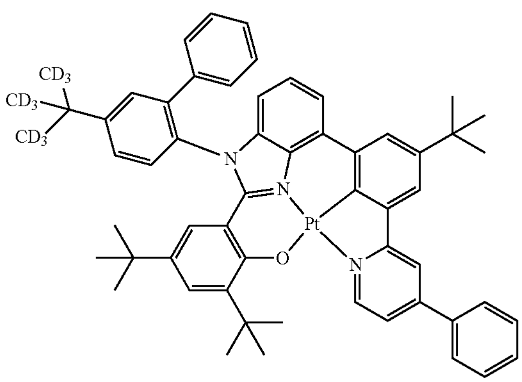
89
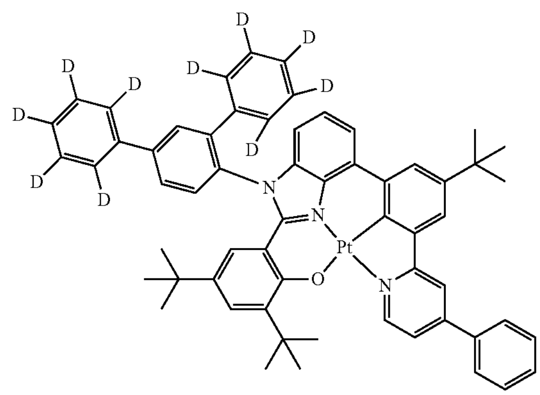
91
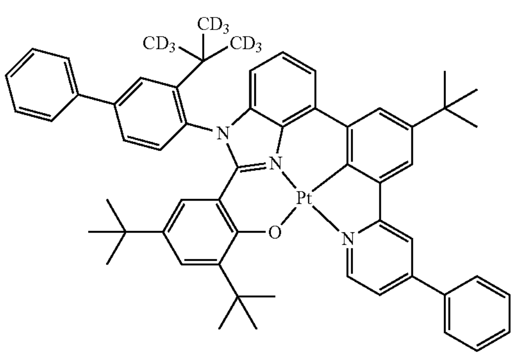
92
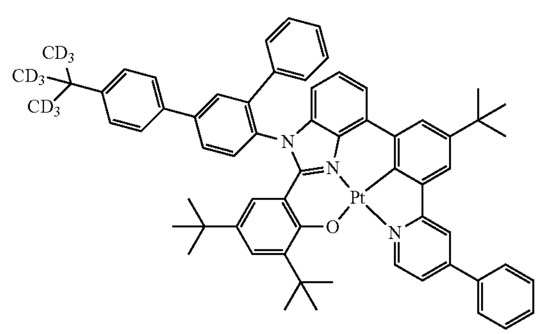

-continued
93
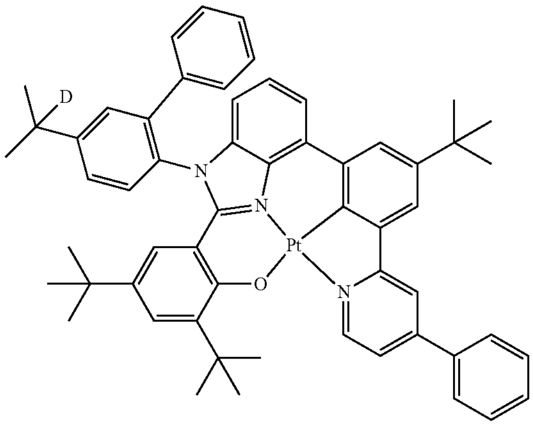
94
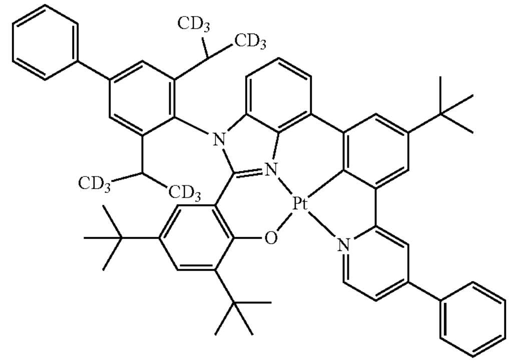
95
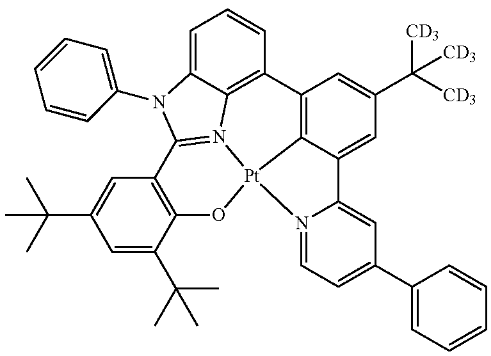
96
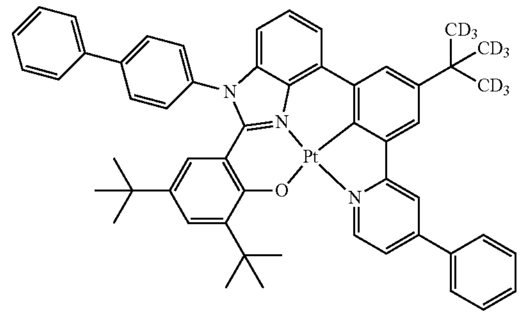
97
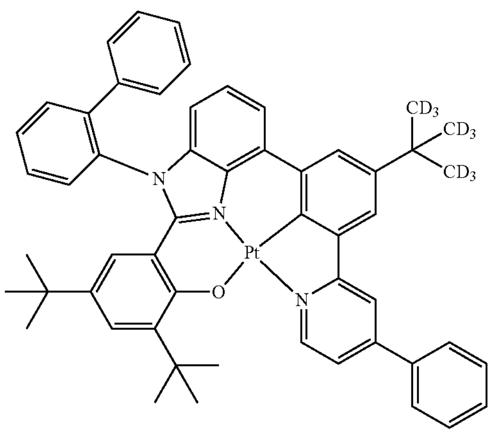
98
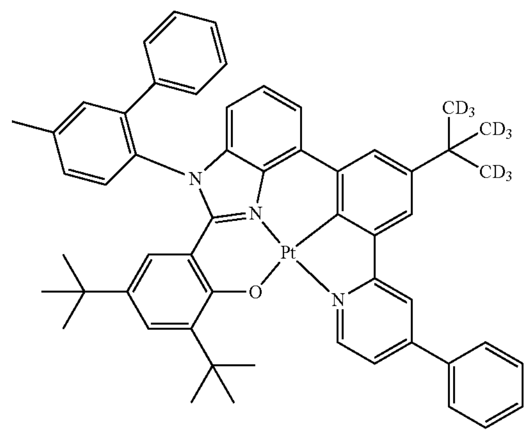
99
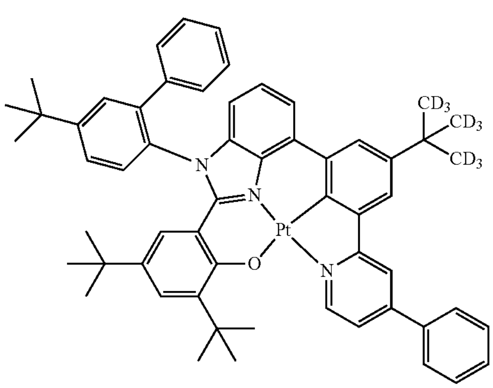
100
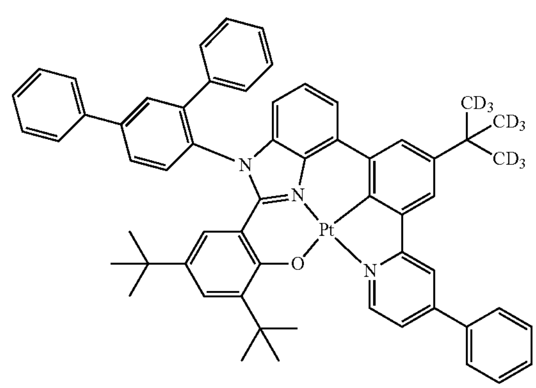

-continued
101
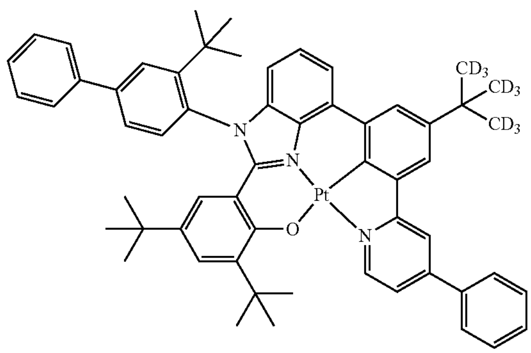
102
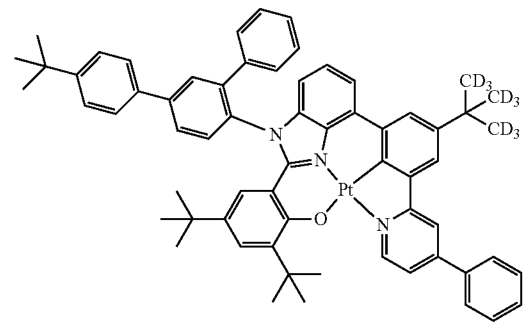
103
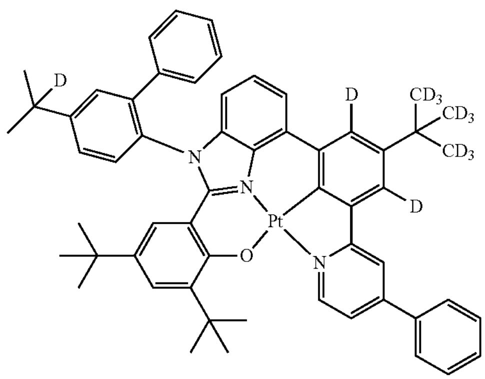
104
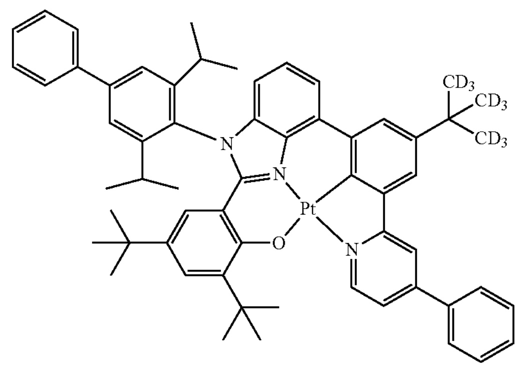
105
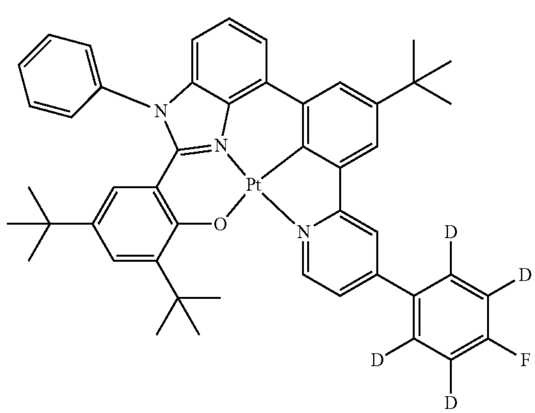
106
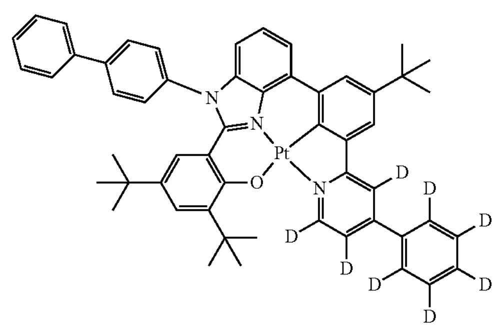
107
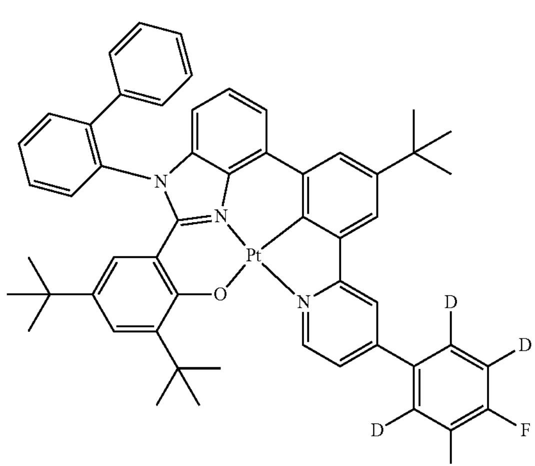
108
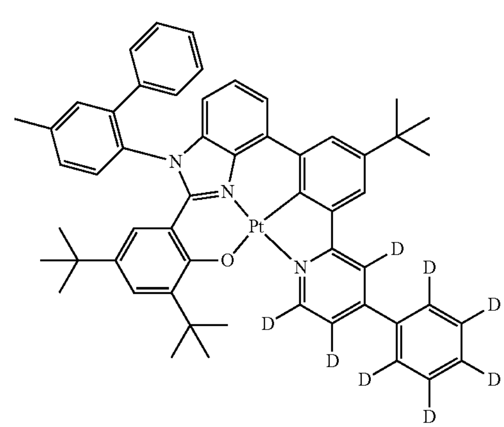

-continued
109
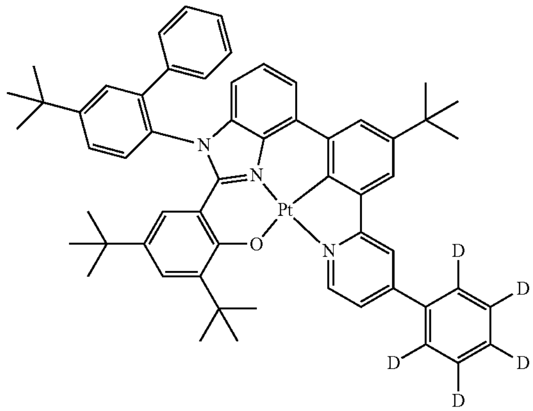
110
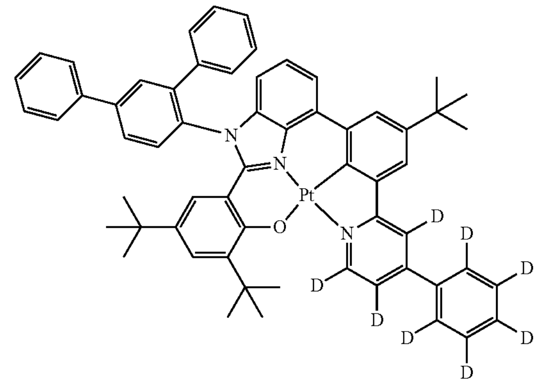
111
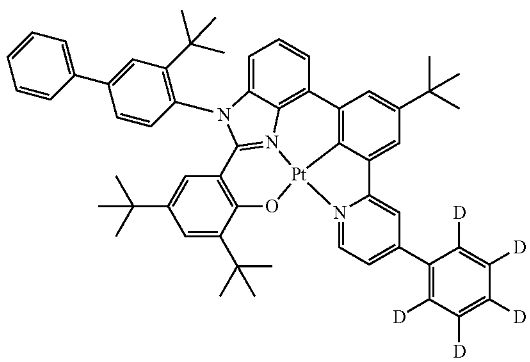
112
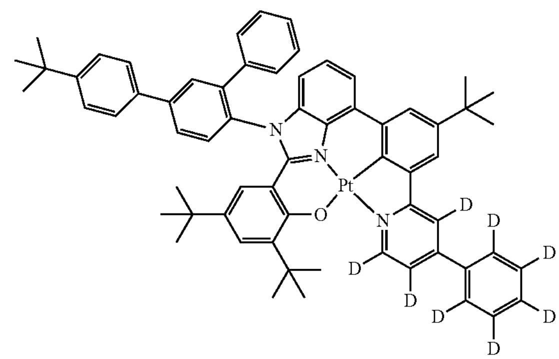
113
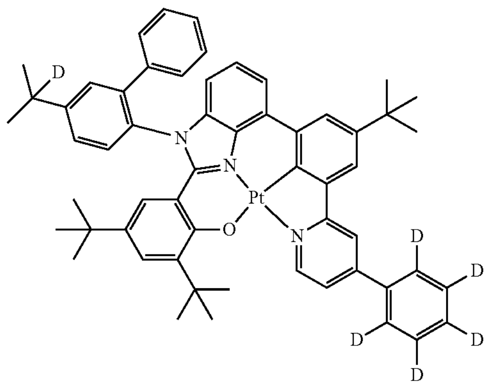
114
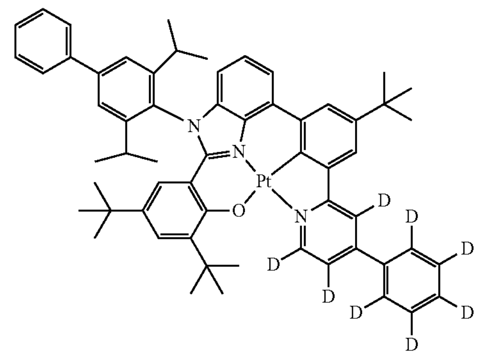
115
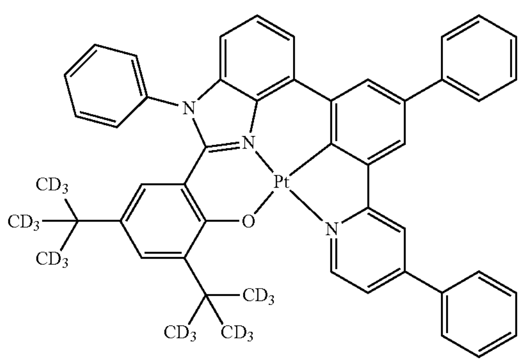
116
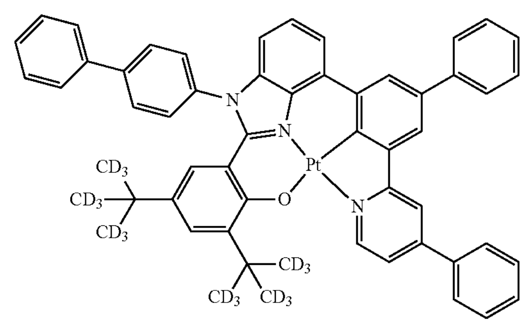

-continued
117
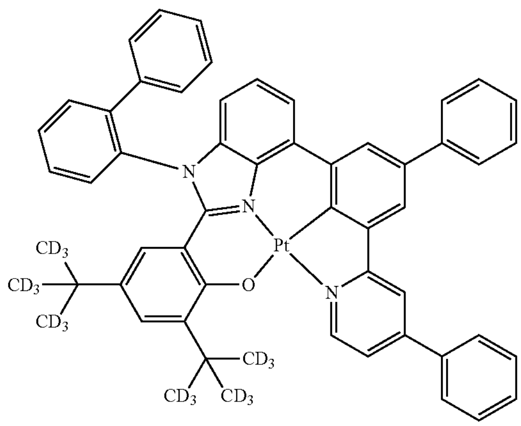
118
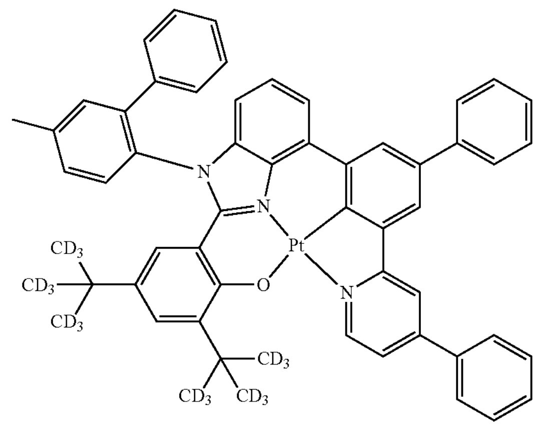
119
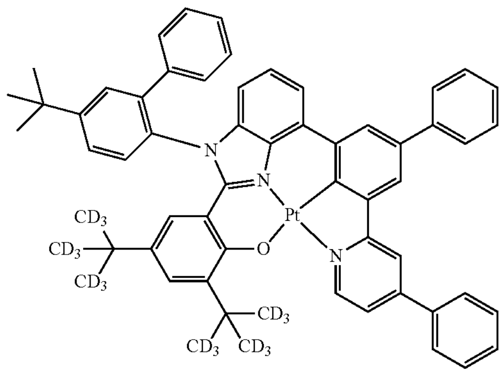
120
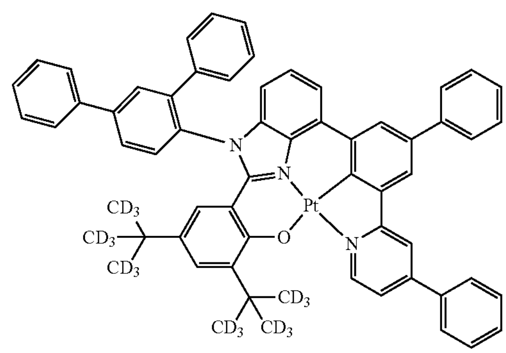
121
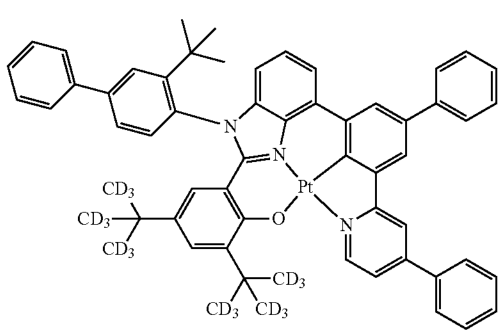
122
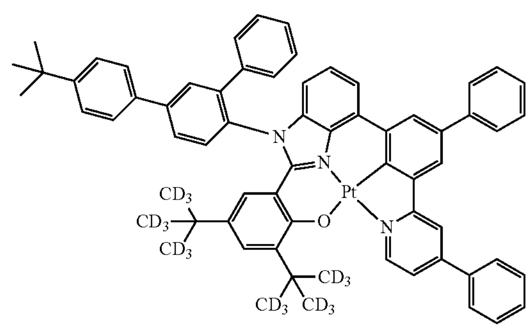
123
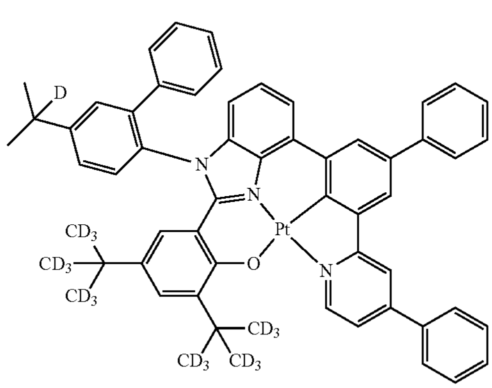
124
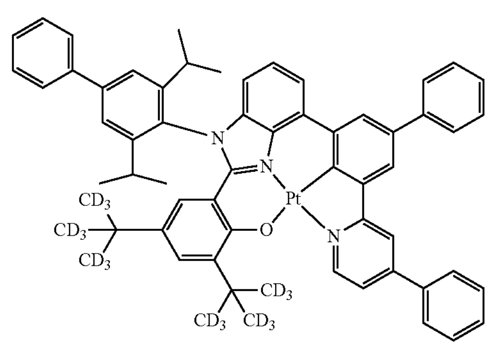

-continued
125
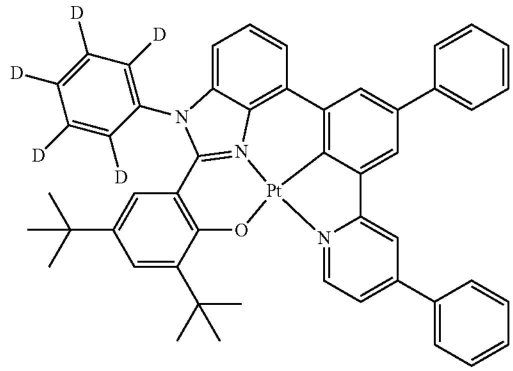
126
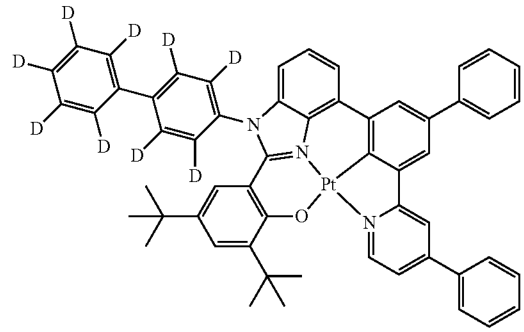
127
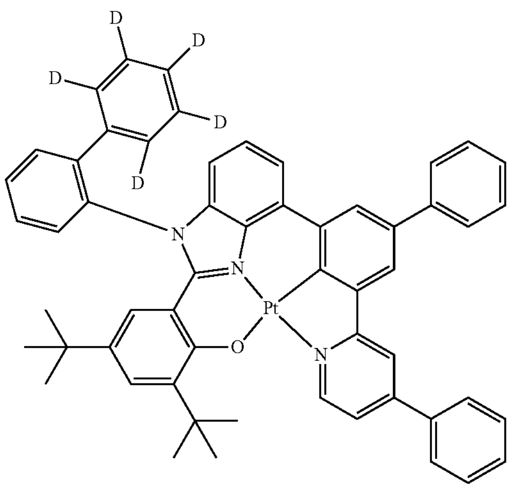
128
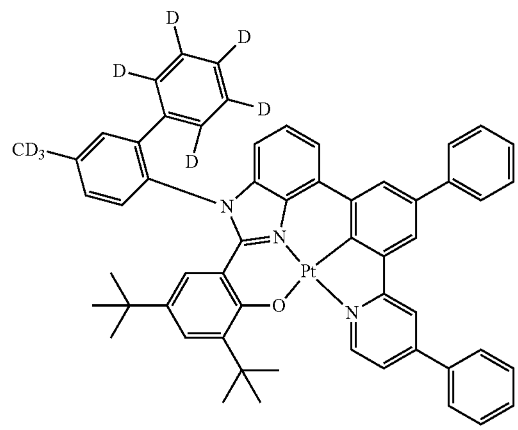
129
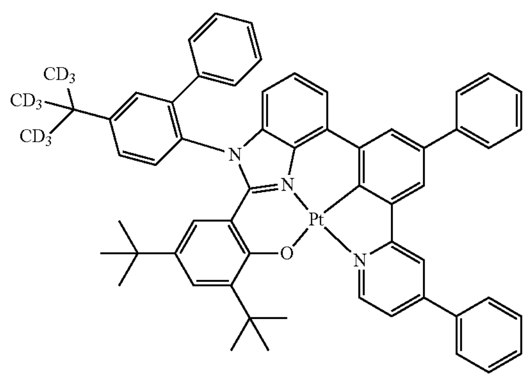
130
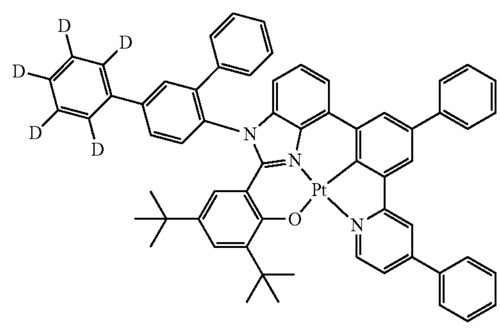
131
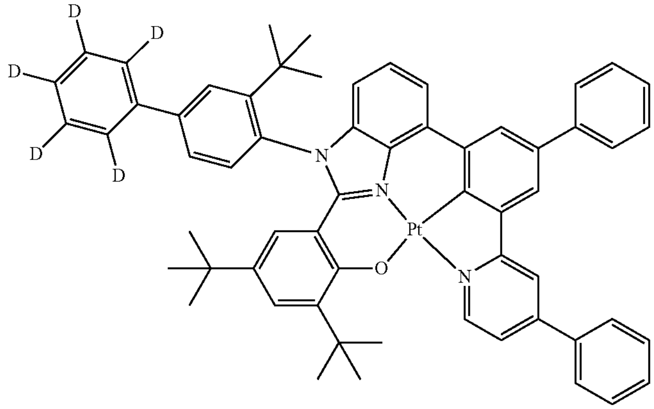

-continued
132
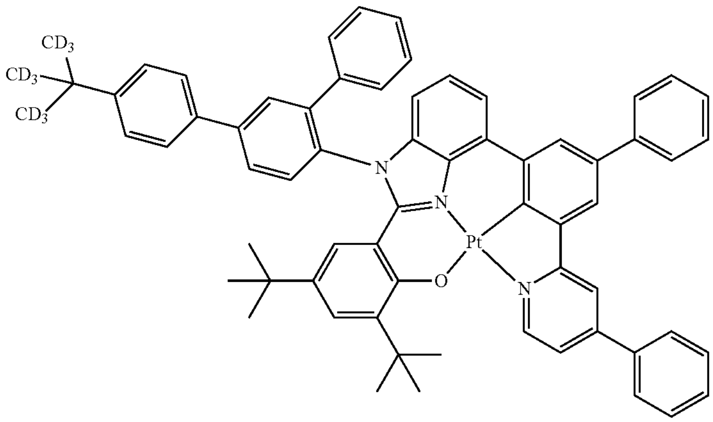
133
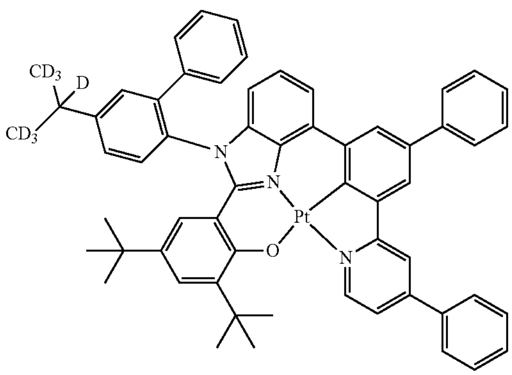
134
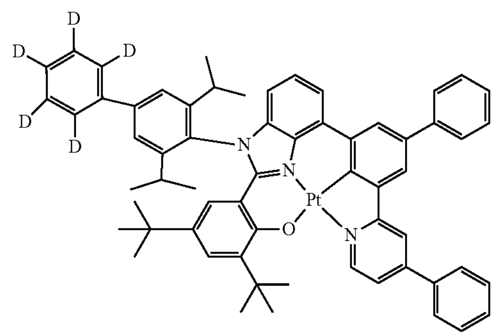
135
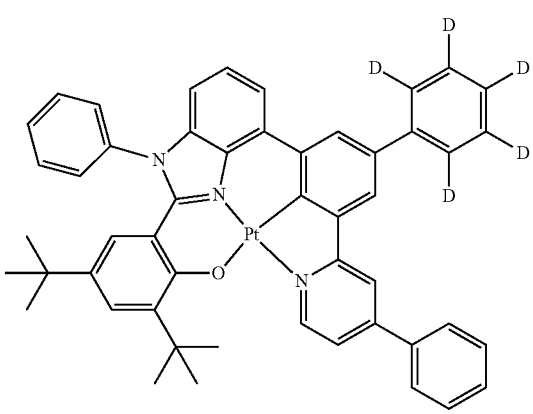
136
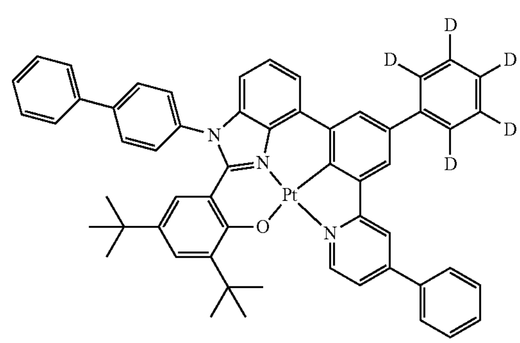

-continued
137
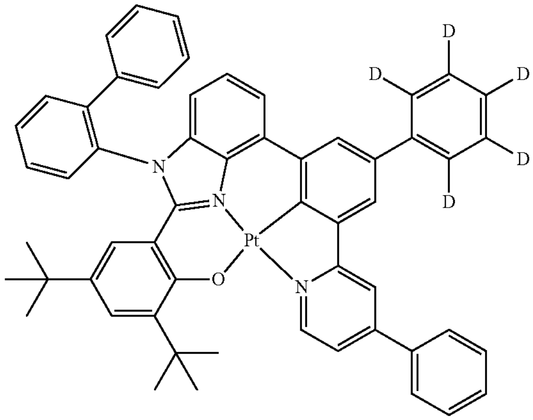
138
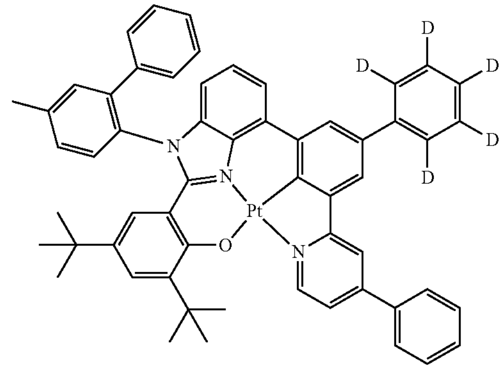
139
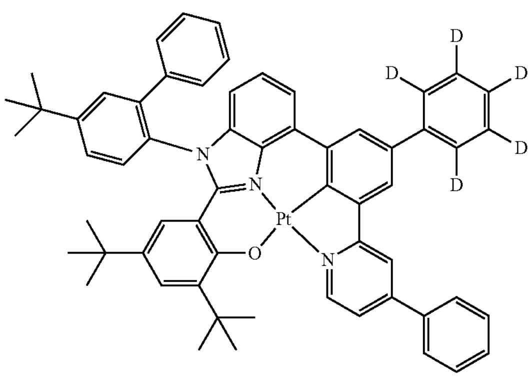
140
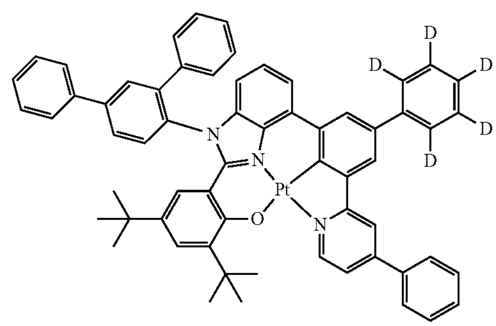
141
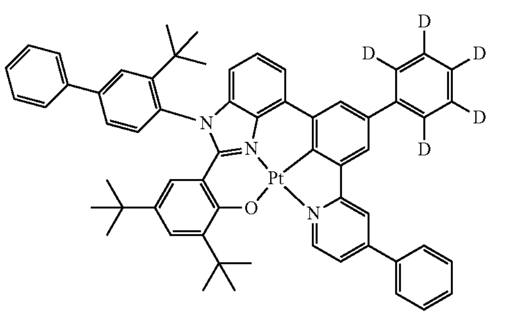
142
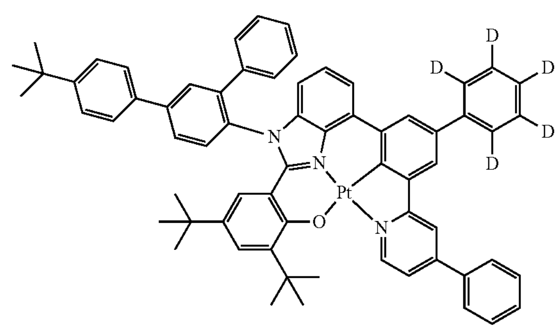
143
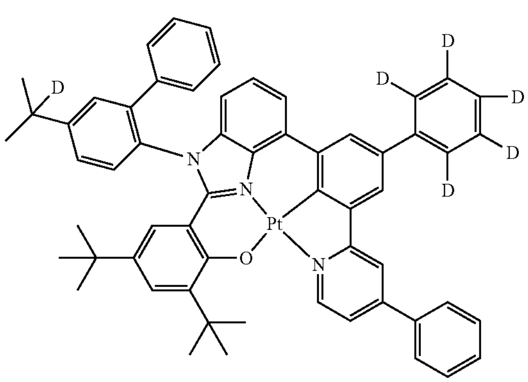
144
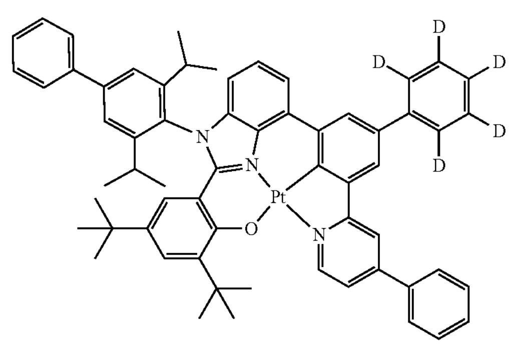

-continued
145
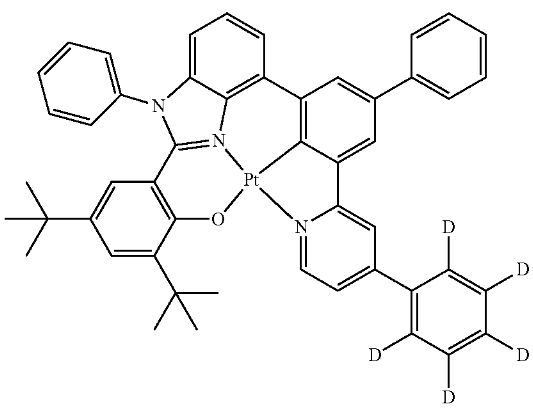
146
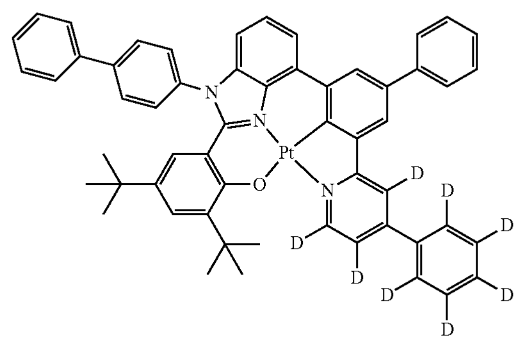
147
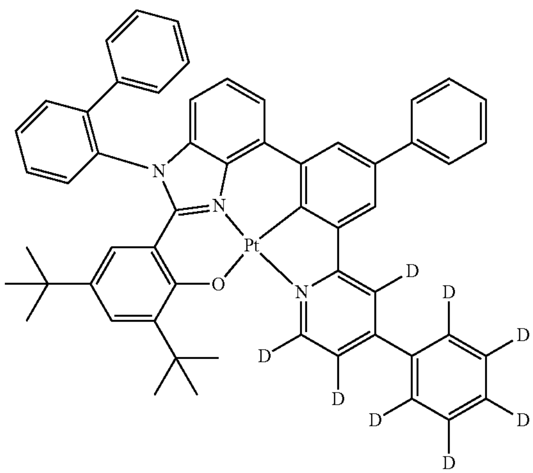
148
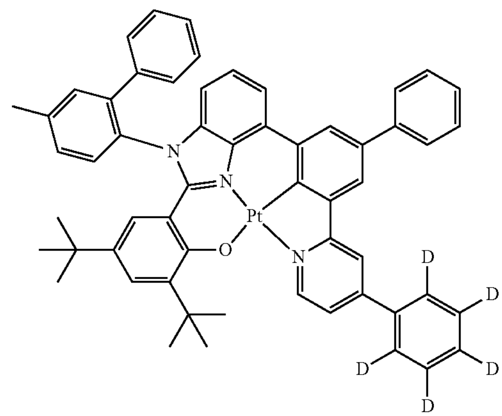
149
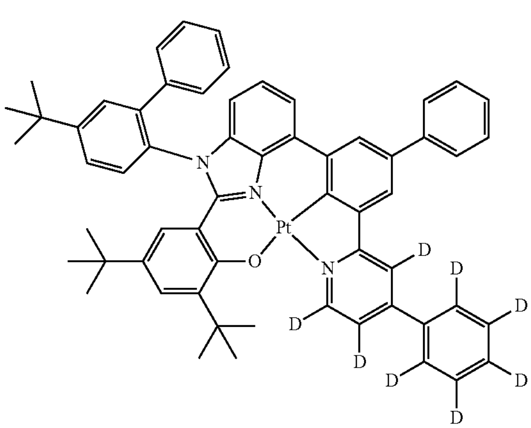
150
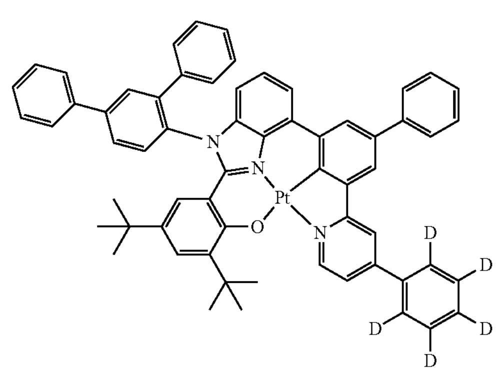

-continued
151
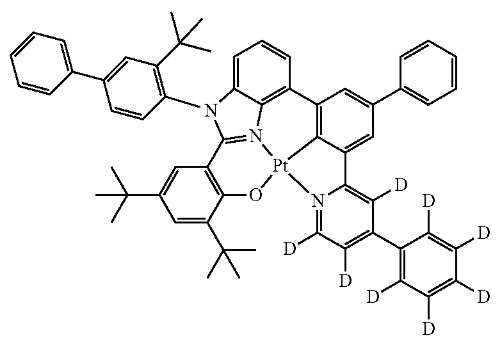
152
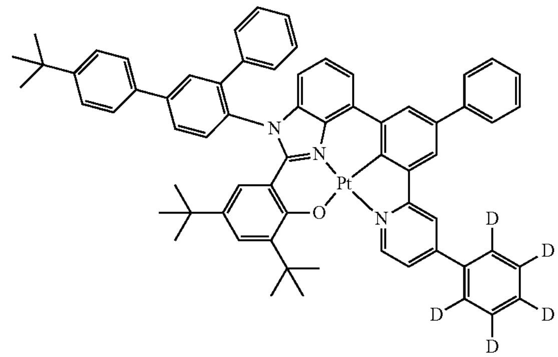
153
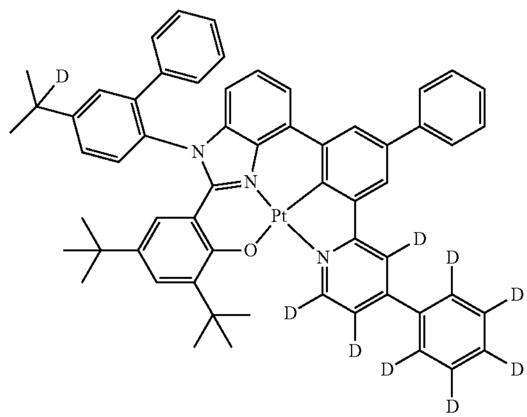
154
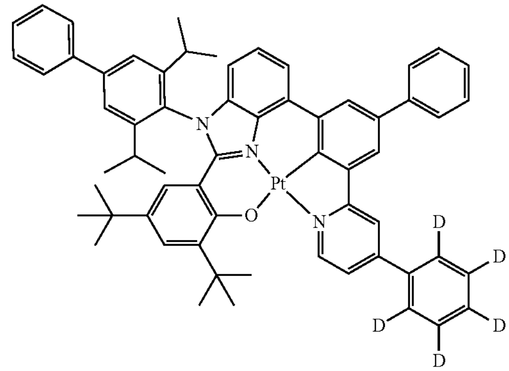
155
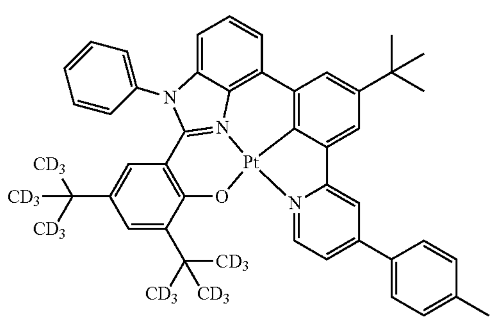
156
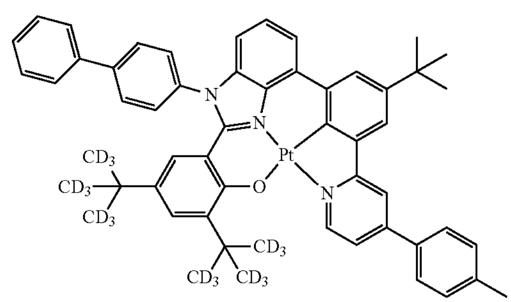
157
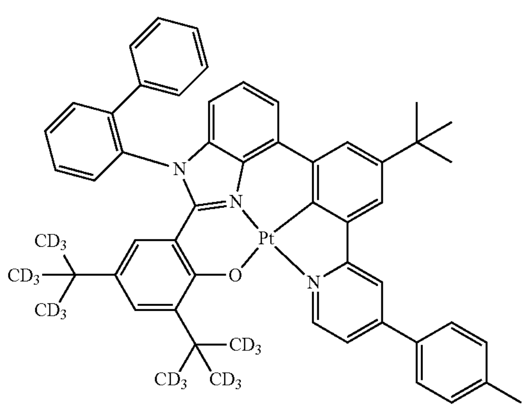
158
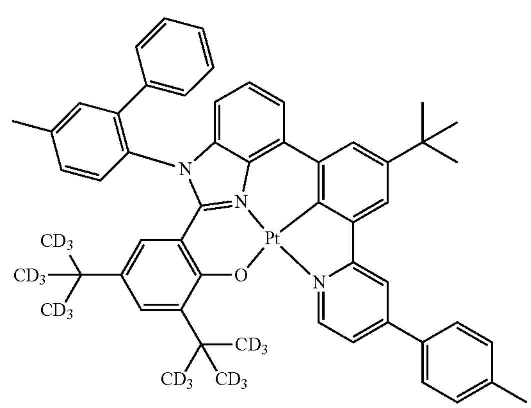

-continued
159
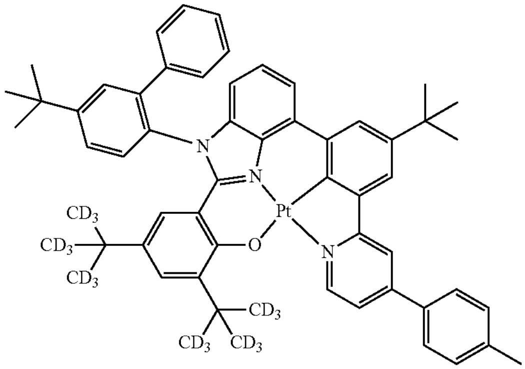
160
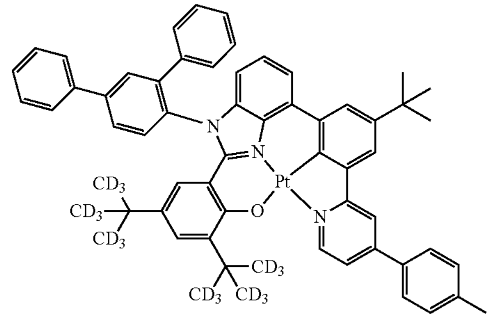
161
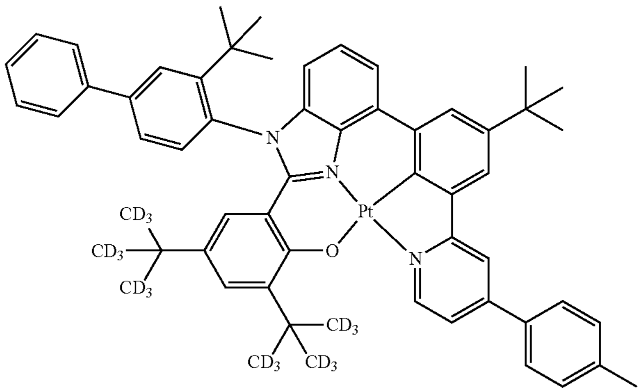
162
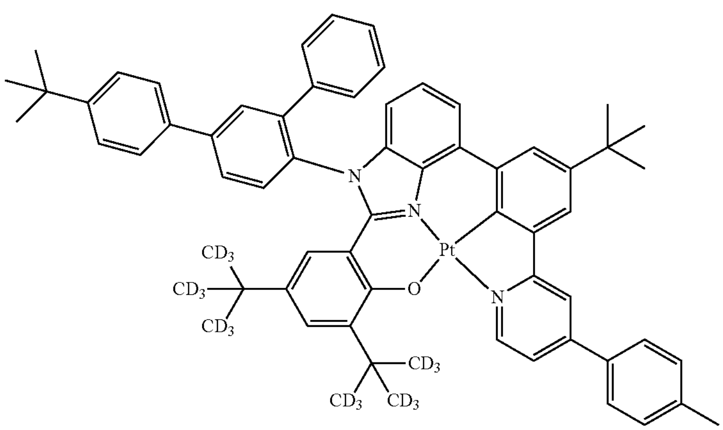
163
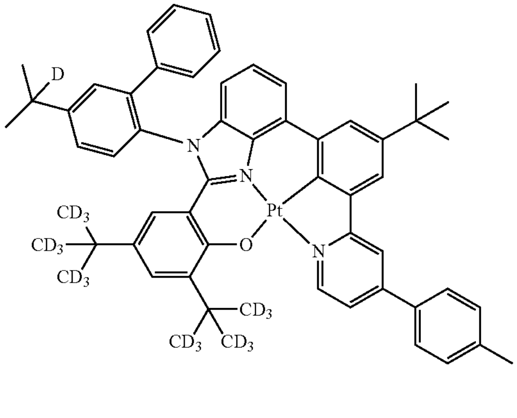
164
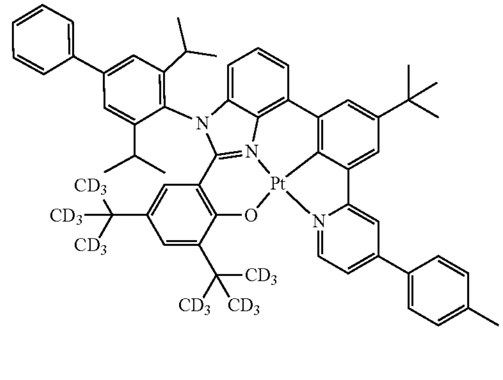

-continued
165
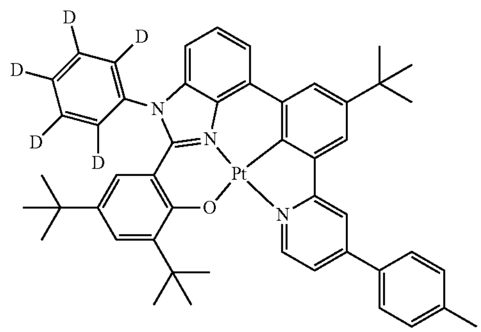
166
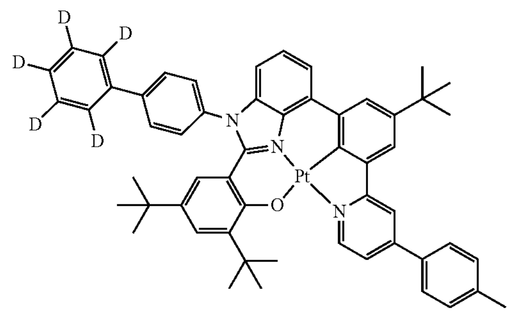
167
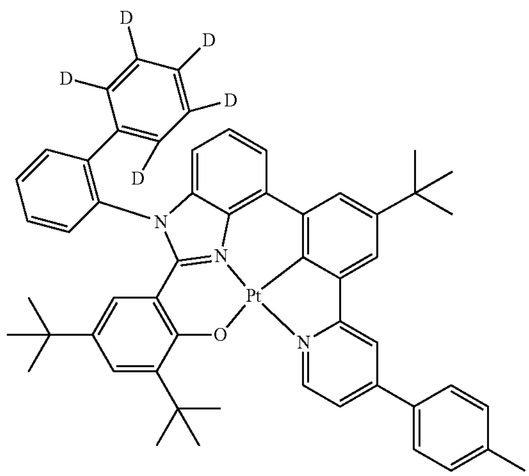
168
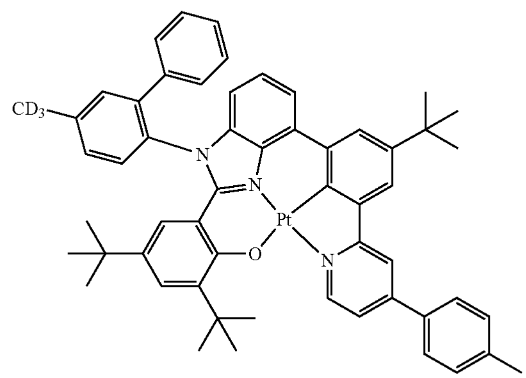
169
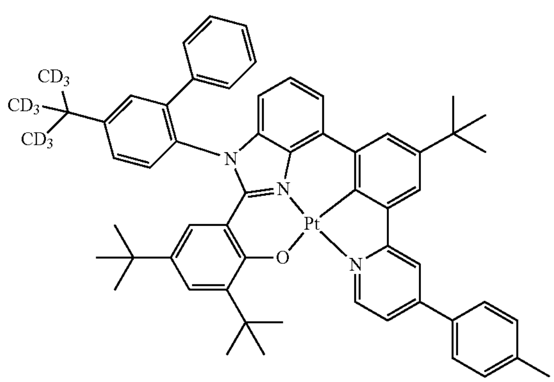
170
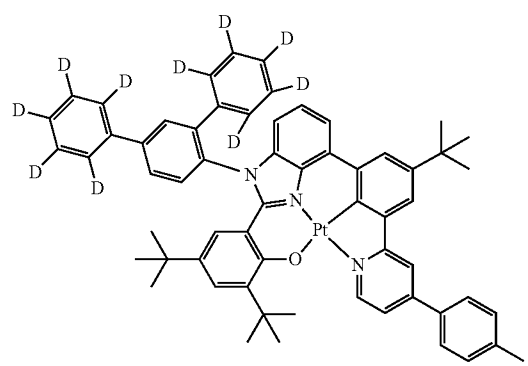
171
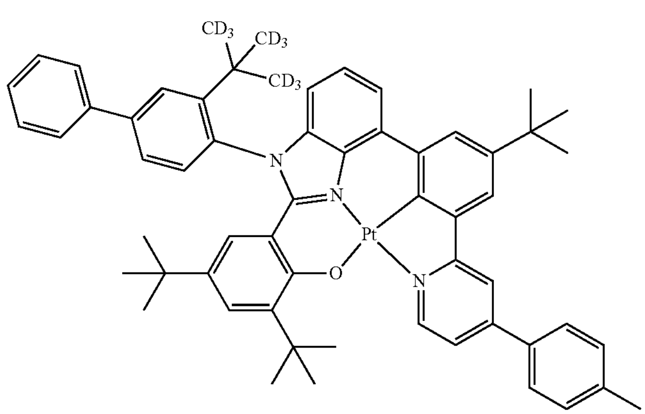

-continued
172
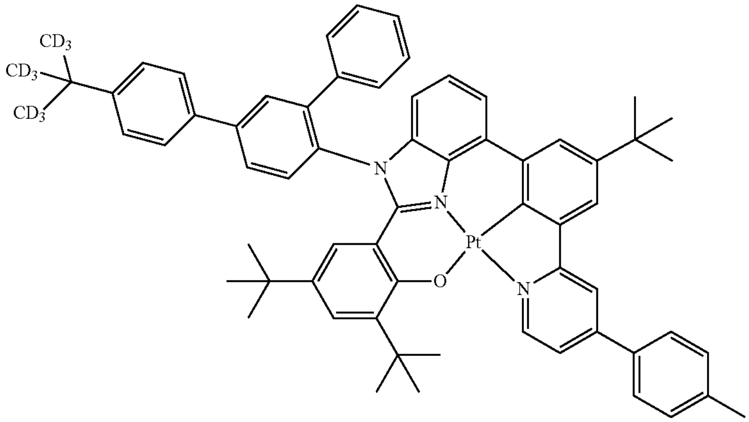
173
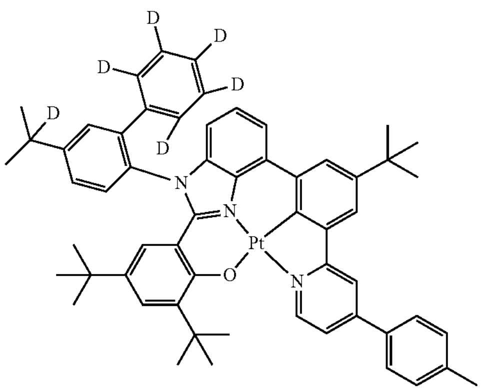
174
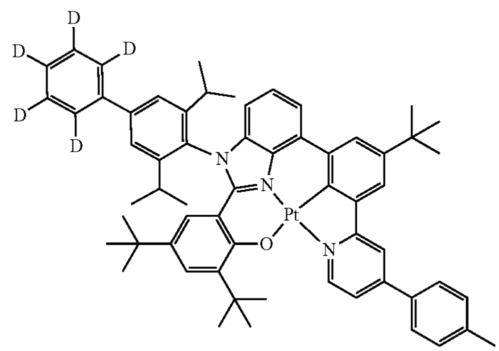
175
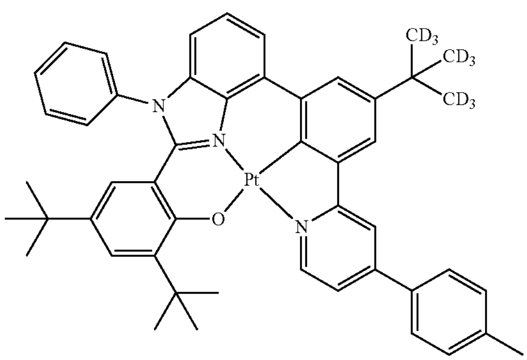
176
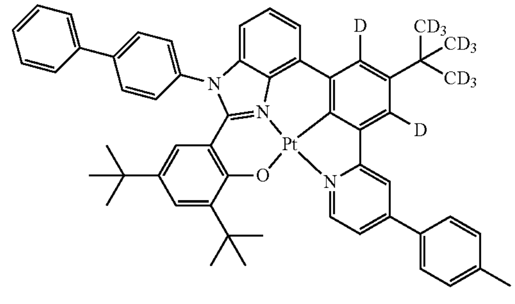
177
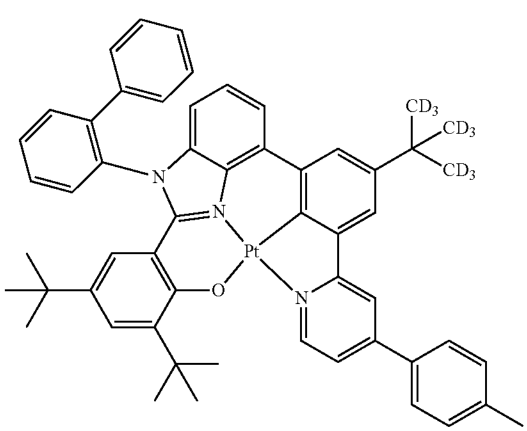
178
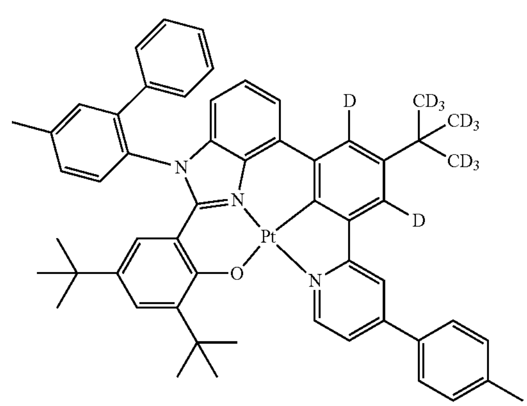

-continued
179
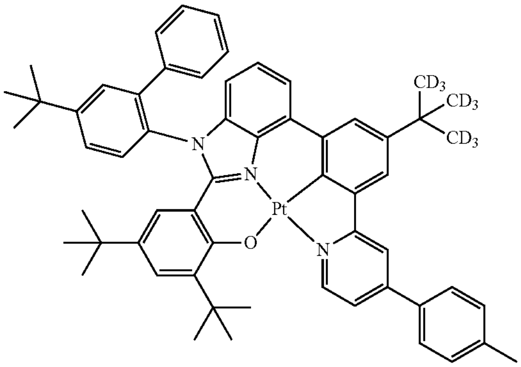
180
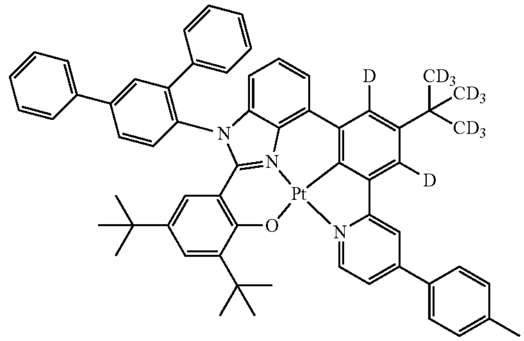
181
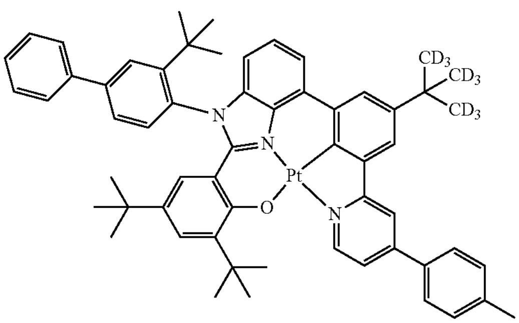
182
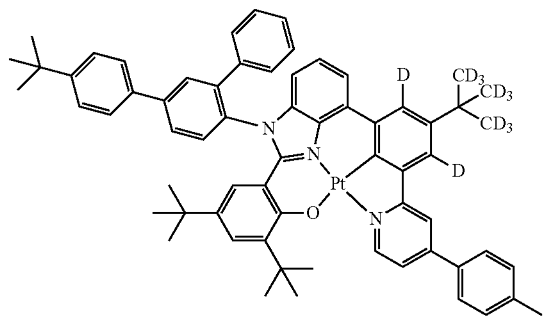
183
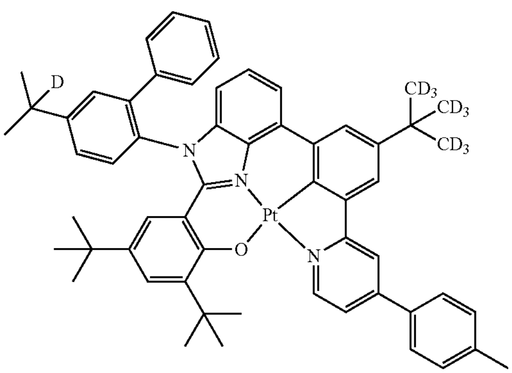
184
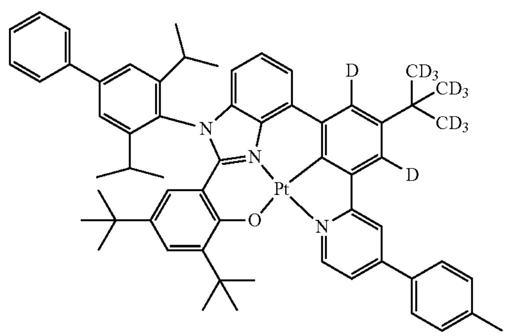
185
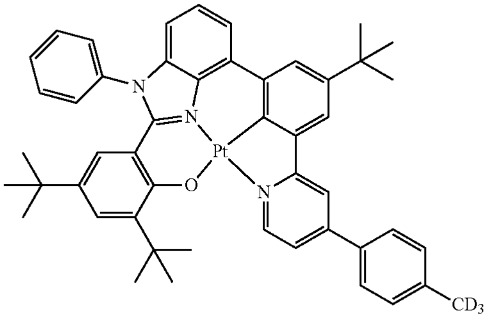
186
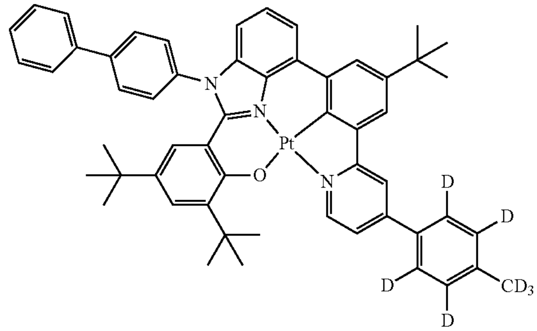

-continued
187
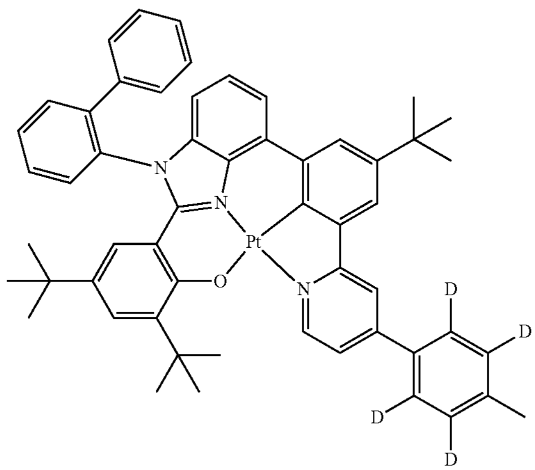
188
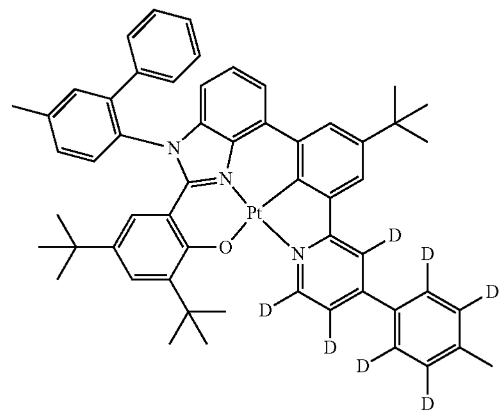
189
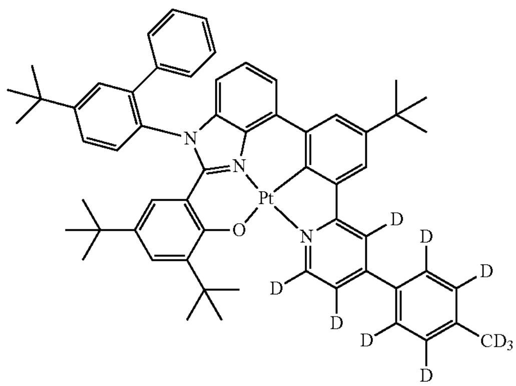
190
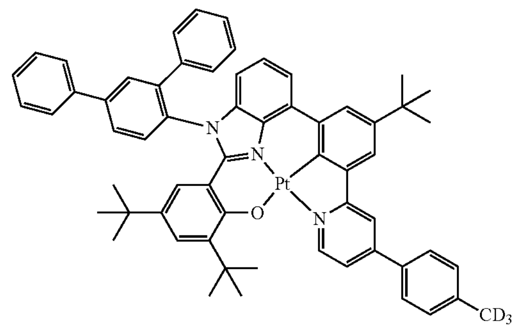
191
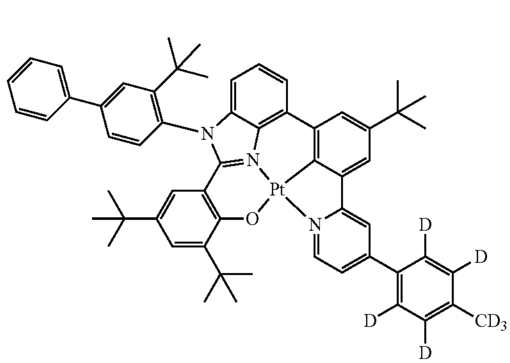
192
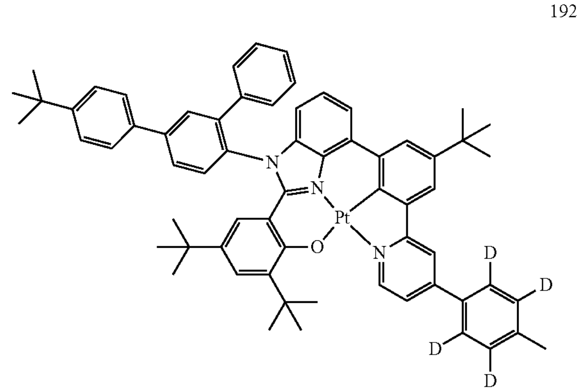

-continued
193
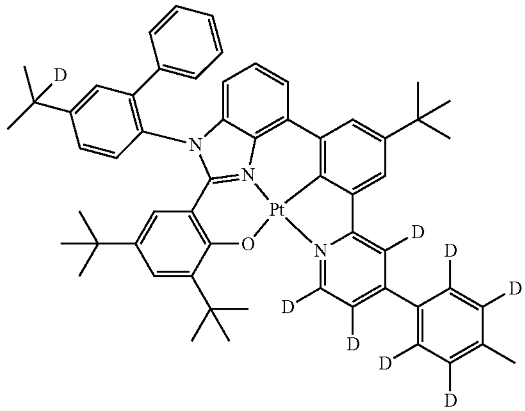
194
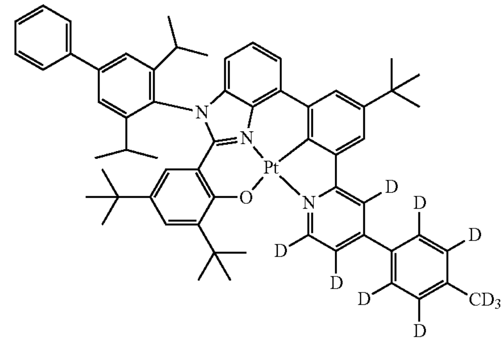
195
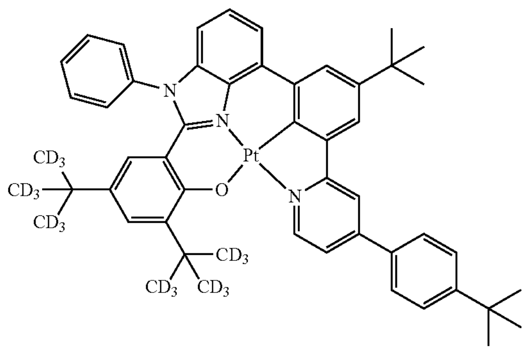
196
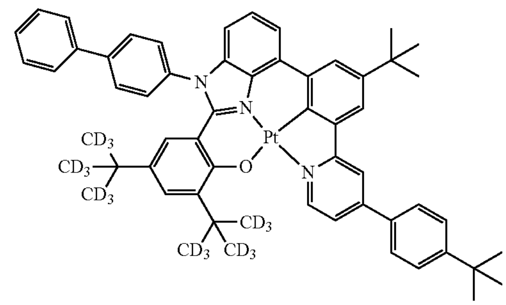
197
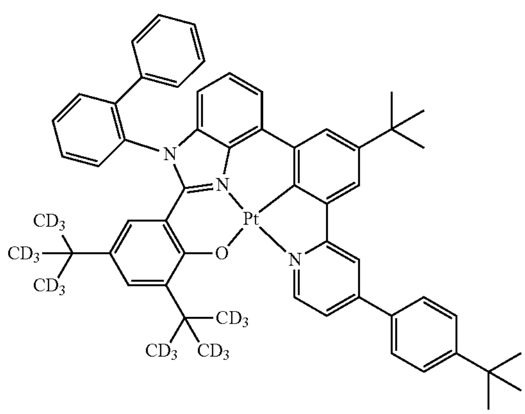
198
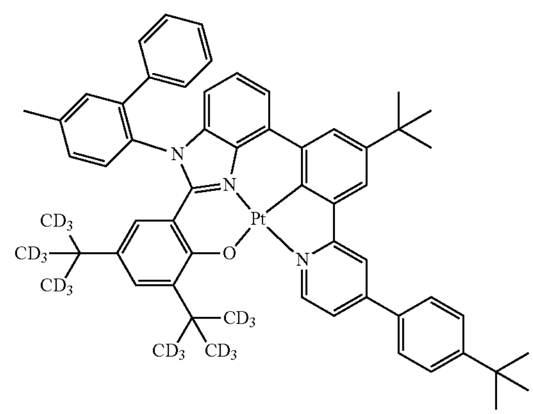
199
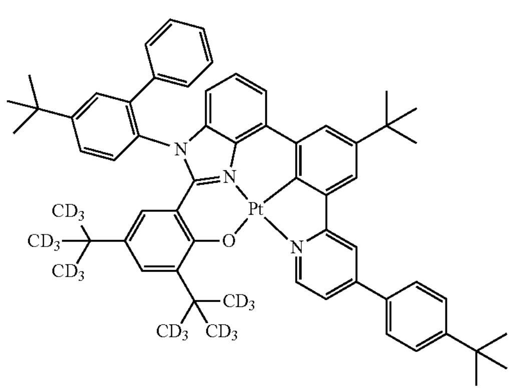
200
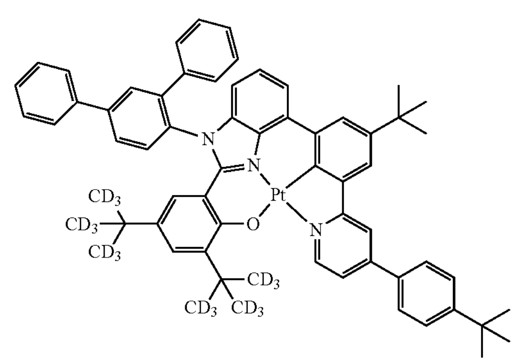

-continued
201
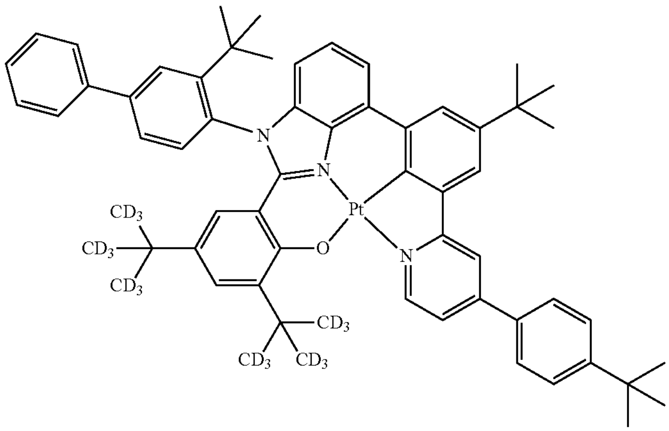
202
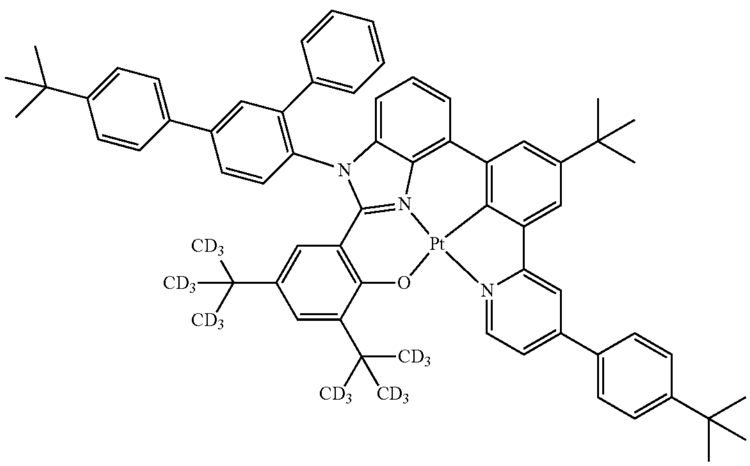
203
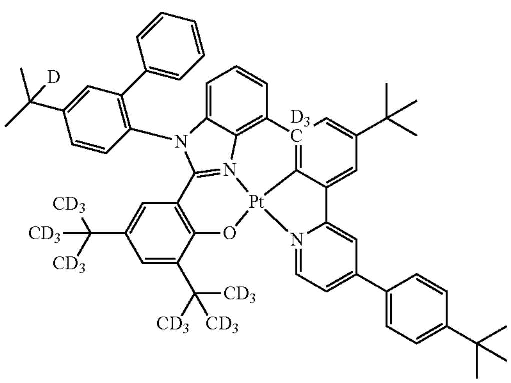
204
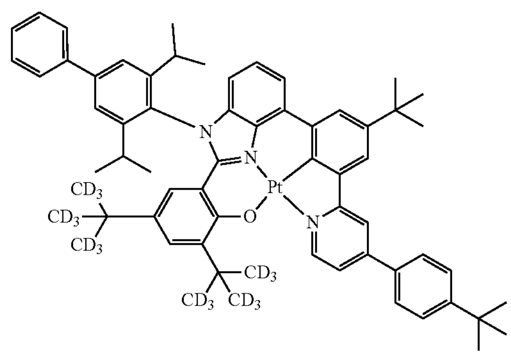
205
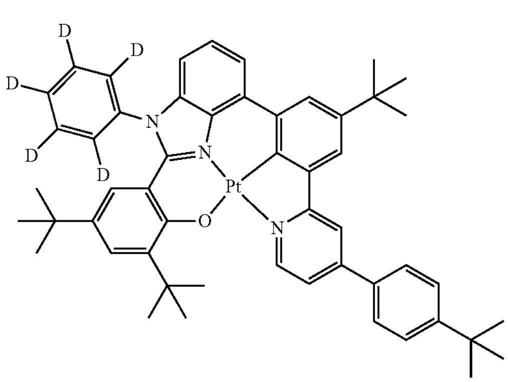
206
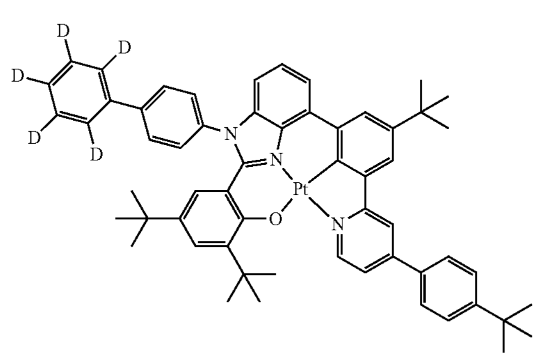

-continued
207
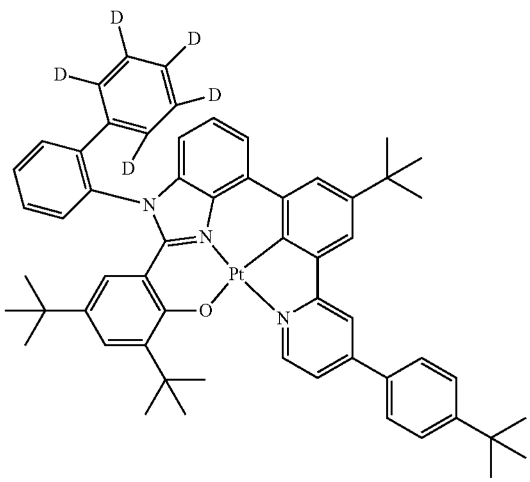
208
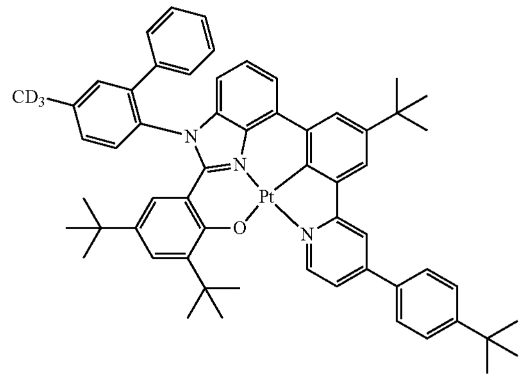
209
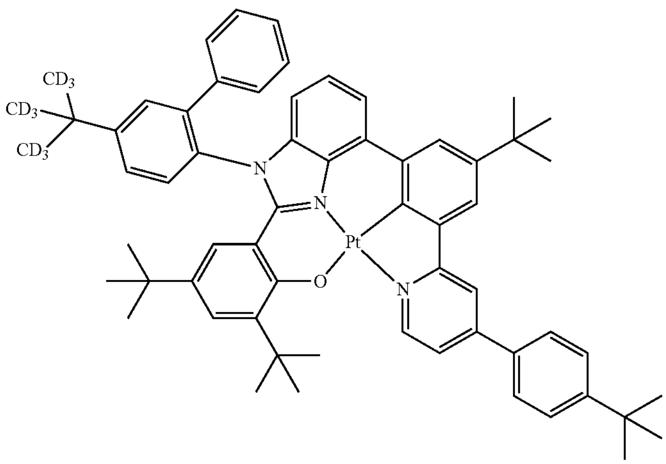
210
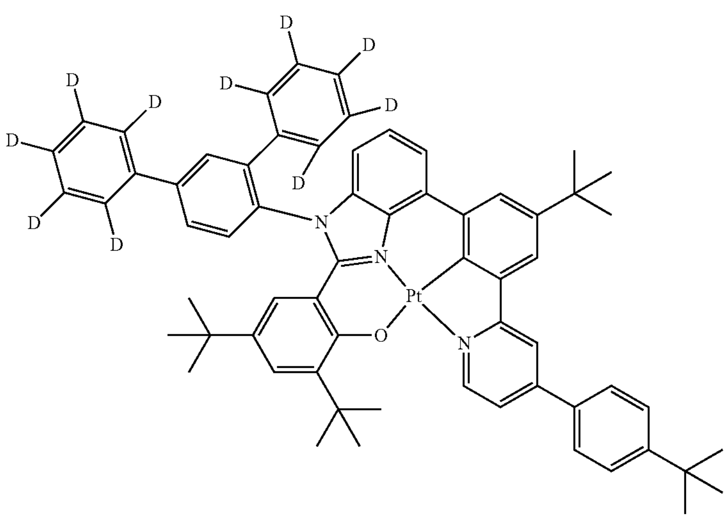

-continued
211
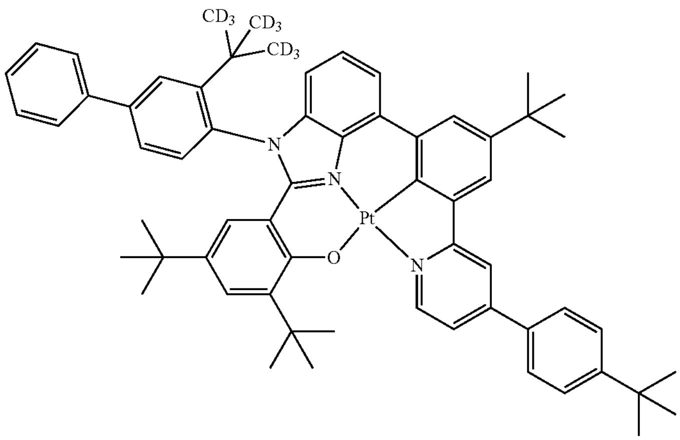
212
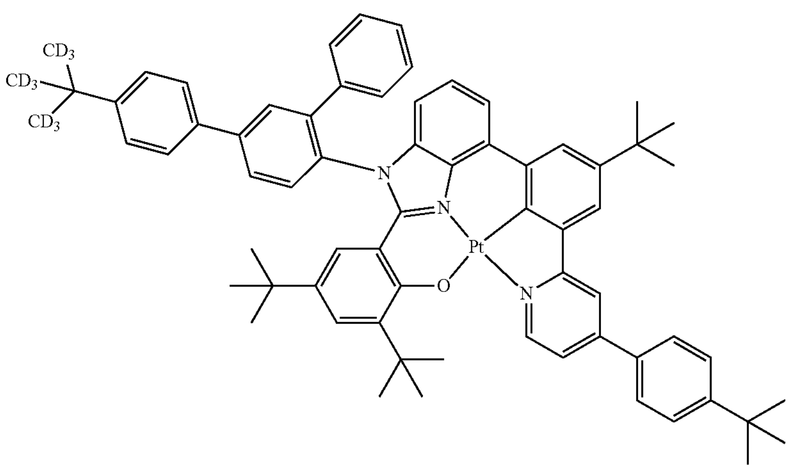
213
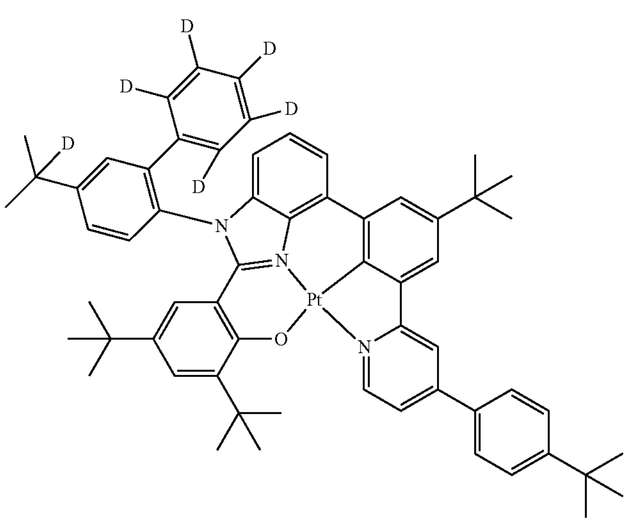

-continued
214
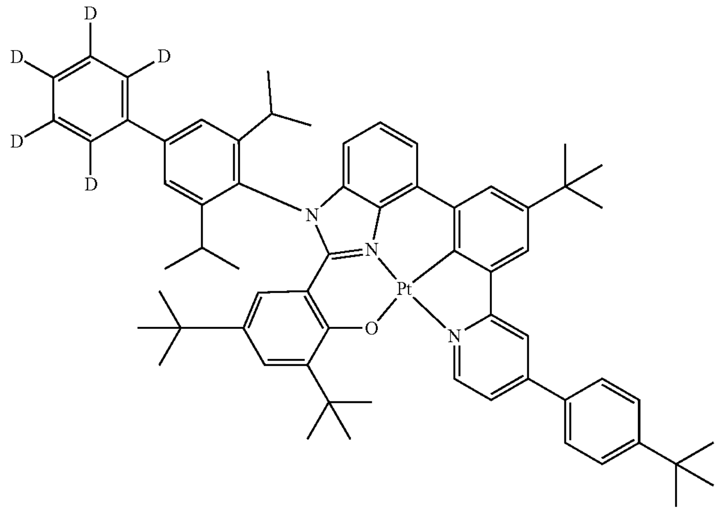
215
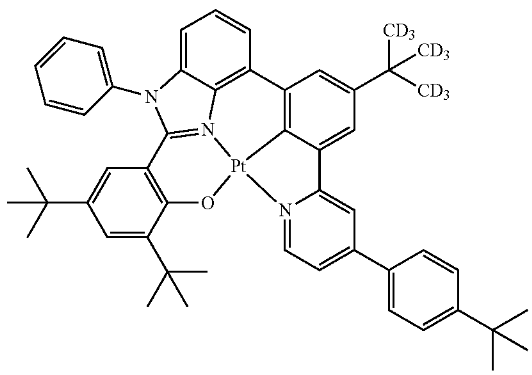
216
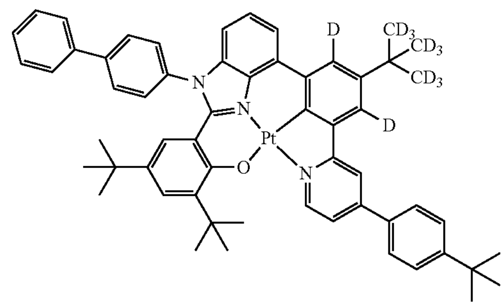
217
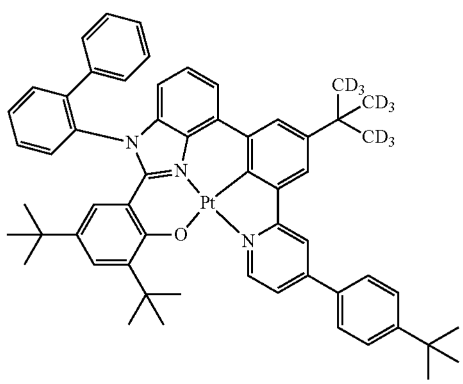
218
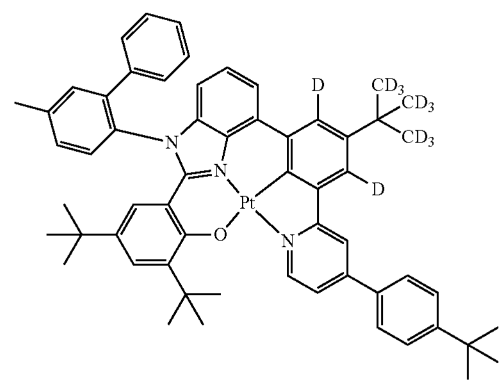
219
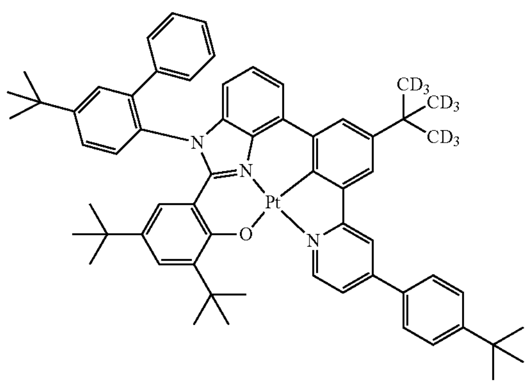
220
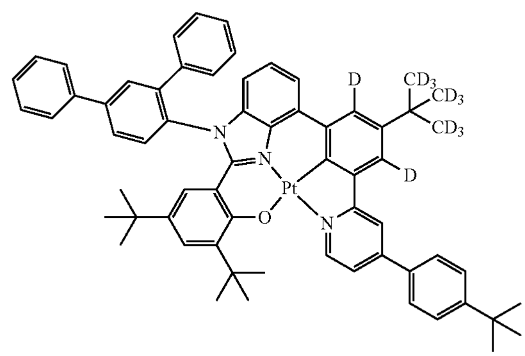

-continued
221
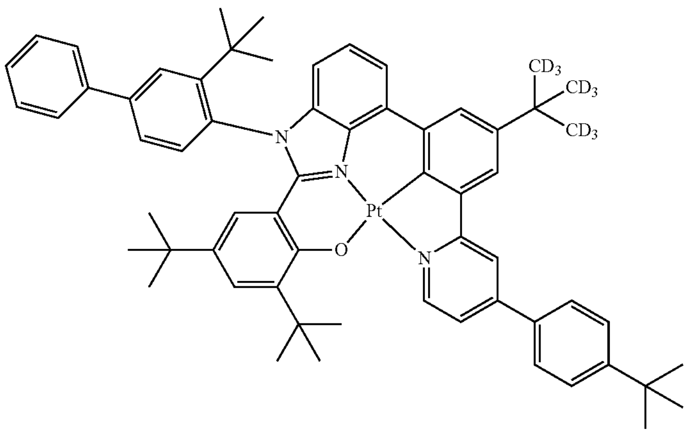
222
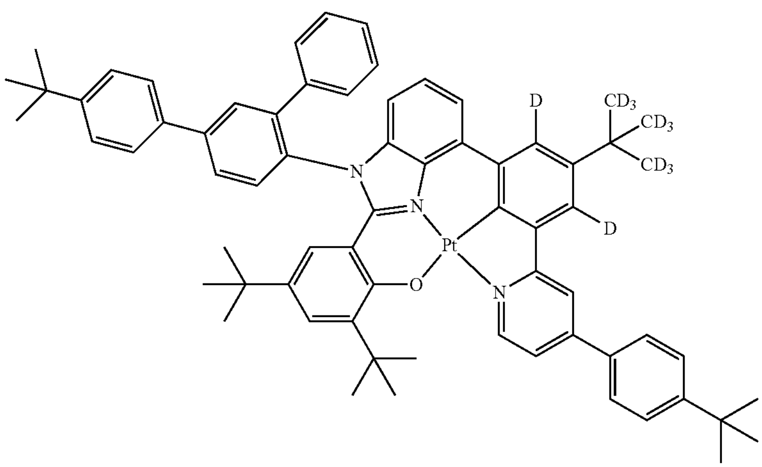
223
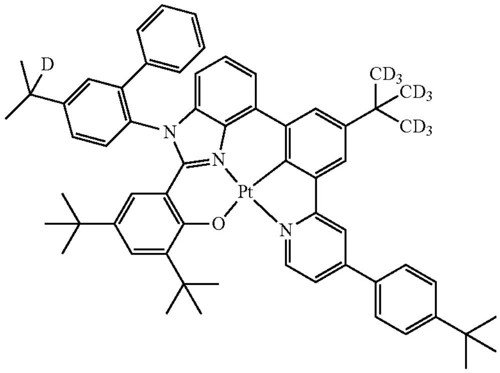
224
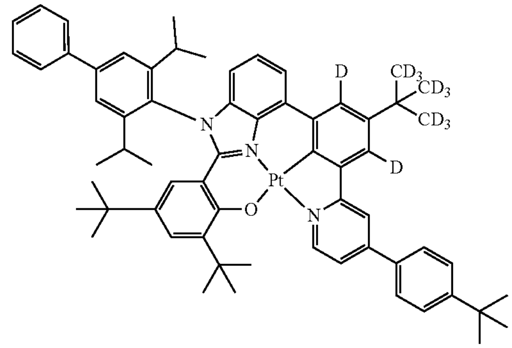

-continued
225
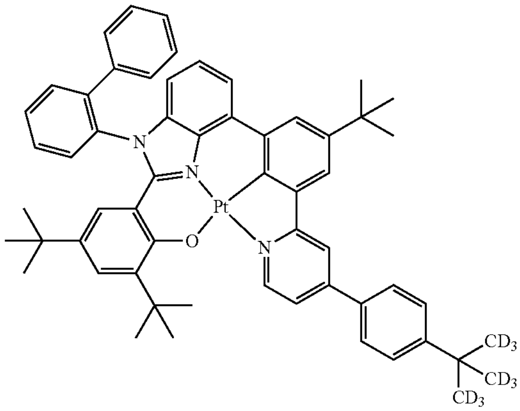
226
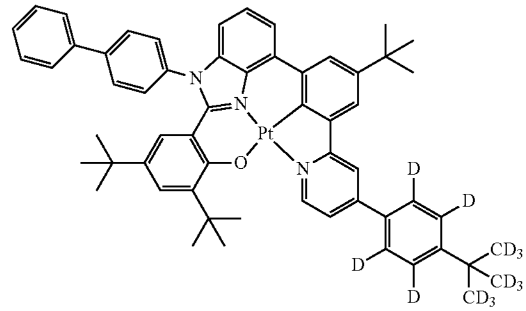
227
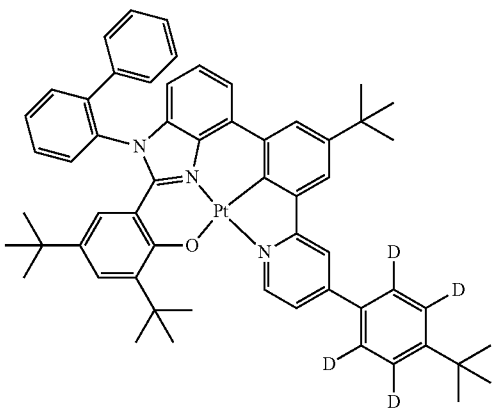
228
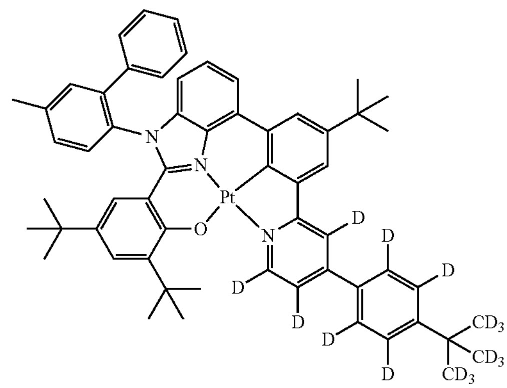
229
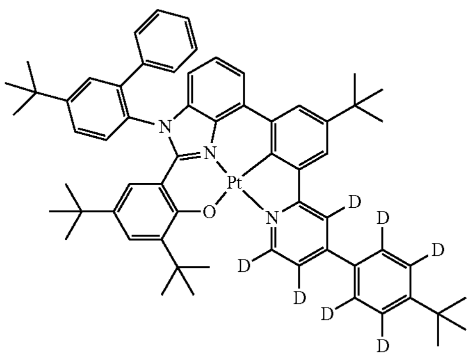
230
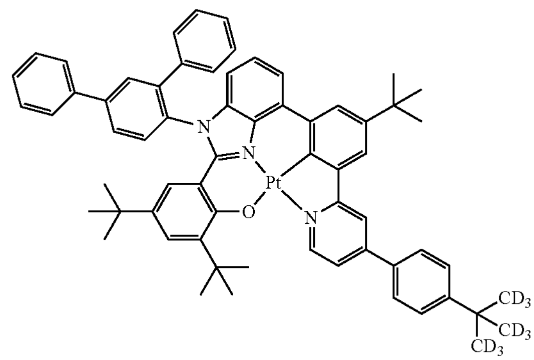
231
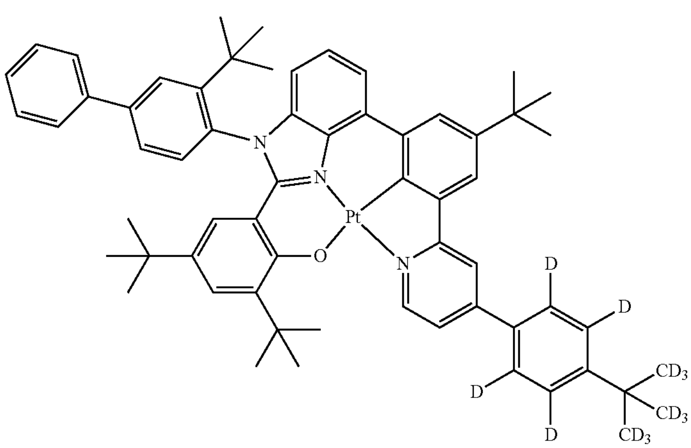

-continued
232
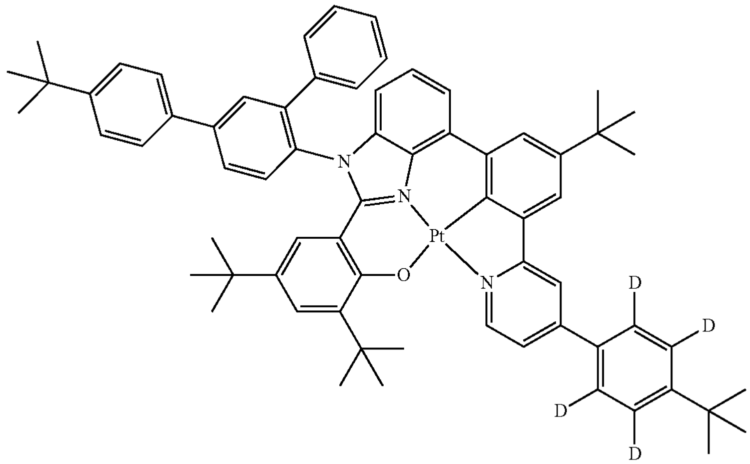
233
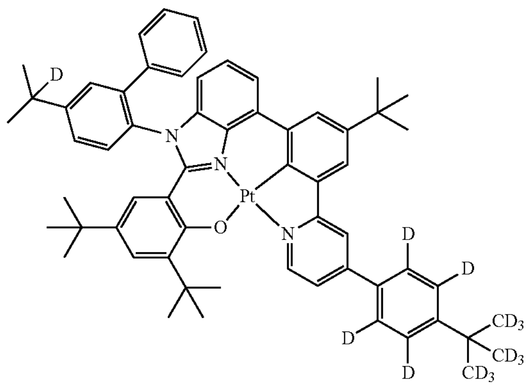
234
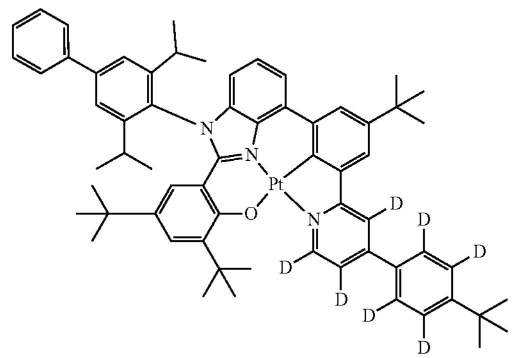
235
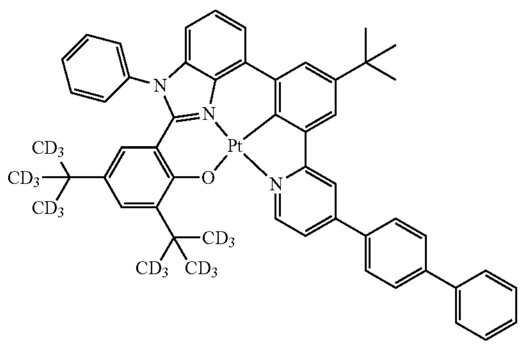
236
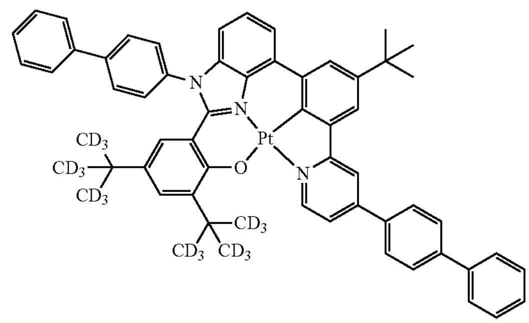
237
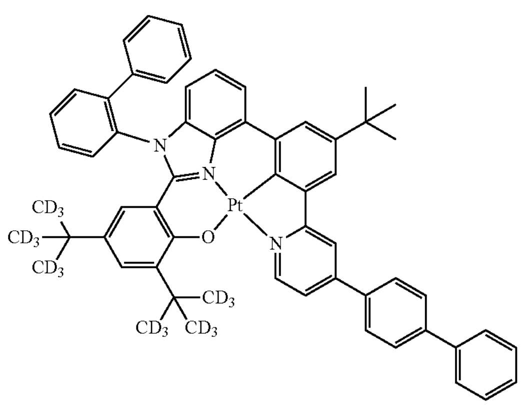
238
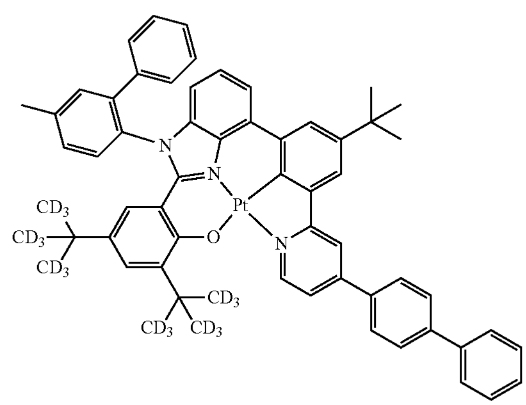

-continued
239
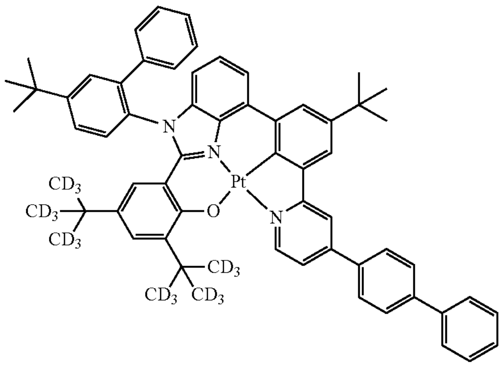
240
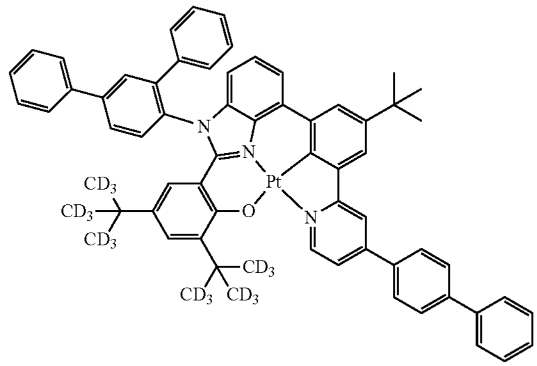
241
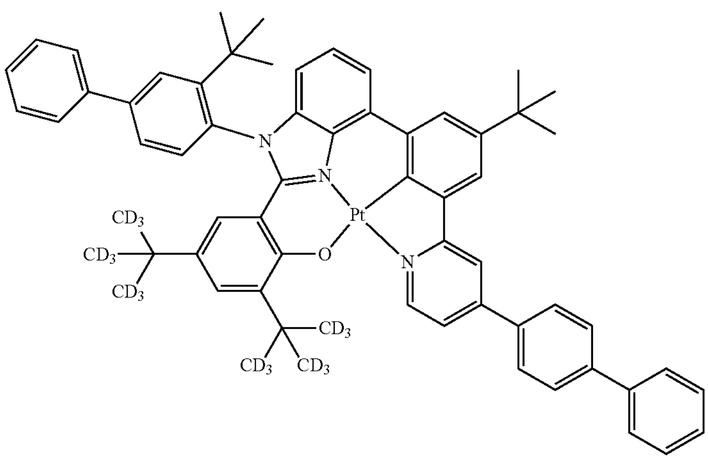
242
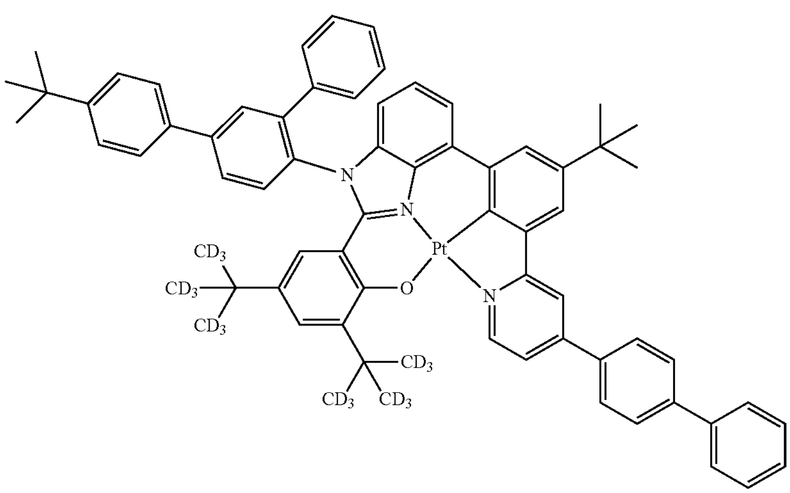

-continued
243
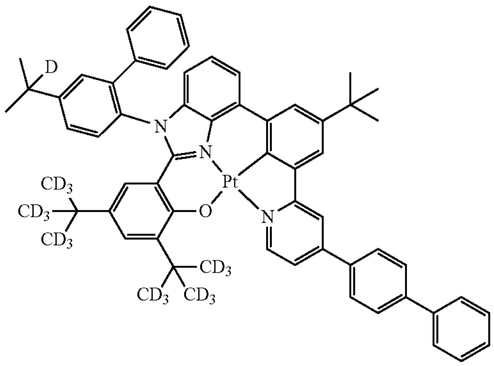
244
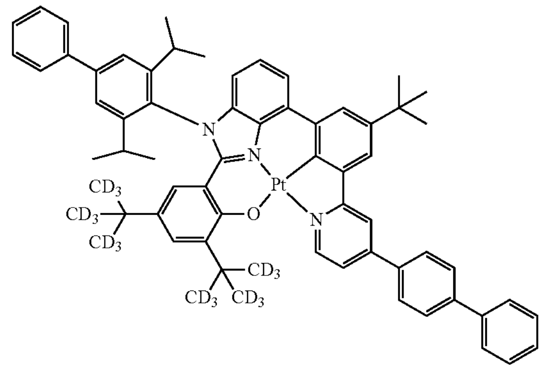
245
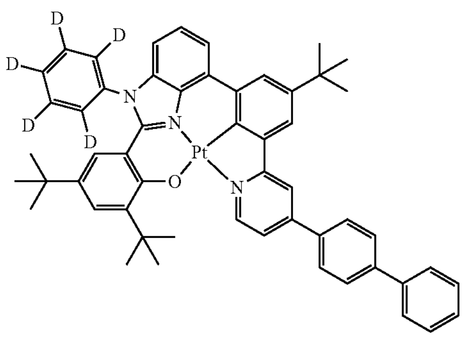
246
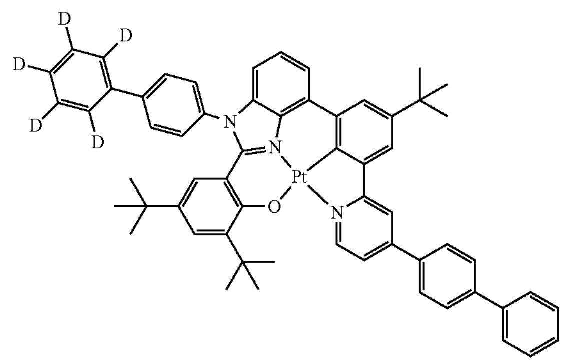
247
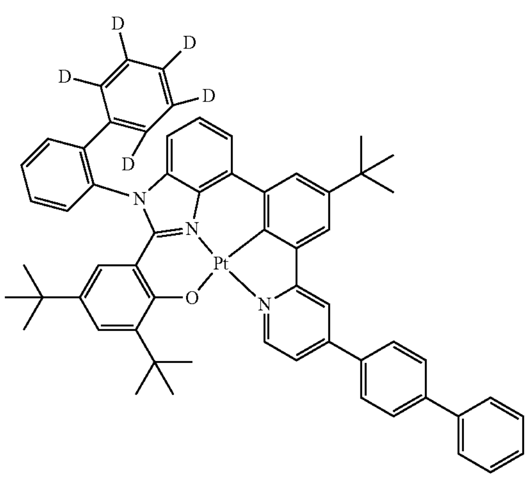
248
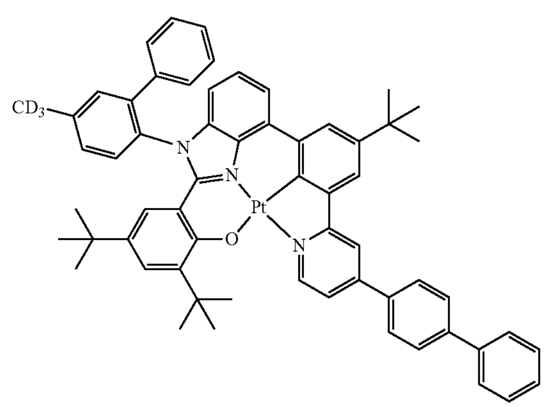

-continued
249
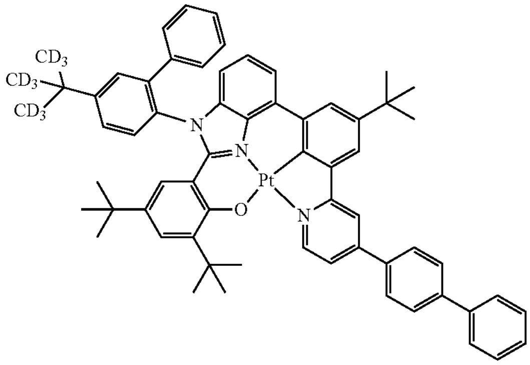
250
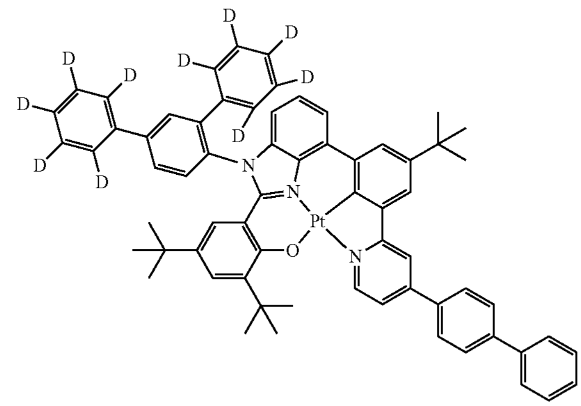
251
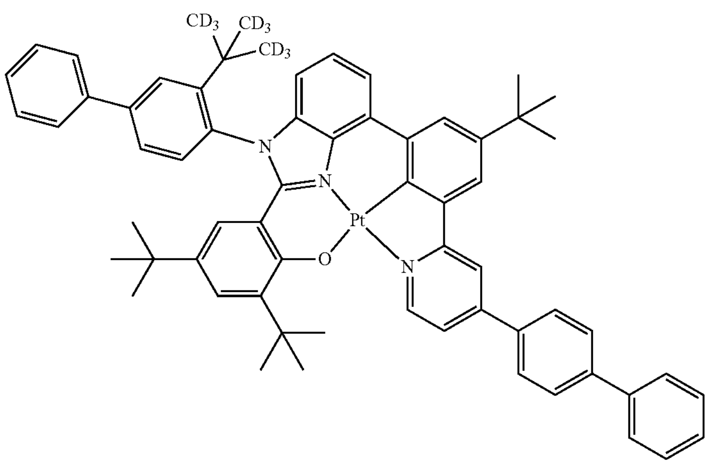
252
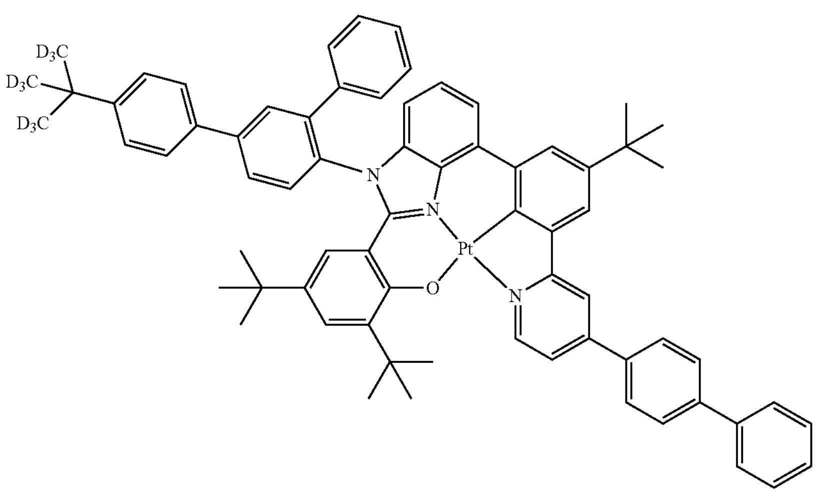

-continued
253
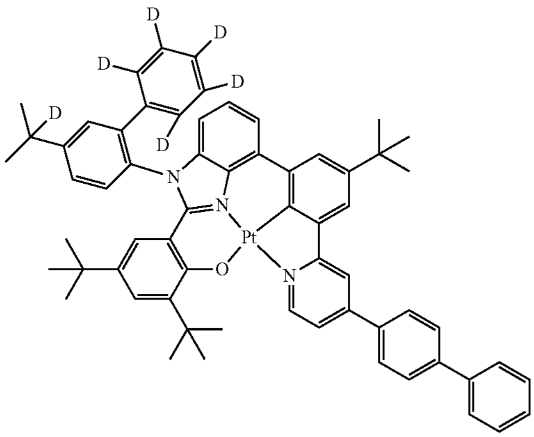
254
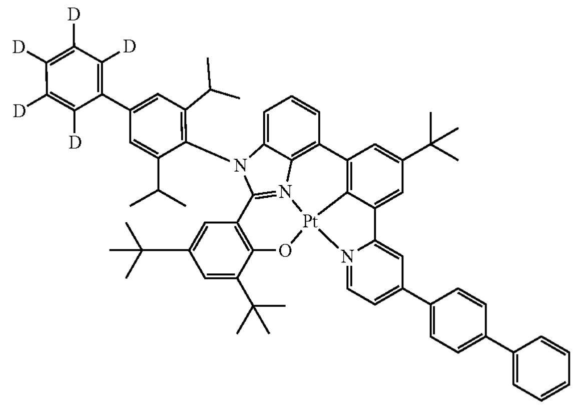
255
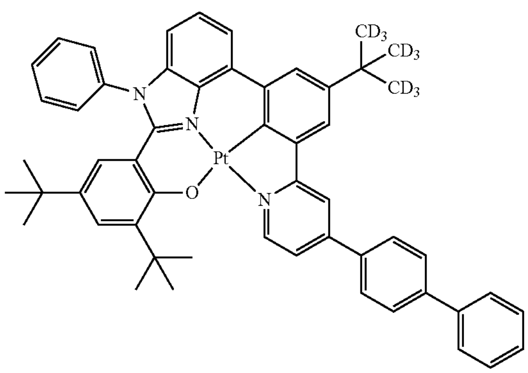
256
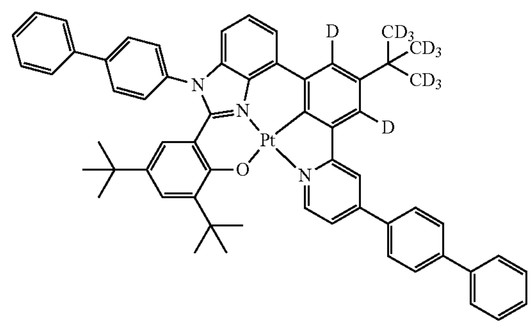
257
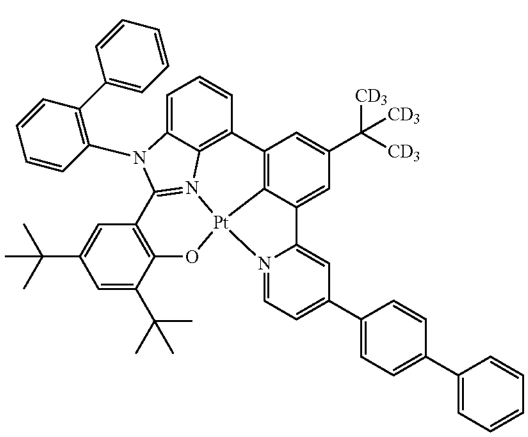
258
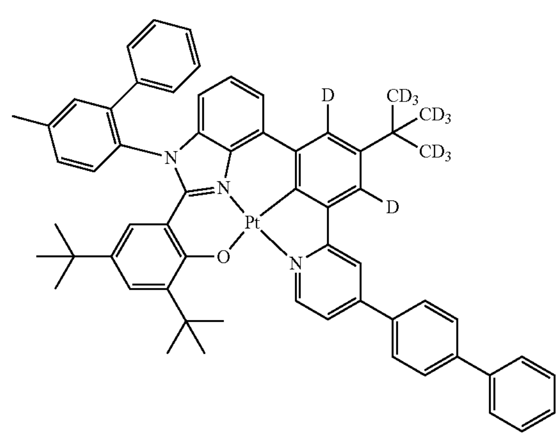

-continued
259
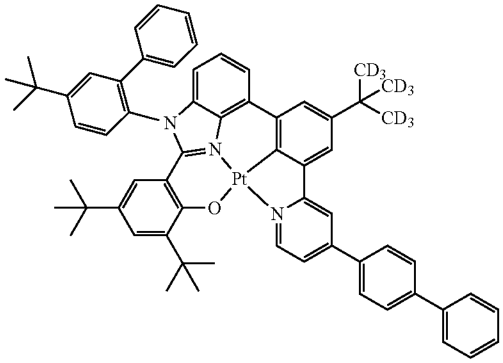
260
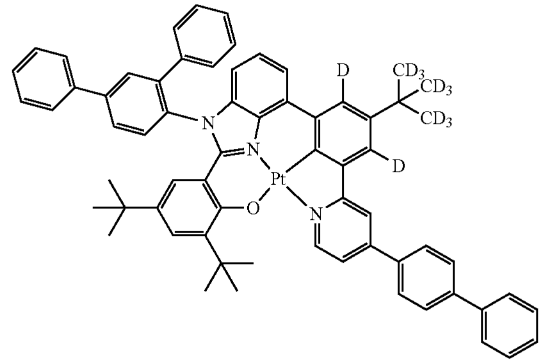
261
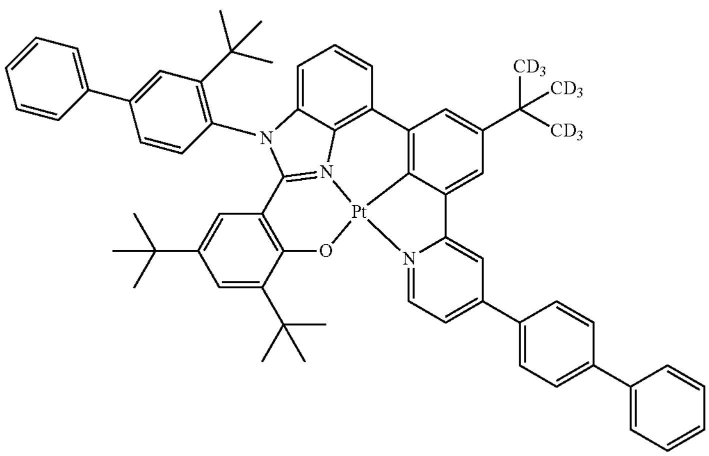
262
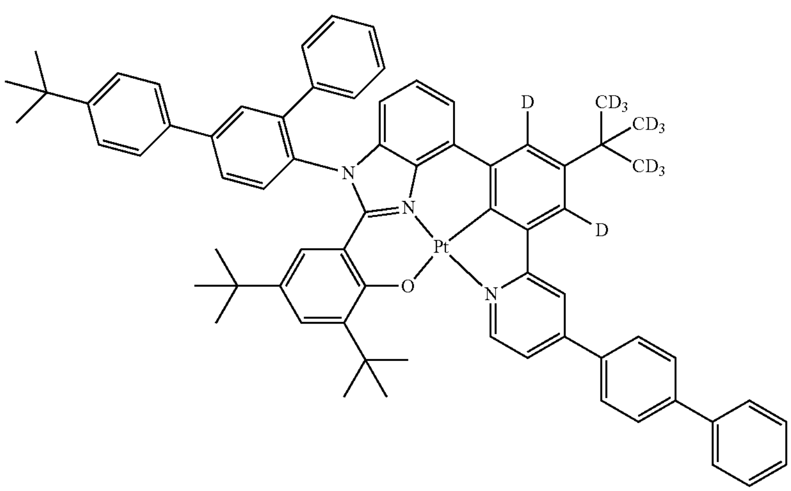

-continued
263
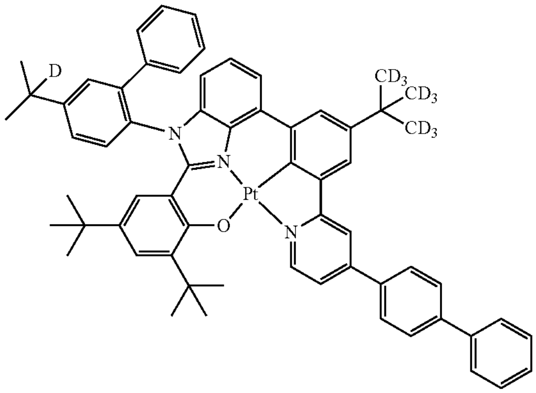
264
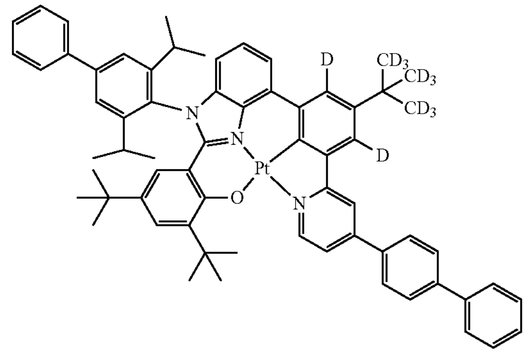
265
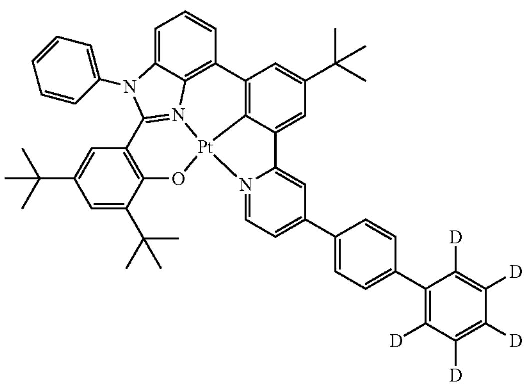
266
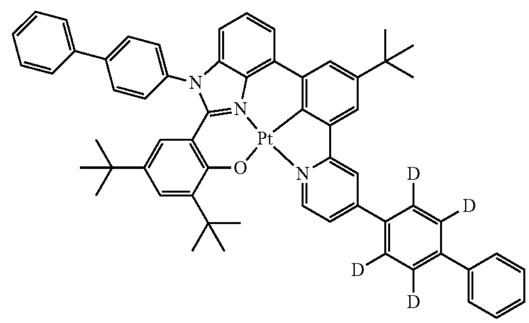
267
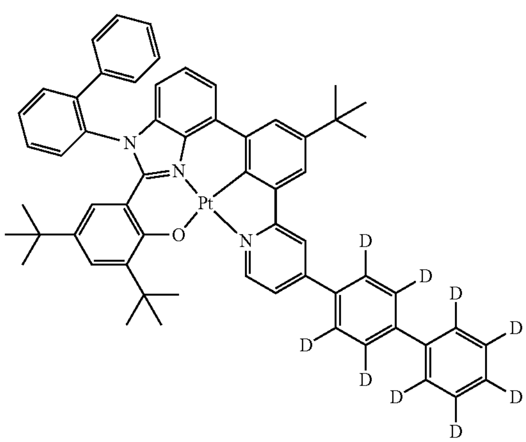
268
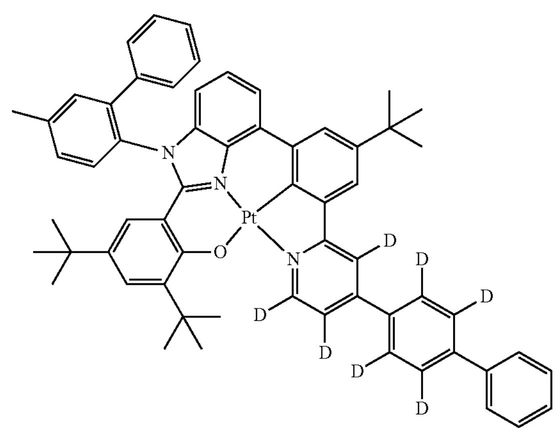

-continued
269
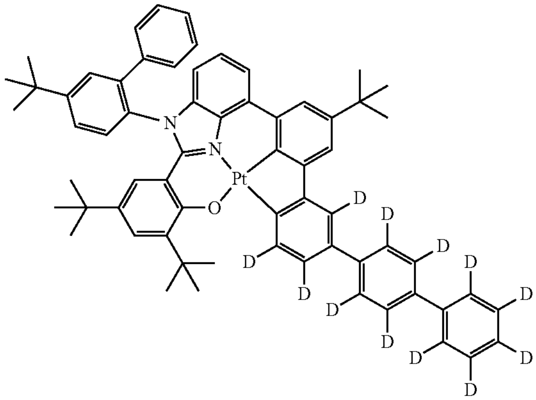
270
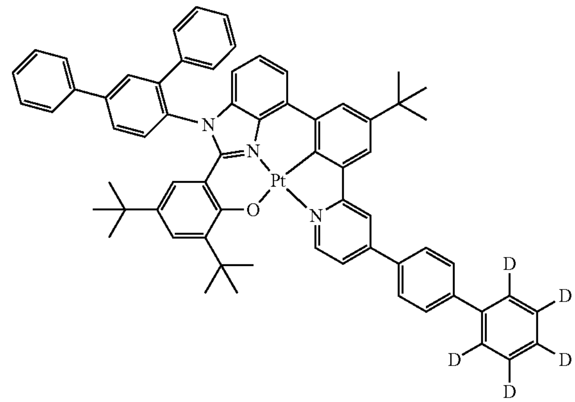
271
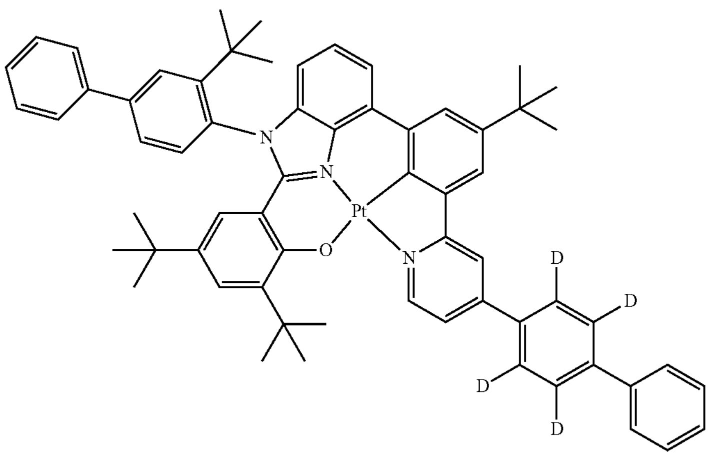
272
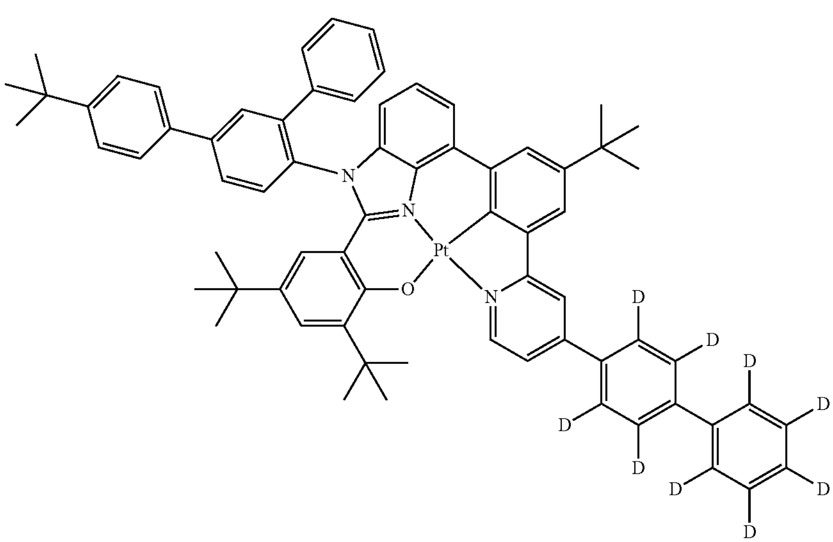

-continued
273
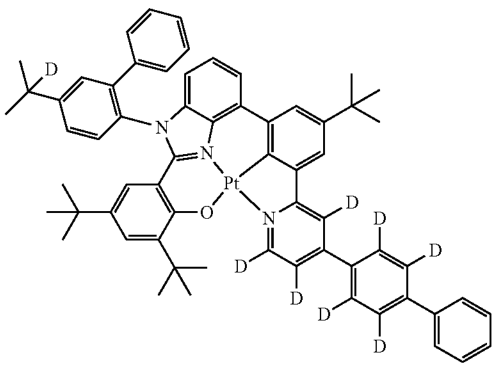
274
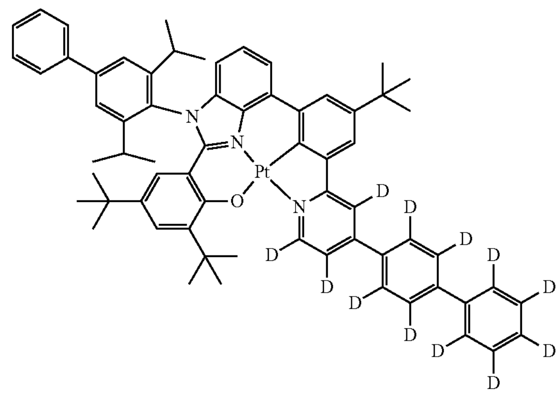
275
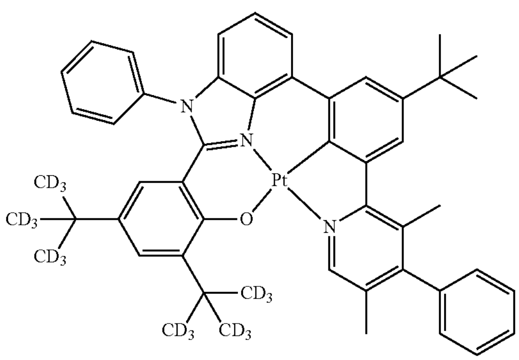
276
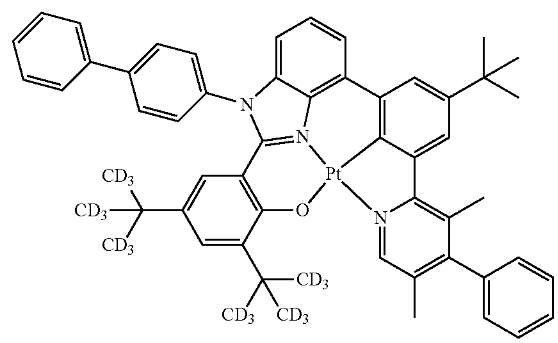
277
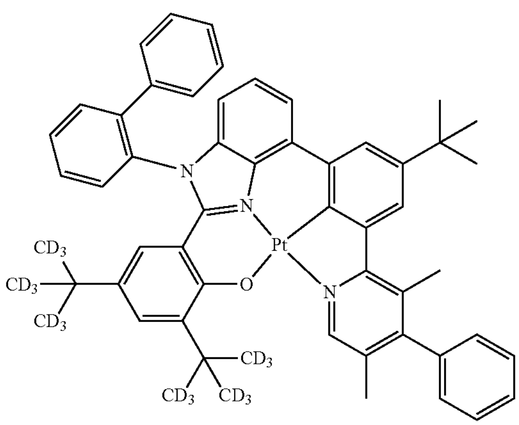
278
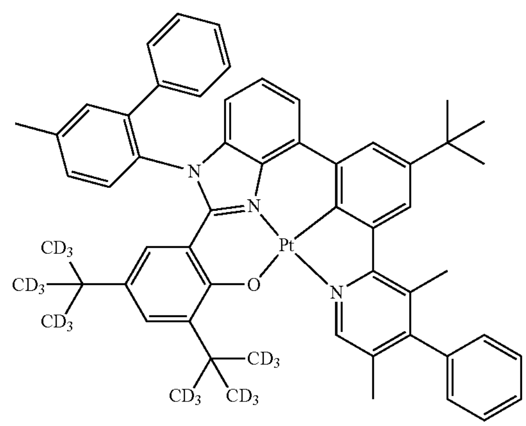
279
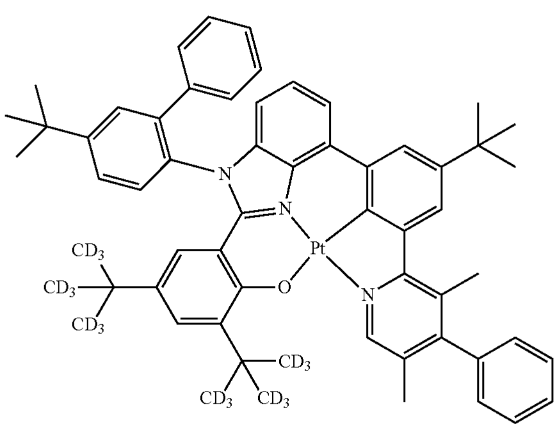
280
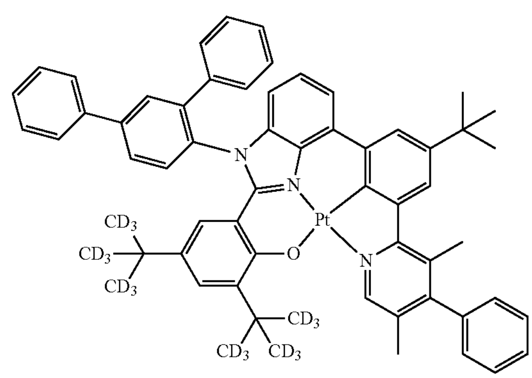

-continued
281
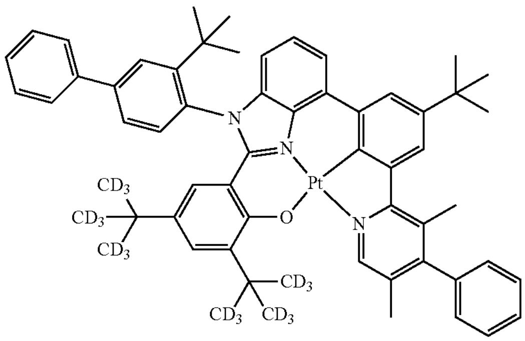
282
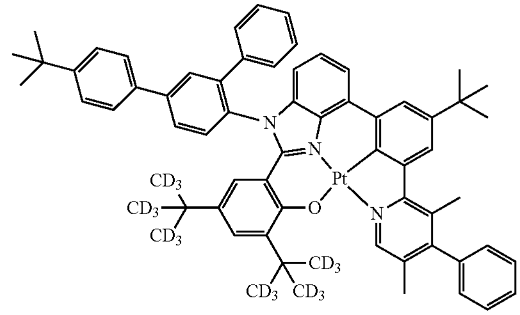
283
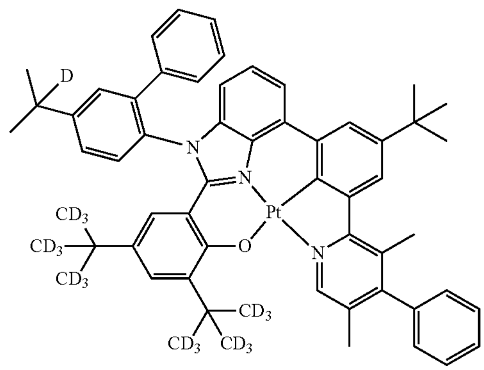
284
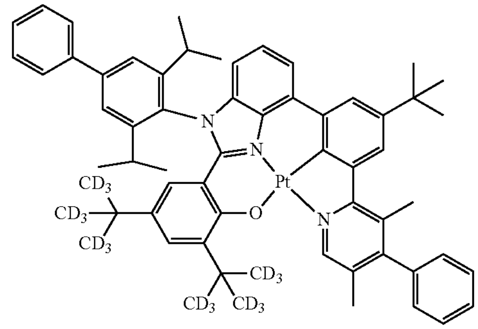
285
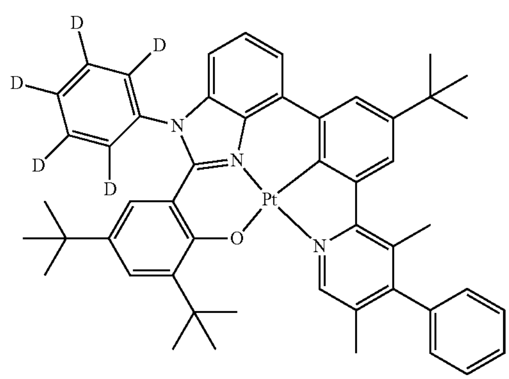
286
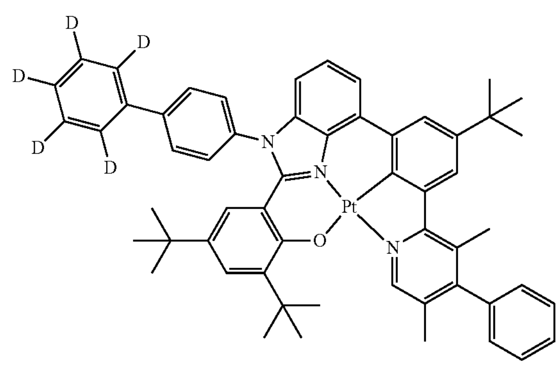
287
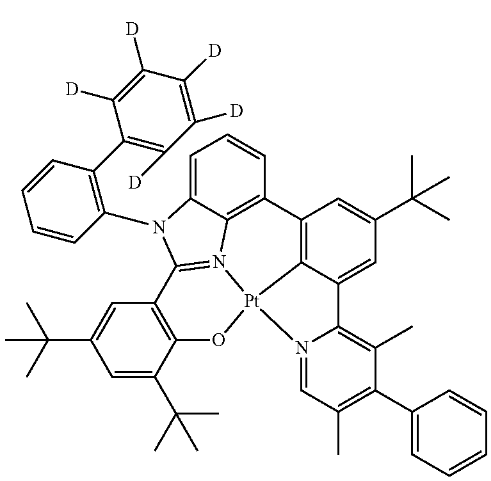
288
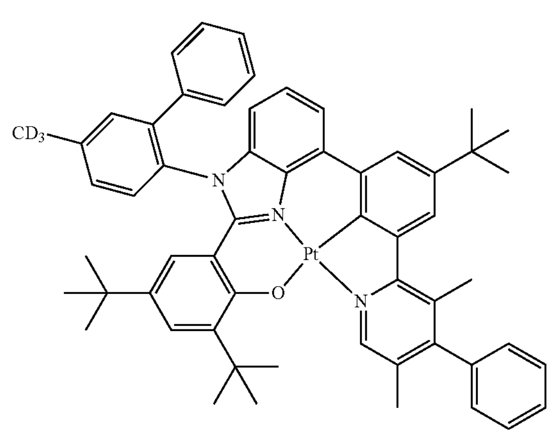

-continued
289
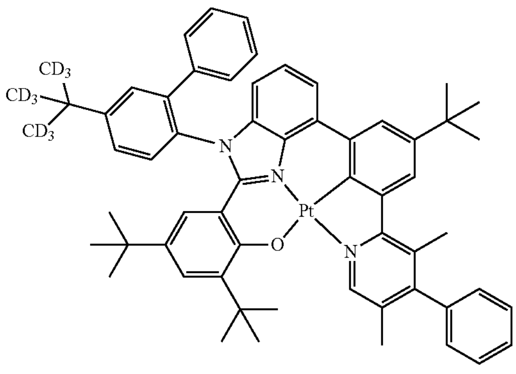
290
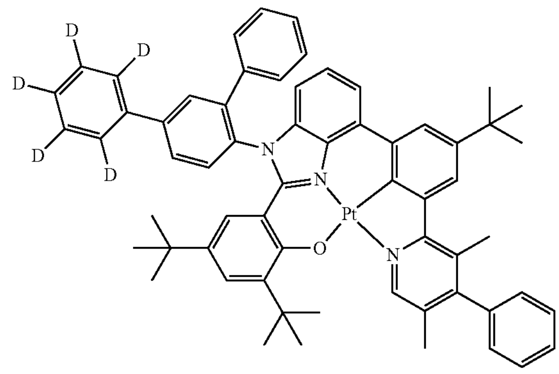
291
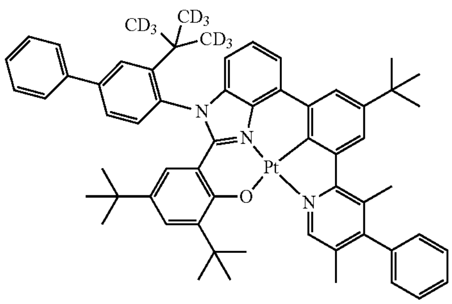
292
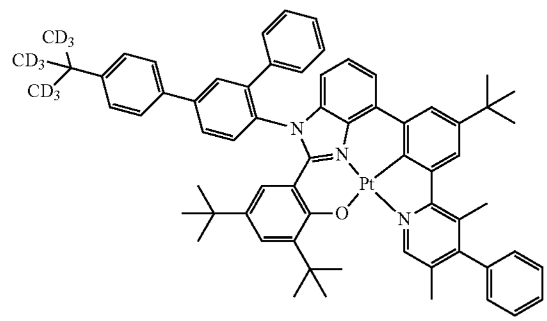
293
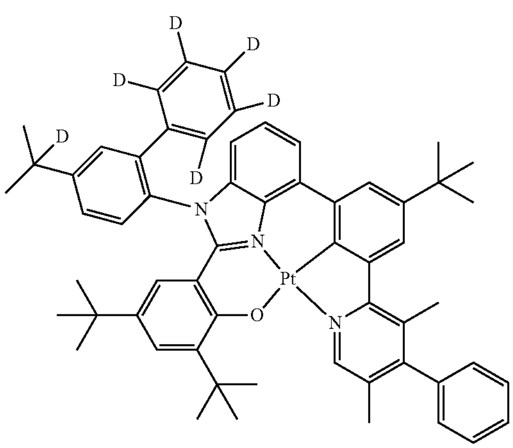
294
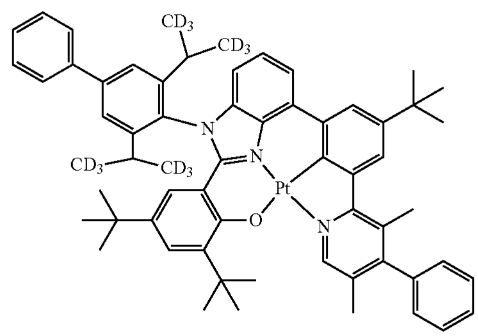
295
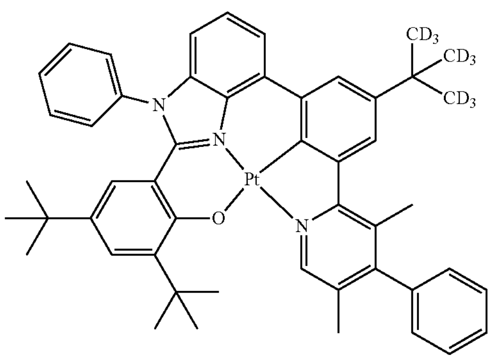
296
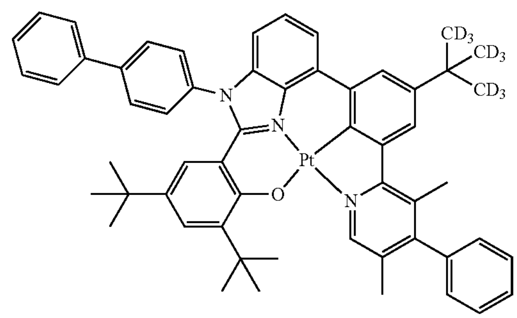

-continued
297
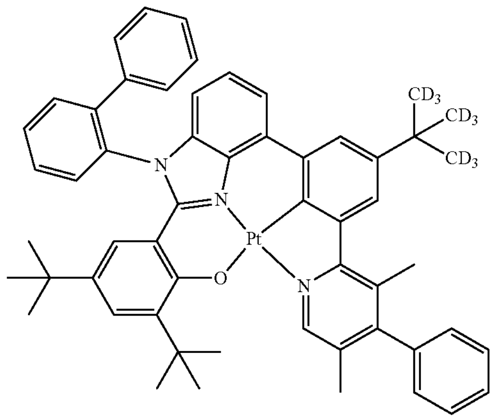
298
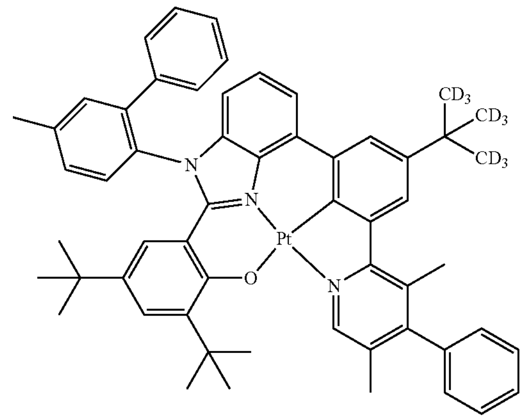
299
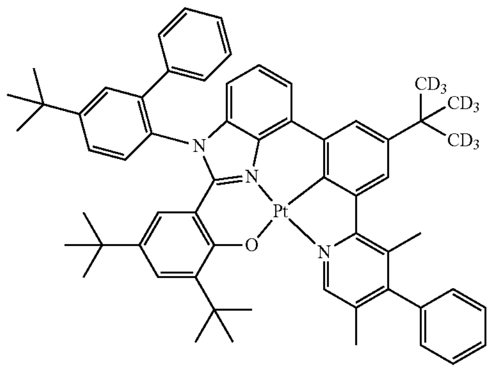
300
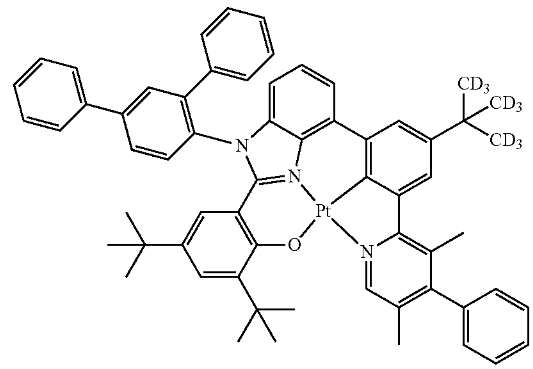
301
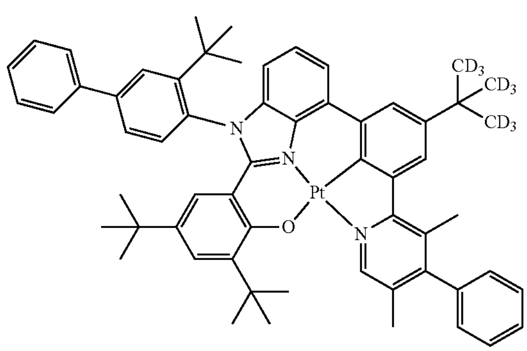
302
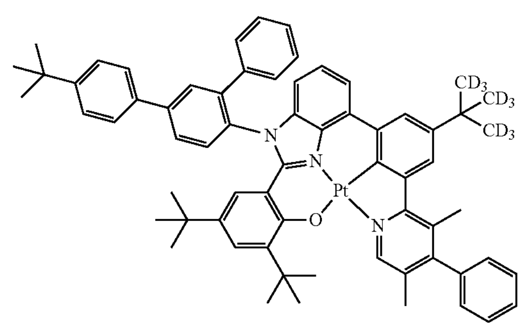
303
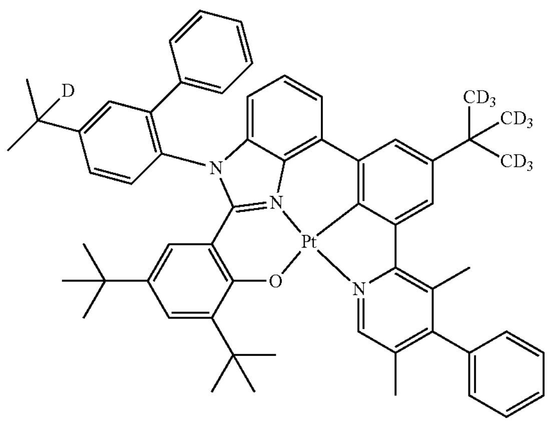
304
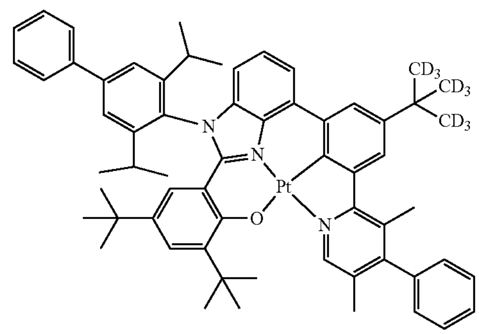

-continued
305
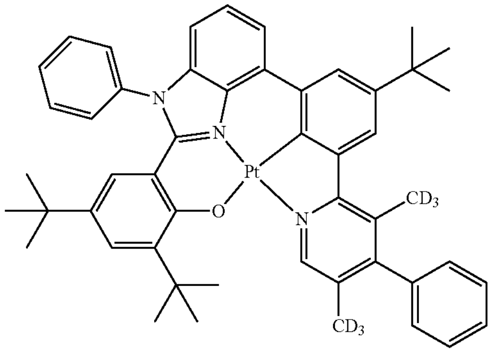
306
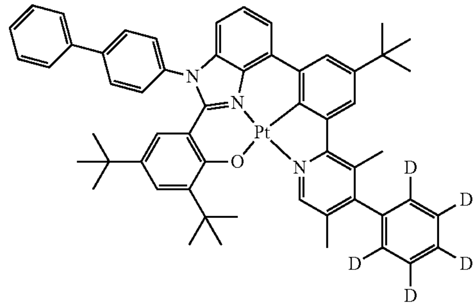
307
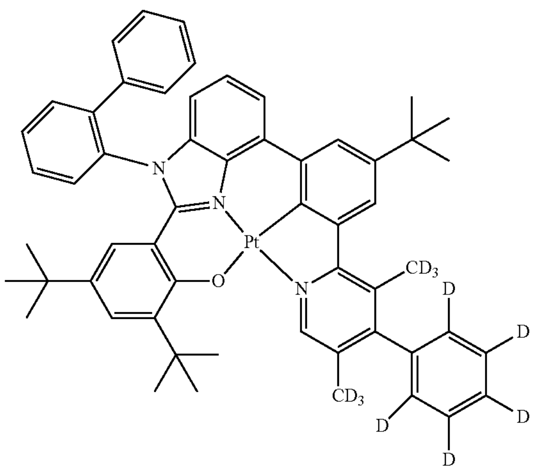
308
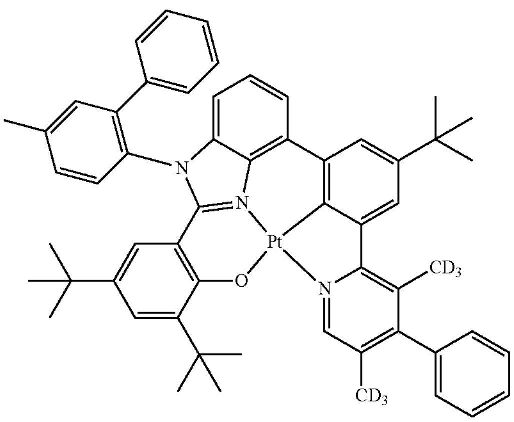
309
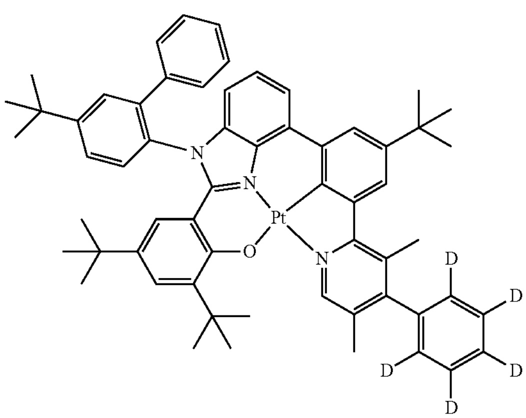
310
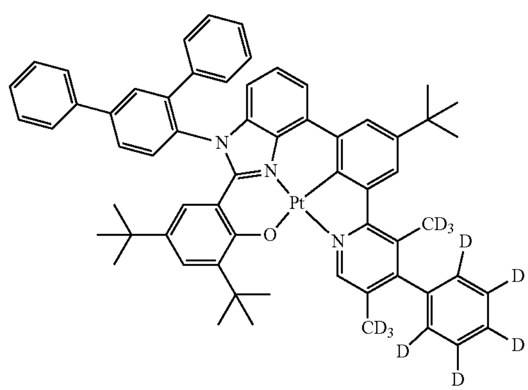
311
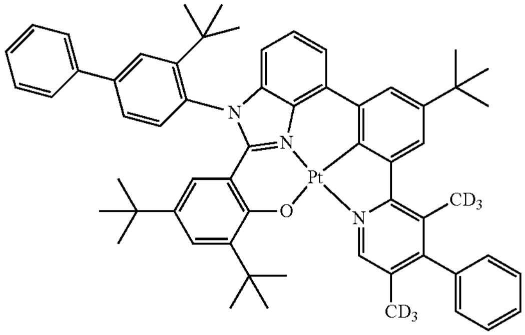
312
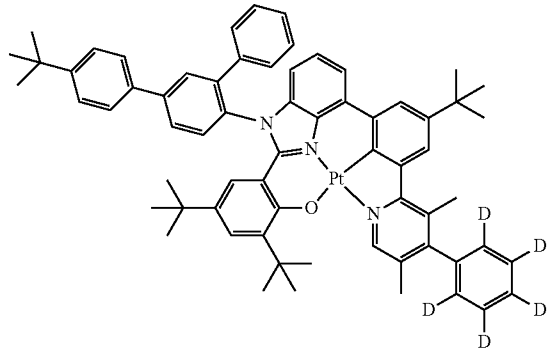

-continued
313
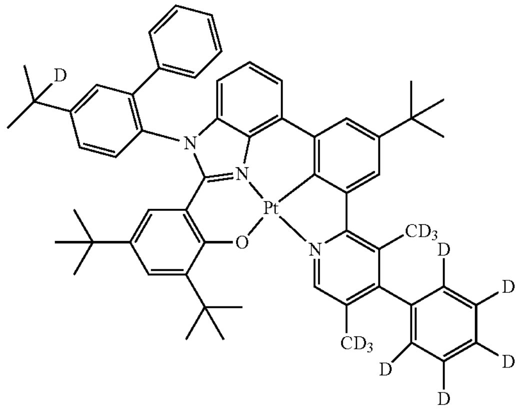
314
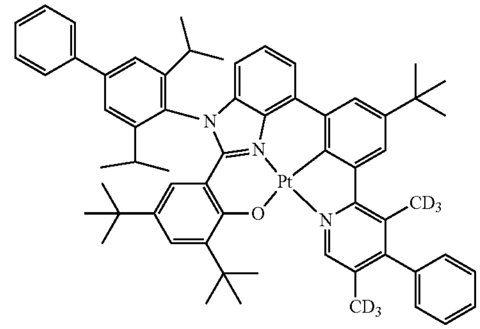
315
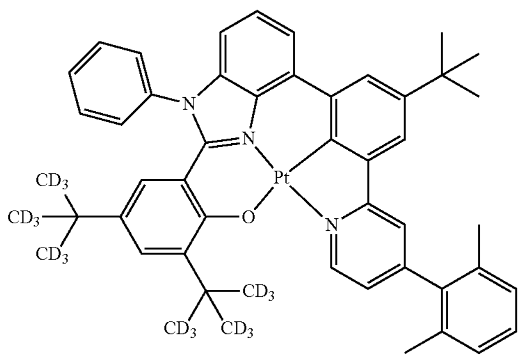
316
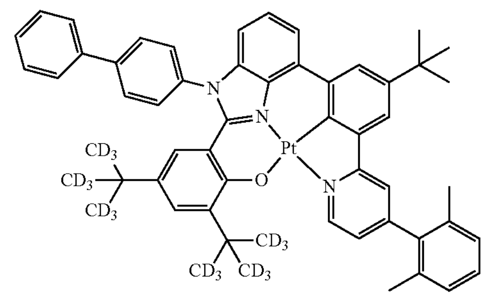
317
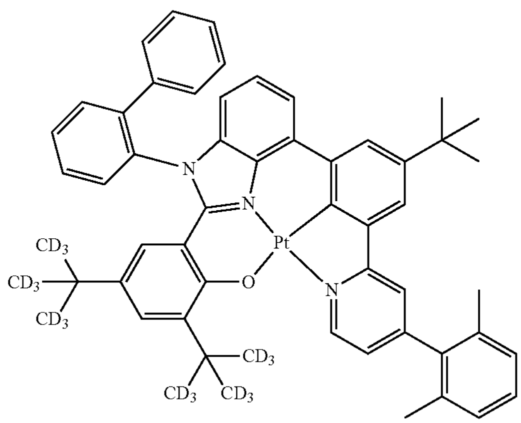
318
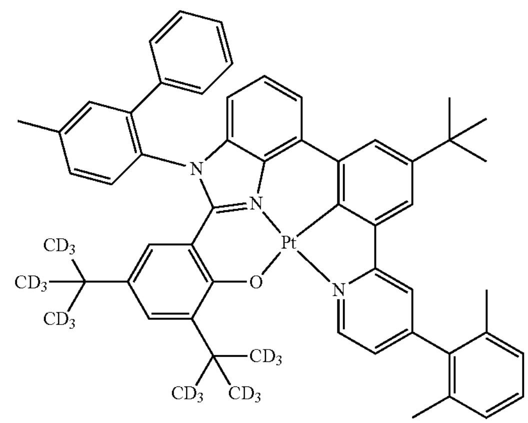
319
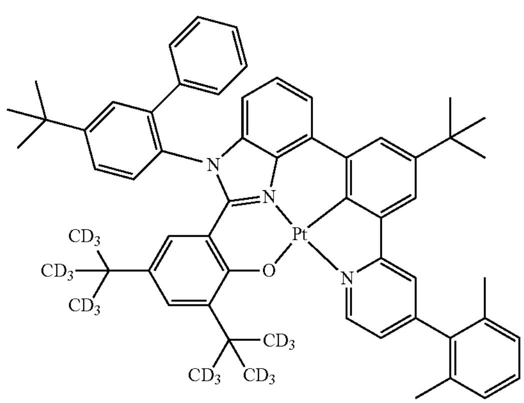
320
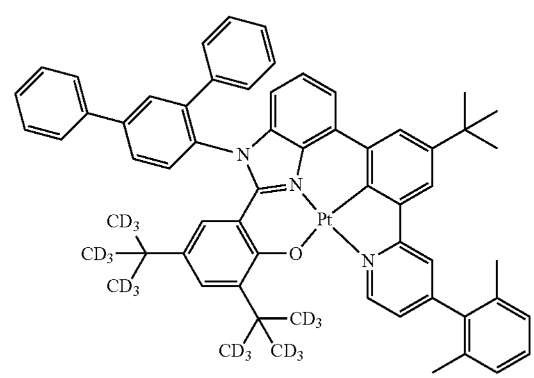

-continued
321
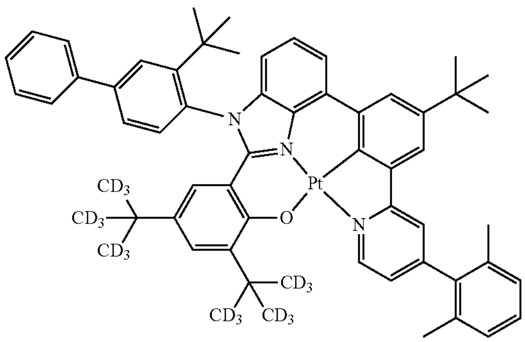
322
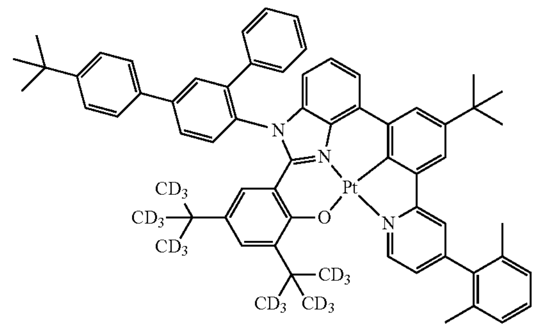
323
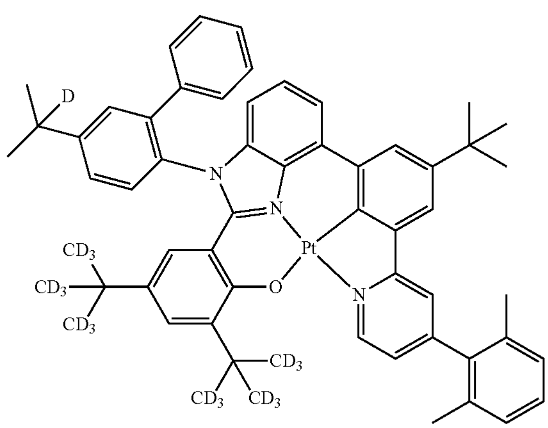
324
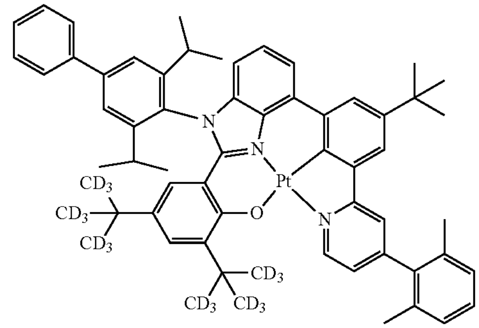
325
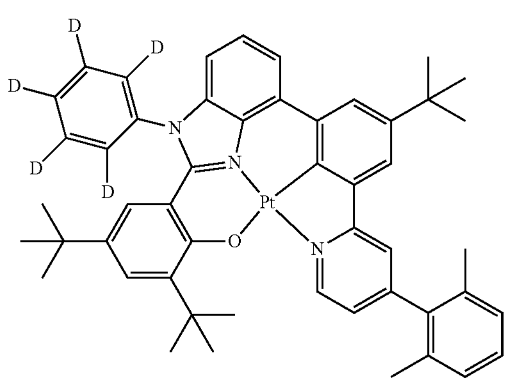
326
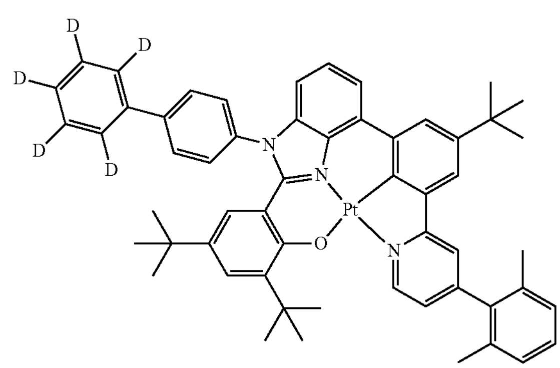

-continued
327
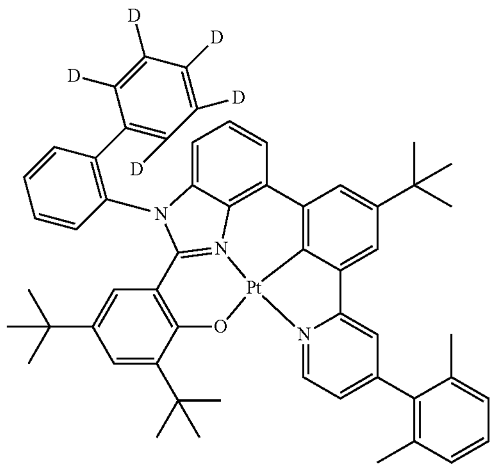
328
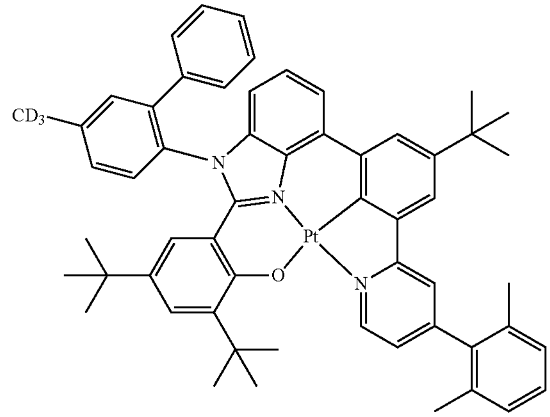
329
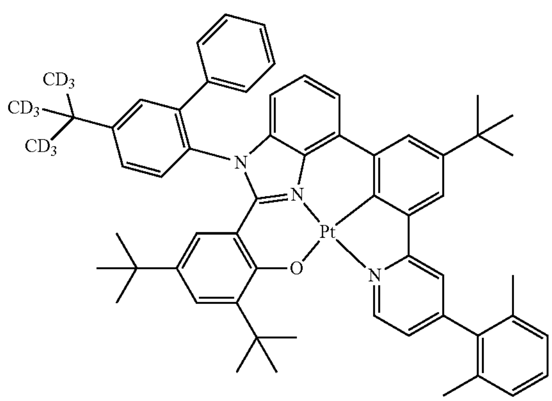
330
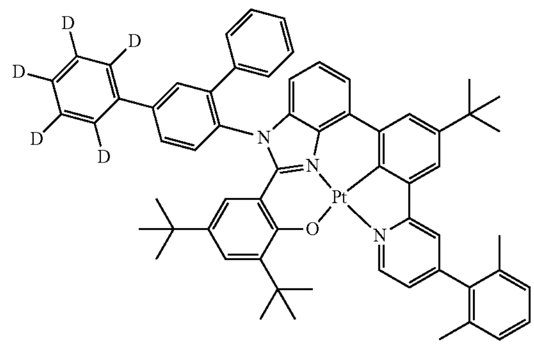
331
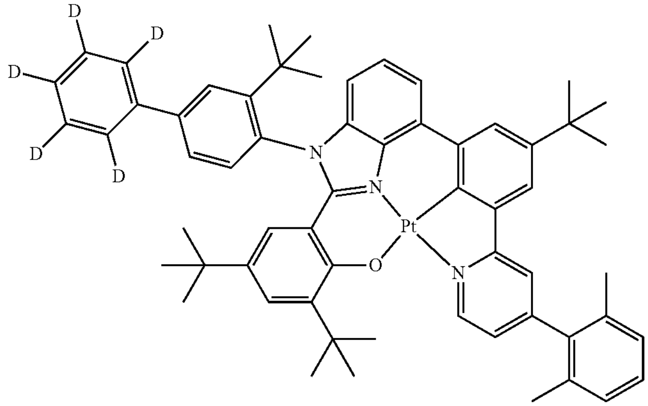

-continued
332
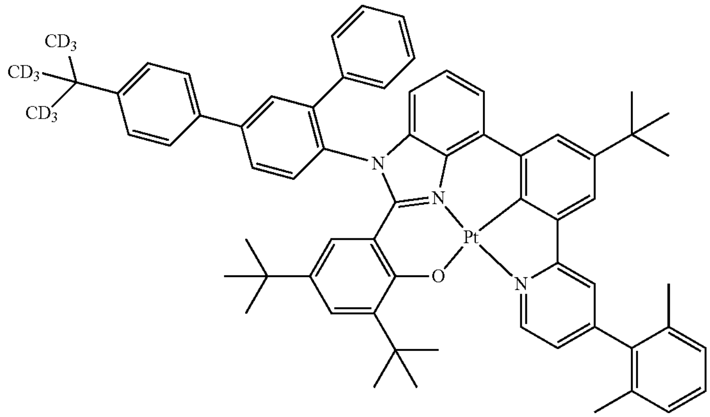
333
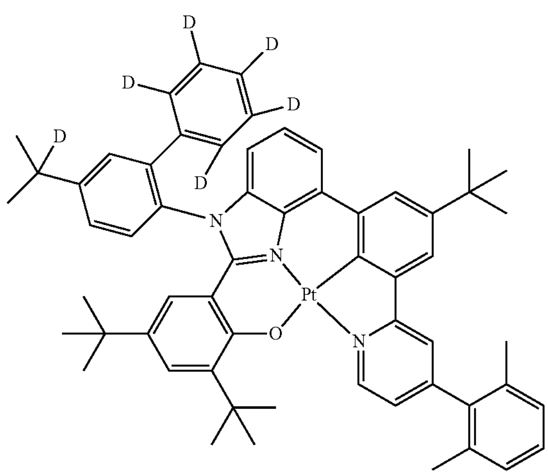
334
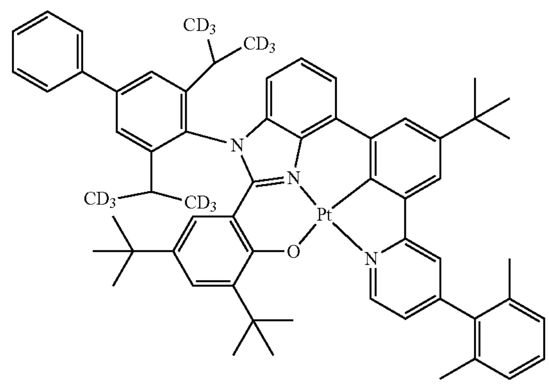
335
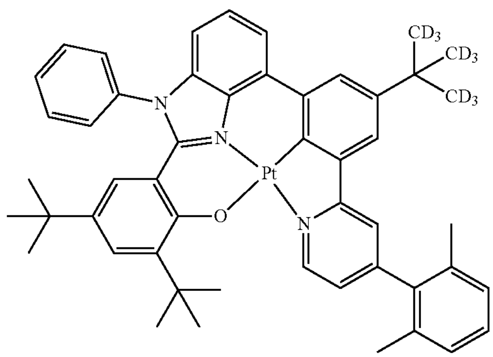
336
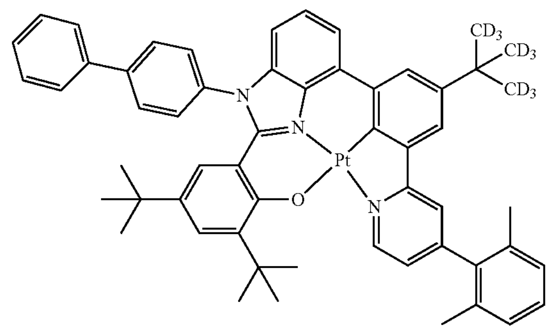

-continued
337
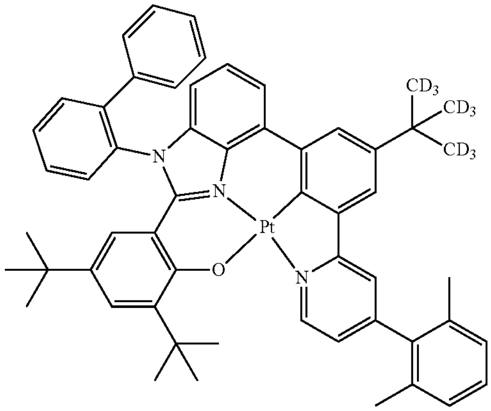
338
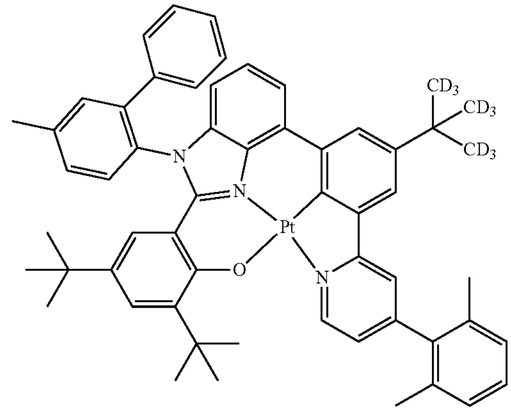
339
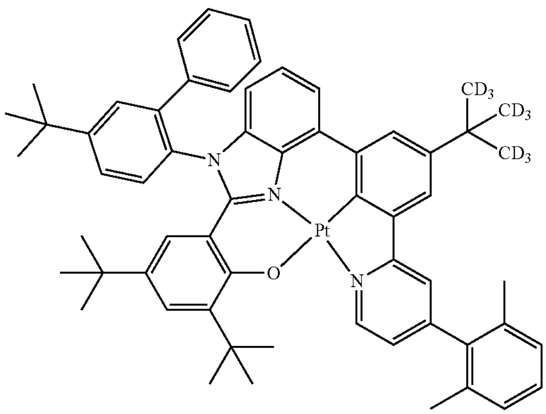
340
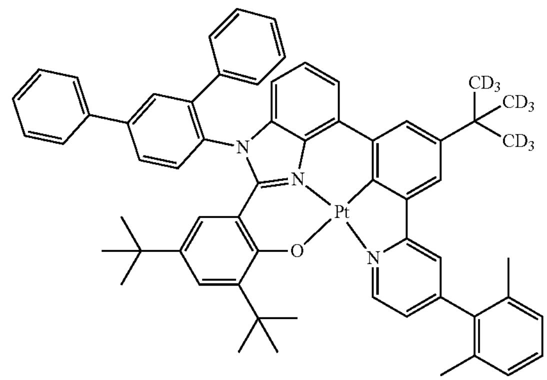
341
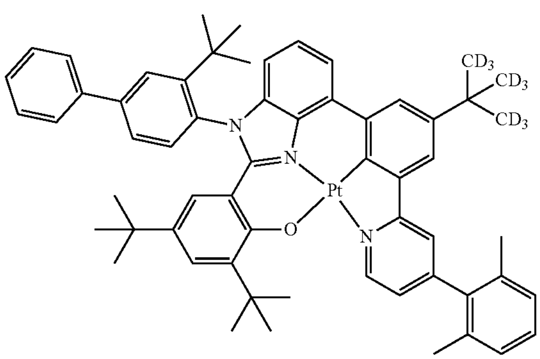
342
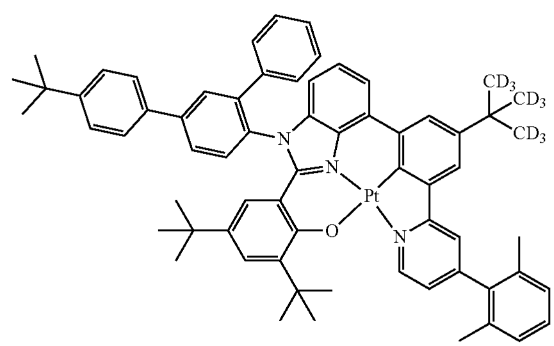
343
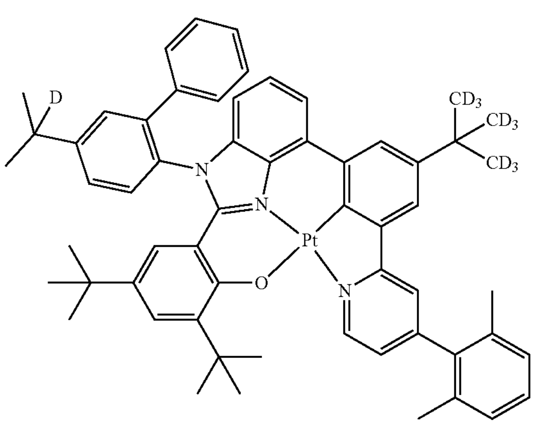
344
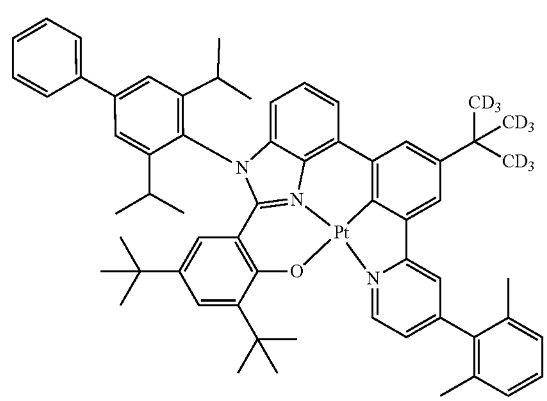

-continued
345
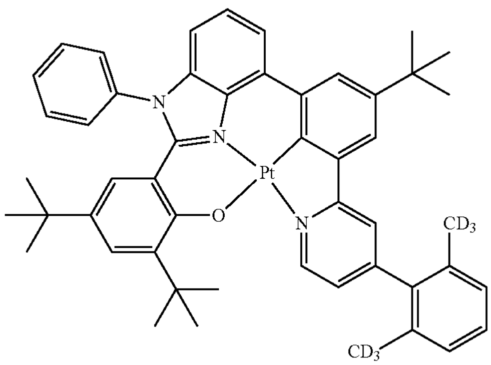
346
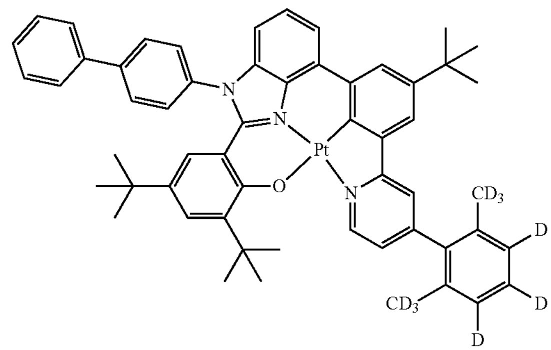
347
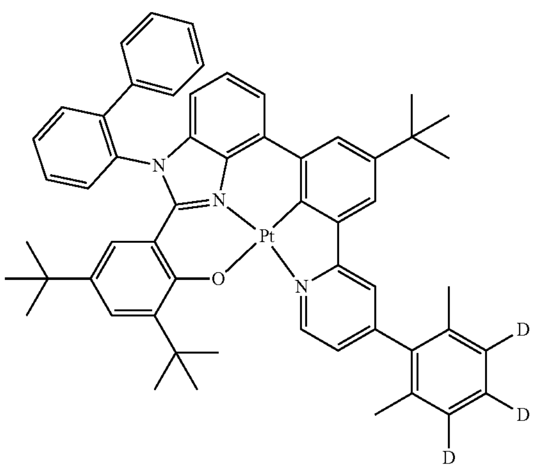
348
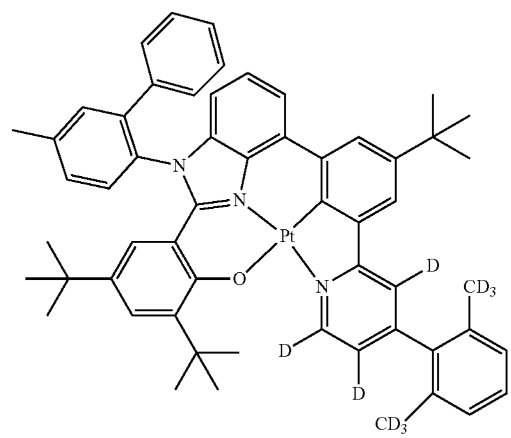
349
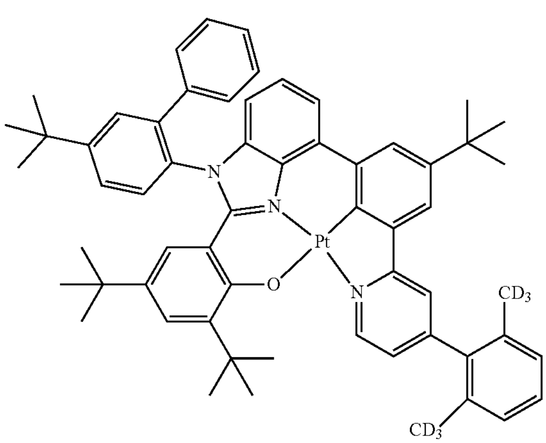
350
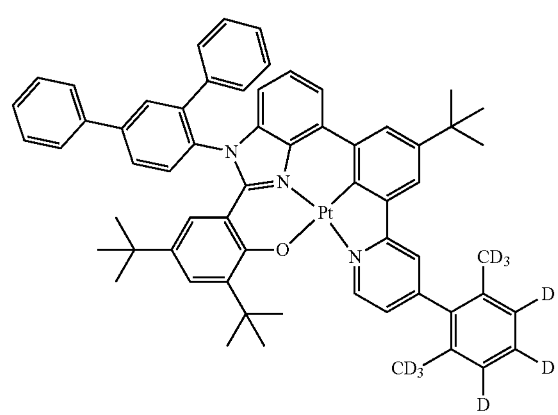

-continued
351
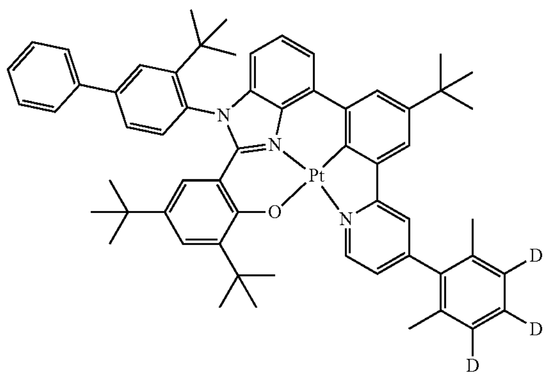
352
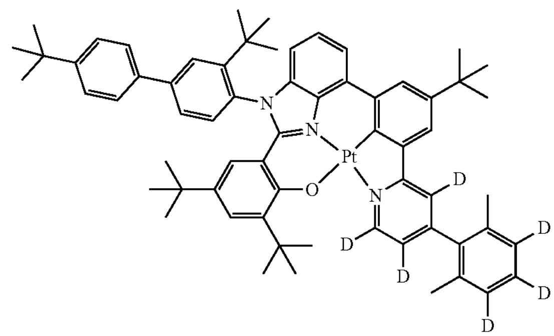
353
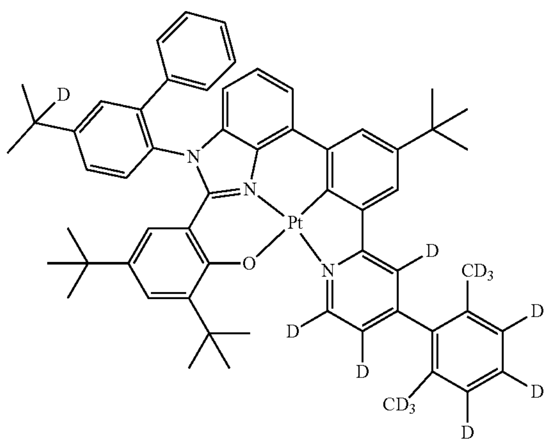
354
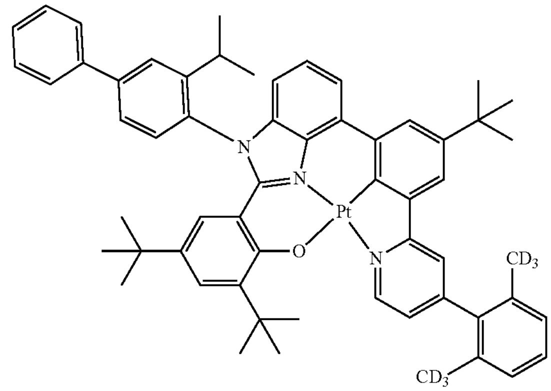
355
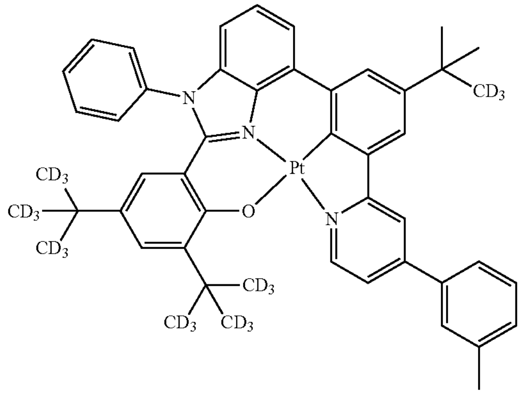
356
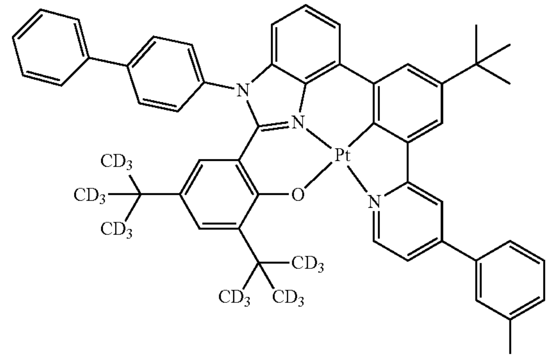

-continued
357
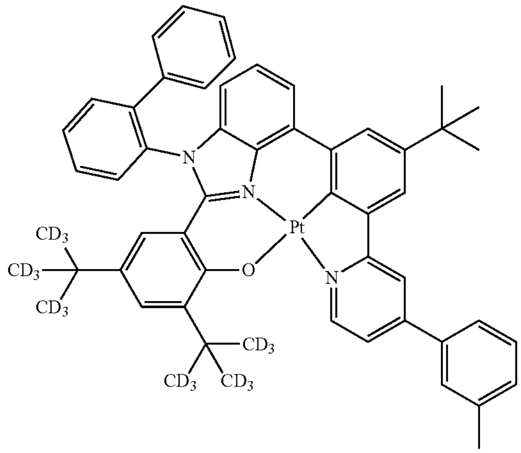
358
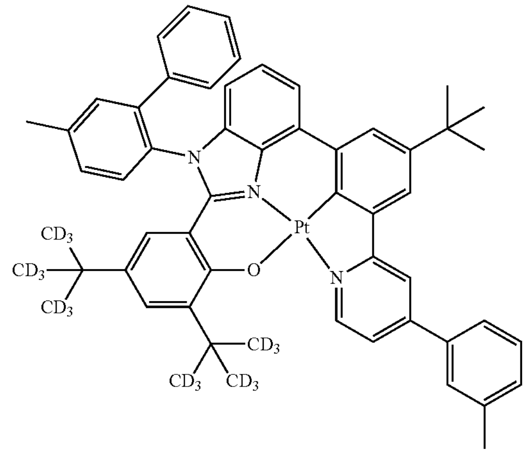
359
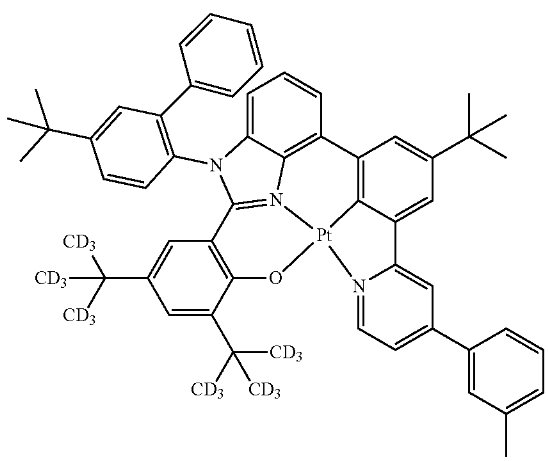
360
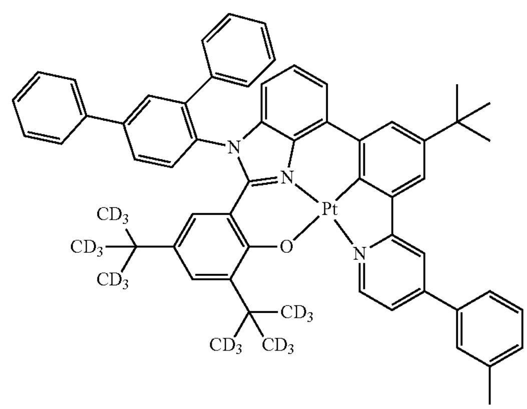
361
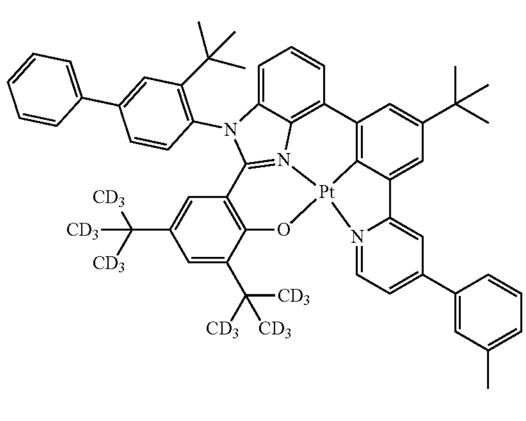
362
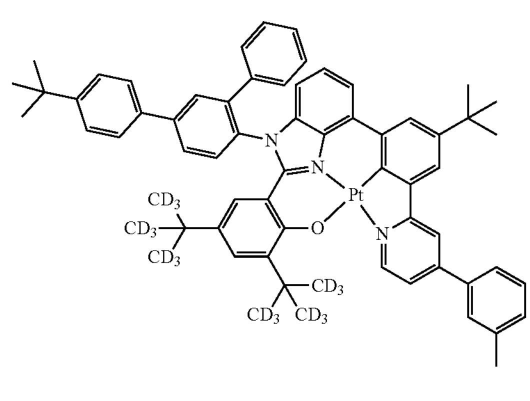

-continued
363
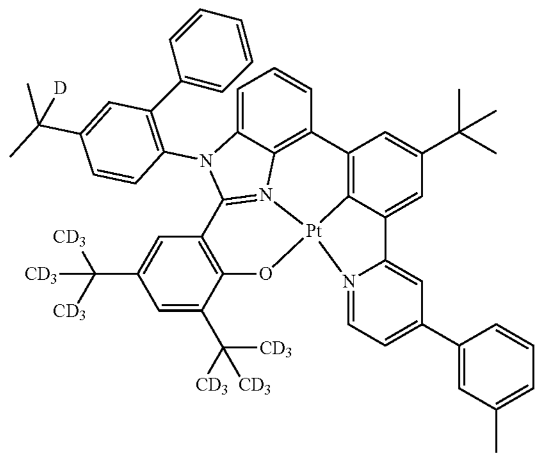
364
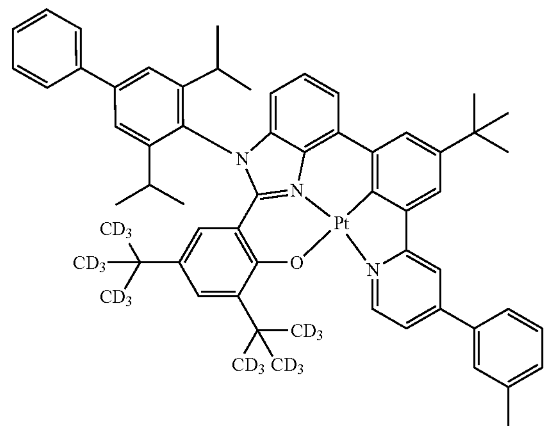
365
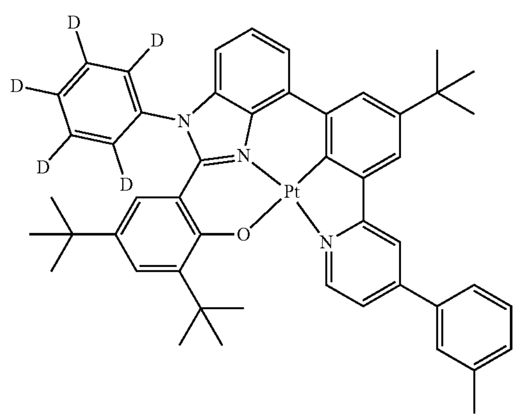
366
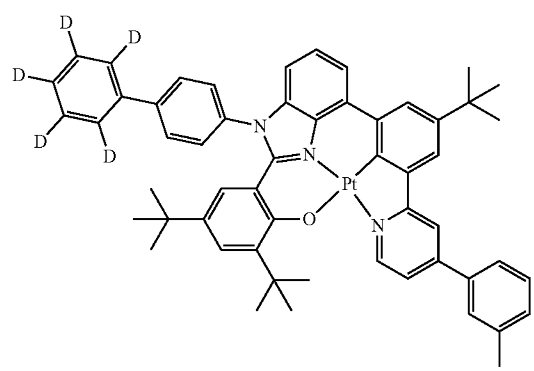
367
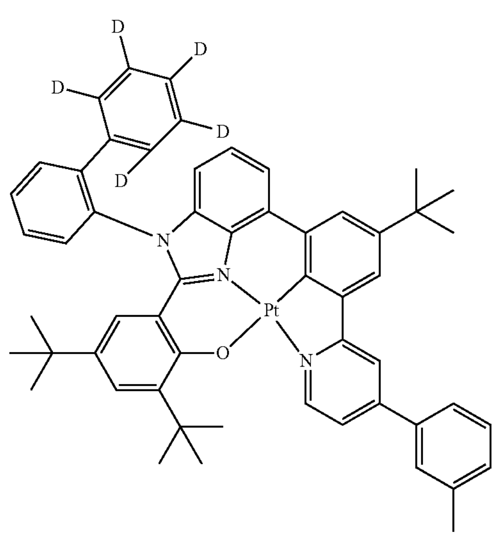
368
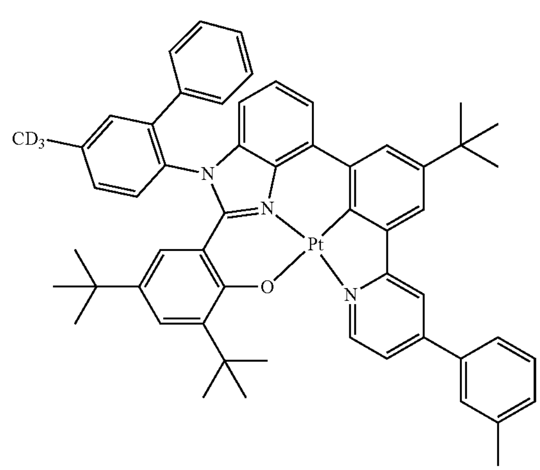

-continued
369
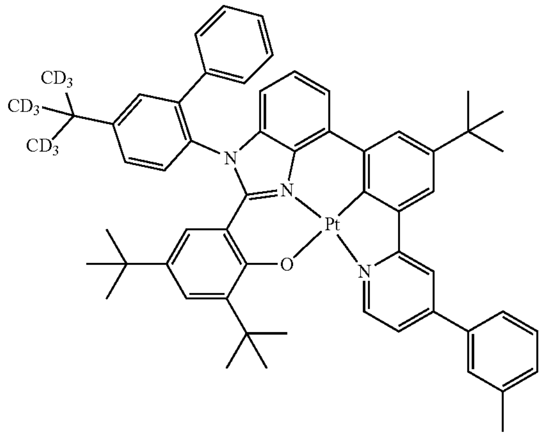
370
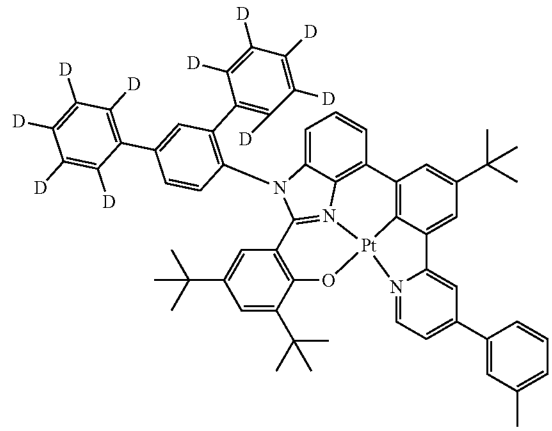
371
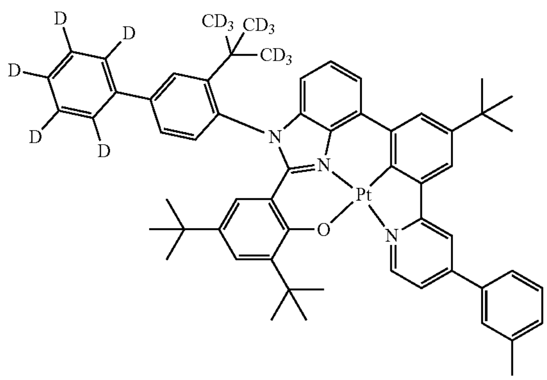
372
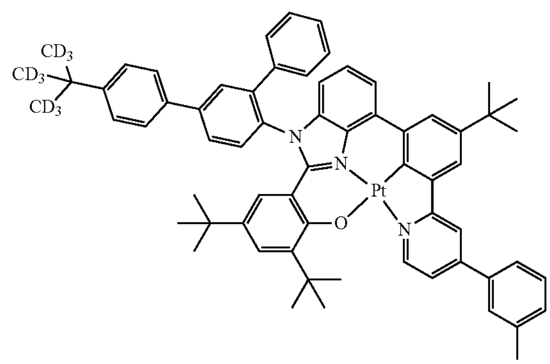
373
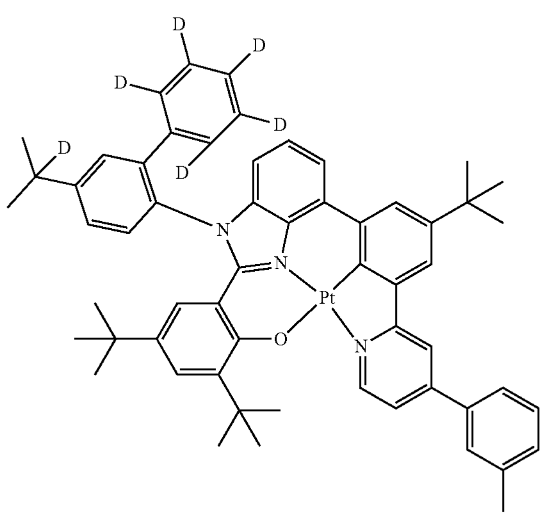
374
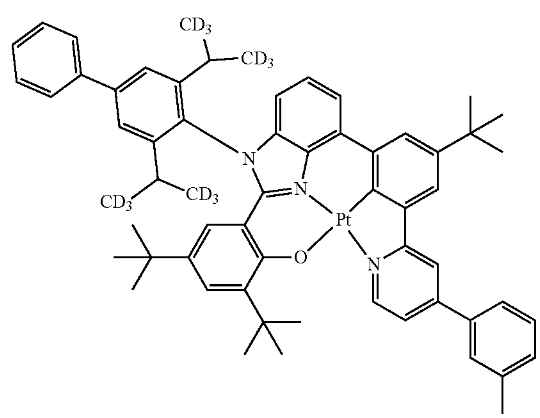

-continued
375
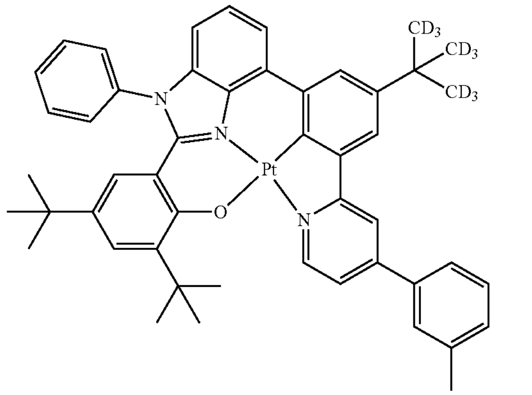
376
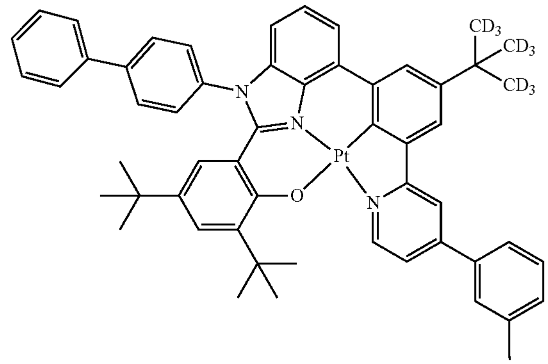
377
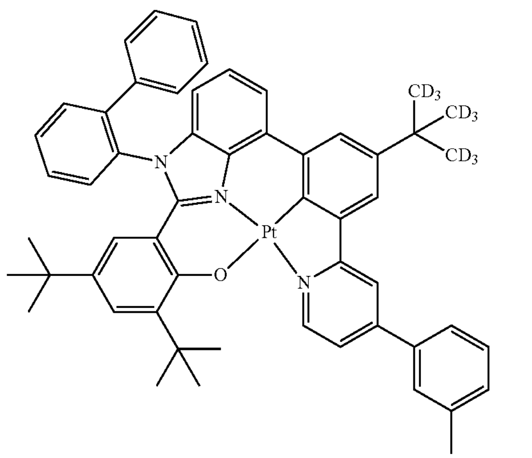
378
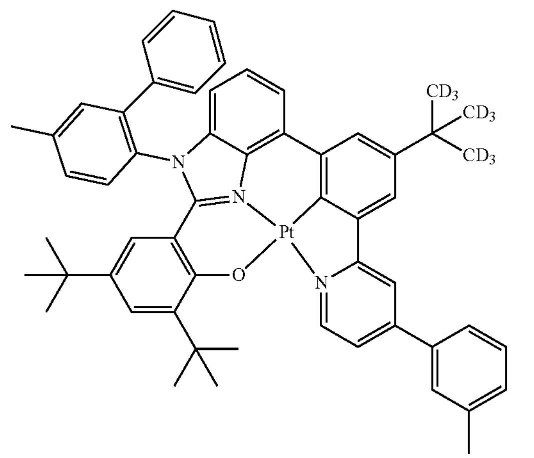
379
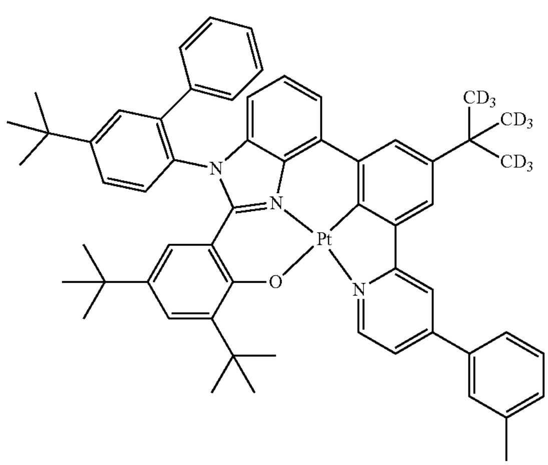
380
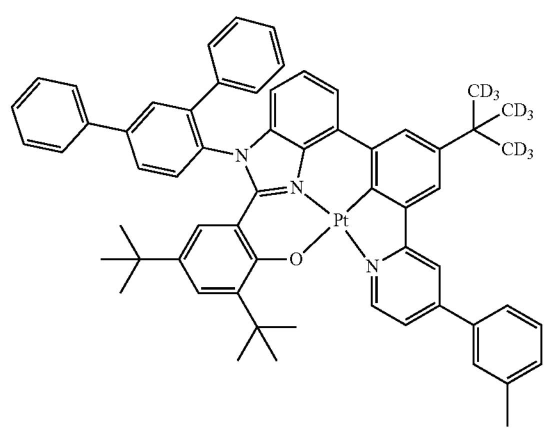

-continued
381
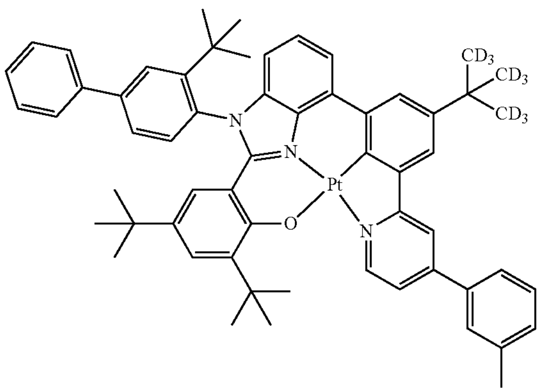
382
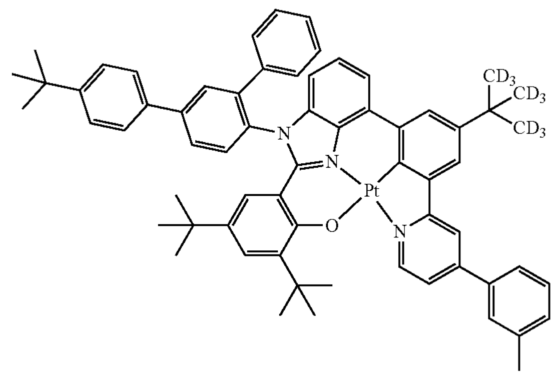
383
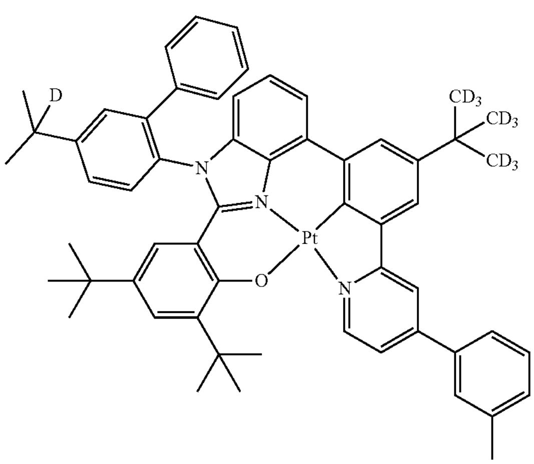
384
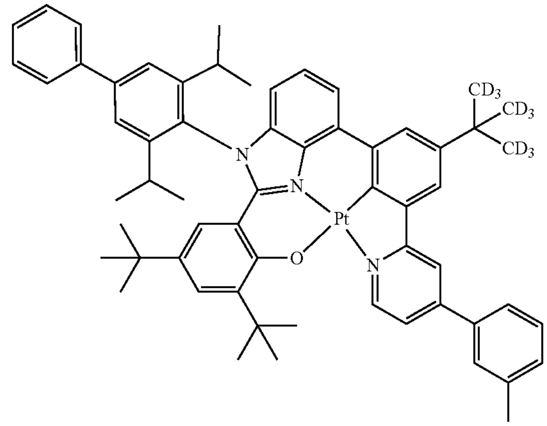
385
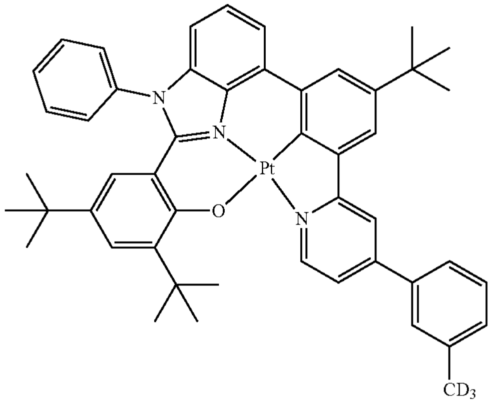
386
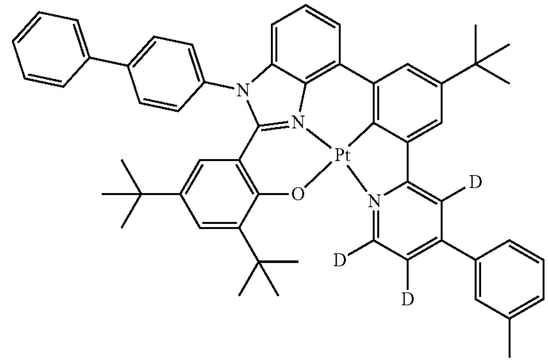

-continued
387
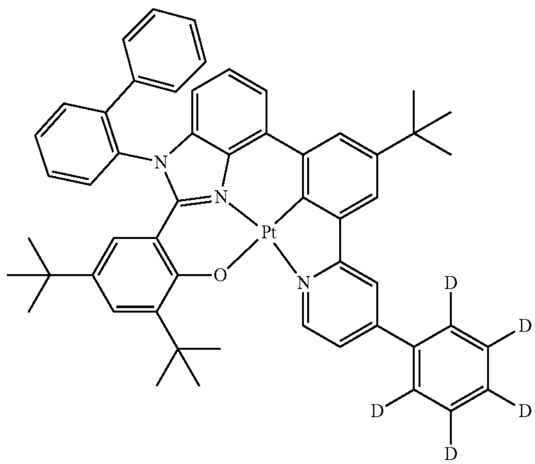
388
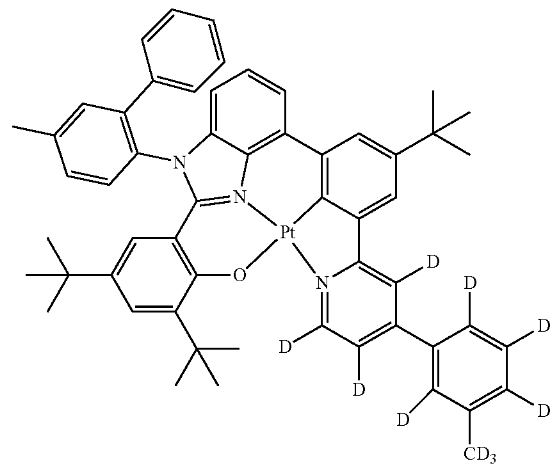
389
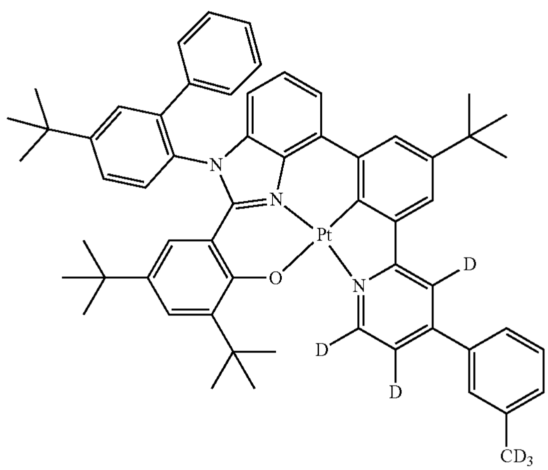
390
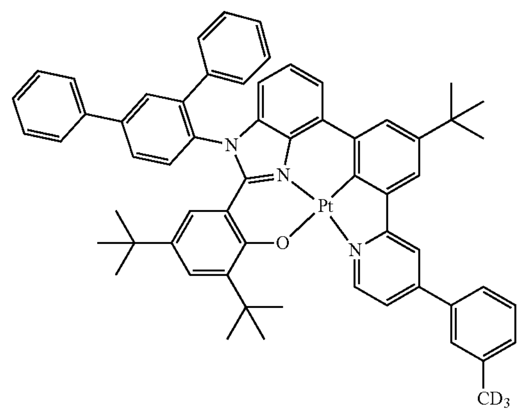
391
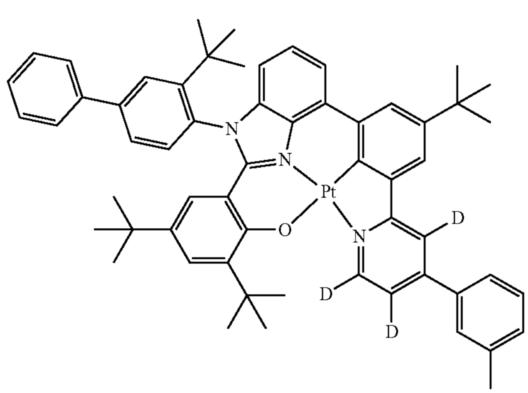
392
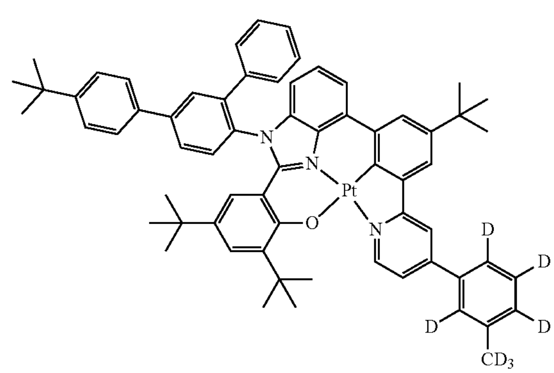

-continued
393
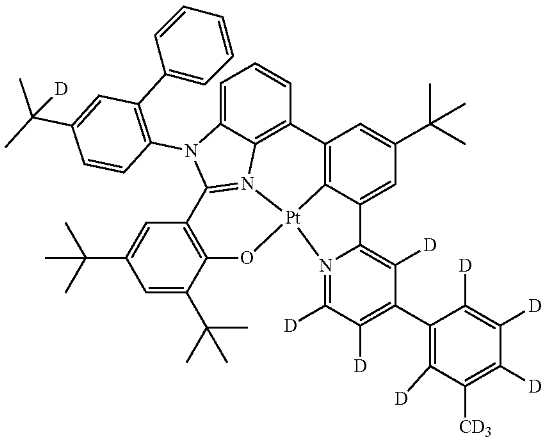
394
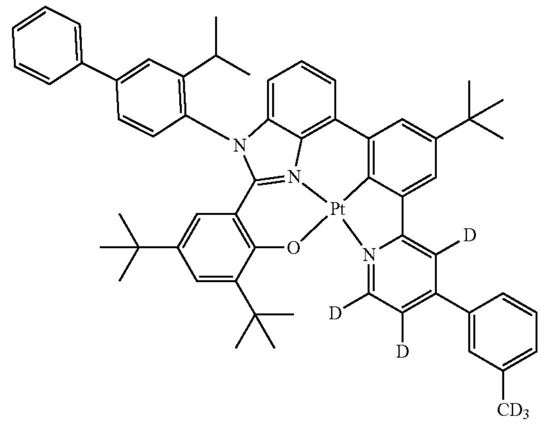
395
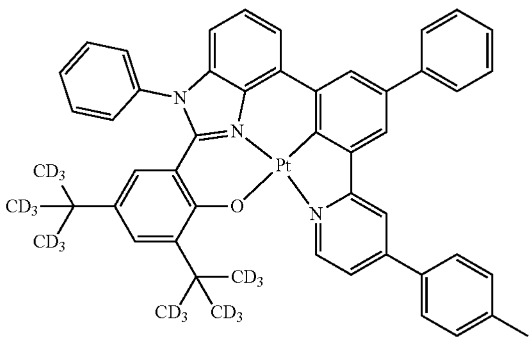
396
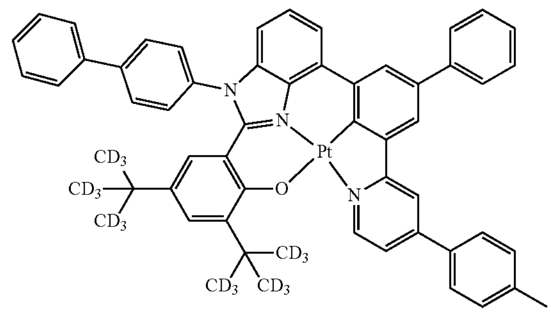
397
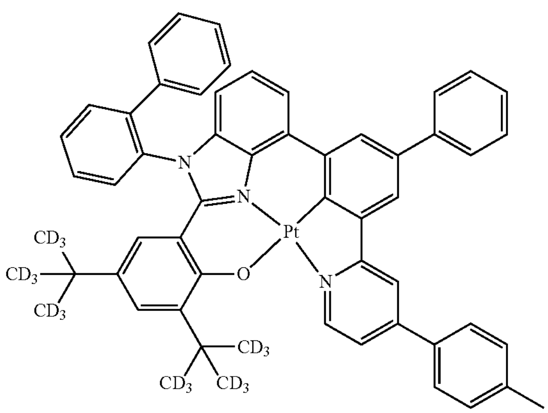
398
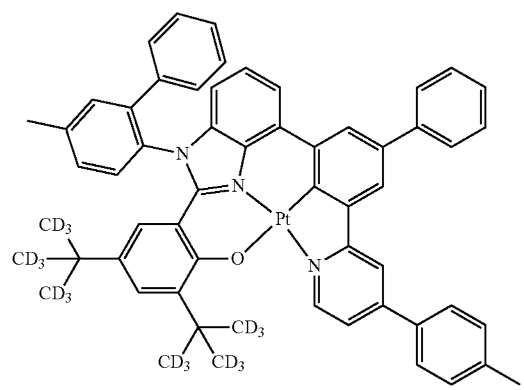
399
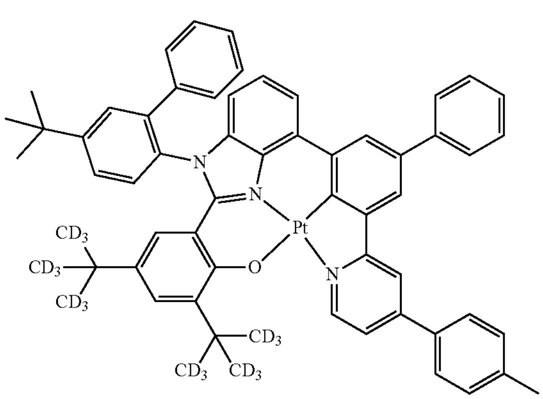
400
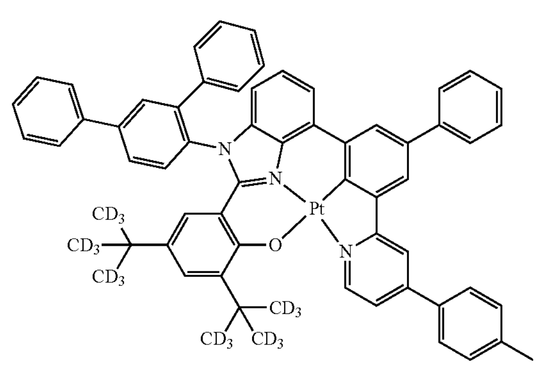

-continued
401
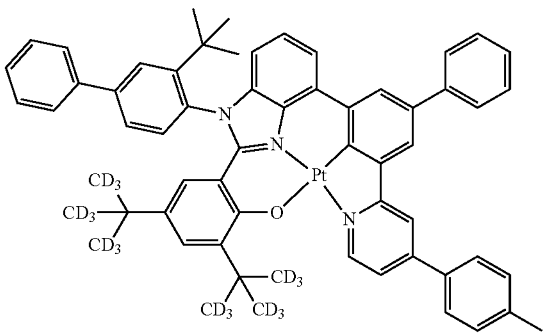
402
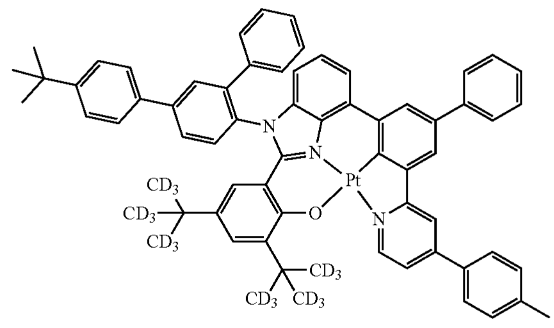
403
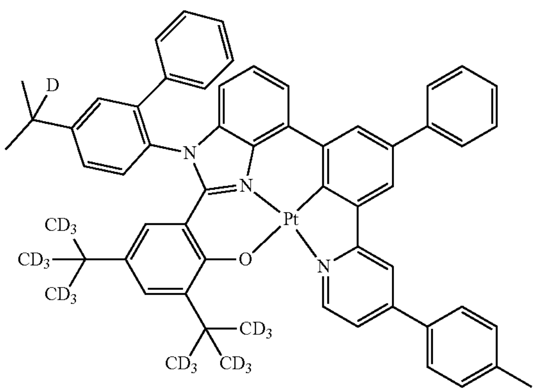
404
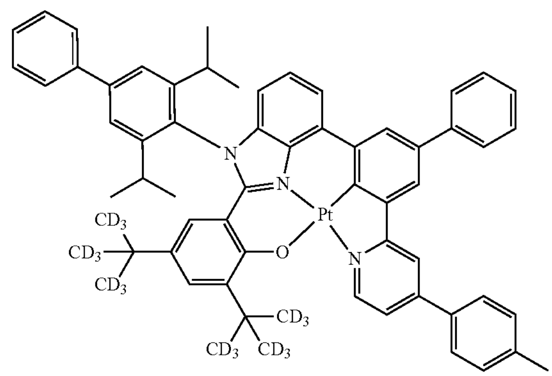
405
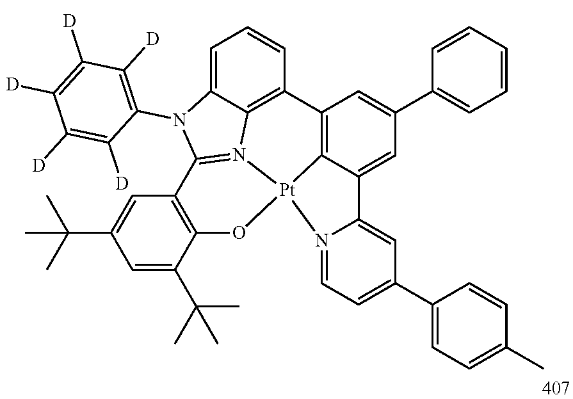
406
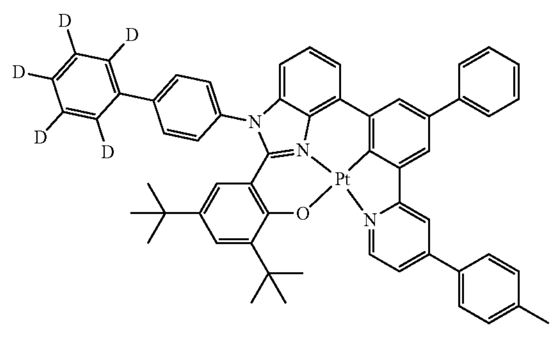
407
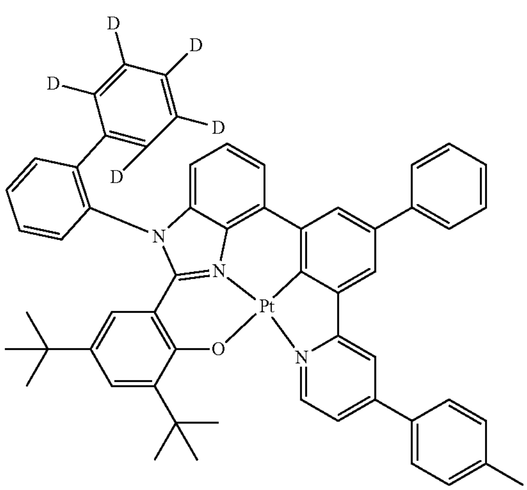
408
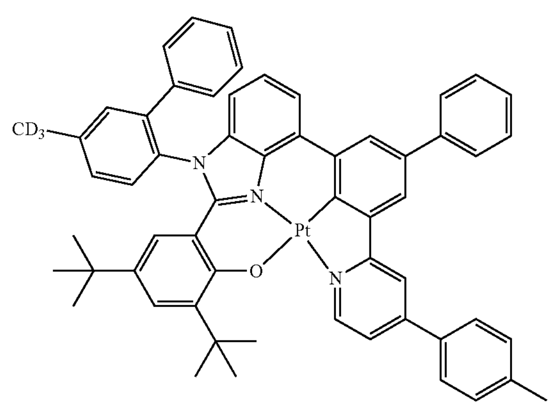

-continued
409
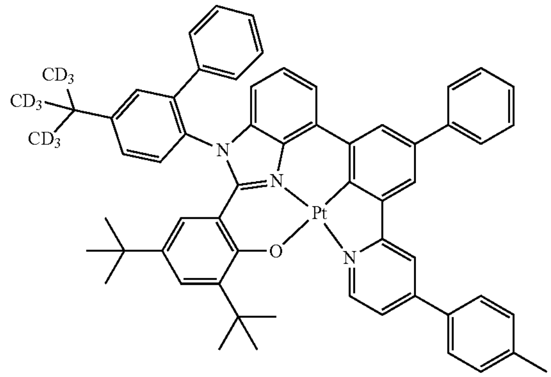
410
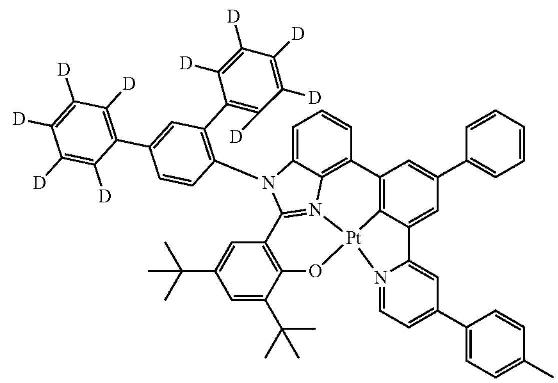
411
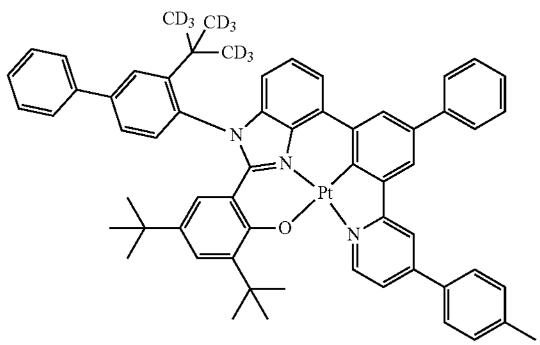
412
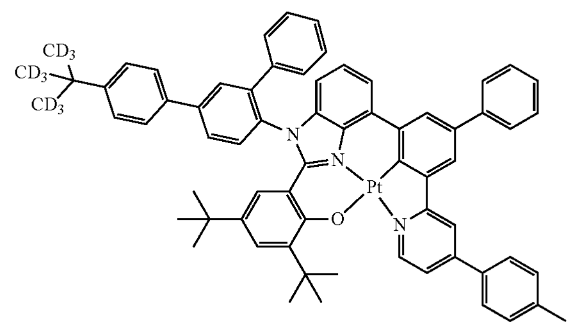
413
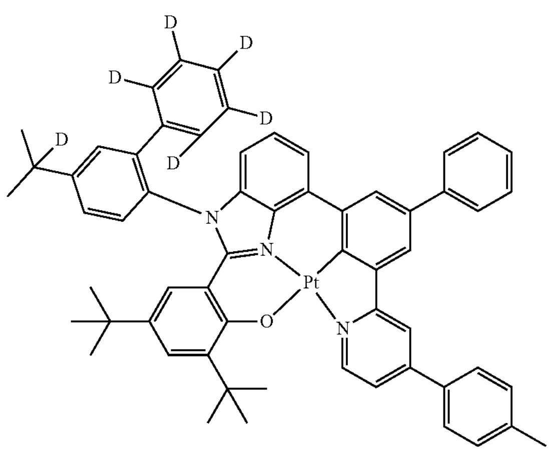
414
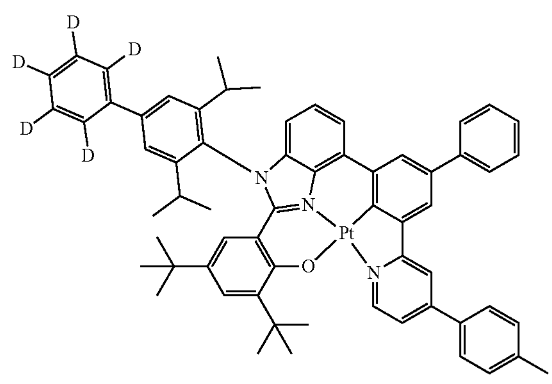
415
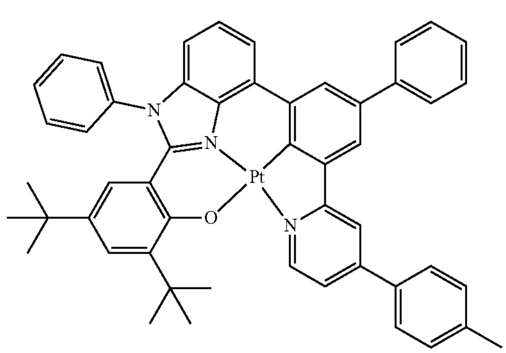
416
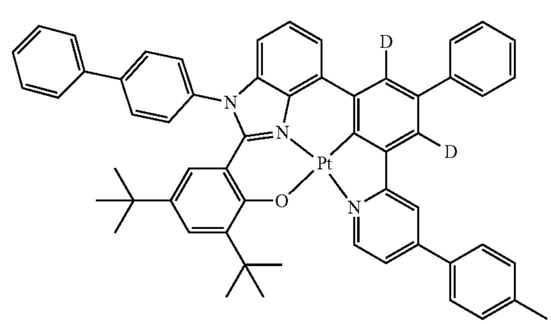

-continued
417
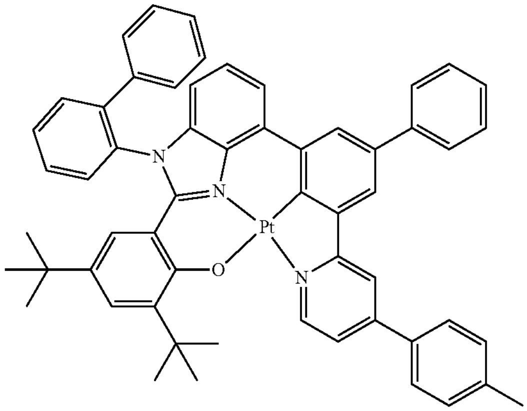
418
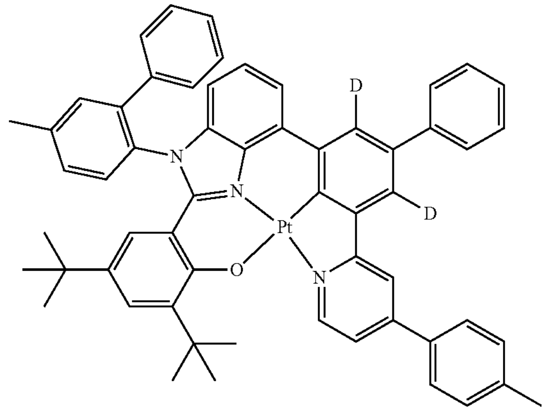
419
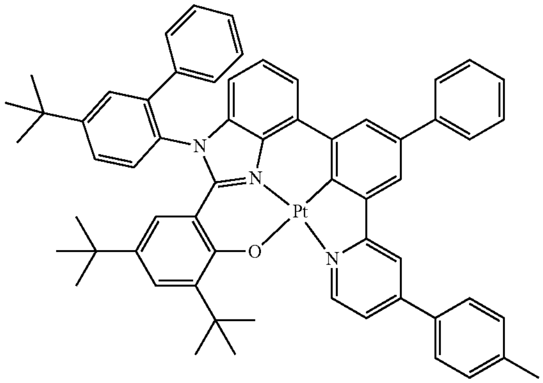
420
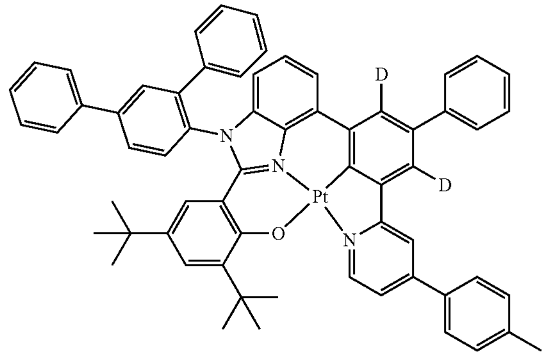
421
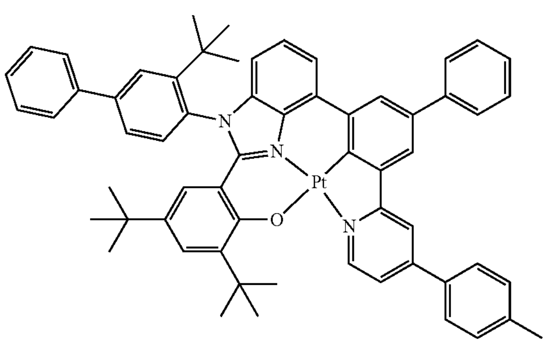
422
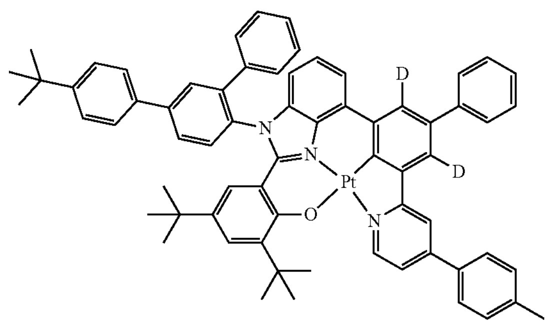
423
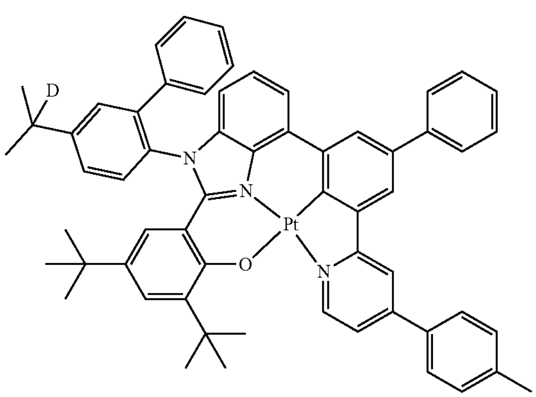
424
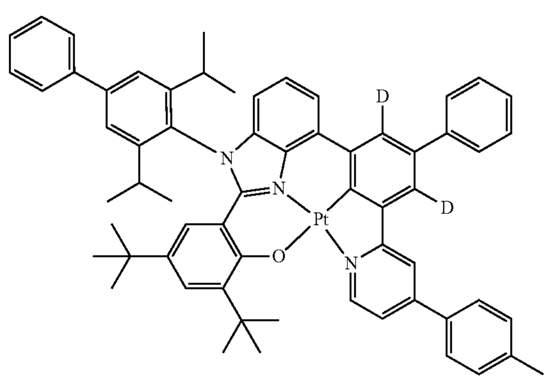

-continued
425
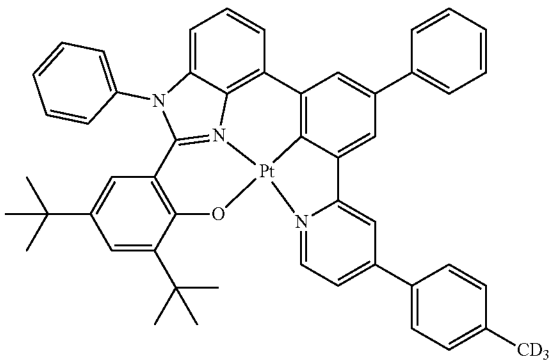
426
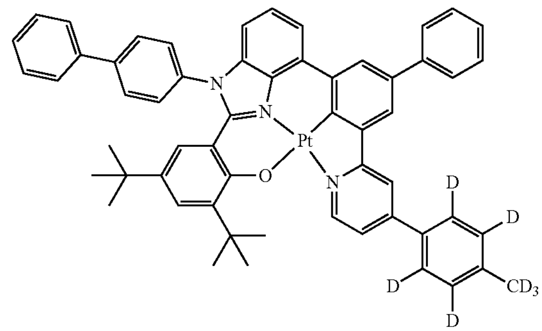
427
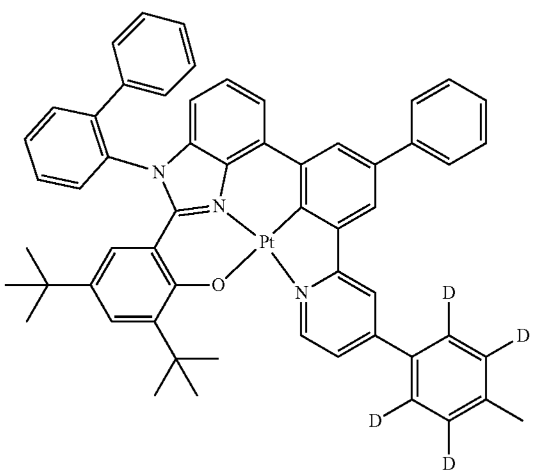
428
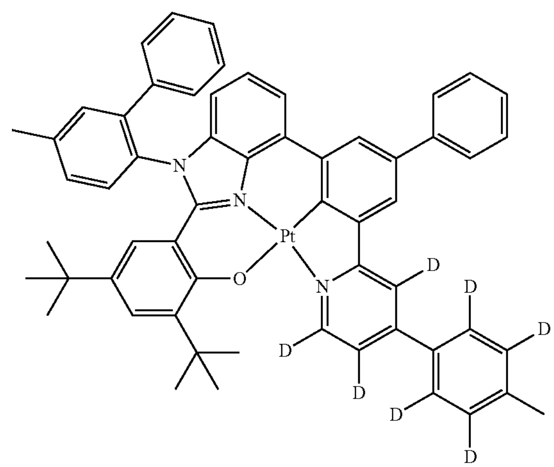
429
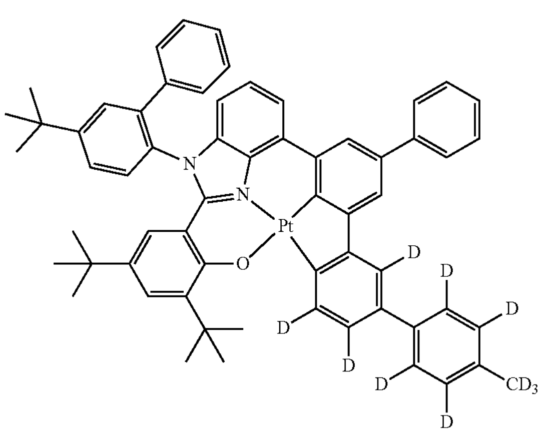
430
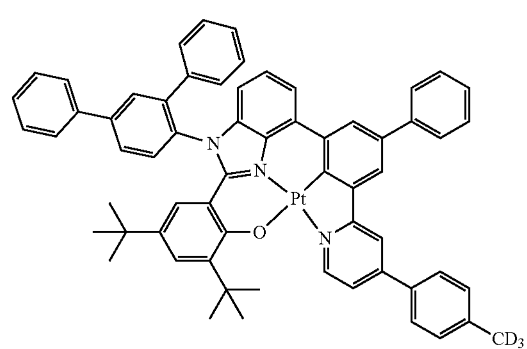

-continued
431
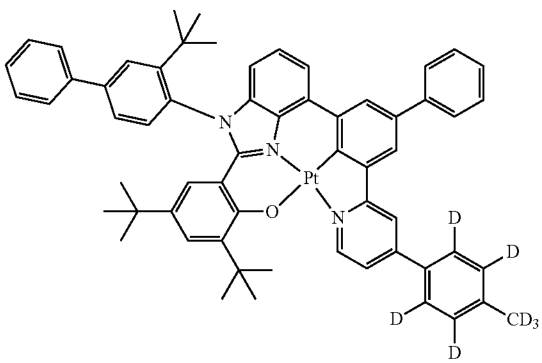
432
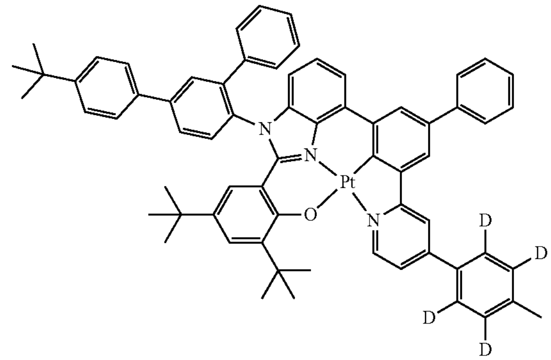
433
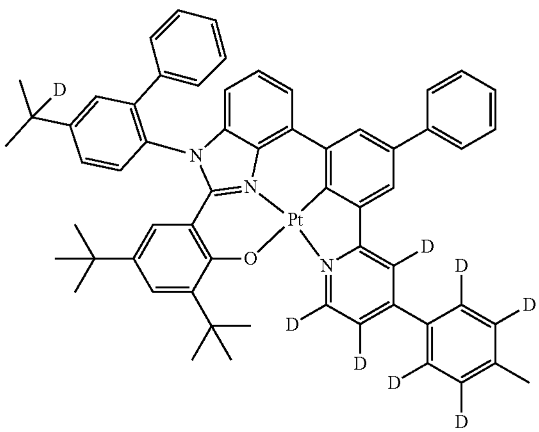
434
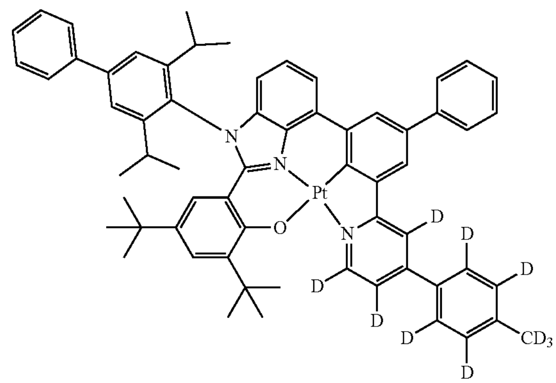
435
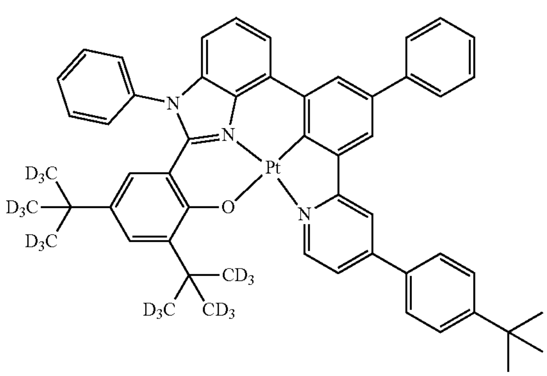
436
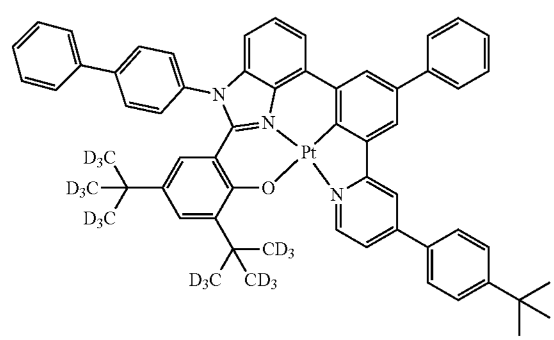
437
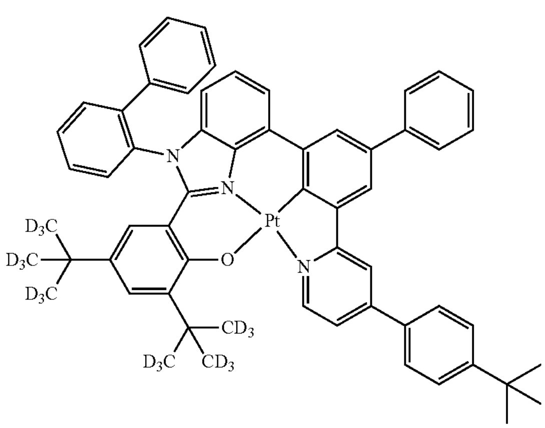
438
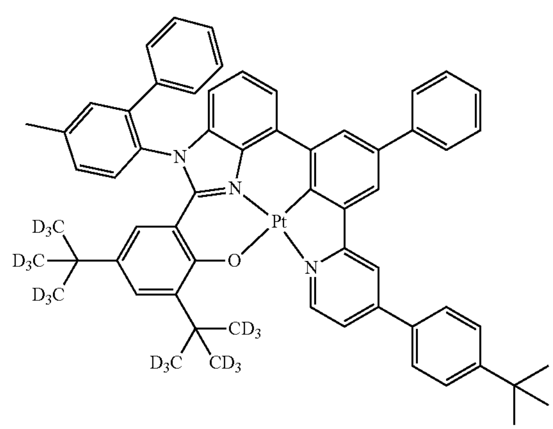

-continued
439
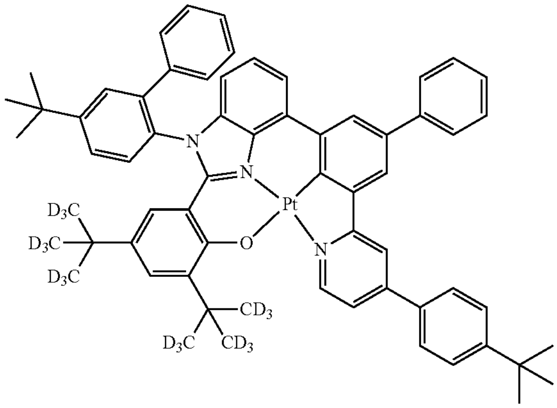
440
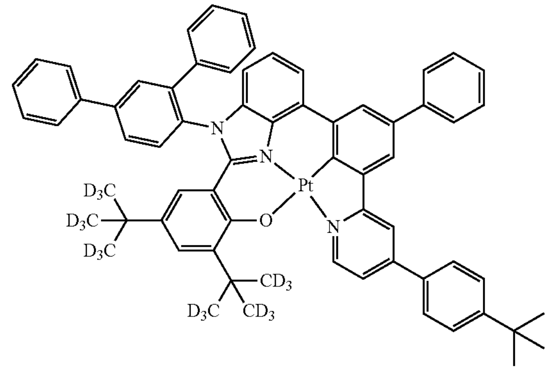
441
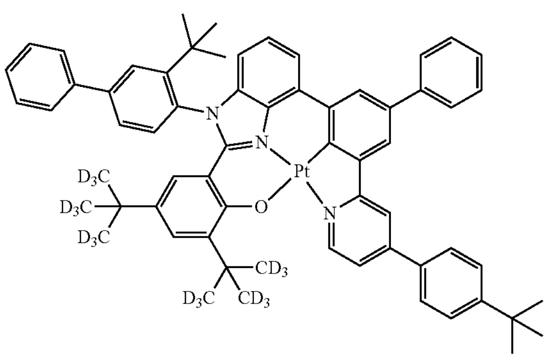
442
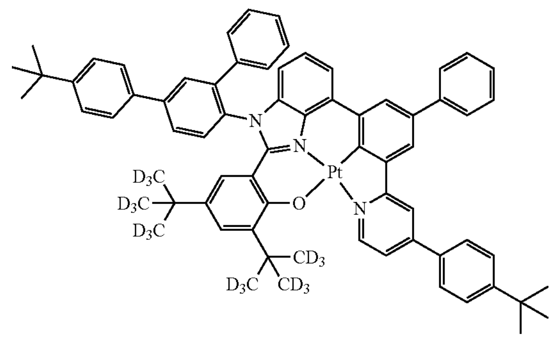
443
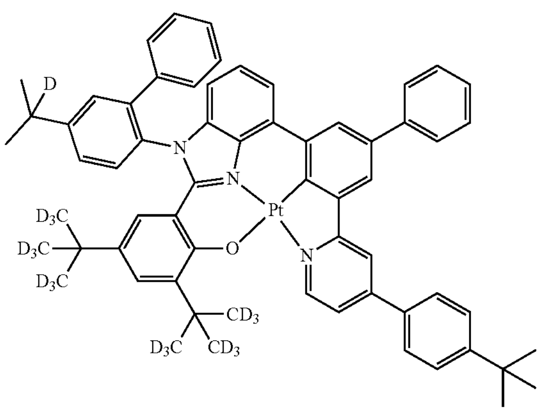
444
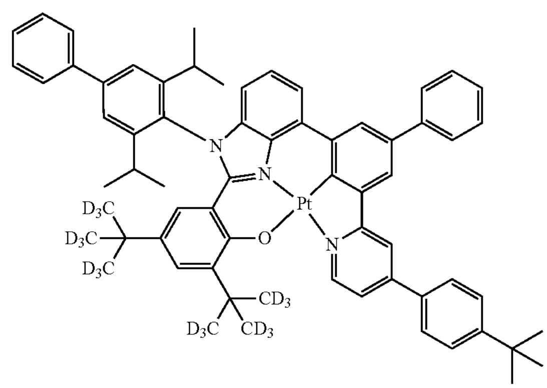
445
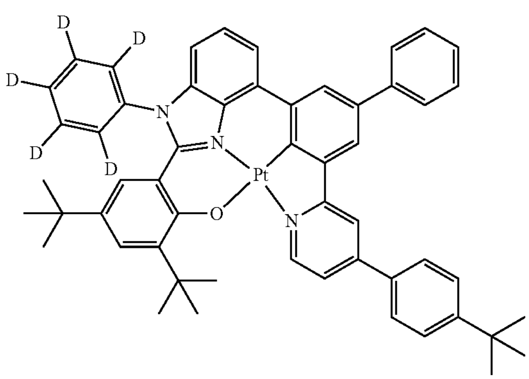
446
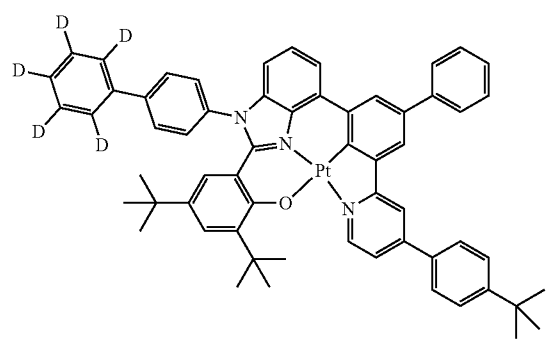

-continued
447
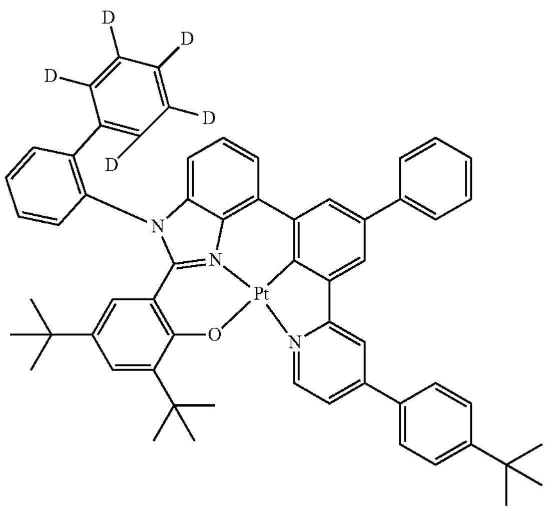
448
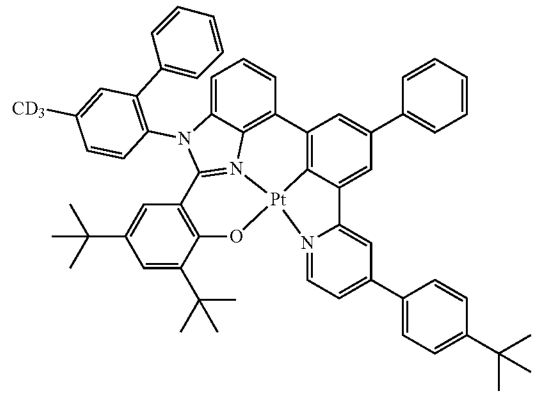
449
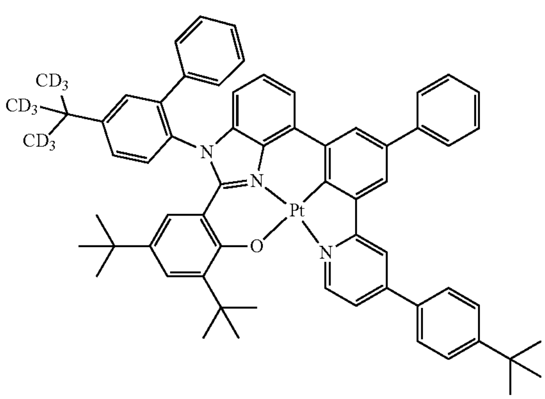
450
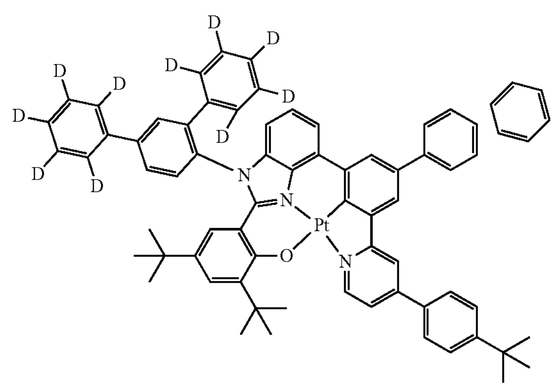
451
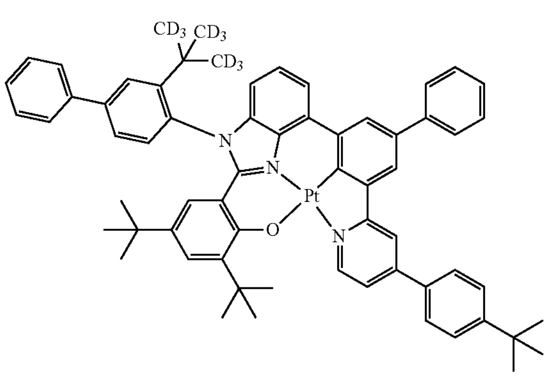
452
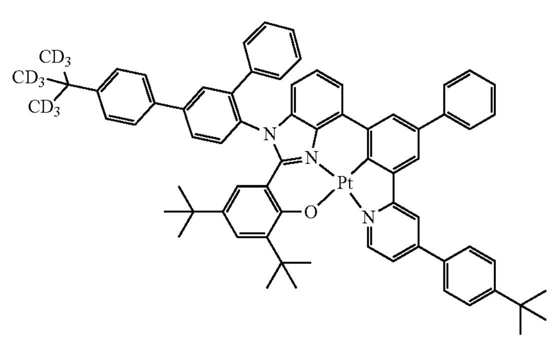

-continued
453
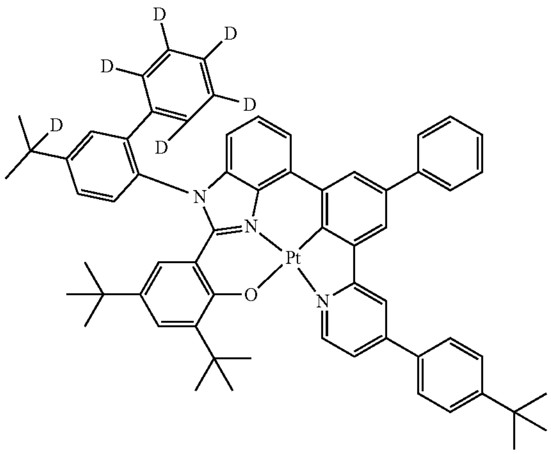
454
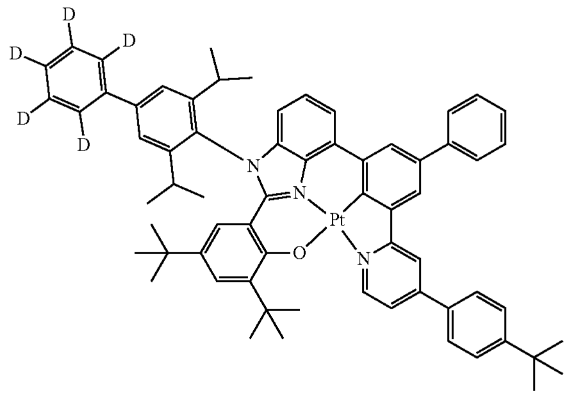
455
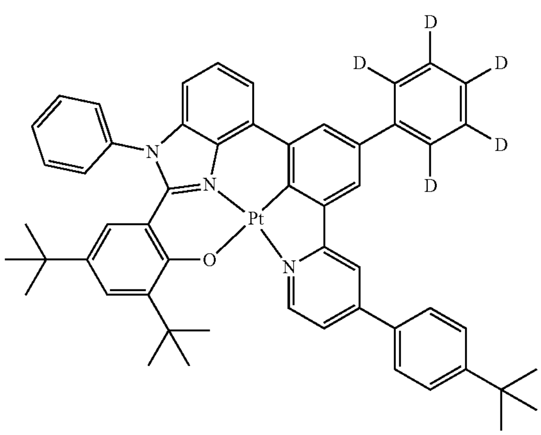
456
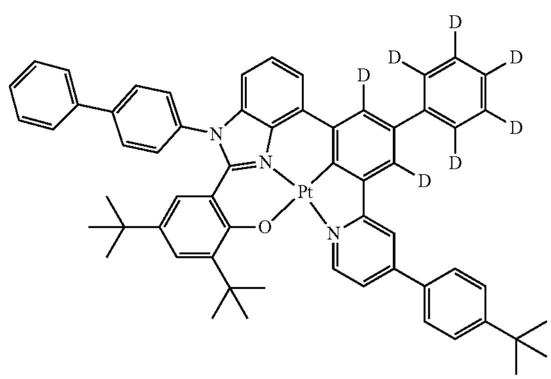
457
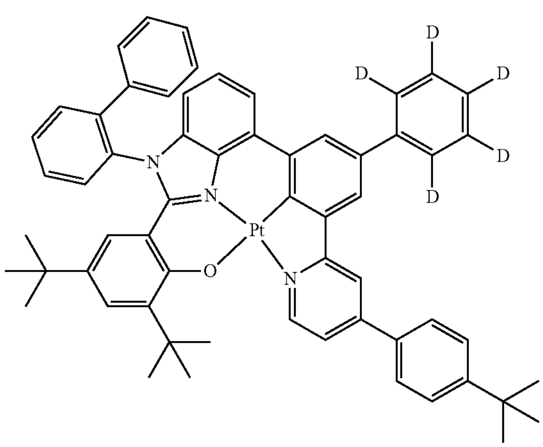
458
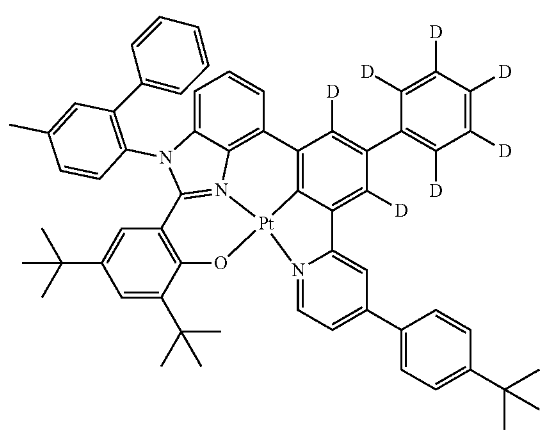

-continued
459
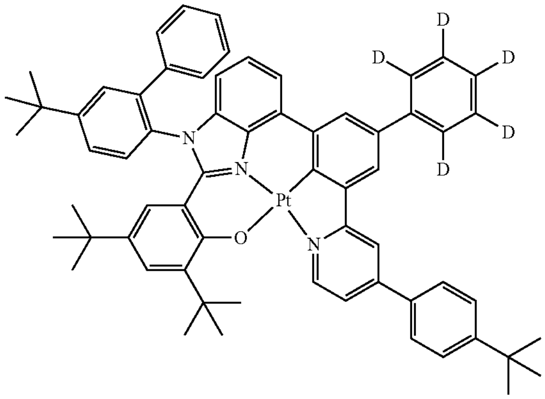
460
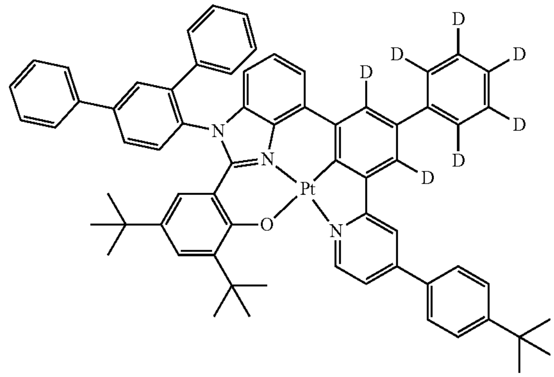
461
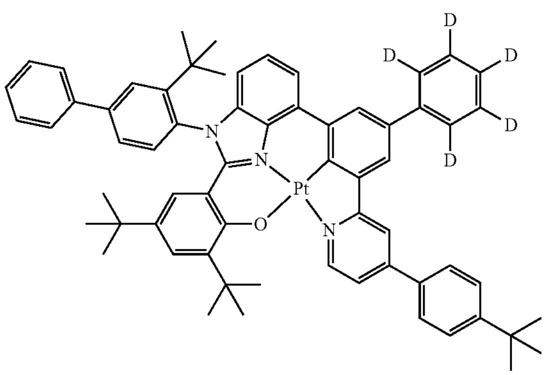
462
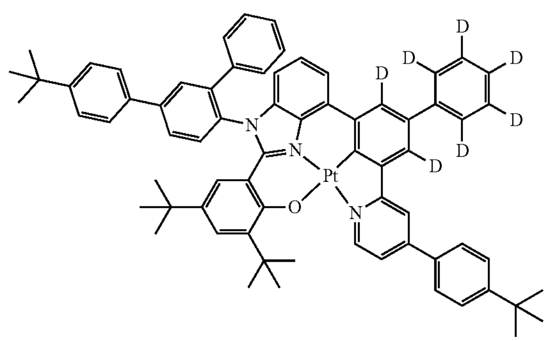
463
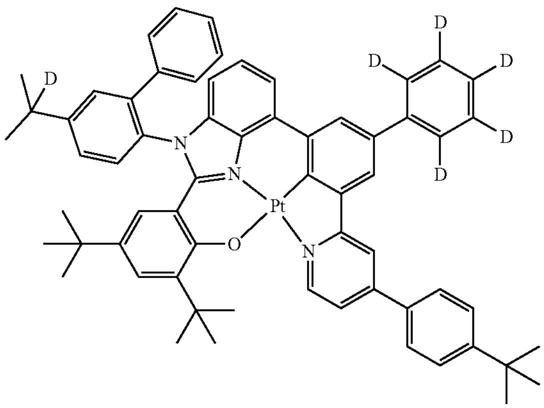
464
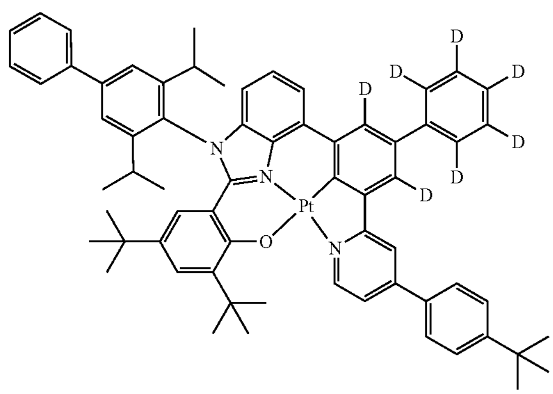
465
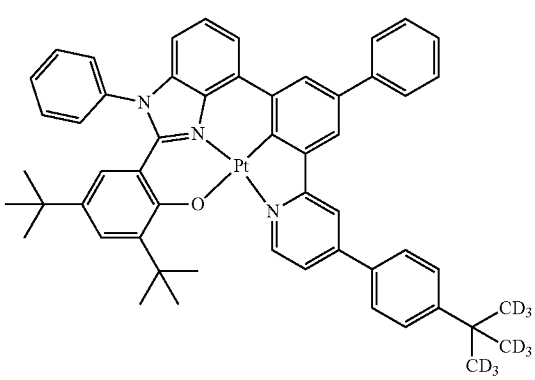
466
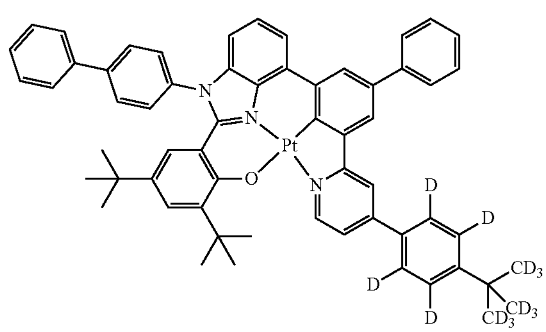

-continued
467
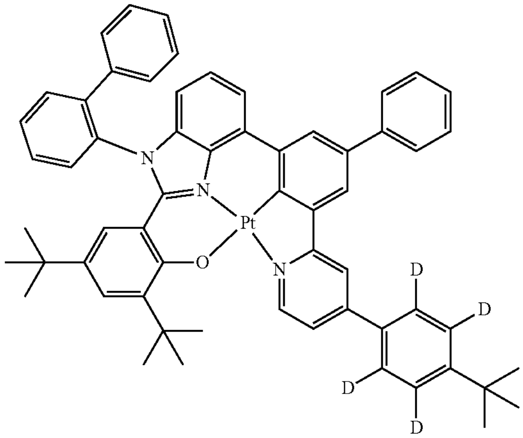
468
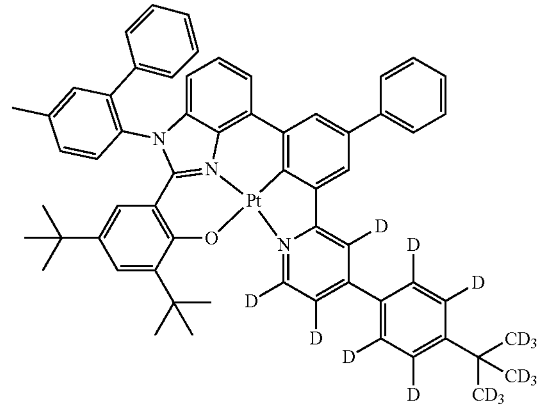
469
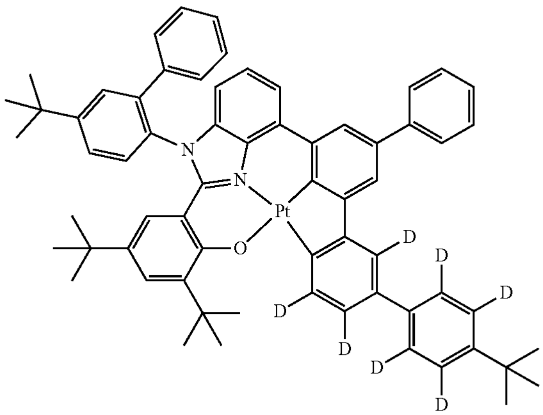
470
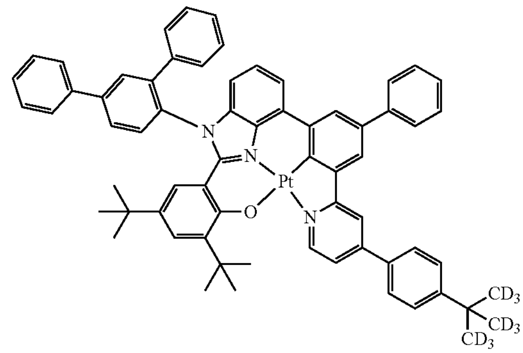
471
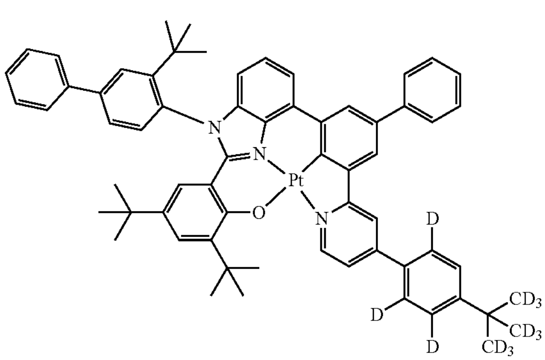
472
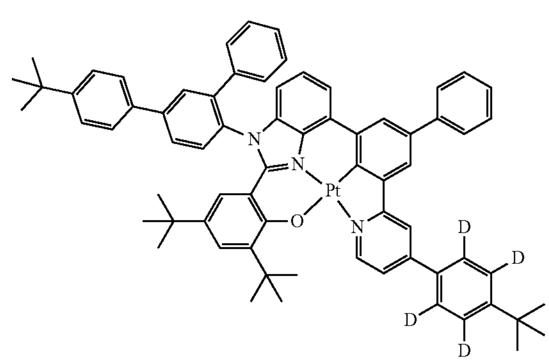

-continued
473
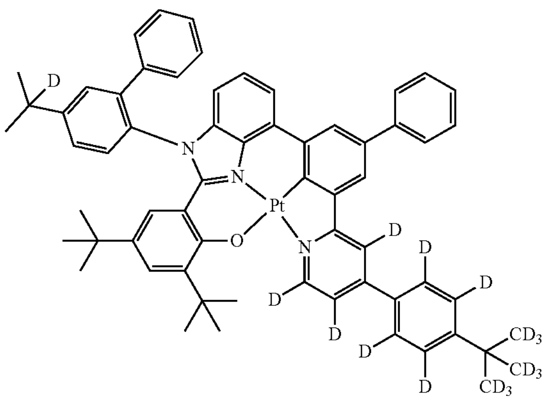
474
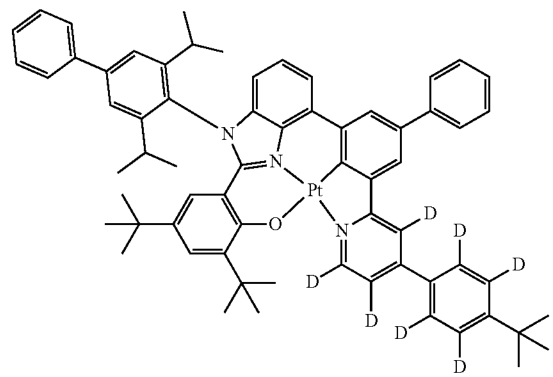
475
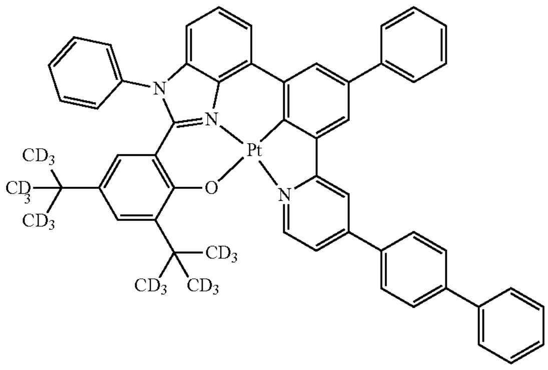
476
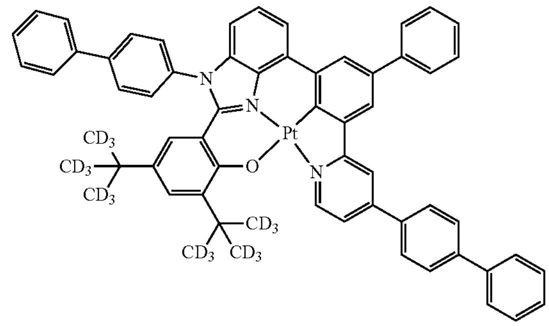
477
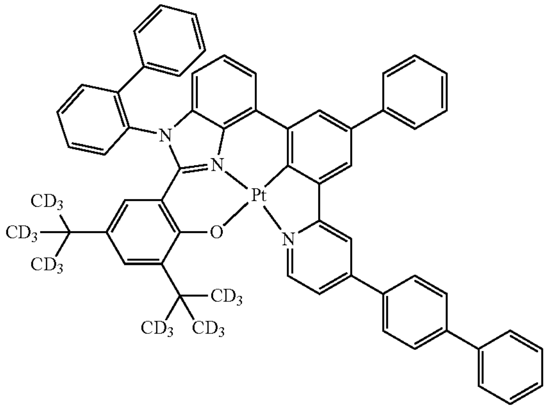
478
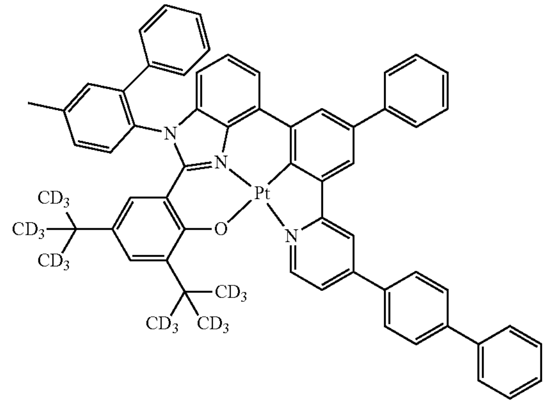
479
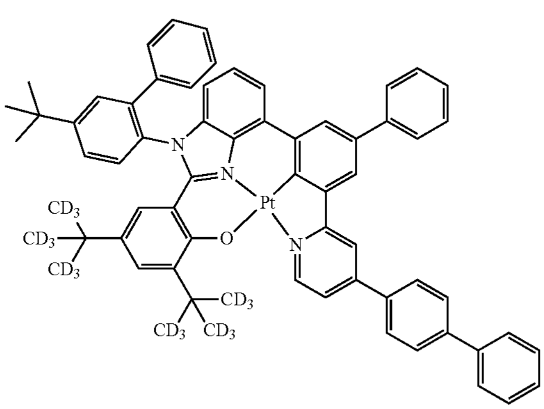
480
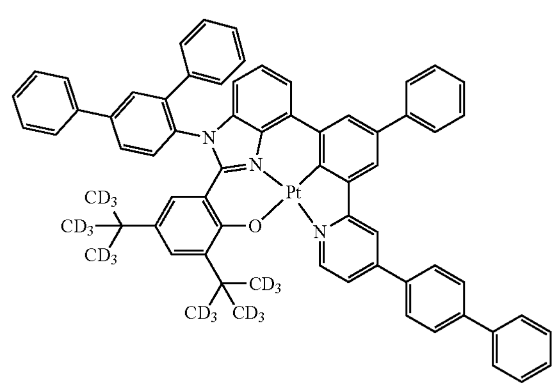

-continued
481
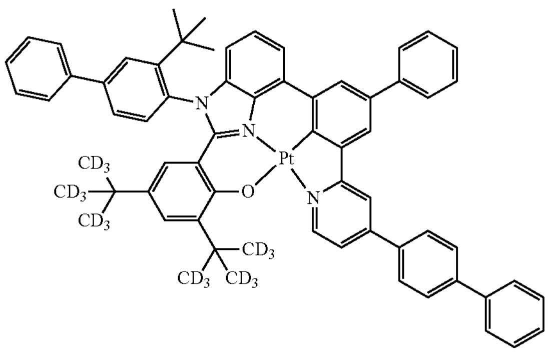
482
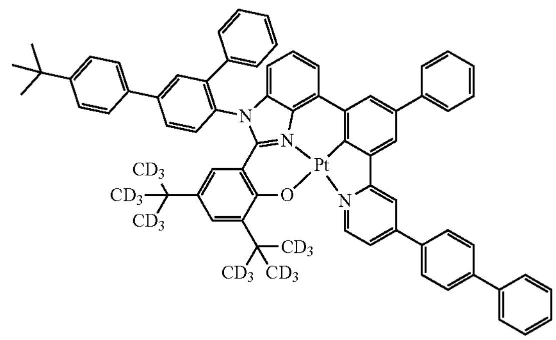
483
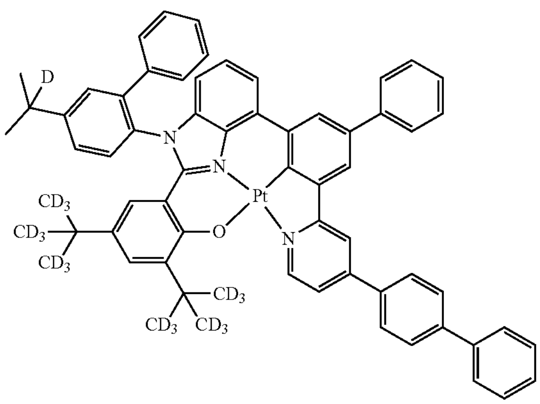
484
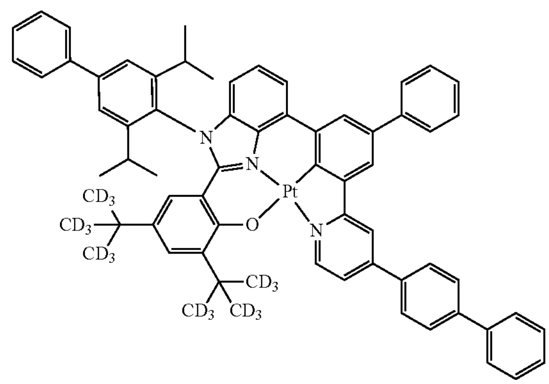
485
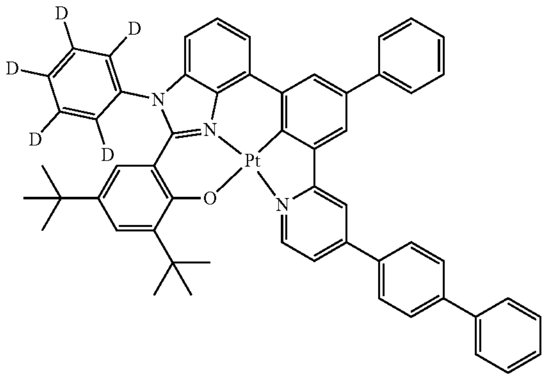
486
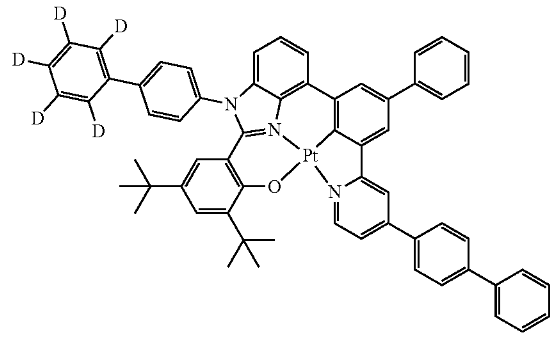

-continued
487
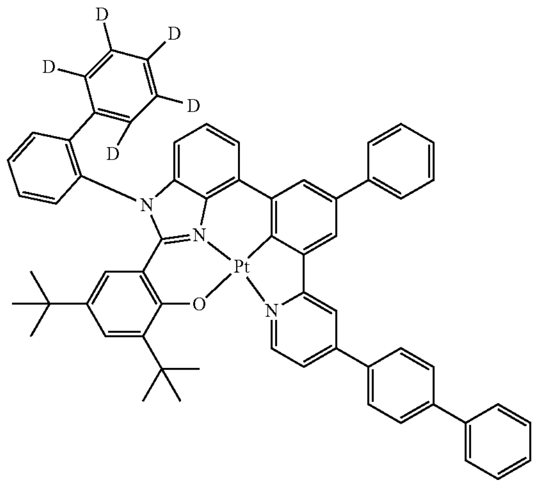
488
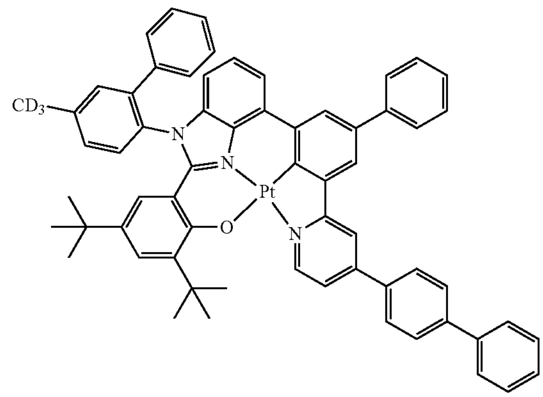
489
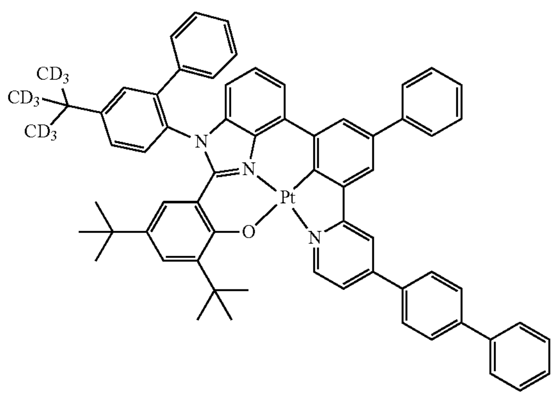
490
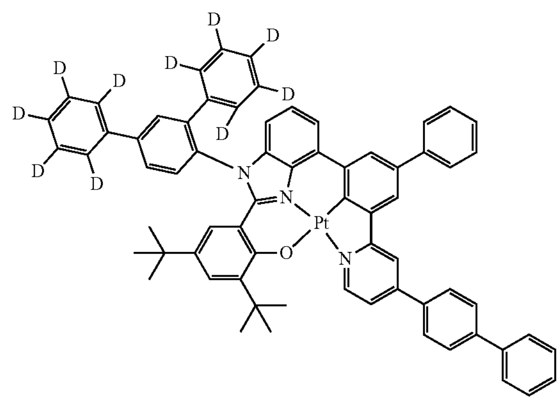
491
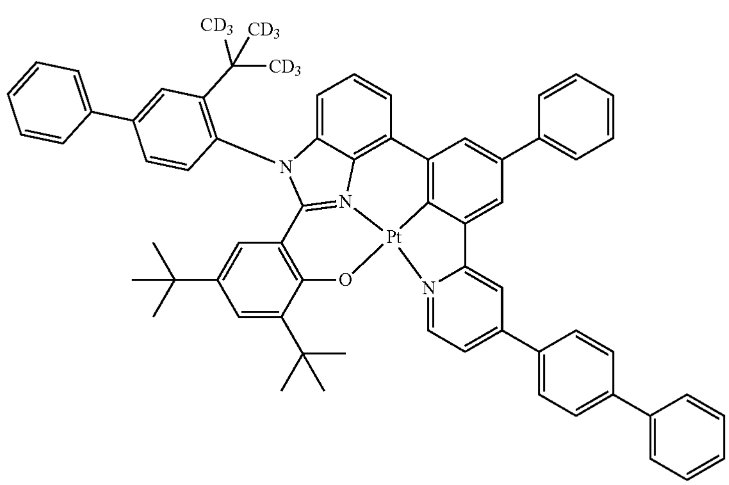

-continued
492
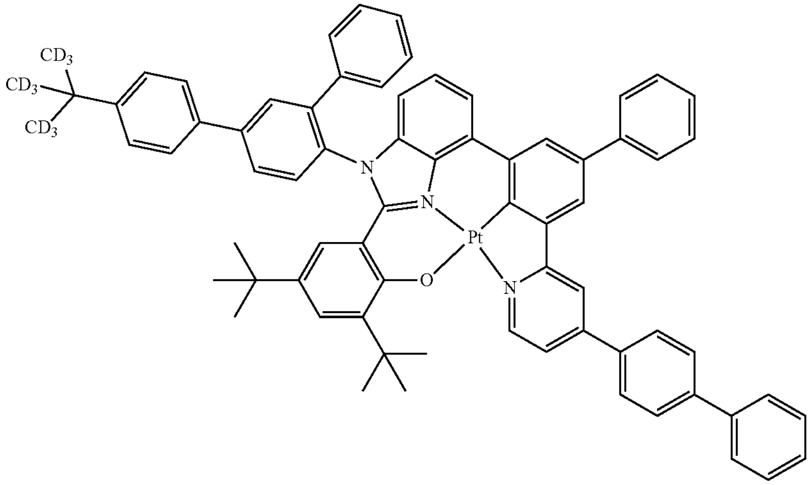
493
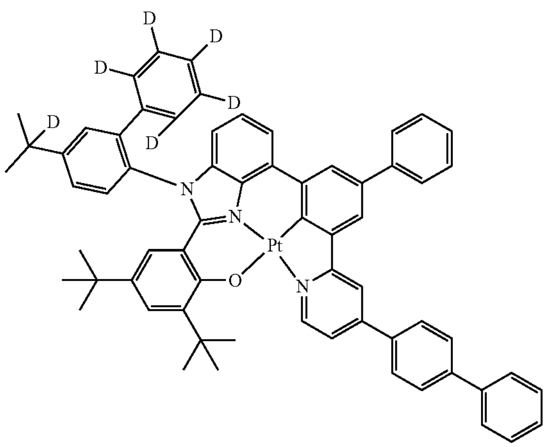
494
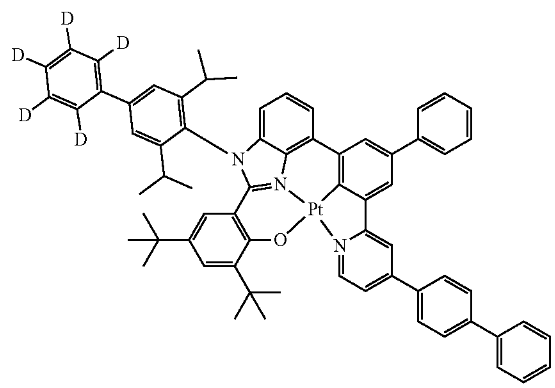
495
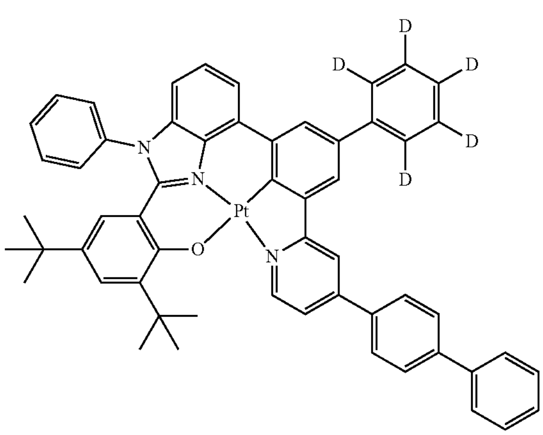
496
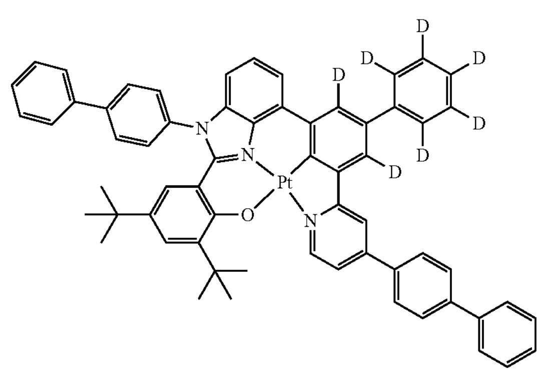

-continued
497
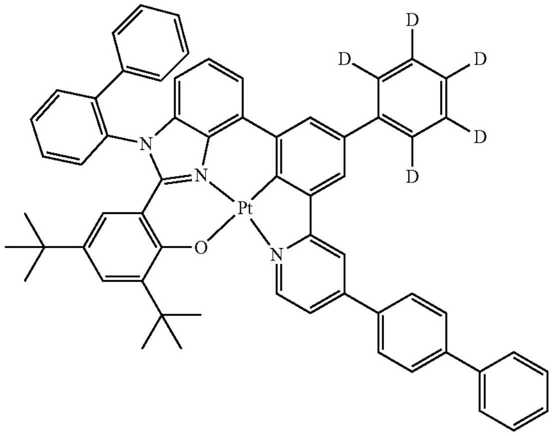
498
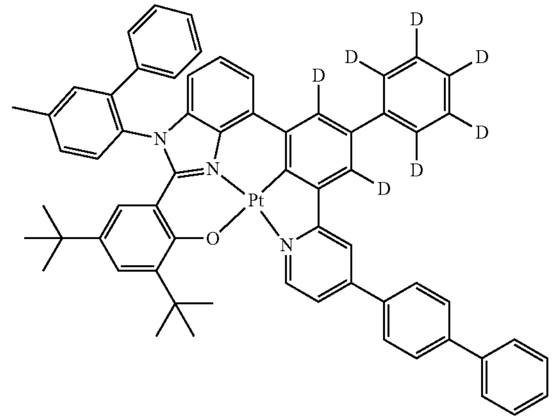
499
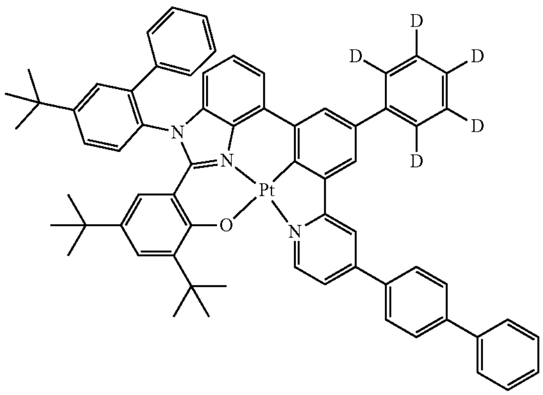
500
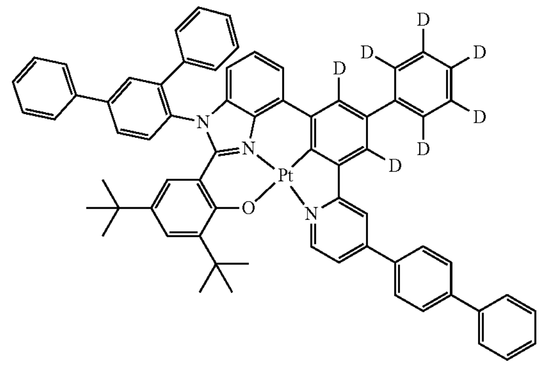
501
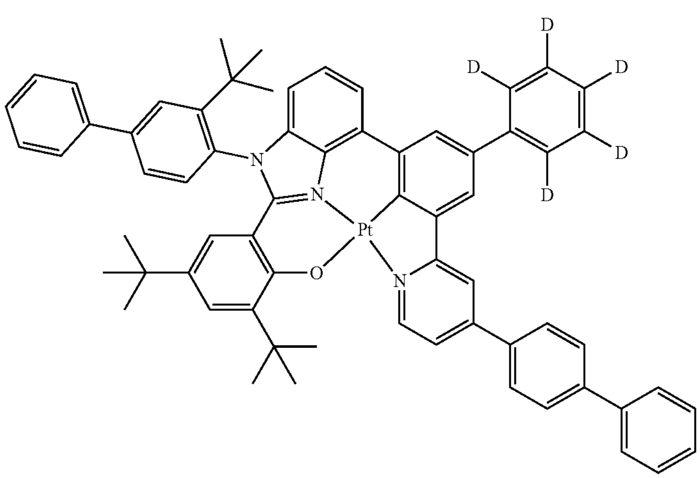

-continued
502
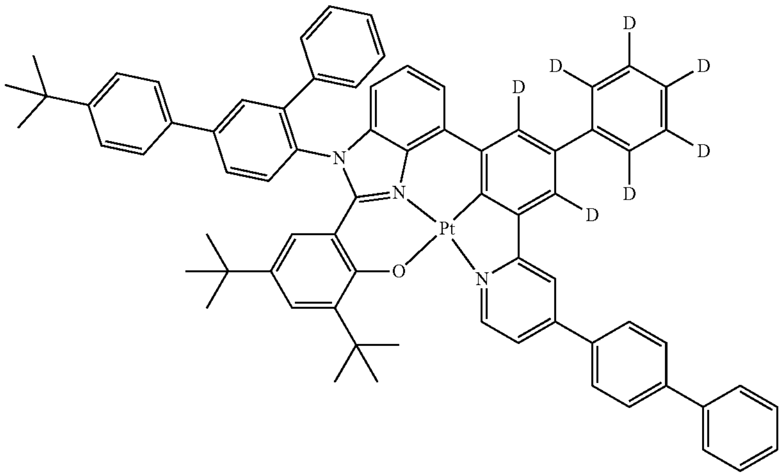
503
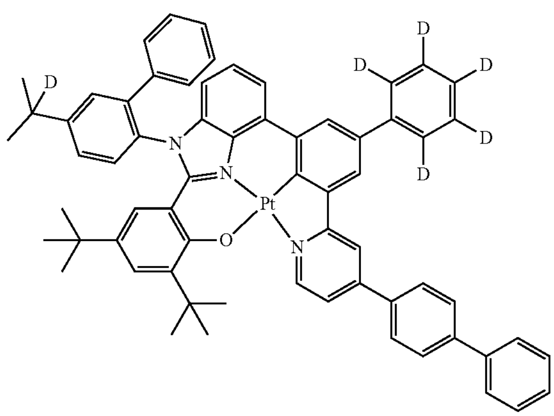
504
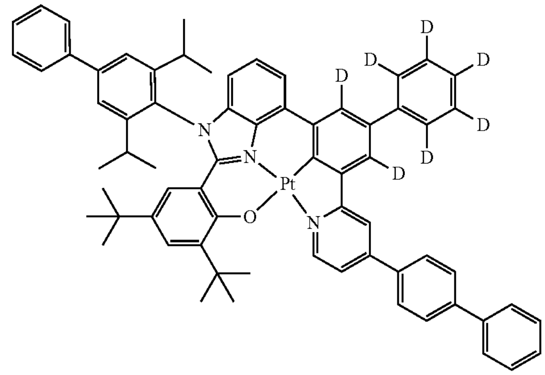
505
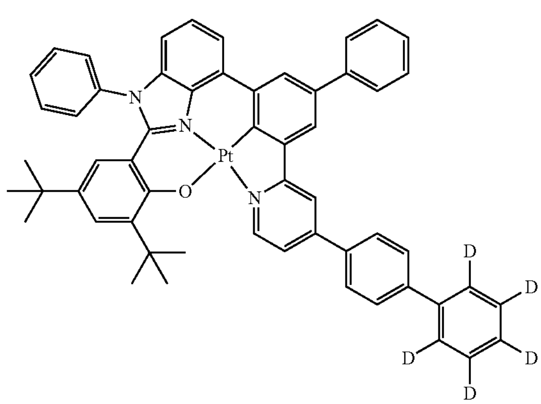
506
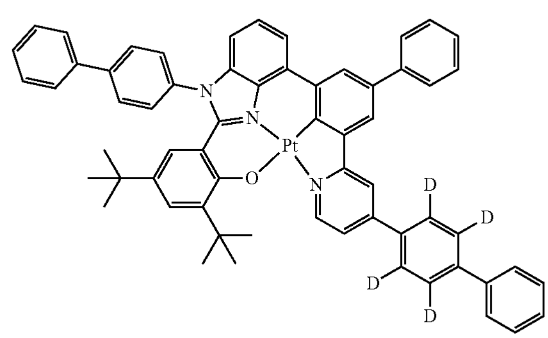

-continued
507
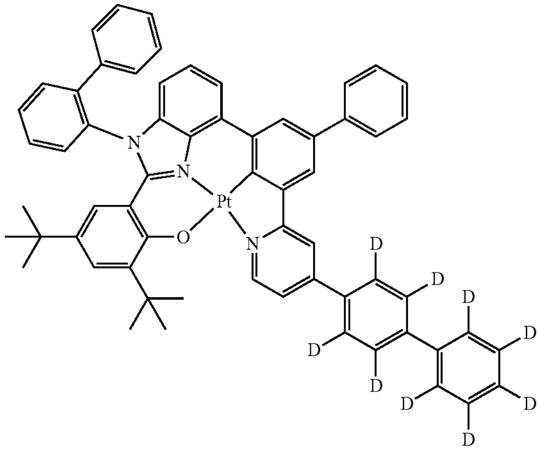
508
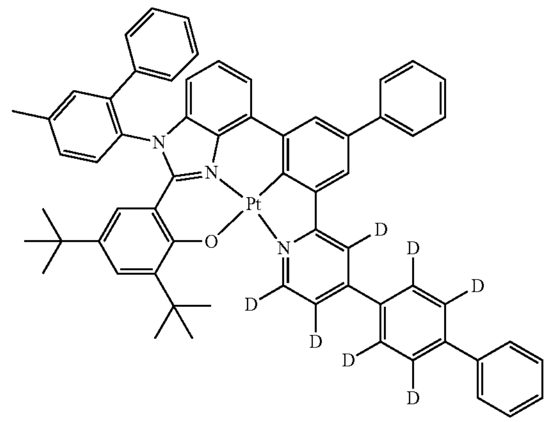
509
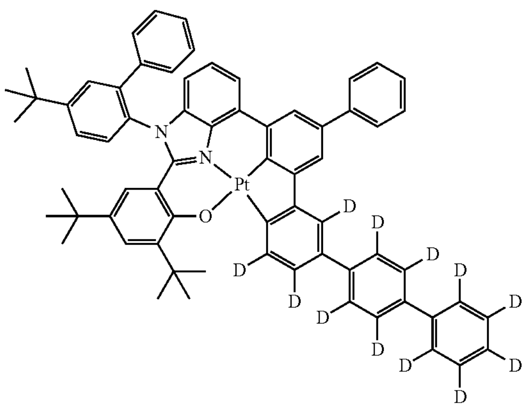
510
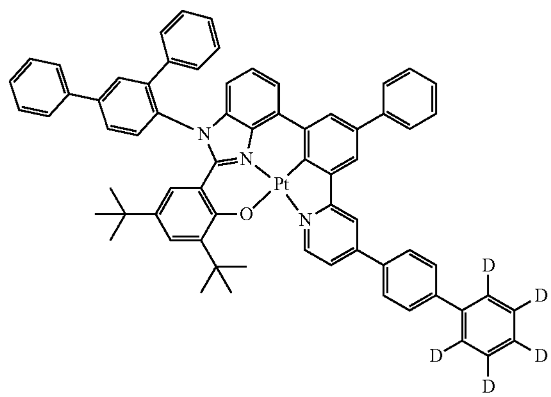
511
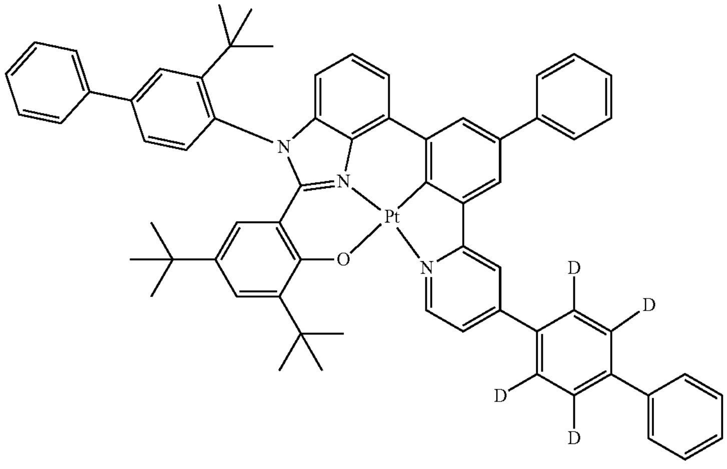

-continued
512
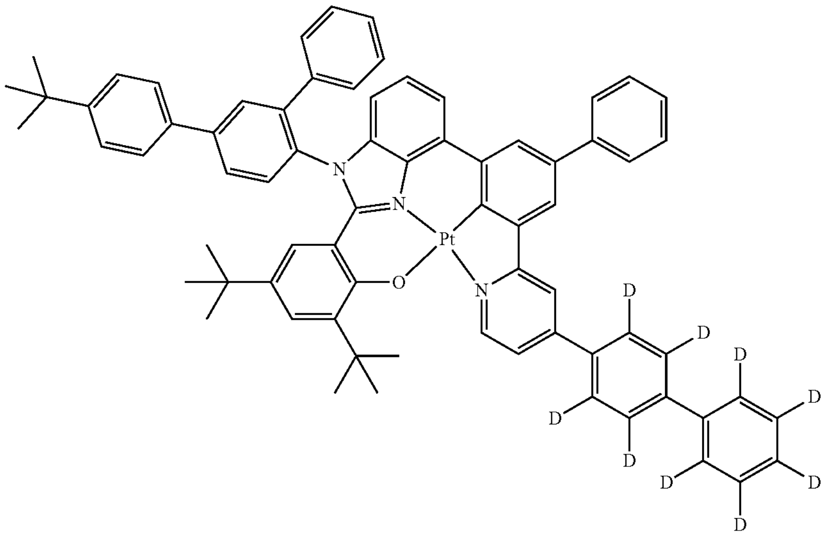
513
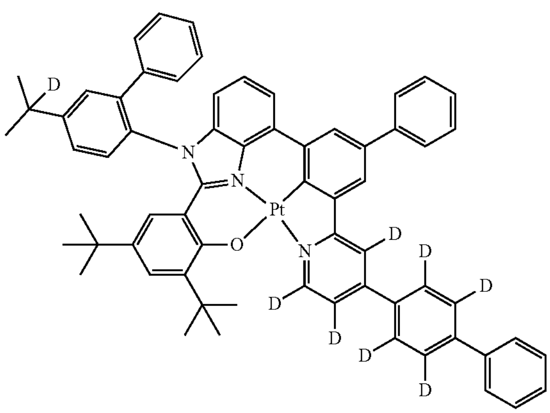
514
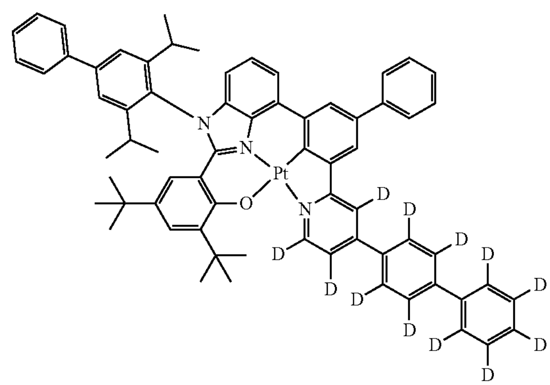
515
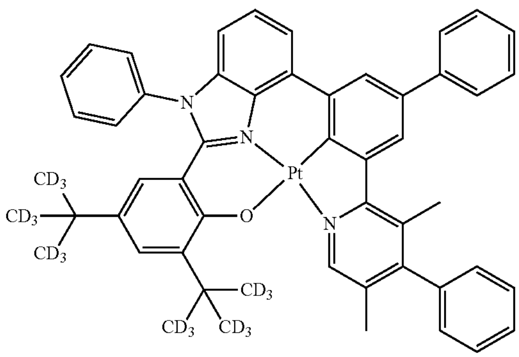
516
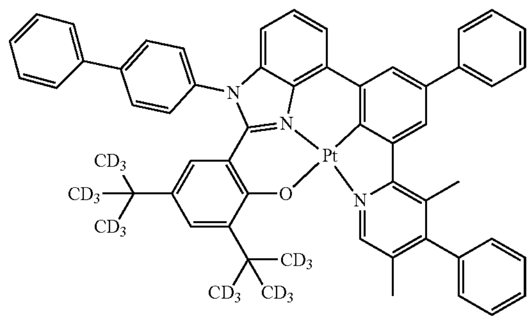

-continued
517
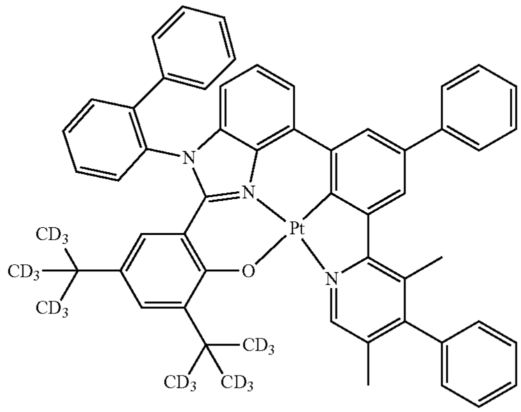
518
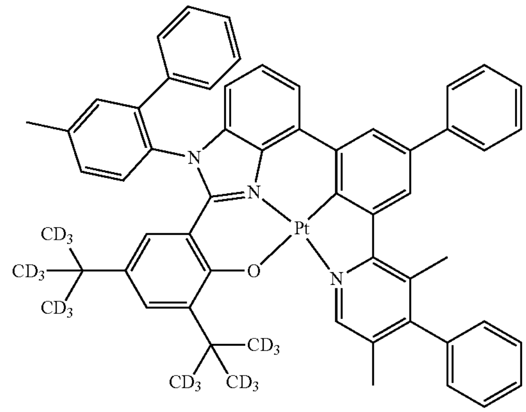
519
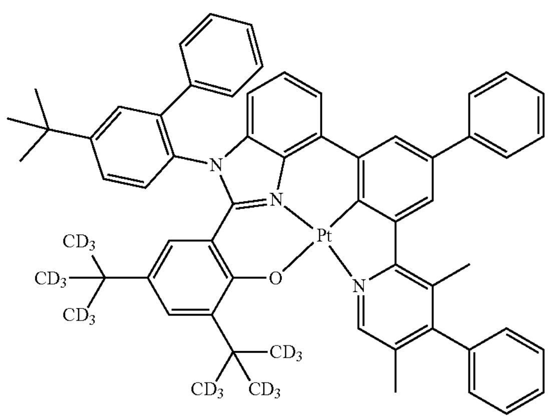
520
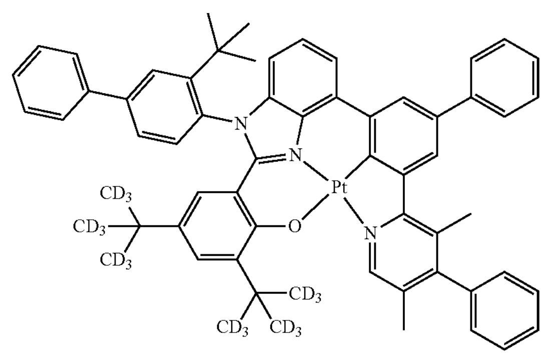
521
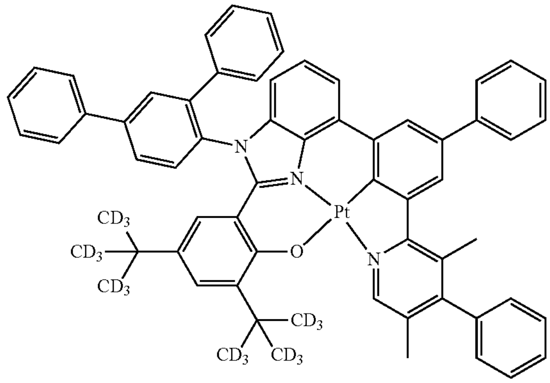
522
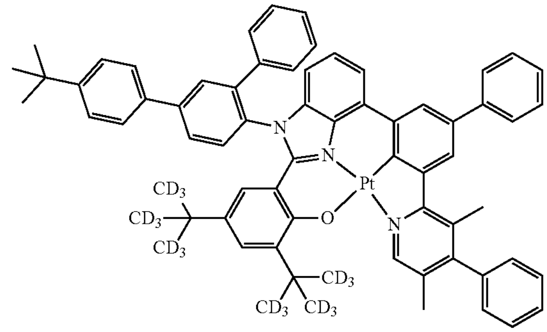

-continued
523
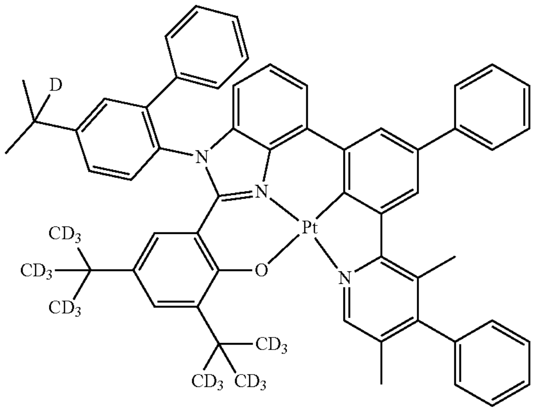
524
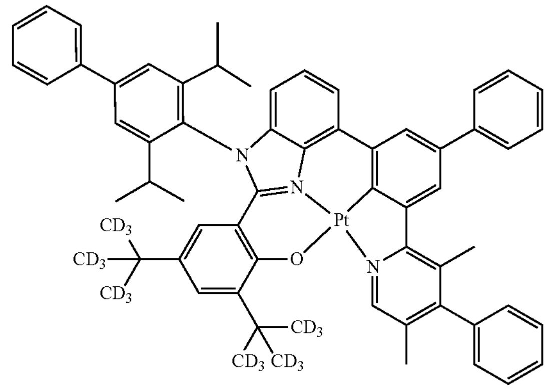
525
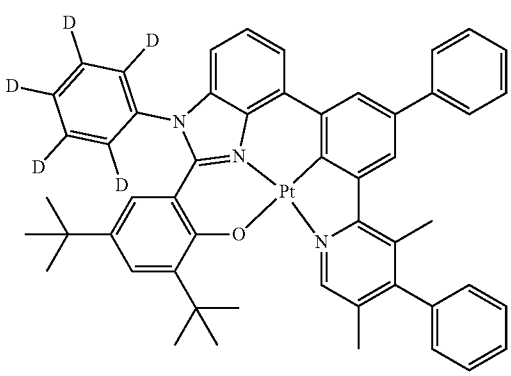
526
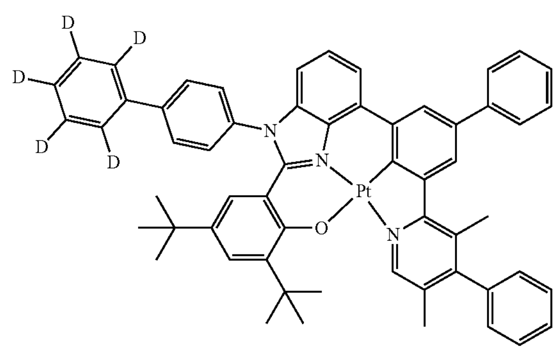
527
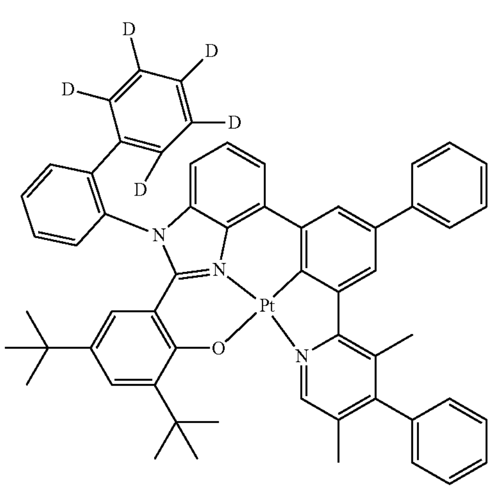
528
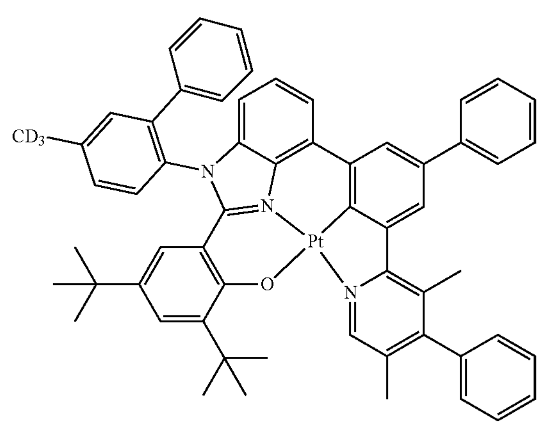

-continued
529
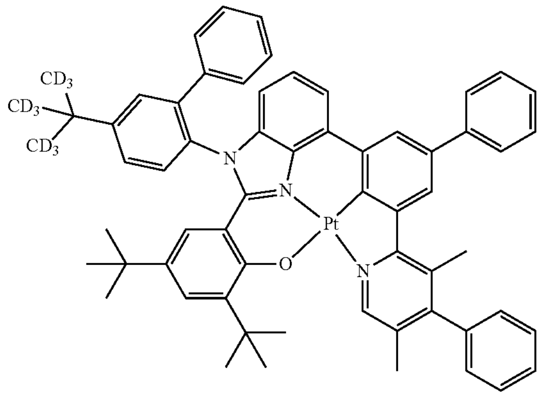
530
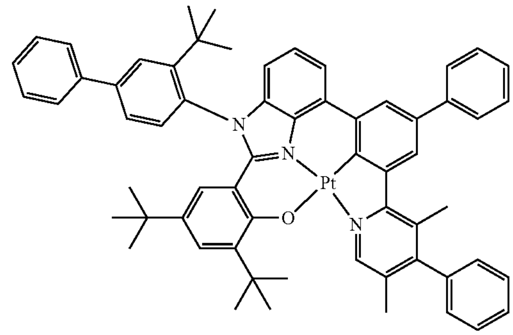
531
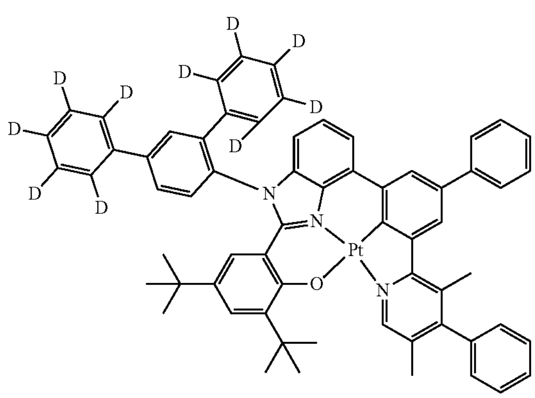
532
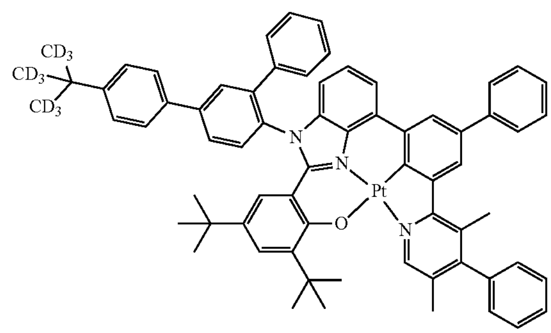
533
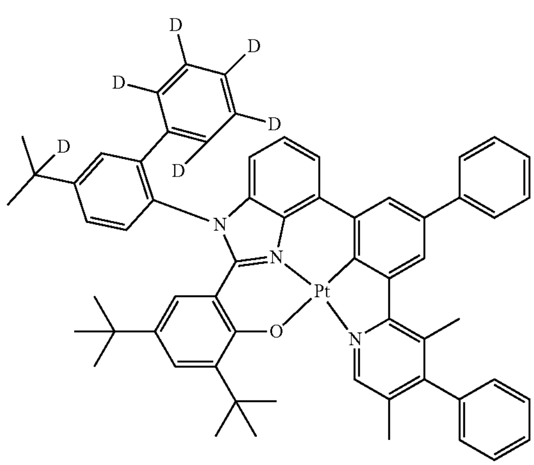
534
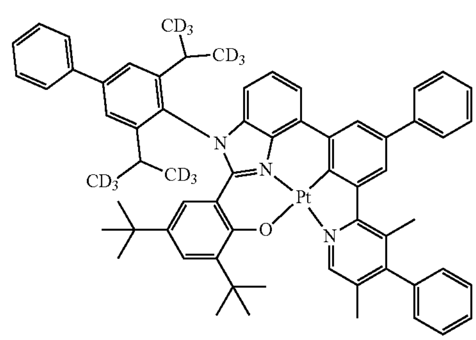

-continued
535
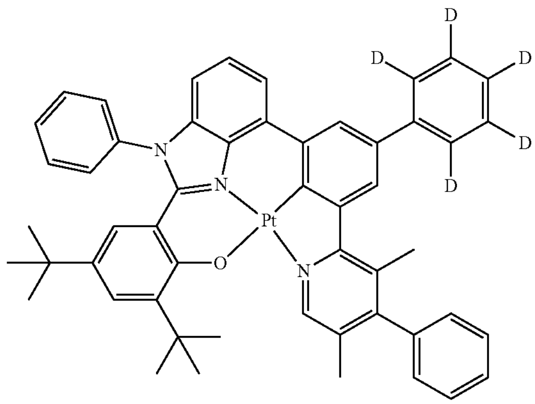
536
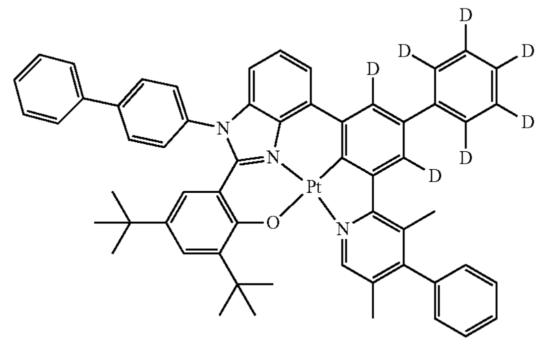
537
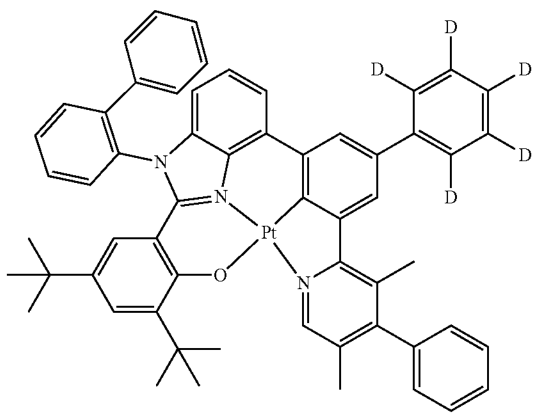
538
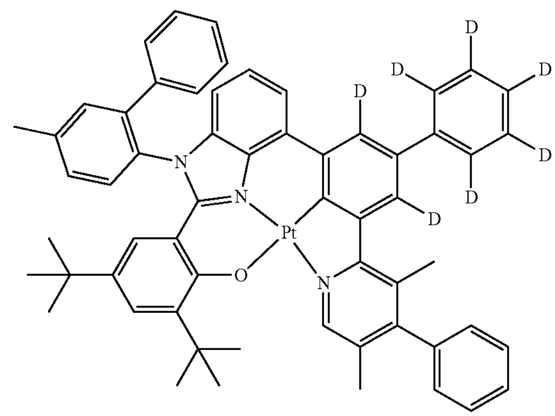
539
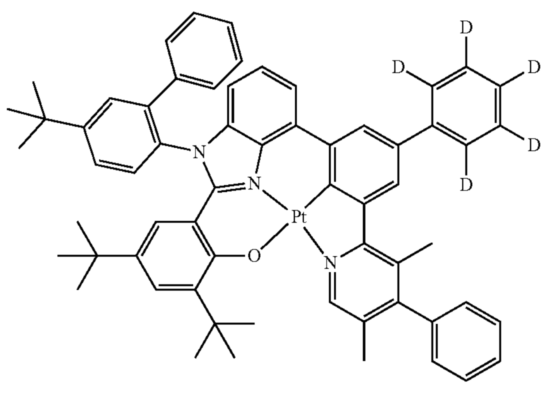
540
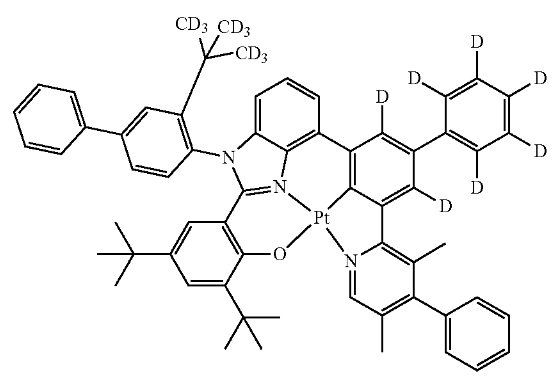
541
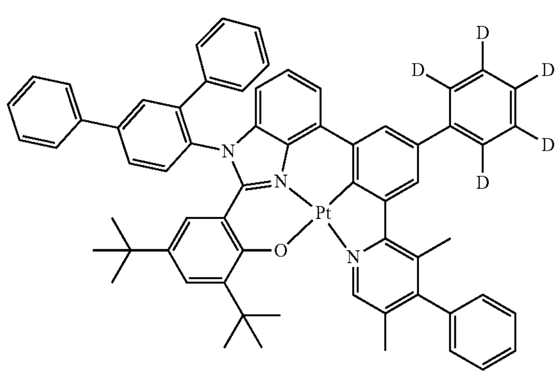
542
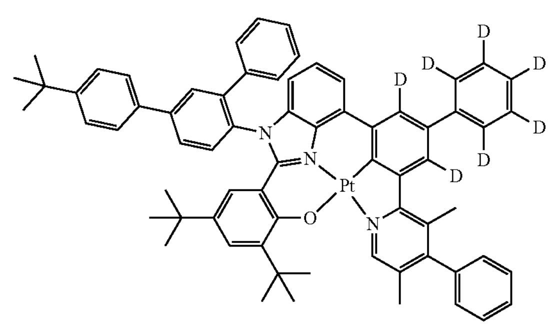

-continued
543
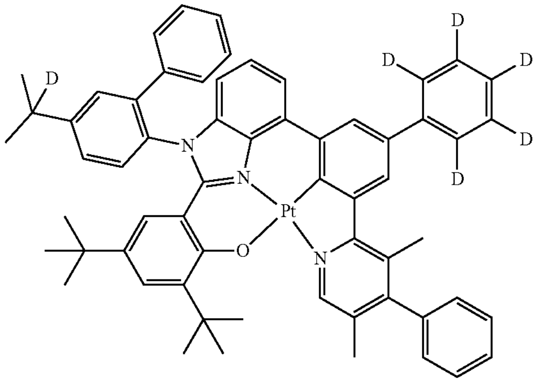
544
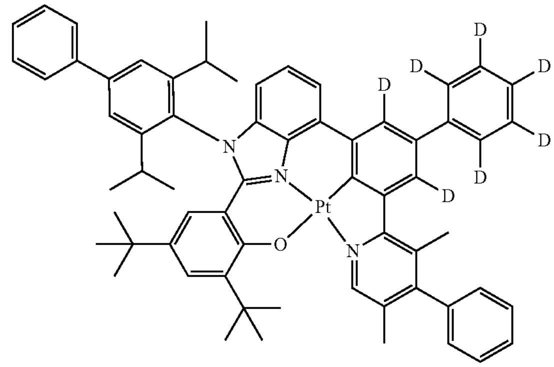
545
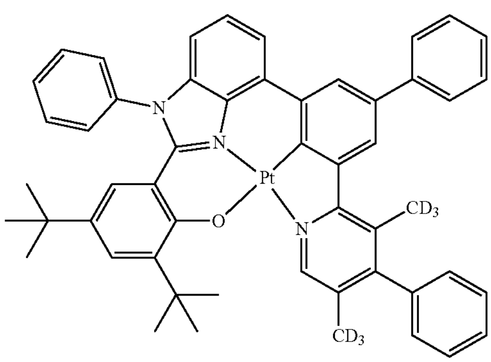
546
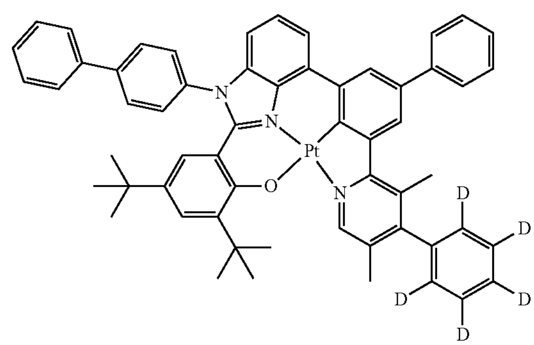
547
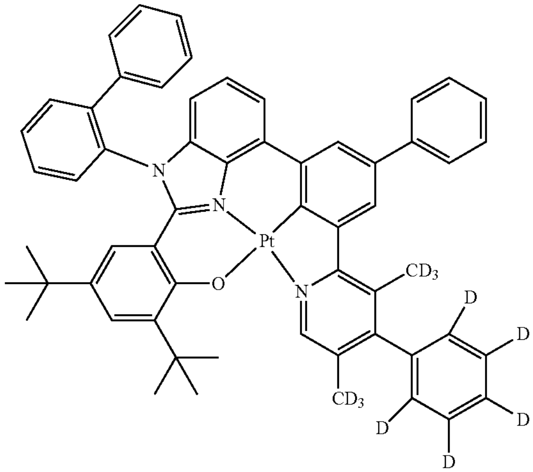
548
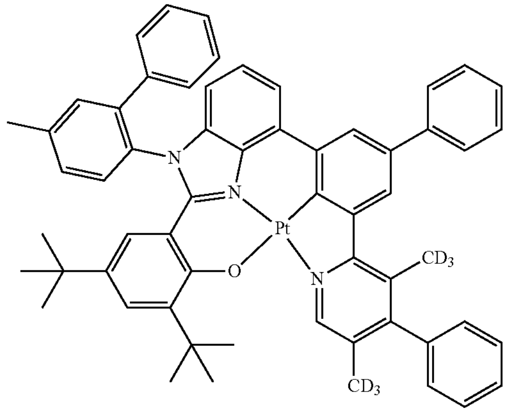

-continued
549
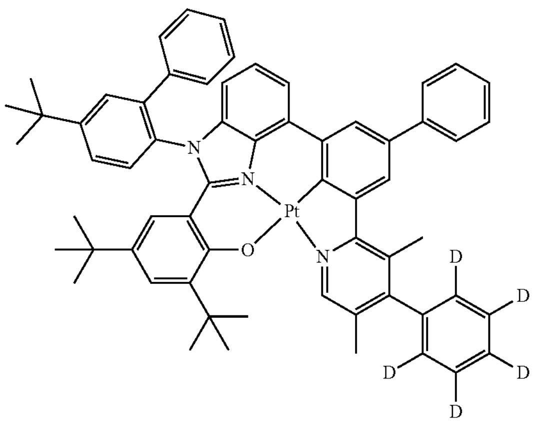
550
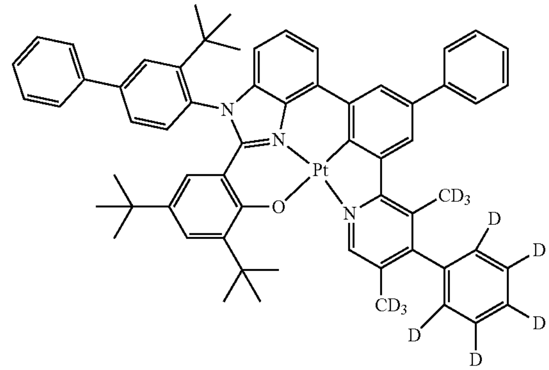
551
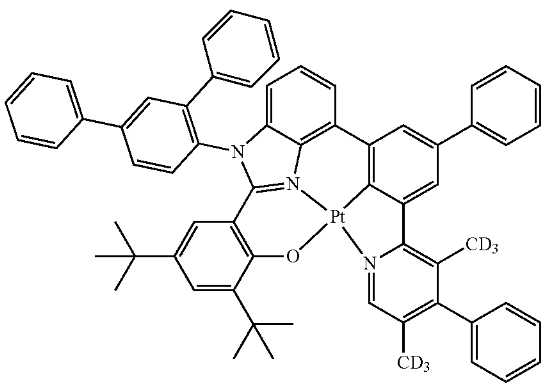
552
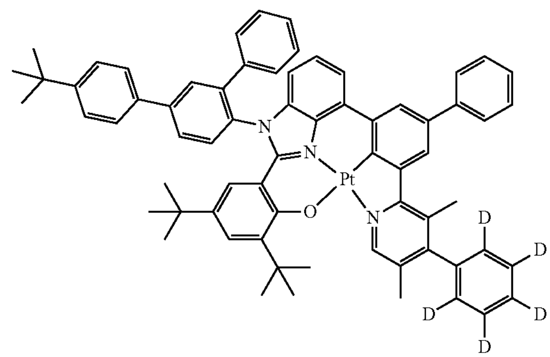
553
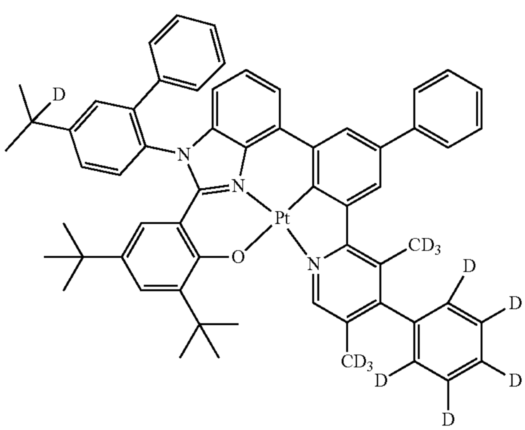
554
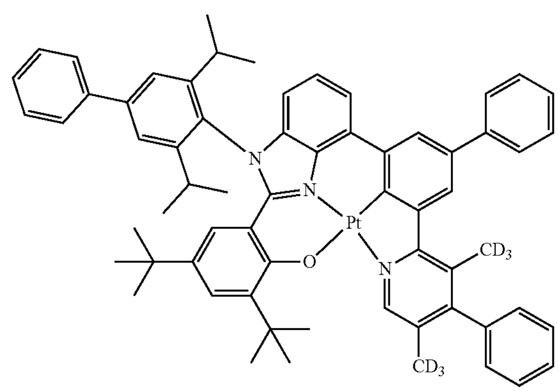
555
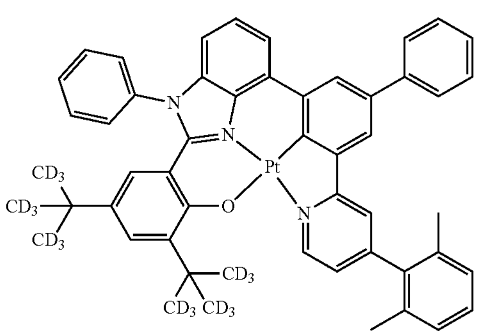
556
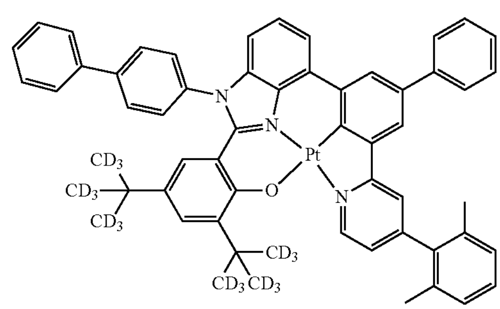

-continued
557
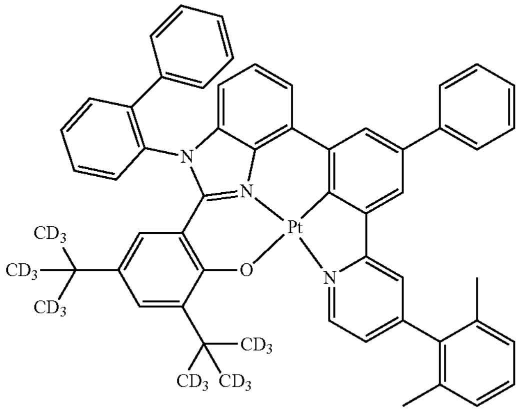
558
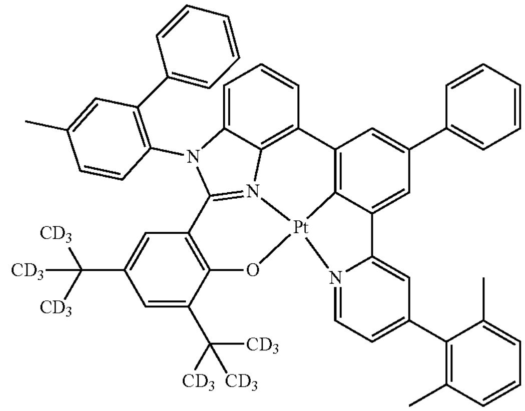
559
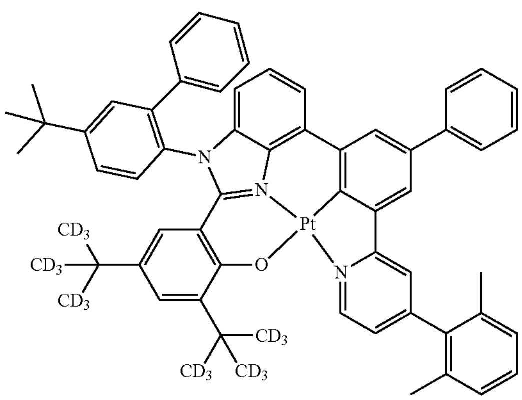
560
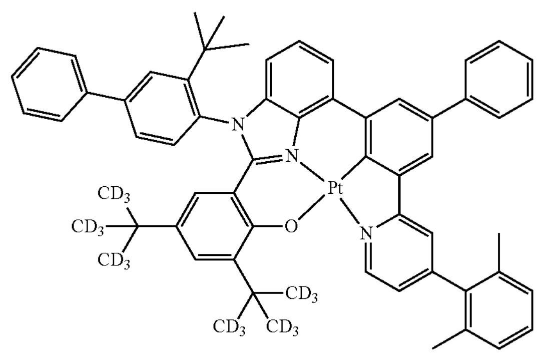
561
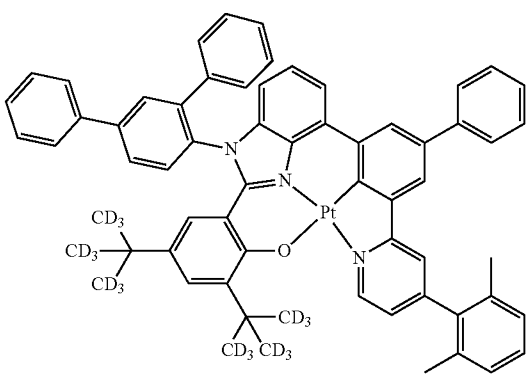
562
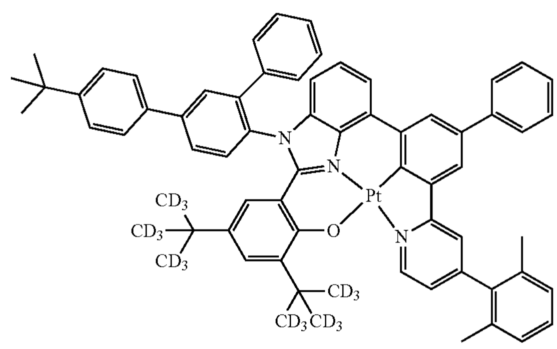
563
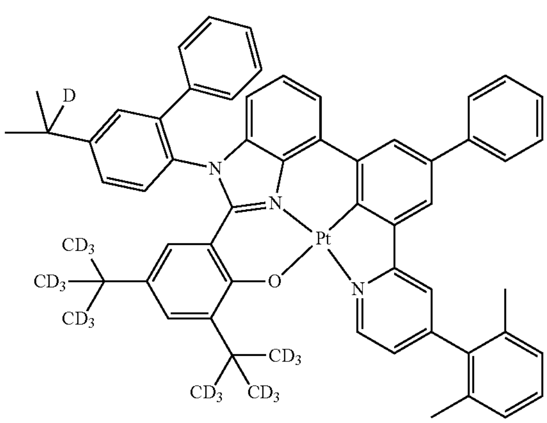
564
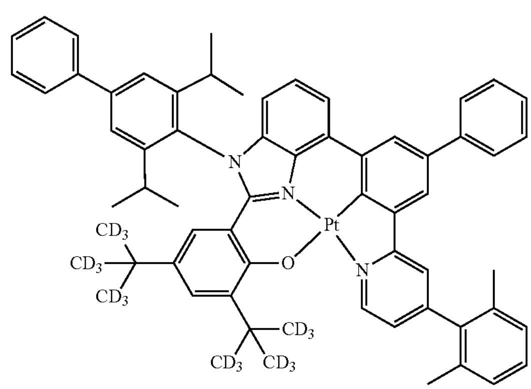

-continued
565
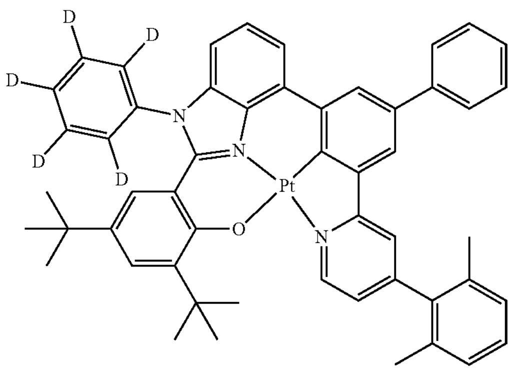
566
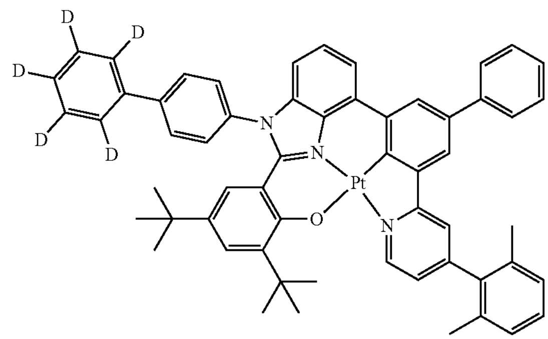
567
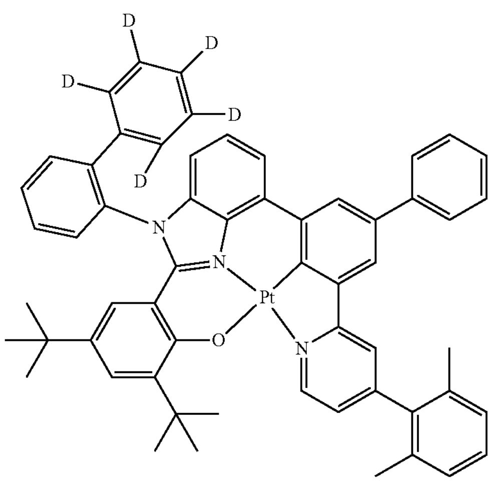
568
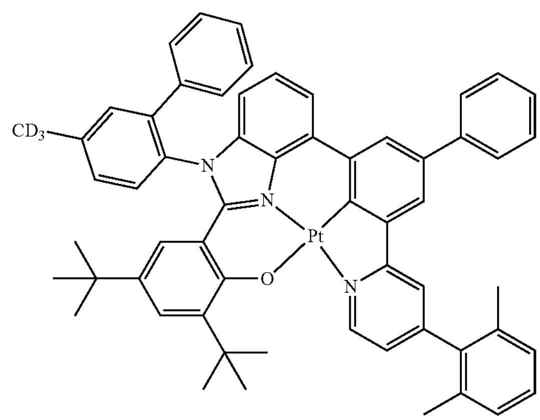
569
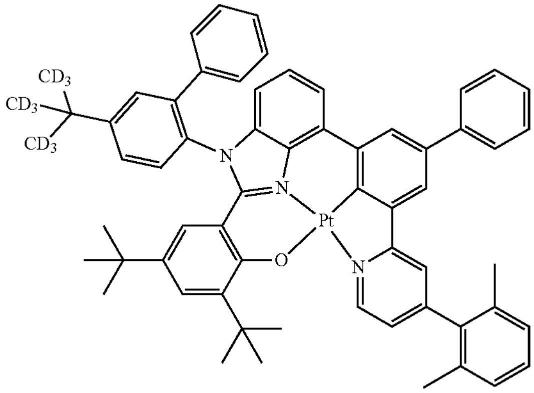
570
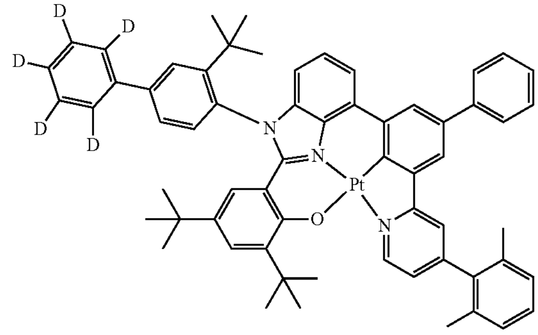

-continued
571
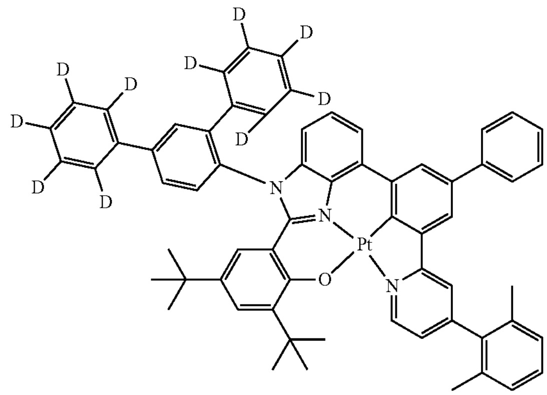
572
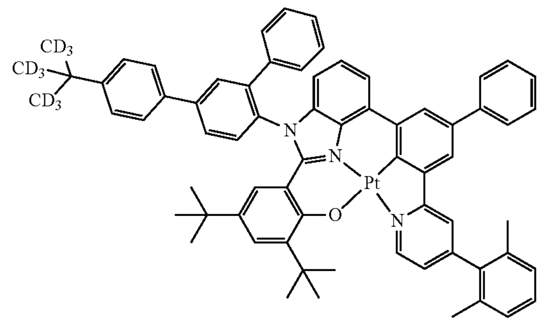
573
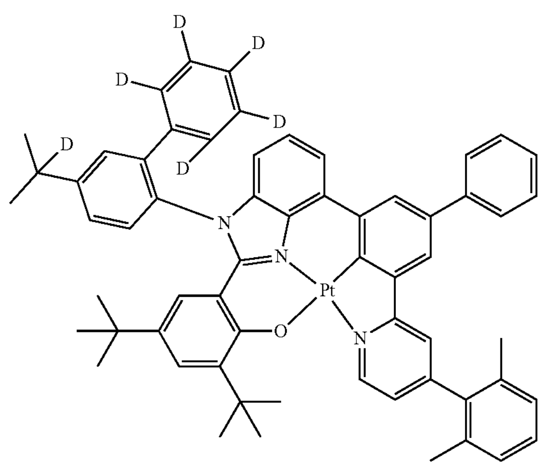
574
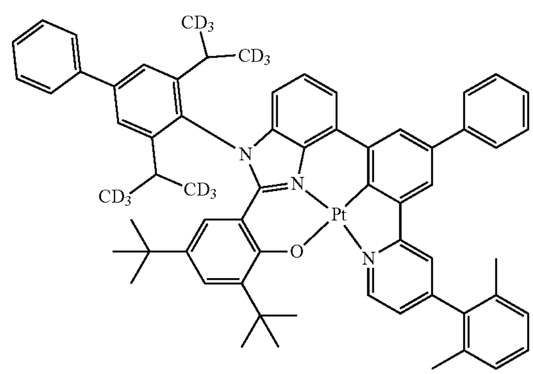
575
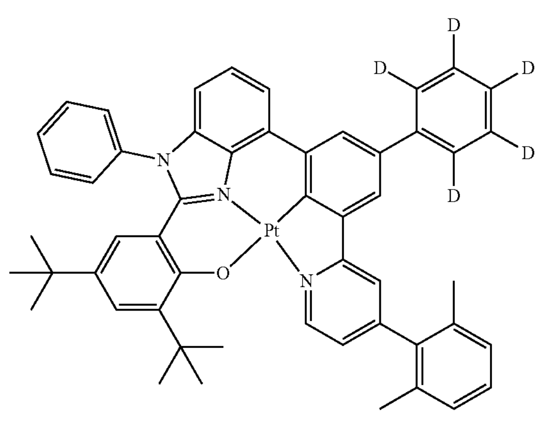
576
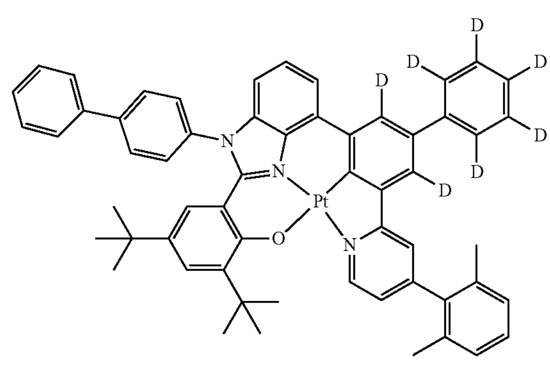

-continued
577
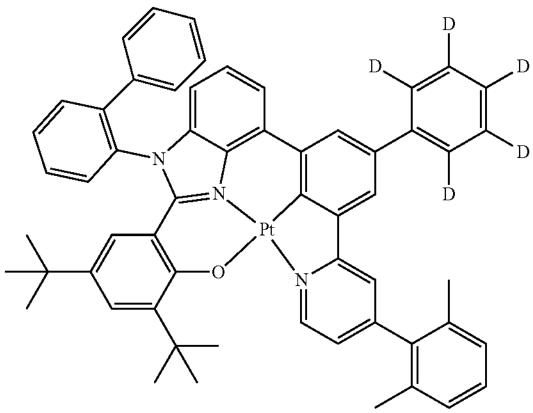
578
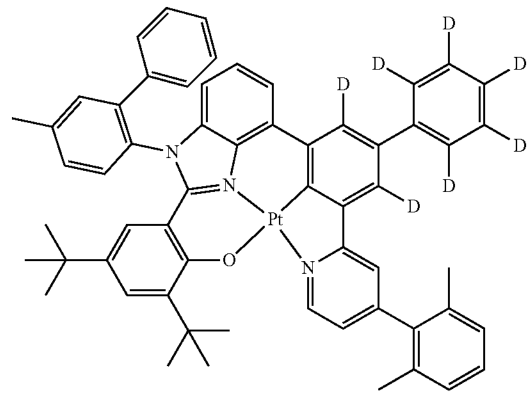
579
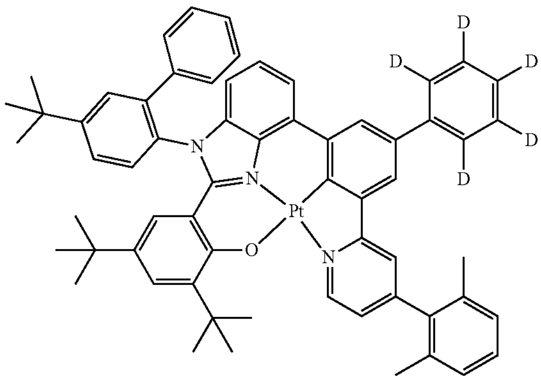
580
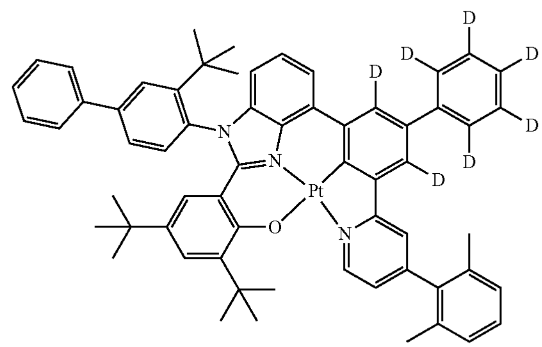
581
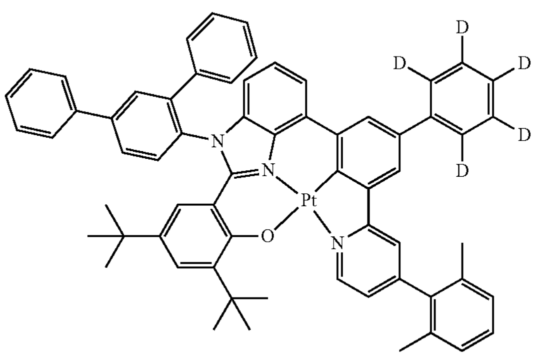
582
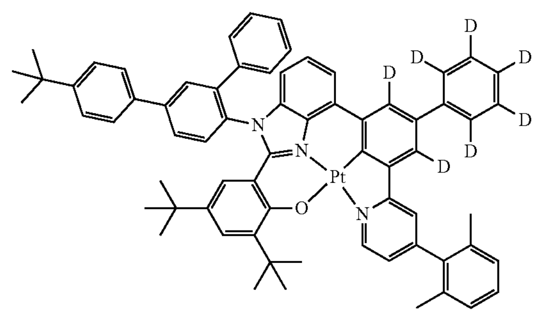
583
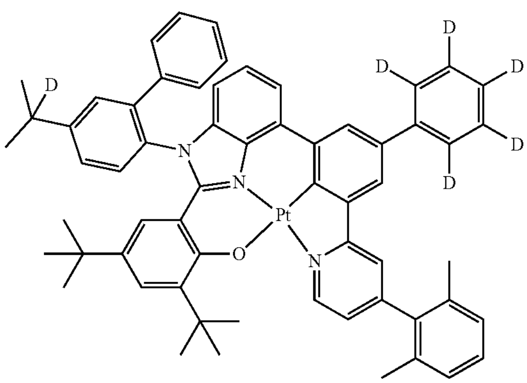
584
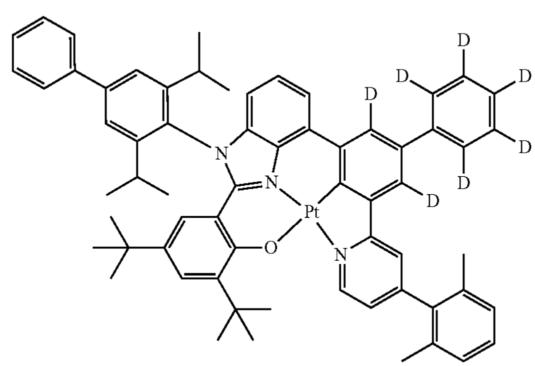

-continued
585
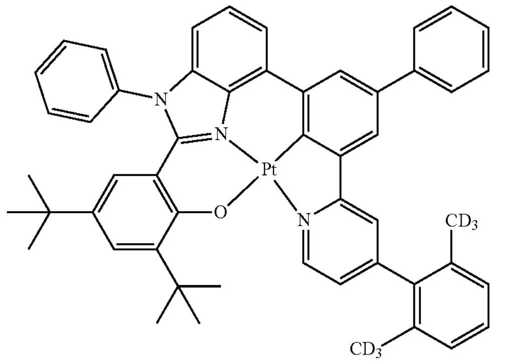
586
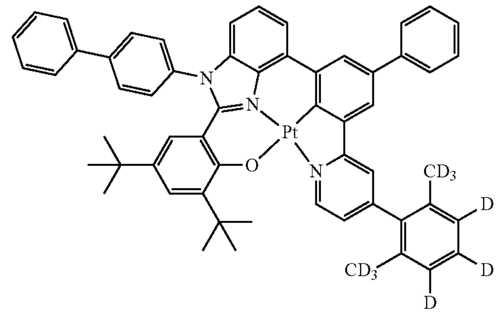
587
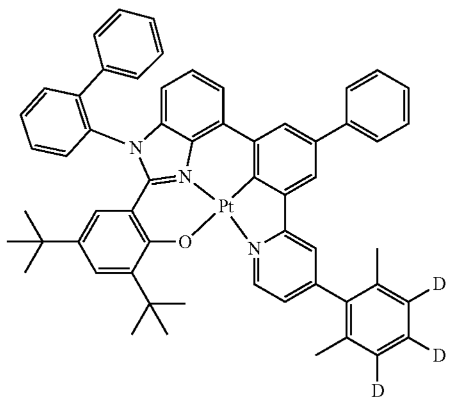
588
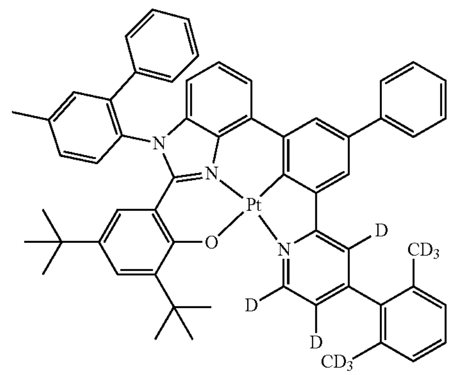
589
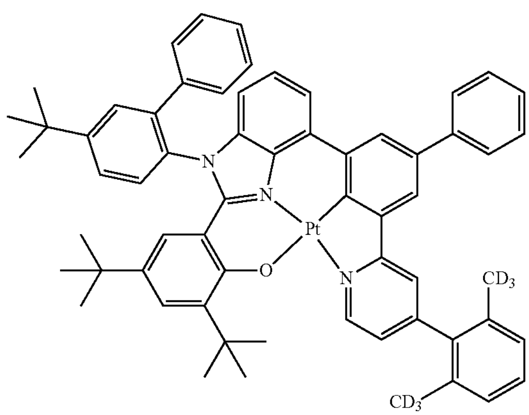
590
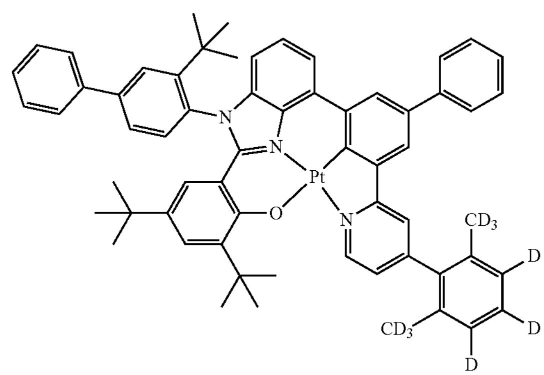
591
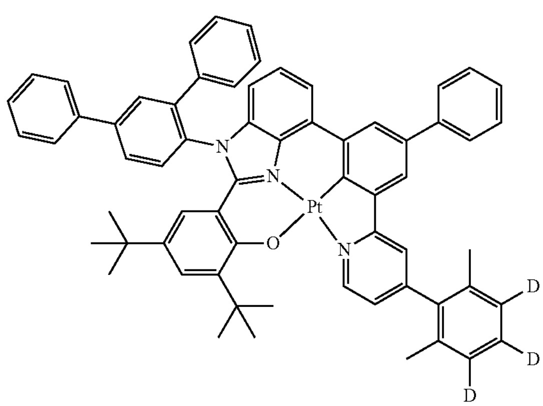
592
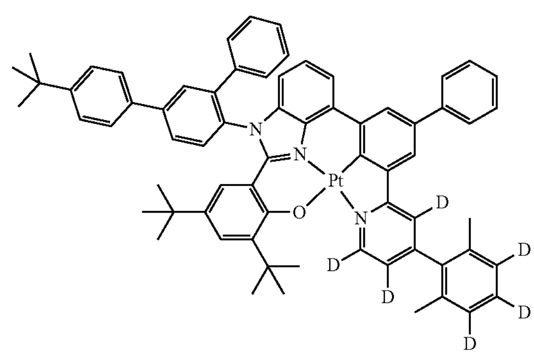

-continued
593
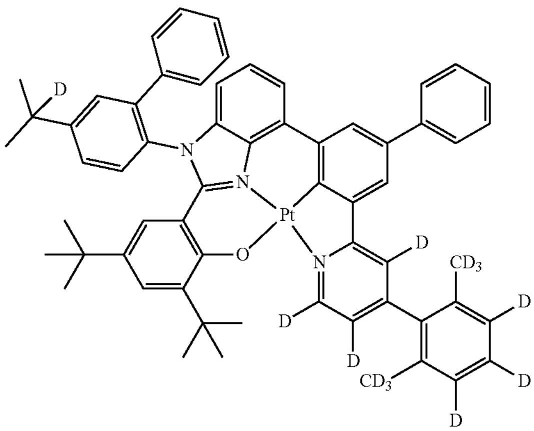
594
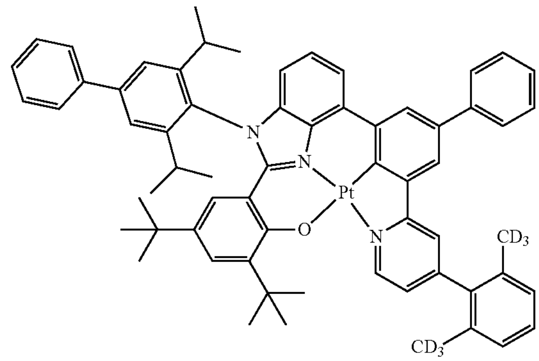
595
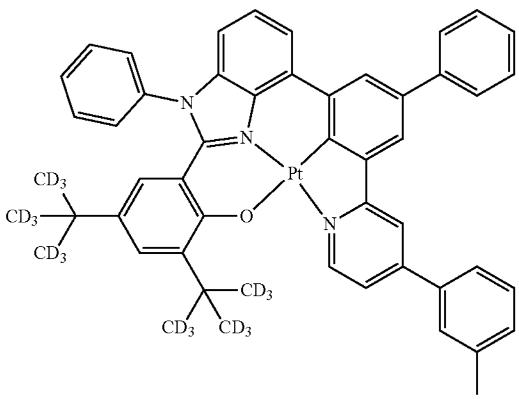
596
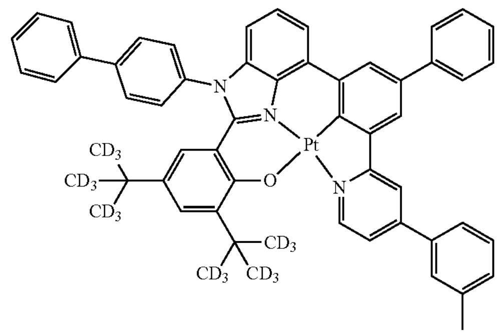
597
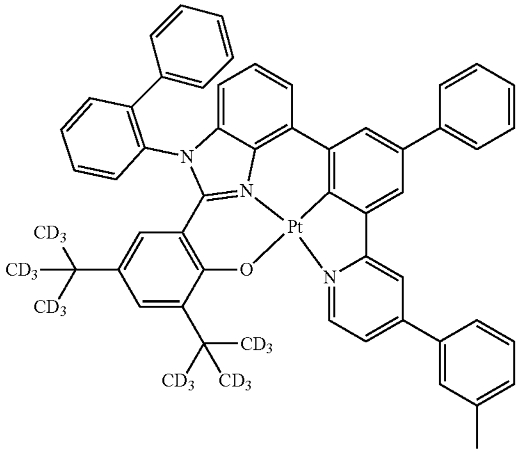
598
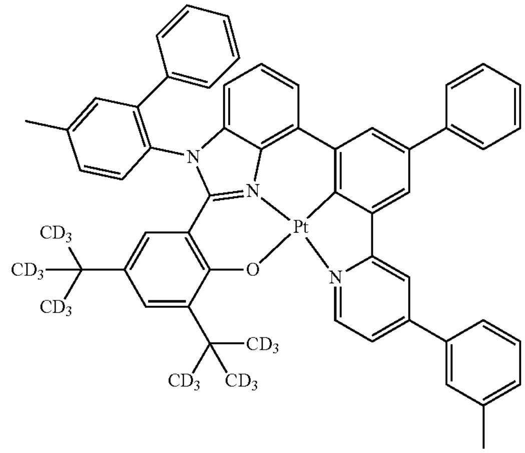

-continued
599
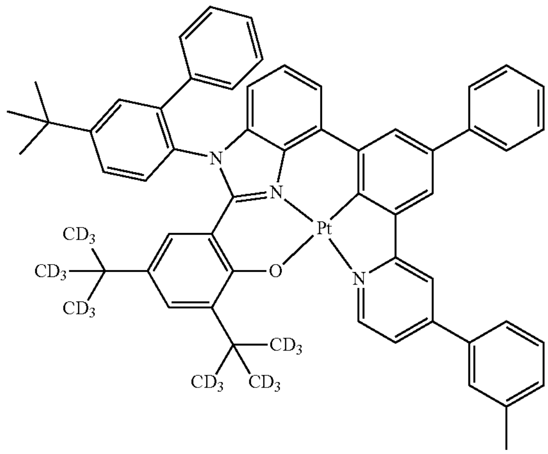
600
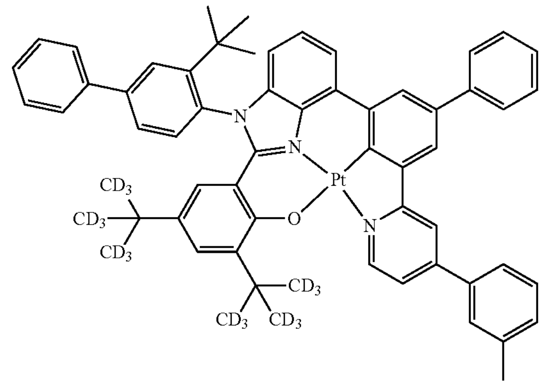
601
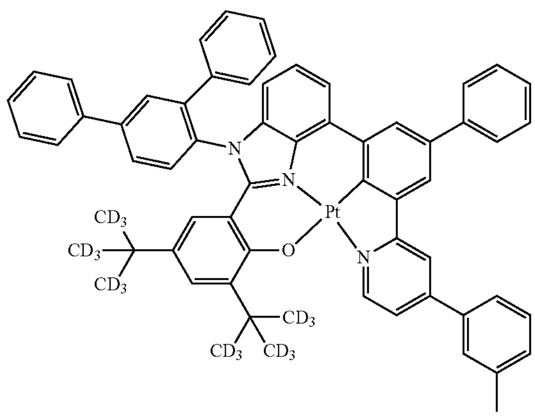
602
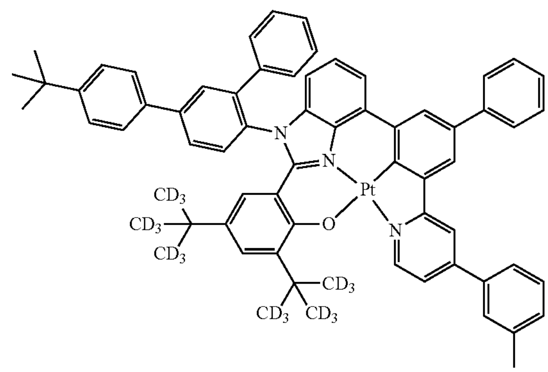
603
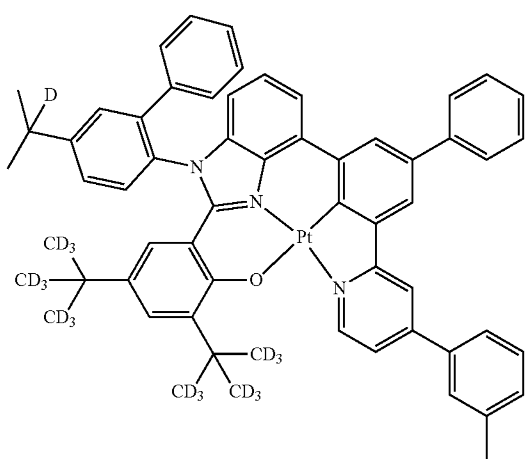
604
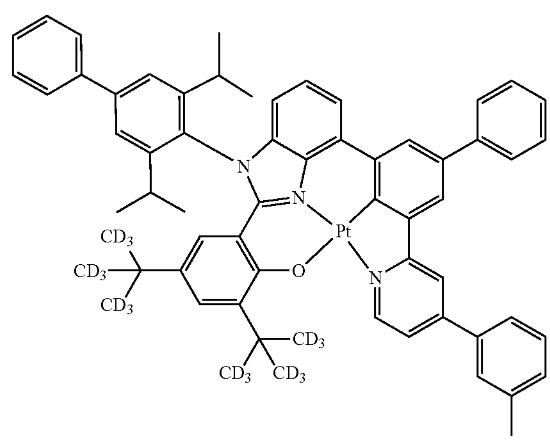

-continued
605
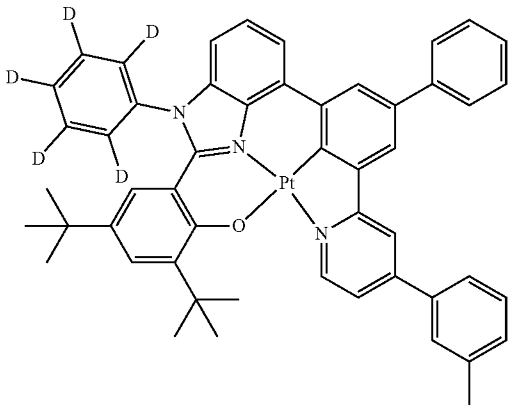
606
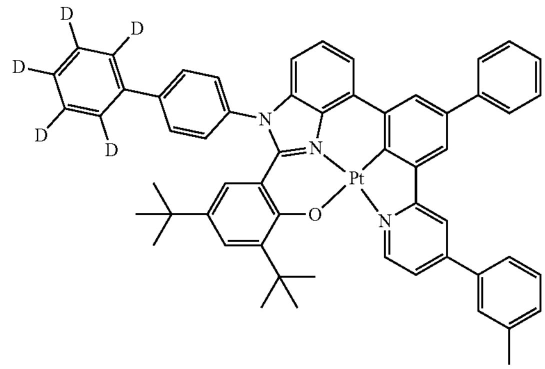
607
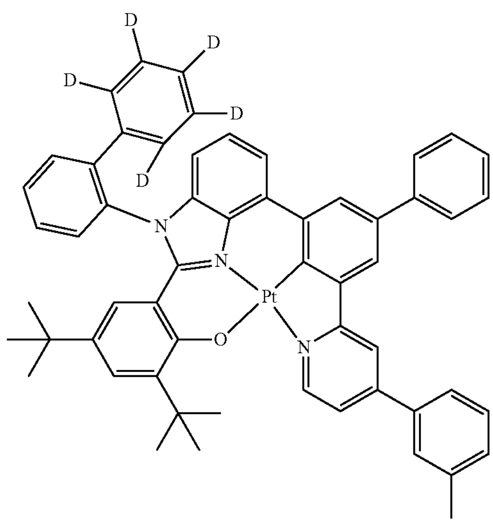
608
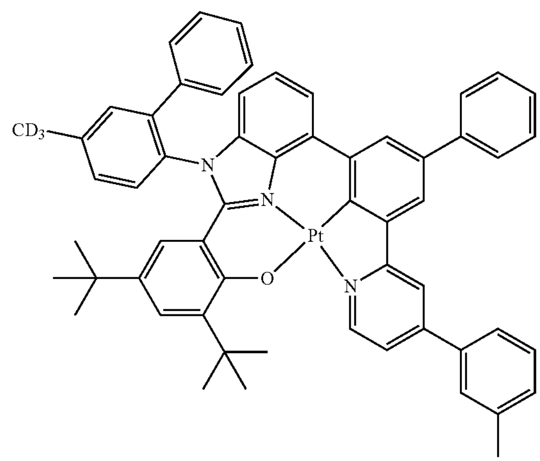
609
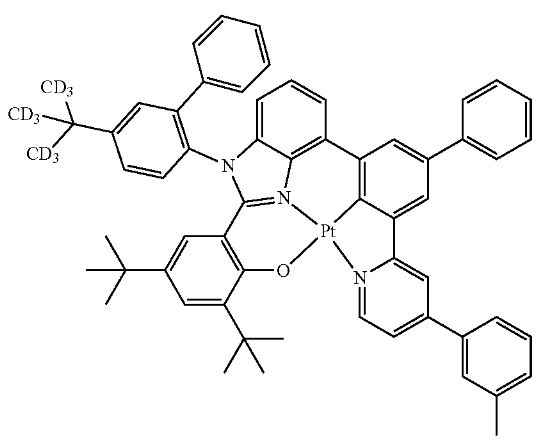
610
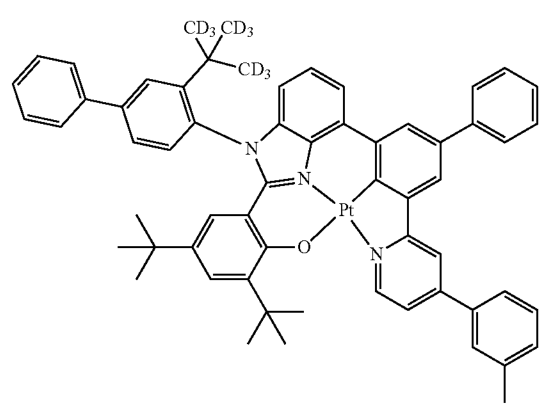

-continued
611
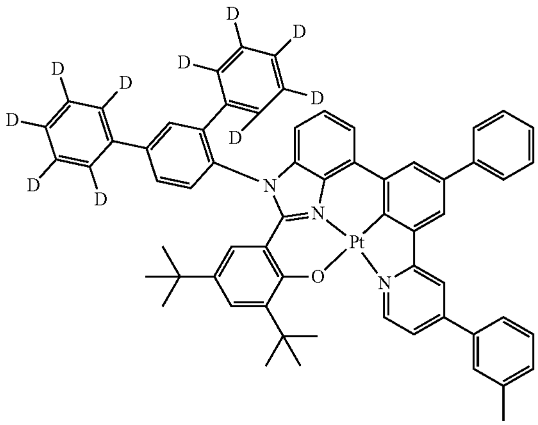
612
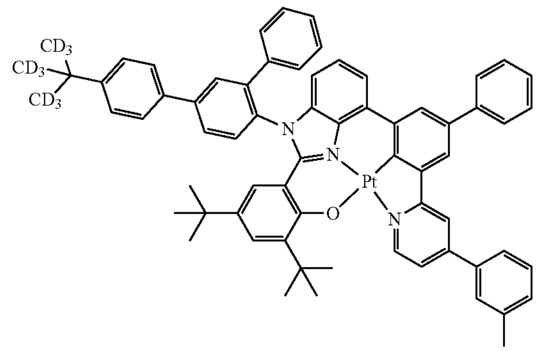
613
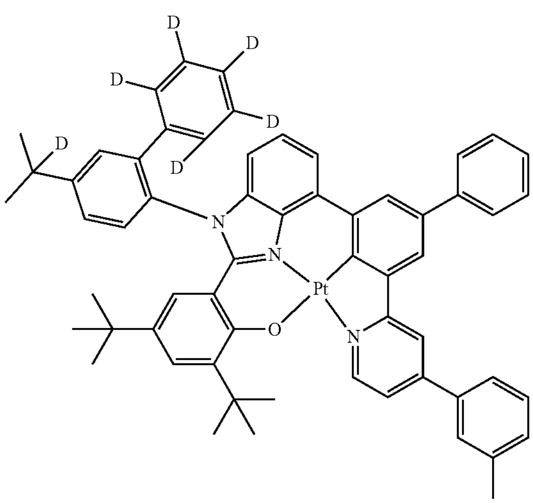
614
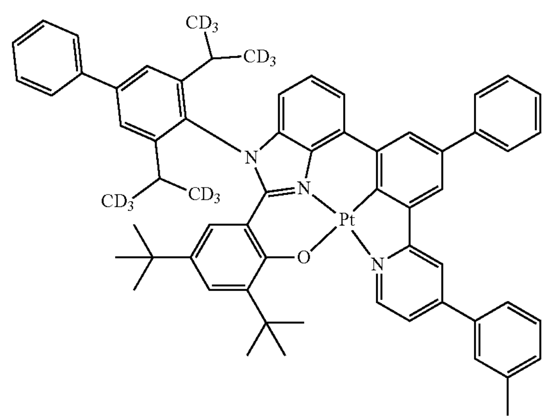
615
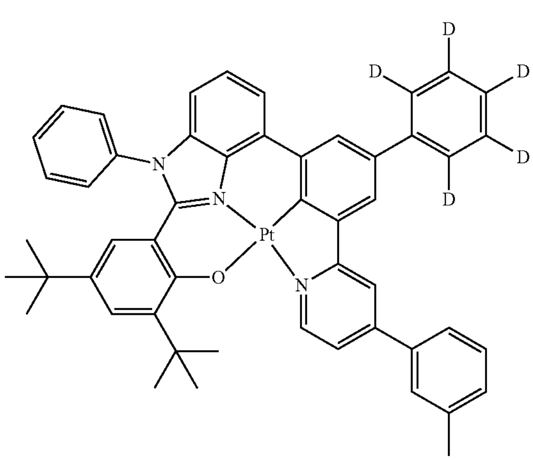
616
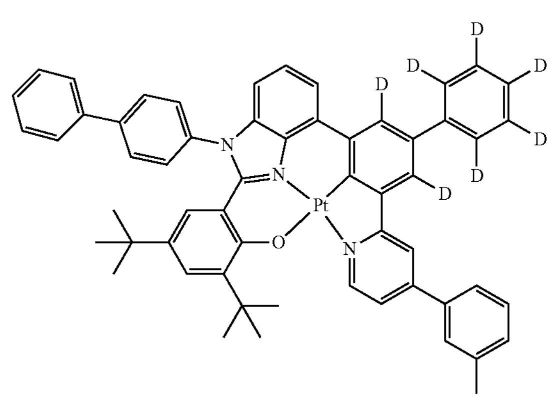

-continued
617
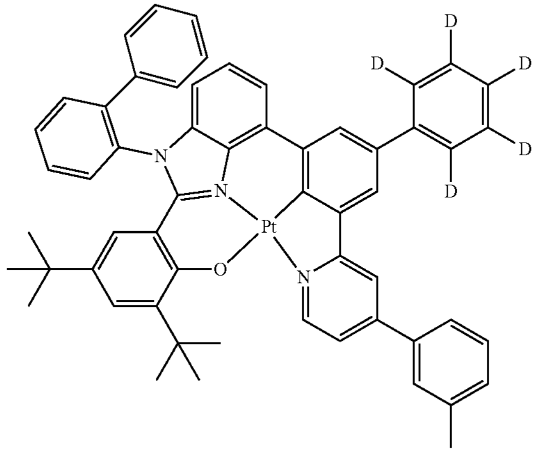
618
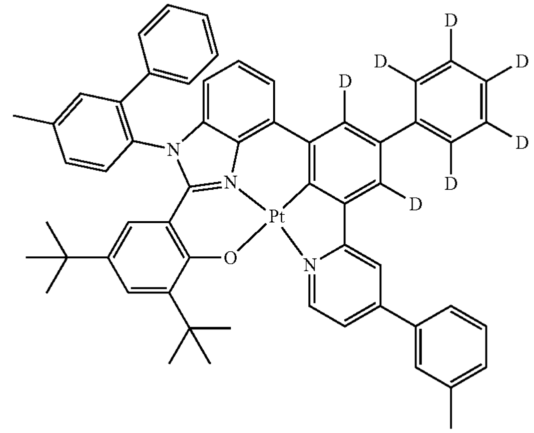
619
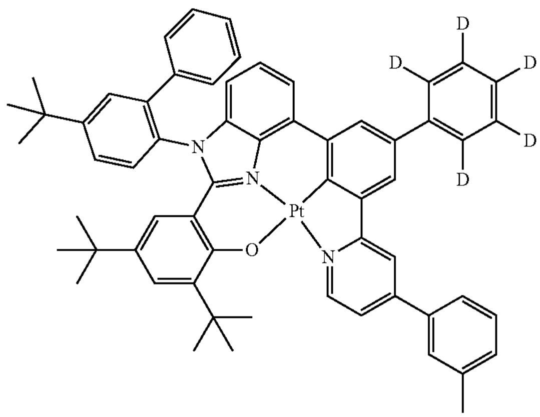
620
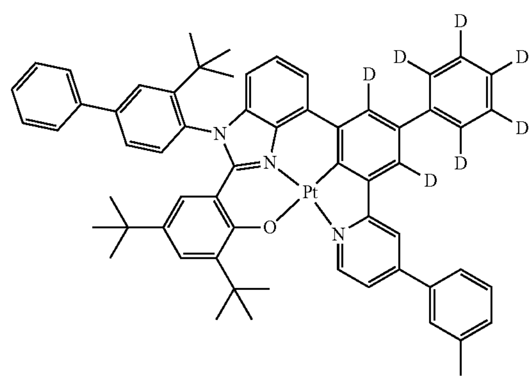
621
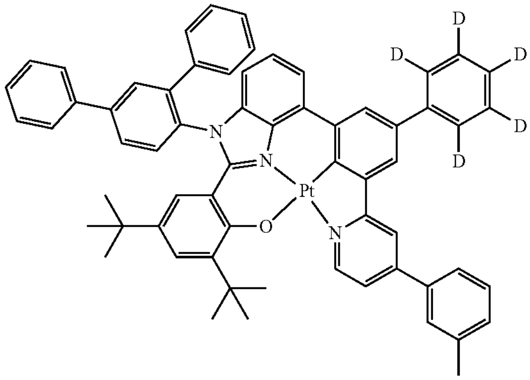
622
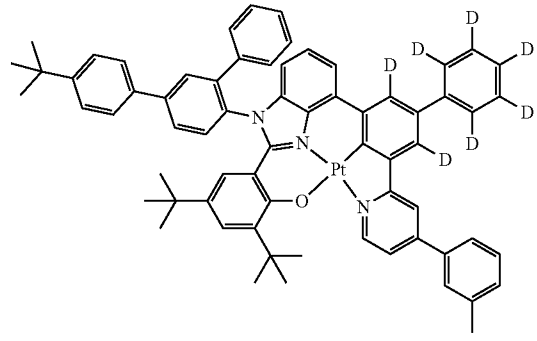

-continued
623
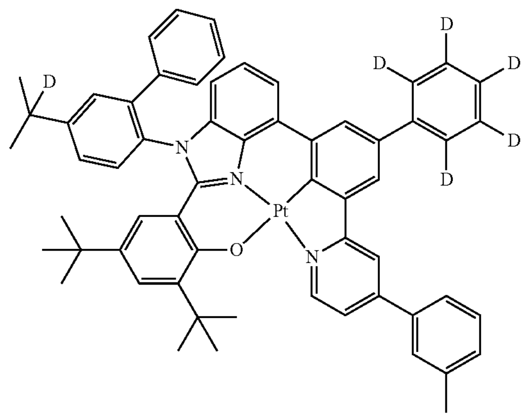
624
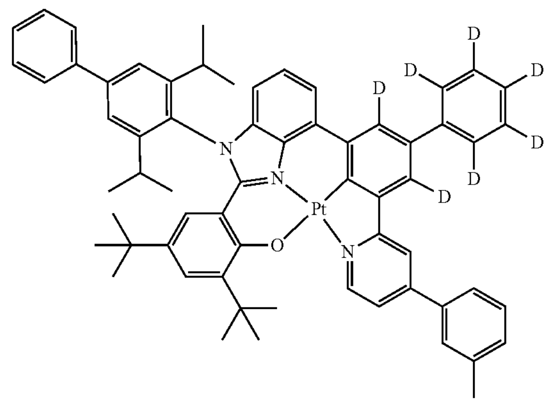
625
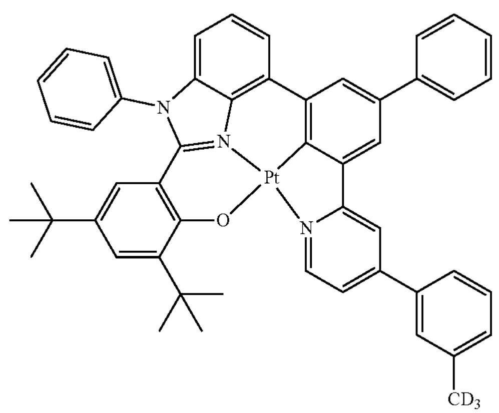
626
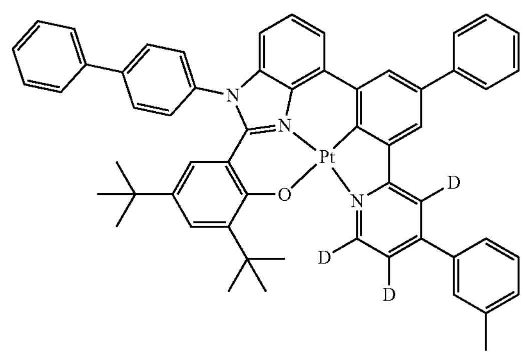
627
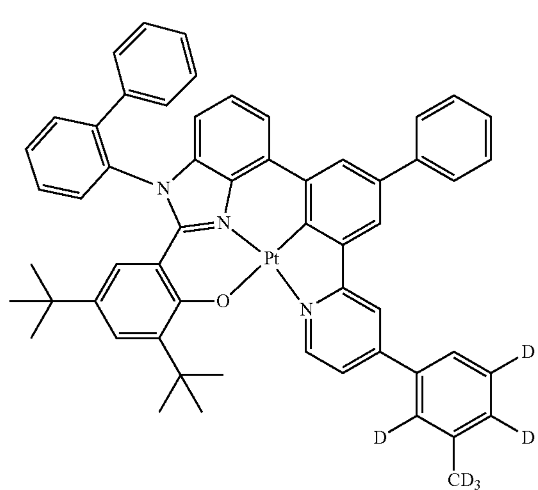
628
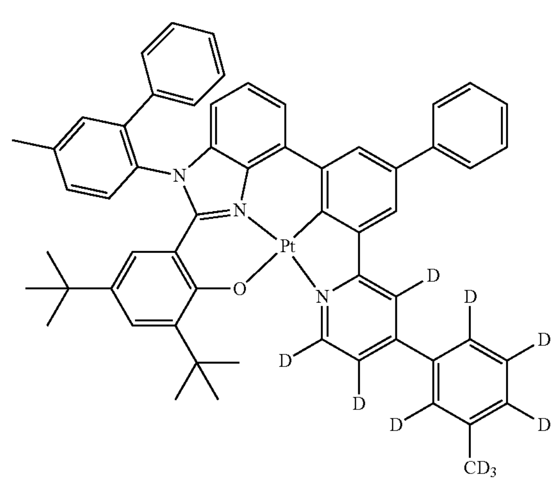

-continued
629
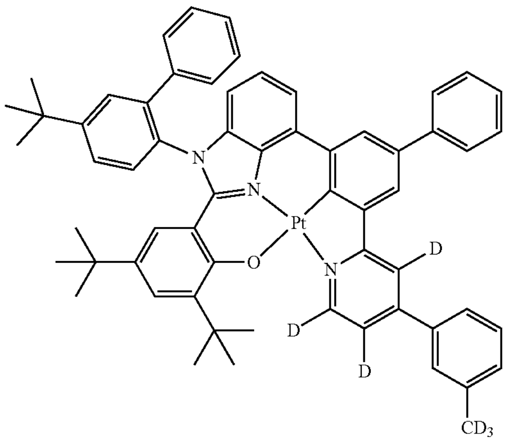
630
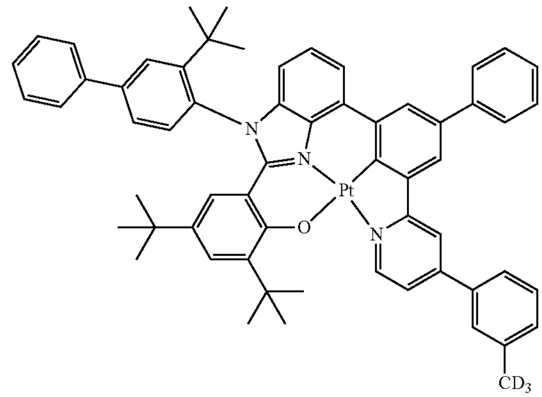
631
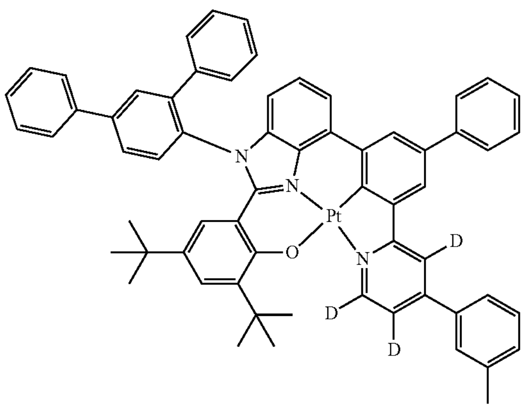
632
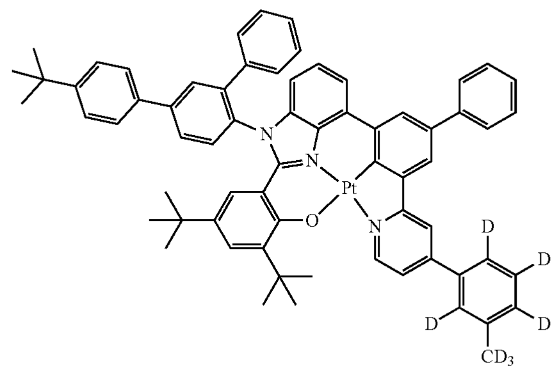
633
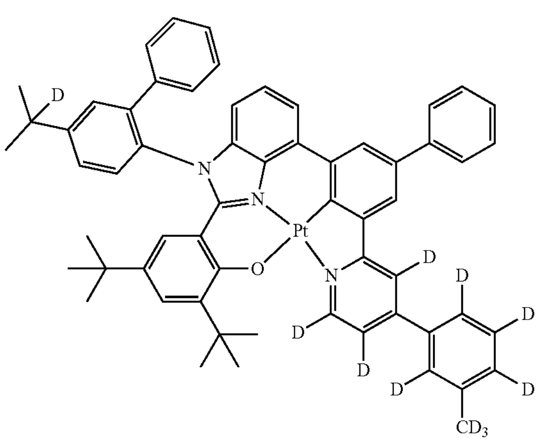
634
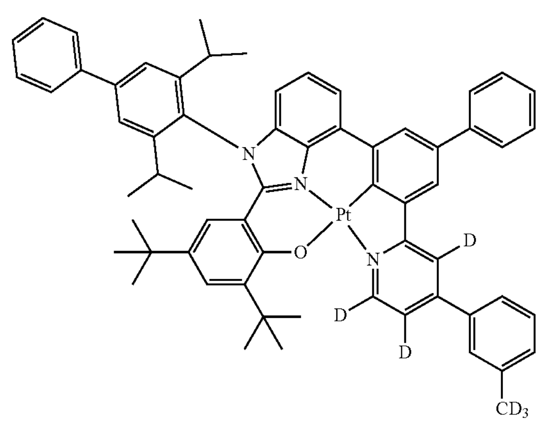

-continued
635
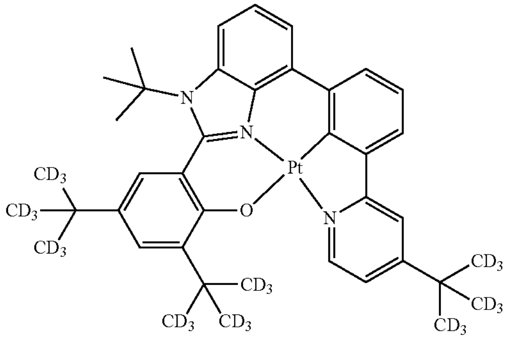
636
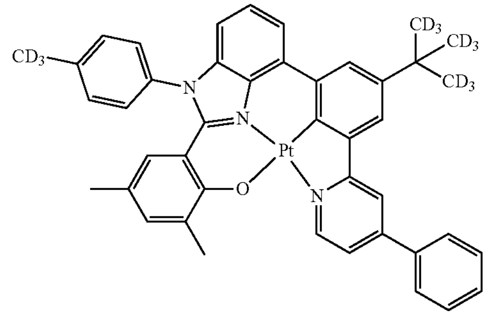
637
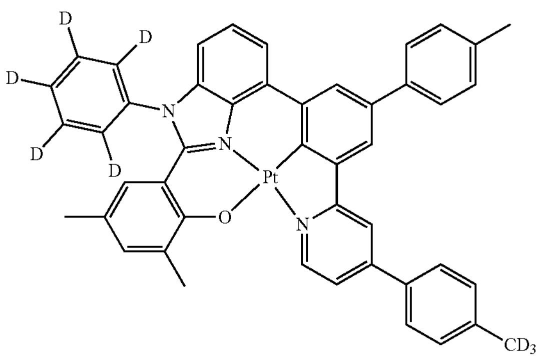
638
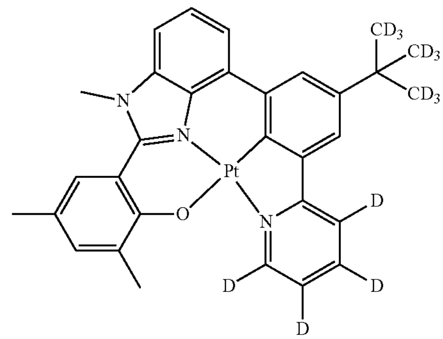
639
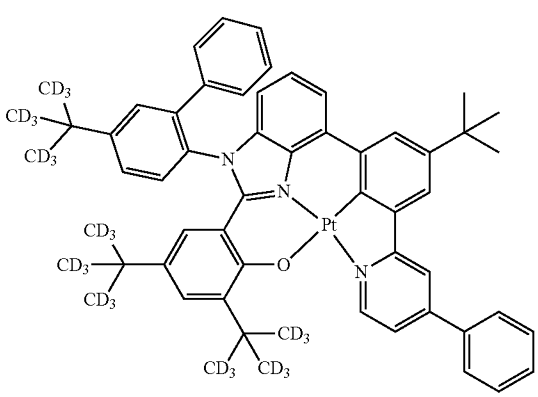
640
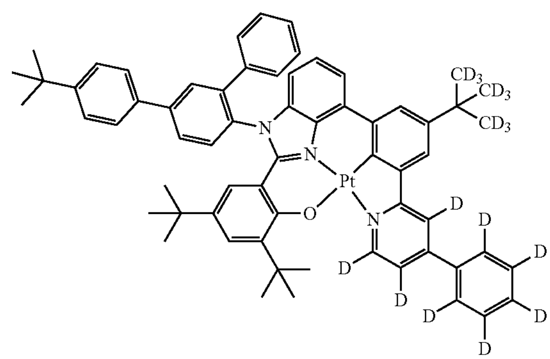
641
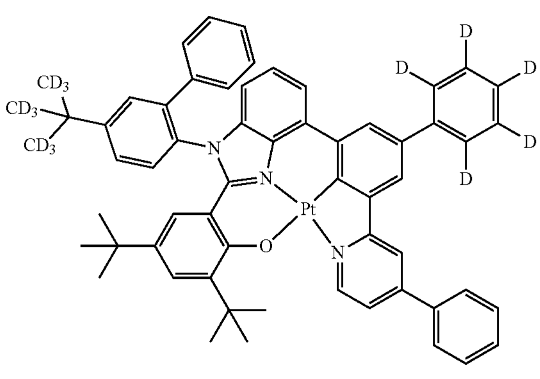
642
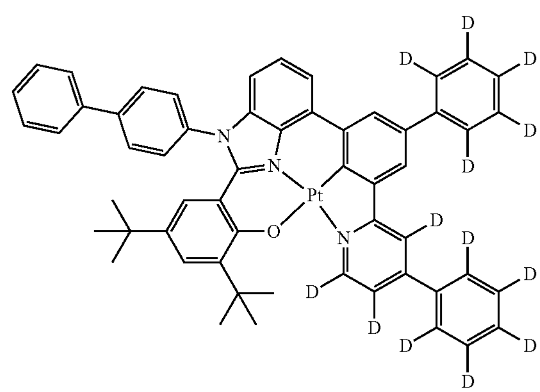

-continued
643
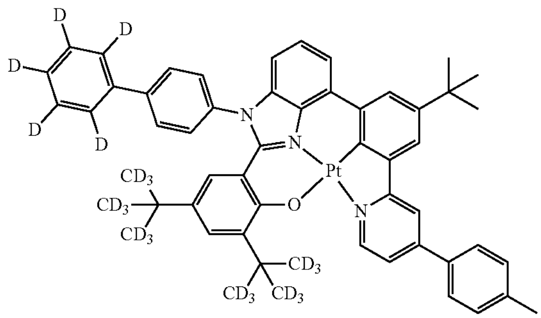
644
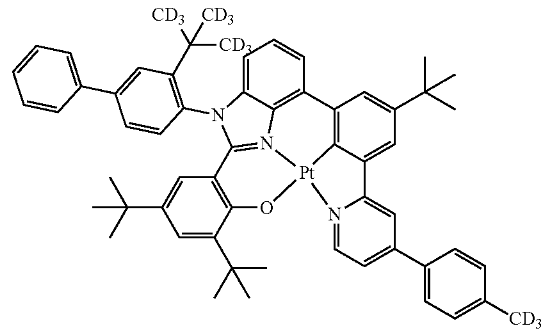
645
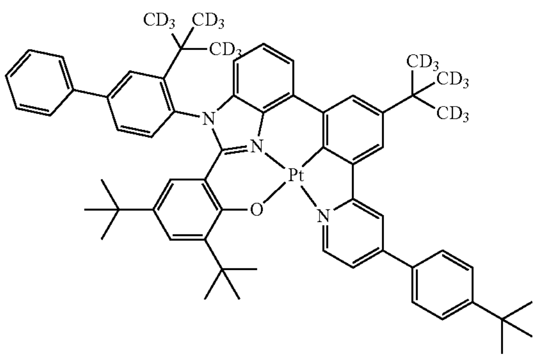
646
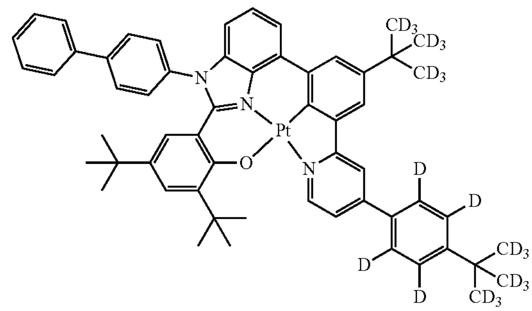
647
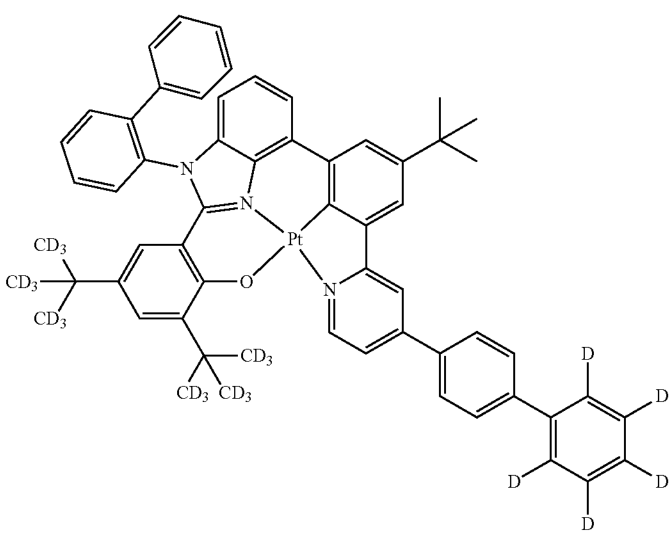

-continued
648
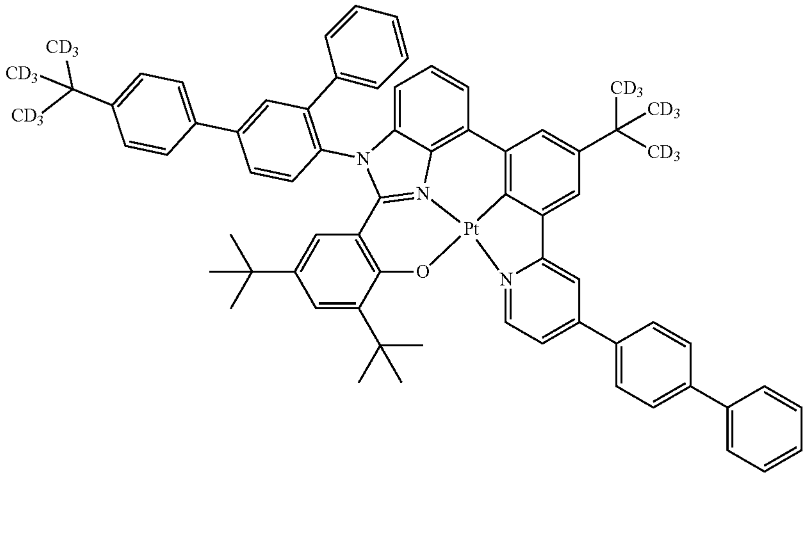
649
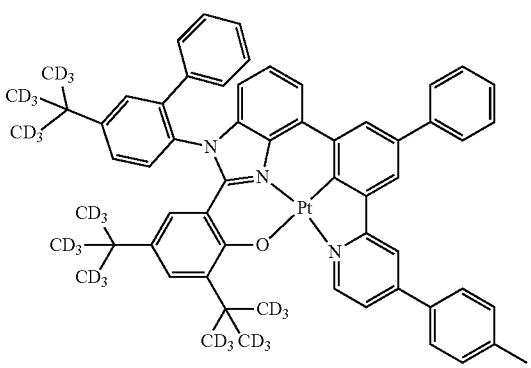
650
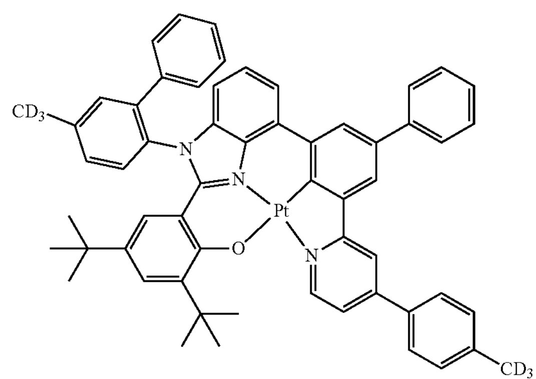
651
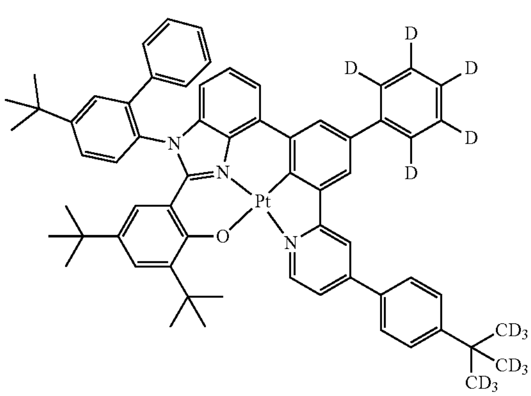
652
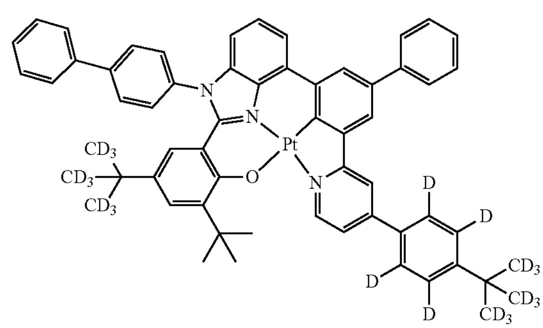

-continued
653
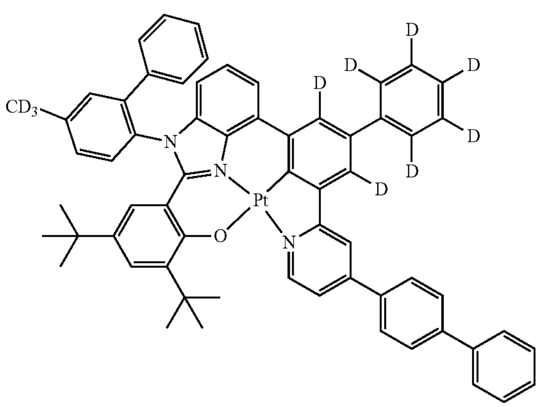
654
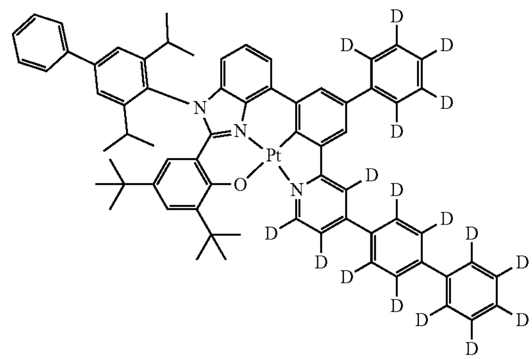
655
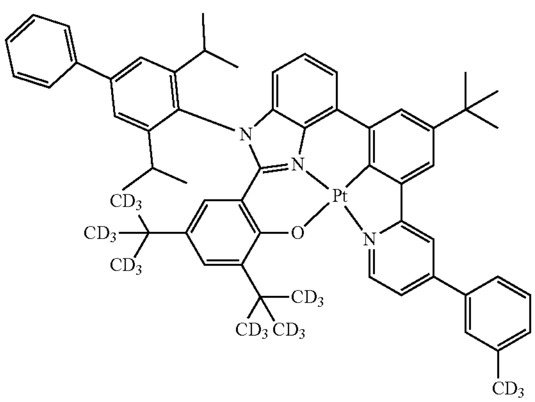
656
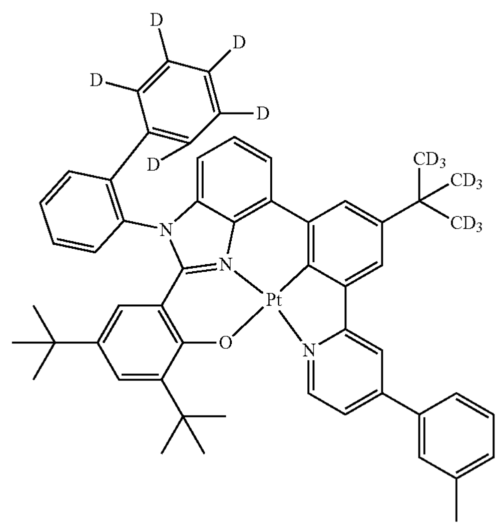
657
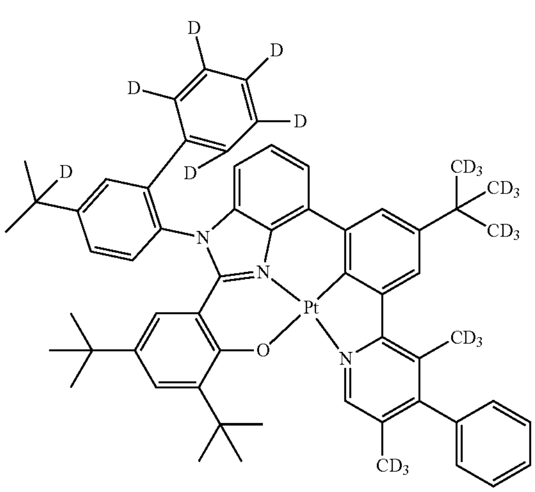
658
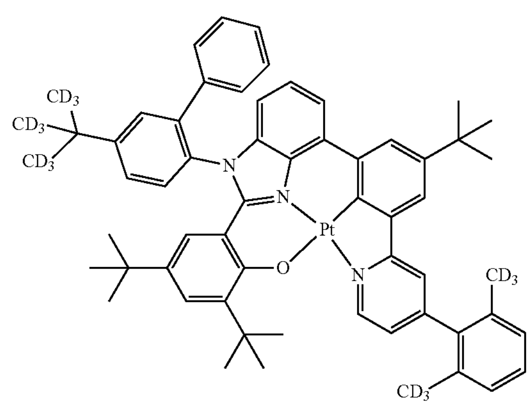

-continued
659
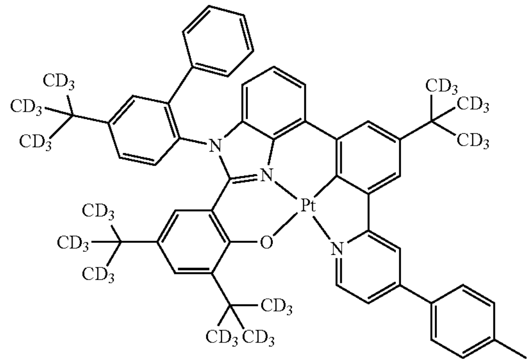
660
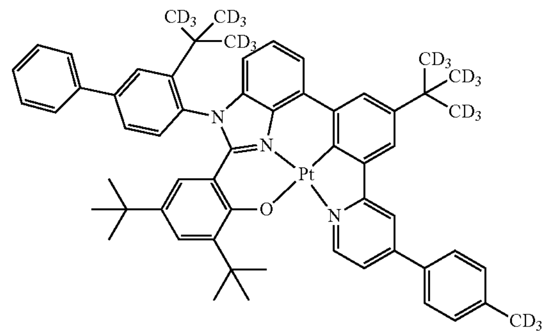
661
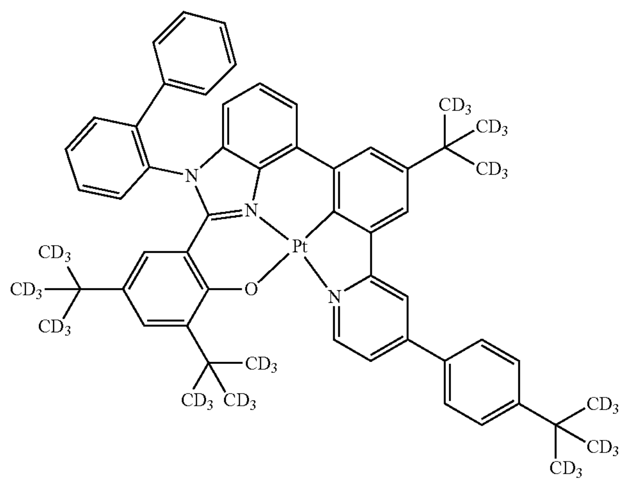
662
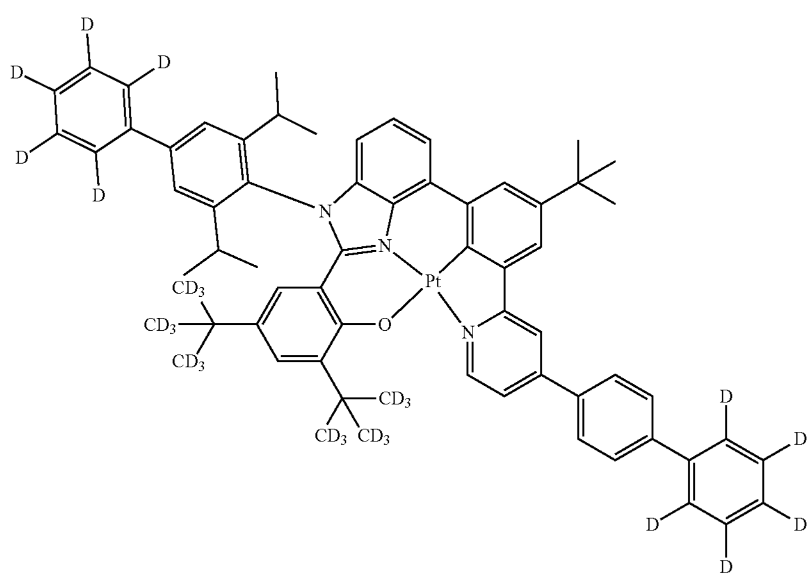

-continued
663
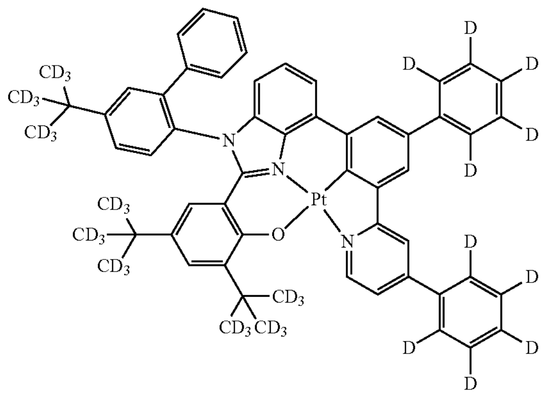
664
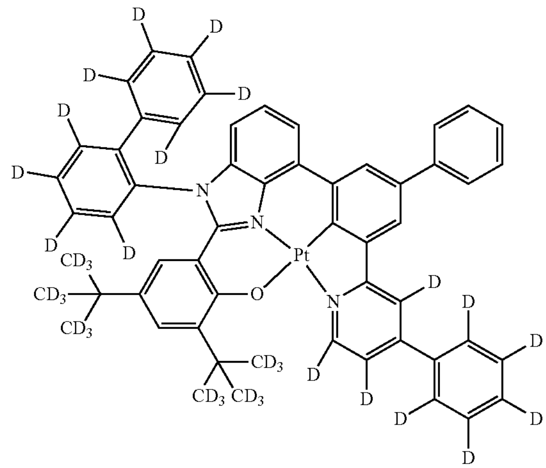
665
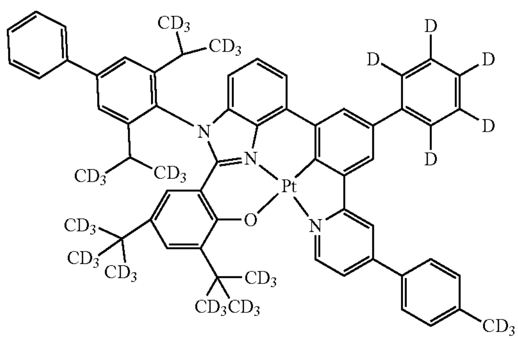
666
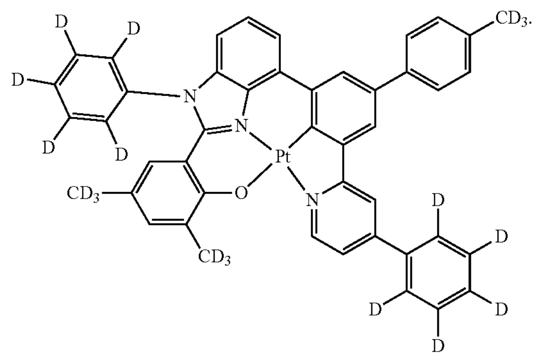
* * * * *